(12) United States Patent
Stadelmeier et al.

(10) Patent No.: US 10,659,275 B2
(45) Date of Patent: May 19, 2020

(54) CODING AND MODULATION APPARATUS USING NON-UNIFORM CONSTELLATION

(71) Applicant: Saturn Licensing LLC, New York, NY (US)

(72) Inventors: Lothar Stadelmeier, Stuttgart (DE); Jan Zoellner, Braunschweig (DE); Nabil Loghin, Freiburg (DE)

(73) Assignee: Saturn Licensing LLC, New York, NY (US)

( * ) Notice: Subject to any disclaimer, the term of this patent is extended or adjusted under 35 U.S.C. 154(b) by 0 days.

(21) Appl. No.: 16/020,554

(22) Filed: Jun. 27, 2018

(65) Prior Publication Data

US 2019/0044783 A1    Feb. 7, 2019

Related U.S. Application Data

(63) Continuation of application No. 15/438,566, filed on Feb. 21, 2017, now Pat. No. 10,033,567, which is a (Continued)

(30) Foreign Application Priority Data

Jul. 9, 2012 (EP) ..................... 12175587
Apr. 17, 2013 (EP) ..................... 13164169

(51) Int. Cl.
*H04L 27/34* (2006.01)
*H04L 1/00* (2006.01)
(Continued)

(52) U.S. Cl.
CPC ............ *H04L 27/34* (2013.01); *H03M 13/25* (2013.01); *H03M 13/356* (2013.01);
(Continued)

(58) Field of Classification Search
CPC ... H04L 27/3405; H04L 1/0041; H04L 27/34; H04L 27/36
See application file for complete search history.

(56) References Cited

U.S. PATENT DOCUMENTS 9,813,279 B2 * 11/2017 Loghin ................ H04L 1/0042
2005/0047517 A1  3/2005 Georgios et al.
(Continued)

FOREIGN PATENT DOCUMENTS

CN    102292982 A    12/2011
EP    2 134 051 A1    12/2009
(Continued)

OTHER PUBLICATIONS

International Search Report dated Oct. 9, 2013 in PCT/EP2013/063824.
(Continued)

*Primary Examiner* — Ross Vamdell
(74) *Attorney, Agent, or Firm* — Oblon, McClelland, Maier & Neustadt, L.L.P.

(57) ABSTRACT

A coding and modulation apparatus and method are presented. The apparatus (10) comprises an encoder (11) that encodes input data into cell words, and a modulator (12) that modulates said cell words into constellation values of a non-uniform constellation. The modulator (12) is configured to use, based on the total number M of constellation points of the constellation, the signal-to-noise ratio SNR in dB and the channel characteristics, a non-uniform constellation from a group of constellations comprising one or more of predetermined constellations defined by the constellation position vector u1 . . . v, wherein v=sqrt(M)/2−1.

12 Claims, 5 Drawing Sheets

Related U.S. Application Data continuation of application No. 14/412,265, filed as application No. PCT/EP2013/063824 on Jul. 1, 2013, now abandoned.

(51) Int. Cl.

| | | |
|---|---|---|
| *H03M 13/25* | (2006.01) | |
| *H03M 13/35* | (2006.01) | |
| *H04L 27/00* | (2006.01) | |
| *H04L 27/38* | (2006.01) | |
| *H04L 27/36* | (2006.01) | |

(52) U.S. Cl.
CPC ............ *H04L 1/007* (2013.01); *H04L 1/0041* (2013.01); *H04L 1/0071* (2013.01); *H04L 27/0008* (2013.01); *H04L 27/3405* (2013.01); *H04L 27/36* (2013.01); *H04L 27/38* (2013.01)

(56) References Cited

U.S. PATENT DOCUMENTS

| | | | |
|---|---|---|---|
| 2007/0115864 A1 | 5/2007 | Bar-Ness et al. | |
| 2009/0034635 A1 | 2/2009 | Golitschek et al. | |
| 2009/0129477 A1 | 5/2009 | Yang | |
| 2009/0168909 A1 | 7/2009 | Stadelmeier et al. | |
| 2010/0210301 A1* | 8/2010 | Dietz ................ | H04M 1/72577 455/556.1 |
| 2011/0090948 A1 | 4/2011 | Zhou et al. | |
| 2011/0274211 A1 | 11/2011 | Ko et al. | |
| 2011/0280327 A1* | 11/2011 | Ko ........................ | H04L 1/0044 375/260 |
| 2014/0314177 A1 | 10/2014 | Choi et al. | |
| 2015/0049844 A1* | 2/2015 | Stott ..................... | H04L 1/0041 375/298 |
| 2015/0163085 A1 | 6/2015 | Stadelmeier et al. | |
| 2015/0222471 A1 | 8/2015 | Myung et al. | |

FOREIGN PATENT DOCUMENTS

| | | |
|---|---|---|
| EP | 2 211 493 A1 | 7/2010 |
| EP | 2 375 666 A1 | 10/2011 |
| EP | 2 378 666 A1 | 10/2011 |
| WO | 2010/078472 A1 | 7/2010 |

OTHER PUBLICATIONS

Zaishuang Liu, et al., "APSK Constellation with Gray Mapping" IEEE Communications Letters, vol. 15, No. 12, XP11389300A, Dec. 2011, pp. 1271-1273.

G. Caire, et al. "Capacity of bit-interleaved channels" IEEE Electronic Letters, vol. 32, No. 12, Jun. 1996, pp. 1060-1061.

Nabil Sven Muhammad, "Coding and Modulation for Spectral Efficient Transmission" Ph.D. dissertation, Universität Stuttgart, Institut für Nachrichtenübertragung, Jun. 2006, 173 Pages.

Giuseppe Caire, et al., "Bit-Interleaved Coded Modulation" IEEE Transactions on Information Theory, vol. 44, No. 3, May 1998, pp. 927-946.

Udo Wachsmann, et al., "Multilevel Codes: Theoretical Concepts and Practical Design Rules" IEEE Transactions on Information Theory, vol. 45 No. 5, Jul. 1999, pp. 1361-1391.

Erik Agrell, et al., "On the Optimality of the Binary Reflected Gray Code" IEEE Transactions on Information Theory, vol. 50, No. 12, Dec. 2014, pp. 3170-3182.

Christine Fragouli, et al., "Turbo Codes with Non-Uniform Constellations" IEEE International Conference on Communications, Jun. 2001, 4 Pages.

Stéphane Y. Le Goff, "Signal Constellations for Bit-Interleaved Coded Modulation" IEEE Transactions on Information Theory, vol. 49, No. 1, Jan. 2003, p. 307-313.

Peter Moss, "TM-H1841 TM-NGH1259_positionTable256QAM.pdf" DVB, Nov. 26, 2011, 2 Pages.

Jonathan Stott, "TM-H2036 TM-NGH1453_positionTable64QAM.pdf" DVB, Dec. 9, 2012, 2 Pages.

Jun Li, et al. "Rayleigh Flat Fading Channels' Capacity" Proceedings of the 3$^{rd}$ Annual Communication Networks and Services Research Conference, 2005, 4 Pages.

Oliver Haffenden "Digital Video Broadcasting (DVB); Implementation guidelines for a second generation digital terrestrial television broadcasting system (DVB-T2)" ETSI TR 102 831, vol. 10.04, 2010, 227 Pages.

Jonathan Stott, "CM and BICM limits for rectangular constellations" BBC TN R&D 3420 v1.0, Aug. 2012, pp. 1-92.

Combined Office Action and Search Report dated Jan. 25, 2017 in Chinese Patent Application No. 20138000364872 (with English translation).

\* cited by examiner

CODING AND MODULATION APPARATUS USING NON-UNIFORM CONSTELLATION

CROSS REFERENCE TO RELATED APPLICATION

This application is a continuation of U.S. application Ser. No. 15/438,566, filed on Feb. 21, 2017, which is a continuation of U.S. application Ser. No. 14/412,265, filed on Dec. 31, 2014, which is a National Stage Application of International Application No. PCT/EP2013/063824, filed on Jul. 1, 2013, which claims the benefit of priority from EP Application No. 13164169.8, filed Apr. 17, 2013 and EP Application No. 12175587.0, filed Jul. 9, 2012. The entire contents of each of the above applications are incorporated herein by reference in their entirety.

BACKGROUND

Field of the Disclosure

The present disclosure relates to a coding and modulation apparatus and method. Further, the present disclosure relates to a transmission apparatus and method. Still further, the present disclosure relates to a computer program and a non-transitory computer-readable recording medium.

Description of Related Art

Modern communications systems typically employ, among other elements, a coding and modulation apparatus (as part of a transmission apparatus) and a decoding and demodulation apparatus (as part of a receiving apparatus). The coding and modulation apparatus is often part of a so called BICM (Bit Interleaved Coded Modulation) apparatus, which generally comprises (at the transmitter side) a serial concatenation of a FEC (Forward Error Correction) encoder, a bit interleaver, and a modulator, which uses spectral efficient modulation such as multilevel PAM (Pulse Amplitude Modulation), PSK (Phase Shift Keying), or QAM (Quadrature Amplitude Modulation). It should be noted that hereinafter, whenever QAM is mentioned it should be understood as a generally term covering PAM, PSK and QAM.

BICM allows for good performance over both non-fading and fading channels due to the use of the interleaver and/or the FEC encoder. It has a reasonable decoding complexity as opposed to multilevel coding (MLC) coding schemes and is thus used frequently in communications systems, such as in all DVB systems, powerline communications (e.g., Homeplug AV, DAB, LTE, WiFi, etc.).

Generally, the coding and modulation capacity, such as the BICM capacity in systems using a BICM apparatus, is considered as a target function, and it is desired to find optimum constellation points such that this capacity is maximized, often subject to a power normalization, i.e., the average power of the constellation points should be normalized to e.g. 1.

The "background" description provided herein is for the purpose of generally presenting the context of the disclosure. Work of the presently named inventor(s), to the extent it is described in this background section, as well as aspects of the description which may not otherwise qualify as prior art at the time of filing, are neither expressly or impliedly admitted as prior art against the present disclosure.

SUMMARY

It is an object to provide a coding and modulation apparatus and method providing an increased or even maximized coding and modulation capacity. It is a further object to provide a demodulation and decoding apparatus and method as well as a corresponding computer program for implementing said methods and a non-transitory computer-readable recording medium for implementing said methods.

According to an aspect there is provided a coding and modulation apparatus comprising
an encoder that encodes input data into cell words, and
a modulator that modulates said cell words into constellation values of a non-uniform constellation,
wherein said modulator is configured to use, based on the total number M of constellation points of the constellation, the signal-to-noise ratio SNR in dB and the channel characteristics, a non-uniform constellation from a group of constellations comprising one or more of the constellations defined by the constellation position vector $u_{1\ldots v}$, wherein $v=\mathrm{sqrt}(M)/2-1$, as described in detail in claim 1.

According to a further aspect there is provided a transmission apparatus comprising
a coding and modulation apparatus as proposed herein that encodes and modulates input data into constellation values,
a converter that converts said constellation values into one or more transmission streams to be transmitted, and
a transmitter that transmits said one or more transmission streams.

According to still further aspects corresponding methods, a computer program comprising program means for causing a computer to carry out the steps of the coding and modulation method disclosed herein, when said computer program is carried out on a computer, as well as a non-transitory computer-readable recording medium that stores therein a computer program product, which, when executed by a processor, causes the coding and modulation method disclosed herein to be performed are provided.

Preferred embodiments are defined in the dependent claims. It shall be understood that the claimed methods, the claimed computer program and the claimed computer-readable recording medium have similar and/or identical preferred embodiments as the claimed apparatus and as defined in the dependent claims.

One of the aspects of the disclosure is that the constellation points of the used constellations are not located on a regular grid with equidistant symbols, but rather on optimized locations, dependent on the channel characteristics, e.g., channel transition probabilities due to AWGN (Additive White Gaussian Noise), fading, etc. Further, the used constellation is selected dependent on the SNR (signal-to-noise ratio) and the desired total number of constellation points of the used constellation. A method how to find and optimize these non-uniform constellations (in the following called NUCs) will be explained below.

It should be noted that to every M-QAM, one can also think of the underlying sqrt(M)-PAM. Further, it should be noted that in other aspects the group of constellations defined in the claims comprises less constellations, e.g. only constellations for non-fading channels, only constellations for fading channels, only constellations for selected values of M, only constellation for M-QAM or sqrt(M)-PAM and/or constellations for less SNR values. In other words, less constellations may be contained in the group of constellations available for use by the modulator, i.e. the group of constellations available for use by the modulator may comprise one or more of the constellations defined in the claims. Accordingly, the present disclosure is also directed to a coding and modulation apparatus and method that have a smaller group of constellations available for used and use (as explained above) and/or where less constellations are available for a particular value of M.

It should further be noted that for some values of M there are two options of constellations for fading channels and two options of constellations for non-fading channels provided for the same selection parameters (e.g. for the same SNR value) among which the modulation can select. These two options (referred to as 1. option and 2. option) are the result of separate optimizations of the coding and modulation capacity. Hence, for instance based on the desired capacity the modulator may select a constellation from the constellations according to the 1. option or the 2. option, wherein the constellations according to the 2. option generally provide a slightly higher capacity.

However, the constellation points of the QAM constellations considered in this disclosure are not located on a regular grid with equidistant symbols, but rather on optimized locations, dependent on the channel characteristics, e.g., channel transition probabilities due to AWGN, fading, etc.

It is to be understood that both the foregoing general description of the disclosure and the following detailed description are exemplary, but are not restrictive, of the disclosure.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DESCRIPTION OF THE EMBODIMENTS

Figure 1:
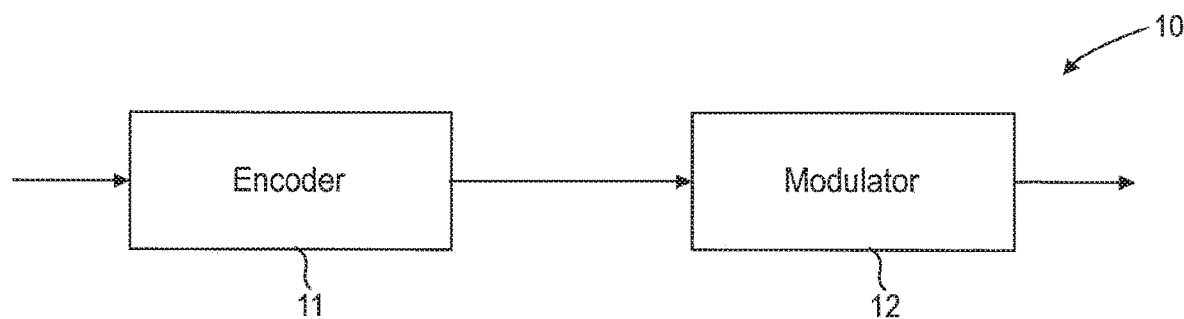
FIG. 1 shows an embodiment of a coding and modulation apparatus according to the present disclosure.

Referring now to the drawings, wherein like reference numerals designate identical or corresponding parts throughout the several views, FIG. 1 shows an embodiment of a coding and modulation apparatus 10 according to the present disclosure. It comprises an encoder 11 that encodes input data into cell words, and a modulator 12 that modulates said cell words into constellation values of a non-uniform constellation. Said modulator 12 is configured to use (and, preferably, select in advance), based on the total number M of constellation points of the constellation, the signal-to-noise ratio SNR in dB and the channel characteristics, a non-uniform constellation from a group of constellations comprising predetermined constellations defined by the constellation position vector $u_{1 \ldots v}$, wherein v=sqrt(M)/2−1. These predetermined constellations will be derived and shown below.

In other embodiments of the coding and modulation apparatus 10 additional elements may be provided, such as a BCH encoder, an LCPC encoder, a bit interleaver and/or a demultiplexer (for demultiplexing bits of encoded data into the cell words). Some or all of these elements may separate elements or may be part of the encoder 11. For instance, a BICM device as conventionally used in the transmission apparatus of a DVB system may be used as coding and modulation apparatus 10.

Figure 2:
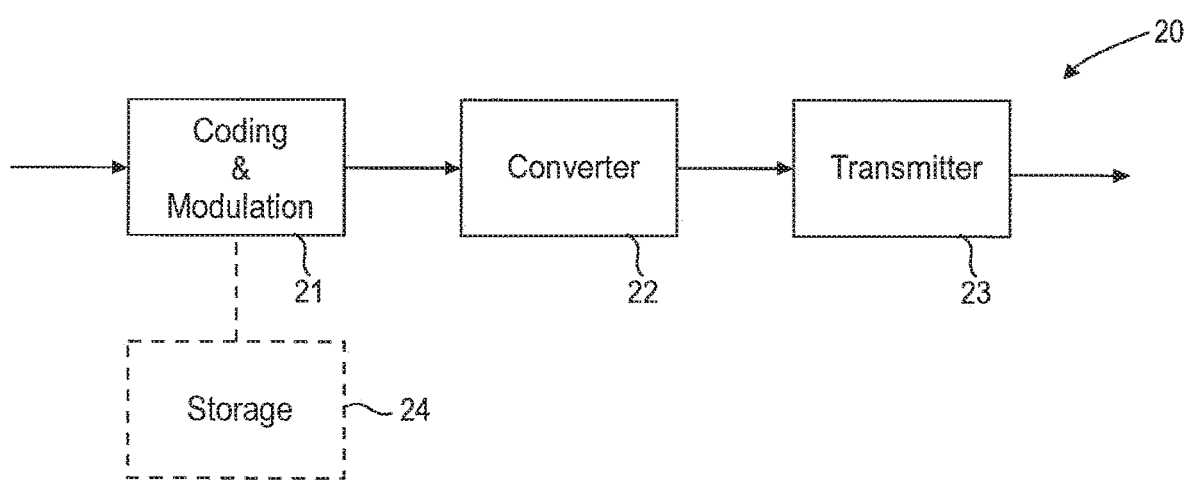
FIG. 2 shows an embodiment of a transmission apparatus according to the present disclosure.

FIG. 2 shows an embodiment of a transmission apparatus 20 according to the present disclosure comprising a coding and modulation apparatus 21 (referenced by 10 in FIG. 1) as proposed herein that encodes and modulates input data into constellation values, a converter 22 that converts said constellation values into one or more transmission streams to be transmitted, and a transmitter 23 that transmits said one or more transmission streams. In an exemplary embodiment the converter 22 may comprise one or more elements like atime, cell and/or frequency interleaver, a frame builder, an OFDM modulator, etc., as e.g. described in the various standards related to DVB. The constellations and the constellations values are generally predetermined and e.g. stored in a constellations storage 24 or retrieved from an external source.

In other embodiments of the transmission apparatus 20 addition elements may be provided, such as an input processing unit, a frame building unit and/or an OFDM generation unit as e.g. conventionally used in transmission apparatus of a DVB system.

Figure 3:
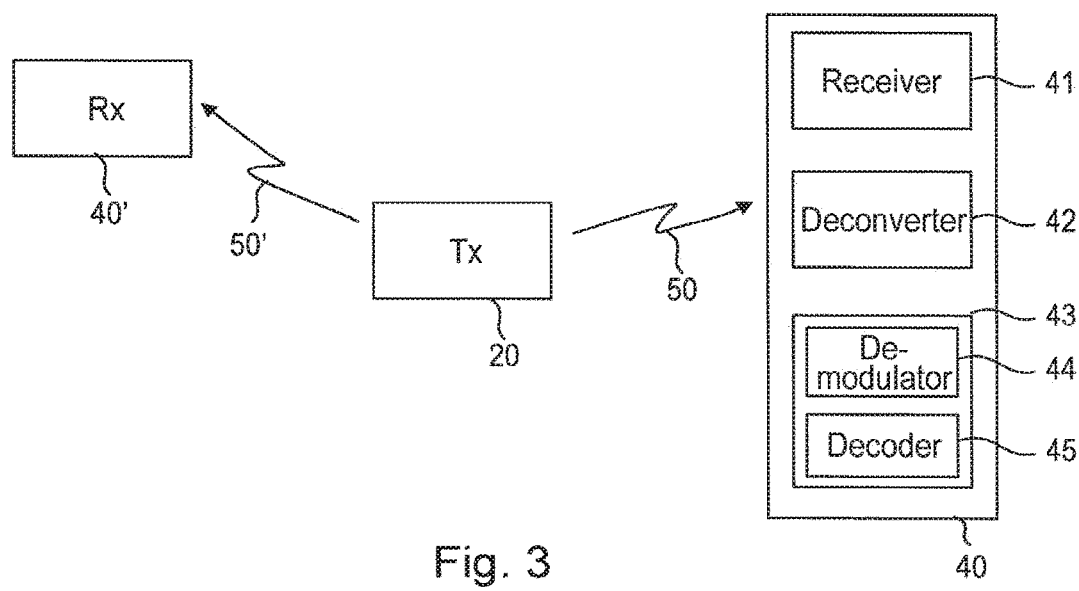
FIG. 3 shows an embodiment of a communications system according to the present disclosure.

FIG. 3 shows an embodiment of a communications system 30 according to the present disclosure comprising one (or more) transmission apparatus 20 (Tx) as shown in FIG. 2 and one or more receiving apparatus 40, 40' (Rx).

A receiving apparatus 40 generally comprises a receiver 41 that receives one or more transmission streams, a deconverter 42 that deconverts the received one or more transmission streams into constellation values, and a demodulation and decoding apparatus 43 that demodulates and decodes said constellation values into output data. The demodulation and decoding apparatus 43 generally comprises a demodulator 44 for demodulating constellation values of a non-uniform constellation into cell words, and a decoder 45 for decoding cell words into output data words, wherein based on the total number M of constellation points of the constellation, the signal-to-noise ratio in dB and the channel characteristics, a non-uniform constellation is used from the group of constellations comprising the same predetermined constellations as used in the coding and modulation apparatus 10.

The preferred demodulation and decoding considers soft values as opposed to hard decided values (0 and 1). Soft values represent the continuously distributed received values (possibly after A/D conversion including quantization) by more than two states (as in the case of binary (hard) decision). The reason is that for hard decision, the NUCs are generally not optimal. Nowadays, BICM receivers typically are soft receivers anyway.

Generally, data (e.g. communications data, broadcast data, etc.) shall be transmitted from a transmission apparatus 20 to one or more of said receiving apparatus 40 over a transmission channel 50, 50'. The transmission channel 50, 50' can be unicast channel, multicast channel, a broadcast channel and may be employed as one-directional or bidirectional channel (i.e. having a return channel from the receiving apparatus to the transmission apparatus).

In an embodiment the modulator 12 is configured to select and use a non-uniform constellation based on the total number M of constellation points of the constellation, the required signal-to-noise ratio SNR for error free decoding in dB and the channel characteristics. In broadcasting applications the constellation is generally not selected dependent on the SNR in the receiver, but dependent on the SNR that is required for error free decoding with a used channel code (if a code is used, for example LDPC codes in case of DVB $2^{nd}$ generation transmission systems) for an expected channel characteristic, e.g., static reception or multipath fading.

The total number M of constellation points is generally selected according to the desired payload throughput jointly with the code rate of the FEC encoder. The SNR for error free decoding for typical channel characteristic is generally known, e.g. by simulation. In broadcasting the channel characteristics of the receivers are not known, i.e. a compromise is selected. For instance, in broadcasting for each code rate of the FEC encoder one non-uniform constellation is selected, optimized for an SNR that is a compromise for all channel characteristics.

The transmitter generally targets a certain scenario. For instance, a broadcast transmission over cable or satellite considers the channel to be just a non-fading AWGN (appropriate channel model), while a terrestrial broadcaster typically considers the channel to be a fading channel, e.g. with Rayleigh distribution, as several echoes are usually received.

In another embodiment the modulator 12 is configured to adaptively select and use a non-uniform constellation based on the total number M of constellation points of the constellation, the signal-to-noise ratio SNR in dB and the channel characteristics, wherein said signal-to-noise ratio SNR in dB and channel characteristics are received from a receiving device 40 to which data shall be transmitted. Such an adaptive selection of the constellation is generally only possible with a return channel in unicast environments. A non-uniform constellation may be adapted e.g. in time and/or frequency domain, e.g. for different OFDM subcarriers.

Depending on the SNR the optimum value for M and the code rate of the FEC encoder can be selected, which offers the highest throughput (equivalent to $C_B$). In other words, for a large SNR a high value of M is selected leading to a high data throughput (and vice versa).

The channel characteristics describe the statistical properties of the channel, e.g., the extent of the multipath propagation of the transmission channel between transmitter and receiver. If the channel is characterized by no multipath propagation, corresponding to the AWGN channel, the required SNR for error free decoding is relatively low, i.e. the NUC has to be selected accordingly for optimum performance. If the transmission channel is characterized by strong multipath propagation, the required SNR for error free reception is larger compared to a channel without multipath propagation, i.e. a NUC optimized for higher SNR has to be used. Further, the NUCs should be optimized taking the fading characteristics into account, as will be discussed below.

As mentioned above, the number M of the constellation points of the constellations is selected according to the desired payload throughput. Larger values of M allow for higher data throughput, but require a larger SNR for error free reception. This is further influenced by the code rate of the FEC encoder, if any FEC encoder is used.

Another explanation (which is closely related to the optimization task of the present disclosure) is that for each SNR, optimized constellations are proposed for different M. The optimization target is the BICM capacity. For an expected SNR, say 15 dB of SNR should be guaranteed, M is chosen, for which the respective optimized NUC yields the largest BICM capacity. As a general rule it holds that for low SNR a low value of M should be selected and vice versa. But from a theoretical point of view, it turns out that high M is generally optimum, e.g., choosing M=4096 or M=1024 is preferred, because even for low SNR, the optimized NUC will "look (almost) like" a constellation with effectively smaller M, as several points will overlap. However, modulation and demodulation complexity increase with increasing M, so a tradeoff has to be considered.

As mentioned above known communications systems often employ among other blocks a so called BICM apparatus which may also be used as coding and modulation apparatus according to the present disclosure. The maximum possible capacity over a BICM apparatus is described by the BICM capacity $C_B$:

$$C_B = \sum_{i=0}^{m-1} E_{b,r_k}\left[\log_2 \frac{\sum_{x_l \in \mathbb{X}_b^i} p(r_k | s_k = x_l)}{p(r_k)}\right] =$$

$$\int_{r_k \in \mathbb{C}} \sum_{i=0}^{m-1} \sum_{b=0}^{1} \sum_{x_l \in \mathbb{X}_b^i} \frac{1}{M} \cdot p(r_k | s_k = x_l)$$

$$\log_2 \frac{\sum_{x_l \in \mathbb{X}_b^i} p(r_k | s_k = x_l)}{\frac{1}{M} \cdot \sum_{x_l' \in \mathbb{X}} p(r_k | s_k = x_l')} dr_k,$$

where I denotes the i-th bit label of the constellation point, and m is the total number of bits/QAM symbol point. Altogether the QAM constellation consists of $M=2^m$ constellation points, each assigned a particular bit label (00 . . . 00, 00 . . . 01, . . . , 11 . . . 11). In (1), E[.] denotes expectation operator, $p(r_k)$ is the probability density function (pdf) of the received symbols, $s_k$ is the transmitted symbol according to a particular bit label, k is the discrete time (or subcarrier index in case of OFDM modulation), $x_l$ is a particular symbol of the set of all constellation symbols, this set being denoted by $\mathbb{X}$ (=symbol alphabet, with cardinality $M=2^m$).

$p(r_k|s_k=x_l)$ is the likelihood function (transition probability—defined by the channel characteristics) that $r_k$ is received given the fact that $s_k=x_l$ was transmitted. The subset $\mathbb{X}_b^i$ includes all symbols from $\mathbb{X}$, where the i-th bit label is b (either b=0 or b=1).

As seen in (1), $C_B$ is a 2-dimensional integral. If only constellations are considered that can be split into two 1-dim. PAM constellations, it is easy to see that $$C_B(\text{2-dim.})=2 \times C_B(\text{1-dim.}) \quad (2)$$

All investigated channels here include AWGN (only or after the fading channel). This can be described by the signal-to-noise ratio SNR, typically in dB:

$$\text{SNR}=10 \log_{10}(E_s/\sigma^2), \quad (3)$$

where $E_s$ is the average symbol power of the QAM constellation (typically normalized to 1), and $\sigma^2$ is the variance (=power) of the additive white Gaussian noise (which is assumed to be of zero-mean).

In (2), the 1-dimensional consideration for $C_B$ (1-dim.) uses an N-PAM constellation, which has only half the symbol power, if just the projection on the in-phase or quadrature-phase, respectively, is taken. However, if again a power normalization to 1 is considered, the noise variance by a factor of 2 is increased. Thus, to be more precise, the target function for the optimization process considered according to the present disclosure is given by $$C_B(\text{2-dim. at SNR } x) = 2 \times C_B(\text{1-dim. at SNR } x/2), \quad (4)$$

where the 1-dimensional PAM has normalized power 1, thus just half the SNR (here, in absolute values, i.e. not in dB) as explained above. The 1-dimensional BICM capacity is also computed according to (1), where the 2-dimensional integral becomes a 1-dimensional integral with $r_k \in \Re$, $\Re$ being the set of real numbers.

This equation (4) is optimized, given all degrees of freedom, namely the constellation points of the underlying 1-dim. constellation, subject to the power constraint, i.e.

$$\mathcal{P}_x = E_{s_k}[|s_k|^2] = E_{x_l}[|x_l|^2] = \frac{1}{M} \sum_{l=0}^{M-1} |x_l|^2 \overset{!}{=} 1 \quad (5)$$

Figure 4:
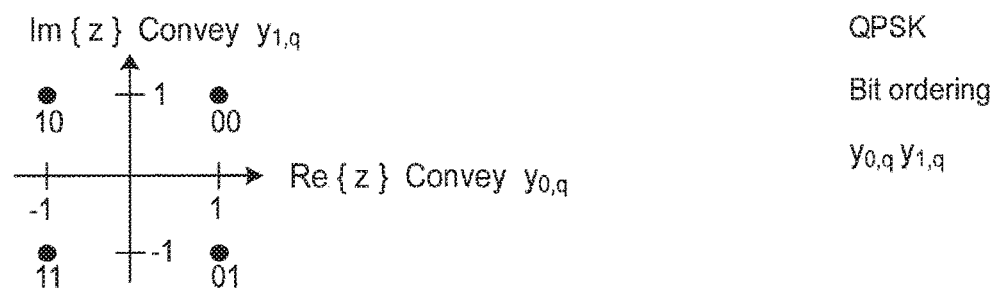
FIG. 4 shows a regular 4-QAM constellation as a simple example for a constellation.

For example, a regular 4-QAM consists of constellation points ($e^{j\pi/4}$, $e^{j7\pi/4}$, $e^{j3\pi/4}$, $e^{j5\pi/4}$), as can be seen in FIG. 4. The average symbol power is 1 (all symbols are located on unit circle here). The above symbol vector ($e^{j\pi/4}$, $e^{j7\pi/4}$, $e^{j3\pi/4}$, $e^{j5\pi/4}$) is to be understood such that the first entry ($e^{j\pi/4}$) belongs to the bit vector 00, the second entry ($e^{j7\pi/4}$) to 01 and so on, i.e. the entries belong to bit vectors with increasing values, where the first bit position is the most significant bit (MSB) and the last one the least significant bit (LSB). This 4-QAM is a particular case of an $N^2$-QAM, with N=2. Note that this definition (of being an $N^2$ QAM) does not only require $N^2$ being a square number ($N^2=2^2$), but also that the constellation is symmetrical and can be described by two independent N-PAM constellations, here a 2-PAM: the in-phase component (real-part of the complex symbols) is a 2-PAM with symbol vector (1/sqrt(2), −1/sqrt(2)) and describes the $1^{st}$ bit of the 4-QAM, whereas the quadrature-phase component (imaginary-part of the complex symbols) is the same 2-PAM, this time describing the $2^{nd}$ bit of the 4-QAM. Note further that the decomposition of the $N^2$-QAM into two N-PAMs is only possible if the bit labeling is according to binary reflected Gray mapping, which is typically applied (e.g. in DVB-systems).

The above example can be extended to higher order $N^2$-QAMs, with M>2. Then the underlying N-PAM describes for one component the $1^{st}$, $3^{rd}$, $5^{th}$ and so on bit label, while for the other component it describes the $2^{nd}$, $4^{th}$, $6^{th}$ and so on label.

Constellation shaping is generally known and has a long history. Only in recent years, constellations were investigated which maximize the BICM capacity $C_B$. In [6], the authors propose an heuristic approach to maximize $C_B$ by forcing the underlying PAM to approach a Gauss-like form (as is well known from Shannon's capacity theorem, the optimum constellation over the AWGN channel should have a Gaussian distribution; note that this means that there is an infinite number of continuously distributed input signals, having a Gaussian distribution, i.e., symbols with small power should occur more frequently than symbols with large power). There is no proof that this maximizes $C_B$, indeed those NUCs designed according to this method do not maximize $C_B$. The resulting NUCs are in general no $N^2$ NUCs, i.e., a 2-dimensional NUC was optimized, not the underlying PAM. However, in N. Muhammad, "Coding and modulation for spectral efficient transmission", Ph.D. dissertation, Universität Stuttgart, Institut für Nachrichtenübertragung, Pfaffenwaldring 47, 70569 Stuttgart, Germany, June 2006, the first time constellations have been directly optimized with respect to the target function $C_B$. For this method two differences to the current method occur:

M-NUCs were proposed for M=8, 16, and 32. No higher order NUCs were investigated, as the optimization becomes very time consuming and the optimization algorithms became numerically unstable.

The optimization algorithm was a hand-written gradient search algorithm, where both the BICM capacity and the gradient thereof consisted of improper integrals. No special care about either the numerical solution of the improper integral or the problematic integrants was considered. This consideration of these two issues is fundamental to obtain results for high order constellations, such as 1 k (i.e. 1024) NUC.

As described above, two problems arise when solving the optimization:
a) improper integral: integration border selection; and
b) integrant.

With respect to problem a) (improper integral: integration border selection), as seen in eq. (1), the BICM capacity involves an integral from − infinity to + infinity (=improper integral). Any numerical solution of this integral has to consider finite integration borders such as from −b to +b, with b sufficiently large. Matlab provides several functions for numerical integration, even for improper integrals, such as the function "quad", which internally optimizes the appropriate integration borders b. However, it has been observed that even these functions yield numerical instabilities and do not end up with the correct integral.

Figure 5A:
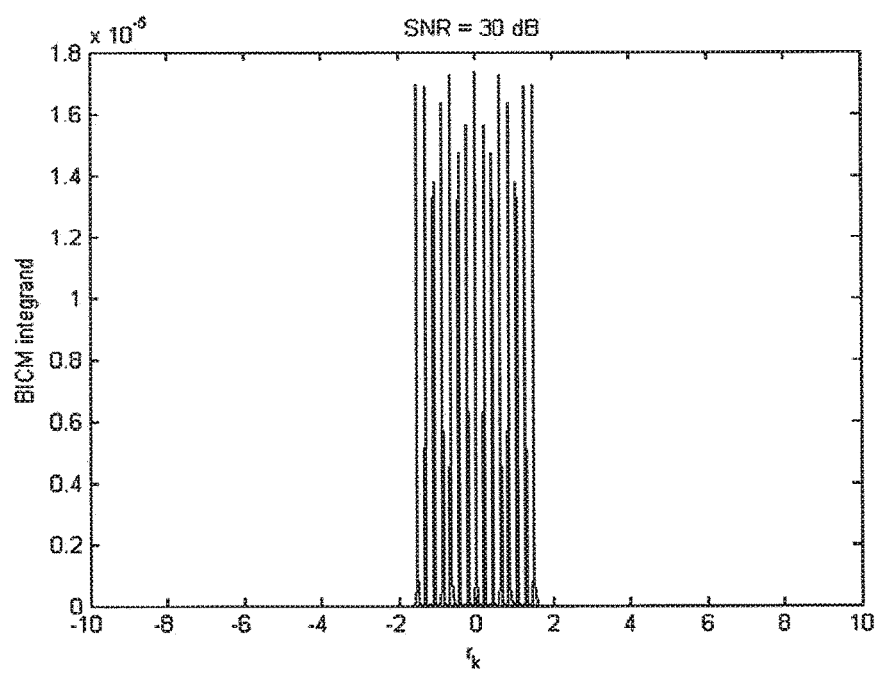
FIG. 5A shows a diagram depicting an integrant of the 1-dimensionsional BICM capacity function at 30 dB SNR.
Figure 5B:
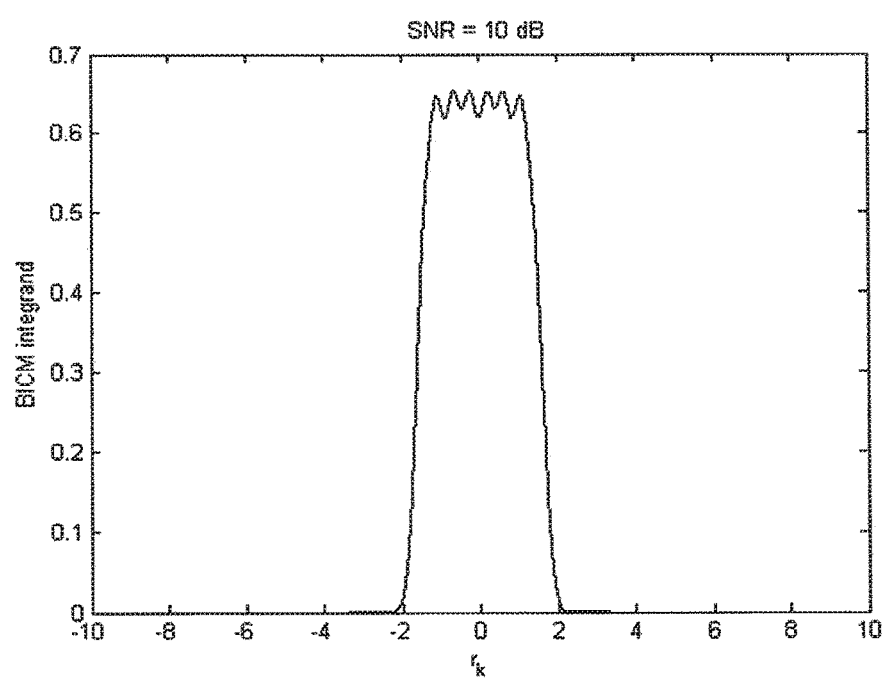
FIG. 5B shows a diagram depicting an integrant of the 1-dimensional BICM capacity function at 10 dB.

It can be observed that the integrant in (1) approaches 0 if the variable $r_k$ is sufficiently large (b→Inf). So a naïve approach would be to stepwise increase the variable $r_k$, until the integrant falls below a certain threshold (say $10^{-300}$ or if it even becomes exactly 0) and chose this value for the integration border b. However, it has further been observed that the integrant can take on very small values even before it converges to 0 for large variables, as can be seen in the two examples depicted in FIGS. 5A and 5B: the plot shown in FIG. 5B is the integrant of the 1-dimensional BICM capacity function, if a regular 32-PAM is used, at 10 dB SNR, while the plot shown in FIG. 5A 30 dB is considered.

Note that for 30 dB, many very small integrant values occur in the interval [−2,2] and any optimized integration border would be misleading in this interval. Thus, it is proposed to find the optimum (=numerically correct) integration border b as follows:

i) start with a large positive value S, iteratively reduce the value by decrements D, compute the integrant with this value as variable $r_k$, until the first non-zero value of the integrant is computed. If no non-zero integrant can be found before $r_k=0$, start again with a larger initial value S (say 10 times larger than before) and reduce D (say by factor of 10) to have a larger search interval and a finer granularity.

ii) As this search is time consuming, it is proposed to adjust the initial value S and the decrement D according to the SNR. If $\sigma^2$ is the noise variance of the 1-dimensional mapping (see eq. (3)), then as a good compromise $S=4000*\sigma^2$ and $D=50*\sigma^2$ has been chosen.

With respect to problem b) (integrant) it has further been observed that the integrant of the BICM capacity integral can cause numerical instabilities for large SNR values. As can be seen in eq. (1), the integrant consists of sums, including terms such as $$x*\log(x), x*\log(1/x), \text{ or } x*1/\log(x).$$

The value of x is e.g. the transition probability $p(r_k|s\_k=x_l)$, or a pdf or includes parts thereof. The values of x become increasingly small (even approaching 0) if the SNR is very large, as the pdfs typically correspond to Gaussian distributions. Thus, the following limits might occur:

$$\lim_{\{x \to 0\}} x*\log(x), \lim_{\{x \to 0\}} x*\log(1/x), \text{ or } \lim_{\{x \to 0\}} x*1/\log(x).$$

Note that in theory, each limit converges to 0 (see l'Hospital's rule), but in a numerical computation, values such as + or − infinite or NaN ("not a number") will occur. Thus, the following is proposed: during the computation of each element (i.e., each addend in the integrant of (1)), the value has to be checked if it is finite (otherwise infinite or NaN), and replace it by 0 in case it is not finite. Only this way, reliable integration results can be obtained.

With the above considerations, $N^2$-NUCs have been optimized as one embodiment with $N^2$ being 16, 64, 256, 1024 (1 k), 4 k, 16 k, 64 k, 256 k and 1024 k. This means, the target function $C_B$ of the underlying 1-dimensional PAM is used and the degrees of freedom (the real-valued constellation points of the PAM) are optimized. Note that the PAM has only N=sqrt($N^2$) degrees of freedom (e.g. a 64-NUC is based on an 8-PAM). Due to symmetry, the negative constellation values are the same as their positive counterparts, such that only N/2 degrees of freedom remain. Finally, one more degree of freedom is lost due to the power normalization (5). The 64-NUC can thus be optimized by considering only 3 degrees of freedom ("dof", i.e., optimization variables).

The presented optimization is preferably based on the Matlab's fmincon function for constrained nonlinear optimization: the target function is the BICM capacity, the constraints are as follows:
- all dof (degrees of freedom)>0;
- all dof need to fulfill the power normalization, when the N-PAM is created based on them;
- the dof must occur in increasing order.

The function fmincon requires an initial set of dof, where the values were taken from a regular, i.e. uniform constellation, but a random mutation was applied on them. It is to be noted that the resulting values should still be in increasing order, otherwise the Gray bit labeling is not fulfilled anymore. The NUCs will be described by their degrees of freedom, e.g., a 64-NUC optimized for the AWGN channel at SNR=11.5 dB yields the following values (optimized degrees of freedom):

2.2794 4.6229 7.5291.

This means that the positive constellation values are 1 2.2794 4.6229 7.5291

(the 1 was redundant, due to the power normalization, which will be applied in the end). The underlying 1-dim. 8-PAM NUC is thus described by the symbol vector (1.6405 1.0073 0.2179 0.4967 −1.6405 −1.0073 −0.2179 −0.4967), where the values are already normalized to unit average power.

As described before, the first entry (1.6405) corresponds to the bit label 000, the next one (1.0073) to 001 and so on. The 2-dim. 64-NUC is then obtained by symmetry, where both in-phase and quadrature-phase component of the NUC are based on the 8-PAM NUC.

Figure 6A:
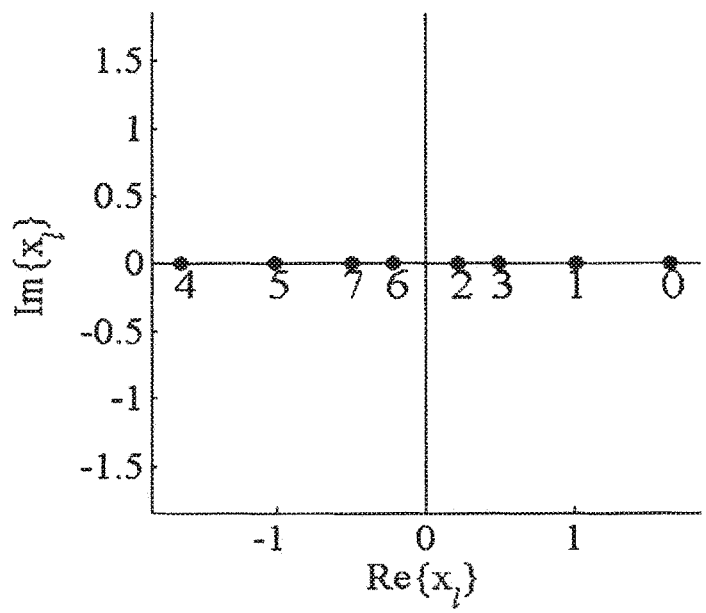
FIG. 6A shows a 8-PAM non-uniform constellation.
Figure 6B:
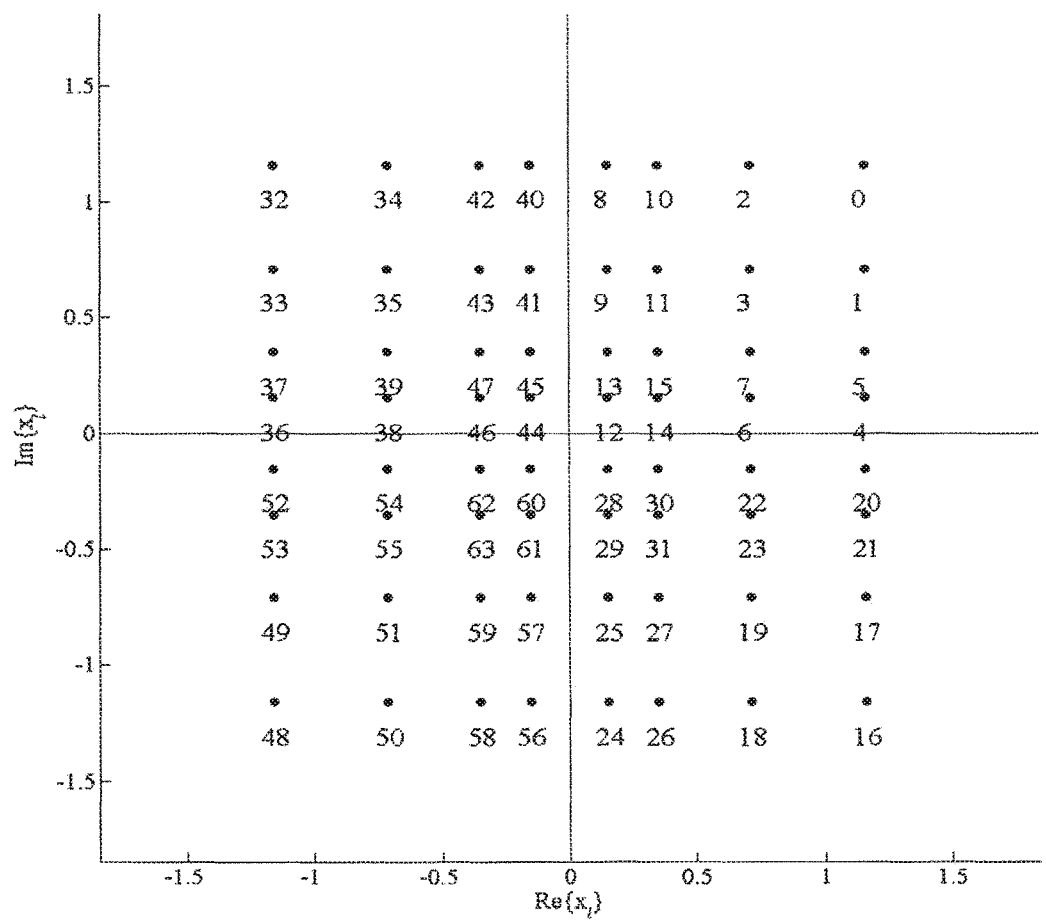
FIG. 6B shows a 64-QAM non-uniform constellation.

FIG. 6A shows a 8-PAM NUC while FIG. 6B shows a 64-QAM NUC. The bit labels are given in integer numbers (000→0, 001→1, 010→2 and so on).

The creation of the 2-dim. NUC based on the optimized degrees of freedom will be explained in more detail below.

Since the performance of NUCs depends on the SNR value they are optimized for, a thorough selection is preferably carried out depending on the (FEC) code rate to achieve optimum performance. If the channel characteristics are known, the required SNR value for FEC convergence can be determined by simulation. Then the NUC that has been optimized for this SNR value is chosen for best performance. If the SNR at the receiver is lower than this SNR decoding threshold, the constellation is not optimal. However, this is no drawback, since the BICM capacity is too low for successful decoding anyhow. On the other hand if the SNR at the receiver is clearly higher than the decoding threshold, a sufficient amount of BICM capacity for successful decoding is available, even though the NUC is suboptimal for this SNR range. Therefore, the NUC needs to be optimized for the SNR value at the waterfall region (i.e., decoding threshold for (quasi-) error free decoding) of the FEC. As the SNR value of the waterfall region depends on the code rate of the FEC, a different NUC is selected for each code rate.

The SNR value for (quasi-) error free decoding also depends on the channel characteristics of the receiver. For instance the required SNR for error free decoding of the DVB-T2 LDPC code in the AWGN channel is 0.8 dB, whereas 2.5 dB are required in the Rayleigh P1 multipath channel. The selected NUC for each code rate is thus not optimal in all channel environments and a tradeoff is necessary in a broadcasting environment that suits all (or most) users in the network. In a point-to-point network with return channel, the optimal NUC may be selected based on the measured channel characteristics in the receiver.

Currently, there exist no optimized constellations for fading channels. If the transmitter has no channel state information (CSI), but the receiver has perfect CSI (due to, e.g., pilot-based channel estimation), then the average BICM is the target function, which needs to be optimized for NUCs designed for fading channels. If the magnitude of the fading value for one QAM symbol is denoted as h (e.g. for a particular time instant and/or a particular subcarrier in case of OFDM), then the instantaneous BICM capacity is called $C_B(h)$ and given acc. to eq. (1). Note that the pdfs and transition probabilities in (1) are now different from the pure AWGN channel. E.g. in the AWGN case, the likelihood function $p(r_k|s_k=x_l)$ was given by a Gaussian distribution with zero-mean and variance $\sigma^2$. Now, for fading with the value h, the distribution is still Gaussian with zero-mean, but with instantaneous variance $\sigma^2/h^2$.

A good model for the fading statistics is given by a Rayleigh distribution of the fading magnitude h. Thus, the pdf of h is:

$$p(h) = h/\sigma_h^2 * \exp(-h^2/(2*\sigma_h^2)), \quad (6)$$

where $\sigma_h^2$ is the variance of the Rayleigh distribution. For a passive channel, i.e. one which on average neither attenuates nor magnifies the signal, $\sigma_h^2 = \frac{1}{2}$. This means, that the average SNR over a fading channel is the same as of a non-fading channel.

Now, the average BICM capacity over many channel realizations is given by $$C_B = \int_0^\infty p(h) * Cb(h) dh, \quad (7)$$

i.e., the instantaneous BICM capacity as a function of h has to be multiplied by the pdf of h (see (6)) and integrated over all possible fading magnitudes (0 . . . infinity).

Again, an improper integral has to be solved. This time, the integrant of (7) converges to 0 due to the pdf of h. It was found that a sufficiently large upper limit for the integral in (7) is given by 38, independent of the instantaneous capacity $C_B(h)$. This enables faster optimization of (7). Results will be shown below for $N^2$-NUCs, $N^2=16$, 64, 256, 1024 (1 k), 4096 (4 k) and 16384 (16 k).

The same principle regarding the selection of the NUC that has been described for static channels also holds for receivers experiencing fading channels, e.g., portable or mobile receivers. But since in fading channels the SNR in the receiver is varying due to the fading effect of the channel, the NUC cannot always operate at the optimum SNR. In general, the NUCs optimized for the fading channel perform better compared to the NUCs optimized for the non-fading channel when used at SNR values for which they are initially not optimized for, i.e. they perform better over broader SNR regions. Moreover, it was found that the NUCs optimized for the Rayleigh fading channel are good for most fading channels, e.g., with Rice distribution, with more than one echo component (e.g. TU6 channel) or with time- and frequency-selective fading with correlation. This is because the optimization considers the average of several channel instances/realizations.

In the following some more explanation is provided regarding the definition of the non-uniform QAM constellations. Each input cell word $(y_{0,q} \ldots y_{m-1,q})$ (i.e. provided to the modulator) shall be modulated using a non-uniform QAM constellation to give a constellation point $z_q$ prior to normalization, where m corresponds to the number of bits per QAM symbol $m=\log_2(M)$. It should be noted that the parameter q used here for discrete time or subcarrier index corresponds to the parameter k as used in the above. The exact values of the real and imaginary components $Re(z_q)$ and $Im(z_q)$ for each combination of the relevant input bits $y_{0 \ldots m-1,q}$ are given in the following tables for the various constellation sizes depending on the NUC position vector $u_{1 \ldots v}$, which defines the constellation point position of the non-uniform constellation. The length of the NUC position vector u is defined by $$v = \frac{\sqrt{M}}{2} - 1.$$

Figure 7:
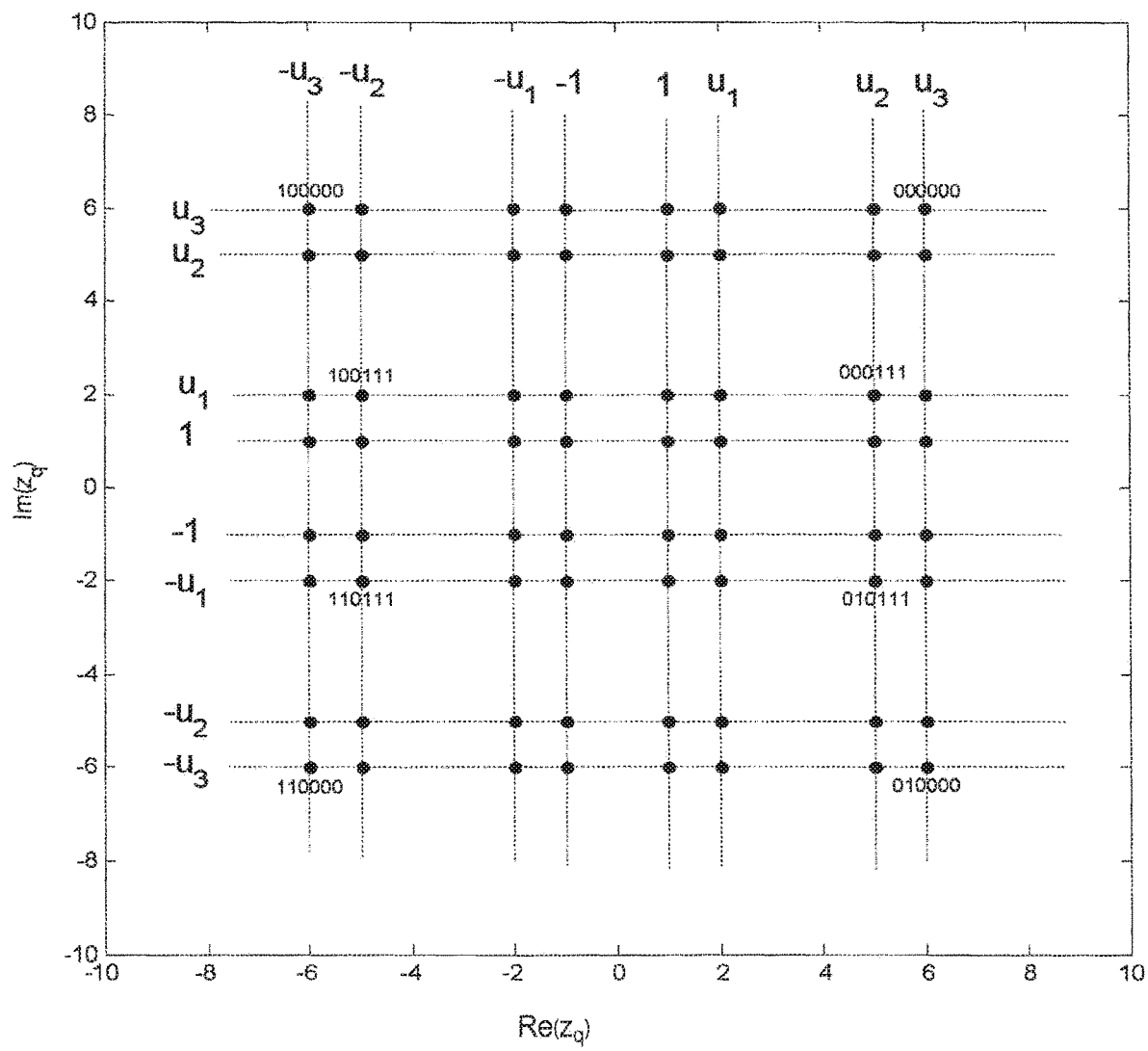
FIG. 7 shows a constellation for a 64-QAM non-uniform constellation generally defining the constellation points.

In one example, the corresponding constellation point $z_q$ for a 64-QAM NUC defined by the NUC position vector $(u_{1 \ldots 3})=(2,5,6)$ and the input cell word $(y_{0,q} \ldots y_{m-1,q})=$ (100111) is $Re(z_q)=-u_2=-5$ and $Im(z_q)=u_1=2$. The complete constellation for this NUC position vector is shown in FIG. 7 with exemplary input cell words marked at the corresponding constellation points.

The resulting constellation mapping (also called labeling) for the non-uniform constellations follows a binary reflected Gray-Mapping (labeling), i.e. neighboring constellation points differ in only one bit. The power of the constellation points $z_q$ is normalized such that the expectation value of the normalized constellation point $f_q$ equals 1, i.e. $E(|f_q|^2)=1$. For example, the normalized constellation value $f_q$ of a uniform 16-QAM constellation results by $$f_q = \frac{z_q}{\sqrt{10}}.$$

Figure 8:
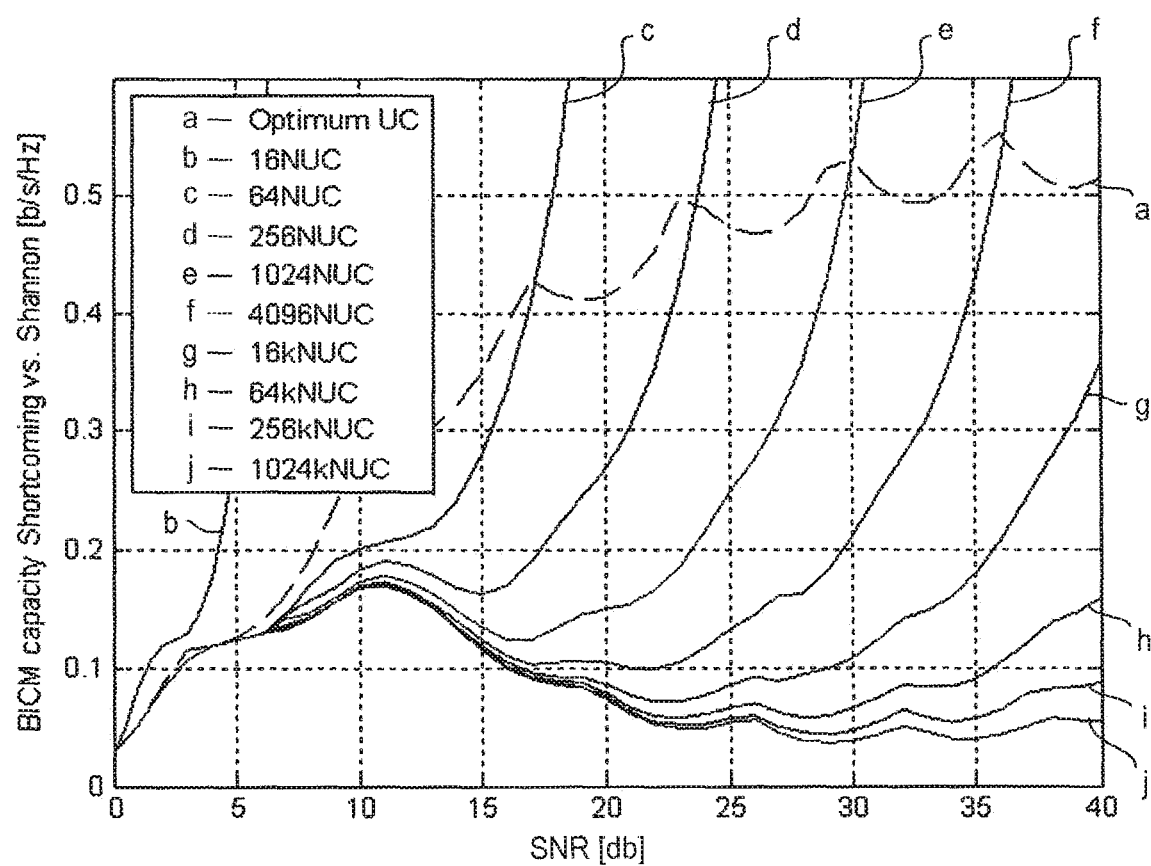
FIG. 8 shows a diagram illustrating the performance of non-uniform $N^2$-QAM constellations.

FIG. 8 shows a diagram illustrating the performance of non-uniform $N^2$-QAM constellations.

The following tables define the constellation position vectors (prior to power normalization) as well as the bit labelling of the data cell words to the constellation points.

Constellation Mapping for Real Part of 16-QAM

| Constellation mapping for real part of 16-QAM | | | | | |
|---|---|---|---|---|---|
| $y_{0,q}$ | 1 | 1 | 0 | 0 | |
| $y_{2,q}$ | 0 | 1 | 1 | 0 | |
| $Re(z_q)$ | −3 | −1 | 1 | 3 | Uniform |
| | −$u_1$ | −1 | 1 | $u_1$ | NUC |

Constellation Mapping for Imaginary Part of 16-QAM

| Constellation mapping for imaginary part of 16-QAM | | | | | |
|---|---|---|---|---|---|
| $Y_{1,q}$ | 1 | 1 | 0 | 0 | |
| $y_{3,q}$ | 0 | 1 | 1 | 0 | |
| $Im(z_q)$ | −3 | −1 | 1 | 3 | Uniform |
| | −$u_1$ | −1 | 1 | $u_1$ | NUC |

Constellation Mapping for Real Part of 64-QAM

| $y_{0,q}$ | 1 | 1 | 1 | 1 | 0 | 0 | 0 | 0 | |
|---|---|---|---|---|---|---|---|---|---|
| $y_{2,q}$ | 0 | 0 | 1 | 1 | 1 | 1 | 0 | 0 | |
| $y_{4,q}$ | 0 | 1 | 1 | 0 | 0 | 1 | 1 | 0 | |
| $Re(z_q)$ | −7 | −5 | −3 | −1 | 1 | 3 | 5 | 7 | Uniform |
| | −$u_3$ | −$u_2$ | −$u_1$ | −1 | 1 | $u_1$ | $u_2$ | $u_3$ | NUC |

Constellation Mapping for Imaginary Part of 64-QAM

| $y_{1,q}$ | 1 | 1 | 1 | 1 | 0 | 0 | 0 | 0 | |
|---|---|---|---|---|---|---|---|---|---|
| $y_{3,q}$ | 0 | 0 | 1 | 1 | 1 | 1 | 0 | 0 | |
| $y_{5,q}$ | 0 | 1 | 1 | 0 | 0 | 1 | 1 | 0 | |
| $Im(z_q)$ | −7 | −5 | −3 | −1 | 1 | 3 | 5 | 7 | Uniform |
| | −$u_3$ | −$u_2$ | −$u_1$ | −1 | 1 | $u_1$ | $u_2$ | $u_3$ | NUC |

Constellation Mapping for Real Part of 256-QAM

| $y_{0,q}$ | 1 | 1 | 1 | 1 | 1 | 1 | 1 | 1 | 0 | 0 | 0 | 0 | 0 | 0 | 0 | 0 |
|---|---|---|---|---|---|---|---|---|---|---|---|---|---|---|---|---|
| $y_{2,q}$ | 0 | 0 | 0 | 0 | 1 | 1 | 1 | 1 | 1 | 1 | 1 | 1 | 0 | 0 | 0 | 0 |

-continued

| | | | | | | | | | | | | | | | | | |
|---|---|---|---|---|---|---|---|---|---|---|---|---|---|---|---|---|---|
| $y_{4,q}$ | 0 | 0 | 1 | 1 | 1 | 1 | 0 | 0 | 0 | 0 | 1 | 1 | 1 | 1 | 0 | 0 | |
| $y_{6,q}$ | 0 | 1 | 1 | 0 | 0 | 1 | 1 | 0 | 0 | 1 | 1 | 0 | 0 | 1 | 1 | 0 | |
| $Re(z_q)$ | −15 | −13 | −11 | −9 | −7 | −5 | −3 | −1 | 1 | 3 | 5 | 7 | 9 | 11 | 13 | 15 | Uniform |
| | $-u_7$ | $-u_6$ | $-u_5$ | $-u_4$ | $-u_3$ | $-u_2$ | $-u_1$ | −1 | 1 | $u_1$ | $u_2$ | $u_3$ | $u_4$ | $u_5$ | $u_6$ | $u_7$ | NUC |

Constellation Mapping for Real Part of 256-QAM

| | | | | | | | | | | | | | | | | | |
|---|---|---|---|---|---|---|---|---|---|---|---|---|---|---|---|---|---|
| $y_{1,q}$ | 1 | 1 | 1 | 1 | 1 | 1 | 1 | 1 | 0 | 0 | 0 | 0 | 0 | 0 | 0 | 0 | |
| $y_{3,q}$ | 0 | 0 | 0 | 0 | 1 | 1 | 1 | 1 | 1 | 1 | 1 | 1 | 0 | 0 | 0 | 0 | |
| $y_{5,q}$ | 0 | 0 | 1 | 1 | 1 | 1 | 0 | 0 | 0 | 0 | 1 | 1 | 1 | 1 | 0 | 0 | |
| $y_{7,q}$ | 0 | 1 | 1 | 0 | 0 | 1 | 1 | 0 | 0 | 1 | 1 | 0 | 0 | 1 | 1 | 0 | |
| $Im(z_q)$ | −15 | −13 | −11 | −9 | −7 | −5 | −3 | −1 | 1 | 3 | 5 | 7 | 9 | 11 | 13 | 15 | Uniform |
| | $-u_7$ | $-u_6$ | $-u_5$ | $-u_4$ | $-u_3$ | $-u_2$ | $-u_1$ | −1 | 1 | $u_1$ | $u_2$ | $u_3$ | $u_4$ | $u_5$ | $u_6$ | $u_7$ | NUC |

Constellation Mapping for Real Part of 1024-QAM

| | | | | | | | | | | | | | | | | | |
|---|---|---|---|---|---|---|---|---|---|---|---|---|---|---|---|---|---|
| $Y_{0,q}$ | 1 | 1 | 1 | 1 | 1 | 1 | 1 | 1 | 1 | 1 | 1 | 1 | 1 | 1 | 1 | 1 | |
| $y_{2,q}$ | 0 | 0 | 0 | 0 | 0 | 0 | 0 | 0 | 1 | 1 | 1 | 1 | 1 | 1 | 1 | 1 | |
| $y_{4,q}$ | 0 | 0 | 0 | 0 | 1 | 1 | 1 | 1 | 1 | 1 | 1 | 1 | 0 | 0 | 0 | 0 | |
| $y_{6,q}$ | 0 | 0 | 1 | 1 | 1 | 1 | 0 | 0 | 0 | 0 | 1 | 1 | 1 | 1 | 0 | 0 | |
| $y_{8,q}$ | 0 | 1 | 1 | 0 | 0 | 1 | 1 | 0 | 0 | 1 | 1 | 0 | 0 | 1 | 1 | 0 | |
| $Re(z_q)$ | −31 | −29 | −27 | −25 | −23 | −21 | −19 | −17 | −15 | −13 | −11 | −9 | −7 | −5 | −3 | −1 | Uniform |
| | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | −1 | NUC |
| $Y_{0,q}$ | 0 | 0 | 0 | 0 | 0 | 0 | 0 | 0 | 0 | 0 | 0 | 0 | 0 | 0 | 0 | 0 | |
| $y_{2,q}$ | 1 | 1 | 1 | 1 | 1 | 1 | 1 | 1 | 0 | 0 | 0 | 0 | 0 | 0 | 0 | 0 | |
| $y_{4,q}$ | 0 | 0 | 0 | 0 | 1 | 1 | 1 | 1 | 1 | 1 | 1 | 1 | 0 | 0 | 0 | 0 | |
| $y_{6,q}$ | 0 | 0 | 1 | 1 | 1 | 1 | 0 | 0 | 0 | 0 | 1 | 1 | 1 | 1 | 0 | 0 | |
| $y_{8,q}$ | 0 | 1 | 1 | 0 | 0 | 1 | 1 | 0 | 0 | 1 | 1 | 0 | 0 | 1 | 1 | 0 | |
| $Re(z_q)$ | 1 | 3 | 5 | 7 | 9 | 11 | 13 | 15 | 17 | 19 | 21 | 23 | 25 | 27 | 29 | 31 | Uniform |
| | 1 | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ | NUC |

Constellation Mapping for Imaginary Part of 1024-QAM

| | | | | | | | | | | | | | | | | | |
|---|---|---|---|---|---|---|---|---|---|---|---|---|---|---|---|---|---|
| $y_{1,q}$ | 1 | 1 | 1 | 1 | 1 | 1 | 1 | 1 | 1 | 1 | 1 | 1 | 1 | 1 | 1 | 1 | |
| $y_{3,q}$ | 0 | 0 | 0 | 0 | 0 | 0 | 0 | 0 | 1 | 1 | 1 | 1 | 1 | 1 | 1 | 1 | |
| $y_{5,q}$ | 0 | 0 | 0 | 0 | 1 | 1 | 1 | 1 | 1 | 1 | 1 | 1 | 0 | 0 | 0 | 0 | |
| $y_{7,q}$ | 0 | 0 | 1 | 1 | 1 | 1 | 0 | 0 | 0 | 0 | 1 | 1 | 1 | 1 | 0 | 0 | |
| $y_{9,q}$ | 0 | 1 | 1 | 0 | 0 | 1 | 1 | 0 | 0 | 1 | 1 | 0 | 0 | 1 | 1 | 0 | |
| $Im(z_q)$ | −31 | −29 | −27 | −25 | −23 | −21 | −19 | −17 | −15 | −13 | −11 | −9 | −7 | −5 | −3 | −1 | Uniform |
| | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | −1 | NUC |
| $y_{1,q}$ | 0 | 0 | 0 | 0 | 0 | 0 | 0 | 0 | 0 | 0 | 0 | 0 | 0 | 0 | 0 | 0 | |
| $y_{3,q}$ | 1 | 1 | 1 | 1 | 1 | 1 | 1 | 1 | 0 | 0 | 0 | 0 | 0 | 0 | 0 | 0 | |
| $y_{5,q}$ | 0 | 0 | 0 | 0 | 1 | 1 | 1 | 1 | 1 | 1 | 1 | 1 | 0 | 0 | 0 | 0 | |
| $y_{7,q}$ | 0 | 0 | 1 | 1 | 1 | 1 | 0 | 0 | 0 | 0 | 1 | 1 | 1 | 1 | 0 | 0 | |
| $y_{9,q}$ | 0 | 1 | 1 | 0 | 0 | 1 | 1 | 0 | 0 | 1 | 1 | 0 | 0 | 1 | 1 | 0 | |
| $Im(z_q)$ | 1 | 3 | 5 | 7 | 9 | 11 | 13 | 15 | 17 | 19 | 21 | 23 | 25 | 27 | 29 | 31 | Uniform |
| | 1 | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ | NUC |

Constellation Mapping for Real Part of 4096-QAM

| | | | | | | | | | | | | | | | | | |
|---|---|---|---|---|---|---|---|---|---|---|---|---|---|---|---|---|---|
| $Y_{0,q}$ | 1 | 1 | 1 | 1 | 1 | 1 | 1 | 1 | 1 | 1 | 1 | 1 | 1 | 1 | 1 | 1 | |
| $y_{2,q}$ | 0 | 0 | 0 | 0 | 0 | 0 | 0 | 0 | 0 | 0 | 0 | 0 | 0 | 0 | 0 | 0 | |
| $y_{4,q}$ | 0 | 0 | 0 | 0 | 0 | 0 | 0 | 0 | 1 | 1 | 1 | 1 | 1 | 1 | 1 | 1 | |
| $y_{6,q}$ | 0 | 0 | 0 | 0 | 1 | 1 | 1 | 1 | 1 | 1 | 1 | 1 | 0 | 0 | 0 | 0 | |
| $y_{8,q}$ | 0 | 0 | 1 | 1 | 1 | 1 | 0 | 0 | 0 | 0 | 1 | 1 | 1 | 1 | 0 | 0 | |
| $y_{10,q}$ | 0 | 1 | 1 | 0 | 0 | 1 | 1 | 0 | 0 | 1 | 1 | 0 | 0 | 1 | 1 | 0 | |
| $Re(z_q)$ | −63 | −61 | −59 | −57 | −55 | −53 | −51 | −49 | −47 | −45 | −43 | −41 | −39 | −37 | −35 | −33 | Uniform |
| | $-u_{31}$ | $-u_{30}$ | $-u_{29}$ | $-u_{28}$ | $-u_{27}$ | $-u_{26}$ | $-u_{25}$ | $-u_{24}$ | $-u_{23}$ | $-u_{22}$ | $-u_{21}$ | $-u_{20}$ | $-u_{19}$ | $-u_{18}$ | $-u_{17}$ | $-u_{16}$ | NUC |
| $Y_{0,q}$ | 1 | 1 | 1 | 1 | 1 | 1 | 1 | 1 | 1 | 1 | 1 | 1 | 1 | 1 | 1 | 1 | |
| $y_{2,q}$ | 1 | 1 | 1 | 1 | 1 | 1 | 1 | 1 | 1 | 1 | 1 | 1 | 1 | 1 | 1 | 1 | |

-continued

| | | | | | | | | | | | | | | | | | |
|---|---|---|---|---|---|---|---|---|---|---|---|---|---|---|---|---|---|
| $y_{4,q}$ | 1 | 1 | 1 | 1 | 1 | 1 | 1 | 1 | 0 | 0 | 0 | 0 | 0 | 0 | 0 | 0 | |
| $y_{6,q}$ | 0 | 0 | 0 | 0 | 1 | 1 | 1 | 1 | 1 | 1 | 1 | 1 | 0 | 0 | 0 | 0 | |
| $y_{8,q}$ | 0 | 0 | 1 | 1 | 1 | 1 | 0 | 0 | 0 | 0 | 1 | 1 | 1 | 1 | 0 | 0 | |
| $y_{10,q}$ | 0 | 1 | 1 | 0 | 0 | 1 | 1 | 0 | 0 | 1 | 1 | 0 | 0 | 1 | 1 | 0 | |
| $\text{Re}(z_q)$ | −31 | −29 | −27 | −25 | −23 | −21 | −19 | −17 | −15 | −13 | −11 | −9 | −7 | −5 | −3 | −1 | Uniform |
| | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | −1 | NUC |
| $Y_{0,q}$ | 0 | 0 | 0 | 0 | 0 | 0 | 0 | 0 | 0 | 0 | 0 | 0 | 0 | 0 | 0 | 0 | |
| $y_{2,q}$ | 1 | 1 | 1 | 1 | 1 | 1 | 1 | 1 | 1 | 1 | 1 | 1 | 1 | 1 | 1 | 1 | |
| $y_{4,q}$ | 0 | 0 | 0 | 0 | 0 | 0 | 0 | 0 | 1 | 1 | 1 | 1 | 1 | 1 | 1 | 1 | |
| $y_{6,q}$ | 0 | 0 | 0 | 0 | 1 | 1 | 1 | 1 | 1 | 1 | 1 | 1 | 0 | 0 | 0 | 0 | |
| $y_{8,q}$ | 0 | 0 | 1 | 1 | 1 | 1 | 0 | 0 | 0 | 0 | 1 | 1 | 1 | 1 | 0 | 0 | |
| $y_{10,q}$ | 0 | 1 | 1 | 0 | 0 | 1 | 1 | 0 | 0 | 1 | 1 | 0 | 0 | 1 | 1 | 0 | |
| $\text{Re}(z_q)$ | 1 | 3 | 5 | 7 | 9 | 11 | 13 | 15 | 17 | 19 | 21 | 23 | 25 | 27 | 29 | 31 | Uniform |
| | 1 | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ | NUC |
| $Y_{0,q}$ | 0 | 0 | 0 | 0 | 0 | 0 | 0 | 0 | 0 | 0 | 0 | 0 | 0 | 0 | 0 | 0 | |
| $y_{2,q}$ | 0 | 0 | 0 | 0 | 0 | 0 | 0 | 0 | 0 | 0 | 0 | 0 | 0 | 0 | 0 | 0 | |
| $y_{4,q}$ | 1 | 1 | 1 | 1 | 1 | 1 | 1 | 1 | 0 | 0 | 0 | 0 | 0 | 0 | 0 | 0 | |
| $y_{6,q}$ | 0 | 0 | 0 | 0 | 1 | 1 | 1 | 1 | 1 | 1 | 1 | 1 | 0 | 0 | 0 | 0 | |
| $y_{8,q}$ | 0 | 0 | 1 | 1 | 1 | 1 | 0 | 0 | 0 | 0 | 1 | 1 | 1 | 1 | 0 | 0 | |
| $y_{10,q}$ | 0 | 1 | 1 | 0 | 0 | 1 | 1 | 0 | 0 | 1 | 1 | 0 | 0 | 1 | 1 | 0 | |
| $\text{Re}(z_q)$ | 33 | 35 | 37 | 39 | 41 | 43 | 45 | 47 | 49 | 51 | 53 | 55 | 57 | 59 | 61 | 63 | Uniform |
| | $u_{16}$ | $u_{17}$ | $u_{18}$ | $u_{19}$ | $u_{20}$ | $u_{21}$ | $u_{22}$ | $u_{23}$ | $u_{24}$ | $u_{25}$ | $u_{26}$ | $u_{27}$ | $u_{28}$ | $u_{29}$ | $u_{30}$ | $u_{31}$ | NUC |

Constellation Mapping for Imaginary Part of 4096-QAM

| | | | | | | | | | | | | | | | | | |
|---|---|---|---|---|---|---|---|---|---|---|---|---|---|---|---|---|---|
| $y_{1,q}$ | 1 | 1 | 1 | 1 | 1 | 1 | 1 | 1 | 1 | 1 | 1 | 1 | 1 | 1 | 1 | 1 | |
| $y_{3,q}$ | 0 | 0 | 0 | 0 | 0 | 0 | 0 | 0 | 0 | 0 | 0 | 0 | 0 | 0 | 0 | 0 | |
| $y_{5,q}$ | 0 | 0 | 0 | 0 | 0 | 0 | 0 | 0 | 1 | 1 | 1 | 1 | 1 | 1 | 1 | 1 | |
| $y_{7,q}$ | 0 | 0 | 0 | 0 | 1 | 1 | 1 | 1 | 1 | 1 | 1 | 1 | 0 | 0 | 0 | 0 | |
| $y_{9,q}$ | 0 | 0 | 1 | 1 | 1 | 1 | 0 | 0 | 0 | 0 | 1 | 1 | 1 | 1 | 0 | 0 | |
| $y_{11,q}$ | 0 | 1 | 1 | 0 | 0 | 1 | 1 | 0 | 0 | 1 | 1 | 0 | 0 | 1 | 1 | 0 | |
| $\text{Im}(z_q)$ | −63 | −61 | −59 | −57 | −55 | −53 | −51 | −49 | −47 | −45 | −43 | −41 | −39 | −37 | −35 | −33 | Uniform |
| | $-u_{31}$ | $-u_{30}$ | $-u_{29}$ | $-u_{28}$ | $-u_{27}$ | $-u_{26}$ | $-u_{25}$ | $-u_{24}$ | $-u_{23}$ | $-u_{22}$ | $-u_{21}$ | $-u_{20}$ | $-u_{19}$ | $-u_{18}$ | $-u_{17}$ | $-u_{16}$ | NUC |
| $y_{1,q}$ | 1 | 1 | 1 | 1 | 1 | 1 | 1 | 1 | 1 | 1 | 1 | 1 | 1 | 1 | 1 | 1 | |
| $y_{3,q}$ | 1 | 1 | 1 | 1 | 1 | 1 | 1 | 1 | 1 | 1 | 1 | 1 | 1 | 1 | 1 | 1 | |
| $y_{5,q}$ | 1 | 1 | 1 | 1 | 1 | 1 | 1 | 1 | 0 | 0 | 0 | 0 | 0 | 0 | 0 | 0 | |
| $y_{7,q}$ | 0 | 0 | 0 | 0 | 1 | 1 | 1 | 1 | 1 | 1 | 1 | 1 | 0 | 0 | 0 | 0 | |
| $y_{9,q}$ | 0 | 0 | 1 | 1 | 1 | 1 | 0 | 0 | 0 | 0 | 1 | 1 | 1 | 1 | 0 | 0 | |
| $y_{11,q}$ | 0 | 1 | 1 | 0 | 0 | 1 | 1 | 0 | 0 | 1 | 1 | 0 | 0 | 1 | 1 | 0 | |
| $\text{Im}(z_q)$ | −31 | −29 | −27 | −25 | −23 | −21 | −19 | −17 | −15 | −13 | −11 | −9 | −7 | −5 | −3 | −1 | Uniform |
| | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | −1 | NUC |
| $y_{1,q}$ | 0 | 0 | 0 | 0 | 0 | 0 | 0 | 0 | 0 | 0 | 0 | 0 | 0 | 0 | 0 | 0 | |
| $y_{3,q}$ | 1 | 1 | 1 | 1 | 1 | 1 | 1 | 1 | 1 | 1 | 1 | 1 | 1 | 1 | 1 | 1 | |
| $y_{5,q}$ | 0 | 0 | 0 | 0 | 0 | 0 | 0 | 0 | 1 | 1 | 1 | 1 | 1 | 1 | 1 | 1 | |
| $y_{7,q}$ | 0 | 0 | 0 | 0 | 1 | 1 | 1 | 1 | 1 | 1 | 1 | 1 | 0 | 0 | 0 | 0 | |
| $y_{9,q}$ | 0 | 0 | 1 | 1 | 1 | 1 | 0 | 0 | 0 | 0 | 1 | 1 | 1 | 1 | 0 | 0 | |
| $y_{11,q}$ | 0 | 1 | 1 | 0 | 0 | 1 | 1 | 0 | 0 | 1 | 1 | 0 | 0 | 1 | 1 | 0 | |
| $\text{Im}(z_q)$ | 1 | 3 | 5 | 7 | 9 | 11 | 13 | 15 | 17 | 19 | 21 | 23 | 25 | 27 | 29 | 31 | Uniform |
| | 1 | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ | NUC |
| $y_{1,q}$ | 0 | 0 | 0 | 0 | 0 | 0 | 0 | 0 | 0 | 0 | 0 | 0 | 0 | 0 | 0 | 0 | |
| $y_{3,q}$ | 0 | 0 | 0 | 0 | 0 | 0 | 0 | 0 | 0 | 0 | 0 | 0 | 0 | 0 | 0 | 0 | |
| $y_{5,q}$ | 1 | 1 | 1 | 1 | 1 | 1 | 1 | 1 | 0 | 0 | 0 | 0 | 0 | 0 | 0 | 0 | |
| $y_{7,q}$ | 0 | 0 | 0 | 0 | 1 | 1 | 1 | 1 | 1 | 1 | 1 | 1 | 0 | 0 | 0 | 0 | |
| $y_{9,q}$ | 0 | 0 | 1 | 1 | 1 | 1 | 0 | 0 | 0 | 0 | 1 | 1 | 1 | 1 | 0 | 0 | |
| $y_{11,q}$ | 0 | 1 | 1 | 0 | 0 | 1 | 1 | 0 | 0 | 1 | 1 | 0 | 0 | 1 | 1 | 0 | |
| $\text{Im}(z_q)$ | 33 | 35 | 37 | 39 | 41 | 43 | 45 | 47 | 49 | 51 | 53 | 55 | 57 | 59 | 61 | 63 | Uniform |
| | $u_{16}$ | $u_{17}$ | $u_{18}$ | $u_{19}$ | $u_{20}$ | $u_{21}$ | $u_{22}$ | $u_{23}$ | $u_{24}$ | $u_{25}$ | $u_{26}$ | $u_{27}$ | $u_{28}$ | $u_{29}$ | $u_{30}$ | $u_{31}$ | NUC |

In the following the definition of the NUC position vectors obtained by use of the above described approach is provided. The signal-to-noise ratio (SNR) is always denoted in dB and corresponds to the average SNR in case of fading channels.

a1) 16-QAM or 4-PAM for a Non-Fading Channel (1. Option)

| SNR | 0 | 0.5 | 1.0 | 1.5 | 2.0 | 2.5 | 3.0 | 3.5 | 4.0 | 4.5 | 5.0 | 5.5 | 6.0 | 6.5 |
|---|---|---|---|---|---|---|---|---|---|---|---|---|---|---|
| $u_1$ | 1.0001 | 1.0001 | 1.0002 | 1.1550 | 1.6201 | 1.9580 | 2.2633 | 2.5594 | 2.8411 | 3.0980 | 3.3357 | 3.5294 | 3.6712 | 3.7520 |
| SNR | 7.0 | 7.5 | 8.0 | 8.5 | 9.0 | 9.5 | 10.0 | 10.5 | 11.0 | 11.5 | 12.0 | 12.5 | 13.0 | 13.5 |

-continued

| $u_1$ | 3.7812 | 3.7480 | 3.6736 | 3.5998 | 3.5184 | 3.4446 | 3.3818 | 3.3239 | 3.2786 | 3.2407 | 3.2109 | 3.1793 | 3.1581 | 3.1390 |
|---|---|---|---|---|---|---|---|---|---|---|---|---|---|---|
| SNR | 14 | 14.5 | 15.0 | 15.5 | 16.0 | 16.5 | 17.0 | 17.5 | 18.0 | 18.5 | 19.0 | 19.5 | 20.0 | |
| $u_1$ | 3.1219 | 3.1078 | 3.0964 | 3.0819 | 3.0774 | 3.0665 | 3.0579 | 3.0528 | 3.0485 | 3.0423 | 3.0411 | 3.0333 | 3.0521 | | a2) 16-QAM or 4-PAM for a Fading Channel (1. Option)

| SNR | 0 | 0.5 | 1.0 | 1.5 | 2.0 | 2.5 | 3.0 | 3.5 | 4.0 | 4.5 | 5.0 | 5.5 | 6.0 | 6.5 | 7.0 |
|---|---|---|---|---|---|---|---|---|---|---|---|---|---|---|---|
| $u_1$ | 1.6289 | 1.8484 | 2.0415 | 2.2247 | 2.3853 | 2.5335 | 2.6736 | 2.7962 | 2.8980 | 2.9832 | 3.0593 | 3.1169 | 3.1616 | 3.1973 | 3.2180 |
| SNR | 7.5 | 8.0 | 8.5 | 9.0 | 9.5 | 10.0 | 10.5 | 11.0 | 11.5 | 12.0 | 12.5 | 13.0 | 13.5 | | |
| $u_1$ | 3.2334 | 3.2427 | 3.2473 | 3.2477 | 3.2463 | 3.2436 | 3.2388 | 3.2312 | 3.2291 | 3.2224 | 3.2149 | 3.2129 | 3.2055 | | |
| SNR | 14 | 14.5 | 15.0 | 15.5 | 16.0 | 16.5 | 17.0 | 17.5 | 18.0 | 18.5 | 19.0 | 19.5 | 20.0 | | |
| $u_1$ | 3.2036 | 3.1976 | 3.1953 | 3.1917 | 3.1854 | 3.1853 | 3.1803 | 3.1799 | 3.1761 | 3.1712 | 3.1715 | 3.1721 | 3.1711 | | | a3) 16-QAM/4-PAM for a Non-Fading Channel (2. Option)

| SNR/u | 0 | 0.5 | 1 | 1.5 | 2 | 2.5 | 3 | 3.5 | 4 | 4.5 | 5 | 5.5 | 6 | 6.5 | 7 | 7.5 |
|---|---|---|---|---|---|---|---|---|---|---|---|---|---|---|---|---|
| u1 | 1.0001 | 1.0001 | 1.0002 | 1.155 | 1.6201 | 1.958 | 2.2633 | 2.5594 | 2.8411 | 3.098 | 3.3357 | 3.5294 | 3.6712 | 3.752 | 3.7812 | 3.748 |
| SNR/u | 8 | 8.5 | 9 | 9.5 | 10 | 10.5 | 11 | 11.5 | 12 | 12.5 | 13 | 13.5 | 14 | | | |
| u1 | 3.6736 | 3.5998 | 3.5184 | 3.4446 | 3.3818 | 3.3239 | 3.2786 | 3.2407 | 3.2109 | 3.1793 | 3.1581 | 3.139 | 3.1219 | | | |
| SNR/u | 14.5 | 15 | 15.5 | 16 | 16.5 | 17 | 17.5 | 18 | 18.5 | 19 | 19.5 | 20 | | | | |
| u1 | 3.1078 | 3.0964 | 3.0819 | 3.0774 | 3.0665 | 3.0579 | 3.0528 | 3.0485 | 3.0423 | 3.0411 | 3.0333 | 3.0521 | | | | | a4) 16-QAM/4-PAM for a Fading Channel (2. Option)

| SNR | 0 | 0.5 | 1 | 1.5 | 2 | 2.5 | 3 | 3.5 | 4 | 4.5 | 5 | 5.5 | 6 | 6.5 |
|---|---|---|---|---|---|---|---|---|---|---|---|---|---|---|
| u1 | 1.6289 | 1.8484 | 2.0415 | 2.2247 | 2.3853 | 2.5335 | 2.6736 | 2.7962 | 2.898 | 2.9832 | 3.0593 | 3.1169 | 3.1616 | 3.1973 |
| SNR | 7 | 7.5 | 8 | 8.5 | 9 | 9.5 | 10 | 10.5 | 11 | 11.5 | 12 | 12.5 | 13 | 13.5 |
| u1 | 3.218 | 3.2334 | 3.2427 | 3.2473 | 3.2477 | 3.2463 | 3.2436 | 3.2388 | 3.2312 | 3.2291 | 3.2224 | 3.2149 | 3.2129 | 3.2055 |
| SNR | 14 | 14.5 | 15 | 15.5 | 16 | 16.5 | 17 | 17.5 | 18 | 18.5 | 19 | 19.5 | 20 | |
| u1 | 3.2036 | 3.1976 | 3.1953 | 3.1917 | 3.1854 | 3.1853 | 3.1803 | 3.1799 | 3.1761 | 3.1712 | 3.1715 | 3.1721 | 3.1711 | | b1) 64-QAM or 8-PAM for a Non-Fading Channel (1. Option)

| SNR | 5 | 6 | 7 | 8 | 9 | 10 | 11 | 12 | 13 | 14 | 15 | 16 | 17 |
|---|---|---|---|---|---|---|---|---|---|---|---|---|---|
| $u_1$ | 1.0000 | 1.0022 | 1.0009 | 1.1945 | 1.4265 | 1.7169 | 2.0784 | 2.4886 | 2.8098 | 2.9798 | 3.0657 | 3.0895 | 3.0744 |
| $u_2$ | 2.6799 | 3.6839 | 3.7714 | 3.5638 | 3.6893 | 3.9984 | 4.4060 | 4.8482 | 5.2018 | 5.4093 | 5.5100 | 5.4881 | 5.3864 |
| $u_3$ | 3.4087 | 3.6839 | 3.7779 | 4.6322 | 5.4024 | 6.2400 | 7.1114 | 7.9262 | 8.4762 | 8.7005 | 8.7024 | 8.4935 | 8.1750 |
| SNR | 18 | 19 | 20 | 21 | 22 | 23 | 24 | 25 | 26 | 27 | 28 | 29 | 30 |
| $u_1$ | 3.0557 | 3.0409 | 3.0309 | 3.0244 | 3.0180 | 3.0140 | 3.0153 | 3.0107 | 3.0001 | 2.7744 | 2.2837 | 3.0137 | 1.9278 |
| $u_2$ | 5.2889 | 5.2157 | 5.1647 | 5.1260 | 5.0979 | 5.0766 | 5.0685 | 5.0403 | 5.0254 | 4.5265 | 3.3188 | 5.1307 | 3.2632 |
| $u_3$ | 7.8949 | 7.6816 | 7.5265 | 7.4114 | 7.3213 | 7.2517 | 7.2083 | 7.1286 | 7.1277 | 6.6760 | 5.0386 | 6.6178 | 4.4151 | b2) 64-QAM or 8-PAM for a Fading Channel (1. Option)

| SNR | 5 | 6 | 7 | 8 | 9 | 10 | 11 | 12 | 13 | 14 | 15 | 16 | 17 |
|---|---|---|---|---|---|---|---|---|---|---|---|---|---|
| $u_1$ | 1.0353 | 1.1062 | 1.2092 | 1.3451 | 1.5409 | 1.8112 | 2.1208 | 2.3945 | 2.6067 | 2.7560 | 2.8505 | 2.9120 | 2.9496 |
| $u_2$ | 2.8206 | 2.9015 | 3.0799 | 3.2980 | 3.5826 | 3.9386 | 4.3237 | 4.6577 | 4.9074 | 5.0773 | 5.1674 | 5.2201 | 5.2393 |
| $u_3$ | 3.4534 | 3.9220 | 4.4154 | 4.9297 | 5.5069 | 6.1594 | 6.8108 | 7.3475 | 7.7177 | 7.9488 | 8.0398 | 8.0680 | 8.0538 |

| SNR | 18 | 19 | 20 | 21 | 22 | 23 | 24 | 25 | 26 | 27 | 28 | 29 | 30 |
|---|---|---|---|---|---|---|---|---|---|---|---|---|---|
| $u_1$ | 2.9751 | 2.9907 | 3.0032 | 3.0055 | 3.0126 | 3.0124 | 3.0136 | 3.0165 | 3.0156 | 3.0158 | 3.0160 | 3.0180 | 3.0183 |
| $u_2$ | 5.2491 | 5.2493 | 5.2489 | 5.2365 | 5.2375 | 5.2247 | 5.2182 | 5.2165 | 5.2098 | 5.2070 | 5.2040 | 5.2036 | 5.1995 |
| $u_3$ | 8.0217 | 7.9849 | 7.9528 | 7.9035 | 7.8862 | 7.8443 | 7.8194 | 7.8046 | 7.7839 | 7.7661 | 7.7620 | 7.7569 | 7.7566 | b3) 64-QAM/8-PAM for a Non-Fading Channel (2. Option)

| SNR | 0 | 1 | 2 | 3 | 4 | 5 | 6 | 7 | 8 | 9 | 10 | 11 |
|---|---|---|---|---|---|---|---|---|---|---|---|---|
| u1 | 1.0007 | 1.0017 | 0.7353 | 0.9997 | 1.0002 | 0.9998 | 1.0001 | 1 | 1.1927 | 1.4264 | 1.7169 | 2.0738 |
| u2 | 1.0005 | 1.0004 | 1.0005 | 2.2657 | 2.8429 | 3.337 | 3.6717 | 3.7738 | 3.5613 | 3.6905 | 3.9984 | 4.3992 |
| u3 | 0.9998 | 0.9999 | 1.4855 | 2.2642 | 2.842 | 3.3367 | 3.6718 | 3.775 | 4.6253 | 5.4009 | 6.24 | 7.1031 |

| SNR | 12 | 13 | 14 | 15 | 16 | 17 | 18 | 19 | 20 | 21 | 22 | 23 |
|---|---|---|---|---|---|---|---|---|---|---|---|---|
| u1 | 2.4886 | 2.8112 | 2.9803 | 3.0658 | 3.089 | 3.0745 | 3.0551 | 3.0408 | 3.0308 | 3.0234 | 3.0183 | 3.0146 |
| u2 | 4.8482 | 5.2041 | 5.4101 | 5.5099 | 5.4876 | 5.3868 | 5.288 | 5.2157 | 5.1639 | 5.1262 | 5.0982 | 5.0776 |
| u3 | 7.9262 | 8.4801 | 8.7018 | 8.7025 | 8.4931 | 8.1754 | 7.8925 | 7.6814 | 7.5255 | 7.4093 | 7.3204 | 7.2536 |

| SNR | 24 | 25 | 26 | 27 | 28 | 29 | 30 |
|---|---|---|---|---|---|---|---|
| u1 | 3.0117 | 3.006 | 2.9999 | 3.0181 | 3.1429 | 2.5878 | 2.6804 |
| u2 | 5.0613 | 5.0467 | 5.0116 | 5.0174 | 5.2147 | 4.0051 | 4.2638 |
| u3 | 7.2029 | 7.156 | 7.1015 | 7.12 | 7.481 | 5.6207 | 5.7796 | b4) 64-QAM/8-PAM for a Fading Channel (2. Option)

| SNR | 5 | 6 | 7 | 8 | 9 | 10 | 11 | 12 | 13 | 14 | 15 | 16 |
|---|---|---|---|---|---|---|---|---|---|---|---|---|
| u1 | 1.0353 | 1.1062 | 1.2092 | 1.3451 | 1.5409 | 1.8112 | 2.1208 | 2.3945 | 2.6067 | 2.756 | 2.8505 | 2.912 |
| u2 | 2.8206 | 2.9015 | 3.0799 | 3.298 | 3.5826 | 3.9386 | 4.3237 | 4.6577 | 4.9074 | 5.0773 | 5.1674 | 5.2201 |
| u3 | 3.4534 | 3.922 | 4.4154 | 4.9297 | 5.5069 | 6.1594 | 6.8108 | 7.3475 | 7.7177 | 7.9488 | 8.0398 | 8.068 |

| SNR | 17 | 18 | 19 | 20 | 21 | 22 | 23 | 24 | 25 | 26 |
|---|---|---|---|---|---|---|---|---|---|---|
| u1 | 2.9496 | 2.9751 | 2.9907 | 3.0032 | 3.0055 | 3.0126 | 3.0124 | 3.0136 | 3.0165 | 3.0156 |
| u2 | 5.2393 | 5.2491 | 5.2493 | 5.2489 | 5.2365 | 5.2375 | 5.2247 | 5.2182 | 5.2165 | 5.2098 |
| u3 | 8.0538 | 8.0217 | 7.9849 | 7.9528 | 7.9035 | 7.8862 | 7.8443 | 7.8194 | 7.8046 | 7.7839 |

| SNR | 27 | 28 | 29 | 30 |
|---|---|---|---|---|
| u1 | 3.0158 | 3.016 | 3.018 | 3.0183 |
| u2 | 5.207 | 5.204 | 5.2036 | 5.1995 |
| u3 | 7.7661 | 7.762 | 7.7569 | 7.7566 | c1) 256-QAM or 16-PAM for a Non-Fading Channel (1. Optioin)

| SNR | 5 | 6 | 7 | 8 | 9 | 10 | 11 | 12 | 13 | 14 | 15 | 16 | 17 |
|---|---|---|---|---|---|---|---|---|---|---|---|---|---|
| $u_1$ | 1.0097 | 1.0665 | 1.0768 | 1.0930 | 1.1066 | 1.0503 | 1.0278 | 1.0000 | 1.0000 | 1.0000 | 1.0000 | 1.0256 | 1.1132 |
| $u_2$ | 1.0243 | 1.4150 | 1.2578 | 1.4817 | 1.7257 | 1.9773 | 2.1334 | 2.3571 | 2.6866 | 2.8218 | 2.9484 | 3.0100 | 3.0828 |
| $u_3$ | 1.0300 | 1.6034 | 1.2587 | 1.5300 | 1.7257 | 1.9773 | 2.1334 | 2.3622 | 2.7092 | 2.8892 | 3.1149 | 3.2249 | 3.4673 |
| $u_4$ | 2.6821 | 3.3596 | 3.4255 | 3.7766 | 3.9138 | 4.1612 | 4.3125 | 4.4722 | 4.8316 | 4.9033 | 5.1366 | 5.2497 | 5.4373 |
| $u_5$ | 2.6821 | 3.3596 | 3.4255 | 3.7766 | 3.9375 | 4.1734 | 4.4861 | 4.8450 | 5.3535 | 5.5528 | 5.8510 | 6.0534 | 6.5183 |
| $u_6$ | 3.3063 | 4.0879 | 4.3286 | 4.6970 | 5.0898 | 5.6363 | 6.3912 | 6.8392 | 7.6085 | 7.9200 | 8.3122 | 8.4791 | 8.8521 |
| $u_7$ | 3.6820 | 4.7573 | 4.7284 | 5.4489 | 6.2380 | 6.5675 | 7.7493 | 8.8112 | 10.0024 | 10.6021 | 11.1960 | 11.3836 | 11.7747 |

| SNR | 18 | 19 | 20 | 21 | 22 | 23 | 24 | 25 | 26 | 27 | 28 | 29 | 30 |
|---|---|---|---|---|---|---|---|---|---|---|---|---|---|
| $u_1$ | 1.3440 | 2.0909 | 2.7505 | 2.9606 | 3.0120 | 3.0176 | 3.0142 | 3.0104 | 3.0073 | 3.0054 | 3.0042 | 3.0022 | 2.9919 |
| $u_2$ | 3.2921 | 4.0957 | 4.8095 | 5.0402 | 5.0981 | 5.0934 | 5.0719 | 5.0525 | 5.0386 | 5.0269 | 5.0222 | 5.0150 | 5.0017 |

-continued

| | | | | | | | | | | | | | |
|---|---|---|---|---|---|---|---|---|---|---|---|---|---|
| $u_3$ | 4.0379 | 5.5745 | 6.8101 | 7.2061 | 7.2981 | 7.2676 | 7.2042 | 7.1500 | 7.1120 | 7.0845 | 7.0663 | 7.0475 | 7.0199 |
| $u_4$ | 5.9945 | 7.7068 | 9.1334 | 9.6065 | 9.6891 | 9.5883 | 9.4460 | 9.3305 | 9.2485 | 9.1897 | 9.1488 | 9.1103 | 9.0581 |
| $u_5$ | 7.5727 | 9.9098 | 11.7487 | 12.3192 | 12.3427 | 12.1129 | 11.8445 | 11.6314 | 11.4793 | 11.3645 | 11.2861 | 11.2158 | 11.1448 |
| $u_6$ | 9.9517 | 12.7455 | 14.9217 | 15.4925 | 15.3646 | 14.9269 | 14.4704 | 14.1111 | 13.8500 | 13.6527 | 13.5110 | 13.3957 | 13.2816 |
| $u_7$ | 13.0332 | 16.3954 | 18.9099 | 19.3657 | 18.9656 | 18.2095 | 17.4738 | 16.8947 | 16.4666 | 16.1368 | 15.8975 | 15.6946 | 15.5305 | c2) 256-QAM or 16-PAM for a Fading Channel (1. Option)

| SNR | 5 | 6 | 7 | 8 | 9 | 10 | 11 | 12 | 13 | 14 | 15 | 16 | 17 |
|---|---|---|---|---|---|---|---|---|---|---|---|---|---|
| $u_1$ | 1.0356 | 1.0100 | 1.0290 | 1.0219 | 1.0329 | 1.0094 | 1.0111 | 1.0000 | 1.0000 | 1.0001 | 1.0246 | 1.1185 | 1.3950 |
| $u_2$ | 1.3828 | 1.3870 | 1.5299 | 1.4838 | 1.7668 | 1.9127 | 2.1472 | 2.2908 | 2.4733 | 2.6105 | 2.7092 | 2.8453 | 3.1765 |
| $u_3$ | 1.3992 | 1.3870 | 1.5492 | 1.4838 | 1.7668 | 1.9127 | 2.1472 | 2.3051 | 2.5255 | 2.7354 | 2.9390 | 3.2706 | 3.9636 |
| $u_4$ | 3.0045 | 3.1253 | 3.3047 | 3.3824 | 3.7309 | 3.9074 | 4.1429 | 4.3242 | 4.5173 | 4.6739 | 4.8281 | 5.1438 | 5.9227 |
| $u_5$ | 3.0045 | 3.1449 | 3.3048 | 3.4113 | 3.7801 | 4.0235 | 4.3590 | 4.7401 | 5.0524 | 5.3659 | 5.7359 | 6.3140 | 7.4309 |
| $u_6$ | 3.6491 | 4.1004 | 4.3581 | 4.6594 | 5.1755 | 5.6876 | 6.0417 | 6.6189 | 7.0304 | 7.3939 | 7.7768 | 8.4290 | 9.7743 |
| $u_7$ | 4.3373 | 4.5258 | 4.9468 | 5.3793 | 5.9000 | 6.6271 | 7.4630 | 8.7179 | 9.2916 | 9.7803 | 10.2831 | 11.1015 | 12.7817 |

| SNR | 18 | 19 | 20 | 21 | 22 | 23 | 24 | 25 | 26 | 27 | 28 | 29 | 30 |
|---|---|---|---|---|---|---|---|---|---|---|---|---|---|
| $u_1$ | 1.8520 | 2.2282 | 2.4888 | 2.6609 | 2.7728 | 2.8431 | 2.8888 | 2.9170 | 2.9375 | 2.9504 | 2.9593 | 2.9671 | 2.9692 |
| $u_2$ | 3.7148 | 4.1544 | 4.4597 | 4.6629 | 4.7937 | 4.8730 | 4.9250 | 4.9552 | 4.9771 | 4.9892 | 4.9973 | 5.0074 | 5.0060 |
| $u_3$ | 4.9210 | 5.6758 | 6.1947 | 6.5358 | 6.7533 | 6.8809 | 6.9632 | 7.0090 | 7.0410 | 7.0554 | 7.0668 | 7.0806 | 7.0767 |
| $u_4$ | 7.0428 | 7.9073 | 8.4842 | 8.8475 | 9.0687 | 9.1840 | 9.2515 | 9.2802 | 9.2999 | 9.2969 | 9.2999 | 9.3060 | 9.2919 |
| $u_5$ | 8.9081 | 10.0295 | 10.7658 | 11.2198 | 11.4828 | 11.6084 | 11.6720 | 11.6871 | 11.6912 | 11.6733 | 11.6622 | 11.6610 | 11.6332 |
| $u_6$ | 11.5661 | 12.8870 | 13.7176 | 14.1966 | 14.4408 | 14.5284 | 14.5407 | 14.5072 | 14.4683 | 14.4127 | 14.3708 | 14.3439 | 14.2915 |
| $u_7$ | 14.9910 | 16.5637 | 17.4984 | 17.9831 | 18.1769 | 18.1849 | 18.1070 | 17.9950 | 17.8844 | 17.7634 | 17.6707 | 17.6011 | 17.5056 | c3) 256-QAM/16-PAM for a Non-Fading Channel (2. Option)

| SNR | 0 | 1 | 2 | 3 | 4 | 5 | 6 | 7 | 8 | 9 | 10 | 11 |
|---|---|---|---|---|---|---|---|---|---|---|---|---|
| u1 | 0.9987 | 1 | 0.8555 | 0.9986 | 1.0007 | 0.9999 | 1 | 1.0001 | 1.1538 | 1.2053 | 1.1098 | 1.0113 |
| u2 | 0.9995 | 0.9988 | 0.6438 | 0.999 | 1.0022 | 1.0008 | 0.9997 | 1 | 1.3318 | 1.4592 | 1.5806 | 1.8511 |
| u3 | 1.0006 | 1.0012 | 0.7241 | 0.9997 | 1.0003 | 0.9994 | 1.0002 | 1 | 1.1537 | 1.2044 | 1.4081 | 1.7918 |
| u4 | 1.0014 | 0.9977 | 0.9802 | 2.2701 | 2.8454 | 3.336 | 3.6707 | 3.7727 | 4.0051 | 4.1314 | 3.8919 | 3.9933 |
| u5 | 0.9994 | 0.9966 | 0.8403 | 2.261 | 2.8447 | 3.3359 | 3.6718 | 3.7726 | 3.5919 | 3.7449 | 3.8725 | 4.2278 |
| u6 | 0.9984 | 0.9972 | 1.2098 | 2.2574 | 2.8455 | 3.3381 | 3.6727 | 3.7737 | 4.0063 | 4.1297 | 4.7175 | 5.7442 |
| u7 | 1.0001 | 0.9996 | 1.4732 | 2.265 | 2.8465 | 3.3369 | 3.6713 | 3.7738 | 5.9093 | 6.4423 | 6.812 | 7.6428 |

| SNR | 12 | 13 | 14 | 15 | 16 | 17 | 18 | 19 | 20 | 21 | 22 | 23 |
|---|---|---|---|---|---|---|---|---|---|---|---|---|
| u1 | 0.9755 | 0.961 | 0.9653 | 0.9856 | 1.0251 | 1.1128 | 1.3449 | 2.0965 | 2.7527 | 2.9608 | 3.012 | 3.0177 |
| u2 | 2.1909 | 2.5454 | 2.7901 | 2.9261 | 3.0106 | 3.0821 | 3.2917 | 4.1039 | 4.811 | 5.0404 | 5.0984 | 5.0934 |
| u3 | 2.1934 | 2.5919 | 2.88 | 3.0661 | 3.2252 | 3.4662 | 4.0382 | 5.5877 | 6.8118 | 7.2066 | 7.2996 | 7.2675 |
| u4 | 4.2942 | 4.6269 | 4.8939 | 5.0926 | 5.2509 | 5.436 | 5.9941 | 7.7231 | 9.1364 | 9.6073 | 9.6907 | 9.5882 |
| u5 | 4.6785 | 5.1556 | 5.5283 | 5.7961 | 6.055 | 6.5161 | 7.5736 | 9.9317 | 11.7532 | 12.3202 | 12.3438 | 12.1129 |
| u6 | 6.5854 | 7.3386 | 7.8908 | 8.2396 | 8.4806 | 8.8492 | 9.9513 | 12.7737 | 14.9274 | 15.4938 | 15.3648 | 14.9271 |
| u7 | 8.6591 | 9.7477 | 10.5917 | 11.0972 | 11.3853 | 11.7713 | 13.0322 | 16.4337 | 18.9135 | 19.3674 | 18.9636 | 18.2094 |

| SNR | 24 | 25 | 26 | 27 | 28 | 29 | 30 |
|---|---|---|---|---|---|---|---|
| u1 | 3.0143 | 3.0103 | 3.0079 | 3.0062 | 3.0044 | 3.0038 | 3.003 |
| u2 | 5.0717 | 5.0526 | 5.0399 | 5.0306 | 5.023 | 5.0178 | 5.0128 |
| u3 | 7.2034 | 7.15 | 7.1134 | 7.0869 | 7.067 | 7.0512 | 7.0407 |
| u4 | 9.4452 | 9.3304 | 9.2506 | 9.1924 | 9.1486 | 9.1126 | 9.0893 |
| u5 | 11.8432 | 11.6313 | 11.4811 | 11.3712 | 11.2883 | 11.2217 | 11.1749 |
| u6 | 14.4683 | 14.1107 | 13.8529 | 13.661 | 13.5157 | 13.3981 | 13.3164 |
| u7 | 17.4708 | 16.8942 | 16.4697 | 16.1476 | 15.9014 | 15.7029 | 15.5677 | c4) 256-QAM/16-PAM for the Fading Channel (2. Option)

| SNR | 0 | 1 | 2 | 3 | 4 | 5 | 6 | 7 | 8 | 9 | 10 | 11 |
|---|---|---|---|---|---|---|---|---|---|---|---|---|
| u1 | 0.9798 | 0.9967 | 0.9947 | 0.9971 | 1.0007 | 1.03 | 1.0688 | 1.0762 | 1.0537 | 1.0342 | 1.0147 | 0.9992 |
| u2 | 0.8908 | 1.0016 | 0.9934 | 1.0006 | 0.9987 | 1.0588 | 1.1381 | 1.2317 | 1.3585 | 1.5225 | 1.7405 | 2.0063 |
| u3 | 0.9072 | 1.0041 | 0.9993 | 1.0003 | 0.9997 | 1.0295 | 1.0664 | 1.1441 | 1.2863 | 1.4689 | 1.7111 | 2.0037 |
| u4 | 1.4244 | 2.0539 | 2.4036 | 2.6739 | 2.9049 | 3.019 | 3.2106 | 3.239 | 3.2891 | 3.4602 | 3.7019 | 3.9966 |
| u5 | 1.3906 | 2.0371 | 2.3593 | 2.6731 | 2.9097 | 2.6841 | 2.8603 | 3.0627 | 3.3005 | 3.5807 | 3.9182 | 4.3056 |

-continued

| | | | | | | | | | | | | |
|---|---|---|---|---|---|---|---|---|---|---|---|---|
| u6 | 1.5899 | 2.024 | 2.3535 | 2.6762 | 2.8921 | 3.0205 | 3.2171 | 3.6521 | 4.2742 | 4.8242 | 5.3945 | 5.997 |
| u7 | 1.6351 | 2.042 | 2.3973 | 2.6721 | 2.8859 | 3.9489 | 4.5222 | 5.0297 | 5.6081 | 6.271 | 7.0282 | 7.8489 |

| SNR | 12 | 13 | 14 | 15 | 16 | 17 | 18 | 19 | 20 | 21 | 22 | 23 |
|---|---|---|---|---|---|---|---|---|---|---|---|---|
| u1 | 0.9918 | 0.9922 | 0.9989 | 1.0259 | 1.1155 | 1.3963 | 1.8534 | 2.2282 | 2.4891 | 2.6619 | 2.7729 | 2.8437 |
| u2 | 2.2615 | 2.4654 | 2.6086 | 2.7135 | 2.8419 | 3.1795 | 3.7175 | 4.1541 | 4.4608 | 4.664 | 4.7936 | 4.8758 |
| u3 | 2.2873 | 2.5275 | 2.7307 | 2.9443 | 3.2659 | 3.9675 | 4.9244 | 5.676 | 6.197 | 6.5386 | 6.7531 | 6.8857 |
| u4 | 4.2761 | 4.5013 | 4.6692 | 4.8339 | 5.1383 | 5.9281 | 7.0475 | 7.9072 | 8.4862 | 8.8521 | 9.0685 | 9.1906 |
| u5 | 4.6871 | 5.0312 | 5.3576 | 5.7413 | 6.3082 | 7.4353 | 8.9135 | 10.0292 | 10.7694 | 11.2248 | 11.4823 | 11.6157 |
| u6 | 6.5483 | 7.0034 | 7.3828 | 7.7887 | 8.4196 | 9.7825 | 11.5726 | 12.8864 | 13.7217 | 14.2018 | 14.4402 | 14.5326 |
| u7 | 8.6107 | 9.2424 | 9.7612 | 10.2938 | 11.0879 | 12.7927 | 15.0009 | 16.5632 | 17.5017 | 17.9894 | 18.1764 | 18.1926 |

| SNR | 24 | 25 | 26 | 27 | 28 | 29 | 30 | 31 | 32 | 33 | 34 | 35 |
|---|---|---|---|---|---|---|---|---|---|---|---|---|
| u1 | 2.889 | 2.9176 | 2.9379 | 2.9516 | 2.9597 | 2.9661 | 2.9708 | 2.9726 | 2.9757 | 2.979 | 2.9795 | 2.9803 |
| u2 | 4.9257 | 4.956 | 4.9778 | 4.9933 | 4.9991 | 5.0047 | 5.0081 | 5.009 | 5.0124 | 5.0173 | 5.0145 | 5.016 |
| u3 | 6.9639 | 7.0096 | 7.0412 | 7.064 | 7.0698 | 7.0758 | 7.0795 | 7.0795 | 7.0819 | 7.0887 | 7.0822 | 7.086 |
| u4 | 9.253 | 9.282 | 9.3008 | 9.3117 | 9.3029 | 9.2996 | 9.2958 | 9.2878 | 9.2861 | 9.2921 | 9.2787 | 9.2803 |
| u5 | 11.6732 | 11.6881 | 11.6943 | 11.6904 | 11.668 | 11.6526 | 11.6385 | 11.6222 | 11.6137 | 11.6142 | 11.5969 | 11.5934 |
| u6 | 14.5421 | 14.508 | 14.472 | 14.4315 | 14.3754 | 14.3333 | 14.2955 | 14.2621 | 14.2394 | 14.2301 | 14.2009 | 14.1909 |
| u7 | 18.1172 | 17.9984 | 17.8904 | 17.7896 | 17.6749 | 17.5886 | 17.5132 | 17.4498 | 17.4048 | 17.3749 | 17.3292 | 17.307 |

| SNR | 36 | 37 | 38 | 39 | 40 |
|---|---|---|---|---|---|
| u1 | 2.981 | 2.982 | 2.9813 | 2.9795 | 2.9788 |
| u2 | 5.0165 | 5.0165 | 5.0154 | 5.0085 | 5.0096 |
| u3 | 7.086 | 7.0867 | 7.0883 | 7.0759 | 7.0772 |
| u4 | 9.2787 | 9.2784 | 9.2785 | 9.2623 | 9.2664 |
| u5 | 11.5903 | 11.5892 | 11.5893 | 11.5636 | 11.561 |
| u6 | 14.1835 | 14.1804 | 14.173 | 14.1335 | 14.1421 |
| u7 | 17.2908 | 17.2734 | 17.2633 | 17.208 | 17.2206 | d1) 1024-QAM or 32-PAM for a Non-Fading Channel (1. Option)

| SNR | 8 | 9 | 10 | 11 | 12 | 13 | 14 | 15 | 16 | 17 | 18 |
|---|---|---|---|---|---|---|---|---|---|---|---|
| $u_1$ | 1.0067 | 1.0148 | 1.0507 | 1.0476 | 1.0198 | 1.0464 | 1.0909 | 1.0037 | 1.0187 | 1.0148 | 1.0251 |
| $u_2$ | 1.0380 | 1.0523 | 1.0845 | 1.0835 | 1.0373 | 1.0701 | 1.0910 | 1.0428 | 1.0711 | 1.1108 | 1.2863 |
| $u_3$ | 1.0695 | 1.0949 | 1.1046 | 1.1376 | 1.0754 | 1.0813 | 1.1644 | 1.0447 | 1.0807 | 1.1364 | 1.2891 |
| $u_4$ | 1.6402 | 1.8347 | 2.0518 | 2.5314 | 2.6729 | 2.9275 | 3.0920 | 2.9924 | 3.0361 | 3.0693 | 3.3256 |
| $u_5$ | 1.6741 | 1.9096 | 2.1058 | 2.5742 | 2.7200 | 2.9512 | 3.1966 | 3.0105 | 3.0631 | 3.0902 | 3.3296 |
| $u_6$ | 1.6802 | 1.9096 | 2.1287 | 2.5742 | 2.7278 | 3.0476 | 3.2399 | 3.1832 | 3.3080 | 3.4418 | 3.9436 |
| $u_7$ | 1.7120 | 1.9314 | 2.1552 | 2.6395 | 2.7641 | 3.0980 | 3.3711 | 3.3133 | 3.3430 | 3.4430 | 3.9450 |
| $u_8$ | 3.7616 | 3.9751 | 4.2512 | 4.6900 | 4.7720 | 5.0430 | 5.3006 | 5.1666 | 5.2248 | 5.3743 | 5.9219 |
| $u_9$ | 3.7988 | 4.0277 | 4.3122 | 4.7622 | 4.8209 | 5.1017 | 5.4156 | 5.1666 | 5.2248 | 5.3743 | 5.9219 |
| $u_{10}$ | 3.7988 | 4.0671 | 4.3749 | 4.8789 | 5.0144 | 5.5053 | 5.8716 | 5.8269 | 5.9842 | 6.2741 | 7.2272 |
| $u_{11}$ | 3.8518 | 4.1230 | 4.3905 | 4.8870 | 5.0144 | 5.5054 | 5.8763 | 6.0961 | 6.4804 | 7.4547 |
| $u_{12}$ | 4.8732 | 5.3269 | 6.0182 | 6.8091 | 7.0796 | 7.6797 | 8.0443 | 7.9004 | 7.9850 | 8.3476 | 9.4109 |
| $u_{13}$ | 4.9607 | 5.3481 | 6.0182 | 6.8466 | 7.0905 | 7.6878 | 8.1462 | 8.2883 | 8.3856 | 8.9683 | 10.1262 |
| $u_{14}$ | 5.5363 | 5.9883 | 6.7380 | 7.6823 | 8.1294 | 8.8170 | 9.3690 | 9.9247 | 10.1499 | 11.0046 | 12.4646 |
| $u_{15}$ | 5.7097 | 6.5205 | 7.2058 | 8.0785 | 8.4303 | 9.8312 | 10.9109 | 11.9003 | 12.0120 | 13.4835 | 15.2549 |

| SNR | 19 | 20 | 21 | 22 | 23 | 24 | 25 | 26 | 27 | 28 | 29 |
|---|---|---|---|---|---|---|---|---|---|---|---|
| $u_1$ | 1.0024 | 1.0006 | 1.0016 | 1.0005 | 1.0031 | 1.0346 | 1.2687 | 2.5688 | 2.9137 | 2.9903 | 3.0038 |
| $u_2$ | 1.7107 | 2.5479 | 2.8831 | 2.9838 | 3.0077 | 3.0243 | 3.2174 | 4.5722 | 4.9309 | 5.0103 | 5.0225 |
| $u_3$ | 1.7141 | 2.5515 | 2.8832 | 2.9845 | 3.0245 | 3.1135 | 3.6704 | 6.2334 | 6.8977 | 7.0454 | 7.0642 |
| $u_4$ | 3.6770 | 4.5909 | 4.9553 | 5.0538 | 5.0615 | 5.0609 | 5.4996 | 8.2567 | 8.9703 | 9.1297 | 9.1403 |
| $u_5$ | 3.6786 | 4.5909 | 4.9553 | 5.0704 | 5.1383 | 5.3184 | 6.3316 | 10.0819 | 11.0442 | 11.2591 | 11.2602 |
| $u_6$ | 4.8209 | 6.4238 | 7.0286 | 7.1835 | 7.1646 | 7.1593 | 8.0505 | 12.1692 | 13.2274 | 13.4612 | 13.4368 |
| $u_7$ | 4.8209 | 6.4274 | 7.0642 | 7.2914 | 7.4407 | 7.8023 | 9.3361 | 14.2128 | 15.4757 | 15.7441 | 15.6806 |
| $u_8$ | 6.8262 | 8.6260 | 9.3012 | 9.4393 | 9.3945 | 9.5457 | 11.0297 | 16.4523 | 17.8558 | 18.1316 | 18.0048 |
| $u_9$ | 6.8553 | 8.7222 | 9.5195 | 9.8531 | 10.1506 | 10.7731 | 12.6757 | 18.7884 | 20.3719 | 20.6408 | 20.4242 |
| $u_{10}$ | 8.6131 | 10.9071 | 11.7486 | 11.9625 | 12.0642 | 12.5104 | 14.5305 | 21.3353 | 23.0690 | 23.2947 | 22.9559 |
| $u_{11}$ | 8.9135 | 11.4255 | 12.5514 | 13.0881 | 13.5886 | 14.2704 | 16.5415 | 24.1089 | 25.9761 | 26.1177 | 25.6206 |
| $u_{12}$ | 11.0009 | 13.7880 | 14.9096 | 15.3045 | 15.6473 | 16.3124 | 18.7922 | 27.1742 | 29.1347 | 29.1436 | 28.4455 |
| $u_{13}$ | 11.9746 | 15.2957 | 16.9425 | 17.5792 | 17.9741 | 18.6433 | 21.3263 | 30.5883 | 32.5987 | 32.4209 | 31.4714 |
| $u_{14}$ | 14.5395 | 18.2064 | 19.8795 | 20.4586 | 20.7562 | 21.3536 | 24.2238 | 34.4505 | 36.4620 | 36.0306 | 34.7706 |
| $u_{15}$ | 17.7040 | 21.9252 | 23.6632 | 24.0824 | 24.1747 | 24.6202 | 27.6622 | 38.9891 | 40.9391 | 40.1627 | 38.5012 |

| SNR | 30 | 31 | 32 | 33 | 34 | 35 | 36 | 37 | 38 | 39 | 40 |
|---|---|---|---|---|---|---|---|---|---|---|---|
| $u_1$ | 3.0029 | 3.0028 | 3.0023 | 3.0037 | 3.0010 | 3.0022 | 2.9991 | 3.0009 | 2.9630 | 2.7120 | 2.4609 |
| $u_2$ | 5.0173 | 5.0132 | 5.0104 | 5.0116 | 5.0054 | 5.0074 | 5.0111 | 5.0049 | 4.9499 | 4.2412 | 3.3493 |

-continued

| | | | | | | | | | | |
|---|---|---|---|---|---|---|---|---|---|---|
| $u_3$ | 7.0495 | 7.0372 | 7.0285 | 7.0273 | 7.0167 | 7.0181 | 7.0328 | 7.0073 | 6.9154 | 5.8741 | 4.7174 |
| $u_4$ | 9.1072 | 9.0800 | 9.0612 | 9.0527 | 9.0358 | 9.0349 | 9.0456 | 9.0153 | 8.8955 | 7.6262 | 6.4878 |
| $u_5$ | 11.1981 | 11.1476 | 11.1119 | 11.0933 | 11.0668 | 11.0584 | 11.0454 | 11.0325 | 10.8427 | 8.9624 | 7.7169 |
| $u_6$ | 13.3309 | 13.2465 | 13.1864 | 13.1515 | 13.1108 | 13.0955 | 13.0779 | 13.0621 | 12.7897 | 10.8692 | 8.5130 |
| $u_7$ | 15.5146 | 15.3830 | 15.2899 | 15.2330 | 15.1738 | 15.1445 | 15.0931 | 15.1013 | 14.7269 | 12.0858 | 9.8751 |
| $u_8$ | 17.7592 | 17.5659 | 17.4290 | 17.3407 | 17.2566 | 17.2099 | 17.1422 | 17.1488 | 16.6081 | 13.7050 | 11.5486 |
| $u_9$ | 20.0760 | 19.8040 | 19.6107 | 19.4829 | 19.3658 | 19.2996 | 19.1878 | 19.2029 | 18.5568 | 15.1881 | 12.4136 |
| $u_{10}$ | 22.4791 | 22.1087 | 21.8439 | 21.6641 | 21.5065 | 21.4089 | 21.2611 | 21.2792 | 20.1847 | 16.9468 | 14.2051 |
| $u_{11}$ | 24.9859 | 24.4938 | 24.1410 | 23.8963 | 23.6863 | 23.5530 | 23.3458 | 23.3490 | 21.2990 | 18.7549 | 15.1350 |
| $u_{12}$ | 27.6192 | 26.9793 | 26.5155 | 26.1908 | 25.9177 | 25.7334 | 25.4559 | 25.4652 | 24.3404 | 20.4199 | 16.3718 |
| $u_{13}$ | 30.4127 | 29.5936 | 28.9967 | 28.5657 | 28.2131 | 27.9698 | 27.6069 | 27.6293 | 25.1817 | 20.6889 | 18.1707 |
| $u_{14}$ | 33.4269 | 32.3855 | 31.6180 | 31.0614 | 30.6020 | 30.2801 | 29.8393 | 29.8551 | 28.0675 | 24.2726 | 18.9363 |
| $u_{15}$ | 36.7956 | 35.4677 | 34.4795 | 33.7493 | 33.1451 | 32.7195 | 32.0437 | 32.1466 | 29.1598 | 25.0126 | 20.2944 | d2) 1024-QAM or 32-PAM for a Fading Channel (1. Option)

| SNR | 0 | 1 | 2 | 3 | 4 | 5 | 6 | 7 | 8 | 9 | 10 |
|---|---|---|---|---|---|---|---|---|---|---|---|
| $u_1$ | 1.0003 | 1.0000 | 1.0000 | 1.0011 | 1.0000 | 1.0000 | 1.0006 | 1.0000 | 1.0002 | 1.0043 | 1.0108 |
| $u_2$ | 1.0003 | 1.0049 | 1.0163 | 1.0196 | 1.0208 | 1.0308 | 1.0214 | 1.0390 | 1.0252 | 1.0803 | 1.1627 |
| $u_3$ | 1.0027 | 1.0254 | 1.0360 | 1.0381 | 1.0582 | 1.0725 | 1.0400 | 1.0475 | 1.0286 | 1.1088 | 1.1942 |
| $u_4$ | 1.0164 | 1.0686 | 1.1300 | 1.2102 | 1.2704 | 1.3984 | 1.4402 | 1.5327 | 1.6809 | 1.9443 | 2.2594 |
| $u_5$ | 1.0277 | 1.0704 | 1.1395 | 1.2359 | 1.2821 | 1.4126 | 1.4586 | 1.5465 | 1.6972 | 1.9733 | 2.3050 |
| $u_6$ | 1.0456 | 1.0894 | 1.1495 | 1.2553 | 1.2994 | 1.4417 | 1.4951 | 1.5465 | 1.7362 | 2.0279 | 2.4395 |
| $u_7$ | 1.0487 | 1.1132 | 1.1734 | 1.2757 | 1.3364 | 1.4849 | 1.5096 | 1.5503 | 1.7364 | 2.0560 | 2.4406 |
| $u_8$ | 1.9738 | 2.1671 | 2.3628 | 2.5480 | 2.7476 | 3.0647 | 3.1661 | 3.3174 | 3.5767 | 3.8954 | 4.3049 |
| $u_9$ | 2.0526 | 2.1986 | 2.4403 | 2.6234 | 2.8083 | 3.1166 | 3.2014 | 3.3403 | 3.5857 | 3.9143 | 4.3315 |
| $u_{10}$ | 2.0663 | 2.2340 | 2.4536 | 2.6234 | 2.8196 | 3.1458 | 3.2015 | 3.3860 | 3.6394 | 4.0486 | 4.6119 |
| $u_{11}$ | 2.1022 | 2.2898 | 2.5070 | 2.6836 | 2.8698 | 3.1887 | 3.2388 | 3.3919 | 3.6572 | 4.0846 | 4.6119 |
| $u_{12}$ | 2.4454 | 2.6894 | 2.9825 | 3.2145 | 3.4803 | 3.8713 | 4.0826 | 4.4221 | 4.8650 | 5.3735 | 6.0449 |
| $u_{13}$ | 2.5537 | 2.7750 | 3.0830 | 3.2993 | 3.6342 | 4.0375 | 4.1566 | 4.4677 | 4.8650 | 5.3735 | 6.1193 |
| $u_{14}$ | 2.7190 | 2.9743 | 3.3004 | 3.5711 | 3.9845 | 4.3829 | 4.6192 | 4.9832 | 5.4362 | 6.1354 | 6.8700 |
| $u_{15}$ | 2.8164 | 3.1340 | 3.3947 | 3.7517 | 4.0778 | 4.5240 | 4.8297 | 5.2517 | 5.7299 | 6.6103 | 7.5087 |

| SNR | 11 | 12 | 13 | 14 | 15 | 16 | 17 | 18 | 19 | 20 | 21 |
|---|---|---|---|---|---|---|---|---|---|---|---|
| $u_1$ | 1.0206 | 1.0240 | 1.0158 | 1.0030 | 1.0094 | 1.0165 | 1.0109 | 1.0003 | 1.0009 | 1.0043 | 1.0003 |
| $u_2$ | 1.0739 | 1.1088 | 1.2267 | 1.0173 | 1.0577 | 1.1641 | 1.3963 | 1.6842 | 2.0893 | 2.3787 | 2.5628 |
| $u_3$ | 1.1015 | 1.1366 | 1.2493 | 1.0173 | 1.0632 | 1.1895 | 1.4131 | 1.6863 | 2.0899 | 2.3793 | 2.5641 |
| $u_4$ | 2.3031 | 2.5070 | 2.7823 | 2.6207 | 2.7531 | 2.9022 | 3.1798 | 3.5239 | 3.9928 | 4.3337 | 4.5385 |
| $u_5$ | 2.3307 | 2.5226 | 2.8092 | 2.6267 | 2.7580 | 2.9222 | 3.1944 | 3.5282 | 3.9930 | 4.3342 | 4.5580 |
| $u_6$ | 2.3962 | 2.6229 | 3.0150 | 2.7411 | 2.9810 | 3.3589 | 3.9199 | 4.5765 | 5.3853 | 5.9529 | 6.2800 |
| $u_7$ | 2.4238 | 2.6526 | 3.0349 | 2.7470 | 2.9811 | 3.3605 | 3.9203 | 4.5765 | 5.3906 | 5.9865 | 6.3991 |
| $u_8$ | 4.3380 | 4.5737 | 4.9461 | 4.6738 | 4.8680 | 5.2293 | 5.8532 | 6.6194 | 7.5215 | 8.1146 | 8.4195 |
| $u_9$ | 4.3743 | 4.6127 | 4.9764 | 4.6738 | 4.8680 | 5.2293 | 5.8532 | 6.6415 | 7.6038 | 8.3211 | 8.8558 |
| $u_{10}$ | 4.6129 | 4.9434 | 5.4050 | 5.3030 | 5.6793 | 6.3007 | 7.1684 | 8.1999 | 9.3413 | 10.1083 | 10.5973 |
| $u_{11}$ | 4.6129 | 4.9434 | 5.4050 | 5.3190 | 5.7268 | 6.4114 | 7.3330 | 8.5123 | 9.8455 | 10.8886 | 11.6792 |
| $u_{12}$ | 6.2332 | 6.6912 | 7.1932 | 7.0781 | 7.4631 | 8.1246 | 9.1671 | 10.4955 | 11.9313 | 12.9749 | 13.7196 |
| $u_{13}$ | 6.2378 | 6.7067 | 7.2143 | 7.4316 | 7.8792 | 8.7397 | 9.9527 | 11.6664 | 13.4007 | 14.6947 | 15.6090 |
| $u_{14}$ | 7.2044 | 7.7531 | 8.3908 | 9.0011 | 9.5503 | 10.5383 | 11.9678 | 13.9641 | 15.9024 | 17.3089 | 18.2685 |
| $u_{15}$ | 7.8925 | 8.6732 | 9.0513 | 10.9148 | 11.5100 | 12.7890 | 14.4376 | 16.9300 | 19.1680 | 20.7369 | 21.7475 |

| SNR | 22 | 23 | 24 | 25 | 26 | 27 | 28 | 29 | 30 | 31 | 32 |
|---|---|---|---|---|---|---|---|---|---|---|---|
| $u_1$ | 1.0002 | 1.0753 | 1.5871 | 2.0792 | 2.3953 | 2.5979 | 2.7284 | 2.8108 | 2.8638 | 2.8972 | 2.9205 |
| $u_2$ | 2.6821 | 2.8032 | 3.3595 | 3.9137 | 4.2801 | 4.5188 | 4.6763 | 4.7770 | 4.8432 | 4.8844 | 4.9121 |
| $u_3$ | 2.6985 | 2.9606 | 4.0489 | 5.0644 | 5.7316 | 6.1639 | 6.4450 | 6.6243 | 6.7411 | 6.8116 | 6.8624 |
| $u_4$ | 4.6475 | 4.8124 | 5.9653 | 7.0563 | 7.7599 | 8.2091 | 8.4995 | 8.6815 | 8.7991 | 8.8675 | 8.9155 |
| $u_5$ | 4.7447 | 5.1854 | 6.8626 | 8.3577 | 9.3324 | 9.9565 | 10.3588 | 10.6098 | 10.7698 | 10.8617 | 10.9265 |
| $u_6$ | 6.4363 | 6.7835 | 8.6319 | 10.2875 | 11.3529 | 12.0290 | 12.4603 | 12.7241 | 12.8892 | 12.9778 | 13.0422 |
| $u_7$ | 6.7723 | 7.5030 | 9.8196 | 11.8295 | 13.1294 | 13.9541 | 14.4760 | 14.7917 | 14.9857 | 15.0876 | 15.1596 |
| $u_8$ | 8.6146 | 9.2375 | 11.8029 | 14.0035 | 15.3949 | 16.2563 | 16.7886 | 17.0983 | 17.2797 | 17.3649 | 17.4228 |
| $u_9$ | 9.3840 | 10.3216 | 13.3049 | 15.8351 | 17.4372 | 18.4233 | 19.0262 | 19.3679 | 19.5628 | 19.6463 | 19.6994 |
| $u_{10}$ | 11.0496 | 12.0123 | 15.3459 | 18.1385 | 19.8764 | 20.9233 | 21.5442 | 21.8783 | 22.0561 | 22.1145 | 22.1450 |
| $u_{11}$ | 12.3712 | 13.5373 | 17.2964 | 20.4157 | 22.3392 | 23.4820 | 24.1409 | 24.6459 | 24.6783 | 24.6849 | 24.6849 |
| $u_{12}$ | 14.3775 | 15.6118 | 19.8018 | 23.2294 | 25.2925 | 26.4779 | 27.1285 | 27.4264 | 27.5506 | 27.5290 | 27.4931 |
| $u_{13}$ | 16.3759 | 17.7521 | 22.4374 | 26.2246 | 28.4576 | 29.7039 | 30.3509 | 30.6108 | 30.6865 | 30.6041 | 30.5122 |
| $u_{14}$ | 19.0535 | 20.5285 | 25.7859 | 29.9638 | 32.3556 | 33.6202 | 34.2212 | 34.3969 | 34.3835 | 34.2046 | 34.0347 |
| $u_{15}$ | 22.5334 | 24.1205 | 30.0937 | 34.7506 | 37.3202 | 38.5786 | 39.0930 | 39.1396 | 38.9925 | 38.6816 | 38.3850 |

| SNR | 33 | 34 | 35 | 36 | 37 | 38 | 39 | 40 |
|---|---|---|---|---|---|---|---|---|
| $u_1$ | 2.9354 | 2.9461 | 2.9539 | 2.9566 | 2.9625 | 2.9679 | 2.9706 | 2.9668 |
| $u_2$ | 4.9294 | 4.9430 | 4.9521 | 4.9535 | 4.9610 | 4.9733 | 4.9711 | 4.9647 |
| $u_3$ | 6.8891 | 6.9128 | 6.9279 | 6.9327 | 6.9441 | 6.9639 | 6.9598 | 6.9537 |
| $u_4$ | 8.9381 | 8.9612 | 8.9734 | 8.9760 | 8.9857 | 9.0117 | 9.0034 | 8.9914 |

| | | | | | | | |
|---|---|---|---|---|---|---|---|
| $u_5$ | 10.9554 | 10.9880 | 11.0022 | 11.0031 | 11.0166 | 11.0516 | 11.0381 | 11.0244 |
| $u_6$ | 13.0641 | 13.0956 | 13.1054 | 13.1036 | 13.1132 | 13.1541 | 13.1339 | 13.1153 |
| $u_7$ | 15.1815 | 15.2131 | 15.2214 | 15.2164 | 15.2267 | 15.2711 | 15.2475 | 15.2256 |
| $u_8$ | 17.4273 | 17.4495 | 17.4469 | 17.4330 | 17.4369 | 17.4818 | 17.4503 | 17.4219 |
| $u_9$ | 19.6952 | 19.7108 | 19.6985 | 19.6773 | 19.6762 | 19.7216 | 19.6855 | 19.6521 |
| $u_{10}$ | 22.1170 | 22.1128 | 22.0880 | 22.0535 | 22.0433 | 22.0913 | 22.0378 | 21.9943 |
| $u_{11}$ | 24.6327 | 24.6090 | 24.5689 | 24.5179 | 24.4941 | 24.5412 | 24.4762 | 24.4209 |
| $u_{12}$ | 27.3953 | 27.3392 | 27.2667 | 27.1957 | 27.1547 | 27.1976 | 27.1095 | 27.0355 |
| $u_{13}$ | 30.3630 | 30.2747 | 30.1682 | 30.0651 | 30.0017 | 30.0359 | 29.9279 | 29.8362 |
| $u_{14}$ | 33.8099 | 33.6615 | 33.5079 | 33.3683 | 33.2557 | 33.2767 | 33.1414 | 33.0224 |
| $u_{15}$ | 38.0516 | 37.8298 | 37.6071 | 37.3990 | 37.2354 | 37.2407 | 37.0845 | 36.9002 |

| SNR | 42 | 44 | 46 | 48 | 50 |
|---|---|---|---|---|---|
| $u_1$ | 2.9738 | 2.9727 | 2.9803 | 2.9747 | 2.9755 |
| $u_2$ | 4.9763 | 4.9704 | 4.9831 | 4.9798 | 4.9849 |
| $u_3$ | 6.9716 | 6.9620 | 6.9761 | 6.9699 | 6.9855 |
| $u_4$ | 9.0140 | 8.9995 | 9.0169 | 9.0005 | 9.0175 |
| $u_5$ | 11.0516 | 11.0383 | 11.0596 | 11.0277 | 11.0471 |
| $u_6$ | 13.1460 | 13.1331 | 13.1545 | 13.0993 | 13.1231 |
| $u_7$ | 15.2595 | 15.2451 | 15.2638 | 15.1874 | 15.2293 |
| $u_8$ | 17.4578 | 17.4387 | 17.4605 | 17.3555 | 17.4128 |
| $u_9$ | 19.6900 | 19.6695 | 19.6999 | 19.5662 | 19.6282 |
| $u_{10}$ | 22.0331 | 22.0039 | 22.0346 | 21.8900 | 21.9543 |
| $u_{11}$ | 24.4634 | 24.4247 | 24.4522 | 24.2985 | 24.3779 |
| $u_{12}$ | 27.0712 | 27.0228 | 27.0504 | 26.8712 | 26.9537 |
| $u_{13}$ | 29.8692 | 29.7967 | 29.8201 | 29.6120 | 29.6794 |
| $u_{14}$ | 33.0482 | 32.9359 | 32.9517 | 32.7729 | 32.8541 |
| $u_{15}$ | 36.8842 | 36.7255 | 36.7204 | 36.5908 | 36.7169 | d3) 1024-QAM/32-PAM for a Non-Fading Channel (2. Option)

| SNR | 0 | 1 | 2 | 3 | 4 | 5 | 6 | 7 | 8 | 9 | 10 | 11 |
|---|---|---|---|---|---|---|---|---|---|---|---|---|
| u1 | 0.9992 | 0.9991 | 0.9626 | 0.9967 | 0.9967 | 0.9988 | 0.9997 | 1.0671 | 1.0969 | 1.0363 | 0.962 | 1.0001 |
| u2 | 0.9957 | 0.9942 | 0.8697 | 0.9895 | 0.9965 | 0.9992 | 0.9989 | 1.1388 | 1.2043 | 1.2107 | 1.1702 | 0.9997 |
| u3 | 0.9965 | 0.9943 | 0.8971 | 0.99 | 0.9962 | 0.9991 | 0.9986 | 1.0674 | 1.0955 | 1.1639 | 1.2161 | 0.9996 |
| u4 | 0.9971 | 0.9965 | 0.6648 | 0.99 | 0.9954 | 0.9994 | 1.0008 | 1.1386 | 1.2048 | 1.3562 | 1.4866 | 1.8264 |
| u5 | 0.996 | 0.9939 | 0.6491 | 0.9905 | 0.9956 | 0.9997 | 1.001 | 1.2138 | 1.3242 | 1.4129 | 1.4414 | 1.848 |
| u6 | 0.9992 | 1.0019 | 0.6995 | 0.9974 | 0.9977 | 0.9998 | 1.0017 | 1.1384 | 1.2058 | 1.2085 | 1.1751 | 1.8267 |
| u7 | 0.9999 | 1.0022 | 0.719 | 0.9994 | 0.9993 | 1.0004 | 1.0017 | 1.0667 | 1.0964 | 1.162 | 1.2213 | 1.8066 |
| u8 | 1.0018 | 1.0047 | 0.9796 | 2.2704 | 2.8447 | 3.3339 | 3.6691 | 4.1038 | 4.3038 | 4.1189 | 3.88 | 3.962 |
| u9 | 1.0009 | 1.0043 | 0.9448 | 2.264 | 2.8416 | 3.334 | 3.6696 | 3.6418 | 3.8694 | 4.0902 | 4.1993 | 4.1097 |
| u10 | 0.9975 | 0.9957 | 0.8525 | 2.2387 | 2.8354 | 3.336 | 3.672 | 3.4119 | 3.666 | 3.7746 | 3.802 | 4.2647 |
| u11 | 0.9986 | 0.9982 | 0.8839 | 2.2405 | 2.8378 | 3.3375 | 3.6721 | 3.6428 | 3.8684 | 3.7435 | 3.6203 | 4.1131 |
| u12 | 0.9986 | 0.9963 | 1.2974 | 2.2393 | 2.8414 | 3.3349 | 3.6662 | 4.1042 | 4.3048 | 4.1203 | 3.8917 | 6.185 |
| u13 | 0.9975 | 0.996 | 1.243 | 2.2388 | 2.838 | 3.3348 | 3.6674 | 3.6422 | 3.8687 | 4.0904 | 4.2129 | 5.8337 |
| u14 | 1.001 | 1.0011 | 1.4137 | 2.2601 | 2.844 | 3.335 | 3.6673 | 4.1032 | 4.3066 | 5.0379 | 5.5707 | 6.2198 |
| u15 | 1.0017 | 1.0022 | 1.4853 | 2.2698 | 2.8465 | 3.3339 | 3.6669 | 6.1624 | 6.9359 | 7.2501 | 7.4066 | 8.6211 |

| SNR | 12 | 13 | 14 | 15 | 16 | 17 | 18 | 19 | 20 | 21 | 22 | 23 |
|---|---|---|---|---|---|---|---|---|---|---|---|---|
| u1 | 0.9878 | 0.9942 | 1.0007 | 1.0027 | 0.9981 | 0.9933 | 0.9936 | 0.999 | 1 | 1.0001 | 0.9973 | 1.0036 |
| u2 | 0.9747 | 0.966 | 0.9694 | 0.9834 | 1.0086 | 1.0594 | 1.2188 | 1.7124 | 2.5469 | 2.8781 | 2.9836 | 3.0078 |
| u3 | 0.9863 | 0.9719 | 0.9681 | 0.9811 | 1.0101 | 1.0676 | 1.2263 | 1.7139 | 2.5465 | 2.8764 | 2.9837 | 3.0244 |
| u4 | 2.2272 | 2.5533 | 2.7737 | 2.9007 | 2.9741 | 3.0241 | 3.159 | 3.6872 | 4.5907 | 4.9456 | 5.0494 | 5.0625 |
| u5 | 2.2217 | 2.5387 | 2.7714 | 2.9125 | 2.9988 | 3.0553 | 3.1727 | 3.6864 | 4.5862 | 4.9442 | 5.0663 | 5.138 |
| u6 | 2.223 | 2.5691 | 2.8418 | 3.0307 | 3.1789 | 3.35 | 3.7479 | 4.8324 | 6.417 | 7.0146 | 7.1785 | 7.1643 |
| u7 | 2.2286 | 2.581 | 2.846 | 3.0218 | 3.1519 | 3.3116 | 3.7215 | 4.8226 | 6.4211 | 7.0502 | 7.2858 | 7.4383 |
| u8 | 4.3457 | 4.661 | 4.9072 | 5.0916 | 5.2328 | 5.352 | 5.6798 | 6.8426 | 8.6195 | 9.2808 | 9.4323 | 9.3928 |
| u9 | 4.4994 | 4.7046 | 4.8825 | 5.0325 | 5.1573 | 5.2795 | 5.6568 | 6.8702 | 8.7174 | 9.4992 | 9.8449 | 10.1481 |
| u10 | 4.7161 | 5.1202 | 5.4415 | 5.6696 | 5.8553 | 6.1215 | 6.9014 | 8.6299 | 10.8957 | 11.7222 | 11.9532 | 12.0621 |
| u11 | 4.5362 | 5.0343 | 5.45 | 5.7667 | 6.0273 | 6.3484 | 7.1423 | 8.9474 | 11.4173 | 12.5228 | 13.0769 | 13.586 |
| u12 | 6.9957 | 7.2365 | 7.6047 | 7.8958 | 8.1046 | 8.3161 | 9.0363 | 11.0231 | 13.7773 | 14.8757 | 15.2913 | 15.6441 |
| u13 | 6.7509 | 7.454 | 8.0146 | 8.4120 | 8.6722 | 8.9298 | 9.7542 | 12.0148 | 15.2835 | 16.9016 | 17.5633 | 17.972 |
| u14 | 7.2075 | 8.594 | 9.6267 | 10.3424 | 10.7968 | 11.1339 | 12.0444 | 14.5782 | 18.1947 | 19.8327 | 20.4394 | 20.7517 |
| u15 | 9.7438 | 10.859 | 11.9177 | 12.7867 | 13.3749 | 13.7814 | 14.8151 | 17.7532 | 21.9096 | 23.606 | 24.0612 | 24.1702 |

| SNR | 24 | 25 | 26 | 27 | 28 | 29 | 30 | 31 | 32 | 33 | 34 | 35 |
|---|---|---|---|---|---|---|---|---|---|---|---|---|
| u1 | 1.0338 | 1.2685 | 2.568 | 2.9124 | 2.9902 | 3.0016 | 3.0038 | 3.002 | 3.0024 | 3.0017 | 3.0014 | 3.0014 |
| u2 | 3.024 | 3.2172 | 4.5709 | 4.9289 | 5.01 | 5.0206 | 5.0186 | 5.0131 | 5.0105 | 5.0084 | 5.006 | 5.0051 |
| u3 | 3.1126 | 3.6704 | 6.2313 | 6.8942 | 7.0446 | 7.0618 | 7.0515 | 7.0373 | 7.0287 | 7.022 | 7.0169 | 7.0134 |
| u4 | 5.0597 | 5.4996 | 8.2546 | 8.9668 | 9.1283 | 9.1368 | 9.1105 | 9.0811 | 9.0608 | 9.0466 | 9.0367 | 9.0261 |
| u5 | 5.3175 | 6.3322 | 10.0797 | 11.0396 | 11.257 | 11.2562 | 11.2029 | 11.1486 | 11.1121 | 11.0856 | 11.0685 | 11.0475 |

-continued

| | | | | | | | | | | | |
|---|---|---|---|---|---|---|---|---|---|---|---|
| u6 | 7.1579 | 8.0513 | 12.1665 | 13.2221 | 13.4588 | 13.4329 | 13.3374 | 13.2478 | 13.1867 | 13.143 | 13.1106 | 13.0776 |
| u7 | 7.8018 | 9.3367 | 14.2096 | 15.4697 | 15.7417 | 15.6758 | 15.5224 | 15.3852 | 15.2907 | 15.2225 | 15.173 | 15.1242 |
| u8 | 9.5449 | 11.0304 | 16.4487 | 17.8497 | 18.1292 | 18.0006 | 17.7684 | 17.5682 | 17.4293 | 17.3297 | 17.2569 | 17.1873 |
| u9 | 10.7709 | 12.6768 | 18.7845 | 20.3652 | 20.6379 | 20.419 | 20.0868 | 19.8058 | 19.6109 | 19.4704 | 19.3651 | 19.2702 |
| u10 | 12.5094 | 14.5322 | 21.3307 | 23.0612 | 23.2916 | 22.9487 | 22.4913 | 22.1116 | 21.8445 | 21.6501 | 21.5069 | 21.3796 |
| u11 | 14.2684 | 16.5436 | 24.1032 | 25.9674 | 26.1151 | 25.6105 | 24.9996 | 24.4967 | 24.1418 | 23.8821 | 23.6873 | 23.5173 |
| u12 | 16.3101 | 18.7948 | 27.1676 | 29.1243 | 29.1412 | 28.4332 | 27.6343 | 26.9825 | 26.5176 | 26.1751 | 25.9187 | 25.6964 |
| u13 | 18.6404 | 21.3291 | 30.5806 | 32.5873 | 32.4176 | 31.4579 | 30.4306 | 29.5967 | 28.997 | 28.5515 | 28.2162 | 27.9277 |
| u14 | 21.3511 | 24.2271 | 34.4413 | 36.4503 | 36.0267 | 34.7541 | 33.4466 | 32.3882 | 31.6189 | 31.0443 | 30.605 | 30.2317 |
| u15 | 24.6165 | 27.6663 | 38.9792 | 40.9267 | 40.1583 | 38.4818 | 36.8177 | 35.4703 | 34.4789 | 33.7311 | 33.1542 | 32.6692 |

| SNR | 36 | 37 | 38 | 39 | 40 |
|---|---|---|---|---|---|
| u1 | 2.9988 | 3.0102 | 3.0035 | 2.7197 | 2.0472 |
| u2 | 5.0006 | 5.0192 | 5.0363 | 4.4139 | 2.9841 |
| u3 | 7.0044 | 7.0244 | 7.0893 | 6.2809 | 3.9607 |
| u4 | 9.0134 | 9.0332 | 9.1092 | 7.9322 | 5.0898 |
| u5 | 11.0277 | 11.0421 | 11.1317 | 9.6412 | 6.0761 |
| u6 | 13.0484 | 13.061 | 13.1503 | 11.2735 | 7.1638 |
| u7 | 15.0767 | 15.0837 | 15.1749 | 13.1326 | 8.1645 |
| u8 | 17.1224 | 17.1191 | 17.2333 | 14.826 | 9.3331 |
| u9 | 19.1868 | 19.1703 | 19.3081 | 16.4589 | 10.3444 |
| u10 | 21.2695 | 21.2328 | 21.3472 | 18.0904 | 11.3035 |
| u11 | 23.3768 | 23.3264 | 23.4267 | 19.7596 | 12.4831 |
| u12 | 25.5123 | 25.421 | 25.4868 | 21.3998 | 13.6002 |
| u13 | 27.6916 | 27.5544 | 27.5728 | 23.1872 | 14.6124 |
| u14 | 29.932 | 29.7649 | 29.6897 | 24.9174 | 15.8244 |
| u15 | 32.2795 | 32.0045 | 31.9429 | 26.7754 | 16.8182 | d4) 1024-QAM/32-PAM for a Fading Channel (2. Option)

| SNR | 0 | 1 | 2 | 3 | 4 | 5 | 6 | 7 | 8 | 9 | 10 | 11 |
|---|---|---|---|---|---|---|---|---|---|---|---|---|
| u1 | 0.9877 | 0.9983 | 1.0021 | 0.996 | 1.0038 | 1.0274 | 1.0458 | 1.0252 | 1.0251 | 1.0106 | 1.0022 | 0.9999 |
| u2 | 0.9503 | 0.9963 | 0.9924 | 1.001 | 0.9979 | 1.0502 | 1.1021 | 1.093 | 1.0684 | 1.0421 | 1.0226 | 1.0034 |
| u3 | 0.9615 | 0.9958 | 0.9968 | 0.9963 | 1.0033 | 1.0263 | 1.0508 | 1.0681 | 1.0408 | 1.0311 | 1.0201 | 1.0037 |
| u4 | 0.8564 | 0.9951 | 0.9982 | 0.9969 | 1.0019 | 1.0506 | 1.1052 | 1.2121 | 1.3282 | 1.4929 | 1.7209 | 1.983 |
| u5 | 0.8494 | 0.9967 | 0.994 | 0.9991 | 1.0008 | 1.073 | 1.1571 | 1.2411 | 1.3645 | 1.5094 | 1.7258 | 1.9826 |
| u6 | 0.8807 | 0.9994 | 0.9998 | 0.9959 | 1.0025 | 1.0482 | 1.1021 | 1.1634 | 1.3105 | 1.4612 | 1.6899 | 1.9706 |
| u7 | 0.8914 | 1.0007 | 0.9995 | 0.998 | 0.9999 | 1.0236 | 1.0521 | 1.1359 | 1.2768 | 1.4444 | 1.6851 | 1.9712 |
| u8 | 1.3814 | 2.0455 | 2.4146 | 2.6684 | 2.9175 | 3.2588 | 3.4859 | 3.2744 | 3.2804 | 3.4275 | 3.6722 | 3.954 |
| u9 | 1.3622 | 2.044 | 2.4 | 2.6704 | 2.8872 | 2.8611 | 3.0858 | 3.2456 | 3.3136 | 3.4906 | 3.7323 | 3.9988 |
| u10 | 1.2981 | 2.0293 | 2.3562 | 2.6608 | 2.8918 | 2.6571 | 2.8799 | 3.0861 | 3.3236 | 3.5804 | 3.9166 | 4.2842 |
| u11 | 1.3174 | 2.0299 | 2.3711 | 2.6666 | 2.9157 | 2.8556 | 3.0645 | 3.0951 | 3.294 | 3.5187 | 3.8461 | 4.2212 |
| u12 | 1.5422 | 2.0304 | 2.3575 | 2.6702 | 2.919 | 3.2583 | 3.4956 | 3.7397 | 4.4647 | 4.8383 | 5.3122 | 5.8215 |
| u13 | 1.5175 | 2.0313 | 2.3446 | 2.6653 | 2.8934 | 2.8625 | 3.0965 | 3.6125 | 4.257 | 4.7767 | 5.3692 | 5.9729 |
| u14 | 1.604 | 2.0428 | 2.3901 | 2.6689 | 2.8884 | 3.265 | 3.5501 | 4.3656 | 4.7788 | 5.4497 | 6.2546 | 7.0898 |
| u15 | 1.6294 | 2.0466 | 2.4075 | 2.6719 | 2.9129 | 4.5146 | 5.143 | 5.676 | 6.3035 | 6.969 | 7.8139 | 8.7306 |

| SNR | 12 | 13 | 14 | 15 | 16 | 17 | 18 | 19 | 20 | 21 | 22 | 23 |
|---|---|---|---|---|---|---|---|---|---|---|---|---|
| u1 | 0.9993 | 0.9997 | 1.0006 | 1.0003 | 0.9986 | 0.9994 | 0.9989 | 1.0005 | 0.9993 | 1.0023 | 1.0042 | 1.0772 |
| u2 | 0.9938 | 0.9916 | 0.9966 | 1.0149 | 1.0776 | 1.2742 | 1.6871 | 2.0897 | 2.3726 | 2.5667 | 2.6852 | 2.8011 |
| u3 | 0.9938 | 0.9911 | 0.9957 | 1.0158 | 1.0779 | 1.2749 | 1.6874 | 2.0888 | 2.3722 | 2.5683 | 2.7063 | 2.9634 |
| u4 | 2.2325 | 2.4349 | 2.5818 | 2.6848 | 2.7905 | 3.0323 | 3.5222 | 3.9945 | 4.3233 | 4.5468 | 4.6563 | 4.8127 |
| u5 | 2.2312 | 2.4346 | 2.5854 | 2.6903 | 2.7982 | 3.0371 | 3.522 | 3.9931 | 4.325 | 4.5636 | 4.7536 | 5.1864 |
| u6 | 2.2471 | 2.486 | 2.6694 | 2.882 | 3.1454 | 3.6813 | 4.5789 | 5.3843 | 5.9387 | 6.2876 | 6.4513 | 6.7838 |
| u7 | 2.2486 | 2.4864 | 2.6871 | 2.8747 | 3.1351 | 3.6718 | 4.5753 | 5.3894 | 5.9728 | 6.4073 | 6.786 | 7.5029 |
| u8 | 4.2289 | 4.4576 | 4.6338 | 4.7815 | 5.0115 | 5.5854 | 6.6178 | 7.5206 | 8.0948 | 8.4282 | 8.6367 | 9.238 |
| u9 | 4.255 | 4.4646 | 4.6222 | 4.7619 | 4.9912 | 5.5804 | 6.6403 | 7.6013 | 8.3014 | 8.8692 | 9.4056 | 10.32 |
| u10 | 4.6461 | 4.9706 | 5.2658 | 5.5779 | 6.0174 | 6.8559 | 8.1969 | 9.3371 | 10.0842 | 10.6112 | 11.0768 | 12.0115 |
| u11 | 4.6016 | 4.9552 | 5.2889 | 5.6434 | 6.134 | 7.0475 | 8.5126 | 9.8429 | 10.8635 | 11.6946 | 12.4 | 13.5356 |
| u12 | 6.3089 | 6.7222 | 7.0625 | 7.3854 | 7.8549 | 8.8436 | 10.4887 | 11.9255 | 12.9446 | 13.7334 | 14.4128 | 15.6099 |
| u13 | 6.5416 | 7.0327 | 7.4575 | 7.8797 | 8.4919 | 9.7042 | 11.6571 | 13.3962 | 14.6601 | 15.6274 | 16.4161 | 17.7524 |
| u14 | 7.8656 | 8.5382 | 9.1068 | 9.635 | 10.344 | 11.727 | 13.9522 | 15.8981 | 17.2695 | 18.2933 | 19.0986 | 20.5256 |
| u15 | 9.6322 | 10.4411 | 11.14 | 11.7874 | 12.6414 | 14.2894 | 16.9161 | 19.1591 | 20.6892 | 21.7769 | 22.5894 | 24.1254 |

| SNR | 24 | 25 | 26 | 27 | 28 | 29 | 30 | 31 | 32 | 33 | 34 | 35 |
|---|---|---|---|---|---|---|---|---|---|---|---|---|
| u1 | 1.5857 | 2.0789 | 2.3946 | 2.5983 | 2.7301 | 2.8111 | 2.8638 | 2.8985 | 2.9204 | 2.9359 | 2.9464 | 2.9538 |
| u2 | 3.3587 | 3.9147 | 4.2782 | 4.5193 | 4.6776 | 4.7777 | 4.8422 | 4.8846 | 4.9112 | 4.9307 | 4.9428 | 4.952 |
| u3 | 4.0473 | 5.0664 | 5.7293 | 6.1649 | 6.4472 | 6.6249 | 6.7392 | 6.8128 | 6.8596 | 6.8928 | 6.913 | 6.9288 |
| u4 | 5.9637 | 7.0579 | 7.7572 | 8.2107 | 8.5011 | 8.6817 | 8.7961 | 8.8683 | 8.9124 | 8.9438 | 8.9619 | 8.9752 |
| u5 | 6.8591 | 8.3596 | 9.3297 | 9.9594 | 10.3587 | 10.6081 | 10.7659 | 10.8639 | 10.9225 | 10.9642 | 10.9877 | 11.0041 |
| u6 | 8.6281 | 10.2901 | 11.3497 | 12.0321 | 12.4587 | 12.7205 | 12.8844 | 12.9827 | 13.0371 | 13.0761 | 13.095 | 13.1067 |
| u7 | 9.816 | 11.834 | 13.1252 | 13.9574 | 14.4744 | 14.7859 | 14.98 | 15.0938 | 15.153 | 15.1954 | 15.2147 | 15.2242 |

-continued

| | | | | | | | | | | | |
|---|---|---|---|---|---|---|---|---|---|---|---|
| u8 | 11.7978 | 14.0092 | 15.3897 | 16.2598 | 16.7868 | 17.0907 | 17.2736 | 17.3718 | 17.4153 | 17.4442 | 17.4504 | 17.4501 |
| u9 | 13.3009 | 15.8419 | 17.4299 | 18.4269 | 19.0243 | 19.3589 | 19.5552 | 19.6555 | 19.6923 | 19.7141 | 19.7134 | 19.7042 |
| u10 | 15.3408 | 18.1472 | 19.8671 | 20.9273 | 21.5442 | 21.8683 | 22.0472 | 22.1242 | 22.1375 | 22.138 | 22.1179 | 22.0915 |
| u11 | 17.2901 | 20.4243 | 22.3301 | 23.4863 | 24.1421 | 24.467 | 24.6335 | 24.688 | 24.6782 | 24.6569 | 24.6156 | 24.5739 |
| u12 | 19.7947 | 23.2381 | 25.2825 | 26.4823 | 27.1288 | 27.4152 | 27.5337 | 27.5378 | 27.4826 | 27.4215 | 27.3471 | 27.2736 |
| u13 | 22.4306 | 26.2322 | 28.4484 | 29.7085 | 30.3512 | 30.5985 | 30.6651 | 30.6154 | 30.503 | 30.398 | 30.2838 | 30.1761 |
| u14 | 25.7783 | 29.973 | 32.3413 | 33.6247 | 34.2179 | 34.3818 | 34.3579 | 34.2186 | 34.0203 | 33.8444 | 33.6739 | 33.5132 |
| u15 | 30.084 | 34.7629 | 37.3028 | 38.5854 | 39.0866 | 39.1219 | 38.9603 | 38.6961 | 38.3675 | 38.0938 | 37.8319 | 37.5978 |

| SNR | 36 | 37 | 38 | 39 | 40 |
|---|---|---|---|---|---|
| u1 | 2.959 | 2.9627 | 2.9646 | 2.9686 | 2.9708 |
| u2 | 4.9581 | 4.9636 | 4.9649 | 4.9695 | 4.9721 |
| u3 | 6.9398 | 6.9487 | 6.951 | 6.9583 | 6.9643 |
| u4 | 8.9849 | 8.9938 | 8.9932 | 9.0001 | 9.0054 |
| u5 | 11.0164 | 11.0274 | 11.0264 | 11.0342 | 11.0416 |
| u6 | 13.1177 | 13.1268 | 13.1229 | 13.1289 | 13.1362 |
| u7 | 15.2319 | 15.2421 | 15.2363 | 15.2411 | 15.2498 |
| u8 | 17.4511 | 17.4547 | 17.4418 | 17.4433 | 17.4518 |
| u9 | 19.6989 | 19.698 | 19.6791 | 19.6776 | 19.6851 |
| u10 | 22.0748 | 22.0635 | 22.0342 | 22.0291 | 22.033 |
| u11 | 24.5418 | 24.5191 | 24.4785 | 24.4679 | 24.468 |
| u12 | 27.2191 | 27.1778 | 27.119 | 27.0996 | 27.0922 |
| u13 | 30.0938 | 30.0323 | 29.9512 | 29.9185 | 29.8979 |
| u14 | 33.3876 | 33.2927 | 33.1818 | 33.1313 | 33.0899 |
| u15 | 37.4117 | 37.2731 | 37.1096 | 37.0386 | 36.9652 | e1) 4096-QAM or 64-PAM for a Non-Fading Channel (1. Option)

| SNR | 8 | 9 | 10 | 11 | 12 | 13 | 14 | 15 | 16 | 17 | 18 |
|---|---|---|---|---|---|---|---|---|---|---|---|
| $u_1$ | 1.0009 | 1.0095 | 1.0017 | 1.0005 | 1.0026 | 1.0357 | 1.0462 | 1.0088 | 1.0294 | 1.0550 | 1.0814 |
| $u_2$ | 1.0034 | 1.0191 | 1.0071 | 1.0103 | 1.0058 | 1.0935 | 1.0747 | 1.0271 | 1.0589 | 1.1067 | 1.1275 |
| $u_3$ | 1.0085 | 1.0328 | 1.0104 | 1.0195 | 1.0178 | 1.1234 | 1.1266 | 1.0514 | 1.1024 | 1.1932 | 1.2000 |
| $u_4$ | 1.0271 | 1.0685 | 1.0379 | 1.0755 | 1.1253 | 1.2903 | 1.2950 | 1.3224 | 1.3806 | 1.9358 | 2.5877 |
| $u_5$ | 1.0425 | 1.0933 | 1.0515 | 1.0862 | 1.1495 | 1.3104 | 1.3388 | 1.3527 | 1.4228 | 1.9850 | 2.6735 |
| $u_6$ | 1.0680 | 1.1256 | 1.0680 | 1.0948 | 1.1750 | 1.3332 | 1.3865 | 1.3620 | 1.4469 | 2.0585 | 2.7203 |
| $u_7$ | 1.0914 | 1.1453 | 1.0851 | 1.1268 | 1.1974 | 1.3824 | 1.4096 | 1.3754 | 1.4702 | 2.1306 | 2.7772 |
| $u_8$ | 1.6408 | 1.9406 | 2.1732 | 2.4538 | 2.7812 | 3.2032 | 3.3168 | 3.3215 | 3.4226 | 4.0242 | 4.7576 |
| $u_9$ | 1.6739 | 1.9863 | 2.2032 | 2.4732 | 2.8165 | 3.2260 | 3.3652 | 3.3288 | 3.4528 | 4.1132 | 4.8002 |
| $u_{10}$ | 1.7194 | 2.0417 | 2.2381 | 2.5159 | 2.8342 | 3.2727 | 3.4215 | 3.3467 | 3.4850 | 4.1566 | 4.8626 |
| $u_{11}$ | 1.7336 | 2.0649 | 2.2482 | 2.5421 | 2.8665 | 3.3094 | 3.4483 | 3.3743 | 3.5120 | 4.2105 | 4.9374 |
| $u_{12}$ | 1.7336 | 2.0649 | 2.2482 | 2.5654 | 2.9673 | 3.4823 | 3.6899 | 3.7007 | 3.9353 | 5.0951 | 6.3475 |
| $u_{13}$ | 1.7489 | 2.0891 | 2.2680 | 2.5736 | 2.9882 | 3.5109 | 3.7310 | 3.7351 | 3.9752 | 5.1790 | 6.4107 |
| $u_{14}$ | 1.7667 | 2.1100 | 2.2697 | 2.5749 | 2.9882 | 3.5472 | 3.7653 | 3.7530 | 4.0006 | 5.2035 | 6.4781 |
| $u_{15}$ | 1.7858 | 2.1333 | 2.2705 | 2.5880 | 2.9954 | 3.6091 | 3.7893 | 3.7599 | 4.0301 | 5.3100 | 6.5484 |
| $u_{16}$ | 3.7227 | 4.1178 | 4.3166 | 4.6107 | 4.9833 | 5.5502 | 5.7186 | 5.6573 | 5.9066 | 7.1262 | 8.4751 |
| $u_{17}$ | 3.7418 | 4.1491 | 4.3322 | 4.6276 | 4.9903 | 5.5822 | 5.7506 | 5.6655 | 5.9204 | 7.2088 | 8.5684 |
| $u_{18}$ | 3.7590 | 4.1737 | 4.3574 | 4.6571 | 5.0237 | 5.6385 | 5.8167 | 5.6849 | 5.9370 | 7.2417 | 8.5939 |
| $u_{19}$ | 3.7960 | 4.2200 | 4.3712 | 4.6746 | 5.0441 | 5.6775 | 5.8728 | 5.7212 | 5.9817 | 7.2914 | 8.6700 |
| $u_{20}$ | 3.8009 | 4.2440 | 4.4357 | 4.8048 | 5.2639 | 6.0310 | 6.3672 | 6.3727 | 6.8343 | 8.5615 | 10.3314 |
| $u_{21}$ | 3.8124 | 4.2614 | 4.4461 | 4.8333 | 5.2981 | 6.0708 | 6.4211 | 6.4165 | 6.8835 | 8.6242 | 10.4036 |
| $u_{22}$ | 3.8523 | 4.2874 | 4.4500 | 4.8427 | 5.3090 | 6.0708 | 6.4211 | 6.4165 | 6.9279 | 8.7014 | 10.5216 |
| $u_{23}$ | 3.8737 | 4.3357 | 4.4807 | 4.8543 | 5.3363 | 6.1026 | 6.4513 | 6.4233 | 6.9731 | 8.8015 | 10.5873 |
| $u_{24}$ | 4.8434 | 5.5231 | 5.8999 | 6.5381 | 7.2235 | 8.1484 | 8.5019 | 8.3784 | 8.8105 | 10.5696 | 12.5476 |
| $u_{25}$ | 4.9258 | 5.5864 | 5.9652 | 6.5983 | 7.2684 | 8.1872 | 8.5620 | 8.4081 | 8.8693 | 10.6847 | 12.6596 |
| $u_{26}$ | 4.9451 | 5.6415 | 5.9778 | 6.5984 | 7.2774 | 8.2065 | 8.5897 | 8.4766 | 9.1103 | 11.0060 | 13.0289 |
| $u_{27}$ | 5.0309 | 5.7430 | 6.0828 | 6.6419 | 7.3205 | 8.2309 | 8.6088 | 8.4887 | 9.1104 | 11.0060 | 13.0289 |
| $u_{28}$ | 5.4098 | 6.2244 | 6.6305 | 7.3617 | 8.0157 | 9.2080 | 9.7789 | 9.9190 | 10.7495 | 12.8951 | 15.2014 |
| $u_{29}$ | 5.5000 | 6.3459 | 6.7055 | 7.4383 | 8.1449 | 9.3149 | 9.8518 | 9.9298 | 10.7503 | 12.8995 | 15.2179 |
| $u_{30}$ | 5.7152 | 6.5427 | 7.0184 | 7.8330 | 8.6100 | 9.8433 | 10.6486 | 10.6096 | 11.8462 | 13.9129 | 16.3707 |
| $u_{31}$ | 5.8780 | 6.7570 | 7.2858 | 8.0687 | 8.7350 | 10.1300 | 10.9482 | 10.8858 | 12.3898 | 14.9464 | 17.4057 |

| SNR | 19 | 20 | 21 | 22 | 23 | 24 | 25 | 26 | 27 | 28 | 29 |
|---|---|---|---|---|---|---|---|---|---|---|---|
| $u_1$ | 1.0483 | 1.0007 | 1.0044 | 1.0055 | 1.0013 | 1.0009 | 1.0008 | 1.0004 | 1.0002 | 1.0009 | 1.0000 |
| $u_2$ | 1.0613 | 1.0233 | 1.0049 | 1.0067 | 1.0042 | 1.0169 | 1.1155 | 2.1473 | 2.7977 | 2.9554 | 2.9938 |
| $u_3$ | 1.0869 | 1.0300 | 1.0156 | 1.0126 | 1.0156 | 1.0172 | 1.1158 | 2.1476 | 2.7982 | 2.9562 | 2.9938 |
| $u_4$ | 2.3556 | 2.7238 | 2.9064 | 2.9831 | 3.0040 | 3.0164 | 3.0800 | 4.1326 | 4.8095 | 4.9735 | 5.0126 |
| $u_5$ | 2.3688 | 2.7327 | 2.9092 | 2.9851 | 3.0143 | 3.0175 | 3.0803 | 4.1329 | 4.8098 | 4.9740 | 5.0127 |
| $u_6$ | 2.4071 | 2.7463 | 2.9108 | 2.9891 | 3.0189 | 3.0684 | 3.3125 | 5.4313 | 6.6706 | 6.9751 | 7.0470 |
| $u_7$ | 2.4309 | 2.7844 | 2.9252 | 2.9939 | 3.0209 | 3.0687 | 3.3127 | 5.4321 | 6.6709 | 6.9755 | 7.0476 |
| $u_8$ | 4.4042 | 4.7555 | 4.9733 | 5.0568 | 5.0728 | 5.0540 | 5.1743 | 7.3914 | 8.7230 | 9.0520 | 9.1240 |
| $u_9$ | 4.4505 | 4.7853 | 4.9821 | 5.0665 | 5.0763 | 5.0545 | 5.1744 | 7.3919 | 8.7232 | 9.0521 | 9.1269 |
| $u_{10}$ | 4.4768 | 4.8087 | 4.9864 | 5.0786 | 5.1205 | 5.2247 | 5.6985 | 8.9330 | 10.7048 | 11.1492 | 11.2396 |

| | | | | | | | | | | |
|---|---|---|---|---|---|---|---|---|---|---|
| $u_{11}$ | 4.4984 | 4.8151 | 4.9894 | 5.0804 | 5.1241 | 5.2259 | 5.6990 | 8.9335 | 10.7052 | 11.1499 | 11.2521 |
| $u_{12}$ | 6.0304 | 6.6746 | 7.0482 | 7.1894 | 7.1853 | 7.1332 | 7.4320 | 10.9015 | 12.8463 | 13.3324 | 13.4094 |
| $u_{13}$ | 6.0394 | 6.7008 | 7.0583 | 7.1926 | 7.1891 | 7.1344 | 7.4326 | 10.9021 | 12.8463 | 13.3372 | 13.4549 |
| $u_{14}$ | 6.0730 | 6.7081 | 7.0832 | 7.2853 | 7.3954 | 7.6181 | 8.4317 | 12.7115 | 15.0078 | 15.5775 | 15.6226 |
| $u_{15}$ | 6.1073 | 6.7375 | 7.0832 | 7.2884 | 7.4045 | 7.6184 | 8.4328 | 12.7116 | 15.0103 | 15.6018 | 15.7683 |
| $u_{16}$ | 8.1524 | 8.8607 | 9.3063 | 9.4515 | 9.4026 | 9.4234 | 10.0879 | 14.7765 | 17.3133 | 17.9142 | 17.8813 |
| $u_{17}$ | 8.1720 | 8.8962 | 9.3102 | 9.4574 | 9.4108 | 9.4236 | 10.0879 | 14.7780 | 17.3310 | 18.0102 | 18.2795 |
| $u_{18}$ | 8.2313 | 8.9543 | 9.4881 | 9.7987 | 10.0367 | 10.4715 | 11.5465 | 16.8714 | 19.7069 | 20.3186 | 20.2643 |
| $u_{19}$ | 8.2425 | 8.9679 | 9.4972 | 9.8026 | 10.0398 | 10.4715 | 11.5513 | 16.8932 | 19.7984 | 20.6313 | 21.1418 |
| $u_{20}$ | 10.1358 | 11.0877 | 11.6875 | 11.9433 | 11.9948 | 12.2390 | 13.2621 | 19.1416 | 22.2235 | 22.8444 | 23.0106 |
| $u_{21}$ | 10.2083 | 11.1511 | 11.7122 | 11.9433 | 11.9948 | 12.2473 | 13.3038 | 19.2585 | 22.5518 | 23.6444 | 24.4435 |
| $u_{22}$ | 10.4647 | 11.5011 | 12.3809 | 12.9249 | 13.3478 | 13.8662 | 15.0350 | 21.5237 | 24.8994 | 25.7504 | 26.2833 |
| $u_{23}$ | 10.4667 | 11.5016 | 12.3809 | 12.9352 | 13.3886 | 13.9623 | 15.2365 | 21.9595 | 25.7968 | 27.2622 | 28.0976 |
| $u_{24}$ | 12.5892 | 13.7714 | 14.6800 | 15.1061 | 15.3331 | 15.7560 | 16.9792 | 24.1820 | 28.0789 | 29.3444 | 30.1001 |
| $u_{25}$ | 12.5892 | 13.7714 | 14.6898 | 15.2127 | 15.5317 | 16.1253 | 17.6049 | 25.3100 | 29.8341 | 31.4219 | 32.2373 |
| $u_{26}$ | 13.4094 | 14.7156 | 16.2278 | 17.0434 | 17.4121 | 17.9163 | 19.3517 | 27.5432 | 32.1791 | 33.7649 | 34.5644 |
| $u_{27}$ | 13.6158 | 15.0373 | 16.6096 | 17.6500 | 18.1533 | 18.9388 | 20.7325 | 29.6202 | 34.6720 | 36.3392 | 37.0984 |
| $u_{28}$ | 15.7576 | 17.2752 | 18.8400 | 19.7714 | 20.1992 | 20.8666 | 22.6401 | 32.1698 | 37.5238 | 39.2039 | 39.8717 |
| $u_{29}$ | 16.4104 | 18.0503 | 19.8935 | 21.3735 | 22.0959 | 22.9213 | 24.8156 | 35.1006 | 40.7639 | 42.4017 | 42.9261 |
| $u_{30}$ | 18.5684 | 20.5641 | 22.6573 | 24.0450 | 24.6870 | 25.4664 | 27.4064 | 38.5288 | 44.4858 | 46.0196 | 46.3385 |
| $u_{31}$ | 21.1733 | 23.6230 | 26.0750 | 27.5013 | 27.9919 | 28.6401 | 30.5717 | 42.6611 | 48.9075 | 50.2608 | 50.2913 |

| SNR | 30 | 31 | 32 | 33 | 34 | 35 | 36 | 37 | 38 | 39 | 40 |
|---|---|---|---|---|---|---|---|---|---|---|---|
| $u_1$ | 1.0001 | 1.0248 | 2.4408 | 2.8945 | 2.9839 | 2.9994 | 3.0018 | 3.0006 | 3.0003 | 3.0001 | 2.9997 |
| $u_2$ | 3.0017 | 3.0182 | 4.4380 | 4.8985 | 4.9886 | 5.0033 | 5.0058 | 5.0032 | 5.0024 | 5.0018 | 5.0008 |
| $u_3$ | 3.0030 | 3.0632 | 5.9156 | 6.8070 | 6.9830 | 7.0115 | 7.0140 | 7.0089 | 7.0069 | 7.0048 | 7.0037 |
| $u_4$ | 5.0173 | 5.0328 | 7.9059 | 8.8226 | 9.0024 | 9.0302 | 9.0288 | 9.0193 | 9.0151 | 9.0102 | 9.0071 |
| $u_5$ | 5.0216 | 5.1327 | 9.4507 | 10.7591 | 11.0195 | 11.0577 | 11.0516 | 11.0358 | 11.0282 | 11.0193 | 11.0115 |
| $u_6$ | 7.0498 | 7.0422 | 11.4357 | 12.7957 | 13.0656 | 13.0993 | 13.0845 | 13.0595 | 13.0468 | 13.0326 | 13.0195 |
| $u_7$ | 7.0641 | 7.2652 | 13.0665 | 14.7736 | 15.1170 | 15.1551 | 15.1295 | 15.0921 | 15.0721 | 15.0515 | 15.0306 |
| $u_8$ | 9.1060 | 9.0644 | 15.0535 | 16.8418 | 17.2002 | 17.2304 | 17.1884 | 17.1352 | 17.1049 | 17.0757 | 17.0463 |
| $u_9$ | 9.1497 | 9.5244 | 16.7818 | 18.8755 | 19.2998 | 19.3267 | 19.2631 | 19.1895 | 19.1460 | 19.1067 | 19.0675 |
| $u_{10}$ | 11.1813 | 11.1850 | 18.7842 | 20.9896 | 21.4336 | 21.4475 | 21.3554 | 21.2573 | 21.1971 | 21.1455 | 21.0958 |
| $u_{11}$ | 11.3033 | 11.9919 | 20.6171 | 23.0931 | 23.5947 | 23.5943 | 23.4675 | 23.3400 | 23.2595 | 23.1929 | 23.1300 |
| $u_{12}$ | 13.2745 | 13.5314 | 22.6537 | 25.2693 | 25.7957 | 25.7708 | 25.6021 | 25.4389 | 25.3346 | 25.2505 | 25.1715 |
| $u_{13}$ | 13.5814 | 14.6560 | 24.5978 | 27.4601 | 28.0325 | 27.9792 | 27.7614 | 27.5562 | 27.4240 | 27.3180 | 27.2219 |
| $u_{14}$ | 15.4281 | 16.1335 | 26.6926 | 29.7208 | 30.3180 | 30.2241 | 29.9475 | 29.6926 | 29.5290 | 29.3975 | 29.2822 |
| $u_{15}$ | 16.0896 | 17.4553 | 28.7584 | 32.0195 | 32.6497 | 32.5080 | 32.1630 | 31.8534 | 31.6506 | 31.4900 | 31.3522 |
| $u_{16}$ | 17.8031 | 18.9459 | 30.9410 | 34.3908 | 35.0362 | 34.8341 | 34.4104 | 34.0374 | 33.7912 | 33.5976 | 33.4333 |
| $u_{17}$ | 18.9158 | 20.3994 | 33.1475 | 36.8221 | 37.4807 | 37.2058 | 36.6926 | 36.2478 | 35.9521 | 35.7214 | 35.5286 |
| $u_{18}$ | 20.5417 | 21.9560 | 35.4574 | 39.3347 | 39.9907 | 39.6274 | 39.0134 | 38.4877 | 38.1359 | 37.8626 | 37.6368 |
| $u_{19}$ | 21.9857 | 23.5351 | 37.8830 | 41.9281 | 42.5704 | 42.1029 | 41.3762 | 40.7588 | 40.3444 | 40.0228 | 39.7614 |
| $u_{20}$ | 23.6361 | 25.2008 | 40.3158 | 44.6167 | 45.2248 | 44.6370 | 43.7840 | 43.0657 | 42.5801 | 42.2047 | 41.9019 |
| $u_{21}$ | 25.2935 | 26.9290 | 42.9015 | 47.4057 | 47.9613 | 47.2349 | 46.2412 | 45.4110 | 44.8462 | 44.4090 | 44.0606 |
| $u_{22}$ | 27.0746 | 28.7504 | 45.6132 | 50.3061 | 50.7879 | 49.9025 | 48.7528 | 47.7990 | 47.1463 | 46.6413 | 46.2405 |
| $u_{23}$ | 28.9429 | 30.6660 | 48.4574 | 53.3265 | 53.7113 | 52.6466 | 51.3243 | 50.2344 | 49.4838 | 48.9030 | 48.4433 |
| $u_{24}$ | 30.9398 | 32.6931 | 51.4505 | 56.4788 | 56.7408 | 55.4760 | 53.9630 | 52.7229 | 51.8619 | 51.1973 | 50.6724 |
| $u_{25}$ | 33.0715 | 34.8412 | 54.6068 | 59.7763 | 59.8883 | 58.4008 | 56.6777 | 55.2711 | 54.2893 | 53.5305 | 52.9293 |
| $u_{26}$ | 35.3606 | 37.1247 | 57.9431 | 63.2360 | 63.1703 | 61.4335 | 59.4783 | 57.8899 | 56.7734 | 55.9080 | 55.2244 |
| $u_{27}$ | 37.8240 | 39.5605 | 61.4829 | 66.8796 | 66.6073 | 64.5910 | 62.3797 | 60.5886 | 59.3222 | 58.3376 | 57.5609 |
| $u_{28}$ | 40.4876 | 42.1719 | 65.2585 | 70.7389 | 70.2237 | 67.8970 | 65.4018 | 63.3861 | 61.9504 | 60.8316 | 59.9460 |
| $u_{29}$ | 43.3896 | 44.9941 | 69.3198 | 74.8651 | 74.0651 | 71.3880 | 68.5763 | 66.3072 | 64.6797 | 63.4096 | 62.3996 |
| $u_{30}$ | 46.6014 | 48.0918 | 73.7587 | 79.3419 | 78.2083 | 75.1280 | 71.9563 | 69.3942 | 67.5467 | 66.1014 | 64.9470 |
| $u_{31}$ | 50.2840 | 51.6166 | 78.7813 | 84.3684 | 82.8265 | 79.2656 | 75.6675 | 72.7558 | 70.6393 | 68.9832 | 67.6450 | e2) 4096-QAM or 64-PAM for a Fading Channel (1. Option)

| SNR | 10 | 12 | 14 | 16 | 18 | 20 | 22 | 24 | 26 | 28 | 30 |
|---|---|---|---|---|---|---|---|---|---|---|---|
| $u_1$ | 1.0037 | 1.0034 | 1.0348 | 1.0952 | 1.0016 | 1.0009 | 1.0005 | 1.0084 | 1.0011 | 1.0013 | 1.4601 |
| $u_2$ | 1.0162 | 1.0343 | 1.0617 | 1.1176 | 1.0241 | 1.0018 | 1.0036 | 1.4936 | 2.2772 | 2.6447 | 3.2217 |
| $u_3$ | 1.0240 | 1.0678 | 1.0884 | 1.1793 | 1.0305 | 1.0041 | 1.0043 | 1.4944 | 2.2777 | 2.6458 | 3.6969 |
| $u_4$ | 1.1921 | 1.3907 | 1.5640 | 2.0417 | 2.0126 | 2.3581 | 2.6689 | 3.2663 | 4.1425 | 4.5751 | 5.6208 |
| $u_5$ | 1.2171 | 1.4100 | 1.5873 | 2.1063 | 2.0228 | 2.3589 | 2.6691 | 3.2663 | 4.1430 | 4.5762 | 6.1651 |
| $u_6$ | 1.2361 | 1.4531 | 1.6033 | 2.1127 | 2.0502 | 2.3605 | 2.6803 | 3.8388 | 5.4771 | 6.2622 | 7.8852 |
| $u_7$ | 1.2492 | 1.4877 | 1.6363 | 2.1955 | 2.0517 | 2.3634 | 2.6818 | 3.8552 | 5.4782 | 6.2644 | 8.5434 |
| $u_8$ | 2.3653 | 2.8845 | 3.2972 | 3.9998 | 3.8921 | 4.3057 | 4.6463 | 5.7758 | 7.4940 | 8.3068 | 10.4374 |
| $u_9$ | 2.3776 | 2.9044 | 3.3210 | 4.0789 | 3.9027 | 4.3085 | 4.6470 | 5.7801 | 7.4956 | 8.3148 | 11.2098 |
| $u_{10}$ | 2.4146 | 2.9464 | 3.3431 | 4.0949 | 3.9258 | 4.3091 | 4.7142 | 6.5005 | 8.9584 | 10.0754 | 12.8922 |
| $u_{11}$ | 2.4330 | 2.9727 | 3.3727 | 4.1576 | 3.9303 | 4.3106 | 4.7159 | 6.5026 | 8.9599 | 10.1075 | 13.7819 |
| $u_{12}$ | 2.5921 | 3.2909 | 3.8752 | 5.0460 | 5.1105 | 5.9019 | 6.4314 | 8.2437 | 10.9416 | 12.1137 | 15.6075 |
| $u_{13}$ | 2.6018 | 3.3308 | 3.8838 | 5.1032 | 5.1251 | 5.9026 | 6.4322 | 8.2470 | 10.9430 | 12.2240 | 16.6372 |
| $u_{14}$ | 2.6036 | 3.3538 | 3.9079 | 5.1106 | 5.1577 | 5.9275 | 6.6966 | 9.2839 | 12.6130 | 13.9827 | 18.3518 |
| $u_{15}$ | 2.6134 | 3.3538 | 3.9575 | 5.2402 | 5.1622 | 5.9305 | 6.6977 | 9.2923 | 12.6172 | 14.2759 | 19.5480 |
| $u_{16}$ | 4.4724 | 5.2413 | 5.8593 | 7.1349 | 7.1838 | 8.0530 | 8.5878 | 11.2148 | 14.8247 | 16.1910 | 21.4467 |

| | | | | | | | | | | |
|---|---|---|---|---|---|---|---|---|---|---|
| $u_{17}$ | 4.4904 | 5.2557 | 5.9016 | 7.2435 | 7.2025 | 8.0584 | 8.5900 | 11.2224 | 14.8505 | 16.7578 | 22.7923 |
| $u_{18}$ | 4.5233 | 5.2967 | 5.9330 | 7.2709 | 7.2402 | 8.2244 | 9.2676 | 12.5840 | 16.7154 | 18.3893 | 24.6241 |
| $u_{19}$ | 4.5370 | 5.3428 | 5.9400 | 7.3156 | 7.2402 | 8.2272 | 9.2676 | 12.5847 | 16.8401 | 19.2507 | 26.1464 |
| $u_{20}$ | 4.7553 | 5.7766 | 6.6383 | 8.4305 | 8.7991 | 10.0062 | 10.9491 | 14.5161 | 18.9533 | 21.0189 | 28.1725 |
| $u_{21}$ | 4.7821 | 5.8104 | 6.6641 | 8.4825 | 8.8222 | 10.0149 | 10.9503 | 14.5520 | 19.3674 | 22.1700 | 29.8997 |
| $u_{22}$ | 4.8082 | 5.8291 | 6.6807 | 8.5209 | 9.0392 | 10.6920 | 12.1865 | 16.2361 | 21.2176 | 23.9044 | 32.0068 |
| $u_{23}$ | 4.8130 | 5.8737 | 6.7033 | 8.6186 | 9.0422 | 10.6920 | 12.2150 | 16.4697 | 22.1503 | 25.3694 | 34.0023 |
| $u_{24}$ | 6.2441 | 7.4671 | 8.5303 | 10.4806 | 10.9914 | 12.7390 | 14.0922 | 18.4450 | 24.2033 | 27.3692 | 36.4075 |
| $u_{25}$ | 6.2893 | 7.4955 | 8.5634 | 10.5693 | 10.9914 | 12.7601 | 14.2864 | 19.1390 | 25.6388 | 29.1536 | 38.7203 |
| $u_{26}$ | 6.2893 | 7.5445 | 8.6516 | 10.7902 | 11.8153 | 14.1858 | 15.8472 | 20.9184 | 27.7224 | 31.3403 | 41.3928 |
| $u_{27}$ | 6.3436 | 7.6168 | 8.6551 | 10.7902 | 11.8939 | 14.5324 | 16.6065 | 22.3106 | 29.7261 | 33.5729 | 44.1720 |
| $u_{28}$ | 7.0226 | 8.5293 | 9.9244 | 12.4877 | 13.6889 | 16.4941 | 18.4985 | 24.4836 | 32.3433 | 36.2788 | 47.4221 |
| $u_{29}$ | 7.0606 | 8.5418 | 9.9244 | 12.4922 | 14.1769 | 17.7125 | 20.1454 | 26.6758 | 35.1307 | 39.2095 | 50.9584 |
| $u_{30}$ | 7.4057 | 9.0421 | 10.6101 | 13.4485 | 15.9473 | 20.0492 | 22.5947 | 29.6354 | 38.6833 | 42.8367 | 55.2496 |
| $u_{31}$ | 7.6853 | 9.2770 | 10.9700 | 13.9607 | 18.0971 | 23.1093 | 25.8301 | 33.4923 | 43.2861 | 47.4796 | 60.6968 |

| SNR | 32 | 34 | 36 | 38 | 40 | 42 | 44 |
|---|---|---|---|---|---|---|---|
| $u_1$ | 2.3630 | 2.7143 | 2.8569 | 2.9146 | 2.9430 | 2.9572 | 2.9626 |
| $u_2$ | 4.2240 | 4.6431 | 4.8201 | 4.8928 | 4.9295 | 4.9485 | 4.9531 |
| $u_3$ | 5.5916 | 6.3624 | 6.6825 | 6.8138 | 6.8769 | 6.9108 | 6.9193 |
| $u_4$ | 7.5711 | 8.3609 | 8.6875 | 8.8217 | 8.8852 | 8.9195 | 8.9261 |
| $u_5$ | 8.9677 | 10.1017 | 10.5677 | 10.7565 | 10.8452 | 10.8923 | 10.9017 |
| $u_6$ | 10.8558 | 12.0656 | 12.5624 | 12.7646 | 12.8566 | 12.9054 | 12.9128 |
| $u_7$ | 12.3100 | 13.8453 | 14.4705 | 14.7240 | 14.8372 | 14.8969 | 14.9042 |
| $u_8$ | 14.3495 | 15.9079 | 16.5327 | 16.7803 | 16.8878 | 16.9453 | 16.9457 |
| $u_9$ | 15.8626 | 17.7314 | 18.4764 | 18.7717 | 18.8959 | 18.9623 | 18.9619 |
| $u_{10}$ | 17.8122 | 19.7689 | 20.5381 | 20.8410 | 20.9630 | 21.0277 | 21.0190 |
| $u_{11}$ | 19.4002 | 21.6494 | 22.5319 | 22.8716 | 23.0051 | 23.0767 | 23.0663 |
| $u_{12}$ | 21.4914 | 23.7930 | 24.6692 | 25.0032 | 25.1259 | 25.1890 | 25.1683 |
| $u_{13}$ | 23.1749 | 25.7482 | 26.7175 | 27.0846 | 27.2145 | 27.2800 | 27.2540 |
| $u_{14}$ | 25.2444 | 27.9133 | 28.8962 | 29.2543 | 29.3711 | 29.4289 | 29.3923 |
| $u_{15}$ | 27.0554 | 29.9674 | 31.0256 | 31.4026 | 31.5200 | 31.5729 | 31.5300 |
| $u_{16}$ | 29.3071 | 32.2781 | 33.3164 | 33.6672 | 33.7575 | 33.7939 | 33.7339 |
| $u_{17}$ | 31.2488 | 34.4427 | 35.5372 | 35.8963 | 35.9772 | 36.0047 | 35.9322 |
| $u_{18}$ | 33.5157 | 36.8096 | 37.8974 | 38.2279 | 38.2797 | 38.2878 | 38.1965 |
| $u_{19}$ | 35.6233 | 39.1139 | 40.2361 | 40.5572 | 40.5894 | 40.5810 | 40.4746 |
| $u_{20}$ | 38.1010 | 41.6634 | 42.7477 | 43.0181 | 43.0067 | 42.9681 | 42.8356 |
| $u_{21}$ | 40.4118 | 44.1431 | 45.2395 | 45.4777 | 45.4325 | 45.3693 | 45.2134 |
| $u_{22}$ | 43.0288 | 46.8438 | 47.9000 | 48.0709 | 47.9708 | 47.8722 | 47.6880 |
| $u_{23}$ | 45.6116 | 49.5583 | 50.5912 | 50.7048 | 50.5545 | 50.4196 | 50.2024 |
| $u_{24}$ | 48.5564 | 52.5523 | 53.4949 | 53.5164 | 53.2904 | 53.1044 | 52.8455 |
| $u_{25}$ | 51.4802 | 55.5697 | 56.4532 | 56.3844 | 56.0878 | 55.8498 | 55.5491 |
| $u_{26}$ | 54.7552 | 58.8833 | 59.6566 | 59.4612 | 59.0692 | 58.7671 | 58.4167 |
| $u_{27}$ | 58.1823 | 62.3637 | 63.0156 | 62.6864 | 62.1896 | 61.8161 | 61.4120 |
| $u_{28}$ | 62.1034 | 66.2736 | 66.7414 | 66.2379 | 65.6055 | 65.1352 | 64.6642 |
| $u_{29}$ | 66.3748 | 70.5252 | 70.7893 | 70.0851 | 69.2959 | 68.7220 | 68.1765 |
| $u_{30}$ | 71.4868 | 75.5508 | 75.5368 | 74.5533 | 73.5731 | 72.8440 | 72.1957 |
| $u_{31}$ | 77.9207 | 81.8329 | 81.4363 | 80.0774 | 78.8139 | 77.8906 | 77.1759 | e3) 4096-QAM/64-PAM for a Non-Fading Channel (2. Option)

| SNR | 0 | 1 | 2 | 3 | 4 | 5 | 6 | 7 | 8 | 9 | 10 | 11 | 12 | 13 |
|---|---|---|---|---|---|---|---|---|---|---|---|---|---|---|
| u1 | 0.9997 | 0.9978 | 0.9991 | 1 | 1.0007 | 1.0007 | 1 | 0.9557 | 1.0614 | 0.9551 | 0.98 | 0.9906 | 0.9983 | 1.0028 |
| u2 | 0.9987 | 0.9964 | 0.9907 | 0.9992 | 1.0007 | 1.0013 | 0.9998 | 0.9995 | 1.132 | 1.0662 | 0.9665 | 0.9929 | 0.9872 | 0.9951 |
| u3 | 0.9992 | 0.9959 | 0.9909 | 1.0013 | 1.0018 | 1.0022 | 0.9998 | 1.0455 | 1.0635 | 1.1175 | 0.9872 | 1.0026 | 0.9889 | 0.9923 |
| u4 | 0.9952 | 0.9939 | 0.9506 | 0.9912 | 0.9956 | 0.9997 | 0.9991 | 1.0963 | 1.1367 | 1.2469 | 1.0968 | 1.0043 | 0.9773 | 0.9706 |
| u5 | 0.9949 | 0.9927 | 0.9497 | 0.9904 | 0.9958 | 1.0001 | 0.999 | 1.0477 | 1.2106 | 1.1914 | 1.0729 | 0.9947 | 0.9757 | 0.9733 |
| u6 | 0.9959 | 0.9925 | 0.9569 | 0.9928 | 0.9977 | 1.0007 | 0.999 | 1.1354 | 1.0632 | 1.0886 | 0.9926 | 0.9867 | 0.9808 |
| u7 | 0.9964 | 0.9925 | 0.9572 | 0.9948 | 0.9985 | 1.0012 | 0.9989 | 1.0469 | 1.067 | 1.1141 | 1.1127 | 1.0022 | 0.9885 | 0.9781 |
| u8 | 0.9979 | 0.996 | 0.82 | 0.9969 | 1.0009 | 1.0011 | 0.9982 | 1.0953 | 1.1392 | 1.2422 | 1.5245 | 1.8225 | 2.2129 | 2.5779 |
| u9 | 0.9971 | 0.9926 | 0.8212 | 0.9946 | 0.9999 | 1.0006 | 0.9981 | 1.0475 | 1.2127 | 1.1856 | 1.4974 | 1.8028 | 2.201 | 2.5773 |
| u10 | 0.9956 | 0.9897 | 0.8169 | 0.9928 | 0.9977 | 1.0004 | 0.998 | 1.0967 | 1.2926 | 1.3288 | 1.484 | 1.8262 | 2.1995 | 2.564 |
| u11 | 0.9956 | 0.988 | 0.8184 | 0.992 | 0.9969 | 0.9997 | 0.9977 | 1.1472 | 1.2149 | 1.3855 | 1.5124 | 1.8468 | 2.2116 | 2.5645 |
| u12 | 0.9999 | 1.0001 | 0.8477 | 1.0019 | 1.0015 | 1 | 0.998 | 1.0951 | 1.1374 | 1.2436 | 1.3501 | 1.8228 | 2.2139 | 2.5865 |
| u13 | 0.9993 | 0.9984 | 0.8477 | 1.0004 | 1.0011 | 0.9998 | 0.9979 | 1.047 | 1.2107 | 1.1876 | 1.3224 | 1.8029 | 2.2021 | 2.5859 |
| u14 | 1.0002 | 0.9981 | 0.8539 | 1.0011 | 1.0023 | 0.9996 | 0.9977 | 1.0003 | 1.1352 | 1.059 | 1.338 | 1.781 | 2.2032 | 2.5981 |
| u15 | 1.0006 | 0.9988 | 0.8548 | 1.0027 | 1.0023 | 0.9993 | 0.9976 | 1.0466 | 1.0674 | 1.1096 | 1.365 | 1.7998 | 2.2143 | 2.599 |
| u16 | 1.0013 | 0.9984 | 1.3062 | 2.2808 | 2.8695 | 3.3381 | 3.672 | 3.6931 | 4.5055 | 4.0594 | 3.6916 | 3.9511 | 4.3515 | 4.733 |
| u17 | 1.0009 | 0.9976 | 1.306 | 2.276 | 2.8682 | 3.3383 | 3.6706 | 4.1143 | 4.0708 | 4.49 | 3.7952 | 3.9685 | 4.3262 | 4.6905 |
| u18 | 1.0001 | 0.9975 | 1.2944 | 2.2716 | 2.8549 | 3.3373 | 3.668 | 3.692 | 3.8547 | 3.9737 | 3.9649 | 4.1043 | 4.4877 | 4.7651 |
| u19 | 1.0006 | 0.9989 | 1.2962 | 2.2767 | 2.8579 | 3.3377 | 3.6688 | 3.4797 | 4.0617 | 3.7447 | 3.8381 | 4.0787 | 4.5102 | 4.8115 |
| u20 | 0.9966 | 0.9843 | 1.2316 | 2.2476 | 2.8174 | 3.3366 | 3.6668 | 3.3388 | 3.8426 | 3.5963 | 3.7694 | 4.2066 | 4.6844 | 5.1505 |
| u21 | 0.9965 | 0.9862 | 1.2316 | 2.2428 | 2.816 | 3.3366 | 3.6654 | 3.4788 | 3.7127 | 3.7506 | 3.8549 | 4.2413 | 4.6695 | 5.1004 |

-continued

| | | | | | | | | | | | | | |
|---|---|---|---|---|---|---|---|---|---|---|---|---|---|
| u22 | 0.9979 | 0.9883 | 1.2438 | 2.2472 | 2.8316 | 3.338 | 3.6687 | 3.693 | 3.8504 | 3.9858 | 3.7378 | 4.1047 | 4.4864 | 4.988 |
| u23 | 0.9988 | 0.9908 | 1.2452 | 2.2521 | 2.8344 | 3.3383 | 3.6697 | 3.4793 | 4.0539 | 3.7531 | 3.6629 | 4.0789 | 4.5089 | 5.0366 |
| u24 | 0.9975 | 0.9885 | 1.5288 | 2.2442 | 2.8217 | 3.3383 | 3.6695 | 3.695 | 4.5123 | 4.0459 | 4.3425 | 6.0223 | 6.8569 | 7.2668 |
| u25 | 0.9969 | 0.9892 | 1.527 | 2.2404 | 2.8202 | 3.3377 | 3.6672 | 4.1199 | 4.0697 | 4.4707 | 4.5777 | 6.3293 | 7.2964 | 7.5851 |
| u26 | 0.9957 | 0.9906 | 1.5113 | 2.237 | 2.8068 | 3.3353 | 3.6622 | 3.6994 | 3.8542 | 3.9657 | 4.7092 | 5.9321 | 6.867 | 7.6187 |
| u27 | 0.996 | 0.992 | 1.5119 | 2.2422 | 2.8098 | 3.3356 | 3.663 | 3.4819 | 4.0606 | 3.7388 | 4.5292 | 5.7308 | 6.6111 | 7.3641 |
| u28 | 1.0002 | 0.9931 | 1.6026 | 2.2672 | 2.849 | 3.34 | 3.6708 | 3.6937 | 4.5158 | 4.0294 | 5.7423 | 6.024 | 6.8485 | 8.1001 |
| u29 | 0.9996 | 0.9947 | 1.6004 | 2.264 | 2.8464 | 3.3382 | 3.6682 | 4.1221 | 4.0742 | 4.4504 | 5.71 | 6.3295 | 7.2893 | 8.6424 |
| u30 | 1.0003 | 0.9972 | 1.6155 | 2.2689 | 2.86 | 3.3379 | 3.6703 | 6.9367 | 4.5402 | 6.1369 | 6.5297 | 7.621 | 8.7159 | 9.8487 |
| u31 | 1.0005 | 1.0011 | 1.6156 | 2.2746 | 2.8614 | 3.3359 | 3.6701 | 4.1219 | 7.7332 | 7.8583 | 8.2835 | 9.5686 | 10.848 | 12.0736 |

| SNR | 14 | 15 | 16 | 17 | 18 | 19 | 20 | 21 | 22 | 23 | 24 | 25 | 26 | 27 |
|---|---|---|---|---|---|---|---|---|---|---|---|---|---|---|
| u1 | 1.0012 | 1.0004 | 1.0001 | 1.0001 | 1.0017 | 0.9994 | 0.9991 | 1.0002 | 1.0004 | 0.9988 | 1.0002 | 1.0002 | 0.9995 | 0.9998 |
| u2 | 1.0012 | 1.0025 | 0.9995 | 0.9931 | 0.9949 | 0.9978 | 0.9973 | 0.9989 | 0.9993 | 0.9997 | 1.0165 | 1.1141 | 2.1397 | 2.7888 |
| u3 | 1.0002 | 1.0027 | 0.9992 | 0.9935 | 0.9925 | 0.9974 | 0.9973 | 1 | 0.9997 | 1.0012 | 1.0173 | 1.1147 | 2.1405 | 2.7905 |
| u4 | 0.9684 | 0.9816 | 1.0059 | 1.0493 | 1.182 | 1.5796 | 2.455 | 2.8426 | 2.9714 | 3.0025 | 3.0148 | 3.08 | 4.1242 | 4.7995 |
| u5 | 0.9695 | 0.9821 | 1.006 | 1.0522 | 1.1824 | 1.5808 | 2.4551 | 2.8429 | 2.9714 | 3.0028 | 3.0143 | 3.0802 | 4.124 | 4.8013 |
| u6 | 0.9697 | 0.9806 | 1.0066 | 1.0576 | 1.1891 | 1.5819 | 2.4541 | 2.8411 | 2.9706 | 3.0134 | 3.0663 | 3.3089 | 5.4109 | 6.6532 |
| u7 | 0.9688 | 0.9802 | 1.0065 | 1.0566 | 1.188 | 1.5815 | 2.4543 | 2.8404 | 2.9705 | 3.0122 | 3.0667 | 3.3087 | 5.4124 | 6.6551 |
| u8 | 2.7742 | 2.898 | 2.9707 | 3.0198 | 3.1266 | 3.5406 | 4.4866 | 4.9057 | 5.0421 | 5.061 | 5.0494 | 5.1723 | 7.3692 | 8.7048 |
| u9 | 2.7759 | 2.8996 | 2.9696 | 3.016 | 3.1241 | 3.5415 | 4.4867 | 5.0432 | 5.0601 | 5.0501 | 5.1727 | 3.7707 | 8.706 |
| u10 | 2.7715 | 2.9072 | 2.9916 | 3.0457 | 3.1402 | 3.541 | 4.4834 | 4.9035 | 5.0525 | 5.1122 | 5.2228 | 5.6928 | 8.9013 | 10.681 |
| u11 | 2.77 | 2.9062 | 2.9926 | 3.0494 | 3.1422 | 3.5425 | 4.4833 | 4.9039 | 5.0525 | 5.1118 | 5.2217 | 5.6928 | 8.9024 | 10.6801 |
| u12 | 2.8379 | 3.0216 | 3.1657 | 3.3215 | 3.6581 | 4.5549 | 6.2418 | 6.9491 | 7.1699 | 7.1725 | 7.1285 | 7.4272 | 10.8677 | 12.8191 |
| u13 | 2.8393 | 3.0233 | 3.1642 | 3.3159 | 3.6531 | 4.5542 | 6.2414 | 6.9493 | 7.1687 | 7.1707 | 7.1292 | 7.4281 | 10.8681 | 12.8187 |
| u14 | 2.844 | 3.017 | 3.1421 | 3.2814 | 3.6249 | 4.5445 | 6.2417 | 6.9759 | 7.25 | 7.3803 | 7.6122 | 8.4242 | 12.6721 | 14.9756 |
| u15 | 2.843 | 3.0158 | 3.1438 | 3.2861 | 3.6295 | 4.5453 | 6.2415 | 6.9762 | 7.2509 | 7.3814 | 7.6109 | 8.4241 | 12.6723 | 14.9747 |
| u16 | 4.911 | 5.0847 | 5.2173 | 5.3247 | 5.5906 | 6.5342 | 8.4252 | 9.2104 | 9.4291 | 9.3921 | 9.4171 | 10.0811 | 14.7326 | 17.2923 |
| u17 | 4.8946 | 5.078 | 5.2225 | 5.3361 | 5.5964 | 6.5309 | 8.4176 | 9.2059 | 9.4328 | 9.3936 | 9.4161 | 10.0799 | 14.7331 | 17.2755 |
| u18 | 4.8828 | 5.032 | 5.1525 | 5.263 | 5.5632 | 6.5493 | 8.4939 | 9.3909 | 9.7733 | 10.0241 | 10.4656 | 11.538 | 16.821 | 19.7523 |
| u19 | 4.8993 | 5.0389 | 5.1478 | 5.2534 | 5.5595 | 6.5509 | 8.5005 | 9.3955 | 9.768 | 10.0192 | 10.4628 | 11.5406 | 16.8423 | 19.666 |
| u20 | 5.4537 | 5.6751 | 5.8353 | 6.0525 | 6.7077 | 8.1966 | 10.6339 | 11.6235 | 11.9277 | 11.9919 | 12.2335 | 13.2526 | 19.0855 | 22.4952 |
| u21 | 5.4274 | 5.661 | 5.8447 | 6.0828 | 6.7436 | 8.2344 | 10.6663 | 11.6306 | 11.9181 | 11.9835 | 12.2406 | 13.2955 | 19.2025 | 22.1794 |
| u22 | 5.4211 | 5.7314 | 5.9947 | 6.2932 | 6.9708 | 8.5154 | 11.1197 | 12.3574 | 12.9096 | 13.3504 | 13.8605 | 15.0255 | 21.46 | 25.7242 |
| u23 | 5.446 | 5.7457 | 5.9865 | 6.2653 | 6.934 | 8.4705 | 11.0711 | 12.3354 | 12.9262 | 13.3985 | 13.9572 | 15.2319 | 21.8968 | 24.8484 |
| u24 | 7.601 | 7.9092 | 8.1116 | 8.2986 | 8.8843 | 10.5567 | 13.4789 | 14.6975 | 15.1159 | 15.345 | 15.7488 | 16.9733 | 24.1121 | 29.7447 |
| u25 | 7.6905 | 7.9139 | 8.0671 | 8.234 | 8.8098 | 10.4713 | 13.4082 | 14.7119 | 15.2287 | 15.5598 | 16.121 | 17.6005 | 25.2362 | 28.0103 |
| u26 | 8.0227 | 8.3661 | 8.5885 | 8.7912 | 9.4292 | 11.2659 | 14.6004 | 16.3761 | 17.081 | 17.4332 | 17.9118 | 19.3511 | 27.4658 | 34.5679 |
| u27 | 7.8908 | 8.3208 | 8.642 | 8.9175 | 9.6219 | 11.5386 | 14.97 | 16.8358 | 17.7127 | 18.2141 | 18.9411 | 20.7343 | 29.5377 | 32.086 |
| u28 | 9.4399 | 10.0496 | 10.4616 | 10.7875 | 11.5373 | 13.6107 | 17.3205 | 19.1194 | 19.8684 | 20.2666 | 20.8688 | 22.6464 | 32.0788 | 40.6327 |
| u29 | 9.7624 | 10.4834 | 10.962 | 11.3065 | 12.0909 | 14.2876 | 18.2519 | 20.3764 | 21.561 | 22.2111 | 22.9314 | 24.8269 | 35.0018 | 37.4081 |
| u30 | 10.8696 | 11.8503 | 12.6479 | 13.2236 | 14.1807 | 16.6639 | 21.0844 | 23.2372 | 24.2835 | 24.8299 | 25.4818 | 27.4224 | 38.4187 | 45.0872 |
| u31 | 13.0935 | 14.0851 | 14.9452 | 15.6218 | 16.7225 | 19.5472 | 24.5629 | 26.8501 | 27.8003 | 28.1675 | 28.6568 | 30.5887 | 42.5428 | 49.499 |

| SNR | 28 | 29 | 30 | 31 | 32 | 33 | 34 | 35 | 36 | 37 | 38 | 39 | 40 |
|---|---|---|---|---|---|---|---|---|---|---|---|---|---|
| u1 | 0.9976 | 0.9987 | 1.0014 | 1.025 | 2.4413 | 2.8939 | 2.9843 | 2.9997 | 3.0019 | 3.0007 | 3.0007 | 3.0003 | 2.9995 |
| u2 | 2.9488 | 2.9915 | 3.0025 | 3.018 | 4.4383 | 4.8976 | 4.9895 | 5.0043 | 5.0061 | 5.0036 | 5.003 | 5.0018 | 5.001 |
| u3 | 2.9479 | 2.9924 | 3.0037 | 3.0632 | 5.9167 | 6.8058 | 6.9842 | 7.0135 | 7.0137 | 7.0097 | 7.0074 | 7.0054 | 7.0045 |
| u4 | 4.9619 | 5.0094 | 5.0187 | 5.0331 | 7.9068 | 8.8211 | 9.0324 | 9.0288 | 9.0203 | 9.0152 | 9.0116 | 9.0111 |
| u5 | 4.9639 | 5.011 | 5.0222 | 5.1327 | 9.4519 | 10.7571 | 11.0224 | 11.0604 | 11.0525 | 11.0369 | 11.0279 | 11.0206 | 11.0185 |
| u6 | 6.9622 | 7.042 | 7.0521 | 7.0424 | 11.4366 | 12.7933 | 13.0677 | 13.1031 | 13.086 | 13.0608 | 13.0457 | 13.0341 | 13.0292 |
| u7 | 6.9646 | 7.0451 | 7.0661 | 7.2657 | 13.0678 | 14.7709 | 15.1192 | 15.1604 | 15.1306 | 15.0937 | 15.0694 | 15.0521 | 15.0437 |
| u8 | 9.0372 | 9.1166 | 9.1087 | 9.0645 | 15.0544 | 16.8389 | 17.2032 | 17.2373 | 17.1893 | 17.1369 | 17.1017 | 17.0762 | 17.0621 |
| u9 | 9.0366 | 9.12 | 9.1529 | 9.5267 | 16.783 | 18.8721 | 19.3026 | 19.3344 | 19.2643 | 19.1918 | 19.1426 | 19.1063 | 19.0849 |
| u10 | 11.1331 | 11.2301 | 11.1846 | 11.1868 | 18.7849 | 20.9854 | 21.4382 | 21.4555 | 21.3571 | 21.2603 | 21.194 | 21.1446 | 21.1144 |
| u11 | 11.1295 | 11.2429 | 11.3066 | 11.9962 | 20.6177 | 23.0888 | 23.5996 | 23.6025 | 23.4702 | 23.3435 | 23.2559 | 23.1917 | 23.1505 |
| u12 | 13.3129 | 13.3994 | 13.2789 | 13.5349 | 22.654 | 25.265 | 25.8011 | 25.7794 | 25.6052 | 25.4431 | 25.3306 | 25.2483 | 25.1935 |
| u13 | 13.316 | 13.4449 | 13.5855 | 14.661 | 24.5975 | 27.4555 | 28.0387 | 27.9889 | 27.7649 | 27.5612 | 27.4193 | 27.3164 | 27.2455 |
| u14 | 15.5542 | 15.6103 | 15.4321 | 16.1384 | 26.6918 | 29.7155 | 30.3242 | 30.2341 | 29.9519 | 29.6994 | 29.5231 | 29.3957 | 29.3073 |
| u15 | 15.58 | 15.7567 | 16.0956 | 17.4614 | 28.7572 | 32.0137 | 32.6572 | 32.518 | 32.1673 | 31.8602 | 31.6441 | 31.4885 | 31.3787 |
| u16 | 17.887 | 17.8671 | 17.8082 | 18.9525 | 30.94 | 34.3846 | 35.0455 | 34.8442 | 34.4149 | 34.0451 | 33.7833 | 33.5958 | 33.4606 |
| u17 | 17.9845 | 18.2619 | 18.9235 | 20.4071 | 33.1458 | 36.8156 | 37.4911 | 37.2161 | 36.6987 | 36.2565 | 35.9437 | 35.7192 | 35.5554 |
| u18 | 20.2884 | 20.2456 | 20.5488 | 21.964 | 35.4548 | 39.3279 | 40.0014 | 39.6382 | 39.0206 | 38.4973 | 38.1256 | 37.8593 | 37.6646 |
| u19 | 20.6026 | 21.1199 | 21.993 | 23.5441 | 37.8295 | 41.9212 | 42.5806 | 42.1143 | 41.383 | 40.7696 | 40.3329 | 40.0202 | 39.7891 |
| u20 | 22.8105 | 22.9898 | 23.6434 | 25.2095 | 40.3124 | 44.6095 | 45.2363 | 44.6495 | 43.79 | 43.0773 | 42.5661 | 42.2016 | 41.9315 |
| u21 | 23.6105 | 24.4211 | 25.3021 | 26.9381 | 42.8978 | 47.3978 | 47.9743 | 47.2486 | 46.2474 | 45.4239 | 44.8319 | 44.407 | 44.0928 |
| u22 | 25.7141 | 26.2598 | 27.0831 | 28.76 | 45.609 | 50.2974 | 50.8009 | 49.9168 | 48.7598 | 47.8129 | 47.1293 | 46.6391 | 46.2746 |
| u23 | 27.2209 | 28.0726 | 28.951 | 30.6768 | 48.453 | 53.3172 | 53.7241 | 52.6624 | 51.3323 | 50.249 | 49.4658 | 48.9001 | 48.4795 |
| u24 | 29.302 | 30.0719 | 30.9486 | 32.7041 | 51.4455 | 56.4693 | 56.7544 | 55.4931 | 53.9725 | 52.7382 | 51.8433 | 51.1958 | 50.7105 |
| u25 | 31.3751 | 32.209 | 33.0801 | 34.8521 | 54.6007 | 59.7663 | 59.9029 | 58.419 | 56.6876 | 55.2875 | 54.2702 | 53.5266 | 52.974 |
| u26 | 33.7153 | 34.532 | 35.3703 | 37.136 | 57.9366 | 63.2251 | 63.1856 | 61.4525 | 59.489 | 57.9066 | 56.7507 | 55.9047 | 55.2723 |
| u27 | 36.2816 | 37.0684 | 37.8335 | 39.572 | 61.4759 | 66.868 | 66.6219 | 64.6108 | 62.39 | 60.607 | 59.2976 | 58.3332 | 57.6109 |
| u28 | 39.1419 | 39.8412 | 40.4977 | 42.1824 | 65.2512 | 70.7275 | 70.2394 | 67.918 | 65.413 | 63.4057 | 61.9235 | 60.8256 | 60.0019 |
| u29 | 42.336 | 42.8943 | 43.4022 | 45.0041 | 69.3127 | 74.8524 | 74.0829 | 71.4105 | 68.5885 | 66.3283 | 64.6487 | 63.4014 | 62.4582 |
| u30 | 45.9471 | 46.3002 | 46.6146 | 48.1025 | 73.7506 | 79.3277 | 78.2264 | 75.1519 | 71.9717 | 69.4194 | 67.5124 | 66.0884 | 65.0072 |
| u31 | 50.1806 | 50.2503 | 50.2989 | 51.6274 | 78.7737 | 84.3532 | 82.8441 | 79.2912 | 75.6839 | 72.7834 | 70.6068 | 68.9588 | 67.7069 | e4) 4096-QAM/64-PAM for a Fading Channel (2. Option)

| SNR | 0 | 1 | 2 | 3 | 4 | 5 | 6 | 7 | 8 | 9 | 10 | 11 | 12 | 13 |
|---|---|---|---|---|---|---|---|---|---|---|---|---|---|---|
| u1 | 0.9963 | 0.9978 | 1.0042 | 1.0018 | 0.9993 | 1.0199 | 1.0097 | 1.0072 | 1.0028 | 0.9994 | 0.9999 | 0.9996 | 1.0002 | 1.0005 |
| u2 | 0.9888 | 0.995 | 1.0058 | 1.0009 | 1 | 1.0401 | 1.0467 | 1.0288 | 1.0323 | 1.0103 | 1.0036 | 0.9995 | 1 | 1.0007 |
| u3 | 0.9918 | 0.9943 | 1.0101 | 1.0036 | 1.0003 | 1.0198 | 1.0337 | 1.018 | 1.0303 | 1.0099 | 1.0047 | 0.9997 | 1.0001 | 1.0009 |
| u4 | 0.9541 | 0.9962 | 0.9955 | 0.9907 | 1.0023 | 1.0376 | 1.0885 | 1.0841 | 1.0665 | 1.0416 | 1.0207 | 1.0048 | 0.9958 | 0.9914 |
| u5 | 0.9509 | 0.9947 | 0.9963 | 0.9911 | 1.0019 | 1.0575 | 1.1007 | 1.0947 | 1.0687 | 1.0415 | 1.0205 | 1.0045 | 0.9959 | 0.9919 |
| u6 | 0.9572 | 0.994 | 1.0008 | 0.9947 | 1.0008 | 1.0371 | 1.0611 | 1.0713 | 1.0375 | 1.0295 | 1.018 | 1.0044 | 0.9963 | 0.9921 |
| u7 | 0.9601 | 0.9933 | 1.0043 | 0.998 | 0.9999 | 1.0167 | 1.049 | 1.061 | 1.0352 | 1.0293 | 1.0191 | 1.0045 | 0.9965 | 0.9922 |
| u8 | 0.8508 | 0.9904 | 1.0057 | 0.9981 | 1.0011 | 1.0359 | 1.1057 | 1.2062 | 1.3196 | 1.4848 | 1.7124 | 1.9789 | 2.2284 | 2.4296 |
| u9 | 0.8497 | 0.9921 | 1.0036 | 0.9975 | 1.0009 | 1.0568 | 1.1177 | 1.2173 | 1.323 | 1.4854 | 1.7111 | 1.9774 | 2.229 | 2.4304 |
| u10 | 0.8453 | 0.9927 | 0.9998 | 0.9957 | 1.0008 | 1.0777 | 1.1579 | 1.2437 | 1.3637 | 1.5033 | 1.7169 | 1.977 | 2.2279 | 2.4297 |
| u11 | 0.8497 | 0.9966 | 0.9966 | 0.9945 | 1.0008 | 1.0584 | 1.1449 | 1.2318 | 1.3601 | 1.5036 | 1.7176 | 1.9772 | 2.2285 | 2.4298 |
| u12 | 0.8794 | 0.9961 | 1.0066 | 1.0036 | 0.9997 | 1.04 | 1.0892 | 1.1572 | 1.3143 | 1.456 | 1.6837 | 1.9674 | 2.2398 | 2.4752 |
| u13 | 0.8775 | 0.9967 | 1.0043 | 1.0016 | 1 | 1.0598 | 1.1014 | 1.1687 | 1.3174 | 1.4567 | 1.6825 | 1.9661 | 2.2404 | 2.4761 |
| u14 | 0.8838 | 0.9993 | 1.0044 | 1.0026 | 0.9999 | 1.0395 | 1.0619 | 1.144 | 1.2769 | 1.4404 | 1.6764 | 1.9651 | 2.2423 | 2.4776 |
| u15 | 0.887 | 1.0004 | 1.0046 | 1.0026 | 1.0005 | 1.0192 | 1.05 | 1.1336 | 1.2731 | 1.4409 | 1.6771 | 1.9652 | 2.2428 | 2.4777 |
| u16 | 1.3685 | 2.044 | 2.4233 | 2.7677 | 2.9386 | 3.5023 | 3.4408 | 3.2474 | 3.2673 | 3.4167 | 3.6611 | 3.9531 | 4.2293 | 4.4538 |
| u17 | 1.3632 | 2.0409 | 2.4206 | 2.7543 | 2.926 | 3.031 | 3.3601 | 3.2589 | 3.2953 | 3.4403 | 3.6759 | 3.9601 | 4.2313 | 4.4531 |
| u18 | 1.3522 | 2.036 | 2.4072 | 2.7164 | 2.8659 | 2.7928 | 3.1046 | 3.2433 | 3.3198 | 3.4991 | 3.737 | 4.0075 | 4.2628 | 4.4661 |
| u19 | 1.3584 | 2.0387 | 2.4131 | 2.7296 | 2.876 | 3.0328 | 3.1327 | 3.2291 | 3.2928 | 3.4736 | 3.7215 | 3.9997 | 4.2609 | 4.4673 |
| u20 | 1.2937 | 2.0217 | 2.3696 | 2.6067 | 2.872 | 2.7985 | 2.8894 | 3.0788 | 3.3078 | 3.5536 | 3.8874 | 4.2677 | 4.632 | 4.955 |
| u21 | 1.2893 | 2.0179 | 2.3654 | 2.5953 | 2.8622 | 2.6481 | 2.879 | 3.0908 | 3.3328 | 3.5791 | 3.9074 | 4.2792 | 4.6369 | 4.954 |
| u22 | 1.3005 | 2.0217 | 2.3804 | 2.6264 | 2.9212 | 2.7978 | 2.9999 | 3.0955 | 3.3114 | 3.5221 | 3.8387 | 4.2143 | 4.5858 | 4.9287 |
| u23 | 1.3059 | 2.0243 | 2.3849 | 2.6377 | 2.9333 | 3.0347 | 3.0216 | 3.0827 | 3.286 | 3.4971 | 3.8215 | 4.2031 | 4.5824 | 4.9304 |
| u24 | 1.536 | 2.0277 | 2.3595 | 2.6209 | 2.931 | 3.5055 | 3.4745 | 3.7641 | 4.5388 | 4.8012 | 5.2768 | 5.7983 | 6.2845 | 6.6904 |
| u25 | 1.5286 | 2.0274 | 2.3608 | 2.611 | 2.9209 | 3.0294 | 3.3939 | 3.7415 | 4.5688 | 4.8766 | 5.3692 | 5.8801 | 6.3465 | 6.73 |
| u26 | 1.5142 | 2.0263 | 2.351 | 2.5814 | 2.8639 | 2.7958 | 3.1184 | 3.6371 | 4.2838 | 4.7955 | 5.3854 | 5.9967 | 6.555 | 7.028 |
| u27 | 1.5207 | 2.0302 | 2.3596 | 2.5937 | 2.8759 | 3.0301 | 3.1528 | 3.6471 | 4.2441 | 4.7386 | 5.3092 | 5.9145 | 6.4785 | 6.9667 |
| u28 | 1.6081 | 2.0374 | 2.397 | 2.7137 | 2.8798 | 3.4906 | 3.7542 | 4.4918 | 4.6545 | 5.4141 | 6.1357 | 6.9502 | 7.6934 | 8.3177 |
| u29 | 1.5999 | 2.0376 | 2.3962 | 2.7007 | 2.8677 | 3.0254 | 3.6131 | 4.3043 | 4.6739 | 5.427 | 6.2138 | 7.0723 | 7.8706 | 8.5561 |
| u30 | 1.6138 | 2.0443 | 2.4108 | 2.7391 | 2.9274 | 3.4965 | 4.488 | 4.9563 | 5.6429 | 6.2434 | 7.0601 | 7.9787 | 8.901 | 9.7418 |
| u31 | 1.6203 | 2.0495 | 2.4173 | 2.752 | 2.9369 | 5.0575 | 5.6783 | 6.2681 | 6.9732 | 7.6928 | 8.5941 | 9.597 | 10.5869 | 11.4949 |

| SNR | 14 | 15 | 16 | 17 | 18 | 19 | 20 | 21 | 22 | 23 | 24 | 25 | 26 | 27 |
|---|---|---|---|---|---|---|---|---|---|---|---|---|---|---|
| u1 | 1.0004 | 1.0002 | 1.0002 | 0.9998 | 0.999 | 0.9988 | 0.9995 | 0.9999 | 1.0013 | 0.9999 | 1.001 | 0.9997 | 1.0009 | 0.9992 |
| u2 | 1.0009 | 0.9991 | 0.9984 | 0.9984 | 1.0001 | 0.9996 | 0.9992 | 1.0004 | 1.0032 | 1.0364 | 1.3959 | 1.9271 | 2.272 | 2.494 |
| u3 | 1.0008 | 0.9992 | 0.9986 | 0.9983 | 0.9997 | 0.998 | 0.9988 | 1.0013 | 1.0018 | 1.037 | 1.3944 | 1.9264 | 2.2732 | 2.4945 |
| u4 | 0.9953 | 1.0125 | 1.067 | 1.2356 | 1.6294 | 2.0374 | 2.3337 | 2.5341 | 2.6647 | 2.7604 | 3.1499 | 3.7388 | 4.1332 | 4.3943 |
| u5 | 0.9956 | 1.0127 | 1.067 | 1.2354 | 1.6298 | 2.0374 | 2.3334 | 2.5347 | 2.6639 | 2.7604 | 3.1496 | 3.7379 | 4.1327 | 4.3952 |
| u6 | 0.9956 | 1.0133 | 1.0683 | 1.2372 | 1.6304 | 2.0374 | 2.3318 | 2.5328 | 2.6769 | 2.8536 | 3.6527 | 4.7448 | 5.4651 | 5.9409 |
| u7 | 0.9957 | 1.0135 | 1.0683 | 1.2366 | 1.6304 | 2.0366 | 2.3321 | 2.5362 | 2.6761 | 2.8534 | 3.6538 | 4.7432 | 5.4655 | 5.9407 |
| u8 | 2.5769 | 2.6774 | 2.7777 | 2.9984 | 3.4541 | 3.93 | 4.2773 | 4.5077 | 4.6411 | 4.7342 | 5.5345 | 6.7158 | 7.4777 | 7.9756 |
| u9 | 2.5774 | 2.6773 | 2.7771 | 2.9867 | 3.4539 | 3.931 | 4.2766 | 4.5089 | 4.6405 | 4.7345 | 5.5352 | 6.7145 | 7.478 | 7.9745 |
| u10 | 2.5794 | 2.6833 | 2.784 | 2.9906 | 3.4555 | 3.9297 | 4.2772 | 4.5202 | 4.7063 | 5.0028 | 6.2647 | 7.8812 | 8.9382 | 9.6301 |
| u11 | 2.5793 | 2.6837 | 2.7837 | 2.9912 | 3.4561 | 3.9294 | 4.2768 | 4.5204 | 4.7061 | 5.0025 | 6.2637 | 7.8827 | 8.9384 | 9.6296 |
| u12 | 2.6756 | 2.8656 | 3.1097 | 3.5858 | 4.4555 | 5.277 | 5.8584 | 6.2318 | 6.4228 | 6.6184 | 7.9618 | 9.7611 | 10.9166 | 11.6754 |
| u13 | 2.6764 | 2.8653 | 3.1091 | 3.5859 | 4.4552 | 5.2757 | 5.8595 | 6.2314 | 6.4225 | 6.1789 | 7.9632 | 9.7632 | 10.9185 | 11.6664 |
| u14 | 2.6747 | 2.8576 | 3.1006 | 3.577 | 4.4507 | 5.2792 | 5.8832 | 6.3219 | 6.6852 | 7.215 | 8.9989 | 11.1777 | 12.5855 | 13.5279 |
| u15 | 2.6746 | 2.8581 | 3.1004 | 3.5775 | 4.4509 | 5.2795 | 5.8851 | 6.3212 | 6.6842 | 7.2149 | 8.9993 | 11.1786 | 12.5908 | 13.4849 |
| u16 | 4.6252 | 4.7674 | 4.9751 | 5.474 | 6.4759 | 7.4011 | 8.0147 | 8.3718 | 8.5777 | 8.9581 | 10.8873 | 13.2883 | 14.7944 | 15.8428 |
| u17 | 4.6243 | 4.7676 | 4.9767 | 5.4757 | 6.4751 | 7.3997 | 8.3997 | 8.372 | 8.5775 | 8.9585 | 10.885 | 13.2918 | 14.8184 | 15.6955 |
| u18 | 4.6188 | 4.7505 | 4.9585 | 5.4675 | 6.4921 | 7.4646 | 8.1858 | 8.7429 | 9.2532 | 9.94 | 12.2345 | 14.9831 | 16.6805 | 18.0725 |
| u19 | 4.62 | 4.7491 | 4.9578 | 5.4681 | 6.4921 | 7.4665 | 8.1853 | 8.7398 | 9.2525 | 9.9394 | 12.2364 | 15.0095 | 16.8025 | 17.6716 |
| u20 | 5.246 | 5.5472 | 5.9566 | 6.7028 | 8.0145 | 9.1828 | 9.9708 | 10.5001 | 10.9359 | 11.5978 | 14.1236 | 17.1287 | 18.9131 | 20.8359 |
| u21 | 5.2441 | 5.5486 | 5.9602 | 6.7104 | 8.0232 | 9.1919 | 9.9185 | 10.4999 | 10.9341 | 11.6041 | 14.1646 | 17.2749 | 19.325 | 20.0208 |
| u22 | 5.2556 | 5.6032 | 6.0637 | 6.8816 | 8.3055 | 9.641 | 10.6757 | 11.4966 | 12.1712 | 12.9965 | 15.8137 | 19.1281 | 21.168 | 23.862 |
| u23 | 5.2584 | 5.602 | 6.0592 | 6.8738 | 8.2927 | 9.6278 | 10.6671 | 11.5018 | 12.202 | 13.088 | 16.0518 | 19.6555 | 22.0945 | 22.6034 |
| u24 | 7.0279 | 7.3462 | 7.7844 | 8.6613 | 10.2586 | 11.7039 | 12.7329 | 13.483 | 14.0789 | 14.878 | 17.9826 | 21.7256 | 24.1425 | 27.5194 |
| u25 | 7.0459 | 7.3437 | 7.7662 | 8.6344 | 10.2325 | 11.6913 | 12.7532 | 13.5672 | 14.2758 | 15.1586 | 18.6869 | 22.8323 | 25.575 | 25.8754 |
| u26 | 7.4305 | 7.8203 | 8.3639 | 9.4101 | 11.2613 | 12.9619 | 14.2091 | 15.1187 | 15.8369 | 16.8096 | 20.4248 | 24.7955 | 27.6541 | 31.8746 |
| u27 | 7.3941 | 7.8194 | 8.4057 | 9.5027 | 11.4236 | 13.2128 | 14.5744 | 15.6519 | 16.6054 | 17.8237 | 21.8049 | 26.5569 | 29.6567 | 29.6686 |
| u28 | 8.8516 | 9.3478 | 9.9831 | 11.1654 | 13.2585 | 15.161 | 16.5544 | 17.6098 | 18.5 | 19.6965 | 23.9472 | 29.0147 | 32.2679 | 37.1329 |
| u29 | 9.1461 | 9.7003 | 10.4171 | 11.7322 | 14.0437 | 16.204 | 17.8423 | 19.1046 | 20.1574 | 21.4926 | 26.1156 | 31.5831 | 35.0526 | 34.4897 |
| u30 | 10.4828 | 11.1807 | 12.0295 | 13.5243 | 16.1109 | 18.4804 | 20.2275 | 21.5413 | 22.6144 | 23.9997 | 29.0224 | 34.929 | 38.6023 | 41.5575 |
| u31 | 12.3176 | 13.1061 | 14.0796 | 15.7967 | 18.7604 | 21.4433 | 23.3683 | 24.7641 | 25.8663 | 27.2995 | 32.8238 | 39.2987 | 43.2007 | 45.9849 |

| SNR | 28 | 29 | 30 | 31 | 32 | 33 | 34 | 35 | 36 | 37 | 38 | 39 | 40 |
|---|---|---|---|---|---|---|---|---|---|---|---|---|---|
| u1 | 1.0006 | 1.0043 | 1.4608 | 2.031 | 2.3634 | 2.5782 | 2.7135 | 2.8007 | 2.8562 | 2.8925 | 2.9145 | 2.932 | 2.9432 |
| u2 | 2.6454 | 2.7379 | 3.2219 | 3.8448 | 4.2255 | 4.4775 | 4.6426 | 4.7502 | 4.8197 | 4.8656 | 4.8927 | 4.9155 | 4.9282 |
| u3 | 2.6449 | 2.746 | 3.6983 | 4.8763 | 5.5926 | 6.0595 | 6.3617 | 6.5573 | 6.6818 | 6.7624 | 6.8134 | 6.8524 | 6.8778 |
| u4 | 4.5762 | 4.6828 | 5.6197 | 6.84 | 7.5722 | 8.051 | 8.3598 | 8.5611 | 8.6878 | 8.7697 | 8.8219 | 8.8609 | 8.8865 |
| u5 | 4.5757 | 4.7079 | 6.1651 | 7.912 | 8.9681 | 9.6583 | 10.0999 | 10.3859 | 10.5661 | 10.6838 | 10.7566 | 10.8106 | 10.8472 |
| u6 | 6.2598 | 6.4365 | 7.8821 | 9.7373 | 10.8558 | 11.5914 | 12.0627 | 12.3691 | 12.5612 | 12.6874 | 12.763 | 12.8207 | 12.8615 |
| u7 | 6.2627 | 6.5065 | 8.5398 | 10.8859 | 12.31 | 13.2454 | 13.8413 | 14.2281 | 14.47 | 14.6273 | 14.7205 | 14.7934 | 14.8444 |
| u8 | 8.3042 | 8.4445 | 10.4315 | 12.8891 | 14.3481 | 15.3017 | 15.9032 | 16.2913 | 16.5325 | 16.6862 | 16.7743 | 16.8469 | 16.8975 |
| u9 | 8.3131 | 8.6065 | 11.2028 | 14.1091 | 15.8609 | 17.0043 | 17.7263 | 18.1889 | 18.4766 | 18.6587 | 18.7627 | 18.8479 | 18.907 |

-continued

| | | | | | | | | | | | | | |
|---|---|---|---|---|---|---|---|---|---|---|---|---|---|
| u10 | 10.0729 | 10.254 | 12.8833 | 15.9704 | 17.8101 | 19.0084 | 19.7625 | 20.244 | 20.5396 | 20.7276 | 20.8283 | 20.9151 | 20.9752 |
| u11 | 10.1062 | 10.5627 | 13.7734 | 17.2797 | 19.3987 | 20.7764 | 21.6431 | 22.1941 | 22.5302 | 22.7431 | 22.8571 | 22.9529 | 23.0199 |
| u12 | 12.1078 | 12.3025 | 15.599 | 19.2948 | 21.4876 | 22.9043 | 23.7857 | 24.3407 | 24.6737 | 24.8824 | 24.9883 | 25.0776 | 25.1403 |
| u13 | 12.2211 | 12.8281 | 16.6269 | 20.7185 | 23.1709 | 24.7554 | 25.7402 | 26.3568 | 26.7257 | 26.9539 | 27.0702 | 27.1641 | 27.23 |
| u14 | 13.9787 | 14.3539 | 18.3392 | 22.6727 | 25.2367 | 26.8878 | 27.9051 | 28.5338 | 28.9056 | 29.1316 | 29.2408 | 29.3276 | 29.3905 |
| u15 | 14.2723 | 15.1126 | 19.5353 | 24.2439 | 27.0471 | 28.8505 | 29.9595 | 30.6383 | 31.0373 | 31.2752 | 31.3895 | 31.4767 | 31.5389 |
| u16 | 16.1851 | 16.7817 | 21.4333 | 26.3916 | 29.2986 | 31.147 | 32.2702 | 32.9453 | 33.3306 | 33.5558 | 33.6536 | 33.727 | 33.7773 |
| u17 | 16.7562 | 17.7277 | 22.7796 | 28.1062 | 31.2381 | 33.2292 | 34.4336 | 35.1516 | 35.5544 | 35.7864 | 35.8824 | 35.9518 | 35.997 |
| u18 | 18.3851 | 19.2664 | 24.6112 | 30.2335 | 33.5042 | 35.5666 | 36.7993 | 37.5228 | 37.9155 | 38.1359 | 38.2116 | 38.2677 | 38.2999 |
| u19 | 19.2499 | 20.3968 | 26.1323 | 32.1242 | 35.6097 | 37.8022 | 39.1019 | 39.8565 | 40.2573 | 40.4733 | 40.5406 | 40.5882 | 40.6091 |
| u20 | 21.0165 | 22.1002 | 28.1574 | 34.4644 | 38.0874 | 40.3385 | 41.6513 | 42.3946 | 42.7722 | 42.9647 | 43.0011 | 43.0265 | 43.0262 |
| u21 | 22.1679 | 23.4306 | 29.8838 | 36.5679 | 40.3963 | 42.7627 | 44.1297 | 44.8896 | 45.2621 | 45.4415 | 45.4589 | 45.4682 | 45.4529 |
| u22 | 23.9006 | 25.1704 | 31.9904 | 39.027 | 43.0119 | 45.4482 | 46.8305 | 47.576 | 47.92 | 48.069 | 48.0512 | 48.0322 | 47.99 |
| u23 | 25.3642 | 26.7556 | 33.9846 | 41.4123 | 45.5943 | 48.1289 | 49.5435 | 50.2892 | 50.6125 | 50.7335 | 50.6844 | 50.639 | 50.5714 |
| u24 | 27.3645 | 28.7536 | 36.3885 | 44.2002 | 48.5385 | 51.1272 | 52.5353 | 53.2485 | 53.5222 | 53.5931 | 53.4946 | 53.4105 | 53.3077 |
| u25 | 29.1484 | 30.6214 | 38.698 | 46.9287 | 51.4594 | 54.1327 | 55.5551 | 56.2467 | 56.4806 | 56.5119 | 56.3625 | 56.2412 | 56.1041 |
| u26 | 31.3343 | 32.829 | 41.3722 | 50.0315 | 54.734 | 57.4607 | 58.8707 | 59.512 | 59.685 | 59.6552 | 59.4393 | 59.268 | 59.0883 |
| u27 | 33.5648 | 35.1146 | 44.1486 | 53.2678 | 58.1622 | 60.9496 | 62.3471 | 62.9389 | 63.0415 | 62.9454 | 62.6599 | 62.439 | 62.2059 |
| u28 | 36.2682 | 37.8272 | 47.3995 | 57.0085 | 62.0839 | 64.905 | 66.2558 | 66.7683 | 66.7757 | 66.5764 | 66.2081 | 65.9151 | 65.6227 |
| u29 | 39.1974 | 40.7685 | 50.93 | 61.0847 | 66.3515 | 69.2122 | 70.5087 | 70.932 | 70.83 | 70.5214 | 70.0572 | 69.6802 | 69.3125 |
| u30 | 42.8228 | 44.3725 | 55.219 | 65.9903 | 71.458 | 74.3362 | 75.5397 | 75.8248 | 75.5766 | 75.0956 | 74.5263 | 74.0405 | 73.5803 |
| u31 | 47.4691 | 48.9596 | 60.6605 | 72.1993 | 77.8935 | 80.7711 | 81.8379 | 81.9286 | 81.4804 | 80.7898 | 80.0683 | 79.4178 | 78.8141 | f1) 16384-QAM/128-PAM for a Non-Fading Channel

| SNR | 0 | 1 | 2 | 3 | 4 | 5 | 6 | 7 | 8 | 9 | 10 | 11 | 12 | 13 |
|---|---|---|---|---|---|---|---|---|---|---|---|---|---|---|
| u1 | 1 | 0.9993 | 1 | 0.9983 | 1.0007 | 1.0015 | 1.0005 | 1.034 | 0.9706 | 0.9792 | 0.9884 | 0.9946 | 1 | 1.0017 |
| u2 | 0.9996 | 0.9966 | 0.9973 | 0.9973 | 1.0014 | 1.0022 | 1.0008 | 1.0677 | 1.0314 | 0.9448 | 0.9812 | 0.987 | 0.9986 | 1.0025 |
| u3 | 0.9997 | 0.9957 | 0.9967 | 0.9982 | 1.0024 | 1.0036 | 1.0013 | 1.0365 | 1.0638 | 0.9658 | 0.9922 | 0.9931 | 0.9987 | 1.0014 |
| u4 | 0.9989 | 0.9931 | 0.9864 | 0.991 | 1.0016 | 1.0036 | 1.0011 | 1.0667 | 1.1349 | 1.0711 | 0.9776 | 0.9939 | 0.9879 | 0.9959 |
| u5 | 0.9989 | 0.9922 | 0.9863 | 0.9895 | 1.0024 | 1.0048 | 1.01 | 1.0998 | 1.1095 | 1.0474 | 0.9662 | 0.989 | 0.9878 | 0.9977 |
| u6 | 0.9993 | 0.9922 | 0.9882 | 0.99 | 1.0037 | 1.0057 | 1.001 | 1.0673 | 1.0313 | 1.0874 | 0.973 | 0.9976 | 0.9894 | 0.9975 |
| u7 | 0.9993 | 0.9916 | 0.9875 | 0.9909 | 1.0047 | 1.0072 | 1.001 | 1.0344 | 1.0642 | 1.111 | 0.984 | 1.0034 | 0.9894 | 0.9963 |
| u8 | 0.9951 | 0.9917 | 0.9456 | 0.9589 | 0.9962 | 0.9983 | 1.0007 | 1.067 | 1.1363 | 1.2505 | 1.0822 | 1.0041 | 0.9777 | 0.9679 |
| u9 | 0.9951 | 0.9914 | 0.9455 | 0.9577 | 0.9964 | 0.9989 | 1.003 | 1.1002 | 1.1015 | 1.2244 | 1.0692 | 0.9982 | 0.9776 | 0.9695 |
| u10 | 0.9947 | 0.9897 | 0.9433 | 0.9569 | 0.9964 | 0.9991 | 1.0003 | 1.1343 | 1.1738 | 1.1804 | 1.0619 | 0.9896 | 0.9761 | 0.9704 |
| u11 | 0.9948 | 0.9893 | 0.9427 | 0.9579 | 0.997 | 0.9997 | 1.0005 | 1.1 | 1.2107 | 1.2066 | 1.0748 | 0.9955 | 0.9761 | 0.9693 |
| u12 | 0.9957 | 0.9901 | 0.9516 | 0.9639 | 0.9992 | 1.0016 | 1.0001 | 1.0653 | 1.135 | 1.0796 | 1.094 | 0.995 | 0.9867 | 0.9751 |
| u13 | 0.9956 | 0.9895 | 0.9517 | 0.9627 | 0.9995 | 1.0023 | 1.0004 | 1.0987 | 1.0997 | 1.0561 | 1.0806 | 0.9892 | 0.9865 | 0.9767 |
| u14 | 0.996 | 0.9899 | 0.9535 | 0.9633 | 1.0005 | 1.0031 | 1.0014 | 1.0659 | 1.0325 | 1.0964 | 1.0878 | 0.9976 | 0.988 | 0.9764 |
| u15 | 0.9961 | 0.9895 | 0.953 | 0.9642 | 1.0011 | 1.0037 | 1.0025 | 1.0336 | 1.0658 | 1.1205 | 1.1011 | 1.0033 | 0.9881 | 0.9754 |
| u16 | 0.9984 | 0.9899 | 0.8171 | 0.8546 | 1.0039 | 1.0033 | 0.9981 | 1.0672 | 1.1362 | 1.2542 | 1.5262 | 1.8221 | 2.2124 | 2.5552 |
| u17 | 0.998 | 0.9881 | 0.8182 | 0.8543 | 1.0029 | 1.003 | 0.9991 | 1.1011 | 1.1004 | 1.2266 | 1.5101 | 1.8088 | 2.2165 | 2.5557 |
| u18 | 0.9973 | 0.9857 | 0.8174 | 0.8547 | 1.0021 | 1.0026 | 1.0001 | 1.1349 | 1.1725 | 1.1819 | 1.5083 | 1.792 | 2.2072 | 2.5533 |
| u19 | 0.997 | 0.9839 | 0.8178 | 0.8565 | 1.0014 | 1.002 | 1.0005 | 1.1002 | 1.2089 | 1.2075 | 1.5252 | 1.8052 | 2.2032 | 2.5518 |
| u20 | 0.9959 | 0.9826 | 0.8116 | 0.8518 | 0.9992 | 1.0015 | 1.0022 | 1.1352 | 1.2878 | 1.3476 | 1.5028 | 1.8306 | 2.2015 | 2.5399 |
| u21 | 0.9954 | 0.9808 | 0.8125 | 0.8518 | 0.9982 | 1.0008 | 1.0025 | 1.17 | 1.2499 | 1.3196 | 1.4861 | 1.8168 | 2.2056 | 2.5406 |
| u22 | 0.9955 | 0.9789 | 0.815 | 0.8533 | 0.9979 | 1 | 1.0026 | 1.135 | 1.1725 | 1.3648 | 1.4886 | 1.8343 | 2.215 | 2.5421 |
| u23 | 0.9952 | 0.9769 | 0.8156 | 0.8551 | 0.9971 | 0.9994 | 1.0024 | 1.1007 | 1.2087 | 1.3912 | 1.5052 | 1.8483 | 2.2106 | 2.5402 |
| u24 | 1.0005 | 0.9931 | 0.845 | 0.8795 | 1.0034 | 1.0026 | 0.9971 | 1.0677 | 1.1353 | 1.2436 | 1.3577 | 1.8233 | 2.2108 | 2.5682 |
| u25 | 1.0003 | 0.9929 | 0.8454 | 0.879 | 1.0031 | 1.0023 | 0.9974 | 1.1013 | 1.1099 | 1.2172 | 1.3421 | 1.8099 | 2.2148 | 2.569 |
| u26 | 0.9997 | 0.9917 | 0.844 | 0.8788 | 1.0024 | 1.0022 | 0.9976 | 1.1352 | 1.1719 | 1.1732 | 1.3371 | 1.7933 | 2.2056 | 2.5669 |
| u27 | 0.9996 | 0.9914 | 0.8441 | 0.8798 | 1.0023 | 1.0022 | 0.9975 | 1.1008 | 1.2084 | 1.1991 | 1.3532 | 1.8066 | 2.2015 | 2.5654 |
| u28 | 1.0004 | 0.9915 | 0.8515 | 0.8852 | 1.0043 | 1.003 | 0.997 | 1.0669 | 1.1327 | 1.073 | 1.3752 | 1.7831 | 2.2028 | 2.5752 |
| u29 | 1.0003 | 0.9914 | 0.8517 | 0.8845 | 1.0042 | 1.0027 | 0.9971 | 1.1002 | 1.0976 | 1.0498 | 1.3592 | 1.7703 | 2.2067 | 2.5759 |
| u30 | 1.0006 | 0.9923 | 0.8534 | 0.8853 | 1.0047 | 1.0027 | 0.9971 | 1.0673 | 1.031 | 1.09 | 1.3639 | 1.7861 | 2.2154 | 2.5775 |
| u31 | 1.0005 | 0.9922 | 0.8533 | 0.8861 | 1.0048 | 1.003 | 0.9971 | 1.0348 | 1.0641 | 1.1142 | 1.3795 | 1.7986 | 2.2115 | 2.576 |
| u32 | 1.001 | 0.9912 | 1.3049 | 1.8562 | 2.8726 | 3.3437 | 3.6766 | 4.4164 | 4.2323 | 3.9974 | 3.6762 | 3.9437 | 4.3434 | 4.6869 |
| u33 | 1.001 | 0.9912 | 1.3059 | 1.8533 | 2.8736 | 3.3442 | 3.6763 | 4.0344 | 4.6857 | 4.1775 | 3.7129 | 3.94 | 4.3617 | 4.6707 |
| u34 | 1.0007 | 0.9901 | 1.3027 | 1.8523 | 2.8709 | 3.3444 | 3.6755 | 3.8268 | 4.129 | 4.544 | 3.8489 | 3.9531 | 4.3441 | 4.6549 |
| u35 | 1.0008 | 0.99 | 1.3027 | 1.8562 | 2.8735 | 3.3451 | 3.6754 | 4.0296 | 3.8985 | 4.3272 | 3.8033 | 3.9572 | 4.3254 | 4.6714 |
| u36 | 1 | 0.9898 | 1.288 | 1.8394 | 2.8539 | 3.3416 | 3.6727 | 3.8227 | 3.7104 | 3.8963 | 3.8829 | 4.0881 | 4.4848 | 4.7175 |
| u37 | 1.0001 | 0.99 | 1.2891 | 1.8368 | 2.8544 | 3.3419 | 3.6724 | 3.682 | 3.8598 | 4.0066 | 3.9374 | 4.088 | 4.5043 | 4.7001 |
| u38 | 1.0007 | 0.991 | 1.2929 | 1.8392 | 2.8609 | 3.3431 | 3.6733 | 3.8219 | 4.1165 | 3.8085 | 3.7902 | 4.0676 | 4.519 | 4.7173 |
| u39 | 1.0008 | 0.9911 | 1.293 | 1.8431 | 2.8632 | 3.3439 | 3.6733 | 4.0286 | 3.887 | 3.7183 | 3.7456 | 4.0679 | 4.5003 | 4.7354 |
| u40 | 0.9961 | 0.9714 | 1.2251 | 1.7528 | 2.8145 | 3.3394 | 3.6733 | 3.8208 | 3.7067 | 3.5597 | 3.7161 | 4.1938 | 4.6751 | 5.1297 |
| u41 | 0.9963 | 0.9726 | 1.2262 | 1.7507 | 2.8144 | 3.3394 | 3.6727 | 3.6829 | 3.86 | 3.6216 | 3.7475 | 4.1977 | 4.6923 | 5.1059 |
| u42 | 0.9963 | 0.9735 | 1.2238 | 1.7496 | 2.8118 | 3.3391 | 3.6711 | 3.5697 | 3.7022 | 3.7482 | 3.8547 | 4.2244 | 4.6842 | 5.0907 |
| u43 | 0.9966 | 0.9749 | 1.2239 | 1.7533 | 2.8135 | 3.3395 | 3.6709 | 3.681 | 3.5841 | 3.681 | 3.8177 | 4.2197 | 4.6663 | 5.1147 |
| u44 | 0.9977 | 0.9754 | 1.2383 | 1.7696 | 2.8355 | 3.3437 | 3.6752 | 3.8266 | 3.7152 | 3.8707 | 3.7599 | 4.0885 | 4.4867 | 5.034 |
| u45 | 0.998 | 0.977 | 1.2392 | 1.7673 | 2.8354 | 3.3437 | 3.6748 | 3.681 | 3.8683 | 3.9779 | 3.7926 | 4.0884 | 4.506 | 5.0119 |
| u46 | 0.9987 | 0.9788 | 1.2429 | 1.7696 | 2.8409 | 3.3446 | 3.6759 | 3.8263 | 4.1241 | 3.783 | 3.6924 | 4.0692 | 4.5205 | 5.0277 |
| u47 | 0.9991 | 0.9799 | 1.2432 | 1.7733 | 2.843 | 3.3451 | 3.6758 | 4.0358 | 3.8954 | 3.6969 | 3.6664 | 4.0694 | 4.502 | 5.0496 |
| u48 | 0.9972 | 0.9797 | 1.5256 | 2.1641 | 2.8191 | 3.3379 | 3.674 | 4.4483 | 4.2332 | 3.9685 | 4.3926 | 5.9305 | 7.0157 | 7.1789 |
| u49 | 0.997 | 0.9815 | 1.5258 | 2.1595 | 2.8191 | 3.3376 | 3.6737 | 4.0435 | 4.6652 | 4.1389 | 4.5191 | 6.1718 | 6.8164 | 7.2237 |

-continued

| | | | | | | | | | | | | | | |
|---|---|---|---|---|---|---|---|---|---|---|---|---|---|---|
| u50 | 0.9964 | 0.9819 | 1.5208 | 2.1572 | 2.8158 | 3.3365 | 3.672 | 3.8308 | 4.1164 | 4.5 | 4.6254 | 6.4012 | 7.1426 | 7.4095 |
| u51 | 0.9964 | 0.9832 | 1.5197 | 2.1616 | 2.8177 | 3.3369 | 3.6723 | 4.0414 | 3.8933 | 4.2885 | 4.5203 | 6.1766 | 7.3723 | 7.3415 |
| u52 | 0.9954 | 0.985 | 1.5005 | 2.1393 | 2.7992 | 3.3311 | 3.6667 | 3.8285 | 3.707 | 3.876 | 4.6675 | 5.8214 | 6.8937 | 7.469 |
| u53 | 0.9952 | 0.9859 | 1.5008 | 2.135 | 2.7992 | 3.3315 | 3.6667 | 3.6836 | 3.8623 | 3.9845 | 4.7729 | 5.9508 | 6.7776 | 7.5359 |
| u54 | 0.9956 | 0.9877 | 1.5048 | 2.1374 | 2.8044 | 3.3331 | 3.6686 | 3.8296 | 4.1085 | 3.7906 | 4.7206 | 5.7884 | 6.5877 | 7.3703 |
| u55 | 0.9955 | 0.9883 | 1.5038 | 2.1418 | 2.8065 | 3.3336 | 3.669 | 4.0381 | 3.8823 | 3.7034 | 4.578 | 5.6671 | 6.6852 | 7.3203 |
| u56 | 1.0003 | 0.9856 | 1.5986 | 2.2732 | 2.8502 | 3.3457 | 3.6758 | 4.4277 | 4.2272 | 4.0107 | 6.8098 | 5.9404 | 7.0281 | 8.3261 |
| u57 | 1.0001 | 0.9875 | 1.5984 | 2.268 | 2.8488 | 3.3444 | 3.6743 | 4.0363 | 4.6482 | 4.1891 | 6.6195 | 6.1853 | 6.8253 | 8.6598 |
| u58 | 0.9996 | 0.9889 | 1.5931 | 2.2651 | 2.8447 | 3.3415 | 3.6721 | 3.8297 | 4.1163 | 4.5614 | 5.7764 | 6.4179 | 7.1544 | 8.8641 |
| u59 | 0.9995 | 0.9906 | 1.5917 | 2.2696 | 2.8451 | 3.3406 | 3.6715 | 4.0351 | 3.8897 | 4.3447 | 6.6596 | 6.191 | 7.3852 | 8.5998 |
| u60 | 1.0002 | 0.9943 | 1.6107 | 2.2933 | 2.8616 | 3.3435 | 3.6769 | 4.4379 | 4.2418 | 6.2574 | 5.5599 | 7.6849 | 8.8055 | 9.6276 |
| u61 | 1 | 0.9974 | 1.6105 | 2.288 | 2.86 | 3.3413 | 3.6755 | 4.0431 | 4.6809 | 6.1223 | 5.7391 | 7.6587 | 8.6932 | 9.9296 |
| u62 | 1.0004 | 1.0005 | 1.6144 | 2.29 | 2.8621 | 3.3393 | 3.6759 | 4.4373 | 6.7937 | 7.0647 | 7.3527 | 8.496 | 11.6838 | 11.0046 |
| u63 | 1.0003 | 1.0033 | 1.6124 | 2.2943 | 2.8617 | 3.3378 | 3.6747 | 8.1118 | 8.3013 | 8.3718 | 9.0057 | 10.3209 | 9.854 | 13.0332 |

| SNR | 14 | 15 | 16 | 17 | 18 | 19 | 20 | 21 | 22 | 23 | 24 | 25 | 26 | 27 |
|---|---|---|---|---|---|---|---|---|---|---|---|---|---|---|
| u1 | 1.0008 | 0.9999 | 1 | 1 | 0.9994 | 1.0003 | 0.9999 | 1 | 1.0003 | 1.0007 | 1.0007 | 1.0007 | 0.9996 | 1.0009 |
| u2 | 1.0009 | 0.9999 | 0.9999 | 1.0005 | 1.0005 | 1.0006 | 0.9998 | 1.0002 | 1.0005 | 1.0011 | 1.0006 | 0.9993 | 1.0002 | 1.0011 |
| u3 | 1.0001 | 0.9998 | 0.9998 | 1.0006 | 1.0005 | 1.0005 | 0.9997 | 0.9998 | 1.001 | 1.0015 | 1.0002 | 0.9982 | 1.0007 | 1.0003 |
| u4 | 1.0001 | 1.0016 | 0.9993 | 0.9948 | 0.9943 | 0.999 | 1.0007 | 1.0014 | 1.0008 | 1.0007 | 1.0135 | 1.0874 | 1.8839 | 2.7462 |
| u5 | 1.0009 | 1.0016 | 0.9993 | 0.9947 | 0.9939 | 0.9991 | 1.006 | 1.001 | 1.0009 | 1.0009 | 1.0138 | 1.0879 | 1.8845 | 2.7474 |
| u6 | 1.0007 | 1.0011 | 0.9992 | 0.9942 | 0.9924 | 0.9988 | 1.0006 | 1.0004 | 1.0003 | 1.0012 | 1.014 | 1.0882 | 1.8837 | 2.7463 |
| u7 | 0.9998 | 1.001 | 0.9991 | 0.9942 | 0.9925 | 0.9987 | 1.0006 | 1.0007 | 1.0009 | 1.0005 | 1.0135 | 1.0873 | 1.8837 | 2.7459 |
| u8 | 0.9689 | 0.9815 | 1.0058 | 1.0493 | 1.169 | 1.5305 | 2.4126 | 2.8284 | 2.9665 | 3.0033 | 3.0148 | 3.0589 | 3.8561 | 4.7555 |
| u9 | 0.9697 | 0.9815 | 1.0056 | 1.0492 | 1.1687 | 1.5304 | 2.4125 | 2.8278 | 2.9664 | 3.0033 | 3.015 | 3.059 | 3.8562 | 4.7559 |
| u10 | 0.9699 | 0.9817 | 1.0055 | 1.0496 | 1.1698 | 1.5307 | 2.4119 | 2.8286 | 2.9669 | 3.0036 | 3.0148 | 3.0584 | 3.8562 | 4.7561 |
| u11 | 0.9691 | 0.9816 | 1.0055 | 1.0497 | 1.1699 | 1.5305 | 2.4118 | 2.8292 | 2.9669 | 3.0034 | 3.0149 | 3.0586 | 3.854 | 4.7547 |
| u12 | 0.969 | 0.9797 | 1.0057 | 1.0551 | 1.1775 | 1.5327 | 2.4121 | 2.8288 | 2.9668 | 3.0111 | 3.0576 | 3.2441 | 4.9271 | 6.5695 |
| u13 | 0.9697 | 0.9795 | 1.0057 | 1.055 | 1.177 | 1.5325 | 2.4116 | 2.8286 | 2.9667 | 3.0107 | 3.0577 | 3.2451 | 4.9274 | 6.5696 |
| u14 | 0.9695 | 0.9791 | 1.0056 | 1.0546 | 1.1755 | 1.5323 | 2.412 | 2.8275 | 2.9669 | 3.0108 | 3.0577 | 3.2451 | 4.9282 | 6.5694 |
| u15 | 0.9687 | 0.979 | 1.0055 | 1.0548 | 1.1753 | 1.5323 | 2.412 | 2.8271 | 2.9668 | 3.0108 | 3.0581 | 3.245 | 4.9282 | 6.5697 |
| u16 | 2.7702 | 2.8974 | 2.9701 | 3.0217 | 3.1155 | 3.4884 | 4.4446 | 4.891 | 5.0389 | 5.064 | 5.0544 | 5.1256 | 6.8448 | 8.6152 |
| u17 | 2.7733 | 2.8969 | 2.9697 | 3.0221 | 3.1156 | 3.486 | 4.4439 | 4.8918 | 5.0381 | 5.0641 | 5.0537 | 5.1247 | 6.8437 | 8.6127 |
| u18 | 2.7713 | 2.8988 | 2.969 | 3.0187 | 3.1129 | 3.4886 | 4.4435 | 4.892 | 5.0384 | 5.0647 | 5.0539 | 5.1251 | 6.8436 | 8.6136 |
| u19 | 2.768 | 2.8987 | 2.9692 | 3.0184 | 3.1123 | 3.4889 | 4.4445 | 4.8915 | 5.0389 | 5.0642 | 5.0546 | 5.1254 | 6.8444 | 8.6151 |
| u20 | 2.7659 | 2.9081 | 2.9906 | 3.0465 | 3.1292 | 3.4897 | 4.4403 | 4.8898 | 5.048 | 5.1086 | 5.2014 | 5.57 | 8.2168 | 10.5563 |
| u21 | 2.7689 | 2.9078 | 2.9902 | 3.0468 | 3.1296 | 3.4901 | 4.4402 | 4.8888 | 5.0476 | 5.1085 | 5.2016 | 5.5695 | 8.2162 | 10.5558 |
| u22 | 2.7708 | 2.9054 | 2.9907 | 3.0504 | 3.1321 | 3.49 | 4.4409 | 4.8892 | 5.0476 | 5.1089 | 5.2009 | 5.5697 | 8.2161 | 10.5567 |
| u23 | 2.7676 | 2.9054 | 2.9909 | 3.05 | 3.1314 | 3.49 | 4.4408 | 4.8892 | 5.0481 | 5.1088 | 5.2021 | 5.5698 | 8.2162 | 10.5562 |
| u24 | 2.8379 | 3.0215 | 3.1624 | 3.3145 | 3.6255 | 4.4521 | 6.1678 | 6.9242 | 7.1628 | 7.1826 | 7.1349 | 7.3211 | 10.1056 | 12.6823 |
| u25 | 2.8408 | 3.0213 | 3.1619 | 3.3148 | 3.6262 | 4.4522 | 6.1674 | 6.9248 | 7.1627 | 7.1825 | 7.1349 | 7.3224 | 10.1062 | 12.6839 |
| u26 | 2.8388 | 3.0232 | 3.1612 | 3.3105 | 3.6215 | 4.4505 | 6.167 | 6.9249 | 7.1626 | 7.181 | 7.1341 | 7.3213 | 10.1065 | 12.6838 |
| u27 | 2.8358 | 3.0231 | 3.1614 | 3.3101 | 3.6205 | 4.4502 | 6.1672 | 6.924 | 7.1629 | 7.1809 | 7.1352 | 7.3226 | 10.1051 | 12.6818 |
| u28 | 2.8379 | 3.0146 | 3.1396 | 3.276 | 3.5926 | 4.4391 | 6.1658 | 6.9478 | 7.2373 | 7.3699 | 7.5672 | 8.2272 | 11.7834 | 14.8109 |
| u29 | 2.8408 | 3.0142 | 3.1392 | 3.2764 | 3.5931 | 4.4392 | 6.1658 | 6.9479 | 7.2365 | 7.3696 | 7.5675 | 8.2268 | 11.784 | 14.8118 |
| u30 | 2.8427 | 3.012 | 3.1397 | 3.2807 | 3.5971 | 4.4406 | 6.1659 | 6.9475 | 7.2381 | 7.3713 | 7.5677 | 8.2255 | 11.7837 | 14.8121 |
| u31 | 2.8398 | 3.0118 | 3.1399 | 3.2804 | 3.5959 | 4.4403 | 6.1655 | 6.9471 | 7.2382 | 7.3713 | 7.5673 | 8.2265 | 11.7838 | 14.8114 |
| u32 | 4.905 | 5.0812 | 5.2135 | 5.325 | 5.5623 | 6.4222 | 8.3424 | 9.1832 | 9.4264 | 9.4043 | 9.3988 | 9.8918 | 13.7405 | 17.0945 |
| u33 | 4.8974 | 5.0829 | 5.215 | 5.3243 | 5.5612 | 6.4225 | 8.3441 | 9.1835 | 9.4249 | 9.4037 | 9.3995 | 9.8925 | 13.7398 | 17.0938 |
| u34 | 4.8874 | 5.076 | 5.2182 | 5.3348 | 5.5671 | 6.4201 | 8.338 | 9.1798 | 9.4272 | 9.4071 | 9.4006 | 9.891 | 13.7388 | 17.1031 |
| u35 | 4.8948 | 5.0741 | 5.2166 | 5.3355 | 5.568 | 6.42 | 8.3361 | 9.179 | 9.4282 | 9.4051 | 9.4001 | 9.8915 | 13.7404 | 17.1045 |
| u36 | 4.885 | 5.0286 | 5.1483 | 5.2618 | 5.5314 | 6.4329 | 8.4049 | 9.3505 | 9.749 | 9.9946 | 10.3826 | 11.2919 | 15.7071 | 19.4613 |
| u37 | 4.8776 | 5.0303 | 5.1496 | 5.2612 | 5.5306 | 6.4335 | 8.4058 | 9.3517 | 9.7493 | 9.9944 | 10.383 | 11.2909 | 15.7076 | 19.4608 |
| u38 | 4.8877 | 5.0366 | 5.1467 | 5.2526 | 5.5259 | 6.435 | 8.4118 | 9.3554 | 9.7463 | 9.9884 | 10.3801 | 11.2952 | 15.7218 | 19.5264 |
| u39 | 4.8951 | 5.0349 | 5.1452 | 5.2532 | 5.5266 | 6.4346 | 8.4112 | 9.3542 | 9.7462 | 9.9877 | 10.3803 | 11.296 | 15.7228 | 19.5267 |
| u40 | 5.4496 | 5.6707 | 5.8312 | 6.0427 | 6.6485 | 8.0446 | 10.5356 | 11.5836 | 11.9143 | 11.9816 | 12.1731 | 12.9935 | 17.8481 | 21.9597 |
| u41 | 5.4265 | 5.6719 | 5.834 | 6.0408 | 6.6435 | 8.0389 | 10.529 | 11.5843 | 11.9143 | 11.9825 | 12.1733 | 12.9944 | 17.8484 | 21.9601 |
| u42 | 5.4225 | 5.6558 | 5.8389 | 6.0682 | 6.6777 | 8.0758 | 10.564 | 11.594 | 11.9068 | 11.9727 | 12.1767 | 13.0275 | 17.9412 | 22.2188 |
| u43 | 5.4462 | 5.6536 | 5.8354 | 6.0699 | 6.6825 | 8.0813 | 10.57 | 11.5945 | 11.9058 | 11.9725 | 12.1768 | 13.0261 | 17.9437 | 22.2189 |
| u44 | 5.4486 | 5.7255 | 5.982 | 6.2744 | 6.9056 | 8.3508 | 10.998 | 12.2939 | 12.8674 | 13.2919 | 13.7704 | 14.7383 | 20.0927 | 24.5954 |
| u45 | 5.4255 | 5.7265 | 5.9847 | 6.2728 | 6.9005 | 8.3443 | 10.9898 | 12.2904 | 12.8677 | 13.293 | 13.7699 | 14.7365 | 20.0925 | 24.596 |
| u46 | 5.4293 | 5.7408 | 5.9804 | 6.2474 | 6.8661 | 8.3021 | 10.9418 | 12.2656 | 12.878 | 13.3338 | 13.851 | 14.9101 | 20.458 | 25.3588 |
| u47 | 5.4516 | 5.7388 | 5.9771 | 6.2491 | 6.8705 | 8.3084 | 10.9501 | 12.2696 | 12.8782 | 13.3327 | 13.8513 | 14.9118 | 20.459 | 25.3582 |
| u48 | 7.6559 | 7.9191 | 8.1097 | 8.2864 | 8.8134 | 10.3614 | 13.3436 | 14.6402 | 15.0909 | 15.3053 | 15.6604 | 16.6484 | 22.572 | 27.6657 |
| u49 | 7.5962 | 7.8987 | 8.101 | 8.2903 | 8.8247 | 10.3765 | 13.3569 | 14.6387 | 15.0847 | 15.3073 | 15.6653 | 16.6516 | 22.5734 | 27.6641 |
| u50 | 7.7659 | 7.9125 | 8.0678 | 8.2301 | 8.7499 | 10.2913 | 13.2832 | 14.6429 | 15.1817 | 15.4954 | 15.9904 | 17.2129 | 23.5603 | 29.2694 |
| u51 | 7.8178 | 7.9342 | 8.0761 | 8.2269 | 8.7415 | 10.2787 | 13.2705 | 14.6437 | 15.1843 | 15.4947 | 15.9844 | 17.2069 | 23.5559 | 29.2772 |
| u52 | 7.9905 | 8.3659 | 8.5924 | 8.7764 | 9.3449 | 11.0377 | 14.3958 | 16.258 | 17.0226 | 17.3789 | 17.8016 | 18.9547 | 25.6725 | 31.5778 |
| u53 | 7.9568 | 8.3388 | 8.5733 | 8.7818 | 9.3685 | 11.0789 | 14.4533 | 16.308 | 17.0397 | 17.3723 | 17.7872 | 18.9473 | 25.6812 | 31.6373 |
| u54 | 7.7652 | 8.2889 | 8.6071 | 8.8942 | 9.5447 | 11.3315 | 14.8025 | 16.7236 | 17.6318 | 18.1013 | 18.7148 | 20.2064 | 27.4993 | 33.8765 |
| u55 | 7.8166 | 8.3137 | 8.6248 | 8.8899 | 9.5217 | 11.2906 | 14.743 | 16.6632 | 17.5973 | 18.1025 | 18.7549 | 20.2774 | 27.6486 | 34.1856 |
| u56 | 9.5716 | 10.0368 | 10.4727 | 10.7927 | 11.475 | 13.4022 | 17.1816 | 19.0526 | 19.7879 | 20.1226 | 20.5974 | 21.9997 | 29.7286 | 36.4886 |
| u57 | 10.5558 | 10.1562 | 10.4808 | 10.7507 | 11.4153 | 13.3253 | 17.0826 | 18.9593 | 19.7761 | 20.2004 | 20.7571 | 22.2698 | 30.256 | 37.411 |
| u58 | 10.0469 | 10.511 | 10.9283 | 11.2366 | 11.9233 | 13.9203 | 17.8741 | 19.9721 | 21.162 | 21.7752 | 22.4108 | 23.9661 | 32.3556 | 39.7554 |
| u59 | 9.5131 | 10.3449 | 10.8696 | 11.2796 | 12.0343 | 14.0983 | 18.1489 | 20.3475 | 21.6061 | 22.3479 | 23.0885 | 24.8194 | 33.7387 | 41.7463 |
| u60 | 9.5784 | 11.5603 | 12.3311 | 12.9013 | 13.7996 | 16.085 | 20.5183 | 22.6963 | 23.7407 | 24.31 | 24.9759 | 26.6835 | 36.0295 | 44.3668 |
| u61 | 10.5573 | 11.9943 | 12.7965 | 13.3906 | 14.2993 | 16.6522 | 21.2455 | 23.5932 | 24.9025 | 25.8342 | 26.7381 | 28.6155 | 38.5765 | 47.3857 |
| u62 | 12.0078 | 13.117 | 14.0906 | 14.9695 | 16.1458 | 18.8287 | 23.9395 | 26.4109 | 27.5876 | 28.3405 | 29.1578 | 31.0568 | 41.6691 | 50.9452 |

-continued

| | | | | | | | | | | | | | |
|---|---|---|---|---|---|---|---|---|---|---|---|---|---|
| u63 | 14.393 | 15.2684 | 16.2378 | 17.167 | 18.4863 | 21.5011 | 27.2192 | 29.8709 | 30.9873 | 31.5842 | 32.2501 | 34.1089 | 45.4747 | 55.251 |

| SNR | 28 | 29 | 30 | 31 | 32 | 33 | 34 | 35 | 36 | 37 | 38 | 39 | 40 |
|---|---|---|---|---|---|---|---|---|---|---|---|---|---|
| u1 | 0.9979 | 0.9994 | 0.9996 | 1.0018 | 1 | 0.9958 | 1.0001 | 0.9984 | 1.0002 | 1.0034 | 2.3511 | 2.8929 | 2.9812 |
| u2 | 1.0007 | 1 | 0.9994 | 1.0053 | 1.2266 | 2.7568 | 2.9441 | 2.9904 | 2.9988 | 3.0035 | 4.3493 | 4.8979 | 4.9814 |
| u3 | 0.9997 | 0.9987 | 0.9994 | 1.0059 | 1.2266 | 2.7554 | 2.9418 | 2.9923 | 2.9989 | 3.0068 | 5.7136 | 6.7911 | 6.9665 |
| u4 | 2.9315 | 2.9872 | 2.9987 | 3.0069 | 3.1896 | 4.7549 | 4.9513 | 4.996 | 5.0029 | 5.0054 | 7.7072 | 8.8002 | 8.9696 |
| u5 | 2.9336 | 2.9859 | 2.9982 | 3.0076 | 3.189 | 4.7564 | 4.949 | 4.9994 | 5.0028 | 5.0111 | 9.0998 | 10.7 | 10.96 |
| u6 | 2.9337 | 2.9866 | 2.9994 | 3.0181 | 3.5189 | 6.5335 | 6.9078 | 6.9976 | 7.0097 | 7.015 | 11.0829 | 12.7134 | 12.9713 |
| u7 | 2.9334 | 2.9865 | 2.9997 | 3.0183 | 3.5182 | 6.5332 | 6.9073 | 6.9995 | 7.0099 | 7.0231 | 12.5168 | 14.6239 | 14.9709 |
| u8 | 4.9479 | 5.0032 | 5.0133 | 5.0197 | 5.3804 | 8.5371 | 8.928 | 9.0199 | 9.0269 | 9.0321 | 14.4903 | 16.643 | 16.9909 |
| u9 | 4.948 | 5.0038 | 5.0139 | 5.0214 | 5.3799 | 8.5369 | 8.9292 | 9.0199 | 9.0271 | 9.041 | 15.9681 | 18.5695 | 19.0023 |
| u10 | 4.9469 | 5.0038 | 5.0137 | 5.0505 | 5.9287 | 10.3494 | 10.9095 | 11.04 | 11.052 | 11.0524 | 17.9366 | 20.5989 | 21.033 |
| u11 | 4.9474 | 5.0063 | 5.015 | 5.0496 | 5.9277 | 10.3496 | 10.9088 | 11.0425 | 11.0518 | 11.0678 | 19.464 | 22.5427 | 23.0556 |
| u12 | 6.9307 | 7.0326 | 7.045 | 7.0381 | 7.657 | 12.3657 | 12.9485 | 13.0857 | 13.0908 | 13.0776 | 21.4254 | 24.5855 | 25.1004 |
| u13 | 6.9312 | 7.0319 | 7.0445 | 7.0398 | 7.6568 | 12.3664 | 12.9482 | 13.0868 | 13.0908 | 13.1135 | 22.9997 | 26.5489 | 27.1403 |
| u14 | 6.9306 | 7.034 | 7.0512 | 7.1161 | 8.5075 | 14.2266 | 14.9667 | 15.1374 | 15.1424 | 15.1029 | 24.9582 | 28.6048 | 29.2023 |
| u15 | 6.9308 | 7.0339 | 7.0507 | 7.1152 | 8.5081 | 14.2263 | 14.9654 | 15.1385 | 15.1432 | 15.1828 | 26.5839 | 30.5966 | 31.2639 |
| u16 | 9.0002 | 9.1099 | 9.1078 | 9.0596 | 10.1193 | 16.2649 | 17.0437 | 17.2199 | 17.2122 | 17.1228 | 28.5435 | 32.6686 | 33.3472 |
| u17 | 9 | 9.1093 | 9.1085 | 9.0594 | 10.1198 | 16.2654 | 17.0432 | 17.2194 | 17.2139 | 17.293 | 30.2168 | 34.6883 | 35.4328 |
| u18 | 9.0014 | 9.1102 | 9.1259 | 9.2488 | 11.2407 | 18.1881 | 19.1132 | 19.3127 | 19.2996 | 19.1443 | 32.1825 | 36.7806 | 37.5374 |
| u19 | 9.0008 | 9.1102 | 9.1266 | 9.2503 | 11.2404 | 18.19 | 19.1131 | 19.3136 | 19.3035 | 19.4856 | 33.9092 | 38.8301 | 39.6482 |
| u20 | 11.0793 | 11.2291 | 11.1982 | 11.0923 | 12.7831 | 20.2619 | 21.2378 | 21.4435 | 21.408 | 21.2084 | 35.8821 | 40.9457 | 41.781 |
| u21 | 11.0811 | 11.2237 | 11.1986 | 11.093 | 12.7828 | 20.264 | 21.2361 | 21.4438 | 21.419 | 21.8192 | 37.6595 | 43.0323 | 43.9222 |
| u22 | 11.08 | 11.2233 | 11.2559 | 11.514 | 14.0803 | 22.2679 | 23.3688 | 23.5964 | 23.535 | 23.4078 | 39.6452 | 45.1778 | 46.0864 |
| u23 | 11.0799 | 11.2286 | 11.2575 | 11.5138 | 14.0809 | 22.2665 | 23.3675 | 23.5944 | 23.563 | 24.3166 | 41.4777 | 47.3044 | 48.262 |
| u24 | 13.254 | 13.3977 | 13.3168 | 13.2208 | 15.6096 | 24.3937 | 25.5513 | 25.7849 | 25.6784 | 25.8019 | 43.484 | 49.4846 | 50.4619 |
| u25 | 13.2562 | 13.4214 | 13.3181 | 13.2211 | 15.6103 | 24.3918 | 25.5503 | 25.7839 | 25.7477 | 26.9208 | 45.3687 | 51.6538 | 52.6767 |
| u26 | 13.2578 | 13.4225 | 13.4828 | 14.0047 | 17.02 | 26.4894 | 27.7584 | 28.0066 | 27.8312 | 28.3524 | 47.3978 | 53.8733 | 54.9154 |
| u27 | 13.2556 | 13.3979 | 13.4821 | 14.0052 | 17.0222 | 26.487 | 27.7589 | 28.0087 | 27.9939 | 29.588 | 49.3396 | 56.0924 | 57.1743 |
| u28 | 15.5004 | 15.7111 | 15.4632 | 15.5855 | 18.577 | 28.6855 | 30.0225 | 30.262 | 29.9913 | 31.0147 | 51.3978 | 58.3558 | 59.4576 |
| u29 | 15.4857 | 15.6237 | 15.4644 | 15.5855 | 18.5771 | 28.6848 | 30.0223 | 30.2757 | 30.3481 | 32.3241 | 53.3977 | 60.6272 | 61.764 |
| u30 | 15.4865 | 15.625 | 15.8754 | 16.7318 | 20.086 | 30.8885 | 32.3293 | 32.5545 | 32.2059 | 33.7617 | 55.4958 | 62.9378 | 64.0976 |
| u31 | 15.5004 | 15.7115 | 15.8741 | 16.7312 | 20.0864 | 30.8896 | 32.3289 | 32.5945 | 32.8891 | 35.1249 | 57.5558 | 65.2691 | 66.4551 |
| u32 | 17.8171 | 17.905 | 17.7218 | 18.2489 | 21.6967 | 33.1813 | 34.694 | 34.878 | 34.6021 | 36.5843 | 59.7015 | 67.6399 | 68.843 |
| u33 | 17.8798 | 18.1687 | 17.7224 | 18.2488 | 21.6967 | 33.1827 | 34.6962 | 34.988 | 35.6555 | 38.0015 | 61.8319 | 70.0352 | 71.2583 |
| u34 | 17.8811 | 18.1688 | 18.5635 | 19.6203 | 23.3093 | 35.5155 | 37.1099 | 37.2183 | 37.2621 | 39.4949 | 64.0329 | 72.4733 | 73.7038 |
| u35 | 17.8183 | 17.9043 | 18.5607 | 19.6213 | 23.3086 | 35.5157 | 37.1257 | 37.4866 | 38.5681 | 40.965 | 66.2391 | 74.9438 | 76.1825 |
| u36 | 20.4505 | 20.9194 | 20.2864 | 21.1594 | 25.0044 | 37.9407 | 39.5858 | 39.5997 | 40.1396 | 42.5006 | 68.5084 | 77.4569 | 78.6956 |
| u37 | 20.2235 | 20.2613 | 20.2866 | 21.1597 | 25.0041 | 37.9408 | 39.6421 | 40.1825 | 41.5814 | 44.0283 | 70.7985 | 80.0072 | 81.2408 |
| u38 | 20.2228 | 20.2596 | 21.5865 | 22.686 | 26.7369 | 40.4312 | 42.1039 | 42.1382 | 43.1702 | 45.6142 | 73.1434 | 82.6023 | 83.8204 |
| u39 | 20.4514 | 20.9191 | 21.5864 | 22.6865 | 26.7378 | 40.4436 | 42.272 | 43.174 | 44.7056 | 47.2067 | 75.5241 | 85.2424 | 86.4403 |
| u40 | 22.7323 | 22.8862 | 23.2637 | 24.3144 | 28.5466 | 43.0066 | 44.6578 | 44.9926 | 46.3389 | 48.8473 | 77.964 | 87.9349 | 89.0997 |
| u41 | 23.3691 | 24.1348 | 23.2623 | 24.3135 | 28.5545 | 43.0586 | 45.082 | 46.4069 | 47.959 | 50.5165 | 80.4512 | 90.6751 | 91.7963 |
| u42 | 23.3697 | 24.133 | 24.8626 | 25.9865 | 30.4157 | 45.6368 | 47.3199 | 48.1706 | 49.6546 | 52.2317 | 83.0006 | 93.4666 | 94.5366 |
| u43 | 22.7335 | 22.884 | 24.8623 | 25.9901 | 30.4477 | 45.8192 | 48.2111 | 49.8024 | 51.365 | 53.9774 | 85.6011 | 96.3129 | 97.3205 |
| u44 | 26.8707 | 27.7628 | 26.627 | 27.7458 | 32.3527 | 48.3313 | 50.2897 | 51.5981 | 53.1407 | 55.7749 | 88.2682 | 99.2175 | 100.1494 |
| u45 | 25.5392 | 26.0216 | 26.6288 | 27.7722 | 32.4627 | 48.8191 | 51.7228 | 53.3748 | 54.9521 | 57.6155 | 91.0021 | 102.1821 | 103.0246 |
| u46 | 25.5384 | 26.0217 | 28.4475 | 29.5707 | 34.3386 | 51.1757 | 53.7055 | 55.2549 | 56.8268 | 59.5099 | 93.8041 | 105.2061 | 105.9496 |
| u47 | 26.8739 | 27.7594 | 28.4692 | 29.6678 | 34.6571 | 52.2186 | 55.4999 | 57.1658 | 58.754 | 61.4529 | 96.6737 | 108.2976 | 108.9276 |
| u48 | 28.9851 | 29.7601 | 30.3758 | 31.4616 | 36.4337 | 54.4329 | 57.5125 | 59.1587 | 60.7475 | 63.4556 | 99.6202 | 111.4573 | 111.9612 |
| u49 | 30.9531 | 31.7887 | 30.4711 | 31.7591 | 37.1647 | 56.0941 | 59.5286 | 61.2176 | 62.8057 | 65.5158 | 102.6436 | 114.6864 | 115.0528 |
| u50 | 30.9871 | 31.9024 | 32.379 | 33.4641 | 38.8366 | 58.2455 | 61.6737 | 63.3609 | 64.9374 | 67.6339 | 105.7482 | 117.9917 | 118.2042 |
| u51 | 28.9841 | 29.7382 | 32.6972 | 34.1786 | 40.0745 | 60.3086 | 63.8886 | 65.5921 | 67.1439 | 69.821 | 108.9399 | 121.3788 | 121.419 |
| u52 | 36.1367 | 37.333 | 34.5326 | 35.8013 | 41.7055 | 62.5724 | 66.2226 | 67.9176 | 69.4313 | 72.0776 | 112.2236 | 124.848 | 124.7037 |
| u53 | 33.1985 | 33.9707 | 35.322 | 37.0377 | 43.2892 | 64.913 | 68.6675 | 70.3445 | 71.8036 | 74.4055 | 115.6037 | 128.406 | 128.065 |
| u54 | 33.3646 | 34.356 | 37.0884 | 38.642 | 45.0343 | 67.4166 | 71.2396 | 72.8828 | 74.2672 | 76.8106 | 119.0894 | 132.0584 | 131.5042 |
| u55 | 35.5643 | 36.3584 | 38.4975 | 40.2456 | 46.8712 | 70.0657 | 73.9506 | 75.5343 | 76.8264 | 79.2998 | 122.6798 | 135.8153 | 135.0306 |
| u56 | 39.6646 | 41.0237 | 40.2896 | 42.0186 | 48.848 | 72.8931 | 76.8123 | 78.3118 | 79.4908 | 81.8779 | 126.395 | 139.6847 | 138.6529 |
| u57 | 41.88 | 43.1264 | 42.1523 | 43.921 | 50.9695 | 75.9027 | 79.8314 | 81.223 | 82.2696 | 84.5537 | 130.2427 | 143.6811 | 142.3817 |
| u58 | 44.1256 | 45.4315 | 44.2271 | 45.9956 | 53.2553 | 79.117 | 83.0274 | 84.2827 | 85.1746 | 87.3442 | 134.239 | 147.8142 | 146.2294 |
| u59 | 38.3088 | 39.301 | 46.5077 | 48.2517 | 55.7201 | 82.5548 | 86.4123 | 87.508 | 88.2199 | 90.2591 | 138.4055 | 152.109 | 150.2155 |
| u60 | 49.7784 | 50.9441 | 49.0319 | 50.7149 | 58.3845 | 86.247 | 90.03 | 90.927 | 91.432 | 93.3206 | 142.7773 | 156.5952 | 154.3654 |
| u61 | 46.7646 | 48.0249 | 51.8299 | 53.4212 | 61.2877 | 90.244 | 93.9167 | 94.5792 | 94.8467 | 96.5606 | 147.3943 | 161.3181 | 158.7214 |
| u62 | 53.972 | 54.8835 | 54.9753 | 56.4311 | 64.4959 | 94.6335 | 98.1642 | 98.5339 | 98.5319 | 100.0465 | 152.3396 | 166.3635 | 163.3522 |
| u63 | 58.1359 | 58.7942 | 58.632 | 59.9046 | 68.168 | 99.6426 | 102.9507 | 102.9731 | 102.6388 | 103.9069 | 157.8042 | 171.9112 | 168.4213 | f2) 16384-QAM/128-PAM for a Fading Channel

| SNR | 0 | 1 | 2 | 3 | 4 | 5 | 6 | 7 | 8 | 9 | 10 | 11 | 12 | 13 |
|---|---|---|---|---|---|---|---|---|---|---|---|---|---|---|
| u1 | 0.9989 | 0.9988 | 1.0029 | 1.0023 | 1.0009 | 1.0079 | 1.0046 | 1.0005 | 1.0018 | 0.9971 | 0.9989 | 0.9997 | 0.9991 | 1.0004 |
| u2 | 0.9962 | 0.997 | 1.0044 | 1.0031 | 1.0013 | 1.022 | 1.0156 | 1.0084 | 1.0048 | 0.9951 | 0.9981 | 0.9994 | 0.9985 | 1.0006 |
| u3 | 0.9967 | 0.9958 | 1.0074 | 1.0046 | 1.0013 | 1.0137 | 1.0141 | 1.0096 | 1.007 | 0.9954 | 0.9984 | 0.9994 | 0.9979 | 1.0007 |
| u4 | 0.9871 | 0.994 | 1.0057 | 1.001 | 1.001 | 1.0342 | 1.0501 | 1.0275 | 1.0253 | 1.0156 | 1.0024 | 0.9997 | 0.9975 | 1.0011 |

| | | | | | | | | | | | | | | |
|---|---|---|---|---|---|---|---|---|---|---|---|---|---|---|
| u5 | 0.9859 | 0.9927 | 1.0082 | 1.0019 | 1.0012 | 1.043 | 1.0524 | 1.0268 | 1.0263 | 1.0136 | 1.0011 | 0.9995 | 0.9968 | 1.0013 |
| u6 | 0.9879 | 0.9917 | 1.0111 | 1.0045 | 1.0011 | 1.0287 | 1.0435 | 1.0193 | 1.026 | 1.0138 | 1.0008 | 0.9994 | 0.9963 | 1.0013 |
| u7 | 0.9885 | 0.9899 | 1.0138 | 1.0058 | 1.0007 | 1.0207 | 1.0415 | 1.0198 | 1.0271 | 1.0148 | 1.0013 | 0.9994 | 0.9958 | 1.0013 |
| u8 | 0.9494 | 0.9964 | 0.9929 | 0.9874 | 1.0002 | 1.0412 | 1.0937 | 1.0881 | 1.0715 | 1.0391 | 1.0201 | 1.0035 | 0.9936 | 0.9926 |
| u9 | 0.9484 | 0.9951 | 0.9943 | 0.9878 | 1.0002 | 1.0493 | 1.0955 | 1.0876 | 1.0708 | 1.038 | 1.0193 | 1.0034 | 0.9932 | 0.9928 |
| u10 | 0.9462 | 0.9939 | 0.9943 | 0.9877 | 1.0002 | 1.0636 | 1.1048 | 1.0962 | 1.0722 | 1.0369 | 1.0191 | 1.0032 | 0.9925 | 0.993 |
| u11 | 0.9468 | 0.993 | 0.9962 | 0.9887 | 1.0002 | 1.0553 | 1.1012 | 1.0967 | 1.0715 | 1.039 | 1.0198 | 1.0033 | 0.992 | 0.993 |
| u12 | 0.9552 | 0.9922 | 1.0031 | 0.9949 | 1.0011 | 1.0348 | 1.0609 | 1.0737 | 1.049 | 1.0201 | 1.0156 | 1.003 | 0.992 | 0.9933 |
| u13 | 0.9542 | 0.9914 | 1.0047 | 0.9955 | 1.002 | 1.0429 | 1.0633 | 1.0732 | 1.0486 | 1.0187 | 1.0147 | 1.0028 | 0.9916 | 0.9934 |
| u14 | 0.9561 | 0.9905 | 1.0073 | 0.9983 | 1.0037 | 1.0285 | 1.0536 | 1.0649 | 1.0466 | 1.0202 | 1.0148 | 1.0029 | 0.9913 | 0.9934 |
| u15 | 0.9567 | 0.9895 | 1.0089 | 0.9998 | 1.006 | 1.0203 | 1.0512 | 1.0654 | 1.0463 | 1.022 | 1.0154 | 1.0029 | 0.9906 | 0.9934 |
| u16 | 0.846 | 0.9872 | 1.0079 | 0.9975 | 0.9977 | 1.0393 | 1.1037 | 1.2076 | 1.3294 | 1.4778 | 1.7101 | 1.97 | 2.2195 | 2.4304 |
| u17 | 0.8463 | 0.9886 | 1.0064 | 0.9978 | 0.9995 | 1.0486 | 1.1082 | 1.2067 | 1.3296 | 1.4754 | 1.7087 | 1.9697 | 2.2196 | 2.4307 |
| u18 | 0.8453 | 0.99 | 1.005 | 0.9969 | 1.0006 | 1.0635 | 1.1194 | 1.216 | 1.3325 | 1.4737 | 1.7084 | 1.9694 | 2.2194 | 2.4311 |
| u19 | 0.8467 | 0.9912 | 1.0037 | 0.9969 | 1.002 | 1.0559 | 1.1172 | 1.2163 | 1.3322 | 1.4759 | 1.7097 | 1.9697 | 2.2194 | 2.4312 |
| u20 | 0.8403 | 0.9907 | 1.0008 | 0.994 | 1.0037 | 1.0767 | 1.159 | 1.2426 | 1.3635 | 1.5026 | 1.7162 | 1.9703 | 2.2183 | 2.4312 |
| u21 | 0.8405 | 0.9921 | 0.9983 | 0.9931 | 1.0041 | 1.0855 | 1.1625 | 1.2422 | 1.3635 | 1.5002 | 1.7148 | 1.9699 | 2.2184 | 2.4316 |
| u22 | 0.8431 | 0.9952 | 0.9965 | 0.9933 | 1.0042 | 1.0717 | 1.1524 | 1.2323 | 1.3602 | 1.5018 | 1.715 | 1.9702 | 2.2188 | 2.4316 |
| u23 | 0.845 | 0.9981 | 0.995 | 0.9925 | 1.0044 | 1.0641 | 1.1499 | 1.2325 | 1.3599 | 1.5041 | 1.7163 | 1.9704 | 2.2189 | 2.4316 |
| u24 | 0.8746 | 0.9923 | 1.0083 | 1.0042 | 1.0029 | 1.0407 | 1.0981 | 1.1559 | 1.3074 | 1.4681 | 1.6823 | 1.9579 | 2.2343 | 2.4767 |
| u25 | 0.8744 | 0.9931 | 1.007 | 1.0033 | 1.0027 | 1.0489 | 1.1008 | 1.1557 | 1.3067 | 1.4656 | 1.6809 | 1.9576 | 2.2343 | 2.4771 |
| u26 | 0.873 | 0.9933 | 1.0054 | 1.0016 | 1.0022 | 1.063 | 1.1107 | 1.1651 | 1.309 | 1.4637 | 1.6806 | 1.9574 | 2.234 | 2.4776 |
| u27 | 0.8741 | 0.994 | 1.0044 | 1.0011 | 1.0018 | 1.0547 | 1.1075 | 1.166 | 1.3077 | 1.4659 | 1.6819 | 1.9577 | 2.2339 | 2.4776 |
| u28 | 0.8817 | 0.9961 | 1.0075 | 1.0052 | 1.0014 | 1.0346 | 1.0666 | 1.1419 | 1.2759 | 1.4395 | 1.6754 | 1.957 | 2.2354 | 2.4777 |
| u29 | 0.8814 | 0.9967 | 1.0066 | 1.004 | 1 | 1.0428 | 1.0686 | 1.1419 | 1.2744 | 1.437 | 1.6741 | 1.9567 | 2.2355 | 2.478 |
| u30 | 0.8834 | 0.9971 | 1.0064 | 1.0048 | 1 | 1.0285 | 1.058 | 1.1338 | 1.2704 | 1.4386 | 1.6743 | 1.957 | 2.2358 | 2.478 |
| u31 | 0.8841 | 0.9972 | 1.006 | 1.0043 | 0.9994 | 1.0201 | 1.0547 | 1.1348 | 1.2687 | 1.4407 | 1.6756 | 1.9574 | 2.2358 | 2.4781 |
| u32 | 1.3629 | 2.0409 | 2.4229 | 2.7785 | 3.0286 | 3.5525 | 3.452 | 3.2399 | 3.2723 | 3.4148 | 3.6596 | 3.9456 | 4.2195 | 4.455 |
| u33 | 1.3616 | 2.0404 | 2.4238 | 2.7775 | 3.0179 | 3.3285 | 3.4601 | 3.2664 | 3.272 | 3.4212 | 3.6597 | 3.9438 | 4.2175 | 4.4543 |
| u34 | 1.358 | 2.0382 | 2.4229 | 2.7662 | 2.9906 | 3.05 | 3.3984 | 3.2771 | 3.3022 | 3.4405 | 3.6743 | 3.9524 | 4.2191 | 4.4538 |
| u35 | 1.3599 | 2.0382 | 2.4261 | 2.7681 | 2.9999 | 3.1665 | 3.3893 | 3.2497 | 3.3014 | 3.4349 | 3.6736 | 3.9535 | 4.2197 | 4.4544 |
| u36 | 1.345 | 2.0329 | 2.4052 | 2.7142 | 2.9046 | 2.8657 | 3.0974 | 3.2393 | 3.3361 | 3.4975 | 3.7337 | 4.0015 | 4.2519 | 4.4678 |
| u37 | 1.3438 | 2.0323 | 2.4051 | 2.713 | 2.8958 | 2.8059 | 3.1063 | 3.2614 | 3.3361 | 3.5053 | 3.7343 | 4.0001 | 4.2499 | 4.4671 |
| u38 | 1.3479 | 2.0341 | 2.4101 | 2.7237 | 2.9186 | 2.9411 | 3.128 | 3.2458 | 3.3058 | 3.4856 | 3.7178 | 3.9905 | 4.2468 | 4.4675 |
| u39 | 1.3497 | 2.034 | 2.4127 | 2.7252 | 2.9269 | 3.0236 | 3.1188 | 3.2208 | 3.3054 | 3.4793 | 3.7171 | 3.9919 | 4.2479 | 4.4682 |
| u40 | 1.2826 | 2.0133 | 2.365 | 2.5997 | 2.6751 | 2.8004 | 2.9034 | 3.0715 | 3.3102 | 3.5467 | 3.8776 | 4.2522 | 4.6189 | 4.9499 |
| u41 | 1.2818 | 2.0123 | 2.3637 | 2.5981 | 2.6701 | 2.7492 | 2.9078 | 3.0856 | 3.3109 | 3.554 | 3.8792 | 4.251 | 4.6171 | 4.9486 |
| u42 | 1.2788 | 2.0097 | 2.3605 | 2.5883 | 2.6558 | 2.656 | 2.8982 | 3.0946 | 3.3356 | 3.5759 | 3.8991 | 4.2651 | 4.622 | 4.9478 |
| u43 | 1.2804 | 2.0091 | 2.362 | 2.589 | 2.6631 | 2.6836 | 2.8851 | 3.0783 | 3.3366 | 3.5679 | 3.8974 | 4.2665 | 4.6241 | 4.9489 |
| u44 | 1.2944 | 2.014 | 2.3852 | 2.6329 | 2.7231 | 2.8828 | 3.0342 | 3.0854 | 3.3064 | 3.5069 | 3.8306 | 4.204 | 4.5744 | 4.9257 |
| u45 | 1.2935 | 2.0131 | 2.384 | 2.6311 | 2.7177 | 2.8219 | 3.0433 | 3.1019 | 3.3071 | 3.5137 | 3.8318 | 4.2028 | 4.5726 | 4.9245 |
| u46 | 1.2972 | 2.0149 | 2.3879 | 2.6404 | 2.7354 | 2.9691 | 3.0594 | 3.0876 | 3.2821 | 3.4927 | 3.8137 | 4.1902 | 4.5683 | 4.9251 |
| u47 | 1.299 | 2.0145 | 2.3898 | 2.6411 | 2.7422 | 3.0569 | 3.0508 | 3.0704 | 3.282 | 3.4857 | 3.8125 | 4.1918 | 4.5703 | 4.9262 |
| u48 | 1.5313 | 2.0191 | 2.3561 | 2.6229 | 2.8594 | 3.5888 | 3.5261 | 3.7149 | 4.3926 | 4.8997 | 5.2665 | 5.7826 | 6.2706 | 6.6945 |
| u49 | 1.5291 | 2.0206 | 2.3598 | 2.6233 | 2.8526 | 3.3576 | 3.5326 | 3.7612 | 4.3914 | 4.9813 | 5.3123 | 5.8072 | 6.2826 | 6.6978 |
| u50 | 1.5241 | 2.0213 | 2.3599 | 2.6144 | 2.8323 | 3.0728 | 3.4598 | 3.7455 | 4.4316 | 5.0823 | 5.3952 | 5.8874 | 6.3481 | 6.7426 |
| u51 | 1.5256 | 2.0228 | 2.3654 | 2.6171 | 2.8413 | 3.1848 | 3.4525 | 3.706 | 4.4301 | 4.9982 | 5.3435 | 5.8583 | 6.3349 | 6.7394 |
| u52 | 1.507 | 2.0211 | 2.3471 | 2.5738 | 2.7683 | 2.8691 | 3.1305 | 3.6125 | 4.2759 | 4.7815 | 5.3532 | 5.9582 | 6.5204 | 7.0147 |
| u53 | 1.5051 | 2.0226 | 2.3509 | 2.5745 | 2.7619 | 2.8099 | 3.1398 | 3.6443 | 4.2761 | 4.8302 | 5.3948 | 5.988 | 6.5386 | 7.022 |
| u54 | 1.5094 | 2.0257 | 2.3572 | 2.5845 | 2.7819 | 2.9556 | 3.1622 | 3.6488 | 4.2348 | 4.7643 | 5.327 | 5.9103 | 6.4612 | 6.9572 |
| u55 | 1.511 | 2.0274 | 2.3625 | 2.5872 | 2.7902 | 3.0453 | 3.1527 | 3.618 | 4.234 | 4.7176 | 5.2885 | 5.8843 | 6.4457 | 6.9515 |
| u56 | 1.6021 | 2.0284 | 2.3939 | 2.7143 | 3.1057 | 3.5076 | 3.689 | 4.5134 | 4.8429 | 5.1235 | 6.0822 | 6.8988 | 7.6405 | 8.2935 |
| u57 | 1.5995 | 2.0305 | 2.3955 | 2.7123 | 3.0929 | 3.3048 | 3.6869 | 4.5115 | 4.842 | 5.2273 | 6.214 | 7.0241 | 7.7438 | 8.3667 |
| u58 | 1.5941 | 2.031 | 2.3942 | 2.7005 | 3.0605 | 3.0374 | 3.5882 | 4.3291 | 4.8102 | 5.309 | 6.2458 | 7.0937 | 7.8834 | 8.5802 |
| u59 | 1.5954 | 2.0347 | 2.3975 | 2.7015 | 3.0727 | 3.1457 | 3.5857 | 4.3044 | 4.8112 | 5.2174 | 6.1432 | 6.9892 | 7.7827 | 8.4912 |
| u60 | 1.6145 | 2.0398 | 2.417 | 2.7561 | 3.212 | 3.8643 | 4.617 | 4.9699 | 5.625 | 6.2727 | 6.9795 | 7.8126 | 8.6889 | 9.531 |
| u61 | 1.6118 | 2.0429 | 2.417 | 2.7528 | 3.1958 | 3.5371 | 4.4599 | 4.9035 | 5.6215 | 6.2593 | 7.0494 | 7.9583 | 8.8773 | 9.7608 |
| u62 | 1.6162 | 2.0472 | 2.4211 | 2.7624 | 3.2323 | 4.2147 | 5.1263 | 5.6564 | 6.9712 | 7.0092 | 7.8747 | 8.854 | 9.824 | 10.7896 |
| u63 | 1.6177 | 2.0493 | 2.4237 | 2.7617 | 3.244 | 5.598 | 6.2209 | 6.8304 | 6.9863 | 8.3585 | 9.343 | 10.4137 | 11.462 | 12.4776 |

| SNR | 14 | 15 | 16 | 17 | 18 | 19 | 20 | 21 | 22 | 23 | 24 | 25 | 26 | 27 |
|---|---|---|---|---|---|---|---|---|---|---|---|---|---|---|
| u1 | 0.9999 | 0.9999 | 1 | 1.0001 | 0.9997 | 0.9998 | 1.0001 | 0.9997 | 1.0005 | 1.0006 | 1.0001 | 1.001 | 1.0002 | 0.9999 |
| u2 | 0.9999 | 1 | 1.0003 | 1.0003 | 0.9996 | 0.9995 | 0.9999 | 1.0002 | 0.9999 | 1.0007 | 1.0001 | 1 | 1.0001 | 1.0007 |
| u3 | 0.9998 | 0.9998 | 1.0002 | 1.0003 | 0.9994 | 0.9993 | 0.9999 | 0.9999 | 1.0004 | 1.0009 | 1.0007 | 1.0014 | 1.0007 | 0.999 |
| u4 | 0.9996 | 0.9978 | 0.9975 | 0.9985 | 0.9999 | 1.0003 | 0.9999 | 1.0004 | 1.0014 | 1.0275 | 1.3247 | 1.8719 | 2.2327 | 2.4633 |
| u5 | 0.9996 | 0.9977 | 0.9974 | 0.9986 | 0.9997 | 1.0001 | 1.0002 | 0.9996 | 1.0019 | 1.0279 | 1.3238 | 1.8728 | 2.2336 | 2.4642 |
| u6 | 0.9994 | 0.9974 | 0.9971 | 0.9984 | 0.9995 | 0.9999 | 0.9997 | 1.0005 | 1.0015 | 1.0275 | 1.3243 | 1.8711 | 2.2327 | 2.4657 |
| u7 | 0.9994 | 0.9972 | 0.997 | 0.9984 | 0.9993 | 0.9996 | 1 | 1 | 1.002 | 1.0279 | 1.3238 | 1.8723 | 2.2333 | 2.4652 |
| u8 | 0.9951 | 1.0119 | 1.0641 | 1.2256 | 1.6094 | 2.0167 | 2.3187 | 2.5221 | 2.6542 | 2.7457 | 3.0728 | 3.6797 | 4.0893 | 4.358 |
| u9 | 0.9952 | 1.0118 | 1.0641 | 1.2257 | 1.6092 | 2.0163 | 2.3185 | 2.5221 | 2.6545 | 2.7465 | 3.0724 | 3.6786 | 4.0902 | 4.3579 |
| u10 | 0.9953 | 1.0119 | 1.0643 | 1.2259 | 1.6091 | 2.0163 | 2.3187 | 2.5218 | 2.6545 | 2.7465 | 3.0727 | 3.6794 | 4.0906 | 4.3587 |
| u11 | 0.9952 | 1.0117 | 1.0642 | 1.2259 | 1.6089 | 2.016 | 2.3188 | 2.522 | 2.6546 | 2.7466 | 3.0729 | 3.6793 | 4.0898 | 4.3589 |
| u12 | 0.9945 | 1.0132 | 1.0667 | 1.2274 | 1.6105 | 2.0168 | 2.3179 | 2.5218 | 2.6643 | 2.8236 | 3.5071 | 4.6309 | 5.3838 | 5.8735 |
| u13 | 0.9946 | 1.0131 | 1.0667 | 1.2275 | 1.6103 | 2.0166 | 2.3178 | 2.5218 | 2.6648 | 2.8242 | 3.5073 | 4.6315 | 5.3844 | 5.8717 |
| u14 | 0.9944 | 1.0128 | 1.0664 | 1.2273 | 1.6101 | 2.0164 | 2.3178 | 2.5221 | 2.664 | 2.8237 | 3.5056 | 4.6308 | 5.3849 | 5.8724 |
| u15 | 0.9943 | 1.0126 | 1.0663 | 1.2273 | 1.6098 | 2.0159 | 2.3178 | 2.5224 | 2.6648 | 2.8234 | 3.507 | 4.6313 | 5.3852 | 5.872 |
| u16 | 2.5761 | 2.6771 | 2.7747 | 2.9747 | 3.4295 | 3.9068 | 4.259 | 4.4941 | 4.631 | 4.7146 | 5.3762 | 6.5959 | 7.3934 | 7.901 |
| u17 | 2.5759 | 2.6769 | 2.7747 | 2.9748 | 3.4293 | 3.9071 | 4.2591 | 4.4942 | 4.6316 | 4.7147 | 5.3781 | 6.5955 | 7.3896 | 7.9034 |

-continued

| | | | | | | | | | | | | | | |
|---|---|---|---|---|---|---|---|---|---|---|---|---|---|---|
| u18 | 2.5761 | 2.6766 | 2.7745 | 2.9749 | 3.4291 | 3.9064 | 4.2591 | 4.4944 | 4.632 | 4.7157 | 5.376 | 6.5969 | 7.3914 | 7.9033 |
| u19 | 2.5758 | 2.6765 | 2.7744 | 2.9748 | 3.4289 | 3.9064 | 4.259 | 4.4945 | 4.6321 | 4.7156 | 5.3768 | 6.5951 | 7.3914 | 7.9016 |
| u20 | 2.5757 | 2.6807 | 2.7808 | 2.9792 | 3.4318 | 3.9075 | 4.2591 | 4.5035 | 4.6889 | 4.9481 | 6.0434 | 7.7141 | 8.8142 | 9.5277 |
| u21 | 2.5756 | 2.6805 | 2.7808 | 2.9793 | 3.4316 | 3.9074 | 4.2594 | 4.5036 | 4.689 | 4.9489 | 6.0427 | 7.7138 | 8.8145 | 9.5234 |
| u22 | 2.5753 | 2.6804 | 2.7809 | 2.9792 | 3.4314 | 3.9067 | 4.2591 | 4.5037 | 4.6881 | 4.9482 | 6.0423 | 7.7129 | 8.8163 | 9.5246 |
| u23 | 2.5751 | 2.6803 | 2.7808 | 2.9792 | 3.4313 | 3.907 | 4.2598 | 4.5039 | 4.6882 | 4.9477 | 6.0431 | 7.7148 | 8.8138 | 9.5258 |
| u24 | 2.6708 | 2.8589 | 3.0989 | 3.5599 | 4.4098 | 5.2362 | 5.8285 | 6.2089 | 6.4094 | 6.5755 | 7.7134 | 9.5764 | 10.7824 | 11.5512 |
| u25 | 2.6707 | 2.8587 | 3.0989 | 3.56 | 4.4097 | 5.2356 | 5.8281 | 6.2088 | 6.4093 | 6.5743 | 7.7142 | 9.5751 | 10.7828 | 11.5554 |
| u26 | 2.6706 | 2.8584 | 3.0987 | 3.5601 | 4.4096 | 5.2357 | 5.8291 | 6.2087 | 6.4093 | 6.5769 | 7.7139 | 9.5761 | 10.7815 | 11.5581 |
| u27 | 2.6704 | 2.8584 | 3.0986 | 3.56 | 4.4093 | 5.2354 | 5.8289 | 6.2089 | 6.4094 | 6.5748 | 7.7127 | 9.575 | 10.7833 | 11.553 |
| u28 | 2.6696 | 2.8533 | 3.0899 | 3.5516 | 4.4062 | 5.2382 | 5.8505 | 6.2904 | 6.6495 | 7.1289 | 8.692 | 10.9478 | 12.4191 | 13.3731 |
| u29 | 2.6694 | 2.8531 | 3.0899 | 3.5517 | 4.4061 | 5.2378 | 5.8507 | 6.2908 | 6.6497 | 7.1297 | 8.6912 | 10.9479 | 12.4195 | 13.3502 |
| u30 | 2.6689 | 2.8531 | 3.0901 | 3.5517 | 4.4059 | 5.238 | 5.8508 | 6.2906 | 6.6488 | 7.1283 | 8.6933 | 10.9474 | 12.4173 | 13.3487 |
| u31 | 2.6686 | 2.8531 | 3.0901 | 3.5517 | 4.4054 | 5.2375 | 5.8508 | 6.2913 | 6.649 | 7.1282 | 8.6913 | 10.9473 | 12.4192 | 13.3722 |
| u32 | 4.6187 | 4.7607 | 4.9645 | 5.4476 | 6.4234 | 7.3577 | 7.984 | 8.3511 | 8.5574 | 8.8785 | 10.5402 | 13.0392 | 14.617 | 15.5648 |
| u33 | 4.6188 | 4.7609 | 4.9647 | 5.4476 | 6.4234 | 7.3577 | 7.9838 | 8.3502 | 8.555 | 8.8796 | 10.5413 | 13.0406 | 14.6184 | 15.6646 |
| u34 | 4.6184 | 4.7616 | 4.9658 | 5.4485 | 6.4234 | 7.357 | 7.984 | 8.3507 | 8.5578 | 8.8816 | 10.5404 | 13.0391 | 14.6312 | 15.6624 |
| u35 | 4.6185 | 4.7612 | 4.9656 | 5.4485 | 6.4232 | 7.3572 | 7.9842 | 8.3515 | 8.5563 | 8.8807 | 10.5401 | 13.0401 | 14.6319 | 15.5607 |
| u36 | 4.6124 | 4.7447 | 4.9489 | 5.4402 | 6.4384 | 7.4182 | 8.1423 | 8.6986 | 9.2012 | 9.8304 | 11.8335 | 14.6892 | 16.4785 | 17.8395 |
| u37 | 4.6127 | 4.745 | 4.9491 | 5.4403 | 6.4383 | 7.4183 | 8.1423 | 8.6985 | 9.2003 | 9.8301 | 11.8338 | 14.6915 | 16.4779 | 17.5206 |
| u38 | 4.6133 | 4.7442 | 4.948 | 5.4394 | 6.4378 | 7.4179 | 8.1433 | 8.6978 | 9.1987 | 9.829 | 11.8352 | 14.7102 | 16.5702 | 17.5149 |
| u39 | 4.6134 | 4.7438 | 4.9478 | 5.4394 | 6.4375 | 7.4173 | 8.1427 | 8.6971 | 9.1986 | 9.8298 | 11.8374 | 14.7102 | 16.5711 | 17.8348 |
| u40 | 5.2325 | 5.5363 | 5.94 | 6.6655 | 7.9474 | 9.1302 | 9.9272 | 10.4599 | 10.8897 | 11.4804 | 13.678 | 16.8135 | 18.7036 | 19.8248 |
| u41 | 5.2324 | 5.5368 | 5.94 | 6.6657 | 7.9469 | 9.1296 | 9.927 | 10.4602 | 10.8893 | 11.4791 | 13.677 | 16.8132 | 18.7045 | 20.5433 |
| u42 | 5.2307 | 5.5377 | 5.9424 | 6.6722 | 7.9544 | 9.1366 | 9.9303 | 10.4585 | 10.8877 | 11.4835 | 13.7102 | 16.9334 | 19.0442 | 20.5387 |
| u43 | 5.2302 | 5.537 | 5.9423 | 6.6721 | 7.9545 | 9.1368 | 9.9305 | 10.4598 | 10.8879 | 11.4845 | 13.7099 | 16.9333 | 19.0433 | 19.8224 |
| u44 | 5.2392 | 5.5887 | 6.0408 | 6.8364 | 8.2261 | 9.571 | 10.6064 | 11.4263 | 12.1002 | 12.8576 | 15.3198 | 18.7743 | 20.9002 | 23.5006 |
| u45 | 5.2391 | 5.5892 | 6.0408 | 6.8366 | 8.2254 | 9.5701 | 10.6058 | 11.4262 | 12.099 | 12.8572 | 15.319 | 18.7761 | 20.8992 | 22.3178 |
| u46 | 5.2404 | 5.5882 | 6.0382 | 6.8289 | 8.2148 | 9.5584 | 10.5981 | 11.429 | 12.1242 | 12.9343 | 15.5198 | 19.2368 | 21.7361 | 22.32 |
| u47 | 5.24 | 5.5876 | 6.0381 | 6.8288 | 8.2149 | 9.5584 | 10.5982 | 11.4285 | 12.1239 | 12.9344 | 15.5203 | 19.2389 | 21.7386 | 23.5021 |
| u48 | 7.013 | 7.3345 | 7.7637 | 8.6099 | 10.17 | 11.6313 | 12.6654 | 13.4186 | 14.012 | 14.7276 | 17.4193 | 21.3014 | 23.7907 | 25.5077 |
| u49 | 7.0128 | 7.3333 | 7.7635 | 8.6113 | 10.1716 | 11.6321 | 12.6649 | 13.4183 | 14.0118 | 14.7294 | 17.4205 | 21.3024 | 23.7908 | 27.071 |
| u50 | 7.0349 | 7.3345 | 7.7495 | 8.5872 | 10.1465 | 11.6186 | 12.6808 | 13.4891 | 14.1858 | 15.0687 | 18.0525 | 22.3301 | 25.1476 | 27.1051 |
| u51 | 7.035 | 7.3356 | 7.7497 | 8.5859 | 10.1447 | 11.6171 | 12.6806 | 13.4899 | 14.1851 | 15.0665 | 18.051 | 22.3288 | 25.1536 | 25.5048 |
| u52 | 7.4046 | 7.8017 | 8.3336 | 9.3452 | 11.1551 | 12.8729 | 14.1217 | 15.0367 | 15.7471 | 16.616 | 19.7548 | 24.2571 | 27.1695 | 31.6586 |
| u53 | 7.4058 | 7.7994 | 8.3323 | 9.3489 | 11.1624 | 12.8834 | 14.1317 | 15.0426 | 15.7489 | 16.6159 | 19.7531 | 24.2712 | 27.2292 | 29.1086 |
| u54 | 7.3633 | 7.7915 | 8.3632 | 9.4306 | 11.3056 | 13.1108 | 14.4682 | 15.5375 | 16.4637 | 17.5688 | 21.022 | 25.8837 | 28.9904 | 29.2925 |
| u55 | 7.3624 | 7.7933 | 8.3644 | 9.4269 | 11.2971 | 13.0972 | 14.4521 | 15.5234 | 16.4628 | 17.5857 | 21.0793 | 26.0304 | 29.3208 | 31.0453 |
| u56 | 8.8065 | 9.3135 | 9.9376 | 11.0884 | 13.1378 | 15.0593 | 16.4427 | 17.4752 | 18.3209 | 19.3541 | 22.9699 | 28.108 | 31.3876 | 34.8066 |
| u57 | 8.8474 | 9.3315 | 9.9371 | 11.0714 | 13.1081 | 15.0256 | 16.4193 | 17.4806 | 18.3726 | 19.4911 | 23.263 | 28.6693 | 32.2909 | 36.6067 |
| u58 | 9.1327 | 9.6836 | 10.3651 | 11.612 | 13.8329 | 15.9587 | 17.5435 | 18.7598 | 19.746 | 20.9135 | 24.8649 | 30.5061 | 34.1994 | 38.3565 |
| u59 | 9.0672 | 9.6447 | 10.3583 | 11.6469 | 13.92 | 16.1127 | 17.7783 | 19.0856 | 20.2014 | 21.5612 | 25.8244 | 31.8572 | 35.8395 | 33.6374 |
| u60 | 10.241 | 10.929 | 11.7451 | 13.1656 | 15.6366 | 17.9556 | 19.6557 | 20.9527 | 22.03 | 23.3514 | 27.7978 | 34.122 | 38.2463 | 41.6053 |
| u61 | 10.4994 | 11.228 | 12.0958 | 13.598 | 16.2181 | 18.729 | 20.6497 | 22.1512 | 23.4014 | 24.8846 | 29.6552 | 36.3897 | 40.7559 | 43.927 |
| u62 | 11.6406 | 12.4845 | 13.4986 | 15.1983 | 18.1005 | 20.8322 | 22.8713 | 24.4239 | 25.6952 | 27.2098 | 32.2996 | 39.4812 | 44.0647 | 47.2753 |
| u63 | 13.3608 | 14.2674 | 15.3815 | 17.2797 | 20.5285 | 23.5625 | 25.7938 | 27.4371 | 28.746 | 30.303 | 35.8031 | 43.5599 | 48.394 | 51.6747 |

| SNR | 28 | 29 | 30 |
|---|---|---|---|
| u1 | 1 | 0.9941 | 1.0006 |
| u2 | 0.9961 | 0.9992 | 1.213 |
| u3 | 0.9985 | 1.0038 | 1.21 |
| u4 | 2.6117 | 2.7108 | 2.9641 |
| u5 | 2.6119 | 2.7122 | 2.9636 |
| u6 | 2.6108 | 2.7177 | 3.2056 |
| u7 | 2.6092 | 2.7167 | 3.2068 |
| u8 | 4.5274 | 4.6511 | 5.1068 |
| u9 | 4.5254 | 4.6491 | 5.1065 |
| u10 | 4.5258 | 4.6621 | 5.4289 |
| u11 | 4.5276 | 4.6634 | 5.4289 |
| u12 | 6.1814 | 6.3913 | 7.1006 |
| u13 | 6.1801 | 6.3942 | 7.0992 |
| u14 | 6.1819 | 6.4253 | 7.5493 |
| u15 | 6.181 | 6.4219 | 7.5507 |
| u16 | 8.2092 | 8.414 | 9.3721 |
| u17 | 8.2092 | 8.4115 | 9.3723 |
| u18 | 8.2196 | 8.493 | 9.9573 |
| u19 | 8.2196 | 8.4937 | 9.9568 |
| u20 | 9.9591 | 10.2022 | 11.5446 |
| u21 | 9.9545 | 10.2008 | 11.5437 |
| u22 | 9.9731 | 10.3908 | 12.2584 |
| u23 | 9.978 | 10.392 | 12.2575 |
| u24 | 11.9929 | 12.2139 | 13.97 |
| u25 | 11.9987 | 12.2143 | 13.9706 |
| u26 | 12.0585 | 12.6031 | 14.8316 |
| u27 | 12.0523 | 12.6008 | 14.8311 |
| u28 | 13.85 | 14.1771 | 16.4155 |
| u29 | 13.8461 | 14.1776 | 16.4152 |
| u30 | 14.0343 | 14.8201 | 17.4439 |

|     |          |          |          |
| --- | -------- | -------- | -------- |
| u31 | 14.0384  | 14.8185  | 17.4452  |
| u32 | 16.0188  | 16.526   | 19.1973  |
| u33 | 16.0226  | 16.5255  | 19.1981  |
| u34 | 16.4627  | 17.3853  | 20.3747  |
| u35 | 16.4617  | 17.3844  | 20.3735  |
| u36 | 18.1241  | 18.9258  | 22.0463  |
| u37 | 18.1257  | 18.9254  | 22.0474  |
| u38 | 18.8767  | 19.9861  | 23.3893  |
| u39 | 18.8812  | 19.9855  | 23.3882  |
| u40 | 20.6662  | 21.6869  | 25.2366  |
| u41 | 20.6656  | 21.6863  | 25.2361  |
| u42 | 21.7376  | 22.959   | 26.7625  |
| u43 | 21.7386  | 22.9576  | 26.7689  |
| u44 | 23.4576  | 24.6756  | 28.6507  |
| u45 | 23.4597  | 24.6791  | 28.6958  |
| u46 | 24.8544  | 26.1926  | 30.3706  |
| u47 | 24.8569  | 26.2204  | 30.5402  |
| u48 | 26.8146  | 28.1094  | 32.437   |
| u49 | 26.8394  | 28.2358  | 32.8644  |
| u50 | 28.4818  | 29.8243  | 34.4657  |
| u51 | 28.6146  | 30.1978  | 35.2449  |
| u52 | 30.4923  | 31.9052  | 36.9762  |
| u53 | 30.9361  | 32.6793  | 38.1036  |
| u54 | 32.5927  | 34.2525  | 39.8085  |
| u55 | 33.5509  | 35.447   | 41.281   |
| u56 | 35.418   | 37.2676  | 43.2674  |
| u57 | 36.8325  | 38.8242  | 45.0812  |
| u58 | 38.7904  | 40.803   | 47.2854  |
| u59 | 40.7347  | 42.8248  | 49.5626  |
| u60 | 43.2185  | 45.313   | 52.3141  |
| u61 | 45.8981  | 48.0239  | 55.3102  |
| u62 | 49.2922  | 51.3988  | 59.013   |
| u63 | 53.675   | 55.7554  | 63.7521  | g) 65536-QAM/256-PAM for a Non-Fading Channel

| SNR | 0 | 1 | 2 | 3 | 4 | 5 | 6 | 7 | 8 | 9 | 10 | 11 | 12 | 13 |
| --- | --- | --- | --- | --- | --- | --- | --- | --- | --- | --- | --- | --- | --- | --- |
| u1 | 0.9999 | 0.9999 | 0.9999 | 0.9998 | 1.0006 | 0.9987 | 1.0011 | 1.0061 | 1.0106 | 1.0072 | 0.995 | 1.0017 | 1.0001 | 1.0007 |
| u2 | 0.9999 | 0.9992 | 0.999 | 0.9992 | 1.0011 | 0.9977 | 1.0019 | 1.0397 | 0.9828 | 0.9887 | 0.9974 | 1.0003 | 1.002 |
| u3 | 0.9999 | 0.9995 | 0.9985 | 0.9989 | 1.0021 | 0.9968 | 1.0029 | 1.0368 | 0.9737 | 0.9812 | 0.9945 | 0.9951 | 1.0003 | 1.0014 |
| u4 | 0.9995 | 0.9968 | 0.9959 | 0.9973 | 1.0025 | 0.9958 | 1.0028 | 1.0735 | 1.0355 | 0.9466 | 0.9768 | 0.9874 | 0.9983 | 1.0022 |
| u5 | 0.9994 | 0.9967 | 0.9957 | 0.9971 | 1.0032 | 0.9952 | 1.003 | 1.0783 | 1.0464 | 0.953 | 0.972 | 0.9891 | 0.9984 | 1.0029 |
| u6 | 0.9994 | 0.9975 | 0.9962 | 0.9971 | 1.0038 | 0.9945 | 1.0036 | 1.0457 | 1.0772 | 0.9704 | 0.9798 | 0.9925 | 0.9984 | 1.0017 |
| u7 | 0.9995 | 0.9978 | 0.9958 | 0.9968 | 1.0047 | 0.9934 | 1.0039 | 1.0406 | 1.0667 | 0.9628 | 0.9858 | 0.9903 | 0.9983 | 1.0012 |
| u8 | 0.9987 | 0.9858 | 0.9859 | 0.9897 | 1.0036 | 0.992 | 1.0017 | 1.0742 | 1.1355 | 1.0509 | 0.9696 | 0.9935 | 0.9849 | 0.9958 |
| u9 | 0.9987 | 0.9857 | 0.9858 | 0.9894 | 1.0045 | 0.9913 | 1.0016 | 1.0791 | 1.1472 | 1.0587 | 0.9647 | 0.9952 | 0.9849 | 0.9965 |
| u10 | 0.9986 | 0.985 | 0.985 | 0.9889 | 1.0049 | 0.9907 | 1.0014 | 1.1129 | 1.1145 | 1.0389 | 0.9585 | 0.991 | 0.9848 | 0.9978 |
| u11 | 0.9986 | 0.9853 | 0.9845 | 0.9887 | 1.0057 | 0.9903 | 1.0015 | 1.1076 | 1.103 | 1.0312 | 0.9638 | 0.9888 | 0.9847 | 0.9973 |
| u12 | 0.999 | 0.9882 | 0.9866 | 0.9897 | 1.0068 | 0.9896 | 1.0019 | 1.0674 | 1.0358 | 1.0697 | 0.9823 | 0.9958 | 0.9867 | 0.9966 |
| u13 | 0.9989 | 0.9881 | 0.9865 | 0.9895 | 1.0072 | 0.9892 | 1.0015 | 1.0723 | 1.0465 | 1.0778 | 0.9773 | 0.9977 | 0.9867 | 0.9973 |
| u14 | 0.999 | 0.9889 | 0.9871 | 0.9896 | 1.0081 | 0.9885 | 1.0015 | 1.0395 | 1.077 | 1.0982 | 0.9847 | 1.0016 | 0.9866 | 0.9962 |
| u15 | 0.999 | 0.9892 | 0.9866 | 0.9893 | 1.0086 | 0.9877 | 1.0014 | 1.0342 | 1.066 | 1.09 | 0.9902 | 0.9995 | 0.9865 | 0.9956 |
| u16 | 0.995 | 0.9494 | 0.9447 | 0.9568 | 0.9971 | 0.9929 | 0.9987 | 1.0732 | 1.1387 | 1.2263 | 1.1006 | 1.0039 | 0.9751 | 0.9687 |
| u17 | 0.995 | 0.9493 | 0.9447 | 0.9567 | 0.9973 | 0.9926 | 0.9983 | 1.0784 | 1.1504 | 1.2352 | 1.0939 | 1.006 | 0.9752 | 0.9694 |
| u18 | 0.9949 | 0.9487 | 0.9438 | 0.9563 | 0.9976 | 0.9924 | 0.9979 | 1.1121 | 1.118 | 1.2125 | 1.0854 | 1.0018 | 0.9753 | 0.9706 |
| u19 | 0.995 | 0.949 | 0.9435 | 0.9561 | 0.998 | 0.9922 | 0.9978 | 1.1072 | 1.1066 | 1.2033 | 1.0915 | 0.9998 | 0.9752 | 0.9701 |
| u20 | 0.9946 | 0.9465 | 0.9411 | 0.9548 | 0.9978 | 0.9918 | 0.9972 | 1.1489 | 1.179 | 1.1598 | 1.0703 | 0.9922 | 0.9736 | 0.9708 |
| u21 | 0.9945 | 0.9465 | 0.9411 | 0.9547 | 0.9982 | 0.9916 | 0.9972 | 1.1543 | 1.1911 | 1.1686 | 1.064 | 0.9942 | 0.9737 | 0.9716 |
| u22 | 0.9945 | 0.9473 | 0.9415 | 0.9548 | 0.9985 | 0.9913 | 0.9974 | 1.1196 | 1.2251 | 1.1908 | 1.072 | 0.9981 | 0.9734 | 0.9705 |
| u23 | 0.9946 | 0.9476 | 0.9412 | 0.9547 | 0.9989 | 0.9912 | 0.9977 | 1.1146 | 1.213 | 1.1819 | 1.0782 | 0.9962 | 0.9733 | 0.9701 |
| u24 | 0.9954 | 0.9588 | 0.9498 | 0.9608 | 1.0009 | 0.9914 | 0.9981 | 1.0764 | 1.1374 | 1.0787 | 1.0934 | 0.9942 | 0.9849 | 0.9756 |
| u25 | 0.9953 | 0.9588 | 0.9497 | 0.9606 | 1.0012 | 0.9912 | 0.9985 | 1.0815 | 1.1491 | 1.087 | 1.0873 | 0.9962 | 0.985 | 0.9763 |
| u26 | 0.9953 | 0.9581 | 0.949 | 0.9602 | 1.0014 | 0.9909 | 0.9988 | 1.1154 | 1.1165 | 1.0667 | 1.0794 | 0.9921 | 0.9851 | 0.9776 |
| u27 | 0.9953 | 0.9584 | 0.9486 | 0.9602 | 1.0017 | 0.9905 | 0.9998 | 1.1102 | 1.105 | 1.0589 | 1.0858 | 0.9902 | 0.9851 | 0.9771 |
| u28 | 0.9957 | 0.9611 | 0.9507 | 0.9612 | 1.0026 | 0.9902 | 1.0011 | 1.0702 | 1.0378 | 1.0988 | 1.1065 | 0.9984 | 0.9872 | 0.9765 |
| u29 | 0.9957 | 0.961 | 0.9507 | 0.9611 | 1.003 | 0.9898 | 1.0021 | 1.0753 | 1.0486 | 1.1074 | 1.1007 | 1.0005 | 0.9873 | 0.9773 |
| u30 | 0.9957 | 0.9618 | 0.9511 | 0.9612 | 1.0033 | 0.9894 | 1.0037 | 1.0427 | 1.0792 | 1.1286 | 1.1091 | 1.0047 | 0.9873 | 0.9763 |
| u31 | 0.9958 | 0.962 | 0.9509 | 0.9611 | 1.0037 | 0.989 | 1.0047 | 1.0379 | 1.0683 | 1.1208 | 1.1161 | 1.0027 | 0.9873 | 0.9758 |
| u32 | 0.9988 | 0.8594 | 0.8156 | 0.8501 | 1.0099 | 0.9903 | 0.9902 | 1.0718 | 1.1384 | 1.2695 | 1.5234 | 1.824 | 2.2152 | 2.5559 |
| u33 | 0.9985 | 0.8605 | 0.8161 | 0.8507 | 1.0092 | 0.9905 | 0.9922 | 1.0764 | 1.1499 | 1.279 | 1.5153 | 1.8294 | 2.2133 | 2.5567 |
| u34 | 0.9983 | 0.8605 | 0.8161 | 0.8509 | 1.0083 | 0.9905 | 0.993 | 1.1098 | 1.1171 | 1.2566 | 1.5053 | 1.8192 | 2.2107 | 2.5577 |
| u35 | 0.9982 | 0.8619 | 0.8163 | 0.8515 | 1.0075 | 0.991 | 0.9949 | 1.1041 | 1.1053 | 1.2477 | 1.5134 | 1.8139 | 2.2123 | 2.5568 |
| u36 | 0.9976 | 0.8606 | 0.815 | 0.8507 | 1.0066 | 0.9907 | 0.9959 | 1.1455 | 1.1776 | 1.204 | 1.4899 | 1.7992 | 2.2032 | 2.5552 |
| u37 | 0.9974 | 0.8613 | 0.8154 | 0.8513 | 1.0058 | 0.991 | 0.9977 | 1.1501 | 1.1893 | 1.2133 | 1.4817 | 1.8044 | 2.2015 | 2.556 |
| u38 | 0.9973 | 0.8629 | 0.8165 | 0.8521 | 1.005 | 0.9916 | 0.9985 | 1.1145 | 1.223 | 1.2361 | 1.4919 | 1.8145 | 2.2039 | 2.5549 |

-continued

| | | | | | | | | | | | | | | |
|---|---|---|---|---|---|---|---|---|---|---|---|---|---|---|
| u39 | 0.9972 | 0.8643 | 0.8167 | 0.8524 | 1.0041 | 0.992 | 0.9995 | 1.1088 | 1.2107 | 1.2273 | 1.5002 | 1.8092 | 2.2055 | 2.554 |
| u40 | 0.9961 | 0.8555 | 0.8101 | 0.8477 | 1.0028 | 0.9899 | 1.0007 | 1.1477 | 1.2899 | 1.3449 | 1.4919 | 1.8323 | 2.2051 | 2.5426 |
| u41 | 0.9959 | 0.8565 | 0.8109 | 0.848 | 1.0018 | 0.9902 | 1.0021 | 1.152 | 1.302 | 1.3544 | 1.4835 | 1.8378 | 2.2032 | 2.5434 |
| u42 | 0.9956 | 0.8573 | 0.8107 | 0.8483 | 1.0009 | 0.9905 | 1.0026 | 1.1869 | 1.2672 | 1.3311 | 1.473 | 1.8272 | 2.2006 | 2.5444 |
| u43 | 0.9955 | 0.8585 | 0.8111 | 0.8489 | 0.9999 | 0.9912 | 1.0032 | 1.181 | 1.2547 | 1.3217 | 1.4813 | 1.8216 | 2.2024 | 2.5435 |
| u44 | 0.9958 | 0.8616 | 0.8132 | 0.8502 | 0.9993 | 0.9919 | 1.0037 | 1.1382 | 1.1777 | 1.3674 | 1.5058 | 1.8371 | 2.2118 | 2.5449 |
| u45 | 0.9955 | 0.8627 | 0.8139 | 0.8509 | 0.9986 | 0.9925 | 1.0044 | 1.1428 | 1.1895 | 1.3769 | 1.4974 | 1.8426 | 2.2099 | 2.5458 |
| u46 | 0.9955 | 0.8638 | 0.8149 | 0.8515 | 0.9979 | 0.9931 | 1.0047 | 1.1081 | 1.2233 | 1.4 | 1.5078 | 1.8533 | 2.2127 | 2.5446 |
| u47 | 0.9954 | 0.865 | 0.8152 | 0.8519 | 0.997 | 0.9937 | 1.0048 | 1.1025 | 1.211 | 1.3909 | 1.5163 | 1.8476 | 2.2146 | 2.5437 |
| u48 | 1.0009 | 0.8931 | 0.8438 | 0.8763 | 1.0045 | 0.9965 | 0.9947 | 1.0691 | 1.1358 | 1.2388 | 1.353 | 1.8195 | 2.216 | 2.57 |
| u49 | 1.0007 | 0.8933 | 0.844 | 0.8765 | 1.0042 | 0.9965 | 0.9954 | 1.074 | 1.1473 | 1.248 | 1.3454 | 1.8248 | 2.2141 | 2.5709 |
| u50 | 1.0006 | 0.8933 | 0.8436 | 0.8765 | 1.0039 | 0.9966 | 0.9957 | 1.1076 | 1.1147 | 1.2255 | 1.3359 | 1.8148 | 2.2113 | 2.5719 |
| u51 | 1.0006 | 0.894 | 0.8436 | 0.8766 | 1.0037 | 0.9968 | 0.9963 | 1.1023 | 1.1033 | 1.2165 | 1.3437 | 1.8096 | 2.213 | 2.5712 |
| u52 | 1.0001 | 0.8923 | 0.842 | 0.8758 | 1.0029 | 0.9967 | 0.9965 | 1.1435 | 1.1753 | 1.1728 | 1.3205 | 1.7949 | 2.2038 | 2.5697 |
| u53 | 0.9999 | 0.8927 | 0.8422 | 0.876 | 1.0026 | 0.9968 | 0.9971 | 1.1485 | 1.1872 | 1.1818 | 1.313 | 1.8001 | 2.2019 | 2.5706 |
| u54 | 0.9999 | 0.8938 | 0.8428 | 0.8763 | 1.0025 | 0.997 | 0.9973 | 1.1136 | 1.2211 | 1.2042 | 1.3228 | 1.81 | 2.2044 | 2.5697 |
| u55 | 0.9999 | 0.8944 | 0.8428 | 0.8764 | 1.0024 | 0.9971 | 0.9977 | 1.1084 | 1.209 | 1.1952 | 1.3306 | 1.8047 | 2.2061 | 2.5689 |
| u56 | 1.0008 | 0.9041 | 0.85 | 0.8816 | 1.0045 | 0.9982 | 0.9992 | 1.0715 | 1.1336 | 1.0908 | 1.3414 | 1.783 | 2.2071 | 2.5793 |
| u57 | 1.0007 | 0.9044 | 0.8501 | 0.8817 | 1.0043 | 0.9982 | 0.9995 | 1.0766 | 1.1453 | 1.0989 | 1.3339 | 1.7882 | 2.2051 | 2.5802 |
| u58 | 1.0006 | 0.9043 | 0.8497 | 0.8816 | 1.0041 | 0.9983 | 0.9998 | 1.1103 | 1.1127 | 1.0783 | 1.3244 | 1.7789 | 2.2021 | 2.5812 |
| u59 | 1.0006 | 0.9048 | 0.8496 | 0.8816 | 1.0041 | 0.9983 | 1.0004 | 1.1051 | 1.1013 | 1.0701 | 1.3319 | 1.7741 | 2.2033 | 2.5805 |
| u60 | 1.001 | 0.9073 | 0.8513 | 0.8826 | 1.0047 | 0.9984 | 1.0011 | 1.0662 | 1.0346 | 1.1103 | 1.3549 | 1.7883 | 2.2119 | 2.5822 |
| u61 | 1.0009 | 0.9075 | 0.8515 | 0.8827 | 1.0046 | 0.9983 | 1.0015 | 1.0713 | 1.0453 | 1.1186 | 1.3473 | 1.7935 | 2.2098 | 2.5831 |
| u62 | 1.0009 | 0.9083 | 0.852 | 0.8829 | 1.0048 | 0.9983 | 1.0018 | 1.0388 | 1.0758 | 1.1395 | 1.3569 | 1.8032 | 2.2122 | 2.5822 |
| u63 | 1.0009 | 0.9088 | 0.8518 | 0.8829 | 1.0049 | 0.9983 | 1.0025 | 1.0339 | 1.0648 | 1.1309 | 1.3645 | 1.7984 | 2.2138 | 2.5815 |
| u64 | 1.0014 | 0.8832 | 1.3023 | 1.8457 | 2.8713 | 3.3468 | 3.6733 | 4.694 | 4.3631 | 3.9582 | 3.6768 | 3.9502 | 4.3585 | 4.6922 |
| u65 | 1.0014 | 0.8832 | 1.3029 | 1.846 | 2.8725 | 3.3462 | 3.6731 | 4.564 | 4.2294 | 3.909 | 3.6877 | 3.9552 | 4.3481 | 4.6869 |
| u66 | 1.0013 | 0.8828 | 1.3019 | 1.8455 | 2.8727 | 3.3444 | 3.6729 | 4.0789 | 4.6337 | 4.0402 | 3.7072 | 3.9512 | 4.3328 | 4.6741 |
| u67 | 1.0014 | 0.8832 | 1.3019 | 1.8457 | 2.8743 | 3.3445 | 3.6729 | 4.1455 | 4.8023 | 4.1009 | 3.6949 | 3.9456 | 4.3415 | 4.6799 |
| u68 | 1.001 | 0.8812 | 1.2984 | 1.8427 | 2.8709 | 3.3391 | 3.6726 | 3.8727 | 4.1949 | 4.4441 | 3.7838 | 3.9628 | 4.327 | 4.6633 |
| u69 | 1.0009 | 0.8813 | 1.2989 | 1.8431 | 2.8724 | 3.3383 | 3.6724 | 3.8289 | 4.1122 | 4.3664 | 3.7988 | 3.9683 | 4.3171 | 4.6583 |
| u70 | 1.001 | 0.882 | 1.3002 | 1.8441 | 2.8745 | 3.3396 | 3.6725 | 4.0201 | 3.9095 | 4.1929 | 3.7754 | 3.9729 | 4.3316 | 4.6713 |
| u71 | 1.0011 | 0.8823 | 1.3002 | 1.8444 | 2.8764 | 3.3397 | 3.6725 | 4.081 | 3.9742 | 4.2618 | 3.7613 | 3.9676 | 4.341 | 4.677 |
| u72 | 1.0002 | 0.873 | 1.2862 | 1.8278 | 2.8526 | 3.3207 | 3.6691 | 3.8523 | 3.7713 | 3.9301 | 3.9063 | 4.0959 | 4.5016 | 4.7241 |
| u73 | 1.0002 | 0.873 | 1.2867 | 1.8282 | 2.8534 | 3.32 | 3.6688 | 3.8097 | 3.7277 | 3.8931 | 3.9258 | 4.1 | 4.4915 | 4.718 |
| u74 | 1.0002 | 0.8724 | 1.2859 | 1.8277 | 2.8538 | 3.3184 | 3.6686 | 3.6813 | 3.8638 | 3.9879 | 3.9571 | 4.098 | 4.4759 | 4.7037 |
| u75 | 1.0003 | 0.8726 | 1.2859 | 1.828 | 2.8551 | 3.3186 | 3.6687 | 3.7161 | 3.9174 | 4.0289 | 3.9361 | 4.0933 | 4.4861 | 4.7098 |
| u76 | 1.0008 | 0.8748 | 1.2899 | 1.8316 | 2.861 | 3.3236 | 3.6696 | 3.9052 | 4.1912 | 3.832 | 3.8327 | 4.0706 | 4.5005 | 4.7274 |
| u77 | 1.0008 | 0.8747 | 1.2903 | 1.8318 | 2.8616 | 3.323 | 3.6694 | 3.8574 | 4.1077 | 3.7986 | 3.8494 | 4.0752 | 4.4907 | 4.7214 |
| u78 | 1.0009 | 0.8754 | 1.2917 | 1.8329 | 2.8642 | 3.3242 | 3.6695 | 4.0837 | 3.9032 | 3.7217 | 3.8238 | 4.0784 | 4.506 | 4.7358 |
| u79 | 1.0011 | 0.8755 | 1.2918 | 1.8332 | 2.8656 | 3.3244 | 3.6696 | 4.1502 | 3.9697 | 3.751 | 3.8086 | 4.074 | 4.5159 | 4.742 |
| u80 | 0.9959 | 0.8487 | 1.2233 | 1.7415 | 2.8108 | 3.2753 | 3.6721 | 3.888 | 3.7599 | 3.5872 | 3.7421 | 4.1984 | 4.6901 | 5.1385 |
| u81 | 0.9959 | 0.8481 | 1.224 | 1.742 | 2.8115 | 3.2749 | 3.6714 | 3.8405 | 3.7159 | 3.561 | 3.7525 | 4.2013 | 4.6807 | 5.1294 |
| u82 | 0.996 | 0.8473 | 1.2234 | 1.7417 | 2.8111 | 3.2735 | 3.6708 | 3.7045 | 3.8513 | 3.6126 | 3.77 | 4.2031 | 4.6667 | 5.1105 |
| u83 | 0.9962 | 0.8471 | 1.2235 | 1.7421 | 2.8125 | 3.2739 | 3.6708 | 3.7398 | 3.9043 | 3.6307 | 3.759 | 4.2002 | 4.6762 | 5.1196 |
| u84 | 0.996 | 0.8446 | 1.2206 | 1.7395 | 2.8088 | 3.269 | 3.6683 | 3.5864 | 3.7397 | 3.7667 | 3.8275 | 4.2295 | 4.6693 | 5.1037 |
| u85 | 0.9961 | 0.8442 | 1.2213 | 1.7398 | 2.8091 | 3.2686 | 3.6676 | 3.565 | 3.7018 | 3.7415 | 3.839 | 4.2323 | 4.6591 | 5.0946 |
| u86 | 0.9963 | 0.8444 | 1.2226 | 1.7409 | 2.8111 | 3.2699 | 3.6673 | 3.6717 | 3.609 | 3.6803 | 3.8211 | 4.2315 | 4.6737 | 5.1141 |
| u87 | 0.9965 | 0.8442 | 1.2227 | 1.7411 | 2.8119 | 3.2704 | 3.6672 | 3.7095 | 3.6369 | 3.7026 | 3.81 | 4.2287 | 4.6835 | 5.1234 |
| u88 | 0.9973 | 0.8537 | 1.2359 | 1.7568 | 2.8376 | 3.2884 | 3.6755 | 3.8446 | 3.7641 | 3.8355 | 3.7043 | 4.1008 | 4.5056 | 5.0392 |
| u89 | 0.9975 | 0.8532 | 1.2366 | 1.7571 | 2.8383 | 3.288 | 3.6748 | 3.8013 | 3.7193 | 3.8029 | 3.7141 | 4.1051 | 4.4955 | 5.031 |
| u90 | 0.9975 | 0.8523 | 1.2361 | 1.7567 | 2.8379 | 3.2867 | 3.6743 | 3.666 | 3.857 | 3.887 | 3.73 | 4.1029 | 4.4797 | 5.0134 |
| u91 | 0.9978 | 0.8521 | 1.2361 | 1.7571 | 2.8389 | 3.2871 | 3.6743 | 3.7021 | 3.9102 | 3.9236 | 3.7203 | 4.0984 | 4.4898 | 5.0217 |
| u92 | 0.9983 | 0.8541 | 1.2398 | 1.7603 | 2.8444 | 3.292 | 3.6759 | 3.9024 | 4.1714 | 3.7493 | 3.6567 | 4.0752 | 4.5042 | 5.0381 |
| u93 | 0.9984 | 0.8536 | 1.2403 | 1.7607 | 2.8449 | 3.2916 | 3.6753 | 3.8552 | 4.0912 | 3.7198 | 3.6671 | 4.079 | 4.4944 | 5.0301 |
| u94 | 0.9986 | 0.854 | 1.2418 | 1.7618 | 2.8469 | 3.2929 | 3.6753 | 4.0694 | 3.8928 | 3.6527 | 3.6554 | 4.0831 | 4.5099 | 5.0476 |
| u95 | 0.9988 | 0.8538 | 1.2418 | 1.762 | 2.8477 | 3.2933 | 3.6754 | 4.1333 | 3.9564 | 3.6776 | 3.6519 | 4.0791 | 4.5199 | 5.0558 |
| u96 | 0.9968 | 0.937 | 1.5256 | 2.1597 | 2.8183 | 3.2753 | 3.6655 | 4.5365 | 4.3213 | 4.0144 | 4.3006 | 6.0029 | 6.7863 | 7.1885 |
| u97 | 0.9966 | 0.9372 | 1.5256 | 2.1597 | 2.8189 | 3.2749 | 3.6652 | 4.4231 | 4.2037 | 3.9605 | 4.3473 | 5.9087 | 6.8606 | 7.1902 |
| u98 | 0.9965 | 0.937 | 1.5239 | 2.1586 | 2.8184 | 3.2736 | 3.665 | 4.0428 | 4.5739 | 4.1035 | 4.4185 | 6.084 | 7.0184 | 7.2296 |
| u99 | 0.9965 | 0.9377 | 1.5232 | 2.1584 | 2.8191 | 3.2739 | 3.6658 | 4.1104 | 4.7316 | 4.1698 | 4.365 | 6.2028 | 6.9192 | 7.2267 |
| u100 | 0.996 | 0.9356 | 1.5181 | 2.1539 | 2.8151 | 3.2693 | 3.6634 | 3.8459 | 4.1686 | 4.53 | 4.564 | 6.4135 | 7.2596 | 7.4016 |
| u101 | 0.9959 | 0.9361 | 1.5181 | 2.1539 | 2.8157 | 3.2689 | 3.6633 | 3.7996 | 4.0887 | 4.4495 | 4.6324 | 6.3018 | 7.3731 | 7.4105 |
| u102 | 0.9959 | 0.9372 | 1.5193 | 2.1548 | 2.8173 | 3.27 | 3.6639 | 3.9715 | 3.8923 | 4.2671 | 4.5453 | 6.1274 | 7.1956 | 7.3518 |
| u103 | 0.9959 | 0.9379 | 1.5186 | 2.1546 | 2.8182 | 3.2702 | 3.6647 | 4.0285 | 3.955 | 4.3407 | 4.4858 | 6.2267 | 7.0986 | 7.3454 |
| u104 | 0.995 | 0.9278 | 1.5004 | 2.1329 | 2.796 | 3.2537 | 3.6548 | 3.8251 | 3.7601 | 3.9671 | 4.6055 | 5.8651 | 6.7617 | 7.4739 |
| u105 | 0.9949 | 0.9281 | 1.5006 | 2.1329 | 2.7964 | 3.253 | 3.6552 | 3.7825 | 3.7159 | 3.9284 | 4.6553 | 5.8142 | 6.8076 | 7.4822 |
| u106 | 0.9948 | 0.9278 | 1.4989 | 2.1319 | 2.7961 | 3.2516 | 3.6556 | 3.8524 | 4.027 | 4.7241 | 5.9113 | 6.8926 | 7.5379 |
| u107 | 0.9948 | 0.9285 | 1.4984 | 2.1318 | 2.7972 | 3.2517 | 3.6569 | 3.6938 | 3.9054 | 4.0698 | 4.67 | 5.9672 | 6.8407 | 7.5277 |
| u108 | 0.9952 | 0.9313 | 1.5027 | 2.1359 | 2.8023 | 3.256 | 3.6597 | 3.8809 | 4.1603 | 3.8661 | 4.5211 | 5.8188 | 6.6438 | 7.3735 |
| u109 | 0.9951 | 0.9317 | 1.5029 | 2.136 | 2.8026 | 3.2554 | 3.6599 | 3.8358 | 4.0813 | 3.8311 | 4.5721 | 5.7654 | 6.6862 | 7.3791 |
| u110 | 0.9951 | 0.9327 | 1.5041 | 2.1369 | 2.8043 | 3.2563 | 3.6609 | 4.0319 | 3.8851 | 3.7506 | 4.5073 | 5.6716 | 6.6138 | 7.3362 |
| u111 | 0.9951 | 0.9332 | 1.5034 | 2.1368 | 2.8052 | 3.2566 | 3.6618 | 4.0903 | 3.9475 | 3.7811 | 4.4615 | 5.7182 | 6.576 | 7.3314 |
| u112 | 0.9997 | 0.9705 | 1.5989 | 2.2702 | 2.8515 | 3.3001 | 3.6717 | 4.5863 | 4.3526 | 4.1768 | 5.5558 | 6.0707 | 6.8156 | 8.305 |
| u113 | 0.9996 | 0.9707 | 1.5987 | 2.2698 | 2.8509 | 3.3004 | 3.6703 | 4.4695 | 4.227 | 4.1089 | 5.734 | 5.967 | 6.8958 | 8.3953 |
| u114 | 0.9995 | 0.9705 | 1.5967 | 2.2686 | 2.8496 | 3.2996 | 3.6692 | 4.0468 | 4.6126 | 4.2848 | 5.8955 | 6.1586 | 7.0601 | 8.6764 |
| u115 | 0.9995 | 0.9711 | 1.5958 | 2.2682 | 2.8494 | 3.3007 | 3.6689 | 4.1028 | 4.7742 | 4.3662 | 5.7319 | 6.2881 | 6.9548 | 8.5465 |
| u116 | 0.9991 | 0.9688 | 1.5906 | 2.2632 | 2.8453 | 3.2964 | 3.6657 | 3.8507 | 4.1858 | 4.7273 | 5.7188 | 6.4807 | 7.2954 | 8.7651 |
| u117 | 0.999 | 0.9691 | 1.5905 | 2.2631 | 2.8447 | 3.2964 | 3.6645 | 3.8095 | 4.1032 | 4.6466 | 5.8238 | 6.3671 | 7.4101 | 8.8692 |

-continued

| | | | | | | | | | | | | | | |
|---|---|---|---|---|---|---|---|---|---|---|---|---|---|---|
| u118 | 0.999 | 0.9703 | 1.5913 | 2.2638 | 2.8451 | 3.2983 | 3.664 | 3.995 | 3.9005 | 4.4571 | 5.7151 | 6.1874 | 7.2309 | 8.6575 |
| u119 | 0.999 | 0.9709 | 1.5905 | 2.2635 | 2.8449 | 3.2992 | 3.6638 | 4.0529 | 3.9647 | 4.5402 | 5.5998 | 6.2918 | 7.1312 | 8.5697 |
| u120 | 0.9998 | 0.9828 | 1.6085 | 2.2865 | 2.863 | 3.3179 | 3.6722 | 4.4061 | 4.3635 | 6.2755 | 6.5122 | 7.7183 | 8.5647 | 9.5905 |
| u121 | 0.9996 | 0.983 | 1.6083 | 2.2862 | 2.8621 | 3.3182 | 3.6707 | 4.3124 | 4.2323 | 6.3107 | 6.6271 | 7.5349 | 8.7598 | 9.9065 |
| u122 | 0.9996 | 0.9829 | 1.6063 | 2.2848 | 2.8606 | 3.3174 | 3.6694 | 4.0197 | 4.622 | 6.1476 | 6.6344 | 7.6321 | 8.8941 | 10.0736 |
| u123 | 0.9996 | 0.9834 | 1.6055 | 2.2845 | 2.86 | 3.3186 | 3.6688 | 4.0704 | 4.7846 | 6.1519 | 6.5676 | 7.7506 | 8.7552 | 9.8558 |
| u124 | 1 | 0.9865 | 1.6099 | 2.2886 | 2.862 | 3.325 | 3.6688 | 4.669 | 6.8189 | 6.9881 | 7.7657 | 8.6079 | 10.1845 | 11.0225 |
| u125 | 0.9999 | 0.9868 | 1.6096 | 2.2885 | 2.8611 | 3.3252 | 3.6676 | 4.4363 | 7.0127 | 7.248 | 7.4229 | 8.7745 | 9.9405 | 11.101 |
| u126 | 0.9999 | 0.9879 | 1.6104 | 2.2891 | 2.8605 | 3.3277 | 3.6665 | 8.3665 | 8.6663 | 8.8291 | 7.9912 | 11.0628 | 10.6068 | 12.0247 |
| u127 | 1 | 0.9887 | 1.6096 | 2.2886 | 2.8597 | 3.3288 | 3.6654 | 7.8601 | 7.9314 | 7.8682 | 9.6554 | 9.4334 | 12.514 | 13.9798 |

| SNR | 14 | 15 | 16 | 17 | 18 | 19 | 20 | 21 | 22 | 23 | 24 | 25 | 26 | 27 |
|---|---|---|---|---|---|---|---|---|---|---|---|---|---|---|
| u1 | 1 | 1 | 1 | 1 | 1 | 1 | 1 | 1.0001 | 1 | 1 | 1.0001 | 1.0002 | 1.0009 | 1.0011 |
| u2 | 1.0005 | 1 | 0.9999 | 0.9999 | 1 | 1 | 1 | 1.0001 | 1 | 1 | 1.0003 | 1.0003 | 1.001 | 1.0016 |
| u3 | 1.0006 | 1.0001 | 1 | 0.9999 | 1.0001 | 1 | 1 | 1.0002 | 0.9999 | 1 | 1.0001 | 1.0002 | 1.0002 | 1.0004 |
| u4 | 1.0019 | 1.0003 | 0.9998 | 1.0003 | 1.0018 | 1.0002 | 1 | 1.0002 | 1.0001 | 1 | 1.0003 | 1.0001 | 1.001 | 1.0009 |
| u5 | 1.0019 | 1.0003 | 0.9998 | 1.0003 | 1.0018 | 1.0002 | 1 | 1.0003 | 0.9999 | 1.0001 | 1.0002 | 1.0003 | 0.9999 | 1.0018 |
| u6 | 1.0016 | 1.0004 | 1 | 1.0007 | 1.0019 | 1.0003 | 1 | 1.0003 | 0.9998 | 1 | 0.9999 | 1.0002 | 1 | 1.0016 |
| u7 | 1.0017 | 1.0005 | 1 | 1.0008 | 1.002 | 1.0003 | 1 | 1.0003 | 0.9997 | 1.0002 | 0.9998 | 1.0004 | 1.001 | 1.0011 |
| u8 | 1.0021 | 1.0028 | 0.9984 | 0.9929 | 0.9943 | 0.9993 | 1.0001 | 1.0001 | 0.9999 | 1 | 1.0116 | 1.0799 | 1.7515 | 2.723 |
| u9 | 1.0021 | 1.0028 | 0.9984 | 0.993 | 0.9943 | 0.9994 | 1.0002 | 1.0001 | 0.9998 | 1 | 1.0118 | 1.08 | 1.7517 | 2.7234 |
| u10 | 1.0025 | 1.0028 | 0.9983 | 0.9928 | 0.9943 | 0.9993 | 1.0002 | 1.0001 | 0.9998 | 1.0001 | 1.0122 | 1.0798 | 1.7514 | 2.7238 |
| u11 | 1.0026 | 1.0029 | 0.9983 | 0.9929 | 0.9944 | 0.9993 | 1.0002 | 1.0002 | 0.9997 | 1.0001 | 1.012 | 1.08 | 1.7512 | 2.7237 |
| u12 | 1.0014 | 1.0027 | 0.9985 | 0.9927 | 0.9928 | 0.9992 | 1.0003 | 1.0002 | 0.9996 | 1.0001 | 1.012 | 1.0799 | 1.7512 | 2.723 |
| u13 | 1.0014 | 1.0027 | 0.9984 | 0.9927 | 0.9928 | 0.9992 | 1.0003 | 1.0003 | 0.9997 | 1.0002 | 1.012 | 1.0798 | 1.7516 | 2.7232 |
| u14 | 1.001 | 1.0028 | 0.9984 | 0.9929 | 0.993 | 0.9993 | 1.0003 | 1.0003 | 0.9997 | 1.0001 | 1.0116 | 1.08 | 1.7515 | 2.7226 |
| u15 | 1.001 | 1.0029 | 0.9983 | 0.993 | 0.993 | 0.9993 | 1.0003 | 1.0003 | 0.9997 | 1.0001 | 1.0118 | 1.0798 | 1.7513 | 2.7223 |
| u16 | 0.968 | 0.9823 | 1.0031 | 1.0455 | 1.1639 | 1.5101 | 2.3862 | 2.821 | 2.9622 | 3.002 | 3.0129 | 3.0541 | 3.7157 | 4.7331 |
| u17 | 0.968 | 0.9823 | 1.003 | 1.0455 | 1.1639 | 1.5101 | 2.3862 | 2.821 | 2.9623 | 3.002 | 3.0131 | 3.0549 | 3.7173 | 4.7329 |
| u18 | 0.9684 | 0.9824 | 1.0029 | 1.0453 | 1.1639 | 1.5101 | 2.3862 | 2.8211 | 2.9623 | 3.002 | 3.0137 | 3.0547 | 3.7167 | 4.7326 |
| u19 | 0.9684 | 0.9825 | 1.0028 | 1.0454 | 1.164 | 1.5101 | 2.3862 | 2.8211 | 2.9623 | 3.0019 | 3.0133 | 3.0548 | 3.716 | 4.7324 |
| u20 | 0.9695 | 0.9827 | 1.0026 | 1.0457 | 1.1657 | 1.5104 | 2.3861 | 2.821 | 2.9623 | 3.002 | 3.0137 | 3.0549 | 3.7166 | 4.733 |
| u21 | 0.9695 | 0.9827 | 1.0026 | 1.0458 | 1.1658 | 1.5104 | 2.3862 | 2.8211 | 2.9622 | 3.002 | 3.0136 | 3.0547 | 3.7157 | 4.7326 |
| u22 | 0.9691 | 0.9828 | 1.0027 | 1.046 | 1.1659 | 1.5105 | 2.3862 | 2.8211 | 2.9622 | 3.002 | 3.013 | 3.0547 | 3.7165 | 4.7331 |
| u23 | 0.9692 | 0.9829 | 1.0027 | 1.0461 | 1.166 | 1.5105 | 2.3862 | 2.8212 | 2.962 | 3.002 | 3.0129 | 3.0546 | 3.7164 | 4.7327 |
| u24 | 0.9688 | 0.9809 | 1.0033 | 1.0523 | 1.173 | 1.5119 | 2.3862 | 2.8192 | 2.9618 | 3.0084 | 3.053 | 3.2258 | 4.6746 | 6.5252 |
| u25 | 0.9687 | 0.9809 | 1.0034 | 1.0524 | 1.1731 | 1.512 | 2.3862 | 2.8192 | 2.9616 | 3.0084 | 3.0526 | 3.2258 | 4.6744 | 6.5246 |
| u26 | 0.9691 | 0.9808 | 1.0033 | 1.0522 | 1.173 | 1.512 | 2.3862 | 2.8192 | 2.9617 | 3.0085 | 3.0533 | 3.2255 | 4.6745 | 6.525 |
| u27 | 0.9691 | 0.9809 | 1.0034 | 1.0523 | 1.1731 | 1.512 | 2.3862 | 2.8193 | 2.9616 | 3.0085 | 3.0527 | 3.2254 | 4.6746 | 6.5254 |
| u28 | 0.968 | 0.9807 | 1.0036 | 1.0521 | 1.1715 | 1.5118 | 2.3863 | 2.8195 | 2.9616 | 3.0086 | 3.0533 | 3.2253 | 4.6745 | 6.5264 |
| u29 | 0.968 | 0.9807 | 1.0037 | 1.0521 | 1.1715 | 1.5118 | 2.3863 | 2.8195 | 2.9616 | 3.0086 | 3.0532 | 3.2253 | 4.6743 | 6.526 |
| u30 | 0.9676 | 0.9807 | 1.0038 | 1.0525 | 1.1717 | 1.5119 | 2.3863 | 2.8196 | 2.9617 | 3.0086 | 3.0526 | 3.2255 | 4.6741 | 6.5256 |
| u31 | 0.9676 | 0.9808 | 1.0038 | 1.0525 | 1.1718 | 1.5119 | 2.3863 | 2.8196 | 2.9616 | 3.0085 | 3.0525 | 3.2252 | 4.6741 | 6.5259 |
| u32 | 2.7706 | 2.898 | 2.9665 | 3.0138 | 3.1134 | 3.4669 | 4.4162 | 4.8829 | 5.0326 | 5.0632 | 5.0535 | 5.1149 | 6.5671 | 8.569 |
| u33 | 2.7702 | 2.8977 | 2.9665 | 3.0139 | 3.1135 | 3.4669 | 4.4162 | 4.883 | 5.0325 | 5.0632 | 5.0537 | 5.1146 | 6.5675 | 8.5693 |
| u34 | 2.7711 | 2.8975 | 2.9659 | 3.0142 | 3.1139 | 3.467 | 4.4161 | 4.883 | 5.0325 | 5.0632 | 5.0541 | 5.1155 | 6.5678 | 8.569 |
| u35 | 2.7713 | 2.8979 | 2.966 | 3.0143 | 3.1139 | 3.467 | 4.4161 | 4.8831 | 5.0325 | 5.0632 | 5.0538 | 5.1147 | 6.5667 | 8.5684 |
| u36 | 2.7738 | 2.8984 | 2.9652 | 3.0111 | 3.1112 | 3.4668 | 4.4165 | 4.8831 | 5.0326 | 5.0635 | 5.0545 | 5.1147 | 6.567 | 8.5685 |
| u37 | 2.7735 | 2.898 | 2.9652 | 3.0112 | 3.1113 | 3.4668 | 4.4165 | 4.8832 | 5.0326 | 5.0636 | 5.0542 | 5.1151 | 6.5675 | 8.5692 |
| u38 | 2.7724 | 2.8983 | 2.9658 | 3.0111 | 3.1109 | 3.4667 | 4.4166 | 4.8832 | 5.0326 | 5.0635 | 5.054 | 5.1154 | 6.5674 | 8.5697 |
| u39 | 2.7726 | 2.8986 | 2.9658 | 3.0111 | 3.1109 | 3.4668 | 4.4166 | 4.8832 | 5.0325 | 5.0635 | 5.0537 | 5.1145 | 6.5668 | 8.5687 |
| u40 | 2.7694 | 2.9054 | 2.9863 | 3.0394 | 3.128 | 3.4689 | 4.4133 | 4.8794 | 5.0406 | 5.1056 | 5.1933 | 5.5323 | 7.8541 | 10.4941 |
| u41 | 2.769 | 2.905 | 2.9862 | 3.0395 | 3.1281 | 3.4689 | 4.4133 | 4.8794 | 5.0405 | 5.1057 | 5.1933 | 5.5324 | 7.8541 | 10.4939 |
| u42 | 2.77 | 2.9048 | 2.9856 | 3.0399 | 3.1285 | 3.4689 | 4.4132 | 4.8794 | 5.0406 | 5.1057 | 5.1935 | 5.5325 | 7.8538 | 10.4937 |
| u43 | 2.7701 | 2.9051 | 2.9857 | 3.0399 | 3.1285 | 3.4689 | 4.4132 | 4.8794 | 5.0406 | 5.1057 | 5.1931 | 5.5324 | 7.8536 | 10.4941 |
| u44 | 2.7674 | 2.9046 | 2.9864 | 3.0434 | 3.1315 | 3.4692 | 4.413 | 4.8794 | 5.0405 | 5.1055 | 5.1935 | 5.5323 | 7.8538 | 10.494 |
| u45 | 2.7671 | 2.9042 | 2.9864 | 3.0435 | 3.1315 | 3.4692 | 4.413 | 4.8795 | 5.0405 | 5.1055 | 5.1933 | 5.5323 | 7.8541 | 10.4939 |
| u46 | 2.766 | 2.9044 | 2.9869 | 3.0432 | 3.1312 | 3.4692 | 4.4131 | 4.8795 | 5.0406 | 5.1055 | 5.1934 | 5.5324 | 7.8542 | 10.4939 |
| u47 | 2.7662 | 2.9046 | 2.9868 | 3.0432 | 3.1311 | 3.4692 | 4.4131 | 4.8795 | 5.0404 | 5.1055 | 5.193 | 5.5328 | 7.8543 | 10.4938 |
| u48 | 2.8358 | 3.0202 | 3.1577 | 3.3064 | 3.615 | 4.4098 | 6.1205 | 6.9091 | 7.1543 | 7.1819 | 7.135 | 7.2942 | 9.7019 | 12.6145 |
| u49 | 2.8354 | 3.0199 | 3.1576 | 3.3064 | 3.6151 | 4.4098 | 6.1205 | 6.9092 | 7.1543 | 7.1819 | 7.1348 | 7.2929 | 9.7021 | 12.614 |
| u50 | 2.8363 | 3.0197 | 3.1569 | 3.3067 | 3.6159 | 4.4101 | 6.1205 | 6.9092 | 7.1543 | 7.182 | 7.1347 | 7.2937 | 9.7022 | 12.6142 |
| u51 | 2.8365 | 3.02 | 3.1568 | 3.3067 | 3.6159 | 4.4103 | 6.1206 | 6.9092 | 7.1542 | 7.1819 | 7.1347 | 7.2933 | 9.7016 | 12.614 |
| u52 | 2.8386 | 3.0206 | 3.156 | 3.3025 | 3.6112 | 4.4086 | 6.1204 | 6.9102 | 7.1539 | 7.1808 | 7.1345 | 7.2931 | 9.7021 | 12.6143 |
| u53 | 2.8382 | 3.0204 | 3.156 | 3.3026 | 3.6114 | 4.4086 | 6.1203 | 6.9103 | 7.1537 | 7.1809 | 7.1345 | 7.2941 | 9.7019 | 12.6137 |
| u54 | 2.8373 | 3.0206 | 3.1565 | 3.3023 | 3.6108 | 4.4084 | 6.1204 | 6.9104 | 7.1537 | 7.1808 | 7.1347 | 7.2941 | 9.7022 | 12.614 |
| u55 | 2.8375 | 3.0209 | 3.1565 | 3.3024 | 3.6108 | 4.4086 | 6.1204 | 6.9104 | 7.1537 | 7.181 | 7.1347 | 7.2934 | 9.7021 | 12.614 |
| u56 | 2.8401 | 3.0149 | 3.1351 | 3.2671 | 3.5805 | 4.3956 | 6.1175 | 6.9308 | 7.2263 | 7.3626 | 7.5499 | 8.1641 | 11.3148 | 14.7279 |
| u57 | 2.8397 | 3.0147 | 3.1351 | 3.2672 | 3.5806 | 4.3956 | 6.1175 | 6.9309 | 7.2262 | 7.3627 | 7.5501 | 8.1641 | 11.3145 | 14.7287 |
| u58 | 2.8406 | 3.0146 | 3.1345 | 3.2675 | 3.5814 | 4.3959 | 6.1175 | 6.9309 | 7.2262 | 7.3627 | 7.5503 | 8.1644 | 11.3149 | 14.7286 |
| u59 | 2.8409 | 3.0149 | 3.1345 | 3.2674 | 3.5814 | 4.396 | 6.1175 | 6.9309 | 7.2261 | 7.3627 | 7.5503 | 8.1643 | 11.3151 | 14.728 |
| u60 | 2.8387 | 3.0144 | 3.1352 | 3.2716 | 3.5861 | 4.3977 | 6.1177 | 6.93 | 7.2265 | 7.364 | 7.5501 | 8.1639 | 11.3141 | 14.7282 |
| u61 | 2.8384 | 3.0141 | 3.1352 | 3.2717 | 3.5863 | 4.3977 | 6.1177 | 6.9301 | 7.2266 | 7.3639 | 7.5506 | 8.1641 | 11.3144 | 14.7288 |
| u62 | 2.8374 | 3.0143 | 3.1357 | 3.2714 | 3.5856 | 4.3976 | 6.1178 | 6.9302 | 7.2265 | 7.364 | 7.5503 | 8.1641 | 11.3137 | 14.7287 |
| u63 | 2.8376 | 3.0147 | 3.1357 | 3.2713 | 3.5855 | 4.3977 | 6.1178 | 6.9303 | 7.2266 | 7.3639 | 7.5508 | 8.1637 | 11.3139 | 14.728 |
| u64 | 4.9091 | 5.0795 | 5.2061 | 5.3107 | 5.5557 | 6.3758 | 8.2887 | 9.1665 | 9.4177 | 9.4044 | 9.3924 | 9.8362 | 13.2148 | 17.0039 |
| u65 | 4.9084 | 5.0805 | 5.2066 | 5.3106 | 5.5557 | 6.3757 | 8.2885 | 9.1665 | 9.4177 | 9.4042 | 9.3926 | 9.8362 | 13.2148 | 17.0037 |
| u66 | 4.9043 | 5.0813 | 5.2087 | 5.3105 | 5.5549 | 6.376 | 8.2899 | 9.1669 | 9.4177 | 9.4042 | 9.3918 | 9.8364 | 13.215 | 17.0034 |

-continued

| | | | | | | | | | | | | | |
|---|---|---|---|---|---|---|---|---|---|---|---|---|---|
| u67 | 4.904 | 5.0793 | 5.2091 | 5.3108 | 5.555 | 6.3761 | 8.2901 | 9.167 | 9.4177 | 9.4041 | 9.392 | 9.836 | 13.2148 | 17.004 |
| u68 | 4.8913 | 5.0741 | 5.2124 | 5.3207 | 5.5615 | 6.3744 | 8.284 | 9.1622 | 9.4196 | 9.4075 | 9.3921 | 9.8354 | 13.2144 | 17.0127 |
| u69 | 4.8907 | 5.0752 | 5.2129 | 5.3207 | 5.5615 | 6.3743 | 8.2838 | 9.1622 | 9.4195 | 9.4074 | 9.392 | 9.8357 | 13.2149 | 17.0123 |
| u70 | 4.8938 | 5.0735 | 5.2116 | 5.3212 | 5.5624 | 6.3741 | 8.2825 | 9.1618 | 9.4194 | 9.4074 | 9.3926 | 9.8356 | 13.2146 | 17.012 |
| u71 | 4.8936 | 5.0717 | 5.2121 | 5.3216 | 5.5625 | 6.3742 | 8.2827 | 9.162 | 9.4194 | 9.4074 | 9.3926 | 9.8353 | 13.2155 | 17.0124 |
| u72 | 4.8847 | 5.0305 | 5.1415 | 5.2473 | 5.5236 | 6.3852 | 8.3465 | 9.328 | 9.7348 | 9.9809 | 10.353 | 11.2147 | 15.1175 | 19.3598 |
| u73 | 4.8843 | 5.0317 | 5.1417 | 5.2471 | 5.5237 | 6.3851 | 8.3464 | 9.328 | 9.7346 | 9.9808 | 10.3529 | 11.2149 | 15.1172 | 19.3598 |
| u74 | 4.8807 | 5.0325 | 5.1436 | 5.2469 | 5.523 | 6.3853 | 8.3477 | 9.3284 | 9.7345 | 9.9807 | 10.3531 | 11.215 | 15.1173 | 19.3597 |
| u75 | 4.8808 | 5.0309 | 5.1438 | 5.2471 | 5.523 | 6.3854 | 8.3478 | 9.3285 | 9.7346 | 9.9808 | 10.3528 | 11.2148 | 15.1177 | 19.36 |
| u76 | 4.8925 | 5.0351 | 5.1412 | 5.239 | 5.5177 | 6.387 | 8.3536 | 9.3337 | 9.7324 | 9.975 | 10.3496 | 11.2176 | 15.1321 | 19.4193 |
| u77 | 4.8922 | 5.0364 | 5.1413 | 5.2388 | 5.5177 | 6.3869 | 8.3535 | 9.3337 | 9.7323 | 9.9751 | 10.35 | 11.2179 | 15.1322 | 19.4197 |
| u78 | 4.8959 | 5.0352 | 5.14 | 5.2391 | 5.5184 | 6.3867 | 8.3522 | 9.3333 | 9.7322 | 9.975 | 10.3494 | 11.2177 | 15.1326 | 19.4195 |
| u79 | 4.8962 | 5.0337 | 5.1402 | 5.2392 | 5.5185 | 6.3868 | 8.3524 | 9.3335 | 9.7324 | 9.9749 | 10.3503 | 11.2178 | 15.1321 | 19.4193 |
| u80 | 5.4571 | 5.6726 | 5.8235 | 6.0254 | 6.627 | 7.9784 | 10.4636 | 11.5616 | 11.9021 | 11.9749 | 12.1515 | 12.9138 | 17.194 | 21.8535 |
| u81 | 5.4585 | 5.6751 | 5.8239 | 6.025 | 6.6269 | 7.9794 | 10.4645 | 11.5618 | 11.9026 | 11.9749 | 12.151 | 12.9138 | 17.1935 | 21.8537 |
| u82 | 5.4491 | 5.6758 | 5.8279 | 6.0244 | 6.6222 | 7.9738 | 10.4584 | 11.5605 | 11.9023 | 11.9757 | 12.1512 | 12.9141 | 17.1942 | 21.8537 |
| u83 | 5.448 | 5.6728 | 5.8279 | 6.025 | 6.6222 | 7.9729 | 10.4575 | 11.5604 | 11.902 | 11.9751 | 12.1516 | 12.9144 | 17.1936 | 21.8539 |
| u84 | 5.4279 | 5.6602 | 5.8333 | 6.0515 | 6.6558 | 8.0083 | 10.4906 | 11.5716 | 11.8947 | 11.9657 | 12.1534 | 12.9438 | 17.2807 | 22.0917 |
| u85 | 5.4291 | 5.6627 | 5.8335 | 6.0511 | 6.6557 | 8.0092 | 10.4915 | 11.5719 | 11.8948 | 11.9648 | 12.1542 | 12.9432 | 17.2808 | 22.0917 |
| u86 | 5.4386 | 5.6615 | 5.8299 | 6.0518 | 6.6606 | 8.0151 | 10.4979 | 11.5732 | 11.8947 | 11.9662 | 12.1536 | 12.9435 | 17.2804 | 22.0917 |
| u87 | 5.4376 | 5.6585 | 5.83 | 6.0524 | 6.6606 | 8.0142 | 10.497 | 11.573 | 11.8943 | 11.9663 | 12.1536 | 12.9439 | 17.281 | 22.0918 |
| u88 | 5.4307 | 5.7276 | 5.9752 | 6.2577 | 6.8842 | 8.2811 | 10.9142 | 12.261 | 12.8473 | 13.2699 | 13.7392 | 14.6484 | 19.3698 | 24.4767 |
| u89 | 5.4318 | 5.7298 | 5.9754 | 6.2572 | 6.8843 | 8.2821 | 10.9155 | 12.2616 | 12.8477 | 13.2699 | 13.7391 | 14.6481 | 19.3697 | 24.4768 |
| u90 | 5.4231 | 5.7301 | 5.9789 | 6.2566 | 6.8799 | 8.2757 | 10.9068 | 12.2583 | 12.8476 | 13.27 | 13.7377 | 14.6471 | 19.3684 | 24.4777 |
| u91 | 5.4221 | 5.7274 | 5.9788 | 6.2571 | 6.8799 | 8.2747 | 10.9055 | 12.2579 | 12.8471 | 13.27 | 13.7377 | 14.6476 | 19.3696 | 24.477 |
| u92 | 5.4403 | 5.7393 | 5.975 | 6.2333 | 6.8466 | 8.2345 | 10.8592 | 12.2302 | 12.8554 | 13.3083 | 13.8147 | 14.8113 | 19.7098 | 25.1963 |
| u93 | 5.4413 | 5.7415 | 5.9752 | 6.2328 | 6.8466 | 8.2356 | 10.8605 | 12.2309 | 12.8558 | 13.3083 | 13.8146 | 14.8112 | 19.7098 | 25.1968 |
| u94 | 5.45 | 5.7407 | 5.9717 | 6.2334 | 6.8512 | 8.2421 | 10.8691 | 12.2342 | 12.8559 | 13.3082 | 13.8161 | 14.8123 | 19.7111 | 25.1944 |
| u95 | 5.4488 | 5.7379 | 5.9716 | 6.2339 | 6.8512 | 8.2411 | 10.8678 | 12.2338 | 12.8554 | 13.3081 | 13.8158 | 14.8126 | 19.7109 | 25.196 |
| u96 | 7.6082 | 7.918 | 8.0953 | 8.2629 | 8.794 | 10.2793 | 13.2511 | 14.6059 | 15.0727 | 15.2889 | 15.6286 | 16.5507 | 21.7665 | 27.5123 |
| u97 | 7.6229 | 7.9104 | 8.0964 | 8.2641 | 8.7933 | 10.2775 | 13.2489 | 14.6057 | 15.0684 | 15.2891 | 15.6295 | 16.5501 | 21.7667 | 27.5124 |
| u98 | 7.6179 | 7.8964 | 8.0887 | 8.2664 | 8.8029 | 10.2921 | 13.2632 | 14.6063 | 15.0691 | 15.2881 | 15.6336 | 16.5542 | 21.7663 | 27.5095 |
| u99 | 7.6038 | 7.9043 | 8.0878 | 8.2651 | 8.8036 | 10.2941 | 13.2655 | 14.6066 | 15.073 | 15.2882 | 15.634 | 16.5531 | 21.7676 | 27.5097 |
| u100 | 7.6836 | 7.918 | 8.056 | 8.2088 | 8.7134 | 10.1627 | 13.191 | 14.6045 | 15.1627 | 15.471 | 15.9451 | 17.0932 | 22.6979 | 29.0617 |
| u101 | 7.6996 | 7.9099 | 8.057 | 8.2099 | 8.7309 | 10.2112 | 13.1893 | 14.6047 | 15.1587 | 15.4709 | 15.945 | 17.0913 | 22.6979 | 29.061 |
| u102 | 7.7031 | 7.925 | 8.0647 | 8.2076 | 8.7228 | 10.1994 | 13.1781 | 14.6056 | 15.1582 | 15.4705 | 15.9389 | 17.0861 | 22.6947 | 29.0661 |
| u103 | 7.6872 | 7.9336 | 8.0638 | 8.2064 | 8.7233 | 10.2009 | 13.1798 | 14.6054 | 15.162 | 15.4706 | 15.9388 | 17.0849 | 22.6941 | 29.0661 |
| u104 | 7.9867 | 8.3705 | 8.5825 | 8.7568 | 9.3283 | 10.9595 | 14.2934 | 16.2011 | 16.9975 | 17.3518 | 17.7589 | 18.8327 | 24.7516 | 31.3744 |
| u105 | 8.0022 | 8.3555 | 8.5825 | 8.7592 | 9.3268 | 10.9548 | 14.2846 | 16.1932 | 17.0148 | 17.3518 | 17.7591 | 18.8328 | 24.7515 | 31.3744 |
| u106 | 8.01 | 8.3395 | 8.5673 | 8.7617 | 9.3471 | 10.9952 | 14.3414 | 16.241 | 17.0125 | 17.3489 | 17.7457 | 18.8249 | 24.758 | 31.4225 |
| u107 | 7.994 | 8.3552 | 8.5672 | 8.7592 | 9.3487 | 11.0003 | 14.3506 | 16.2494 | 16.9953 | 17.3487 | 17.7453 | 18.8246 | 24.7579 | 31.4221 |
| u108 | 7.8836 | 8.307 | 8.5972 | 8.8664 | 9.5228 | 11.2413 | 14.686 | 16.6559 | 17.5535 | 18.0663 | 18.6517 | 20.055 | 26.503 | 33.6513 |
| u109 | 7.8988 | 8.2935 | 8.5972 | 8.867 | 9.5215 | 11.2367 | 14.6771 | 16.6462 | 17.5876 | 18.0663 | 18.6515 | 20.0533 | 26.5013 | 33.6487 |
| u110 | 7.896 | 8.3091 | 8.6117 | 8.8651 | 9.5023 | 11.1973 | 14.6201 | 16.5887 | 17.592 | 18.0639 | 18.6846 | 20.116 | 26.6315 | 33.9236 |
| u111 | 7.8814 | 8.3226 | 8.6119 | 8.8627 | 9.5038 | 11.2023 | 14.6292 | 16.5987 | 17.5578 | 18.0639 | 18.6839 | 20.1169 | 26.6341 | 33.9259 |
| u112 | 9.436 | 10.0623 | 10.47 | 10.7662 | 11.4481 | 13.2962 | 17.0489 | 18.9735 | 19.7492 | 20.0947 | 20.5375 | 21.8418 | 28.6556 | 36.2339 |
| u113 | 9.3922 | 10.0518 | 10.4493 | 10.7594 | 11.4525 | 13.3074 | 17.0669 | 18.9921 | 19.7306 | 20.0909 | 20.5382 | 21.8465 | 28.6619 | 36.2372 |
| u114 | 9.5947 | 10.1666 | 10.4664 | 10.7276 | 11.397 | 13.2318 | 16.9666 | 18.8982 | 19.733 | 20.155 | 20.6843 | 22.0926 | 29.1346 | 37.0892 |
| u115 | 9.6675 | 10.1729 | 10.4873 | 10.7344 | 11.3929 | 13.2221 | 16.952 | 18.884 | 19.7514 | 20.1585 | 20.6834 | 22.0865 | 29.1241 | 37.0814 |
| u116 | 9.8599 | 10.4729 | 10.9145 | 11.2124 | 11.8964 | 13.7987 | 17.7117 | 19.8555 | 21.532 | 21.7205 | 22.3344 | 23.7879 | 31.1747 | 39.4286 |
| u117 | 9.7871 | 10.4837 | 10.8883 | 11.1969 | 11.8218 | 17.7542 | 19.9174 | 21.1271 | 21.7394 | 22.2312 | 23.7735 | 31.1574 | 39.4283 |
| u118 | 9.6068 | 10.3396 | 10.8274 | 11.223 | 12.0011 | 13.9892 | 18.0179 | 20.2702 | 21.0785 | 22.2761 | 22.9719 | 24.5637 | 32.394 | 41.2564 |
| u119 | 9.6596 | 10.3378 | 10.8495 | 11.2374 | 11.9958 | 13.9668 | 17.9752 | 20.2067 | 21.4734 | 22.2398 | 22.9714 | 24.5985 | 32.4681 | 41.4046 |
| u120 | 10.8978 | 11.5582 | 12.3208 | 12.8873 | 13.7835 | 15.9874 | 20.4011 | 22.6571 | 23.7082 | 24.2388 | 24.8198 | 26.3669 | 34.5207 | 43.6965 |
| u121 | 10.5767 | 11.8252 | 12.4176 | 12.8829 | 13.7395 | 15.9323 | 20.3136 | 23.2522 | 24.9175 | 24.2243 | 24.889 | 26.5122 | 34.7919 | 44.2145 |
| u122 | 10.8844 | 12.1038 | 12.8045 | 13.3274 | 14.2155 | 16.4449 | 20.9694 | 23.3205 | 24.5559 | 25.4566 | 26.3058 | 28.0576 | 36.7487 | 46.5162 |
| u123 | 11.1412 | 11.8553 | 12.6517 | 13.2856 | 14.2645 | 16.564 | 21.1646 | 23.6074 | 23.6197 | 25.898 | 26.8505 | 28.703 | 37.6825 | 47.9585 |
| u124 | 12.2046 | 12.8017 | 13.778 | 14.6238 | 15.8072 | 18.3949 | 23.4389 | 25.9652 | 30.6384 | 27.8455 | 28.6556 | 30.5018 | 39.8778 | 50.4943 |
| u125 | 11.9129 | 13.2528 | 14.2362 | 15.0958 | 16.2929 | 18.9245 | 24.0891 | 26.7086 | 27.9794 | 28.9722 | 30.1021 | 32.1972 | 42.1228 | 53.295 |
| u126 | 15.2521 | 14.3199 | 15.3464 | 16.3701 | 17.8724 | 20.8801 | 26.5953 | 29.4179 | 27.1182 | 31.4419 | 32.4263 | 34.5222 | 44.9919 | 56.7086 |
| u127 | 13.2522 | 16.3863 | 17.4046 | 18.4252 | 20.0452 | 23.3692 | 29.6877 | 32.7332 | 33.9159 | 34.5905 | 35.4336 | 37.4918 | 48.5912 | 60.917 |

| SNR | 28 | 29 | 30 | 31 | 32 | 33 | 34 | 35 | 36 | 37 | 38 | 39 | 40 |
|---|---|---|---|---|---|---|---|---|---|---|---|---|---|
| u1 | 1 | 1.0006 | 1.0005 | 0.9999 | 1 | 0.9985 | 0.9981 | 1.001 | 0.9984 | 1.0066 | 1.0362 | 0.9974 | 0.9984 |
| u2 | 1.0002 | 1.001 | 1.0016 | 1 | 1.0005 | 0.9964 | 0.9985 | 1.0014 | 1.0004 | 1.0018 | 1.015 | 2.7466 | 2.9574 |
| u3 | 1.0004 | 0.9999 | 1.0017 | 1.0006 | 1.0016 | 0.9961 | 0.9978 | 1.0011 | 1.0038 | 1.0083 | 0.9943 | 2.7475 | 2.9731 |
| u4 | 1 | 1.0006 | 1.0019 | 1.0032 | 1.1214 | 2.7051 | 2.9204 | 2.9864 | 2.9875 | 3.0172 | 3.0491 | 4.7407 | 5.0019 |
| u5 | 1.0004 | 1 | 1.0023 | 1.0038 | 1.1212 | 2.7031 | 2.9211 | 2.9868 | 2.9902 | 3.0022 | 3.0331 | 4.741 | 5.0129 |
| u6 | 1.0005 | 1.0005 | 1.0011 | 1.0047 | 1.1199 | 2.7045 | 2.9203 | 2.986 | 2.9989 | 3.0025 | 3.0315 | 6.489 | 7.015 |
| u7 | 0.9999 | 1.0005 | 1.0002 | 1.0047 | 1.1195 | 2.7126 | 2.9207 | 2.9859 | 2.9886 | 3.0143 | 3.0414 | 6.4865 | 7.0267 |
| u8 | 2.9287 | 2.987 | 3.0045 | 3.0062 | 3.0946 | 4.705 | 4.921 | 4.9923 | 4.998 | 5.0154 | 5.066 | 8.474 | 9.099 |
| u9 | 2.9287 | 2.9869 | 3.0043 | 3.0045 | 3.094 | 4.7011 | 4.9203 | 4.9912 | 4.994 | 5.0197 | 5.0752 | 8.4759 | 9.109 |
| u10 | 2.9277 | 2.9867 | 3.0039 | 3.0053 | 3.0945 | 4.7047 | 4.9204 | 4.9915 | 4.9955 | 5.0194 | 5.074 | 10.2165 | 11.1153 |
| u11 | 2.9287 | 2.988 | 3.004 | 3.007 | 3.0946 | 4.7008 | 4.9222 | 4.9906 | 4.9966 | 5.0244 | 5.05 | 10.2213 | 11.1043 |
| u12 | 2.9293 | 2.987 | 3.0042 | 3.0137 | 3.2804 | 6.415 | 6.8546 | 6.9861 | 6.9976 | 7.0339 | 7.0804 | 12.2129 | 13.188 |
| u13 | 2.9287 | 2.9869 | 3.0039 | 3.0128 | 3.2806 | 6.4246 | 6.8543 | 6.9856 | 6.9957 | 7.0364 | 7.0591 | 12.2173 | 13.1782 |
| u14 | 2.9288 | 2.9877 | 3.0045 | 3.0129 | 3.2812 | 6.4186 | 6.8543 | 6.985 | 7.0001 | 7.0375 | 7.1081 | 13.9784 | 15.1993 |
| u15 | 2.9292 | 2.9875 | 3.0045 | 3.0126 | 3.2812 | 6.4249 | 6.8538 | 6.9857 | 6.9995 | 7.0372 | 7.1435 | 13.979 | 15.191 |

-continued

| | | | | | | | | | | | | |
|---|---|---|---|---|---|---|---|---|---|---|---|---|
| u16 | 4.9446 | 5.0065 | 5.0252 | 5.0189 | 5.1769 | 8.419 | 8.8685 | 9.0062 | 9.0003 | 9.0594 | 9.0511 | 15.9776 | 17.284 |
| u17 | 4.9444 | 5.0064 | 5.025 | 5.0197 | 5.1766 | 8.4254 | 8.8694 | 9.0046 | 8.9994 | 9.0608 | 9.0667 | 15.9766 | 17.2687 |
| u18 | 4.9446 | 5.0061 | 5.0252 | 5.0191 | 5.1776 | 8.4269 | 8.8697 | 9.0043 | 9.0021 | 9.0676 | 9.2359 | 17.7671 | 19.3093 |
| u19 | 4.9451 | 5.0066 | 5.0251 | 5.0189 | 5.177 | 8.4249 | 8.8709 | 9.0048 | 9.0003 | 9.0595 | 9.1971 | 17.7707 | 19.3124 |
| u20 | 4.9446 | 5.0064 | 5.0256 | 5.0398 | 5.5211 | 10.1853 | 10.8276 | 11.0207 | 11.0167 | 11.1094 | 11.0581 | 19.7707 | 21.3941 |
| u21 | 4.9444 | 5.0059 | 5.0256 | 5.0402 | 5.5219 | 10.183 | 10.8294 | 11.0221 | 11.0145 | 11.0923 | 11.0384 | 19.7797 | 21.3982 |
| u22 | 4.9441 | 5.0061 | 5.0257 | 5.0417 | 5.5217 | 10.1826 | 10.8282 | 11.0199 | 11.0121 | 11.0955 | 11.324 | 21.5858 | 23.4312 |
| u23 | 4.9445 | 5.0061 | 5.0261 | 5.0401 | 5.5206 | 10.1849 | 10.8293 | 11.0198 | 11.0182 | 11.0867 | 11.3325 | 21.5898 | 23.4309 |
| u24 | 6.9214 | 7.035 | 7.0638 | 7.0422 | 7.2895 | 12.1967 | 12.866 | 13.0648 | 13.0507 | 13.1344 | 13.0661 | 23.6016 | 25.5302 |
| u25 | 6.9212 | 7.0346 | 7.0638 | 7.0418 | 7.2901 | 12.1976 | 12.8658 | 13.0659 | 13.0504 | 13.1304 | 13.058 | 23.5992 | 25.5124 |
| u26 | 6.9214 | 7.0342 | 7.0642 | 7.0405 | 7.2903 | 12.1994 | 12.8636 | 13.0636 | 13.0549 | 13.1287 | 13.5872 | 25.4362 | 27.5717 |
| u27 | 6.9214 | 7.0345 | 7.0636 | 7.0405 | 7.2904 | 12.1984 | 12.8643 | 13.0642 | 13.0518 | 13.1398 | 13.579 | 25.4354 | 27.5781 |
| u28 | 6.9224 | 7.0349 | 7.0667 | 7.0972 | 7.9067 | 14.0122 | 14.8618 | 15.1097 | 15.1051 | 15.1819 | 15.1752 | 27.4562 | 29.681 |
| u29 | 6.9221 | 7.0347 | 7.0672 | 7.0965 | 7.908 | 14.0085 | 14.8599 | 15.113 | 15.0992 | 15.1856 | 15.1876 | 27.4558 | 29.6821 |
| u30 | 6.9214 | 7.0351 | 7.0671 | 7.0961 | 7.9061 | 14.0092 | 14.8613 | 15.1135 | 15.1023 | 15.1927 | 16.0237 | 29.3231 | 31.7549 |
| u31 | 6.9205 | 7.0344 | 7.0668 | 7.0959 | 7.9054 | 14.0097 | 14.8597 | 15.1108 | 15.1035 | 15.1814 | 16.0137 | 29.3232 | 31.7594 |
| u32 | 8.9908 | 9.1122 | 9.1348 | 9.0707 | 9.5396 | 16.0463 | 16.9244 | 17.1907 | 17.1718 | 17.2414 | 17.5113 | 31.3516 | 33.8871 |
| u33 | 8.9911 | 9.1118 | 9.1344 | 9.071 | 9.5398 | 16.0452 | 16.9259 | 17.1888 | 17.1705 | 17.2417 | 17.5031 | 31.353 | 33.8773 |
| u34 | 8.9906 | 9.1113 | 9.1351 | 9.0701 | 9.539 | 16.0419 | 16.9255 | 17.1882 | 17.1678 | 17.2654 | 18.5706 | 33.2528 | 35.9715 |
| u35 | 8.991 | 9.1116 | 9.1354 | 9.0705 | 9.5392 | 16.0388 | 16.9266 | 17.1881 | 17.1691 | 17.2629 | 18.5644 | 33.2529 | 35.9809 |
| u36 | 8.9912 | 9.1123 | 9.1489 | 9.2125 | 10.4775 | 17.9271 | 18.9687 | 19.2795 | 19.2557 | 19.3163 | 19.9804 | 35.3025 | 38.1205 |
| u37 | 8.9914 | 9.1122 | 9.1478 | 9.2106 | 10.4778 | 17.9298 | 18.968 | 19.2804 | 19.2559 | 19.3111 | 19.9788 | 35.304 | 38.117 |
| u38 | 8.9917 | 9.1134 | 9.1472 | 9.2112 | 10.4764 | 17.9299 | 18.9683 | 19.2809 | 19.2553 | 19.3466 | 21.1495 | 37.2403 | 40.2362 |
| u39 | 8.9912 | 9.1128 | 9.1476 | 9.2117 | 10.4769 | 17.9285 | 18.9672 | 19.2801 | 19.2578 | 19.3621 | 21.1524 | 37.2445 | 40.2239 |
| u40 | 11.0673 | 11.2256 | 11.2369 | 11.1059 | 12.0061 | 19.9923 | 21.0777 | 21.4044 | 21.3747 | 21.3617 | 22.4953 | 39.3085 | 42.3801 |
| u41 | 11.0668 | 11.2255 | 11.2377 | 11.1066 | 12.0057 | 19.9919 | 21.0771 | 21.402 | 21.3729 | 21.3876 | 22.5109 | 39.3099 | 42.3847 |
| u42 | 11.067 | 11.2254 | 11.237 | 11.1065 | 12.0041 | 19.9952 | 21.0776 | 21.4039 | 21.3663 | 21.5155 | 23.7174 | 41.2818 | 44.5501 |
| u43 | 11.0666 | 11.225 | 11.2364 | 11.1049 | 12.0045 | 19.9964 | 21.0766 | 21.4043 | 21.3679 | 21.5122 | 23.7283 | 41.2832 | 44.5608 |
| u44 | 11.0657 | 11.2302 | 11.2811 | 11.4342 | 13.1858 | 21.9618 | 23.1874 | 23.5507 | 23.5059 | 23.4567 | 25.0719 | 43.3629 | 46.7679 |
| u45 | 11.0671 | 11.2297 | 11.2819 | 11.435 | 13.187 | 21.9641 | 23.1875 | 23.5505 | 23.5042 | 23.4496 | 25.0679 | 43.365 | 46.7714 |
| u46 | 11.0669 | 11.2304 | 11.2825 | 11.4362 | 13.1856 | 21.9643 | 23.1838 | 23.5499 | 23.5066 | 23.717 | 26.3361 | 45.3749 | 48.9786 |
| u47 | 11.0668 | 11.2301 | 11.2812 | 11.436 | 13.1857 | 21.9603 | 23.187 | 23.5523 | 23.5044 | 23.7238 | 26.3195 | 45.3761 | 48.9808 |
| u48 | 13.2397 | 13.4028 | 13.3692 | 13.2007 | 14.6699 | 24.0714 | 25.3576 | 25.7368 | 25.6586 | 25.5407 | 27.7266 | 47.487 | 51.2241 |
| u49 | 13.2403 | 13.4035 | 13.3698 | 13.201 | 14.6709 | 24.0717 | 25.3576 | 25.7375 | 25.6592 | 25.54 | 27.7184 | 47.4854 | 51.2195 |
| u50 | 13.2399 | 13.4035 | 13.3701 | 13.1998 | 14.6705 | 24.0693 | 25.3565 | 25.7358 | 25.6776 | 26.0607 | 29.0202 | 49.5433 | 53.4655 |
| u51 | 13.2395 | 13.403 | 13.3701 | 13.2006 | 14.6701 | 24.0707 | 25.3553 | 25.7359 | 25.6743 | 26.0597 | 29.0174 | 49.5435 | 53.4582 |
| u52 | 13.2404 | 13.4232 | 13.5027 | 13.8607 | 15.9969 | 26.129 | 27.545 | 27.9509 | 27.8297 | 27.7435 | 30.4166 | 51.6853 | 55.7521 |
| u53 | 13.2416 | 13.4229 | 13.5031 | 13.861 | 15.9969 | 26.1272 | 27.5449 | 27.9527 | 27.8345 | 27.7437 | 30.4132 | 51.6875 | 55.7264 |
| u54 | 13.2416 | 13.4226 | 13.5028 | 13.862 | 15.998 | 26.1264 | 27.5433 | 27.9522 | 27.8866 | 28.6142 | 31.7338 | 53.7974 | 58.0397 |
| u55 | 13.2412 | 13.4229 | 13.5023 | 13.8619 | 15.9969 | 26.1297 | 27.5443 | 27.9539 | 27.8863 | 28.6058 | 31.7285 | 53.8007 | 58.0114 |
| u56 | 15.4695 | 15.6354 | 15.5294 | 15.4932 | 17.4935 | 28.3018 | 29.7929 | 30.2126 | 30.0253 | 30.1633 | 33.1425 | 55.9894 | 60.3628 |
| u57 | 15.4695 | 15.6359 | 15.5294 | 15.492 | 17.4932 | 28.3028 | 29.7933 | 30.2117 | 30.0251 | 30.1586 | 33.1369 | 55.99 | 60.3492 |
| u58 | 15.4698 | 15.6351 | 15.5295 | 15.4926 | 17.4933 | 28.3013 | 29.7925 | 30.2145 | 30.1545 | 31.2927 | 34.5363 | 58.1615 | 62.684 |
| u59 | 15.47 | 15.6345 | 15.5299 | 15.4944 | 17.4936 | 28.302 | 29.7914 | 30.2159 | 30.1555 | 31.2986 | 34.5258 | 58.1607 | 62.6805 |
| u60 | 15.4822 | 15.7086 | 15.8746 | 16.5486 | 18.9258 | 30.4642 | 32.081 | 32.5124 | 32.2268 | 32.7848 | 35.9852 | 60.3904 | 65.0661 |
| u61 | 15.4818 | 15.7082 | 15.8741 | 16.5476 | 18.9261 | 30.465 | 32.08 | 32.5102 | 32.2223 | 32.7812 | 35.9871 | 60.3926 | 65.0532 |
| u62 | 15.4822 | 15.7077 | 15.8736 | 16.5474 | 18.927 | 30.4705 | 32.0774 | 32.524 | 32.5194 | 34.0615 | 37.3989 | 62.6197 | 67.4533 |
| u63 | 15.4821 | 15.7077 | 15.8741 | 16.5498 | 18.9263 | 30.4707 | 32.0782 | 32.5252 | 32.525 | 34.0601 | 37.4058 | 62.6194 | 67.45 |
| u64 | 17.8039 | 17.9235 | 17.7749 | 18.0908 | 20.4681 | 32.7308 | 34.4285 | 34.8508 | 34.4638 | 35.5387 | 38.8801 | 64.9059 | 69.8435 |
| u65 | 17.8033 | 17.9229 | 17.775 | 18.0916 | 20.4684 | 32.7342 | 34.4286 | 34.8517 | 34.4716 | 35.5407 | 38.8762 | 64.9012 | 69.8618 |
| u66 | 17.8036 | 17.9233 | 17.7746 | 18.0899 | 20.4691 | 32.7353 | 34.4319 | 34.8466 | 35.0611 | 36.9021 | 40.3523 | 67.197 | 72.2732 |
| u67 | 17.8046 | 17.9235 | 17.7746 | 18.09 | 20.4684 | 32.7374 | 34.4325 | 34.8942 | 35.0559 | 36.8974 | 40.3446 | 67.1931 | 72.2674 |
| u68 | 17.8596 | 18.1519 | 18.5207 | 19.4231 | 22.0024 | 35.0307 | 36.8304 | 37.2229 | 36.8551 | 38.383 | 41.8603 | 69.536 | 74.7596 |
| u69 | 17.8589 | 18.1531 | 18.5216 | 19.4233 | 22.0024 | 35.0258 | 36.832 | 37.2222 | 36.8551 | 38.3841 | 41.8594 | 69.5345 | 74.7295 |
| u70 | 17.8584 | 18.1533 | 18.5209 | 19.4215 | 22.0014 | 35.0353 | 36.8376 | 37.3434 | 37.8414 | 39.8194 | 43.3968 | 71.8934 | 77.2584 |
| u71 | 18.8591 | 18.1523 | 18.5212 | 19.4214 | 22.0026 | 35.0373 | 36.8413 | 37.3441 | 37.8414 | 39.818 | 43.4039 | 71.8922 | 77.2299 |
| u72 | 20.2138 | 20.2778 | 20.2921 | 20.9646 | 23.6204 | 37.4258 | 39.2979 | 39.6172 | 39.5116 | 41.3494 | 44.9547 | 74.3042 | 79.794 |
| u73 | 20.2143 | 20.2777 | 20.2924 | 20.9666 | 23.6212 | 37.4258 | 39.2979 | 39.6173 | 39.509 | 41.3364 | 44.9503 | 74.3063 | 79.7739 |
| u74 | 20.2146 | 20.2783 | 20.2923 | 20.9653 | 23.6208 | 37.4354 | 39.3284 | 39.9222 | 40.8043 | 42.8419 | 46.5098 | 76.7413 | 82.3524 |
| u75 | 20.2144 | 20.2769 | 20.292 | 20.9651 | 23.6208 | 37.432 | 39.3274 | 39.9226 | 40.8082 | 42.8464 | 46.486 | 76.7436 | 82.3657 |
| u76 | 20.42 | 20.8736 | 21.5286 | 22.4713 | 25.2716 | 39.8894 | 41.819 | 42.0625 | 42.4198 | 44.4117 | 48.1059 | 79.225 | 84.9825 |
| u77 | 20.4194 | 20.8739 | 21.5305 | 22.4715 | 25.2701 | 39.8807 | 41.8165 | 42.0611 | 42.4209 | 44.4134 | 48.0959 | 79.2238 | 84.9999 |
| u78 | 20.4194 | 20.8736 | 21.5298 | 22.4719 | 25.2715 | 39.8945 | 41.9135 | 42.7227 | 43.8895 | 45.9788 | 49.697 | 81.7531 | 87.6215 |
| u79 | 20.4195 | 20.8732 | 21.5288 | 22.472 | 25.2723 | 39.9024 | 41.9126 | 42.7223 | 43.8897 | 45.9742 | 49.7094 | 81.7468 | 87.6724 |
| u80 | 22.7233 | 22.8704 | 23.2313 | 24.0926 | 26.9965 | 42.4275 | 44.3814 | 44.7027 | 45.527 | 47.6023 | 51.3549 | 84.3422 | 90.3187 |
| u81 | 22.7236 | 22.8711 | 23.2304 | 24.0923 | 27.0001 | 42.4321 | 44.3853 | 44.7029 | 45.5275 | 47.601 | 51.3717 | 84.3288 | 90.4311 |
| u82 | 22.7246 | 22.8715 | 23.2302 | 24.0924 | 27.0041 | 42.4692 | 44.6426 | 45.8431 | 47.1136 | 49.2392 | 53.0585 | 86.9802 | 93.0428 |
| u83 | 22.7242 | 22.8705 | 23.2313 | 24.0935 | 27.0015 | 42.461 | 44.6617 | 45.8431 | 47.103 | 49.2363 | 53.0737 | 86.9711 | 93.2898 |
| u84 | 23.3138 | 24.0541 | 24.8112 | 25.751 | 28.7832 | 45.0533 | 47.0001 | 47.6949 | 48.7801 | 50.9199 | 54.7968 | 89.6586 | 95.801 |
| u85 | 23.3127 | 24.0543 | 24.8118 | 25.751 | 28.7794 | 45.045 | 46.9988 | 47.696 | 48.7776 | 50.9245 | 54.807 | 89.6655 | 96.2763 |
| u86 | 23.3144 | 24.0547 | 24.8116 | 25.7552 | 28.8014 | 45.1577 | 47.6181 | 49.2057 | 50.4537 | 52.6302 | 56.5811 | 92.3763 | 98.6388 |
| u87 | 23.313 | 24.0544 | 24.8109 | 25.7544 | 28.8046 | 45.1638 | 47.6189 | 49.2068 | 50.4564 | 52.643 | 56.5866 | 92.4194 | 99.5106 |
| u88 | 25.5044 | 25.9653 | 26.5789 | 27.5038 | 30.6332 | 47.7278 | 49.8108 | 51.0227 | 52.2038 | 54.4034 | 58.3896 | 95.1312 | 101.6507 |
| u89 | 25.5051 | 25.9648 | 26.5791 | 27.5029 | 30.6352 | 47.725 | 49.8118 | 51.0229 | 52.1989 | 54.4037 | 58.3844 | 95.2633 | 103.0069 |
| u90 | 25.5053 | 25.964 | 26.5809 | 27.52 | 30.7141 | 48.0599 | 50.9801 | 52.7432 | 53.9696 | 56.2267 | 60.2319 | 97.9117 | 105.0269 |
| u91 | 25.5049 | 25.9644 | 26.5807 | 27.521 | 30.7134 | 48.0654 | 50.9816 | 52.7453 | 53.9632 | 56.2216 | 60.2299 | 98.2343 | 106.631 |
| u92 | 26.7816 | 27.6749 | 28.3939 | 29.3219 | 32.5364 | 50.5027 | 53.035 | 54.6113 | 55.8117 | 58.0789 | 62.0692 | 100.7297 | 108.6317 |
| u93 | 26.7831 | 27.6761 | 28.3935 | 29.3221 | 32.5365 | 50.51 | 53.0336 | 54.6119 | 55.8027 | 58.0845 | 62.1495 | 101.4149 | 110.3993 |
| u94 | 26.7809 | 27.6769 | 28.4103 | 29.3929 | 32.7789 | 51.2992 | 54.6924 | 56.4831 | 57.7006 | 59.9745 | 63.9313 | 103.7252 | 112.3836 |

-continued

| | | | | | | | | | | | | | |
|---|---|---|---|---|---|---|---|---|---|---|---|---|---|
| u95 | 26.7811 | 27.6774 | 28.4104 | 29.3936 | 32.7792 | 51.2959 | 54.694 | 56.4803 | 57.7011 | 60.0062 | 64.1876 | 104.9305 | 114.3191 |
| u96 | 28.9133 | 29.6554 | 30.3268 | 31.2106 | 34.5196 | 53.5865 | 56.7122 | 58.4546 | 59.6618 | 61.925 | 65.8707 | 107.0741 | 116.3731 |
| u97 | 28.9131 | 29.655 | 30.3276 | 31.2106 | 34.5185 | 53.5784 | 56.7123 | 58.4533 | 59.6589 | 61.9994 | 66.3884 | 108.7177 | 118.3829 |
| u98 | 28.9139 | 29.6732 | 30.4037 | 31.4462 | 35.1081 | 55.0276 | 58.6598 | 60.4712 | 61.6726 | 63.8904 | 67.956 | 110.7913 | 120.5016 |
| u99 | 28.9145 | 29.6736 | 30.403 | 31.4444 | 35.1106 | 55.0302 | 58.6585 | 60.4736 | 61.6878 | 64.0956 | 68.8364 | 112.6798 | 122.6396 |
| u100 | 30.8635 | 31.7009 | 32.3378 | 33.1867 | 36.7457 | 57.2064 | 60.7699 | 62.5823 | 63.7283 | 65.9028 | 70.2821 | 114.777 | 124.8491 |
| u101 | 30.8637 | 31.7021 | 32.3379 | 33.1877 | 36.746 | 57.2057 | 60.7722 | 62.5903 | 63.8097 | 66.3942 | 71.4289 | 116.8115 | 127.09 |
| u102 | 30.8923 | 31.7987 | 32.602 | 33.7894 | 37.832 | 59.1583 | 62.9276 | 64.7595 | 65.8345 | 68.061 | 72.8718 | 118.9684 | 129.3915 |
| u103 | 30.8921 | 31.7987 | 32.602 | 33.7912 | 37.8322 | 59.1589 | 62.9305 | 64.7912 | 66.0432 | 68.9522 | 74.1587 | 121.1169 | 131.7078 |
| u104 | 33.1103 | 33.8833 | 34.4773 | 35.4425 | 39.4064 | 61.3827 | 65.2053 | 67.011 | 67.9846 | 70.5191 | 75.6001 | 123.3634 | 134.0697 |
| u105 | 33.1098 | 33.8828 | 34.4762 | 35.442 | 39.4075 | 61.3888 | 65.2239 | 67.1249 | 68.4883 | 71.7518 | 77.0182 | 125.6343 | 136.4748 |
| u106 | 33.2559 | 34.2269 | 35.172 | 36.5807 | 40.8735 | 63.6481 | 67.5701 | 69.3232 | 70.2982 | 73.2724 | 78.5537 | 127.9882 | 138.9739 |
| u107 | 33.2568 | 34.2274 | 35.1737 | 36.5807 | 40.8734 | 63.659 | 67.6342 | 69.6384 | 71.2727 | 74.709 | 80.0777 | 130.3969 | 141.5291 |
| u108 | 35.4684 | 36.2481 | 36.9718 | 38.1902 | 42.5213 | 66.0718 | 70.0278 | 71.7242 | 72.9705 | 76.2561 | 81.6684 | 132.8873 | 144.1989 |
| u109 | 35.4689 | 36.2489 | 36.9721 | 38.1901 | 42.5275 | 66.119 | 70.2374 | 72.4646 | 74.349 | 77.8245 | 83.2755 | 135.4437 | 146.9255 |
| u110 | 35.9949 | 37.1526 | 38.3017 | 39.7394 | 44.2273 | 68.5974 | 72.5659 | 74.4167 | 76.0146 | 79.477 | 84.9523 | 138.085 | 149.7421 |
| u111 | 35.9934 | 37.1496 | 38.3007 | 39.7481 | 44.2665 | 68.7677 | 73.131 | 75.7125 | 77.646 | 81.161 | 86.7073 | 140.8074 | 152.6113 |
| u112 | 38.1816 | 39.1352 | 40.0935 | 41.4613 | 46.0376 | 71.2182 | 75.3271 | 77.574 | 79.3964 | 82.93 | 88.4865 | 143.626 | 155.5662 |
| u113 | 38.1774 | 39.1335 | 40.1039 | 41.516 | 46.1905 | 71.7293 | 76.5081 | 79.2732 | 81.1921 | 84.7563 | 90.3453 | 146.5311 | 158.5759 |
| u114 | 39.4601 | 40.7841 | 41.8845 | 43.2609 | 47.9278 | 74.0577 | 78.5907 | 81.1887 | 83.092 | 86.6595 | 92.2971 | 149.5326 | 161.6944 |
| u115 | 39.4654 | 40.8108 | 41.9638 | 43.4675 | 48.3853 | 75.2231 | 80.3611 | 83.1387 | 85.0706 | 88.6446 | 94.3202 | 152.6251 | 164.8804 |
| u116 | 41.6592 | 42.8235 | 43.8418 | 45.1833 | 50.0471 | 77.4591 | 82.4633 | 85.2176 | 87.1495 | 90.7162 | 96.3936 | 155.829 | 168.1631 |
| u117 | 41.7049 | 42.9554 | 44.136 | 45.7703 | 51.0365 | 79.3386 | 84.5973 | 87.3964 | 89.3121 | 92.8734 | 98.5482 | 159.1453 | 171.495 |
| u118 | 43.7517 | 44.9531 | 45.9711 | 47.4293 | 52.6487 | 81.6178 | 86.9047 | 89.7118 | 91.5981 | 95.1252 | 100.7916 | 162.5723 | 174.9686 |
| u119 | 44.0261 | 45.4435 | 46.7742 | 48.6159 | 54.1387 | 83.9545 | 89.3582 | 92.1643 | 93.9938 | 97.4803 | 103.1416 | 166.1155 | 178.531 |
| u120 | 46.1915 | 47.437 | 48.591 | 50.2795 | 55.8617 | 86.5324 | 91.9868 | 94.7707 | 96.529 | 99.9355 | 105.5792 | 169.8029 | 182.2238 |
| u121 | 47.0297 | 48.6433 | 50.122 | 51.9653 | 57.7109 | 89.2947 | 94.8013 | 97.5359 | 99.1736 | 102.4958 | 108.1276 | 173.63 | 186.0831 |
| u122 | 49.2467 | 50.6869 | 52.0513 | 53.8713 | 59.739 | 92.3002 | 97.8188 | 100.4667 | 101.982 | 105.1988 | 110.8224 | 177.6145 | 190.0792 |
| u123 | 51.1141 | 52.7512 | 54.165 | 55.9764 | 61.9603 | 95.5521 | 101.0594 | 103.5869 | 104.9459 | 108.0373 | 113.5985 | 181.7798 | 194.231 |
| u124 | 53.5989 | 55.1926 | 56.557 | 58.314 | 64.3981 | 99.1007 | 104.5481 | 106.9211 | 108.0924 | 111.0473 | 116.55 | 186.1633 | 198.5898 |
| u125 | 56.464 | 57.9913 | 59.2563 | 60.9174 | 67.0836 | 102.97 | 108.3322 | 110.5136 | 111.4395 | 114.2481 | 119.6945 | 190.8022 | 203.2222 |
| u126 | 59.8456 | 61.2264 | 62.3312 | 63.8479 | 70.0819 | 107.2526 | 112.4929 | 114.4357 | 115.113 | 117.7127 | 123.0838 | 195.7743 | 208.1804 |
| u127 | 63.9379 | 65.0834 | 65.9472 | 67.2579 | 73.5415 | 112.162 | 117.228 | 118.8617 | 119.2181 | 121.5705 | 127.0239 | 201.2647 | 213.6522 | h) 262144-QAM/512-PAM for a Non-Fading Channel

| SNR | 0 | 1 | 2 | 3 | 4 | 5 | 6 | 7 | 8 | 9 | 10 | 11 | 12 | 13 |
|---|---|---|---|---|---|---|---|---|---|---|---|---|---|---|
| u1 | 0.9998 | 1.0001 | 0.9999 | 1 | 1.0006 | 0.9995 | 0.9998 | 0.9962 | 1.0007 | 0.9963 | 1.0006 | 1.0006 | 1.0001 | 1.0001 |
| u2 | 0.9991 | 0.9999 | 0.9995 | 0.9997 | 1.001 | 0.9988 | 0.9997 | 0.9948 | 0.9893 | 0.9887 | 0.996 | 0.9998 | 1.0003 | 1.0007 |
| u3 | 0.9986 | 1 | 0.9994 | 0.9995 | 1.0016 | 0.9985 | 0.9996 | 0.9944 | 0.9902 | 0.9926 | 0.9952 | 0.9985 | 1 | 1.0007 |
| u4 | 0.9978 | 0.9994 | 0.9986 | 0.999 | 1.0019 | 0.9979 | 0.9995 | 0.9893 | 0.9616 | 0.9733 | 0.9889 | 0.9943 | 1.0001 | 1.0018 |
| u5 | 0.9973 | 0.9995 | 0.9985 | 0.9989 | 1.0022 | 0.9973 | 0.9994 | 0.9847 | 0.9623 | 0.9695 | 0.9896 | 0.9947 | 1.0003 | 1.0019 |
| u6 | 0.9968 | 0.9998 | 0.9986 | 0.9989 | 1.0027 | 0.9969 | 0.9993 | 0.9818 | 0.9746 | 0.9772 | 0.9941 | 0.9946 | 1 | 1.0014 |
| u7 | 0.9963 | 0.9998 | 0.9985 | 0.9987 | 1.0031 | 0.9963 | 0.9993 | 0.9813 | 0.9759 | 0.9811 | 0.9934 | 0.9934 | 0.9997 | 1.0015 |
| u8 | 0.9946 | 0.9971 | 0.9963 | 0.9971 | 1.0033 | 0.9958 | 0.9994 | 1.0291 | 1.0236 | 0.951 | 0.976 | 0.986 | 0.9983 | 1.0018 |
| u9 | 0.9943 | 0.9972 | 0.9962 | 0.9971 | 1.0037 | 0.9954 | 0.9993 | 1.0269 | 1.0243 | 0.9469 | 0.9767 | 0.9864 | 0.9985 | 1.0019 |
| u10 | 0.9937 | 0.997 | 0.9958 | 0.9968 | 1.0042 | 0.995 | 0.9994 | 1.027 | 1.0124 | 0.9389 | 0.9724 | 0.9855 | 0.9987 | 1.0024 |
| u11 | 0.9932 | 0.9971 | 0.9957 | 0.9967 | 1.0046 | 0.9945 | 0.9993 | 1.0276 | 1.0134 | 0.9423 | 0.9718 | 0.9844 | 0.9984 | 1.0025 |
| u12 | 0.993 | 0.9978 | 0.9961 | 0.9969 | 1.0052 | 0.994 | 0.9993 | 1.0254 | 1.0456 | 0.9621 | 0.9779 | 0.9877 | 0.9981 | 1.0015 |
| u13 | 0.9926 | 0.9978 | 0.996 | 0.9968 | 1.0055 | 0.9937 | 0.9993 | 1.0234 | 1.0463 | 0.958 | 0.9786 | 0.9884 | 0.9983 | 1.0015 |
| u14 | 0.992 | 0.9981 | 0.9961 | 0.9969 | 1.006 | 0.9931 | 0.9992 | 1.0218 | 1.0597 | 0.9656 | 0.983 | 0.9884 | 0.9981 | 1.0011 |
| u15 | 0.9917 | 0.9982 | 0.996 | 0.9966 | 1.0064 | 0.9929 | 0.9993 | 1.0217 | 1.0609 | 0.9694 | 0.9825 | 0.987 | 0.9978 | 1.0011 |
| u16 | 0.9854 | 0.9856 | 0.986 | 0.9894 | 1.0047 | 0.9922 | 1.0001 | 1.0799 | 1.1302 | 1.0696 | 0.9687 | 0.9919 | 0.9883 | 0.9939 |
| u17 | 0.9851 | 0.9857 | 0.9859 | 0.9893 | 1.0052 | 0.992 | 1.0001 | 1.0788 | 1.13 | 1.0655 | 0.9694 | 0.9924 | 0.9887 | 0.9939 |
| u18 | 0.9844 | 0.9855 | 0.9855 | 0.9891 | 1.0055 | 0.9915 | 1.0002 | 1.0801 | 1.1161 | 1.0572 | 0.9648 | 0.9918 | 0.989 | 0.9944 |
| u19 | 0.9841 | 0.9856 | 0.9854 | 0.989 | 1.006 | 0.9911 | 1.0002 | 1.0822 | 1.1164 | 1.0616 | 0.9642 | 0.9906 | 0.9889 | 0.9944 |
| u20 | 0.9832 | 0.985 | 0.9847 | 0.9885 | 1.0064 | 0.9907 | 1.0003 | 1.0831 | 1.082 | 1.0407 | 0.9578 | 0.9869 | 0.9893 | 0.9955 |
| u21 | 0.9826 | 0.9851 | 0.9846 | 0.9884 | 1.0066 | 0.9903 | 1.0003 | 1.0824 | 1.0818 | 1.0367 | 0.9585 | 0.9873 | 0.9896 | 0.9955 |
| u22 | 0.9823 | 0.9854 | 0.9847 | 0.9884 | 1.0071 | 0.9899 | 1.0003 | 1.082 | 1.0954 | 1.0455 | 0.963 | 0.9873 | 0.9895 | 0.995 |
| u23 | 0.9819 | 0.9854 | 0.9845 | 0.9883 | 1.0076 | 0.9897 | 1.0004 | 1.084 | 1.0957 | 1.0499 | 0.9624 | 0.9862 | 0.9894 | 0.995 |
| u24 | 0.9826 | 0.9883 | 0.9865 | 0.9895 | 1.0085 | 0.9893 | 1.0002 | 1.0321 | 1.043 | 1.0838 | 0.9801 | 0.9923 | 0.9908 | 0.9947 |
| u25 | 0.9822 | 0.9884 | 0.9863 | 0.9895 | 1.009 | 0.9889 | 1.0003 | 1.0311 | 1.0428 | 1.0797 | 0.9807 | 0.993 | 0.991 | 0.9947 |
| u26 | 0.9818 | 0.9882 | 0.9859 | 0.9892 | 1.0093 | 0.9886 | 1.0004 | 1.0323 | 1.0299 | 1.0712 | 0.9762 | 0.9924 | 0.9913 | 0.9952 |
| u27 | 0.9811 | 0.9882 | 0.9858 | 0.989 | 1.0097 | 0.9884 | 1.0004 | 1.0341 | 1.0301 | 1.0757 | 0.9755 | 0.9914 | 0.9911 | 0.9952 |
| u28 | 0.9809 | 0.9889 | 0.9863 | 0.9894 | 1.0102 | 0.9879 | 1.0004 | 1.033 | 1.0628 | 1.0979 | 0.9817 | 0.9953 | 0.9908 | 0.9942 |
| u29 | 0.9804 | 0.989 | 0.9861 | 0.9893 | 1.0105 | 0.9876 | 1.0004 | 1.0322 | 1.0626 | 1.0938 | 0.9824 | 0.9961 | 0.991 | 0.9942 |
| u30 | 0.9801 | 0.9893 | 0.9862 | 0.9892 | 1.0109 | 0.9873 | 1.0005 | 1.0313 | 1.0758 | 1.1029 | 0.9868 | 0.9964 | 0.9909 | 0.9937 |
| u31 | 0.9797 | 0.9894 | 0.9862 | 0.9891 | 1.0113 | 0.987 | 1.0006 | 1.0331 | 1.076 | 1.1074 | 0.9861 | 0.9954 | 0.9906 | 0.9937 |
| u32 | 0.9865 | 0.9479 | 0.9445 | 0.9566 | 0.9978 | 0.9938 | 1.0006 | 1.0721 | 1.1533 | 1.2466 | 1.1002 | 1.0032 | 0.978 | 0.9669 |
| u33 | 0.9859 | 0.948 | 0.9444 | 0.9565 | 0.998 | 0.9937 | 1.0007 | 1.0709 | 1.1531 | 1.2416 | 1.1011 | 1.0042 | 0.9782 | 0.9671 |
| u34 | 0.9856 | 0.9479 | 0.9441 | 0.9564 | 0.9983 | 0.9936 | 1.0008 | 1.0722 | 1.1392 | 1.2318 | 1.0958 | 1.0037 | 0.9783 | 0.9678 |
| u35 | 0.985 | 0.9479 | 0.944 | 0.9563 | 0.9985 | 0.9935 | 1.0009 | 1.0743 | 1.1395 | 1.2365 | 1.0951 | 1.0028 | 0.9781 | 0.9678 |
| u36 | 0.9844 | 0.9474 | 0.9434 | 0.9559 | 0.9987 | 0.9933 | 1.001 | 1.0749 | 1.1049 | 1.2124 | 1.0878 | 0.9984 | 0.9781 | 0.969 |
| u37 | 0.9841 | 0.9475 | 0.9433 | 0.9558 | 0.9988 | 0.9931 | 1.0011 | 1.0737 | 1.1047 | 1.2076 | 1.0887 | 0.9994 | 0.9783 | 0.9691 |
| u38 | 0.9837 | 0.9477 | 0.9434 | 0.9559 | 0.9991 | 0.9931 | 1.0011 | 1.073 | 1.1186 | 1.2173 | 1.0941 | 0.9998 | 0.9782 | 0.9686 |

-continued

| | | | | | | | | | | | | | | |
|---|---|---|---|---|---|---|---|---|---|---|---|---|---|---|
| u39 | 0.9833 | 0.9478 | 0.9434 | 0.9559 | 0.9993 | 0.993 | 1.0012 | 1.0751 | 1.1188 | 1.222 | 1.0933 | 0.9989 | 0.9781 | 0.9686 |
| u40 | 0.9818 | 0.9453 | 0.9415 | 0.9545 | 0.9991 | 0.9927 | 1.0014 | 1.125 | 1.1761 | 1.186 | 1.0734 | 0.9913 | 0.9756 | 0.9692 |
| u41 | 0.9813 | 0.9454 | 0.9413 | 0.9545 | 0.9993 | 0.9926 | 1.0014 | 1.1235 | 1.1759 | 1.1814 | 1.0742 | 0.9922 | 0.9758 | 0.9693 |
| u42 | 0.981 | 0.9452 | 0.9411 | 0.9543 | 0.9994 | 0.9925 | 1.0015 | 1.1245 | 1.1615 | 1.1717 | 1.069 | 0.9919 | 0.976 | 0.9698 |
| u43 | 0.9806 | 0.9453 | 0.941 | 0.9542 | 0.9996 | 0.9924 | 1.0015 | 1.1264 | 1.1617 | 1.1764 | 1.0682 | 0.991 | 0.9758 | 0.9697 |
| u44 | 0.9805 | 0.9459 | 0.9414 | 0.9545 | 1 | 0.9922 | 1.0014 | 1.126 | 1.1979 | 1.2004 | 1.0754 | 0.9952 | 0.9759 | 0.9685 |
| u45 | 0.9801 | 0.946 | 0.9413 | 0.9545 | 1.0002 | 0.9921 | 1.0014 | 1.1245 | 1.1977 | 1.1957 | 1.0762 | 0.9961 | 0.9761 | 0.9686 |
| u46 | 0.9797 | 0.9462 | 0.9414 | 0.9546 | 1.0004 | 0.992 | 1.0014 | 1.1237 | 1.2122 | 1.2055 | 1.0814 | 0.9965 | 0.9761 | 0.968 |
| u47 | 0.9793 | 0.9463 | 0.9413 | 0.9545 | 1.0006 | 0.9918 | 1.0014 | 1.1254 | 1.2124 | 1.2103 | 1.0806 | 0.9956 | 0.9759 | 0.9678 |
| u48 | 0.9841 | 0.9581 | 0.9503 | 0.9609 | 1.0031 | 0.9919 | 1.0012 | 1.0813 | 1.1302 | 1.0859 | 1.0919 | 0.9951 | 0.987 | 0.9726 |
| u49 | 0.9836 | 0.9581 | 0.9502 | 0.9609 | 1.0034 | 0.9917 | 1.0012 | 1.0799 | 1.1299 | 1.0817 | 1.0927 | 0.996 | 0.9872 | 0.9725 |
| u50 | 0.9832 | 0.958 | 0.9498 | 0.9607 | 1.0035 | 0.9916 | 1.0011 | 1.0808 | 1.1161 | 1.0733 | 1.0873 | 0.9956 | 0.9873 | 0.973 |
| u51 | 0.9829 | 0.958 | 0.9498 | 0.9606 | 1.0038 | 0.9914 | 1.0011 | 1.0823 | 1.1162 | 1.0778 | 1.0864 | 0.9947 | 0.9871 | 0.9729 |
| u52 | 0.982 | 0.9575 | 0.9492 | 0.9602 | 1.0039 | 0.9911 | 1.001 | 1.0826 | 1.082 | 1.0566 | 1.0791 | 0.9905 | 0.9873 | 0.9739 |
| u53 | 0.9816 | 0.9576 | 0.9491 | 0.9602 | 1.0041 | 0.991 | 1.001 | 1.0808 | 1.0818 | 1.0526 | 1.0798 | 0.9915 | 0.9874 | 0.9738 |
| u54 | 0.9814 | 0.9578 | 0.9492 | 0.9602 | 1.0043 | 0.9908 | 1.0009 | 1.0799 | 1.0953 | 1.0616 | 1.085 | 0.992 | 0.9872 | 0.9732 |
| u55 | 0.981 | 0.9578 | 0.9492 | 0.9601 | 1.0045 | 0.9906 | 1.0008 | 1.0814 | 1.0955 | 1.0662 | 1.0841 | 0.9911 | 0.987 | 0.9731 |
| u56 | 0.9816 | 0.9605 | 0.9509 | 0.9613 | 1.0053 | 0.9904 | 1.0005 | 1.0319 | 1.043 | 1.0994 | 1.1042 | 0.9995 | 0.9881 | 0.9724 |
| u57 | 0.9811 | 0.9606 | 0.9508 | 0.9613 | 1.0055 | 0.9902 | 1.0004 | 1.03 | 1.0429 | 1.0955 | 1.105 | 1.0005 | 0.9882 | 0.9723 |
| u58 | 0.9806 | 0.9604 | 0.9505 | 0.9612 | 1.0056 | 0.99 | 1.0003 | 1.0307 | 1.0301 | 1.0873 | 1.0994 | 1.0001 | 0.9884 | 0.9728 |
| u59 | 0.9803 | 0.9604 | 0.9505 | 0.961 | 1.0059 | 0.9897 | 1.0002 | 1.0317 | 1.0304 | 1.092 | 1.0984 | 0.9992 | 0.9881 | 0.9726 |
| u60 | 0.9801 | 0.9611 | 0.9509 | 0.9614 | 1.0062 | 0.9895 | 0.9999 | 1.0314 | 1.0628 | 1.1143 | 1.1056 | 1.0034 | 0.9878 | 0.9714 |
| u61 | 0.9799 | 0.9612 | 0.9508 | 0.9614 | 1.0065 | 0.9893 | 0.9998 | 1.0293 | 1.0627 | 1.1105 | 1.1063 | 1.0044 | 0.9879 | 0.9714 |
| u62 | 0.9794 | 0.9614 | 0.9509 | 0.9614 | 1.0068 | 0.989 | 0.9996 | 1.0283 | 1.0759 | 1.12 | 1.1115 | 1.0048 | 0.9876 | 0.9709 |
| u63 | 0.979 | 0.9615 | 0.9509 | 0.9613 | 1.007 | 0.9888 | 0.9994 | 1.029 | 1.0761 | 1.1252 | 1.1105 | 1.0039 | 0.9873 | 0.9708 |
| u64 | 0.9546 | 0.8578 | 0.8134 | 0.8471 | 1.0124 | 0.9912 | 1.0025 | 1.0806 | 1.161 | 1.2656 | 1.5203 | 1.8256 | 2.2149 | 2.5504 |
| u65 | 0.9563 | 0.8584 | 0.8137 | 0.8475 | 1.0117 | 0.9912 | 1.0023 | 1.0785 | 1.1604 | 1.2606 | 1.5216 | 1.8285 | 2.215 | 2.5507 |
| u66 | 0.9572 | 0.8587 | 0.8139 | 0.8478 | 1.0113 | 0.9913 | 1.002 | 1.0786 | 1.146 | 1.2502 | 1.5147 | 1.827 | 2.2141 | 2.5515 |
| u67 | 0.9585 | 0.859 | 0.814 | 0.8481 | 1.0109 | 0.9915 | 1.0018 | 1.0792 | 1.146 | 1.2546 | 1.5134 | 1.8241 | 2.2139 | 2.5512 |
| u68 | 0.9591 | 0.8589 | 0.8139 | 0.848 | 1.0104 | 0.9915 | 1.0016 | 1.0787 | 1.1109 | 1.2303 | 1.5041 | 1.8141 | 2.2107 | 2.5522 |
| u69 | 0.9603 | 0.8595 | 0.8142 | 0.8484 | 1.01 | 0.9916 | 1.0013 | 1.0764 | 1.1103 | 1.2251 | 1.5054 | 1.8169 | 2.2108 | 2.5525 |
| u70 | 0.9615 | 0.86 | 0.8148 | 0.8489 | 1.0095 | 0.9917 | 1.0011 | 1.0748 | 1.1239 | 1.2344 | 1.5123 | 1.8183 | 2.2117 | 2.5516 |
| u71 | 0.9624 | 0.8606 | 0.8152 | 0.8491 | 1.009 | 0.9919 | 1.0009 | 1.0756 | 1.1238 | 1.239 | 1.511 | 1.8155 | 2.2115 | 2.5513 |
| u72 | 0.9628 | 0.8587 | 0.8138 | 0.8485 | 1.0085 | 0.9915 | 1.0006 | 1.1257 | 1.1816 | 1.2024 | 1.4871 | 1.8008 | 2.2027 | 2.5496 |
| u73 | 0.9637 | 0.8591 | 0.8141 | 0.8487 | 1.0081 | 0.9916 | 1.0004 | 1.1238 | 1.181 | 1.1973 | 1.4884 | 1.8036 | 2.2029 | 2.5498 |
| u74 | 0.9647 | 0.8594 | 0.8143 | 0.8489 | 1.0075 | 0.9918 | 1.0002 | 1.1242 | 1.1663 | 1.1874 | 1.4814 | 1.8021 | 2.2019 | 2.5506 |
| u75 | 0.9661 | 0.86 | 0.8146 | 0.8493 | 1.0072 | 0.9919 | 1.0001 | 1.1254 | 1.1663 | 1.1917 | 1.4802 | 1.7993 | 2.2017 | 2.5503 |
| u76 | 0.9672 | 0.8608 | 0.8154 | 0.85 | 1.0067 | 0.9922 | 0.9999 | 1.1242 | 1.2023 | 1.2154 | 1.4896 | 1.8092 | 2.2048 | 2.5492 |
| u77 | 0.9684 | 0.8613 | 0.8157 | 0.8503 | 1.0061 | 0.9923 | 0.9997 | 1.1223 | 1.2018 | 1.2103 | 1.4908 | 1.812 | 2.205 | 2.5494 |
| u78 | 0.97 | 0.8619 | 0.8162 | 0.8506 | 1.0058 | 0.9925 | 0.9995 | 1.121 | 1.2161 | 1.2199 | 1.4978 | 1.8135 | 2.2058 | 2.5485 |
| u79 | 0.9709 | 0.8626 | 0.8165 | 0.851 | 1.0052 | 0.9927 | 0.9994 | 1.1222 | 1.2161 | 1.2243 | 1.4965 | 1.8106 | 2.2056 | 2.5482 |
| u80 | 0.967 | 0.853 | 0.8095 | 0.8458 | 1.004 | 0.9908 | 0.9993 | 1.1692 | 1.302 | 1.3625 | 1.4833 | 1.8295 | 2.2012 | 2.5365 |
| u81 | 0.9684 | 0.8535 | 0.8097 | 0.8461 | 1.0037 | 0.991 | 0.9992 | 1.1674 | 1.3015 | 1.3569 | 1.4847 | 1.8325 | 2.2014 | 2.5367 |
| u82 | 0.9693 | 0.8539 | 0.8099 | 0.8463 | 1.0031 | 0.9912 | 0.9991 | 1.1681 | 1.2864 | 1.3461 | 1.4776 | 1.831 | 2.2005 | 2.5375 |
| u83 | 0.9707 | 0.8543 | 0.8104 | 0.8467 | 1.0024 | 0.9914 | 0.999 | 1.1695 | 1.2865 | 1.3506 | 1.4764 | 1.828 | 2.2002 | 2.5372 |
| u84 | 0.9721 | 0.8543 | 0.8102 | 0.8467 | 1.002 | 0.9915 | 0.9988 | 1.1704 | 1.249 | 1.3252 | 1.4668 | 1.8176 | 2.1969 | 2.5383 |
| u85 | 0.9728 | 0.8548 | 0.8106 | 0.8471 | 1.0015 | 0.9917 | 0.9987 | 1.1685 | 1.2486 | 1.3196 | 1.4681 | 1.8205 | 2.1971 | 2.5385 |
| u86 | 0.9741 | 0.8555 | 0.8112 | 0.8476 | 1.0011 | 0.9919 | 0.9986 | 1.1676 | 1.2633 | 1.3294 | 1.4752 | 1.822 | 2.198 | 2.5376 |
| u87 | 0.9753 | 0.856 | 0.8114 | 0.8479 | 1.0005 | 0.9922 | 0.9985 | 1.1689 | 1.2634 | 1.3341 | 1.474 | 1.819 | 2.1978 | 2.5373 |
| u88 | 0.9772 | 0.8586 | 0.8133 | 0.8492 | 1.0002 | 0.9929 | 0.9984 | 1.1157 | 1.2016 | 1.3715 | 1.4985 | 1.8345 | 2.2069 | 2.5389 |
| u89 | 0.9786 | 0.859 | 0.8135 | 0.8496 | 0.9996 | 0.9931 | 0.9984 | 1.1139 | 1.2012 | 1.3662 | 1.4998 | 1.8375 | 2.2071 | 2.5391 |
| u90 | 0.9799 | 0.8594 | 0.8138 | 0.8499 | 0.9991 | 0.9933 | 0.9983 | 1.1146 | 1.1864 | 1.3558 | 1.4927 | 1.8359 | 2.2061 | 2.5399 |
| u91 | 0.9808 | 0.86 | 0.8141 | 0.8501 | 0.9987 | 0.9935 | 0.9982 | 1.1159 | 1.1864 | 1.3605 | 1.4914 | 1.8329 | 2.2059 | 2.5396 |
| u92 | 0.9819 | 0.8608 | 0.8147 | 0.8507 | 0.9984 | 0.9939 | 0.9982 | 1.1145 | 1.2226 | 1.3855 | 1.5009 | 1.8433 | 2.2092 | 2.5384 |
| u93 | 0.9829 | 0.8615 | 0.8151 | 0.851 | 0.998 | 0.9942 | 0.9981 | 1.1126 | 1.2223 | 1.3803 | 1.5021 | 1.8463 | 2.2095 | 2.5386 |
| u94 | 0.9844 | 0.8619 | 0.8155 | 0.8514 | 0.9973 | 0.9944 | 0.9981 | 1.1116 | 1.2367 | 1.3903 | 1.5092 | 1.8478 | 2.2104 | 2.5377 |
| u95 | 0.9854 | 0.8625 | 0.8159 | 0.8518 | 0.9969 | 0.9946 | 0.998 | 1.1129 | 1.2367 | 1.3952 | 1.5079 | 1.8448 | 2.2102 | 2.5374 |
| u96 | 0.9694 | 0.8911 | 0.8434 | 0.8758 | 1.0064 | 0.9966 | 1.0017 | 1.0786 | 1.1574 | 1.2454 | 1.3448 | 1.8091 | 2.2111 | 2.5636 |
| u97 | 0.9696 | 0.8915 | 0.8435 | 0.8759 | 1.0063 | 0.9967 | 1.0016 | 1.0766 | 1.1571 | 1.2407 | 1.3458 | 1.812 | 2.2112 | 2.5638 |
| u98 | 0.9701 | 0.8914 | 0.8434 | 0.876 | 1.0062 | 0.9967 | 1.0015 | 1.077 | 1.1429 | 1.231 | 1.3391 | 1.8106 | 2.2102 | 2.5645 |
| u99 | 0.9707 | 0.8917 | 0.8435 | 0.8761 | 1.006 | 0.9967 | 1.0014 | 1.0784 | 1.1431 | 1.2358 | 1.3379 | 1.8078 | 2.21 | 2.5642 |
| u100 | 0.9709 | 0.8915 | 0.8432 | 0.8759 | 1.0058 | 0.9967 | 1.0013 | 1.0781 | 1.1081 | 1.2119 | 1.3289 | 1.7981 | 2.2065 | 2.5652 |
| u101 | 0.9714 | 0.8917 | 0.8433 | 0.8761 | 1.0056 | 0.9968 | 1.0012 | 1.0763 | 1.1078 | 1.2073 | 1.3299 | 1.8009 | 2.2067 | 2.5654 |
| u102 | 0.9718 | 0.8921 | 0.8435 | 0.8763 | 1.0055 | 0.9968 | 1.0012 | 1.0751 | 1.1215 | 1.217 | 1.3363 | 1.8023 | 2.2075 | 2.5645 |
| u103 | 0.9724 | 0.8923 | 0.8437 | 0.8764 | 1.0054 | 0.9969 | 1.0011 | 1.0766 | 1.1216 | 1.2219 | 1.3351 | 1.7995 | 2.2072 | 2.5642 |
| u104 | 0.9721 | 0.8904 | 0.8423 | 0.8755 | 1.0047 | 0.9968 | 1.0011 | 1.126 | 1.1789 | 1.1859 | 1.311 | 1.7851 | 2.1982 | 2.5625 |
| u105 | 0.9726 | 0.8906 | 0.8424 | 0.8757 | 1.0047 | 0.9968 | 1.0011 | 1.1242 | 1.1786 | 1.1812 | 1.3119 | 1.7878 | 2.1983 | 2.5627 |
| u106 | 0.9729 | 0.8907 | 0.8423 | 0.8757 | 1.0045 | 0.9969 | 1.0011 | 1.1248 | 1.1641 | 1.1717 | 1.3054 | 1.7865 | 2.1973 | 2.5634 |
| u107 | 0.9735 | 0.8909 | 0.8424 | 0.8758 | 1.0043 | 0.9969 | 1.001 | 1.1264 | 1.1642 | 1.1765 | 1.3041 | 1.7838 | 2.197 | 2.5631 |
| u108 | 0.9739 | 0.8917 | 0.8429 | 0.8762 | 1.0044 | 0.997 | 1.0008 | 1.1258 | 1.2003 | 1.2005 | 1.313 | 1.7935 | 2.2002 | 2.5621 |
| u109 | 0.9743 | 0.8919 | 0.843 | 0.8763 | 1.0043 | 0.9971 | 1.0008 | 1.124 | 1.2 | 1.1958 | 1.314 | 1.7963 | 2.2003 | 2.5623 |
| u110 | 0.9748 | 0.8923 | 0.8432 | 0.8764 | 1.0042 | 0.9971 | 1.0007 | 1.123 | 1.2145 | 1.2057 | 1.3204 | 1.7977 | 2.2011 | 2.5615 |
| u111 | 0.9753 | 0.8924 | 0.8433 | 0.8766 | 1.0041 | 0.9972 | 1.0007 | 1.1244 | 1.2146 | 1.2105 | 1.3192 | 1.795 | 2.2007 | 2.5612 |
| u112 | 0.9785 | 0.9026 | 0.8506 | 0.8818 | 1.0069 | 0.9975 | 1 | 1.0788 | 1.1336 | 1.0874 | 1.3348 | 1.7774 | 2.2054 | 2.5719 |
| u113 | 0.979 | 0.9028 | 0.8506 | 0.8819 | 1.0069 | 0.9975 | 1 | 1.0771 | 1.1333 | 1.083 | 1.3358 | 1.7802 | 2.2054 | 2.5721 |
| u114 | 0.9791 | 0.9028 | 0.8505 | 0.8819 | 1.0069 | 0.9975 | 0.9999 | 1.0777 | 1.1194 | 1.0743 | 1.3292 | 1.7789 | 2.2043 | 2.5728 |
| u115 | 0.9794 | 0.903 | 0.8506 | 0.882 | 1.0068 | 0.9975 | 0.9998 | 1.0792 | 1.1196 | 1.0785 | 1.3281 | 1.7764 | 2.2039 | 2.5725 |
| u116 | 0.9797 | 0.9026 | 0.8502 | 0.8817 | 1.0067 | 0.9975 | 0.9998 | 1.0794 | 1.0852 | 1.057 | 1.3192 | 1.7672 | 2.2006 | 2.5733 |
| u117 | 0.98 | 0.9029 | 0.8502 | 0.8819 | 1.0066 | 0.9975 | 0.9998 | 1.0776 | 1.085 | 1.0527 | 1.3202 | 1.77 | 2.2007 | 2.5735 |

-continued

| | | | | | | | | | | | | | | |
|---|---|---|---|---|---|---|---|---|---|---|---|---|---|---|
| u118 | 0.9802 | 0.9032 | 0.8504 | 0.882 | 1.0067 | 0.9975 | 0.9998 | 1.0766 | 1.0985 | 1.0613 | 1.3266 | 1.7714 | 2.2014 | 2.5727 |
| u119 | 0.9805 | 0.9034 | 0.8505 | 0.882 | 1.0066 | 0.9975 | 0.9997 | 1.0782 | 1.0987 | 1.0653 | 1.3255 | 1.7689 | 2.201 | 2.5724 |
| u120 | 0.9812 | 0.9057 | 0.8519 | 0.883 | 1.0073 | 0.9974 | 0.9995 | 1.0278 | 1.0461 | 1.0986 | 1.3492 | 1.7829 | 2.2093 | 2.574 |
| u121 | 0.9817 | 0.9059 | 0.852 | 0.8831 | 1.0074 | 0.9974 | 0.9994 | 1.0262 | 1.0459 | 1.0943 | 1.3502 | 1.7857 | 2.2093 | 2.5742 |
| u122 | 0.9818 | 0.9058 | 0.8518 | 0.883 | 1.0074 | 0.9974 | 0.9993 | 1.0267 | 1.0331 | 1.0854 | 1.3437 | 1.7844 | 2.2082 | 2.5749 |
| u123 | 0.982 | 0.906 | 0.8519 | 0.883 | 1.0073 | 0.9973 | 0.9993 | 1.0282 | 1.0332 | 1.0896 | 1.3425 | 1.7819 | 2.2079 | 2.5746 |
| u124 | 0.9823 | 0.9067 | 0.8523 | 0.8833 | 1.0075 | 0.9973 | 0.9991 | 1.0282 | 1.0658 | 1.1117 | 1.3513 | 1.7914 | 2.2109 | 2.5736 |
| u125 | 0.9826 | 0.9068 | 0.8523 | 0.8834 | 1.0076 | 0.9972 | 0.9991 | 1.0265 | 1.0656 | 1.1073 | 1.3524 | 1.7942 | 2.211 | 2.5738 |
| u126 | 0.9828 | 0.9071 | 0.8524 | 0.8834 | 1.0077 | 0.9972 | 0.999 | 1.0788 | 1.1162 | 1.3588 | 1.7956 | 2.2116 | 2.573 |  |
| u127 | 0.9831 | 0.9073 | 0.8525 | 0.8834 | 1.0077 | 0.9971 | 0.9989 | 1.0271 | 1.079 | 1.1206 | 1.3577 | 1.7931 | 2.2112 | 2.5727 |
| u128 | 0.9756 | 0.8808 | 1.3017 | 1.8444 | 2.8725 | 3.3532 | 3.6746 | 4.2319 | 4.1112 | 3.9432 | 3.6724 | 3.9399 | 4.3558 | 4.686 |
| u129 | 0.9757 | 0.8809 | 1.3017 | 1.8447 | 2.8733 | 3.3528 | 3.6745 | 4.2775 | 4.1131 | 3.9693 | 3.6742 | 3.9449 | 4.3544 | 4.6854 |
| u130 | 0.9758 | 0.8809 | 1.3015 | 1.8444 | 2.874 | 3.3524 | 3.6745 | 4.2579 | 4.2341 | 4.026 | 3.684 | 3.9415 | 4.3493 | 4.6802 |
| u131 | 0.9758 | 0.8809 | 1.3016 | 1.8445 | 2.8748 | 3.3523 | 3.6745 | 4.22 | 4.232 | 3.9977 | 3.6824 | 3.937 | 4.3523 | 4.6794 |
| u132 | 0.9757 | 0.8806 | 1.3008 | 1.8436 | 2.8746 | 3.3508 | 3.6742 | 4.3134 | 4.6448 | 4.1662 | 3.7017 | 3.9349 | 4.3357 | 4.6658 |
| u133 | 0.9757 | 0.8807 | 1.3009 | 1.8439 | 2.8754 | 3.3506 | 3.6742 | 4.3572 | 4.6481 | 4.2022 | 3.7035 | 3.94 | 4.3343 | 4.6649 |
| u134 | 0.9757 | 0.8809 | 1.3015 | 1.8444 | 2.8767 | 3.3506 | 3.6743 | 4.4836 | 4.4679 | 4.1318 | 3.6933 | 3.944 | 4.3414 | 4.6687 |
| u135 | 0.9758 | 0.881 | 1.3016 | 1.8444 | 2.8776 | 3.3506 | 3.6743 | 4.3461 | 4.4653 | 4.0993 | 3.6917 | 3.9392 | 4.3442 | 4.6675 |
| u136 | 0.9752 | 0.879 | 1.2986 | 1.841 | 2.8735 | 3.3447 | 3.6734 | 3.854 | 4.1292 | 4.4207 | 3.7812 | 3.9556 | 4.3214 | 4.6541 |
| u137 | 0.9752 | 0.8791 | 1.2987 | 1.8412 | 2.8745 | 3.3444 | 3.6734 | 3.876 | 4.1308 | 4.462 | 3.7826 | 3.9608 | 4.3194 | 4.6534 |
| u138 | 0.975 | 0.879 | 1.2985 | 1.841 | 2.8752 | 3.344 | 3.6733 | 3.8631 | 4.2298 | 4.5456 | 3.7964 | 3.9569 | 4.3128 | 4.6483 |
| u139 | 0.975 | 0.8791 | 1.2987 | 1.8411 | 2.8761 | 3.344 | 3.6733 | 3.8404 | 4.228 | 4.5024 | 3.795 | 3.9516 | 4.3149 | 4.6474 |
| u140 | 0.9751 | 0.8796 | 1.2996 | 1.8422 | 2.8781 | 3.345 | 3.6736 | 3.7681 | 3.9867 | 4.3011 | 3.7699 | 3.9548 | 4.3325 | 4.6596 |
| u141 | 0.9751 | 0.8798 | 1.2998 | 1.8425 | 2.8791 | 3.3448 | 3.6736 | 3.7892 | 3.988 | 4.3395 | 3.7713 | 3.96 | 4.3305 | 4.6591 |
| u142 | 0.975 | 0.88 | 1.3003 | 1.8429 | 2.88 | 3.3449 | 3.6736 | 3.8007 | 3.9117 | 4.2646 | 3.7585 | 3.9641 | 4.3372 | 4.663 |
| u143 | 0.9749 | 0.8801 | 1.3004 | 1.843 | 2.8812 | 3.3448 | 3.6737 | 3.7784 | 3.9105 | 4.2291 | 3.757 | 3.9589 | 4.3394 | 4.6621 |
| u144 | 0.9705 | 0.8702 | 1.2859 | 1.8261 | 2.8536 | 3.3242 | 3.6705 | 3.5727 | 3.7017 | 3.8676 | 3.9123 | 4.0804 | 4.4853 | 4.7149 |
| u145 | 0.9703 | 0.8703 | 1.2861 | 1.8264 | 2.8544 | 3.3239 | 3.6704 | 3.5878 | 3.7023 | 3.8844 | 3.913 | 4.0851 | 4.483 | 4.715 |
| u146 | 0.9699 | 0.8702 | 1.2859 | 1.8262 | 2.8548 | 3.3235 | 3.6703 | 3.5797 | 3.7505 | 3.9198 | 3.93 | 4.0812 | 4.4762 | 4.7102 |
| u147 | 0.9697 | 0.8702 | 1.286 | 1.8263 | 2.8558 | 3.3234 | 3.6704 | 3.5648 | 3.7496 | 3.9015 | 3.9293 | 4.0764 | 4.4788 | 4.7102 |
| u148 | 0.9692 | 0.8698 | 1.2853 | 1.8254 | 2.8554 | 3.322 | 3.67 | 3.6212 | 3.903 | 4.0007 | 3.9609 | 4.0759 | 4.4619 | 4.6971 |
| u149 | 0.9689 | 0.8698 | 1.2855 | 1.8257 | 2.8561 | 3.3217 | 3.67 | 3.6367 | 3.9043 | 4.0206 | 3.9614 | 4.0808 | 4.4596 | 4.6973 |
| u150 | 0.9687 | 0.87 | 1.2859 | 1.8262 | 2.8571 | 3.3218 | 3.67 | 3.6452 | 3.8438 | 3.9803 | 3.9427 | 4.0847 | 4.4669 | 4.7021 |
| u151 | 0.9684 | 0.8701 | 1.2862 | 1.8262 | 2.8578 | 3.3218 | 3.67 | 3.6295 | 3.8431 | 3.9605 | 3.9422 | 4.0797 | 4.4695 | 4.7021 |
| u152 | 0.9691 | 0.8723 | 1.2893 | 1.8298 | 2.8634 | 3.3273 | 3.6712 | 3.8836 | 3.9958 | 3.7909 | 3.8355 | 4.0579 | 4.4795 | 4.7184 |
| u153 | 0.9688 | 0.8723 | 1.2894 | 1.8301 | 2.8644 | 3.327 | 3.6711 | 3.9072 | 3.9979 | 3.8062 | 3.8366 | 4.0627 | 4.4771 | 4.7185 |
| u154 | 0.9683 | 0.8722 | 1.2892 | 1.8299 | 2.8651 | 3.3267 | 3.671 | 3.894 | 4.0858 | 3.8389 | 3.8507 | 4.0589 | 4.4702 | 4.7137 |
| u155 | 0.968 | 0.8722 | 1.2894 | 1.8299 | 2.8656 | 3.3267 | 3.671 | 3.8706 | 4.0849 | 3.8218 | 3.8494 | 4.0541 | 4.4728 | 4.7137 |
| u156 | 0.9681 | 0.8728 | 1.2904 | 1.831 | 2.8674 | 3.3278 | 3.6713 | 3.7929 | 3.8716 | 3.7359 | 3.8247 | 4.0555 | 4.4893 | 4.7272 |
| u157 | 0.9676 | 0.8728 | 1.2905 | 1.8312 | 2.8685 | 3.3276 | 3.6713 | 3.8145 | 3.8732 | 3.7502 | 3.8258 | 4.0603 | 4.4869 | 4.7272 |
| u158 | 0.9676 | 0.873 | 1.291 | 1.8317 | 2.8693 | 3.3277 | 3.6714 | 3.8267 | 3.8076 | 3.7206 | 3.8127 | 4.0641 | 4.4939 | 4.7322 |
| u159 | 0.9672 | 0.873 | 1.2912 | 1.8318 | 2.87 | 3.3278 | 3.6713 | 3.8042 | 3.8069 | 3.7063 | 3.8114 | 4.0594 | 4.4965 | 4.7321 |
| u160 | 0.9727 | 0.8451 | 1.2226 | 1.7395 | 2.8107 | 3.2735 | 3.6744 | 3.5924 | 3.6574 | 3.537 | 3.7404 | 4.1904 | 4.6892 | 5.1275 |
| u161 | 0.9718 | 0.845 | 1.2227 | 1.7398 | 2.8113 | 3.2734 | 3.6743 | 3.6072 | 3.6579 | 3.5589 | 3.741 | 4.1941 | 4.6865 | 5.1268 |
| u162 | 0.9707 | 0.8447 | 1.2227 | 1.7397 | 2.8118 | 3.2731 | 3.674 | 3.5983 | 3.7031 | 3.5843 | 3.7505 | 4.1911 | 4.6797 | 5.1194 |
| u163 | 0.9695 | 0.8446 | 1.2228 | 1.7398 | 2.8122 | 3.2732 | 3.6739 | 3.5825 | 3.7017 | 3.5955 | 3.7495 | 4.1876 | 4.6827 | 5.12 |
| u164 | 0.9681 | 0.844 | 1.2222 | 1.7391 | 2.8119 | 3.2719 | 3.6734 | 3.6386 | 3.8422 | 3.6134 | 3.7683 | 4.1906 | 4.6669 | 5.1022 |
| u165 | 0.9672 | 0.8438 | 1.2225 | 1.7394 | 2.8124 | 3.2718 | 3.6733 | 3.6537 | 3.8425 | 3.6259 | 3.7692 | 4.1945 | 4.6642 | 5.1016 |
| u166 | 0.9663 | 0.8439 | 1.223 | 1.7398 | 2.8132 | 3.272 | 3.6733 | 3.6616 | 3.7867 | 3.6118 | 3.7599 | 4.1979 | 4.6713 | 5.1088 |
| u167 | 0.9654 | 0.8438 | 1.2232 | 1.7399 | 2.8137 | 3.2721 | 3.6732 | 3.6453 | 3.7849 | 3.6075 | 3.7589 | 4.1941 | 4.6744 | 5.1094 |
| u168 | 0.9625 | 0.8415 | 1.2207 | 1.737 | 2.8096 | 3.2668 | 3.6714 | 3.5033 | 3.6841 | 3.7328 | 3.8276 | 4.222 | 4.6693 | 5.0925 |
| u169 | 0.9619 | 0.8414 | 1.2209 | 1.7373 | 2.8101 | 3.2667 | 3.6712 | 3.5032 | 3.6846 | 3.7442 | 3.8283 | 4.2259 | 4.6664 | 5.0919 |
| u170 | 0.9603 | 0.841 | 1.2208 | 1.7372 | 2.8104 | 3.2665 | 3.671 | 3.4823 | 3.7277 | 3.7691 | 3.8393 | 4.2224 | 4.6593 | 5.0845 |
| u171 | 0.9596 | 0.8409 | 1.221 | 1.7373 | 2.8108 | 3.2666 | 3.6709 | 3.4601 | 3.7263 | 3.7556 | 3.8386 | 4.2184 | 4.6623 | 5.085 |
| u172 | 0.9589 | 0.8413 | 1.2221 | 1.7383 | 2.8126 | 3.2678 | 3.6712 | 3.495 | 3.6148 | 3.6824 | 3.8182 | 4.2152 | 4.6787 | 5.1031 |
| u173 | 0.9578 | 0.8412 | 1.2222 | 1.7385 | 2.8131 | 3.2677 | 3.6711 | 3.493 | 3.6153 | 3.6948 | 3.8189 | 4.2191 | 4.6759 | 5.1025 |
| u174 | 0.957 | 0.8412 | 1.2228 | 1.739 | 2.8138 | 3.268 | 3.6711 | 3.3876 | 3.5805 | 3.6706 | 3.8085 | 4.2226 | 4.6832 | 5.1099 |
| u175 | 0.9556 | 0.841 | 1.2229 | 1.7392 | 2.8142 | 3.2681 | 3.671 | 3.3623 | 3.5802 | 3.6585 | 3.8076 | 4.2186 | 4.6863 | 5.1105 |
| u176 | 0.9631 | 0.851 | 1.2363 | 1.7547 | 2.8429 | 3.2876 | 3.6765 | 3.5774 | 3.7135 | 3.8241 | 3.6999 | 4.0963 | 4.5241 | 5.0255 |
| u177 | 0.9621 | 0.8509 | 1.2364 | 1.7549 | 2.8433 | 3.2875 | 3.6763 | 3.5919 | 3.7142 | 3.8394 | 3.7007 | 4.1008 | 4.5217 | 5.025 |
| u178 | 0.9609 | 0.8506 | 1.2363 | 1.7548 | 2.8437 | 3.2872 | 3.6761 | 3.5841 | 3.766 | 3.8729 | 3.7093 | 4.0972 | 4.5148 | 5.0184 |
| u179 | 0.9601 | 0.8505 | 1.2365 | 1.7548 | 2.8443 | 3.2873 | 3.6761 | 3.5699 | 3.7649 | 3.8551 | 3.708 | 4.0927 | 4.5175 | 5.0187 |
| u180 | 0.9585 | 0.8499 | 1.236 | 1.7542 | 2.8435 | 3.2861 | 3.6755 | 3.6241 | 3.9263 | 3.9567 | 3.725 | 4.0931 | 4.5009 | 5.0022 |
| u181 | 0.9574 | 0.8497 | 1.236 | 1.7544 | 2.8442 | 3.286 | 3.6754 | 3.6389 | 3.9272 | 3.9768 | 3.7259 | 4.0978 | 4.4985 | 5.0017 |
| u182 | 0.9566 | 0.8498 | 1.2366 | 1.7549 | 2.8449 | 3.2862 | 3.6754 | 3.6472 | 3.8634 | 3.9368 | 3.7168 | 4.1015 | 4.5058 | 5.0082 |
| u183 | 0.9556 | 0.8497 | 1.2368 | 1.755 | 2.8455 | 3.2863 | 3.6754 | 3.6322 | 3.8621 | 3.9175 | 3.7152 | 4.0969 | 4.5084 | 5.0084 |
| u184 | 0.9566 | 0.8518 | 1.2398 | 1.7583 | 2.8508 | 3.2917 | 3.6769 | 3.8911 | 4.0272 | 3.7501 | 3.6486 | 4.0746 | 4.517 | 5.0256 |
| u185 | 0.9555 | 0.8517 | 1.2399 | 1.7585 | 2.8515 | 3.2915 | 3.6768 | 3.9152 | 4.0282 | 3.7628 | 3.6507 | 4.0795 | 4.5146 | 5.0251 |
| u186 | 0.9545 | 0.8514 | 1.2398 | 1.7584 | 2.8517 | 3.2913 | 3.6766 | 3.9028 | 4.1171 | 3.791 | 3.66 | 4.0762 | 4.5077 | 5.0186 |
| u187 | 0.9533 | 0.8512 | 1.2399 | 1.7585 | 2.8521 | 3.2914 | 3.6765 | 3.8799 | 4.1151 | 3.7732 | 3.6593 | 4.0718 | 4.5102 | 5.0189 |
| u188 | 0.9529 | 0.8517 | 1.241 | 1.7596 | 2.8539 | 3.2926 | 3.6769 | 3.8042 | 3.8951 | 3.6937 | 3.6446 | 4.073 | 4.526 | 5.0351 |
| u189 | 0.9518 | 0.8516 | 1.2411 | 1.7598 | 2.8544 | 3.2925 | 3.6768 | 3.8271 | 3.8959 | 3.7051 | 3.6497 | 4.0785 | 4.5236 | 5.0346 |
| u190 | 0.9511 | 0.8516 | 1.2417 | 1.7602 | 2.8551 | 3.2927 | 3.6768 | 3.84 | 3.8271 | 3.6773 | 3.6475 | 4.0827 | 4.5304 | 5.0411 |
| u191 | 0.9498 | 0.8515 | 1.2419 | 1.7603 | 2.8557 | 3.2928 | 3.6768 | 3.8176 | 3.8257 | 3.6637 | 3.6496 | 4.0785 | 4.5329 | 5.0414 |
| u192 | 0.9599 | 0.9365 | 1.5261 | 2.1608 | 2.8194 | 3.2752 | 3.6692 | 4.2207 | 4.1617 | 3.9567 | 4.2832 | 5.8734 | 6.7254 | 7.181 |
| u193 | 0.9612 | 0.9367 | 1.5259 | 2.1609 | 2.8198 | 3.2751 | 3.6694 | 4.2544 | 4.1633 | 3.9828 | 4.28 | 5.8249 | 6.7257 | 7.1719 |
| u194 | 0.962 | 0.9367 | 1.5252 | 2.1604 | 2.8199 | 3.2749 | 3.6694 | 4.2233 | 4.3069 | 4.0392 | 4.3175 | 5.8498 | 6.7634 | 7.172 |
| u195 | 0.9633 | 0.9369 | 1.525 | 2.1602 | 2.8203 | 3.2751 | 3.6696 | 4.1729 | 4.3036 | 4.0108 | 4.3214 | 5.9001 | 6.7619 | 7.1812 |
| u196 | 0.9642 | 0.9365 | 1.5237 | 2.1588 | 2.8195 | 3.274 | 3.6692 | 4.2584 | 4.7636 | 4.1704 | 4.3861 | 6.0852 | 6.9137 | 7.221 |

|      |        |        |        |        |        |        |        |        |        |        |        |        |        |         |
|------|--------|--------|--------|--------|--------|--------|--------|--------|--------|--------|--------|--------|--------|---------|
| u197 | 0.9651 | 0.9367 | 1.5235 | 2.1588 | 2.8198 | 3.2739 | 3.6693 | 4.2969 | 4.7663 | 4.2075 | 4.3809 | 6.0189 | 6.9188 | 7.2109  |
| u198 | 0.9662 | 0.9371 | 1.5238 | 2.1592 | 2.8205 | 3.2741 | 3.6696 | 4.3131 | 4.5676 | 4.1363 | 4.3387 | 5.9859 | 6.8645 | 7.2101  |
| u199 | 0.967  | 0.9373 | 1.5236 | 2.1589 | 2.821  | 3.2742 | 3.6698 | 4.2582 | 4.5637 | 4.1035 | 4.343  | 6.0456 | 6.8609 | 7.2199  |
| u200 | 0.9673 | 0.935  | 1.5195 | 2.1542 | 2.8167 | 3.2695 | 3.668  | 3.8388 | 4.1515 | 4.4132 | 4.5413 | 6.2669 | 7.1707 | 7.3957  |
| u201 | 0.9684 | 0.9353 | 1.5193 | 2.1543 | 2.8171 | 3.2694 | 3.6681 | 3.8626 | 4.1534 | 4.4548 | 4.5323 | 6.1999 | 7.182  | 7.384   |
| u202 | 0.9694 | 0.9352 | 1.5186 | 2.1538 | 2.8173 | 3.2691 | 3.6681 | 3.8517 | 4.258  | 4.5377 | 4.5873 | 6.2389 | 7.2494 | 7.3894  |
| u203 | 0.9703 | 0.9354 | 1.5185 | 2.1536 | 2.8177 | 3.2692 | 3.6684 | 3.8311 | 4.2562 | 4.4945 | 4.5983 | 6.3101 | 7.2353 | 7.4014  |
| u204 | 0.9716 | 0.9362 | 1.5194 | 2.1548 | 2.8193 | 3.2703 | 3.669  | 3.7612 | 4.0018 | 4.3009 | 4.517  | 6.1256 | 7.0572 | 7.3425  |
| u205 | 0.9721 | 0.9363 | 1.5192 | 2.1548 | 2.8198 | 3.2701 | 3.6692 | 3.7829 | 4.0035 | 4.3392 | 4.5086 | 6.0645 | 7.0651 | 7.3316  |
| u206 | 0.973  | 0.9367 | 1.5195 | 2.1552 | 2.8203 | 3.2703 | 3.6695 | 3.7956 | 3.924  | 4.2659 | 4.46   | 6.0329 | 7.0115 | 7.3279  |
| u207 | 0.9741 | 0.9369 | 1.5195 | 2.155  | 2.8207 | 3.2704 | 3.6697 | 3.7758 | 3.923  | 4.2311 | 4.4671 | 6.0899 | 7.0049 | 7.3385  |
| u208 | 0.9713 | 0.926  | 1.5012 | 2.1331 | 2.7954 | 3.253  | 3.6636 | 3.5613 | 3.7215 | 3.8649 | 4.6033 | 5.8218 | 6.7539 | 7.4662  |
| u209 | 0.9722 | 0.9262 | 1.501  | 2.1332 | 2.7959 | 3.2528 | 3.6638 | 3.5754 | 3.7224 | 3.8821 | 4.5949 | 5.7926 | 6.7556 | 7.4576  |
| u210 | 0.9725 | 0.9262 | 1.5004 | 2.1327 | 2.7962 | 3.2525 | 3.664  | 3.5677 | 3.7751 | 3.918  | 4.6365 | 5.8078 | 6.7824 | 7.4632  |
| u211 | 0.9734 | 0.9264 | 1.5003 | 2.1326 | 2.7968 | 3.2524 | 3.6642 | 3.5539 | 3.7741 | 3.9002 | 4.6454 | 5.8376 | 6.7806 | 7.4718  |
| u212 | 0.974  | 0.926  | 1.4991 | 2.1313 | 2.7963 | 3.2511 | 3.664  | 3.606  | 3.9393 | 4.0011 | 4.7092 | 5.9431 | 6.8739 | 7.528   |
| u213 | 0.9744 | 0.9262 | 1.4989 | 2.1314 | 2.7966 | 3.2509 | 3.6642 | 3.6207 | 3.9401 | 4.0219 | 4.6984 | 5.9089 | 6.877  | 7.5188  |
| u214 | 0.9754 | 0.9266 | 1.4992 | 2.1318 | 2.7975 | 3.2509 | 3.6646 | 3.6289 | 3.8746 | 3.982  | 4.6539 | 5.8907 | 6.8465 | 7.5114  |
| u215 | 0.976  | 0.9268 | 1.4992 | 2.1316 | 2.798  | 3.2509 | 3.6649 | 3.6141 | 3.8734 | 3.9628 | 4.6631 | 5.9234 | 6.8439 | 7.5202  |
| u216 | 0.9778 | 0.9293 | 1.5028 | 2.136  | 2.8028 | 3.2557 | 3.6669 | 3.8669 | 4.0453 | 3.7879 | 4.5093 | 5.7803 | 6.657  | 7.3639  |
| u217 | 0.9786 | 0.9295 | 1.5026 | 2.1361 | 2.8032 | 3.2554 | 3.6671 | 3.8914 | 4.0462 | 3.8036 | 4.502  | 5.75   | 6.6576 | 7.3555  |
| u218 | 0.9791 | 0.9295 | 1.502  | 2.1356 | 2.8037 | 3.2551 | 3.6672 | 3.8792 | 4.1387 | 3.8366 | 4.543  | 5.7658 | 6.6824 | 7.359   |
| u219 | 0.9796 | 0.9298 | 1.5019 | 2.1354 | 2.8041 | 3.2551 | 3.6676 | 3.8568 | 4.1366 | 3.82   | 4.5504 | 5.7972 | 6.6817 | 7.3676  |
| u220 | 0.9807 | 0.9305 | 1.5029 | 2.1366 | 2.8055 | 3.2561 | 3.6682 | 3.7824 | 3.9081 | 3.7356 | 4.488  | 5.6939 | 6.6005 | 7.3248  |
| u221 | 0.9815 | 0.9306 | 1.5027 | 2.1367 | 2.8061 | 3.2559 | 3.6684 | 3.8054 | 3.9089 | 3.75   | 4.4812 | 5.667  | 6.6006 | 7.3169  |
| u222 | 0.9821 | 0.9311 | 1.5031 | 2.1371 | 2.8067 | 3.256  | 3.6687 | 3.8188 | 3.8382 | 3.7206 | 4.4427 | 5.6537 | 6.5793 | 7.3154  |
| u223 | 0.9828 | 0.9312 | 1.5029 | 2.1369 | 2.8074 | 3.2559 | 3.6691 | 3.7971 | 3.8367 | 3.7063 | 4.448  | 5.6795 | 6.5795 | 7.3238  |
| u224 | 0.9705 | 0.9702 | 1.5985 | 2.2713 | 2.8549 | 3.3009 | 3.6708 | 4.172  | 4.1343 | 4.0248 | 5.5914 | 6.101  | 6.9114 | 8.2969  |
| u225 | 0.9717 | 0.9703 | 1.5983 | 2.2713 | 2.8546 | 3.3011 | 3.6707 | 4.2194 | 4.1364 | 4.0513 | 5.5275 | 6.032  | 6.916  | 8.2922  |
| u226 | 0.9722 | 0.9702 | 1.5974 | 2.2706 | 2.8541 | 3.3014 | 3.6704 | 4.2088 | 4.2763 | 4.1109 | 5.6694 | 6.0701 | 6.9707 | 8.3658  |
| u227 | 0.9736 | 0.9704 | 1.5971 | 2.2703 | 2.8538 | 3.3021 | 3.6703 | 4.178  | 4.2739 | 4.0787 | 5.7432 | 6.1456 | 6.9643 | 8.3671  |
| u228 | 0.9745 | 0.97   | 1.5958 | 2.2687 | 2.8528 | 3.3014 | 3.6696 | 4.2689 | 4.723  | 4.2546 | 5.8813 | 6.3811 | 7.1671 | 8.6238  |
| u229 | 0.9753 | 0.9701 | 1.5954 | 2.2687 | 2.8525 | 3.3017 | 3.6695 | 4.3183 | 4.7268 | 4.2965 | 5.8078 | 6.2853 | 7.1808 | 8.6339  |
| u230 | 0.9766 | 0.9705 | 1.5957 | 2.2689 | 2.8523 | 3.3022 | 3.6695 | 4.3476 | 4.5332 | 4.2139 | 5.6761 | 6.2349 | 7.1028 | 8.5283  |
| u231 | 0.9775 | 0.9706 | 1.5954 | 2.2687 | 2.852  | 3.3028 | 3.6694 | 4.3144 | 4.5305 | 4.1749 | 5.7451 | 6.3221 | 7.0922 | 8.524   |
| u232 | 0.9778 | 0.9681 | 1.5911 | 2.2635 | 2.8482 | 3.2981 | 3.6674 | 3.8396 | 4.1387 | 4.5185 | 5.7322 | 6.5017 | 7.3989 | 8.7422  |
| u233 | 0.9784 | 0.9684 | 1.5909 | 2.2635 | 2.8479 | 3.2985 | 3.6673 | 3.8616 | 4.1401 | 4.5626 | 5.6855 | 6.4242 | 7.4189 | 8.7546  |
| u234 | 0.9794 | 0.9683 | 1.5901 | 2.2629 | 2.8475 | 3.2986 | 3.667  | 3.848  | 4.2429 | 4.6475 | 5.772  | 6.4724 | 7.4985 | 8.8406  |
| u235 | 0.9805 | 0.9684 | 1.5899 | 2.2626 | 2.8474 | 3.2991 | 3.667  | 3.8249 | 4.2408 | 4.6029 | 5.8199 | 6.5545 | 7.4746 | 8.8241  |
| u236 | 0.9818 | 0.9692 | 1.5908 | 2.2638 | 2.8479 | 3.3008 | 3.6673 | 3.7512 | 3.9894 | 4.3991 | 5.7285 | 6.3652 | 7.2801 | 8.629   |
| u237 | 0.9826 | 0.9694 | 1.5904 | 2.2637 | 2.8475 | 3.3011 | 3.6672 | 3.772  | 3.9904 | 4.4404 | 5.6799 | 6.2882 | 7.296  | 8.6372  |
| u238 | 0.9841 | 0.9697 | 1.5907 | 2.264  | 2.8475 | 3.3016 | 3.6672 | 3.7835 | 3.9117 | 4.3615 | 5.5867 | 6.246  | 7.2283 | 8.5649  |
| u239 | 0.9851 | 0.9699 | 1.5904 | 2.2637 | 2.8472 | 3.3022 | 3.6672 | 3.7608 | 3.9102 | 4.3232 | 5.6331 | 6.3178 | 7.215  | 8.5601  |
| u240 | 0.9922 | 0.9821 | 1.6086 | 2.287  | 2.8663 | 3.322  | 3.6733 | 4.1545 | 4.3073 | 6.2088 | 6.6481 | 7.6994 | 8.5134 | 9.5652  |
| u241 | 0.9931 | 0.9823 | 1.6083 | 2.2869 | 2.8658 | 3.3227 | 3.6732 | 4.186  | 4.3091 | 6.2581 | 6.5053 | 7.4845 | 8.6673 | 9.687   |
| u242 | 0.9943 | 0.9822 | 1.6075 | 2.2863 | 2.8651 | 3.323  | 3.6728 | 4.1781 | 4.4936 | 6.2875 | 6.6084 | 7.6651 | 8.8616 | 9.9729  |
| u243 | 0.9955 | 0.9824 | 1.6073 | 2.286  | 2.8646 | 3.3236 | 3.6727 | 4.1588 | 4.4896 | 6.2467 | 6.7166 | 7.8614 | 8.7036 | 9.8143  |
| u244 | 0.9958 | 0.9819 | 1.6059 | 2.2844 | 2.8635 | 3.3229 | 3.6721 | 4.1858 | 5.0011 | 6.1498 | 6.6858 | 7.7945 | 8.8212 | 9.9746  |
| u245 | 0.9969 | 0.9821 | 1.6055 | 2.2843 | 2.863  | 3.3234 | 3.6719 | 4.2303 | 5.0051 | 6.1827 | 6.6038 | 7.6749 | 8.9329 | 10.0907 |
| u246 | 0.9984 | 0.9825 | 1.6057 | 2.2846 | 2.8627 | 3.3243 | 3.6718 | 4.2605 | 4.8038 | 6.1579 | 6.5359 | 7.5616 | 8.7985 | 9.8998  |
| u247 | 0.9992 | 0.9826 | 1.6054 | 2.2843 | 2.8623 | 3.3248 | 3.6716 | 4.2359 | 4.8008 | 6.1259 | 6.6374 | 7.6921 | 8.683  | 9.7915  |
| u248 | 1.0016 | 0.9855 | 1.609  | 2.289  | 2.8642 | 3.3313 | 3.6728 | 5.6672 | 6.8862 | 7.2376 | 7.7201 | 8.5517 | 9.8794 | 10.8371 |
| u249 | 1.003  | 0.9856 | 1.6087 | 2.2889 | 2.8635 | 3.3318 | 3.6725 | 5.6856 | 6.8835 | 7.1427 | 7.7266 | 8.5031 | 10.0858 | 11.1715 |
| u250 | 1.0035 | 0.9856 | 1.6079 | 2.2881 | 2.8629 | 3.3321 | 3.6722 | 5.6665 | 6.7482 | 6.9826 | 7.4297 | 8.6211 | 10.028 | 11.2134 |
| u251 | 1.0046 | 0.9857 | 1.6077 | 2.2878 | 2.8622 | 3.3327 | 3.672  | 5.6494 | 6.7507 | 7.0377 | 7.4744 | 8.629  | 9.8915 | 11.0006 |
| u252 | 1.0063 | 0.9865 | 1.6085 | 2.2889 | 2.8621 | 3.335  | 3.6721 | 8.2487 | 7.8976 | 8.0026 | 7.9653 | 9.4855 | 10.8838 | 12.0322 |
| u253 | 1.007  | 0.9867 | 1.6082 | 2.2889 | 2.8617 | 3.3355 | 3.672  | 7.787  | 7.8873 | 7.6706 | 8.0895 | 10.1155 | 10.777 | 12.1018 |
| u254 | 1.0085 | 0.987  | 1.6084 | 2.2892 | 2.861  | 3.3361 | 3.6718 | 7.5814 | 8.7006 | 8.311  | 10.2888 | 11.7767 | 11.5385 | 12.9996 |
| u255 | 1.0093 | 0.9872 | 1.608  | 2.2888 | 2.8603 | 3.3371 | 3.6716 | 7.9739 | 8.7215 | 9.3659 | 8.8346 | 9.7807 | 13.39  | 14.8624 |

| SNR | 14     | 15     | 16     | 17     | 18     | 19     | 20     | 21     | 22     | 23     | 24     | 25     | 26     | 27     |
|-----|--------|--------|--------|--------|--------|--------|--------|--------|--------|--------|--------|--------|--------|--------|
| u1  | 1.0001 | 0.9999 | 1.0001 | 1.0001 | 1      | 1.0001 | 1      | 1      | 0.9999 | 1.0001 | 0.9999 | 1.0001 | 1      | 1.0003 |
| u2  | 1.0002 | 0.9998 | 1.0002 | 1.0003 | 1      | 1.0002 | 1.0001 | 0.9999 | 0.9999 | 1.0001 | 0.9999 | 1      | 1.0003 | 1.0004 |
| u3  | 1.0004 | 0.9997 | 1.0002 | 1.0004 | 1      | 1.0003 | 1.0002 | 0.9999 | 0.9999 | 1.0001 | 0.9998 | 1      | 1.0002 | 1.0004 |
| u4  | 1.001  | 0.9997 | 1.0004 | 1.0006 | 0.9997 | 1.0004 | 1.0002 | 0.9999 | 0.9998 | 1.0001 | 0.9997 | 1      | 1.0002 | 1.0001 |
| u5  | 1.0011 | 0.9996 | 1.0004 | 1.0008 | 0.9997 | 1.0004 | 1.0003 | 0.9999 | 0.9997 | 1.0001 | 0.9997 | 0.9999 | 1.0003 | 1      |
| u6  | 1.0012 | 0.9995 | 1.0005 | 1.0009 | 0.9997 | 1.0005 | 1.0003 | 0.9998 | 0.9997 | 1.0002 | 0.9997 | 1.0001 | 1      | 0.9998 |
| u7  | 1.0013 | 0.9994 | 1.0006 | 1.001  | 0.9997 | 1.0006 | 1.0003 | 0.9998 | 0.9997 | 1.0001 | 0.9996 | 1.0001 | 0.9999 | 0.9995 |
| u8  | 1.0027 | 0.9998 | 1.0006 | 1.0024 | 1.0003 | 1.0008 | 1.0007 | 0.9997 | 0.9996 | 1.0001 | 0.9997 | 0.9998 | 1.0006 | 0.9997 |
| u9  | 1.0028 | 0.9997 | 1.0007 | 1.0025 | 1.0003 | 1.0009 | 1.0006 | 0.9997 | 0.9996 | 1.0001 | 0.9997 | 0.9999 | 1.0002 | 0.9998 |
| u10 | 1.0029 | 0.9996 | 1.0007 | 1.0027 | 1.0002 | 1.0009 | 1.0006 | 0.9997 | 0.9995 | 1.0001 | 0.9996 | 1      | 1.0002 | 0.9997 |
| u11 | 1.0031 | 0.9995 | 1.0008 | 1.0028 | 1.0002 | 1.001  | 1.0006 | 0.9996 | 0.9994 | 1.0001 | 0.9996 | 1.0001 | 1      | 0.9995 |
| u12 | 1.0027 | 0.9994 | 1.0008 | 1.0028 | 1.0005 | 1.0011 | 1.0006 | 0.9996 | 0.9995 | 1.0001 | 0.9996 | 1      | 1      | 0.9994 |
| u13 | 1.0028 | 0.9993 | 1.0009 | 1.0029 | 1.0005 | 1.0012 | 1.0005 | 0.9996 | 0.9994 | 1.0001 | 0.9996 | 0.9999 | 1.0003 | 0.9994 |
| u14 | 1.0029 | 0.9993 | 1.001  | 1.003  | 1.0006 | 1.0013 | 1.0004 | 0.9996 | 0.9993 | 1.0001 | 0.9996 | 1      | 1      | 0.9995 |
| u15 | 1.003  | 0.9992 | 1.001  | 1.0031 | 1.0005 | 1.0014 | 1.0004 | 0.9995 | 0.9992 | 1      | 0.9996 | 0.9999 | 1.0004 | 0.9995 |
| u16 | 1.0031 | 1.0011 | 1.0009 | 0.9946 | 0.9941 | 0.9982 | 1.001  | 1.0005 | 0.9999 | 1.0002 | 1.0123 | 1.0759 | 1.7023 | 2.7114 |
| u17 | 1.0032 | 1.0011 | 1.0009 | 0.9946 | 0.9941 | 0.9983 | 1.0009 | 1.0005 | 0.9998 | 1.0002 | 1.0123 | 1.0758 | 1.7024 | 2.7117 |

-continued

| | | | | | | | | | | | | | | |
|---|---|---|---|---|---|---|---|---|---|---|---|---|---|---|
| u18 | 1.0033 | 1.001 | 1.001 | 0.9947 | 0.9941 | 0.9984 | 1.0009 | 1.0005 | 0.9997 | 1.0002 | 1.0123 | 1.0758 | 1.7024 | 2.712 |
| u19 | 1.0034 | 1.0009 | 1.001 | 0.9948 | 0.9941 | 0.9985 | 1.0008 | 1.0005 | 0.9997 | 1.0001 | 1.0122 | 1.0757 | 1.7025 | 2.7117 |
| u20 | 1.004 | 1.0009 | 1.0011 | 0.995 | 0.9938 | 0.9986 | 1.0008 | 1.0004 | 0.9996 | 1.0001 | 1.0122 | 1.0756 | 1.7025 | 2.7116 |
| u21 | 1.004 | 1.0009 | 1.0012 | 0.9951 | 0.9939 | 0.9987 | 1.0008 | 1.0004 | 0.9995 | 1.0002 | 1.0121 | 1.0757 | 1.7025 | 2.7117 |
| u22 | 1.0041 | 1.0009 | 1.0013 | 0.9951 | 0.9939 | 0.9987 | 1.0008 | 1.0004 | 0.9995 | 1.0002 | 1.0121 | 1.0757 | 1.7024 | 2.7113 |
| u23 | 1.0042 | 1.0008 | 1.0013 | 0.9951 | 0.9939 | 0.9988 | 1.0008 | 1.0004 | 0.9994 | 1.0001 | 1.0121 | 1.0758 | 1.7024 | 2.7112 |
| u24 | 1.0029 | 1.0003 | 1.0014 | 0.9939 | 0.9933 | 0.9989 | 1.0004 | 1.0003 | 0.9993 | 1.0001 | 1.0124 | 1.0757 | 1.7024 | 2.7111 |
| u25 | 1.003 | 1.0003 | 1.0014 | 0.9939 | 0.9933 | 0.999 | 1.0004 | 1.0003 | 0.9992 | 1.0001 | 1.0123 | 1.0757 | 1.7024 | 2.7111 |
| u26 | 1.0031 | 1.0002 | 1.0015 | 0.994 | 0.9933 | 0.9991 | 1.0004 | 1.0002 | 0.9992 | 1.0001 | 1.0123 | 1.0758 | 1.7023 | 2.7111 |
| u27 | 1.0031 | 1.0002 | 1.0015 | 0.994 | 0.9933 | 0.9992 | 1.0004 | 1.0002 | 0.9992 | 1.0001 | 1.0122 | 1.0757 | 1.7024 | 2.7108 |
| u28 | 1.0026 | 1.0002 | 1.0015 | 0.994 | 0.9936 | 0.9993 | 1.0003 | 1.0002 | 0.9992 | 1.0001 | 1.0123 | 1.0757 | 1.7024 | 2.7106 |
| u29 | 1.0026 | 1.0002 | 1.0016 | 0.994 | 0.9936 | 0.9994 | 1.0003 | 1.0002 | 0.9991 | 1.0001 | 1.0122 | 1.0757 | 1.7024 | 2.7108 |
| u30 | 1.0026 | 1.0002 | 1.0016 | 0.994 | 0.9936 | 0.9994 | 1.0002 | 1.0001 | 0.9991 | 1.0002 | 1.0122 | 1.0756 | 1.7026 | 2.7107 |
| u31 | 1.0026 | 1.0002 | 1.0017 | 0.994 | 0.9936 | 0.9995 | 1.0002 | 1.0001 | 0.9991 | 1.0002 | 1.0121 | 1.0757 | 1.7026 | 2.7108 |
| u32 | 0.9698 | 0.9802 | 1.0052 | 1.0457 | 1.1607 | 1.498 | 2.3739 | 2.8154 | 2.9613 | 3.0012 | 3.0125 | 3.051 | 3.6641 | 4.7191 |
| u33 | 0.9698 | 0.9802 | 1.0053 | 1.0457 | 1.1607 | 1.498 | 2.3739 | 2.8154 | 2.9613 | 3.0011 | 3.0125 | 3.0511 | 3.6642 | 4.7192 |
| u34 | 0.9697 | 0.9801 | 1.0053 | 1.0458 | 1.1606 | 1.4981 | 2.3739 | 2.8153 | 2.9612 | 3.0012 | 3.0124 | 3.051 | 3.6639 | 4.7192 |
| u35 | 0.9697 | 0.98 | 1.0054 | 1.0458 | 1.1606 | 1.4981 | 2.374 | 2.8153 | 2.9611 | 3.0012 | 3.0124 | 3.051 | 3.6638 | 4.7193 |
| u36 | 0.9701 | 0.98 | 1.0055 | 1.0459 | 1.1603 | 1.4982 | 2.3741 | 2.8152 | 2.9611 | 3.0012 | 3.0124 | 3.0511 | 3.6639 | 4.7192 |
| u37 | 0.9701 | 0.98 | 1.0056 | 1.046 | 1.1603 | 1.4982 | 2.3741 | 2.8151 | 2.9611 | 3.0012 | 3.0123 | 3.051 | 3.6638 | 4.7191 |
| u38 | 0.9701 | 0.98 | 1.0056 | 1.046 | 1.1603 | 1.4982 | 2.3741 | 2.8151 | 2.961 | 3.0012 | 3.0122 | 3.0511 | 3.6638 | 4.7191 |
| u39 | 0.9701 | 0.98 | 1.0057 | 1.046 | 1.1603 | 1.4983 | 2.3742 | 2.8151 | 2.961 | 3.0012 | 3.0122 | 3.0511 | 3.6639 | 4.719 |
| u40 | 0.9712 | 0.9803 | 1.0057 | 1.0474 | 1.1609 | 1.4986 | 2.3745 | 2.8146 | 2.9609 | 3.0011 | 3.0125 | 3.0508 | 3.6639 | 4.7187 |
| u41 | 0.9712 | 0.9803 | 1.0058 | 1.0474 | 1.1609 | 1.4987 | 2.3745 | 2.8146 | 2.9609 | 3.0011 | 3.0125 | 3.051 | 3.6642 | 4.7187 |
| u42 | 0.9713 | 0.9802 | 1.0059 | 1.0475 | 1.1608 | 1.4987 | 2.3746 | 2.8145 | 2.9608 | 3.0011 | 3.0125 | 3.0511 | 3.6643 | 4.7184 |
| u43 | 0.9713 | 0.9801 | 1.0059 | 1.0476 | 1.1608 | 1.4988 | 2.3746 | 2.8145 | 2.9608 | 3.0011 | 3.0125 | 3.0511 | 3.6644 | 4.7183 |
| u44 | 0.9709 | 0.9801 | 1.0059 | 1.0476 | 1.1611 | 1.4989 | 2.3745 | 2.8145 | 2.9607 | 3.0011 | 3.0124 | 3.051 | 3.6642 | 4.7182 |
| u45 | 0.9709 | 0.98 | 1.006 | 1.0476 | 1.1611 | 1.4989 | 2.3745 | 2.8145 | 2.9606 | 3.0011 | 3.0124 | 3.0509 | 3.6641 | 4.7182 |
| u46 | 0.971 | 0.98 | 1.0061 | 1.0477 | 1.1611 | 1.499 | 2.3744 | 2.8145 | 2.9606 | 3.0011 | 3.0123 | 3.051 | 3.664 | 4.7183 |
| u47 | 0.971 | 0.98 | 1.0061 | 1.0477 | 1.1611 | 1.4991 | 2.3744 | 2.8145 | 2.9605 | 3.0011 | 3.0123 | 3.0509 | 3.6638 | 4.7184 |
| u48 | 0.9711 | 0.9782 | 1.0065 | 1.0548 | 1.1678 | 1.5 | 2.373 | 2.8139 | 2.9608 | 3.0074 | 3.0525 | 3.2157 | 4.5775 | 6.5011 |
| u49 | 0.9712 | 0.9782 | 1.0065 | 1.0549 | 1.1678 | 1.5 | 2.3729 | 2.8139 | 2.9607 | 3.0074 | 3.0525 | 3.2157 | 4.5774 | 6.5013 |
| u50 | 0.9713 | 0.9781 | 1.0066 | 1.055 | 1.1678 | 1.5001 | 2.373 | 2.8138 | 2.9606 | 3.0074 | 3.0524 | 3.2157 | 4.5775 | 6.5016 |
| u51 | 0.9713 | 0.978 | 1.0066 | 1.0551 | 1.1677 | 1.5001 | 2.373 | 2.8138 | 2.9606 | 3.0074 | 3.0524 | 3.2156 | 4.5774 | 6.5015 |
| u52 | 0.9719 | 0.978 | 1.0067 | 1.0553 | 1.1674 | 1.5002 | 2.373 | 2.8137 | 2.9605 | 3.0074 | 3.0524 | 3.2155 | 4.5776 | 6.5017 |
| u53 | 0.972 | 0.9779 | 1.0068 | 1.0554 | 1.1674 | 1.5002 | 2.373 | 2.8137 | 2.9605 | 3.0073 | 3.0524 | 3.2156 | 4.5777 | 6.5016 |
| u54 | 0.972 | 0.9779 | 1.0068 | 1.0554 | 1.1674 | 1.5003 | 2.373 | 2.8137 | 2.9604 | 3.0073 | 3.0523 | 3.2156 | 4.5776 | 6.5012 |
| u55 | 0.9721 | 0.9779 | 1.0069 | 1.0555 | 1.1673 | 1.5003 | 2.3731 | 2.8137 | 2.9604 | 3.0074 | 3.0523 | 3.2156 | 4.5777 | 6.5013 |
| u56 | 0.971 | 0.9774 | 1.0069 | 1.0543 | 1.1666 | 1.5001 | 2.3729 | 2.8141 | 2.9602 | 3.0073 | 3.0523 | 3.2156 | 4.5772 | 6.5008 |
| u57 | 0.9711 | 0.9774 | 1.007 | 1.0544 | 1.1666 | 1.5001 | 2.3729 | 2.814 | 2.9602 | 3.0073 | 3.0523 | 3.2156 | 4.5773 | 6.5008 |
| u58 | 0.9712 | 0.9773 | 1.0071 | 1.0546 | 1.1665 | 1.5002 | 2.373 | 2.814 | 2.9602 | 3.0073 | 3.0523 | 3.2156 | 4.5774 | 6.5009 |
| u59 | 0.9713 | 0.9772 | 1.0071 | 1.0546 | 1.1665 | 1.5002 | 2.3731 | 2.8139 | 2.9601 | 3.0074 | 3.0523 | 3.2156 | 4.5774 | 6.5008 |
| u60 | 0.9709 | 0.9771 | 1.0071 | 1.0547 | 1.1667 | 1.5002 | 2.3731 | 2.8139 | 2.96 | 3.0074 | 3.0522 | 3.2156 | 4.5772 | 6.5003 |
| u61 | 0.9711 | 0.9771 | 1.0072 | 1.0547 | 1.1667 | 1.5003 | 2.3733 | 2.8139 | 2.96 | 3.0074 | 3.0521 | 3.2156 | 4.5772 | 6.5004 |
| u62 | 0.9711 | 0.9771 | 1.0073 | 1.0548 | 1.1667 | 1.5003 | 2.3733 | 2.8139 | 2.96 | 3.0074 | 3.0521 | 3.2155 | 4.5773 | 6.5001 |
| u63 | 0.9712 | 0.977 | 1.0073 | 1.0549 | 1.1667 | 1.5003 | 2.3735 | 2.8138 | 2.9599 | 3.0075 | 3.052 | 3.2155 | 4.5773 | 6.5003 |
| u64 | 2.7713 | 2.8926 | 2.9725 | 3.0169 | 3.1061 | 3.4536 | 4.4024 | 4.8775 | 5.0326 | 5.0597 | 5.0528 | 5.1078 | 6.4605 | 8.5403 |
| u65 | 2.7715 | 2.8926 | 2.9726 | 3.017 | 3.1063 | 3.4538 | 4.4024 | 4.8774 | 5.0325 | 5.0597 | 5.0528 | 5.1079 | 6.4604 | 8.5404 |
| u66 | 2.7716 | 2.8921 | 2.9727 | 3.0171 | 3.1063 | 3.4539 | 4.4025 | 4.8775 | 5.0325 | 5.0598 | 5.0527 | 5.1077 | 6.4603 | 8.5403 |
| u67 | 2.7715 | 2.892 | 2.9727 | 3.0172 | 3.1065 | 3.454 | 4.4025 | 4.8774 | 5.0325 | 5.0598 | 5.0527 | 5.1078 | 6.4605 | 8.5403 |
| u68 | 2.773 | 2.892 | 2.972 | 3.017 | 3.1069 | 3.4541 | 4.4024 | 4.8774 | 5.0325 | 5.0598 | 5.0527 | 5.1078 | 6.4608 | 8.54 |
| u69 | 2.7732 | 2.892 | 2.9721 | 3.0171 | 3.1071 | 3.4542 | 4.4024 | 4.8773 | 5.0325 | 5.0598 | 5.0527 | 5.1077 | 6.4604 | 8.5401 |
| u70 | 2.773 | 2.8922 | 2.9722 | 3.0171 | 3.1073 | 3.4543 | 4.4024 | 4.8773 | 5.0324 | 5.0598 | 5.0527 | 5.1078 | 6.4614 | 8.5402 |
| u71 | 2.7729 | 2.8921 | 2.9723 | 3.0172 | 3.1073 | 3.4545 | 4.4024 | 4.8772 | 5.0324 | 5.0598 | 5.0526 | 5.1078 | 6.4618 | 8.54 |
| u72 | 2.7755 | 2.8938 | 2.9712 | 3.0136 | 3.105 | 3.4542 | 4.4027 | 4.877 | 5.0319 | 5.0599 | 5.0527 | 5.1074 | 6.4598 | 8.5397 |
| u73 | 2.7756 | 2.8938 | 2.9712 | 3.0137 | 3.1051 | 3.4542 | 4.4027 | 4.8769 | 5.0318 | 5.0599 | 5.0527 | 5.1078 | 6.4613 | 8.5397 |
| u74 | 2.7758 | 2.8934 | 2.9713 | 3.0138 | 3.1051 | 3.4544 | 4.4026 | 4.8769 | 5.0317 | 5.0599 | 5.0527 | 5.1078 | 6.4608 | 8.5394 |
| u75 | 2.7756 | 2.8933 | 2.9714 | 3.0138 | 3.1053 | 3.4545 | 4.4026 | 4.8769 | 5.0317 | 5.0599 | 5.0526 | 5.1079 | 6.4618 | 8.5393 |
| u76 | 2.7741 | 2.8931 | 2.9722 | 3.0141 | 3.105 | 3.4545 | 4.4027 | 4.8769 | 5.0315 | 5.0599 | 5.0525 | 5.1078 | 6.4616 | 8.5393 |
| u77 | 2.7743 | 2.8931 | 2.9723 | 3.0142 | 3.1051 | 3.4546 | 4.4026 | 4.8769 | 5.0315 | 5.0599 | 5.0525 | 5.1077 | 6.4608 | 8.5393 |
| u78 | 2.7742 | 2.8934 | 2.9724 | 3.0142 | 3.1053 | 3.4547 | 4.4025 | 4.8768 | 5.0314 | 5.0599 | 5.0525 | 5.1077 | 6.4616 | 8.5395 |
| u79 | 2.774 | 2.8933 | 2.9725 | 3.0143 | 3.1054 | 3.4548 | 4.4025 | 4.8768 | 5.0313 | 5.0599 | 5.0525 | 5.1076 | 6.4603 | 8.5395 |
| u80 | 2.7715 | 2.9012 | 2.9935 | 3.0431 | 3.1214 | 3.455 | 4.3995 | 4.8737 | 5.0399 | 5.1008 | 5.1902 | 5.5135 | 7.7125 | 10.4547 |
| u81 | 2.7717 | 2.9013 | 2.9936 | 3.0432 | 3.1215 | 3.4551 | 4.3994 | 4.8737 | 5.0398 | 5.1008 | 5.1902 | 5.5135 | 7.7126 | 10.4547 |
| u82 | 2.7718 | 2.9009 | 2.9936 | 3.0433 | 3.1215 | 3.4552 | 4.3994 | 4.8738 | 5.0398 | 5.1009 | 5.1901 | 5.5135 | 7.7128 | 10.4549 |
| u83 | 2.7716 | 2.9008 | 2.9936 | 3.0434 | 3.1215 | 3.4553 | 4.3993 | 4.8737 | 5.0397 | 5.1008 | 5.1901 | 5.5135 | 7.7128 | 10.455 |
| u84 | 2.7731 | 2.9009 | 2.9929 | 3.0432 | 3.122 | 3.4554 | 4.3991 | 4.8737 | 5.0397 | 5.1008 | 5.1902 | 5.5135 | 7.7128 | 10.4552 |
| u85 | 2.7733 | 2.9009 | 2.9929 | 3.0433 | 3.1221 | 3.4555 | 4.3991 | 4.8737 | 5.0397 | 5.1008 | 5.1902 | 5.5135 | 7.7128 | 10.4551 |
| u86 | 2.7731 | 2.9012 | 2.993 | 3.0433 | 3.1222 | 3.4556 | 4.399 | 4.8736 | 5.0396 | 5.1008 | 5.1901 | 5.5134 | 7.7126 | 10.4549 |
| u87 | 2.7729 | 2.9012 | 2.9931 | 3.0433 | 3.1222 | 3.4557 | 4.399 | 4.8736 | 5.0395 | 5.1008 | 5.1901 | 5.5134 | 7.7125 | 10.455 |
| u88 | 2.7704 | 2.8994 | 2.9943 | 3.047 | 3.125 | 3.4563 | 4.3986 | 4.8738 | 5.0399 | 5.1006 | 5.1903 | 5.5135 | 7.7125 | 10.4548 |
| u89 | 2.7705 | 2.8994 | 2.9944 | 3.0471 | 3.1251 | 3.4563 | 4.3986 | 4.8738 | 5.0399 | 5.1006 | 5.1903 | 5.5135 | 7.7126 | 10.4547 |
| u90 | 2.7706 | 2.8992 | 2.9944 | 3.0471 | 3.1251 | 3.4564 | 4.3986 | 4.8738 | 5.0398 | 5.1006 | 5.1903 | 5.5135 | 7.7126 | 10.4547 |
| u91 | 2.7704 | 2.8991 | 2.9944 | 3.0472 | 3.1251 | 3.4565 | 4.3985 | 4.8737 | 5.0398 | 5.1006 | 5.1902 | 5.5135 | 7.7126 | 10.4548 |
| u92 | 2.7689 | 2.8991 | 2.9952 | 3.0474 | 3.1248 | 3.4566 | 4.3986 | 4.8737 | 5.0397 | 5.1006 | 5.1901 | 5.5135 | 7.7126 | 10.4545 |
| u93 | 2.769 | 2.8992 | 2.9953 | 3.0474 | 3.1249 | 3.4567 | 4.3986 | 4.8737 | 5.0396 | 5.1007 | 5.19 | 5.5135 | 7.7126 | 10.4544 |
| u94 | 2.7688 | 2.8996 | 2.9954 | 3.0474 | 3.125 | 3.4568 | 4.3985 | 4.8736 | 5.0395 | 5.1007 | 5.19 | 5.5135 | 7.7127 | 10.4544 |
| u95 | 2.7686 | 2.8996 | 2.9954 | 3.0474 | 3.125 | 3.4569 | 4.3985 | 4.8736 | 5.0395 | 5.1007 | 5.1899 | 5.5135 | 7.7126 | 10.4546 |
| u96 | 2.8386 | 3.0147 | 3.1649 | 3.3091 | 3.6043 | 4.3849 | 6.0929 | 6.8999 | 7.1538 | 7.1738 | 7.1334 | 7.278 | 9.5442 | 12.57 |

-continued

| | | | | | | | | | | | | | | |
|---|---|---|---|---|---|---|---|---|---|---|---|---|---|---|
| u97 | 2.8387 | 3.0148 | 3.1649 | 3.3091 | 3.6042 | 4.3849 | 6.093 | 6.8998 | 7.1538 | 7.1738 | 7.1333 | 7.278 | 9.544 | 12.5701 |
| u98 | 2.8388 | 3.0145 | 3.1649 | 3.3091 | 3.604 | 4.3848 | 6.093 | 6.8998 | 7.1537 | 7.1738 | 7.1333 | 7.278 | 9.5445 | 12.5702 |
| u99 | 2.8386 | 3.0145 | 3.1649 | 3.3091 | 3.6039 | 4.3848 | 6.0931 | 6.8997 | 7.1536 | 7.1739 | 7.1332 | 7.278 | 9.5443 | 12.5702 |
| u100 | 2.84 | 3.0146 | 3.1641 | 3.3089 | 3.6045 | 4.3849 | 6.0932 | 6.8998 | 7.1534 | 7.174 | 7.1331 | 7.2779 | 9.5443 | 12.5702 |
| u101 | 2.8401 | 3.0147 | 3.1642 | 3.3089 | 3.6044 | 4.3849 | 6.0933 | 6.8997 | 7.1534 | 7.174 | 7.133 | 7.2779 | 9.5442 | 12.57 |
| u102 | 2.84 | 3.015 | 3.1643 | 3.3089 | 3.6044 | 4.3849 | 6.0935 | 6.8997 | 7.1533 | 7.174 | 7.133 | 7.2779 | 9.5445 | 12.5699 |
| u103 | 2.8398 | 3.0149 | 3.1643 | 3.309 | 3.6042 | 4.3849 | 6.0935 | 6.8997 | 7.1533 | 7.174 | 7.133 | 7.2779 | 9.5445 | 12.5698 |
| u104 | 2.8418 | 3.0165 | 3.1632 | 3.3048 | 3.5996 | 4.3829 | 6.0926 | 6.9028 | 7.154 | 7.1732 | 7.1329 | 7.2779 | 9.5438 | 12.57 |
| u105 | 2.842 | 3.0166 | 3.1632 | 3.3049 | 3.5995 | 4.3829 | 6.0927 | 6.9027 | 7.154 | 7.1732 | 7.1329 | 7.2779 | 9.5442 | 12.5701 |
| u106 | 2.8422 | 3.0162 | 3.1633 | 3.305 | 3.5993 | 4.3828 | 6.0927 | 6.9026 | 7.1539 | 7.1731 | 7.1328 | 7.278 | 9.544 | 12.57 |
| u107 | 2.8421 | 3.0161 | 3.1633 | 3.3051 | 3.5992 | 4.3828 | 6.0928 | 6.9026 | 7.1538 | 7.1732 | 7.1328 | 7.278 | 9.5443 | 12.57 |
| u108 | 2.8408 | 3.016 | 3.1642 | 3.3055 | 3.5985 | 4.3827 | 6.0929 | 6.9025 | 7.1539 | 7.1731 | 7.1329 | 7.2781 | 9.5444 | 12.5695 |
| u109 | 2.841 | 3.016 | 3.1643 | 3.3056 | 3.5984 | 4.3827 | 6.0929 | 6.9024 | 7.1538 | 7.173 | 7.1329 | 7.2781 | 9.5439 | 12.5694 |
| u110 | 2.8409 | 3.0162 | 3.1644 | 3.3057 | 3.5984 | 4.3828 | 6.093 | 6.9024 | 7.1538 | 7.1731 | 7.1329 | 7.2781 | 9.5444 | 12.5694 |
| u111 | 2.8408 | 3.0161 | 3.1644 | 3.3059 | 3.5982 | 4.3828 | 6.093 | 6.9024 | 7.1537 | 7.1731 | 7.1329 | 7.2781 | 9.5433 | 12.5695 |
| u112 | 2.8431 | 3.0094 | 3.143 | 3.2686 | 3.5702 | 4.3705 | 6.0909 | 6.9228 | 7.2252 | 7.3516 | 7.5419 | 8.1338 | 11.1285 | 14.6753 |
| u113 | 2.8433 | 3.0094 | 3.143 | 3.2688 | 3.5702 | 4.3704 | 6.0909 | 6.9228 | 7.2251 | 7.3516 | 7.5419 | 8.1338 | 11.1288 | 14.6753 |
| u114 | 2.8436 | 3.0091 | 3.1431 | 3.269 | 3.5699 | 4.3703 | 6.0909 | 6.9227 | 7.225 | 7.3516 | 7.5418 | 8.1337 | 11.1289 | 14.6753 |
| u115 | 2.8435 | 3.0089 | 3.1432 | 3.2692 | 3.5698 | 4.3703 | 6.0909 | 6.9227 | 7.2249 | 7.3516 | 7.5418 | 8.1338 | 11.129 | 14.6754 |
| u116 | 2.8449 | 3.0089 | 3.1424 | 3.2692 | 3.5702 | 4.3704 | 6.0909 | 6.9227 | 7.2247 | 7.3517 | 7.5416 | 8.1337 | 11.1293 | 14.6754 |
| u117 | 2.8452 | 3.0089 | 3.1425 | 3.2695 | 3.5701 | 4.3704 | 6.091 | 6.9227 | 7.2246 | 7.3517 | 7.5415 | 8.1337 | 11.1292 | 14.6754 |
| u118 | 2.8451 | 3.0091 | 3.1426 | 3.2696 | 3.57 | 4.3704 | 6.0911 | 6.9227 | 7.2246 | 7.3517 | 7.5415 | 8.1337 | 11.1292 | 14.6754 |
| u119 | 2.8451 | 3.009 | 3.1427 | 3.2699 | 3.5699 | 4.3703 | 6.0911 | 6.9227 | 7.2245 | 7.3517 | 7.5415 | 8.1336 | 11.1289 | 14.6753 |
| u120 | 2.8432 | 3.0072 | 3.1439 | 3.2744 | 3.5741 | 4.3722 | 6.0922 | 6.9197 | 7.2236 | 7.3525 | 7.5421 | 8.1335 | 11.1284 | 14.6752 |
| u121 | 2.8434 | 3.0072 | 3.1441 | 3.2747 | 3.5739 | 4.3722 | 6.0923 | 6.9196 | 7.2236 | 7.3525 | 7.542 | 8.1335 | 11.1283 | 14.6751 |
| u122 | 2.8437 | 3.0068 | 3.1441 | 3.275 | 3.5737 | 4.3721 | 6.0924 | 6.9195 | 7.2235 | 7.3525 | 7.5419 | 8.1334 | 11.1282 | 14.6752 |
| u123 | 2.8436 | 3.0066 | 3.1442 | 3.2753 | 3.5735 | 4.372 | 6.0926 | 6.9195 | 7.2234 | 7.3525 | 7.5419 | 8.1334 | 11.1283 | 14.6753 |
| u124 | 2.8423 | 3.0064 | 3.1451 | 3.2758 | 3.5727 | 4.3718 | 6.0927 | 6.9194 | 7.2236 | 7.3524 | 7.5421 | 8.1335 | 11.128 | 14.6753 |
| u125 | 2.8426 | 3.0064 | 3.1452 | 3.2761 | 3.5725 | 4.3717 | 6.0929 | 6.9193 | 7.2235 | 7.3524 | 7.542 | 8.1335 | 11.1279 | 14.6753 |
| u126 | 2.8426 | 3.0066 | 3.1454 | 3.2763 | 3.5725 | 4.3717 | 6.0931 | 6.9193 | 7.2235 | 7.3525 | 7.5419 | 8.1336 | 11.1282 | 14.6753 |
| u127 | 2.8425 | 3.0064 | 3.1455 | 3.2766 | 3.5723 | 4.3717 | 6.0933 | 6.9193 | 7.2235 | 7.3525 | 7.5419 | 8.1335 | 11.1282 | 14.6754 |
| u128 | 4.9103 | 5.0734 | 5.218 | 5.3185 | 5.5367 | 6.3469 | 8.2579 | 9.1578 | 9.4166 | 9.3913 | 9.3861 | 9.8077 | 13.006 | 16.9446 |
| u129 | 4.911 | 5.0729 | 5.218 | 5.3182 | 5.5368 | 6.347 | 8.258 | 9.1578 | 9.4165 | 9.3913 | 9.3859 | 9.8079 | 13.0059 | 16.9446 |
| u130 | 4.9115 | 5.074 | 5.2181 | 5.318 | 5.5372 | 6.3471 | 8.2579 | 9.1578 | 9.4165 | 9.3914 | 9.3858 | 9.8076 | 13.0055 | 16.9448 |
| u131 | 4.9116 | 5.074 | 5.2183 | 5.3177 | 5.5374 | 6.3472 | 8.258 | 9.1577 | 9.4165 | 9.3914 | 9.3857 | 9.8077 | 13.0056 | 16.9446 |
| u132 | 4.908 | 5.0748 | 5.2199 | 5.3177 | 5.5368 | 6.3472 | 8.2595 | 9.158 | 9.4163 | 9.3913 | 9.3859 | 9.8076 | 13.0059 | 16.9447 |
| u133 | 4.9085 | 5.0744 | 5.2199 | 5.3175 | 5.537 | 6.3473 | 8.2596 | 9.158 | 9.4163 | 9.3913 | 9.3858 | 9.8075 | 13.0057 | 16.9446 |
| u134 | 4.9089 | 5.073 | 5.22 | 5.3175 | 5.537 | 6.3475 | 8.2598 | 9.158 | 9.4162 | 9.3913 | 9.3857 | 9.8077 | 13.0061 | 16.9445 |
| u135 | 4.909 | 5.0731 | 5.2202 | 5.3173 | 5.5373 | 6.3476 | 8.2598 | 9.1579 | 9.4162 | 9.3913 | 9.3857 | 9.8077 | 13.0061 | 16.9445 |
| u136 | 4.8947 | 5.067 | 5.2238 | 5.3284 | 5.5432 | 6.3461 | 8.2529 | 9.1516 | 9.4168 | 9.3939 | 9.3863 | 9.8063 | 13.0062 | 16.9529 |
| u137 | 4.8956 | 5.0666 | 5.2238 | 5.3282 | 5.5433 | 6.3462 | 8.253 | 9.1516 | 9.4168 | 9.3939 | 9.3863 | 9.8066 | 13.0065 | 16.953 |
| u138 | 4.8963 | 5.0676 | 5.2239 | 5.3279 | 5.5436 | 6.3463 | 8.2528 | 9.1516 | 9.4167 | 9.3939 | 9.3863 | 9.8067 | 13.0064 | 16.9531 |
| u139 | 4.8965 | 5.0677 | 5.2241 | 5.3277 | 5.5437 | 6.3464 | 8.2528 | 9.1515 | 9.4167 | 9.3939 | 9.3862 | 9.8069 | 13.0068 | 16.9531 |
| u140 | 4.9011 | 5.0665 | 5.2227 | 5.3273 | 5.5448 | 6.3466 | 8.2512 | 9.1511 | 9.4167 | 9.394 | 9.3861 | 9.8069 | 13.0064 | 16.9532 |
| u141 | 4.9018 | 5.0662 | 5.2227 | 5.3272 | 5.545 | 6.3467 | 8.2512 | 9.1511 | 9.4166 | 9.394 | 9.3861 | 9.8067 | 13.0061 | 16.9531 |
| u142 | 4.902 | 5.0648 | 5.2227 | 5.3272 | 5.5449 | 6.3468 | 8.2513 | 9.1511 | 9.4165 | 9.394 | 9.386 | 9.8069 | 13.006 | 16.953 |
| u143 | 4.9021 | 5.0649 | 5.2229 | 5.327 | 5.5452 | 6.3469 | 8.2512 | 9.151 | 9.4164 | 9.394 | 9.3859 | 9.8068 | 13.0056 | 16.9531 |
| u144 | 4.8872 | 5.0213 | 5.1541 | 5.2561 | 5.5033 | 6.3558 | 8.3174 | 9.3161 | 9.7263 | 9.9606 | 10.3344 | 11.1771 | 14.8816 | 19.2945 |
| u145 | 4.8877 | 5.021 | 5.1541 | 5.2559 | 5.5034 | 6.3559 | 8.3174 | 9.3161 | 9.7262 | 9.9606 | 10.3344 | 11.1771 | 14.8815 | 19.2945 |
| u146 | 4.888 | 5.0219 | 5.1543 | 5.2556 | 5.5036 | 6.3559 | 8.3172 | 9.3161 | 9.7261 | 9.9605 | 10.3345 | 11.177 | 14.8815 | 19.2939 |
| u147 | 4.8879 | 5.022 | 5.1546 | 5.2554 | 5.5038 | 6.356 | 8.3186 | 9.316 | 9.726 | 9.9605 | 10.3344 | 11.177 | 14.8815 | 19.2941 |
| u148 | 4.8836 | 5.0229 | 5.1559 | 5.2555 | 5.5033 | 6.356 | 8.3186 | 9.3164 | 9.7258 | 9.9604 | 10.3346 | 11.1769 | 14.8815 | 19.2945 |
| u149 | 4.884 | 5.0226 | 5.1559 | 5.2553 | 5.5034 | 6.3561 | 8.3186 | 9.3164 | 9.7257 | 9.9604 | 10.3346 | 11.1769 | 14.8815 | 19.2944 |
| u150 | 4.8838 | 5.0214 | 5.1561 | 5.2554 | 5.5034 | 6.3562 | 8.3187 | 9.3163 | 9.7256 | 9.9604 | 10.3345 | 11.177 | 14.8816 | 19.2951 |
| u151 | 4.8836 | 5.0215 | 5.1562 | 5.2553 | 5.5036 | 6.3563 | 8.3186 | 9.3162 | 9.7256 | 9.9604 | 10.3345 | 11.177 | 14.8817 | 19.2949 |
| u152 | 4.8989 | 5.0264 | 5.1538 | 5.2455 | 5.4991 | 6.3579 | 8.3251 | 9.3228 | 9.7246 | 9.9555 | 10.3315 | 11.1791 | 14.8957 | 19.3523 |
| u153 | 4.8992 | 5.0261 | 5.1538 | 5.2455 | 5.4992 | 6.3579 | 8.3251 | 9.3228 | 9.7245 | 9.9555 | 10.3315 | 11.1791 | 14.8957 | 19.3521 |
| u154 | 4.8994 | 5.0273 | 5.1538 | 5.2453 | 5.4994 | 6.358 | 8.3249 | 9.3227 | 9.7245 | 9.9556 | 10.3315 | 11.179 | 14.8955 | 19.3514 |
| u155 | 4.899 | 5.0275 | 5.1539 | 5.2454 | 5.4996 | 6.3581 | 8.3249 | 9.3227 | 9.7244 | 9.9556 | 10.3314 | 11.179 | 14.8956 | 19.3516 |
| u156 | 4.9033 | 5.0266 | 5.1527 | 5.2452 | 5.5004 | 6.3583 | 8.3234 | 9.3222 | 9.7245 | 9.9557 | 10.3311 | 11.1791 | 14.8956 | 19.3512 |
| u157 | 4.9035 | 5.0264 | 5.1525 | 5.2453 | 5.5005 | 6.3583 | 8.3235 | 9.3222 | 9.7244 | 9.9557 | 10.3311 | 11.1791 | 14.8956 | 19.3512 |
| u158 | 4.9031 | 5.0254 | 5.1525 | 5.2456 | 5.5005 | 6.3585 | 8.3236 | 9.3222 | 9.7244 | 9.9558 | 10.3309 | 11.1791 | 14.8959 | 19.352 |
| u159 | 4.9026 | 5.0257 | 5.1525 | 5.2456 | 5.5006 | 6.3586 | 8.3235 | 9.3222 | 9.7243 | 9.9558 | 10.3309 | 11.1791 | 14.8959 | 19.3522 |
| u160 | 5.4645 | 5.6623 | 5.8387 | 6.0327 | 6.5989 | 7.9383 | 10.4266 | 11.5513 | 11.8946 | 11.9545 | 12.1357 | 12.8736 | 16.9311 | 21.7829 |
| u161 | 5.4642 | 5.6617 | 5.8385 | 6.0329 | 6.5987 | 7.9383 | 10.4265 | 11.5512 | 11.8946 | 11.9546 | 12.1356 | 12.8735 | 16.9311 | 21.7831 |
| u162 | 5.4639 | 5.6638 | 5.8387 | 6.0324 | 6.5993 | 7.9392 | 10.4275 | 11.5513 | 11.8946 | 11.9546 | 12.1355 | 12.8736 | 16.9313 | 21.7834 |
| u163 | 5.4642 | 5.6644 | 5.8389 | 6.0326 | 6.5994 | 7.9392 | 10.4277 | 11.5513 | 11.8945 | 11.9546 | 12.1355 | 12.8736 | 16.9312 | 21.7832 |
| u164 | 5.4539 | 5.6644 | 5.8426 | 6.0329 | 6.5958 | 7.935 | 10.4216 | 11.5499 | 11.8949 | 11.9546 | 12.1351 | 12.874 | 16.9316 | 21.7828 |
| u165 | 5.4536 | 5.6638 | 5.8424 | 6.033 | 6.5955 | 7.9351 | 10.4215 | 11.5498 | 11.8949 | 11.9546 | 12.1351 | 12.874 | 16.9317 | 21.7831 |
| u166 | 5.454 | 5.6616 | 5.8423 | 6.0337 | 6.5948 | 7.9341 | 10.4207 | 11.5496 | 11.8949 | 11.9546 | 12.1351 | 12.8739 | 16.9314 | 21.783 |
| u167 | 5.4543 | 5.6621 | 5.8426 | 6.0339 | 6.5949 | 7.934 | 10.4209 | 11.5496 | 11.8948 | 11.9546 | 12.1351 | 12.8739 | 16.9313 | 21.7827 |
| u168 | 5.4338 | 5.6485 | 5.8483 | 6.0579 | 6.6301 | 7.9702 | 10.4555 | 11.5604 | 11.8877 | 11.9452 | 12.1371 | 12.9022 | 17.0161 | 22.0143 |
| u169 | 5.4336 | 5.6479 | 5.8481 | 6.058 | 6.6298 | 7.9702 | 10.4554 | 11.5603 | 11.8877 | 11.9453 | 12.1371 | 12.9018 | 17.0158 | 22.0135 |
| u170 | 5.4333 | 5.65 | 5.8483 | 6.0574 | 6.6305 | 7.9712 | 10.4564 | 11.5604 | 11.8876 | 11.9453 | 12.1371 | 12.9019 | 17.0158 | 22.0135 |
| u171 | 5.4336 | 5.6506 | 5.8486 | 6.0575 | 6.6306 | 7.9712 | 10.4566 | 11.5604 | 11.8875 | 11.9453 | 12.1371 | 12.9017 | 17.0154 | 22.0134 |
| u172 | 5.4439 | 5.6504 | 5.845 | 6.0575 | 6.6342 | 7.9755 | 10.4633 | 11.5618 | 11.887 | 11.9453 | 12.1371 | 12.9014 | 17.0149 | 22.0144 |
| u173 | 5.4437 | 5.6498 | 5.8449 | 6.0576 | 6.6339 | 7.9755 | 10.4632 | 11.5617 | 11.887 | 11.9453 | 12.1371 | 12.9017 | 17.0152 | 22.0146 |
| u174 | 5.444 | 5.6476 | 5.8448 | 6.0583 | 6.6332 | 7.9745 | 10.4622 | 11.5616 | 11.887 | 11.9452 | 12.1372 | 12.9016 | 17.0151 | 22.0148 |
| u175 | 5.4443 | 5.6481 | 5.845 | 6.0584 | 6.6333 | 7.9745 | 10.4624 | 11.5616 | 11.8869 | 11.9452 | 12.1373 | 12.9017 | 17.0157 | 22.0149 |

-continued

| | | | | | | | | | | | | | | |
|---|---|---|---|---|---|---|---|---|---|---|---|---|---|---|
| u176 | 5.4376 | 5.7159 | 5.9919 | 6.2621 | 6.8568 | 8.2403 | 10.8783 | 12.2474 | 12.8281 | 13.2426 | 13.7158 | 14.6035 | 19.0802 | 24.3998 |
| u177 | 5.4374 | 5.7153 | 5.9918 | 6.2622 | 6.8566 | 8.2403 | 10.8782 | 12.2473 | 12.828 | 13.2426 | 13.7158 | 14.6035 | 19.0799 | 24.4002 |
| u178 | 5.4371 | 5.7173 | 5.992 | 6.2616 | 6.8571 | 8.2414 | 10.8796 | 12.2475 | 12.8279 | 13.2426 | 13.7159 | 14.6033 | 19.0796 | 24.4004 |
| u179 | 5.4373 | 5.7179 | 5.9922 | 6.2616 | 6.8572 | 8.2414 | 10.88 | 12.2476 | 12.8277 | 13.2426 | 13.7158 | 14.6033 | 19.0794 | 24.4 |
| u180 | 5.4279 | 5.7178 | 5.9953 | 6.2616 | 6.8535 | 8.2364 | 10.8712 | 12.2441 | 12.8287 | 13.2417 | 13.7159 | 14.6016 | 19.0791 | 24.3997 |
| u181 | 5.4276 | 5.7172 | 5.9952 | 6.2616 | 6.8532 | 8.2364 | 10.8712 | 12.244 | 12.8286 | 13.2418 | 13.7159 | 14.6017 | 19.0793 | 24.4 |
| u182 | 5.4279 | 5.7152 | 5.9951 | 6.2623 | 6.8525 | 8.2353 | 10.87 | 12.2438 | 12.8285 | 13.2417 | 13.7158 | 14.6018 | 19.0796 | 24.3998 |
| u183 | 5.4281 | 5.7158 | 5.9953 | 6.2623 | 6.8525 | 8.2352 | 10.8705 | 12.2438 | 12.8283 | 13.2417 | 13.7157 | 14.6019 | 19.0797 | 24.3995 |
| u184 | 5.447 | 5.729 | 5.9909 | 6.2405 | 6.8178 | 8.1942 | 10.8218 | 12.2178 | 12.8361 | 13.2776 | 13.7903 | 14.7602 | 19.4116 | 25.1037 |
| u185 | 5.4467 | 5.7284 | 5.9907 | 6.2406 | 6.8176 | 8.1942 | 10.8218 | 12.2177 | 12.836 | 13.2776 | 13.7903 | 14.7601 | 19.4116 | 25.1035 |
| u186 | 5.4464 | 5.7304 | 5.9909 | 6.24 | 6.818 | 8.1953 | 10.8233 | 12.218 | 12.836 | 13.2777 | 13.7904 | 14.76 | 19.4115 | 25.1039 |
| u187 | 5.4466 | 5.7309 | 5.9912 | 6.24 | 6.818 | 8.1952 | 10.8238 | 12.2181 | 12.8359 | 13.2776 | 13.7903 | 14.76 | 19.4115 | 25.1039 |
| u188 | 5.456 | 5.731 | 5.988 | 6.2401 | 6.8215 | 8.2001 | 10.8328 | 12.2215 | 12.8348 | 13.2785 | 13.7902 | 14.7617 | 19.4121 | 25.1021 |
| u189 | 5.4558 | 5.7305 | 5.9879 | 6.2402 | 6.8211 | 8.2001 | 10.8328 | 12.2214 | 12.8347 | 13.2785 | 13.7902 | 14.7617 | 19.4121 | 25.1021 |
| u190 | 5.4561 | 5.7285 | 5.9878 | 6.2408 | 6.8203 | 8.1989 | 10.8319 | 12.2212 | 12.8346 | 13.2786 | 13.79 | 14.7618 | 19.4121 | 25.1018 |
| u191 | 5.4563 | 5.729 | 5.988 | 6.2409 | 6.8203 | 8.1989 | 10.8324 | 12.2213 | 12.8345 | 13.2785 | 13.7899 | 14.7619 | 19.412 | 25.1019 |
| u192 | 7.6324 | 7.9014 | 8.1161 | 8.2737 | 8.7597 | 10.2349 | 13.2125 | 14.5954 | 15.0555 | 15.2593 | 15.609 | 16.4996 | 21.442 | 27.4183 |
| u193 | 7.6245 | 7.9019 | 8.1172 | 8.2734 | 8.76 | 10.235 | 13.2129 | 14.5954 | 15.0554 | 15.2593 | 15.6089 | 16.4997 | 21.4445 | 27.4182 |
| u194 | 7.6164 | 7.8961 | 8.1178 | 8.2743 | 8.7595 | 10.2331 | 13.2108 | 14.5952 | 15.0559 | 15.2592 | 15.6086 | 16.4997 | 21.4446 | 27.419 |
| u195 | 7.6237 | 7.8961 | 8.1171 | 8.2741 | 8.7595 | 10.2333 | 13.2104 | 14.5952 | 15.056 | 15.2592 | 15.6086 | 16.4999 | 21.4459 | 27.4184 |
| u196 | 7.615 | 7.883 | 8.1093 | 8.2771 | 8.7692 | 10.2475 | 13.2245 | 14.5955 | 15.0519 | 15.2602 | 15.611 | 16.5033 | 21.4448 | 27.4169 |
| u197 | 7.6071 | 7.8835 | 8.1103 | 8.2769 | 8.7695 | 10.2475 | 13.2249 | 14.5955 | 15.0518 | 15.2601 | 15.6108 | 16.5033 | 21.444 | 27.4167 |
| u198 | 7.6146 | 7.8895 | 8.11 | 8.2755 | 8.7704 | 10.2498 | 13.2272 | 14.5956 | 15.0512 | 15.2603 | 15.611 | 16.5037 | 21.4466 | 27.4167 |
| u199 | 7.6223 | 7.8894 | 8.1092 | 8.2755 | 8.7704 | 10.25 | 13.2267 | 14.5956 | 15.0513 | 15.2603 | 15.6111 | 16.5038 | 21.4465 | 27.4166 |
| u200 | 7.712 | 7.9009 | 8.0775 | 8.22 | 8.698 | 10.1672 | 13.1513 | 14.5943 | 15.1383 | 15.4386 | 15.9161 | 17.0297 | 22.3558 | 28.9457 |
| u201 | 7.703 | 7.9012 | 8.0784 | 8.22 | 8.6982 | 10.1672 | 13.1516 | 14.5943 | 15.1381 | 15.4386 | 15.916 | 17.0296 | 22.3562 | 28.9453 |
| u202 | 7.694 | 7.895 | 8.0789 | 8.2211 | 8.6977 | 10.1656 | 13.1498 | 14.5941 | 15.1386 | 15.4384 | 15.9157 | 17.03 | 22.3555 | 28.9458 |
| u203 | 7.7028 | 7.8947 | 8.078 | 8.2212 | 8.6976 | 10.1658 | 13.1494 | 14.5941 | 15.1387 | 15.4384 | 15.9157 | 17.03 | 22.3561 | 28.9457 |
| u204 | 7.7096 | 7.9091 | 8.0858 | 8.2181 | 8.6896 | 10.1546 | 13.1382 | 14.5937 | 15.1425 | 15.4375 | 15.9125 | 17.0225 | 22.3521 | 28.9508 |
| u205 | 7.7009 | 7.9095 | 8.0866 | 8.2182 | 8.6898 | 10.1546 | 13.1384 | 14.5937 | 15.1424 | 15.4375 | 15.9124 | 17.0225 | 22.3515 | 28.9509 |
| u206 | 7.7094 | 7.9159 | 8.0861 | 8.2172 | 8.6904 | 10.1563 | 13.1401 | 14.5939 | 15.1418 | 15.4376 | 15.9126 | 17.0222 | 22.3521 | 28.9503 |
| u207 | 7.7181 | 7.9156 | 8.0851 | 8.2174 | 8.6903 | 10.1564 | 13.1397 | 14.5938 | 15.1418 | 15.4376 | 15.9127 | 17.0222 | 22.3516 | 28.9504 |
| u208 | 8.0121 | 8.3554 | 8.6046 | 8.7685 | 9.2888 | 10.9082 | 14.2418 | 16.1876 | 16.9697 | 17.3155 | 17.7322 | 18.7703 | 24.3868 | 31.2555 |
| u209 | 8.0033 | 8.3574 | 8.6062 | 8.7685 | 9.2891 | 10.9079 | 14.2435 | 16.1888 | 16.97 | 17.3155 | 17.7324 | 18.7707 | 24.3845 | 31.254 |
| u210 | 7.9945 | 8.346 | 8.6057 | 8.7708 | 9.2875 | 10.9023 | 14.2346 | 16.1834 | 16.9675 | 17.3158 | 17.7329 | 18.77 | 24.3864 | 31.2564 |
| u211 | 8.0035 | 8.3438 | 8.6043 | 8.7711 | 9.2872 | 10.9026 | 14.233 | 16.1822 | 16.967 | 17.3158 | 17.7326 | 18.7705 | 24.3844 | 31.2559 |
| u212 | 8.0082 | 8.3276 | 8.59 | 8.7749 | 9.3089 | 10.9417 | 14.2877 | 16.2266 | 16.984 | 17.3117 | 17.7212 | 18.762 | 24.39 | 31.3018 |
| u213 | 7.999 | 8.3295 | 8.5915 | 8.7749 | 9.3092 | 10.9414 | 14.2894 | 16.2278 | 16.9844 | 17.3116 | 17.7207 | 18.7622 | 24.3913 | 31.301 |
| u214 | 8.0084 | 8.3406 | 8.5922 | 8.7729 | 9.3107 | 10.9472 | 14.2985 | 16.2333 | 16.9868 | 17.3113 | 17.721 | 18.762 | 24.3911 | 31.3026 |
| u215 | 8.0178 | 8.3385 | 8.5908 | 8.773 | 9.3103 | 10.9475 | 14.2968 | 16.232 | 16.9862 | 17.3113 | 17.7208 | 18.7623 | 24.3923 | 31.3012 |
| u216 | 7.8981 | 8.2909 | 8.6214 | 8.877 | 9.4809 | 11.1907 | 14.635 | 16.6387 | 17.5568 | 18.0225 | 18.6184 | 19.9778 | 26.1084 | 33.5212 |
| u217 | 7.8896 | 8.2925 | 8.6228 | 8.877 | 9.4811 | 11.1903 | 14.6368 | 16.6401 | 17.5576 | 18.0225 | 18.6186 | 19.978 | 26.108 | 33.5207 |
| u218 | 7.8811 | 8.2825 | 8.6221 | 8.8791 | 9.4797 | 11.1849 | 14.6283 | 16.6333 | 17.5528 | 18.023 | 18.6193 | 19.9766 | 26.1054 | 33.5214 |
| u219 | 7.8896 | 8.2808 | 8.6208 | 8.8792 | 9.4794 | 11.1852 | 14.6269 | 16.6317 | 17.5517 | 18.023 | 18.6191 | 19.9764 | 26.1055 | 33.5203 |
| u220 | 7.8897 | 8.2959 | 8.6348 | 8.8766 | 9.4582 | 11.1462 | 14.5713 | 16.5785 | 17.518 | 18.0218 | 18.6454 | 20.0373 | 26.2332 | 33.7822 |
| u221 | 7.8814 | 8.2975 | 8.6361 | 8.8766 | 9.4584 | 11.1459 | 14.5731 | 16.5799 | 17.5188 | 18.0219 | 18.6455 | 20.0375 | 26.2329 | 33.7828 |
| u222 | 7.8896 | 8.3075 | 8.6369 | 8.8747 | 9.4597 | 11.1514 | 14.5823 | 16.5865 | 17.5233 | 18.0215 | 18.6446 | 20.0388 | 26.2346 | 33.7842 |
| u223 | 7.8978 | 8.3057 | 8.6356 | 8.8749 | 9.4593 | 11.1517 | 14.5808 | 16.585 | 17.5224 | 18.0215 | 18.6444 | 20.0386 | 26.2341 | 33.7835 |
| u224 | 9.406 | 10.029 | 10.4958 | 10.7769 | 11.4044 | 13.2335 | 16.9958 | 18.9586 | 19.7149 | 20.0476 | 20.5075 | 21.7651 | 28.2323 | 36.09 |
| u225 | 9.4201 | 10.0443 | 10.4903 | 10.7769 | 11.4035 | 13.2343 | 16.9933 | 18.9557 | 19.7143 | 20.0481 | 20.5073 | 21.7647 | 28.2321 | 36.0934 |
| u226 | 9.4366 | 10.0398 | 10.475 | 10.7713 | 11.4068 | 13.2445 | 17.009 | 18.9714 | 19.7173 | 20.0451 | 20.5063 | 21.7695 | 28.2375 | 36.0975 |
| u227 | 9.4206 | 10.0241 | 10.4803 | 10.7735 | 11.4063 | 13.2437 | 17.0123 | 18.9743 | 19.7178 | 20.0446 | 20.5064 | 21.7694 | 28.2371 | 36.0973 |
| u228 | 9.6569 | 10.1253 | 10.4988 | 10.7403 | 11.3508 | 13.1705 | 16.9142 | 18.8855 | 19.6972 | 20.1089 | 20.6438 | 22.0063 | 28.6932 | 36.9209 |
| u229 | 9.6905 | 10.1436 | 10.493 | 10.7402 | 11.3499 | 13.1712 | 16.912 | 18.8832 | 19.6967 | 20.1094 | 20.6437 | 22.0061 | 28.6934 | 36.9229 |
| u230 | 9.6554 | 10.1446 | 10.5094 | 10.7474 | 11.3473 | 13.1625 | 16.8986 | 18.871 | 19.6942 | 20.1121 | 20.6447 | 22.0005 | 28.6847 | 36.9118 |
| u231 | 9.6255 | 10.1272 | 10.5154 | 10.7495 | 11.3479 | 13.1618 | 16.9006 | 18.8732 | 19.6946 | 20.1117 | 20.6448 | 22.0008 | 28.6844 | 36.9133 |
| u232 | 9.8133 | 10.4463 | 10.9419 | 11.2256 | 11.8494 | 13.7408 | 17.6676 | 19.86 | 21.0358 | 21.6688 | 22.2882 | 23.698 | 30.7057 | 39.2576 |
| u233 | 9.844 | 10.4621 | 10.9304 | 11.225 | 11.8483 | 13.7423 | 17.6615 | 19.8509 | 21.0269 | 21.6665 | 22.2884 | 23.698 | 30.705 | 39.2601 |
| u234 | 9.8783 | 10.4767 | 10.9134 | 11.212 | 11.8512 | 13.763 | 17.7008 | 19.9036 | 21.0738 | 21.6822 | 22.2863 | 23.6838 | 30.6906 | 39.2544 |
| u235 | 9.845 | 10.4604 | 10.9246 | 11.212 | 11.8524 | 13.7615 | 17.7071 | 19.9132 | 21.0831 | 21.6846 | 22.286 | 23.6839 | 30.6895 | 39.2571 |
| u236 | 9.6445 | 10.3272 | 10.8644 | 11.2391 | 11.9513 | 13.926 | 17.9622 | 20.2447 | 21.4815 | 22.2184 | 22.9182 | 24.4558 | 31.8914 | 41.0564 |
| u237 | 9.6665 | 10.3426 | 10.8549 | 11.2388 | 11.9502 | 13.9275 | 17.9564 | 20.2352 | 21.4707 | 22.214 | 22.9184 | 24.456 | 31.8925 | 41.056 |
| u238 | 9.644 | 10.3356 | 10.871 | 11.2511 | 11.9482 | 13.907 | 17.9712 | 20.1799 | 21.4148 | 22.1828 | 22.9132 | 24.4859 | 31.9569 | 41.1837 |
| u239 | 9.6238 | 10.3209 | 10.8807 | 11.251 | 11.9493 | 13.9064 | 17.9233 | 20.1897 | 21.4254 | 22.1871 | 22.913 | 24.4857 | 31.9562 | 41.1846 |
| u240 | 10.5191 | 11.5819 | 12.3755 | 12.8897 | 13.7318 | 15.9161 | 20.3226 | 22.6258 | 23.6472 | 24.176 | 24.7645 | 26.258 | 33.9905 | 43.4805 |
| u241 | 10.6585 | 11.5623 | 12.3568 | 12.9069 | 13.7368 | 15.9104 | 20.3344 | 22.6457 | 23.6657 | 24.1783 | 24.7618 | 26.2589 | 33.9868 | 43.4906 |
| u242 | 10.8339 | 11.7509 | 12.451 | 12.9129 | 13.7014 | 15.8513 | 20.2511 | 22.5435 | 23.5781 | 24.1617 | 24.8226 | 26.3894 | 34.2283 | 43.959 |
| u243 | 10.661 | 11.7946 | 12.4701 | 12.8943 | 13.6963 | 15.8563 | 20.2407 | 22.5274 | 23.5639 | 24.1599 | 24.825 | 26.3884 | 34.2342 | 43.9451 |
| u244 | 10.981 | 12.068 | 12.8109 | 13.3251 | 14.1531 | 16.3735 | 20.8844 | 23.2617 | 24.4679 | 25.3779 | 26.2308 | 27.9294 | 36.1527 | 46.2656 |
| u245 | 11.1191 | 12.0112 | 12.8087 | 13.3498 | 14.1661 | 16.3659 | 20.9073 | 23.3085 | 24.5293 | 25.4224 | 26.2426 | 27.9226 | 36.168 | 46.2419 |
| u246 | 10.9793 | 11.833 | 12.6742 | 13.2986 | 14.2011 | 16.4679 | 21.0881 | 23.5775 | 24.8664 | 25.8163 | 26.7608 | 28.5298 | 37.0508 | 47.5462 |
| u247 | 10.8521 | 11.8708 | 12.6818 | 13.2764 | 14.1887 | 16.4747 | 21.0659 | 23.5295 | 24.8018 | 25.7607 | 26.7335 | 28.5335 | 37.0124 | 47.6363 |
| u248 | 11.8849 | 13.0905 | 13.8038 | 14.7073 | 15.7619 | 18.2722 | 23.3749 | 25.9665 | 27.1115 | 27.8003 | 28.5556 | 30.2833 | 39.2788 | 49.9734 |
| u249 | 12.1473 | 12.7965 | 13.9846 | 14.6519 | 15.7781 | 18.3236 | 23.3027 | 25.8731 | 27.0076 | 27.7231 | 28.5582 | 30.3631 | 39.1189 | 50.2915 |
| u250 | 12.3356 | 13.1171 | 14.3402 | 15.0024 | 16.1878 | 18.8351 | 23.8997 | 26.5293 | 27.7366 | 28.6179 | 29.7394 | 31.7068 | 41.8153 | 52.5015 |
| u251 | 12.1456 | 13.3623 | 14.1289 | 15.12 | 16.2129 | 18.7701 | 24.0313 | 26.7441 | 28.0325 | 28.9814 | 30.1716 | 32.2652 | 41.0617 | 53.5837 |
| u252 | 13.7855 | 14.4369 | 15.0929 | 16.5631 | 17.984 | 20.9825 | 26.1538 | 29.0357 | 30.255 | 30.9837 | 31.959 | 33.9882 | 45.9289 | 56.0888 |
| u253 | 13.4087 | 14.1236 | 15.5384 | 16.105 | 17.5044 | 20.4569 | 26.7657 | 29.703 | 30.9894 | 31.8448 | 33.0897 | 35.4623 | 43.9207 | 58.6894 |
| u254 | 13.8029 | 17.3788 | 16.5633 | 19.6359 | 21.3364 | 25.035 | 29.0581 | 32.2728 | 33.5757 | 34.2999 | 35.3836 | 37.7081 | 52.1355 | 61.9867 |

-continued

| u255 | 16.1623 | 15.4188 | 18.5496 | 17.6602 | 19.2927 | 22.6969 | 31.9833 | 35.4419 | 36.7557 | 37.3543 | 38.322 | 40.6078 | 48.6564 | 66.1131 |
|---|---|---|---|---|---|---|---|---|---|---|---|---|---|---|
| SNR | 28 | 29 | 30 | 31 | 32 | 33 | 34 | 35 | 36 | 37 | 38 | 39 | 40 | |
| u1 | 1 | 1.0002 | 0.9997 | 1.0011 | 1.0004 | 0.9998 | 0.9997 | 0.9995 | 0.9999 | 1.001 | 1.0006 | 0.9987 | 1.0018 | |
| u2 | 1.0001 | 1.0004 | 0.9993 | 1.0005 | 1.0012 | 0.9989 | 1 | 1.0007 | 1.0015 | 1.0005 | 1.0033 | 0.9988 | 0.9997 | |
| u3 | 1.0003 | 1.0002 | 0.9998 | 1.0003 | 1.0005 | 0.9988 | 1.0009 | 1.0001 | 1.0011 | 0.9977 | 1.0022 | 1.0004 | 1.0053 | |
| u4 | 1 | 1.0005 | 0.9999 | 1.0006 | 1.001 | 1.0008 | 1 | 1.0019 | 1.0011 | 0.9986 | 1.0075 | 2.6751 | 2.8869 | |
| u5 | 1.0002 | 1.0007 | 0.9995 | 1.0013 | 1.0015 | 1.0001 | 1.0019 | 1.0005 | 1.0005 | 1.0008 | 1.0083 | 2.6756 | 2.9038 | |
| u6 | 1.0004 | 1.0005 | 0.9996 | 1.0003 | 1.0009 | 1.0006 | 0.9994 | 0.9987 | 1.0002 | 1.0003 | 1.0052 | 2.6755 | 2.8783 | |
| u7 | 0.9998 | 1.0004 | 1.0001 | 1.0001 | 1 | 1.0015 | 0.9995 | 1.0009 | 1.0001 | 0.999 | 1.0041 | 2.6763 | 2.8853 | |
| u8 | 1.0007 | 1.0006 | 0.9996 | 1.0044 | 1.0836 | 2.671 | 2.9144 | 2.9824 | 2.9977 | 3.0018 | 3.0114 | 4.6738 | 4.8911 | |
| u9 | 1.0006 | 1.0008 | 0.9992 | 1.006 | 1.0845 | 2.6721 | 2.9145 | 2.9817 | 2.9961 | 3.0001 | 3.0118 | 4.6745 | 4.8638 | |
| u10 | 1.0008 | 1.0011 | 0.9989 | 1.0062 | 1.0855 | 2.6704 | 2.9144 | 2.9818 | 2.9967 | 2.9989 | 3.0081 | 4.6734 | 4.8696 | |
| u11 | 1.0008 | 1.0009 | 0.9993 | 1.0053 | 1.0841 | 2.6696 | 2.9146 | 2.9807 | 2.9971 | 3.0021 | 3.0085 | 4.6741 | 4.8821 | |
| u12 | 1.0001 | 1.0008 | 0.9986 | 1.0041 | 1.0839 | 2.671 | 2.9138 | 2.9819 | 2.9977 | 3.0012 | 3.0165 | 6.3541 | 6.8065 | |
| u13 | 1.0004 | 1.0009 | 0.9983 | 1.0043 | 1.086 | 2.6718 | 2.9146 | 2.9819 | 2.9973 | 2.9994 | 3.0162 | 6.3556 | 6.7927 | |
| u14 | 1.0005 | 1.0006 | 0.9988 | 1.0048 | 1.0843 | 2.6735 | 2.9142 | 2.9826 | 2.9966 | 2.9993 | 3.019 | 6.3541 | 6.7957 | |
| u15 | 1.0001 | 1.0004 | 0.9989 | 1.0047 | 1.0828 | 2.6701 | 2.9134 | 2.9818 | 2.9975 | 3.0023 | 3.0201 | 6.3533 | 6.7981 | |
| u16 | 2.9258 | 2.9874 | 2.9976 | 3.0083 | 3.0648 | 4.6709 | 4.9167 | 4.9876 | 5.002 | 5.0068 | 5.0171 | 8.3525 | 8.8072 | |
| u17 | 2.9258 | 2.9872 | 2.998 | 3.0083 | 3.0648 | 4.671 | 4.9168 | 4.9882 | 5.0009 | 5.0065 | 5.0154 | 8.3534 | 8.7891 | |
| u18 | 2.9258 | 2.9863 | 2.9979 | 3.0088 | 3.065 | 4.6727 | 4.9176 | 4.9886 | 5.0021 | 5.0076 | 5.0169 | 8.3537 | 8.8201 | |
| u19 | 2.9259 | 2.9864 | 2.9978 | 3.0089 | 3.0647 | 4.6718 | 4.9169 | 4.9877 | 5.0012 | 5.0068 | 5.0183 | 8.3551 | 8.8293 | |
| u20 | 2.926 | 2.9875 | 2.9977 | 3.0088 | 3.0645 | 4.6726 | 4.9172 | 4.9893 | 5.0023 | 5.0063 | 5.0351 | 10.0467 | 10.7435 | |
| u21 | 2.9261 | 2.9873 | 2.9979 | 3.0086 | 3.0647 | 4.6713 | 4.9173 | 4.9902 | 5.0009 | 5.0062 | 5.0331 | 10.0471 | 10.7383 | |
| u22 | 2.9261 | 2.9879 | 2.998 | 3.0083 | 3.0643 | 4.6714 | 4.9178 | 4.9899 | 5.0007 | 5.007 | 5.0316 | 10.0467 | 10.7509 | |
| u23 | 2.926 | 2.988 | 2.9978 | 3.0087 | 3.0642 | 4.6705 | 4.9171 | 4.9886 | 5.0009 | 5.0056 | 5.0337 | 10.0454 | 10.7746 | |
| u24 | 2.9261 | 2.9884 | 2.998 | 3.0159 | 3.2009 | 6.3634 | 6.8446 | 6.9827 | 7.0056 | 7.0188 | 7.0226 | 12.0464 | 12.7787 | |
| u25 | 2.926 | 2.9883 | 2.998 | 3.016 | 3.2012 | 6.3649 | 6.8445 | 6.9821 | 7.006 | 7.0162 | 7.0236 | 12.0451 | 12.7739 | |
| u26 | 2.926 | 2.9876 | 2.9977 | 3.0164 | 3.2021 | 6.3652 | 6.8449 | 6.9834 | 7.0068 | 7.0172 | 7.0225 | 12.046 | 12.796 | |
| u27 | 2.9261 | 2.9877 | 2.9977 | 3.0166 | 3.2017 | 6.3654 | 6.8439 | 6.9832 | 7.0068 | 7.0185 | 7.0221 | 12.0459 | 12.7936 | |
| u28 | 2.9254 | 2.9869 | 2.9972 | 3.0169 | 3.2021 | 6.3656 | 6.8436 | 6.9843 | 7.0066 | 7.0174 | 7.0583 | 13.7568 | 14.7454 | |
| u29 | 2.9255 | 2.9867 | 2.9972 | 3.0166 | 3.2025 | 6.3655 | 6.8436 | 6.9836 | 7.0071 | 7.0171 | 7.0593 | 13.755 | 14.7321 | |
| u30 | 2.9256 | 2.9872 | 2.9977 | 3.016 | 3.2019 | 6.3654 | 6.8441 | 6.9831 | 7.0056 | 7.0164 | 7.0606 | 13.7554 | 14.7533 | |
| u31 | 2.9255 | 2.9873 | 2.9978 | 3.0158 | 3.2012 | 6.3645 | 6.8445 | 6.9836 | 7.0053 | 7.0167 | 7.0596 | 13.7551 | 14.742 | |
| u32 | 4.943 | 5.0066 | 5.0138 | 5.0267 | 5.1163 | 8.3693 | 8.8596 | 9.005 | 9.0251 | 9.0365 | 9.0268 | 15.7582 | 16.7635 | |
| u33 | 4.9428 | 5.0067 | 5.0142 | 5.0261 | 5.1169 | 8.3694 | 8.8581 | 9.005 | 9.0227 | 9.0368 | 9.0258 | 15.7574 | 16.7563 | |
| u34 | 4.9428 | 5.0069 | 5.0143 | 5.0257 | 5.1163 | 8.3694 | 8.8589 | 9.0053 | 9.0215 | 9.0349 | 9.0251 | 15.7583 | 16.7781 | |
| u35 | 4.9431 | 5.0066 | 5.0141 | 5.026 | 5.1154 | 8.3699 | 8.8593 | 9.0053 | 9.0232 | 9.0372 | 9.0266 | 15.7578 | 16.8022 | |
| u36 | 4.9429 | 5.0065 | 5.0143 | 5.0264 | 5.1165 | 8.3701 | 8.859 | 9.0057 | 9.023 | 9.0355 | 9.1026 | 17.4856 | 18.756 | |
| u37 | 4.943 | 5.0067 | 5.0146 | 5.0259 | 5.1169 | 8.3688 | 8.8579 | 9.0058 | 9.0213 | 9.0357 | 9.1029 | 17.4872 | 18.7621 | |
| u38 | 4.9431 | 5.0064 | 5.0144 | 5.0263 | 5.1176 | 8.361 | 8.8581 | 9.0061 | 9.0232 | 9.0361 | 9.1028 | 17.4879 | 18.7421 | |
| u39 | 4.9431 | 5.0063 | 5.0141 | 5.0265 | 5.1171 | 8.3698 | 8.8589 | 9.0058 | 9.0244 | 9.0362 | 9.1028 | 17.4864 | 18.7824 | |
| u40 | 4.9434 | 5.007 | 5.0146 | 5.0464 | 5.3808 | 10.1049 | 10.8109 | 11.0209 | 11.0452 | 11.0631 | 11.0233 | 19.4901 | 20.7983 | |
| u41 | 4.9431 | 5.0072 | 5.0148 | 5.0458 | 5.3821 | 10.1052 | 10.8111 | 11.0207 | 11.0469 | 11.0636 | 11.0241 | 19.4896 | 20.8081 | |
| u42 | 4.943 | 5.0074 | 5.0147 | 5.0458 | 5.3819 | 10.1043 | 10.8111 | 11.0201 | 11.0477 | 11.0623 | 11.0245 | 19.4909 | 20.7991 | |
| u43 | 4.9432 | 5.0072 | 5.0145 | 5.0461 | 5.3807 | 10.106 | 10.8102 | 11.0201 | 11.0455 | 11.062 | 11.0235 | 19.4897 | 20.8173 | |
| u44 | 4.9427 | 5.0075 | 5.0136 | 5.0456 | 5.3798 | 10.1054 | 10.8103 | 11.0208 | 11.0452 | 11.0615 | 11.1787 | 21.2453 | 22.758 | |
| u45 | 4.9428 | 5.0076 | 5.014 | 5.0453 | 5.3808 | 10.1043 | 10.8108 | 11.0209 | 11.0477 | 11.0619 | 11.1793 | 21.245 | 22.7904 | |
| u46 | 4.943 | 5.0072 | 5.0141 | 5.0453 | 5.3812 | 10.1046 | 10.8112 | 11.0214 | 11.0474 | 11.0617 | 11.1788 | 21.244 | 22.7842 | |
| u47 | 4.9429 | 5.0069 | 5.0139 | 5.0459 | 5.38 | 10.1056 | 10.811 | 11.0213 | 11.0442 | 11.0629 | 11.1783 | 21.2443 | 22.7874 | |
| u48 | 6.9184 | 7.035 | 7.0489 | 7.0528 | 7.18 | 12.1168 | 12.8458 | 13.0654 | 13.0877 | 13.098 | 13.0171 | 23.2538 | 24.7711 | |
| u49 | 6.9183 | 7.0347 | 7.0485 | 7.0536 | 7.1793 | 12.1183 | 12.8454 | 13.066 | 13.0859 | 13.0988 | 13.0178 | 23.2544 | 24.8001 | |
| u50 | 6.918 | 7.0349 | 7.0482 | 7.0535 | 7.1794 | 12.1185 | 12.8458 | 13.0655 | 13.0853 | 13.0992 | 13.018 | 23.2522 | 24.8226 | |
| u51 | 6.9182 | 7.035 | 7.0487 | 7.053 | 7.1801 | 12.1168 | 12.8456 | 13.0656 | 13.0871 | 13.0994 | 13.0168 | 23.2528 | 24.8065 | |
| u52 | 6.918 | 7.0349 | 7.0485 | 7.0531 | 7.1795 | 12.1169 | 12.8459 | 13.0656 | 13.087 | 13.1016 | 13.317 | 25.0373 | 26.7414 | |
| u53 | 6.9178 | 7.0346 | 7.0479 | 7.0533 | 7.1787 | 12.1181 | 12.8463 | 13.0653 | 13.0856 | 13.1012 | 13.317 | 25.0387 | 26.7576 | |
| u54 | 6.918 | 7.0343 | 7.0484 | 7.0533 | 7.179 | 12.1169 | 12.8458 | 13.0657 | 13.0865 | 13.1 | 13.3165 | 25.0376 | 26.7502 | |
| u55 | 6.9181 | 7.0344 | 7.0483 | 7.0531 | 7.1796 | 12.1182 | 12.8459 | 13.0654 | 13.0882 | 13.1006 | 13.3156 | 25.037 | 26.7618 | |
| u56 | 6.9179 | 7.0351 | 7.0525 | 7.102 | 7.6835 | 13.912 | 14.836 | 15.1128 | 15.1389 | 15.1479 | 15.0352 | 27.0541 | 28.7752 | |
| u57 | 6.9178 | 7.0349 | 7.052 | 7.1025 | 7.6829 | 13.913 | 14.8349 | 15.1121 | 15.1387 | 15.1479 | 15.0335 | 27.0545 | 28.7672 | |
| u58 | 6.9175 | 7.0351 | 7.0515 | 7.1026 | 7.6827 | 13.911 | 14.836 | 15.1126 | 15.1396 | 15.1466 | 15.0335 | 27.0547 | 28.8046 | |
| u59 | 6.9176 | 7.0352 | 7.052 | 7.102 | 7.6833 | 13.9101 | 14.8368 | 15.1125 | 15.1403 | 15.1473 | 15.0337 | 27.0524 | 28.8706 | |
| u60 | 6.9176 | 7.0355 | 7.0517 | 7.1019 | 7.6838 | 13.9096 | 14.8368 | 15.1121 | 15.1403 | 15.1524 | 15.5652 | 28.8737 | 30.7564 | |
| u61 | 6.9175 | 7.0352 | 7.0512 | 7.1023 | 7.6832 | 13.9096 | 14.8358 | 15.1124 | 15.1406 | 15.1522 | 15.5659 | 28.8742 | 30.762 | |
| u62 | 6.9178 | 7.0349 | 7.0518 | 7.1021 | 7.6834 | 13.9106 | 14.8361 | 15.1119 | 15.1401 | 15.1533 | 15.5665 | 28.8733 | 30.774 | |
| u63 | 6.9179 | 7.0349 | 7.0525 | 7.1015 | 7.684 | 13.9105 | 14.8364 | 15.1119 | 15.1387 | 15.1538 | 15.5656 | 28.8728 | 30.7724 | |
| u64 | 8.9889 | 9.1124 | 9.1154 | 9.0905 | 9.3435 | 15.939 | 16.9029 | 17.1925 | 17.2145 | 17.2075 | 17.1515 | 30.8997 | 32.8382 | |
| u65 | 8.989 | 9.1124 | 9.1155 | 9.09 | 9.3429 | 15.9401 | 16.9024 | 17.192 | 17.2135 | 17.2078 | 17.1513 | 30.897 | 32.834 | |
| u66 | 8.989 | 9.1125 | 9.1154 | 9.0887 | 9.3429 | 15.9396 | 16.9015 | 17.1922 | 17.2131 | 17.2089 | 17.1513 | 30.898 | 32.8385 | |
| u67 | 8.9889 | 9.1124 | 9.1154 | 9.0894 | 9.3422 | 15.9389 | 16.9016 | 17.1924 | 17.2135 | 17.2108 | 17.1519 | 30.9004 | 32.8425 | |
| u68 | 8.9888 | 9.1115 | 9.1153 | 9.0893 | 9.3432 | 15.9391 | 16.902 | 17.1913 | 17.2136 | 17.224 | 17.9625 | 32.7536 | 34.8915 | |
| u69 | 8.989 | 9.1116 | 9.1154 | 9.0883 | 9.3445 | 15.9387 | 16.9021 | 17.1917 | 17.2133 | 17.2239 | 17.9625 | 32.754 | 34.9238 | |
| u70 | 8.989 | 9.1113 | 9.1155 | 9.0894 | 9.3428 | 15.9393 | 16.9031 | 17.1917 | 17.2128 | 17.2219 | 17.9618 | 32.7537 | 34.9064 | |
| u71 | 8.9888 | 9.1112 | 9.1154 | 9.0901 | 9.3422 | 15.9397 | 16.9029 | 17.1919 | 17.2141 | 17.2218 | 17.9621 | 32.7539 | 34.8983 | |
| u72 | 8.9883 | 9.1126 | 9.1278 | 9.2152 | 10.1727 | 17.8043 | 18.9416 | 19.284 | 19.3025 | 19.2838 | 19.4368 | 34.7917 | 37.0328 | |
| u73 | 8.9883 | 9.1127 | 9.1278 | 9.2144 | 10.1728 | 17.8043 | 18.9422 | 19.2843 | 19.3034 | 19.2823 | 19.4362 | 34.7938 | 37.0074 | |
| u74 | 8.9883 | 9.1128 | 9.1275 | 9.2134 | 10.1728 | 17.8046 | 18.9422 | 19.2835 | 19.3034 | 19.2808 | 19.4366 | 34.7931 | 37.049 | |
| u75 | 8.9883 | 9.1126 | 9.1274 | 9.214 | 10.1726 | 17.804 | 18.9418 | 19.2838 | 19.3031 | 19.2822 | 19.4366 | 34.7921 | 37.0498 | |

-continued

| | | | | | | | | | | | | | |
|---|---|---|---|---|---|---|---|---|---|---|---|---|---|
| u76 | 8.9879 | 9.1136 | 9.127 | 9.2139 | 10.1717 | 17.8043 | 18.9408 | 19.283 | 19.3045 | 19.3161 | 20.4608 | 36.6833 | 39.1338 |
| u77 | 8.9882 | 9.1135 | 9.1271 | 9.2133 | 10.1715 | 17.8034 | 18.9414 | 19.2829 | 19.3053 | 19.3159 | 20.4601 | 36.6848 | 39.1318 |
| u78 | 8.9882 | 9.1132 | 9.1274 | 9.2141 | 10.1715 | 17.8037 | 18.9416 | 19.2832 | 19.3039 | 19.3173 | 20.4615 | 36.6846 | 39.1573 |
| u79 | 8.9879 | 9.113 | 9.1276 | 9.2149 | 10.1715 | 17.8046 | 18.9412 | 19.2829 | 19.3044 | 19.3177 | 20.4603 | 36.6855 | 39.1485 |
| u80 | 11.0636 | 11.2257 | 11.2138 | 11.1333 | 11.7119 | 19.8603 | 21.0509 | 21.4132 | 21.4179 | 21.3639 | 21.8706 | 38.7381 | 41.2799 |
| u81 | 11.0635 | 11.2255 | 11.2144 | 11.133 | 11.7116 | 19.8599 | 21.0506 | 21.4127 | 21.4183 | 21.3649 | 21.8712 | 38.7377 | 41.274 |
| u82 | 11.0637 | 11.2257 | 11.2154 | 11.1333 | 11.714 | 19.8602 | 21.0514 | 21.412 | 21.4187 | 21.367 | 21.8696 | 38.7374 | 41.2822 |
| u83 | 11.0639 | 11.2255 | 11.2149 | 11.1333 | 11.7117 | 19.8611 | 21.0516 | 21.4124 | 21.4181 | 21.3652 | 21.8704 | 38.7382 | 41.2946 |
| u84 | 11.0636 | 11.2256 | 11.2147 | 11.1325 | 11.7111 | 19.8606 | 21.0519 | 21.412 | 21.4196 | 21.4457 | 23.0163 | 40.6713 | 43.3561 |
| u85 | 11.0637 | 11.2254 | 11.2151 | 11.1323 | 11.7113 | 19.8594 | 21.0518 | 21.4115 | 21.4193 | 21.4475 | 23.0154 | 40.6708 | 43.3658 |
| u86 | 11.0636 | 11.2251 | 11.2143 | 11.1324 | 11.7106 | 19.8593 | 21.0512 | 21.4123 | 21.4197 | 21.4453 | 23.0154 | 40.669 | 43.3851 |
| u87 | 11.0634 | 11.2251 | 11.2137 | 11.132 | 11.714 | 19.8607 | 21.0514 | 21.4125 | 21.4195 | 21.4441 | 23.0154 | 40.6703 | 43.3788 |
| u88 | 11.0635 | 11.2303 | 11.255 | 11.4297 | 12.8247 | 21.8089 | 23.1564 | 23.5571 | 23.5565 | 23.4484 | 24.4043 | 42.7415 | 45.4971 |
| u89 | 11.0633 | 11.2301 | 11.2554 | 11.4297 | 12.8245 | 21.8089 | 23.1564 | 23.5628 | 23.5571 | 23.4487 | 24.4032 | 42.7419 | 45.4756 |
| u90 | 11.0633 | 11.2303 | 11.2562 | 11.4299 | 12.8252 | 21.8093 | 23.1561 | 23.5638 | 23.5551 | 23.4475 | 24.4028 | 42.7419 | 45.5104 |
| u91 | 11.0634 | 11.2305 | 11.2557 | 11.4301 | 12.8255 | 21.8085 | 23.1563 | 23.5634 | 23.5551 | 23.4477 | 24.4038 | 42.7423 | 45.5011 |
| u92 | 11.0627 | 11.2306 | 11.2554 | 11.4311 | 12.8253 | 21.8092 | 23.1564 | 23.5634 | 23.5585 | 23.6271 | 25.6147 | 44.7195 | 47.5966 |
| u93 | 11.063 | 11.2304 | 11.2559 | 11.4304 | 12.825 | 21.8076 | 23.1563 | 23.5634 | 23.5585 | 23.6292 | 25.6146 | 44.7194 | 47.5794 |
| u94 | 11.0631 | 11.23 | 11.2552 | 11.4304 | 12.8244 | 21.8081 | 23.1568 | 23.5627 | 23.5601 | 23.63 | 25.6146 | 44.7185 | 47.5895 |
| u95 | 11.063 | 11.23 | 11.2548 | 11.4308 | 12.8248 | 21.8085 | 23.1569 | 23.5624 | 23.5605 | 23.6289 | 25.6147 | 44.7188 | 47.6034 |
| u96 | 13.238 | 13.4045 | 13.3474 | 13.2218 | 14.3021 | 23.9092 | 25.3244 | 25.7523 | 25.7204 | 25.5373 | 27.0007 | 46.8185 | 49.7372 |
| u97 | 13.2379 | 13.4042 | 13.3472 | 13.2221 | 14.3023 | 23.9098 | 25.3243 | 25.7529 | 25.7207 | 25.5368 | 27.0028 | 46.8174 | 49.7333 |
| u98 | 13.2383 | 13.404 | 13.3474 | 13.2222 | 14.3029 | 23.9092 | 25.3255 | 25.7533 | 25.7214 | 25.5382 | 27.0018 | 46.8156 | 49.7527 |
| u99 | 13.2385 | 13.4039 | 13.3477 | 13.2222 | 14.3012 | 23.9103 | 25.3258 | 25.7523 | 25.7213 | 25.5391 | 27.0024 | 46.817 | 49.7679 |
| u100 | 13.2378 | 13.4047 | 13.3472 | 13.2224 | 14.3027 | 23.9087 | 25.3249 | 25.7531 | 25.734 | 25.9116 | 28.2609 | 48.8416 | 51.9278 |
| u101 | 13.2378 | 13.4046 | 13.3469 | 13.222 | 14.3024 | 23.9092 | 25.3248 | 25.7536 | 25.734 | 25.9119 | 28.2599 | 48.8413 | 51.9214 |
| u102 | 13.2375 | 13.4047 | 13.3468 | 13.2221 | 14.302 | 23.9096 | 25.324 | 25.7535 | 25.7331 | 25.9103 | 28.2605 | 48.8403 | 51.9044 |
| u103 | 13.2375 | 13.4048 | 13.3471 | 13.2225 | 14.3015 | 23.91 | 25.3242 | 25.7524 | 25.7325 | 25.9106 | 28.2616 | 48.8409 | 51.9312 |
| u104 | 13.2391 | 13.4233 | 13.4684 | 13.8408 | 15.5915 | 25.9553 | 27.5089 | 27.9747 | 27.9107 | 27.6829 | 29.6585 | 50.9665 | 54.1339 |
| u105 | 13.2389 | 13.4231 | 13.4682 | 13.8403 | 15.5907 | 25.9553 | 27.5085 | 27.9736 | 27.9119 | 27.6841 | 29.6577 | 50.9663 | 54.1353 |
| u106 | 13.239 | 13.4228 | 13.4683 | 13.8398 | 15.5901 | 25.9561 | 27.5075 | 27.9729 | 27.912 | 27.6833 | 29.6589 | 50.9668 | 54.1497 |
| u107 | 13.2392 | 13.4229 | 13.4688 | 13.8403 | 15.5904 | 25.9557 | 27.5079 | 27.9735 | 27.9103 | 27.6833 | 29.658 | 50.9656 | 54.153 |
| u108 | 13.2393 | 13.4222 | 13.4685 | 13.8404 | 15.5907 | 25.9561 | 27.5071 | 27.9737 | 27.9447 | 28.3612 | 30.9625 | 53.0371 | 56.3735 |
| u109 | 13.2393 | 13.4219 | 13.4683 | 13.8397 | 15.59 | 25.9555 | 27.5069 | 27.9728 | 27.9449 | 28.3617 | 30.9625 | 53.0375 | 56.3731 |
| u110 | 13.2391 | 13.422 | 13.4684 | 13.8401 | 15.5907 | 25.9546 | 27.5083 | 27.9736 | 27.9445 | 28.3619 | 30.9619 | 53.0392 | 56.3708 |
| u111 | 13.2392 | 13.422 | 13.4686 | 13.8405 | 15.5915 | 25.9555 | 27.5086 | 27.9746 | 27.9429 | 28.3611 | 30.9626 | 53.0367 | 56.3715 |
| u112 | 15.4682 | 15.6379 | 15.5055 | 15.4971 | 17.0655 | 28.1189 | 29.7544 | 30.2383 | 30.1253 | 29.9964 | 32.377 | 55.1971 | 58.6171 |
| u113 | 15.468 | 15.6378 | 15.5053 | 15.4946 | 17.066 | 28.1209 | 29.7552 | 30.2392 | 30.1233 | 29.9954 | 32.3779 | 55.1981 | 58.6306 |
| u114 | 15.4686 | 15.6374 | 15.5057 | 15.4942 | 17.0666 | 28.1201 | 29.7563 | 30.2425 | 30.1228 | 29.9966 | 32.3777 | 55.1972 | 58.6651 |
| u115 | 15.4691 | 15.6373 | 15.506 | 15.4947 | 17.0661 | 28.1177 | 29.7553 | 30.2416 | 30.1244 | 29.9972 | 32.3781 | 55.1962 | 58.6498 |
| u116 | 15.468 | 15.6383 | 15.5056 | 15.4943 | 17.0656 | 28.1195 | 29.7554 | 30.2423 | 30.2081 | 30.9996 | 33.727 | 57.3247 | 60.9064 |
| u117 | 15.4683 | 15.6382 | 15.5053 | 15.4973 | 17.0666 | 28.121 | 29.7563 | 30.2431 | 30.206 | 31.0002 | 33.7268 | 57.3256 | 60.9193 |
| u118 | 15.4684 | 15.6384 | 15.505 | 15.4951 | 17.0657 | 28.1213 | 29.7559 | 30.2397 | 30.2067 | 31.0002 | 33.7276 | 57.326 | 60.9137 |
| u119 | 15.4682 | 15.6383 | 15.5053 | 15.4945 | 17.0656 | 28.1197 | 29.7547 | 30.2385 | 30.2086 | 30.9994 | 33.7265 | 57.3265 | 60.913 |
| u120 | 15.48 | 15.7077 | 15.8267 | 16.5167 | 18.4674 | 30.2759 | 32.0361 | 32.5546 | 32.346 | 32.5328 | 35.1644 | 59.531 | 63.2167 |
| u121 | 15.4799 | 15.7078 | 15.8268 | 16.5166 | 18.4668 | 30.2747 | 32.0366 | 32.5542 | 32.3485 | 32.5336 | 35.1642 | 59.5306 | 63.2233 |
| u122 | 15.4799 | 15.7074 | 15.8261 | 16.516 | 18.4664 | 30.2751 | 32.037 | 32.5432 | 32.3499 | 32.5335 | 35.1641 | 59.5279 | 63.2191 |
| u123 | 15.4803 | 15.7072 | 15.8264 | 16.516 | 18.467 | 30.2755 | 32.0371 | 32.5438 | 32.3467 | 32.5332 | 35.164 | 59.5293 | 63.2293 |
| u124 | 15.4794 | 15.7063 | 15.8264 | 16.5155 | 18.467 | 30.2739 | 32.0364 | 32.5435 | 32.5496 | 33.7543 | 36.5568 | 61.7197 | 65.5387 |
| u125 | 15.4802 | 15.7063 | 15.8261 | 16.5153 | 18.4661 | 30.2741 | 32.0363 | 32.5431 | 32.5496 | 33.7546 | 36.5566 | 61.7199 | 65.5305 |
| u126 | 15.4805 | 15.7065 | 15.8269 | 16.5162 | 18.4666 | 30.2737 | 32.0363 | 32.5538 | 32.5461 | 33.754 | 36.5569 | 61.7182 | 65.5472 |
| u127 | 15.4804 | 15.7064 | 15.8271 | 16.5166 | 18.4677 | 30.2748 | 32.0357 | 32.5551 | 32.5463 | 33.7539 | 36.5564 | 61.7184 | 65.5242 |
| u128 | 17.8032 | 17.93 | 17.7398 | 18.074 | 19.9851 | 32.5297 | 34.3847 | 34.8897 | 34.5909 | 35.2499 | 38.0192 | 63.9735 | 67.9228 |
| u129 | 17.8033 | 17.9301 | 17.7394 | 18.0733 | 19.9848 | 32.5294 | 34.3843 | 34.8912 | 34.589 | 35.2491 | 38.0192 | 63.9737 | 67.9048 |
| u130 | 17.8037 | 17.9306 | 17.7415 | 18.0733 | 19.9854 | 32.5297 | 34.3844 | 34.9262 | 34.5887 | 35.2499 | 38.02 | 63.974 | 67.9213 |
| u131 | 17.8043 | 17.9303 | 17.7411 | 18.074 | 19.9855 | 32.5295 | 34.3855 | 34.9247 | 34.5893 | 35.2507 | 38.0193 | 63.9738 | 67.8975 |
| u132 | 17.8031 | 17.9306 | 17.7396 | 18.0739 | 19.9852 | 32.5291 | 34.3839 | 34.9268 | 35.0264 | 36.5896 | 39.4555 | 66.2312 | 70.2971 |
| u133 | 17.8038 | 17.9307 | 17.7407 | 18.074 | 19.9859 | 32.5292 | 34.383 | 34.9282 | 35.0254 | 36.5903 | 39.4556 | 66.2313 | 70.2978 |
| u134 | 17.8037 | 17.93 | 17.7403 | 18.0741 | 19.9858 | 32.5286 | 34.3834 | 34.8944 | 35.0283 | 36.5897 | 39.4553 | 66.2301 | 70.3117 |
| u135 | 17.8035 | 17.9299 | 17.7404 | 18.0728 | 19.9857 | 32.5296 | 34.3836 | 34.8934 | 35.0265 | 36.5897 | 39.4555 | 66.2301 | 70.2879 |
| u136 | 17.8571 | 18.1483 | 18.4512 | 19.3929 | 21.4899 | 34.815 | 36.7899 | 37.3694 | 36.9186 | 38.0902 | 40.9505 | 68.5455 | 72.7122 |
| u137 | 17.8567 | 18.1483 | 18.4519 | 19.3929 | 21.4906 | 34.815 | 36.7897 | 37.369 | 36.9185 | 38.0896 | 40.9505 | 68.5455 | 72.7285 |
| u138 | 17.8571 | 18.148 | 18.4525 | 19.3933 | 21.4907 | 34.8133 | 36.7842 | 37.2755 | 36.919 | 38.0901 | 40.9507 | 68.543 | 72.7254 |
| u139 | 17.8574 | 18.148 | 18.452 | 19.3933 | 21.4901 | 34.8133 | 36.7846 | 37.2756 | 36.919 | 38.0893 | 40.9505 | 68.5427 | 72.7465 |
| u140 | 17.8564 | 18.1475 | 18.4517 | 19.3938 | 21.4901 | 34.8137 | 36.7837 | 37.2781 | 37.7322 | 39.5062 | 42.4347 | 70.8714 | 75.1479 |
| u141 | 17.8571 | 18.1476 | 18.4523 | 19.3938 | 21.4906 | 34.8127 | 36.7834 | 37.2769 | 37.7329 | 39.5069 | 42.4361 | 70.872 | 75.1592 |
| u142 | 17.8576 | 18.1479 | 18.4516 | 19.3933 | 21.4906 | 34.8145 | 36.79 | 37.3706 | 37.7332 | 39.5058 | 42.4355 | 70.871 | 75.1566 |
| u143 | 17.8572 | 18.1478 | 18.4511 | 19.393 | 21.4902 | 34.8145 | 36.7897 | 37.3711 | 37.7305 | 39.5061 | 42.4359 | 70.8711 | 75.1594 |
| u144 | 20.2164 | 20.2868 | 20.2349 | 20.9428 | 23.0809 | 37.1945 | 39.2538 | 39.6865 | 39.482 | 41.0327 | 43.9712 | 73.252 | 77.6014 |
| u145 | 20.2164 | 20.287 | 20.2356 | 20.9426 | 23.0807 | 37.195 | 39.2526 | 39.6866 | 39.4816 | 41.034 | 43.9718 | 73.2505 | 77.6106 |
| u146 | 20.2171 | 20.2869 | 20.2342 | 20.9421 | 23.0807 | 37.1962 | 39.274 | 39.9285 | 39.4807 | 41.0336 | 43.9717 | 73.2474 | 77.6082 |
| u147 | 20.2176 | 20.2868 | 20.2369 | 20.9427 | 23.0813 | 37.1952 | 39.2746 | 39.9281 | 39.4814 | 41.0328 | 43.9714 | 73.2497 | 77.6298 |
| u148 | 20.217 | 20.2859 | 20.237 | 20.9425 | 23.081 | 37.1956 | 39.2739 | 39.9286 | 40.6736 | 42.5141 | 45.5107 | 75.6539 | 80.0702 |
| u149 | 20.2176 | 20.286 | 20.2346 | 20.9428 | 23.0802 | 37.1946 | 39.2732 | 39.9286 | 40.6721 | 42.5143 | 45.5113 | 75.654 | 80.0995 |
| u150 | 20.2176 | 20.286 | 20.2368 | 20.9432 | 23.0802 | 37.1942 | 39.253 | 39.6881 | 40.6711 | 42.5148 | 45.5116 | 75.6536 | 80.1254 |
| u151 | 20.2171 | 20.2859 | 20.235 | 20.942 | 23.0809 | 37.1952 | 39.2535 | 39.6886 | 40.672 | 42.5146 | 45.5108 | 75.6539 | 80.1008 |
| u152 | 20.4134 | 20.8607 | 21.4443 | 22.447 | 24.7 | 39.6393 | 41.8477 | 42.6788 | 42.3303 | 44.0788 | 47.0949 | 78.1115 | 82.6571 |
| u153 | 20.4138 | 20.8606 | 21.4437 | 22.4469 | 24.701 | 39.64 | 41.849 | 42.6811 | 42.3299 | 44.0789 | 47.0955 | 78.1106 | 82.6298 |
| u154 | 20.4138 | 20.8609 | 21.4429 | 22.4466 | 24.7012 | 39.6412 | 41.7792 | 42.1347 | 42.3305 | 44.0782 | 47.0947 | 78.1134 | 82.6678 |

| | | | | | | | | | | | | |
|---|---|---|---|---|---|---|---|---|---|---|---|---|
| u155 | 20.4132 | 20.8607 | 21.4436 | 22.4466 | 24.7001 | 39.6399 | 41.7774 | 42.133 | 42.3312 | 44.0797 | 47.0958 | 78.1145 | 82.6385 |
| u156 | 20.4138 | 20.8608 | 21.4442 | 22.4462 | 24.7002 | 39.6454 | 41.7753 | 42.132 | 43.7556 | 45.6267 | 48.6948 | 80.6014 | 85.2507 |
| u157 | 20.4136 | 20.8605 | 21.4436 | 22.446 | 24.7009 | 39.6457 | 41.7769 | 42.1336 | 43.7565 | 45.6271 | 48.6963 | 80.6033 | 85.2287 |
| u158 | 20.4136 | 20.8601 | 21.4444 | 22.4463 | 24.7011 | 39.6446 | 41.8476 | 42.6822 | 43.7553 | 45.6272 | 48.6948 | 80.6023 | 85.2642 |
| u159 | 20.4136 | 20.8596 | 21.4451 | 22.4465 | 24.7003 | 39.645 | 41.8455 | 42.6806 | 43.756 | 45.628 | 48.6943 | 80.603 | 85.2381 |
| u160 | 22.7291 | 22.8715 | 23.1502 | 24.0705 | 26.3971 | 42.1758 | 44.3495 | 44.7258 | 45.4031 | 47.2433 | 50.3384 | 83.1437 | 87.8673 |
| u161 | 22.7294 | 22.8727 | 23.1507 | 24.0704 | 26.3968 | 42.1757 | 44.3493 | 44.7254 | 45.4024 | 47.243 | 50.338 | 83.1448 | 87.8502 |
| u162 | 22.73 | 22.8707 | 23.1507 | 24.0708 | 26.3974 | 42.1754 | 44.5584 | 45.741 | 45.402 | 47.2432 | 50.3384 | 83.1435 | 87.8769 |
| u163 | 22.7298 | 22.8702 | 23.1508 | 24.0713 | 26.3978 | 42.1756 | 44.558 | 45.7422 | 45.4029 | 47.2445 | 50.337 | 83.1439 | 87.8927 |
| u164 | 22.7288 | 22.8717 | 23.1507 | 24.0707 | 26.4013 | 42.203 | 44.5579 | 45.7394 | 46.9637 | 48.8623 | 52.004 | 85.7289 | 90.4885 |
| u165 | 22.7295 | 22.8715 | 23.1507 | 24.0709 | 26.4009 | 42.2038 | 44.5571 | 45.7419 | 46.9648 | 48.8638 | 52.0058 | 85.7305 | 90.5115 |
| u166 | 22.729 | 22.8707 | 23.1498 | 24.0699 | 26.4004 | 42.2042 | 44.349 | 44.7255 | 46.9632 | 48.8622 | 52.0053 | 85.7292 | 90.5583 |
| u167 | 22.7284 | 22.8704 | 23.1502 | 24.0703 | 26.4008 | 42.2038 | 44.4387 | 44.7263 | 46.9632 | 48.8632 | 52.0037 | 85.7283 | 90.5501 |
| u168 | 23.3002 | 24.0312 | 24.7181 | 25.7297 | 28.1493 | 44.7811 | 47.4893 | 49.0867 | 48.6496 | 50.5432 | 53.7116 | 88.3704 | 93.1711 |
| u169 | 23.3003 | 24.0317 | 24.7177 | 25.7301 | 28.149 | 44.7822 | 47.4905 | 49.0874 | 48.6492 | 50.5421 | 53.7115 | 88.3729 | 93.1834 |
| u170 | 23.3001 | 24.0319 | 24.7176 | 25.73 | 28.1485 | 44.7836 | 46.9655 | 47.6436 | 48.6506 | 50.5416 | 53.7107 | 88.375 | 93.3431 |
| u171 | 23.3002 | 24.0318 | 24.7178 | 25.7296 | 28.1488 | 44.7825 | 46.9643 | 47.6417 | 48.6501 | 50.543 | 53.7117 | 88.3731 | 93.3278 |
| u172 | 23.2994 | 24.0301 | 24.7179 | 25.7324 | 28.1662 | 44.884 | 46.9645 | 47.6414 | 50.3142 | 52.2443 | 55.4501 | 91.0631 | 95.8755 |
| u173 | 23.2995 | 24.0303 | 24.7179 | 25.7328 | 28.1658 | 44.8843 | 46.9654 | 47.6423 | 50.3159 | 52.2445 | 55.4497 | 91.0624 | 95.8431 |
| u174 | 23.2997 | 24.0301 | 24.7179 | 25.7328 | 28.1663 | 44.8817 | 47.4898 | 49.087 | 50.3149 | 52.244 | 55.4498 | 91.0797 | 96.2453 |
| u175 | 23.2996 | 24.0299 | 24.7182 | 25.7325 | 28.1669 | 44.8822 | 47.4881 | 49.0874 | 50.3157 | 52.244 | 55.4507 | 91.0806 | 96.2669 |
| u176 | 25.5008 | 25.9515 | 26.4839 | 27.4846 | 29.9714 | 47.4569 | 49.7368 | 50.924 | 52.068 | 54 | 57.23 | 93.8035 | 98.5959 |
| u177 | 25.5014 | 25.9515 | 26.4825 | 27.4846 | 29.9715 | 47.4576 | 49.7351 | 50.9237 | 52.0678 | 54 | 57.2336 | 93.8015 | 98.626 |
| u178 | 25.5017 | 25.9508 | 26.4844 | 27.4846 | 29.9714 | 47.4561 | 50.7927 | 52.6194 | 52.0687 | 54.0003 | 57.2363 | 93.8651 | 99.3573 |
| u179 | 25.5017 | 25.9514 | 26.4829 | 27.4847 | 29.9713 | 47.456 | 50.7912 | 52.6204 | 52.0688 | 54.0007 | 57.2322 | 93.8657 | 99.3658 |
| u180 | 25.5014 | 25.9516 | 26.4861 | 27.5004 | 30.0364 | 47.7567 | 50.7908 | 52.6186 | 53.8366 | 55.7934 | 59.0651 | 96.5768 | 101.5264 |
| u181 | 25.5028 | 25.9505 | 26.4855 | 27.5001 | 30.0362 | 47.7543 | 50.792 | 52.6204 | 53.8379 | 57.7949 | 59.0487 | 96.5759 | 101.5192 |
| u182 | 25.503 | 25.9503 | 26.4853 | 27.5 | 30.0364 | 47.7547 | 49.7345 | 50.9223 | 53.8375 | 55.7947 | 59.0513 | 96.744 | 102.7774 |
| u183 | 25.5017 | 25.9503 | 26.4848 | 27.5001 | 30.0366 | 47.756 | 49.7351 | 50.923 | 53.8375 | 55.7945 | 59.0654 | 96.7471 | 102.758 |
| u184 | 26.7564 | 27.6499 | 28.2924 | 29.3043 | 31.8445 | 50.2126 | 54.481 | 56.352 | 55.6799 | 57.6402 | 60.9066 | 99.3737 | 104.7895 |
| u185 | 26.7557 | 27.6505 | 28.2926 | 29.3046 | 31.8444 | 50.2112 | 54.482 | 56.3524 | 55.6794 | 57.6402 | 60.9514 | 99.3735 | 104.784 |
| u186 | 26.756 | 27.6502 | 28.2928 | 29.3051 | 31.845 | 50.2115 | 52.8879 | 54.4937 | 55.6799 | 57.6424 | 60.9527 | 99.7791 | 106.3724 |
| u187 | 26.7572 | 27.6495 | 28.2926 | 29.3047 | 31.8451 | 50.2119 | 52.8889 | 54.4927 | 55.6801 | 57.6445 | 60.9074 | 99.7778 | 106.3917 |
| u188 | 26.7547 | 27.6507 | 28.3062 | 29.37 | 32.0502 | 50.946 | 52.8873 | 54.4931 | 57.5635 | 59.5304 | 62.9105 | 102.2392 | 108.3364 |
| u189 | 26.7551 | 27.6515 | 28.3063 | 29.3703 | 32.0499 | 50.9478 | 52.8862 | 54.4933 | 57.5626 | 59.53 | 62.7907 | 102.2389 | 108.3192 |
| u190 | 26.7555 | 27.6518 | 28.3063 | 29.3699 | 32.0493 | 50.9473 | 54.4811 | 56.3535 | 57.5625 | 59.5426 | 62.7919 | 103.0672 | 110.0782 |
| u191 | 26.7557 | 27.6508 | 28.3063 | 29.3696 | 32.0496 | 50.9471 | 54.4777 | 56.3517 | 57.5619 | 59.5421 | 62.9118 | 103.0709 | 110.098 |
| u192 | 28.8967 | 29.6329 | 30.2211 | 31.1985 | 33.7878 | 53.2472 | 56.5129 | 58.3201 | 59.5158 | 61.4692 | 64.6982 | 105.3423 | 112.0229 |
| u193 | 28.8954 | 29.6343 | 30.221 | 31.1988 | 33.7878 | 53.2474 | 56.5126 | 58.3198 | 59.515 | 61.47 | 64.9878 | 105.3399 | 112.0215 |
| u194 | 28.8984 | 29.6333 | 30.2209 | 31.1977 | 33.7875 | 53.2471 | 58.4305 | 60.3284 | 59.518 | 61.5083 | 64.9887 | 106.6962 | 113.9226 |
| u195 | 28.8957 | 29.6335 | 30.2207 | 31.1976 | 33.788 | 53.2469 | 58.432 | 60.3294 | 59.5174 | 61.51 | 64.6986 | 106.6951 | 113.9457 |
| u196 | 28.8964 | 29.6482 | 30.2288 | 31.4137 | 34.3072 | 54.6317 | 58.4322 | 60.3288 | 61.5225 | 63.4448 | 67.26 | 108.8201 | 115.9569 |
| u197 | 28.8963 | 29.6491 | 30.2889 | 31.4126 | 34.306 | 54.6309 | 58.4293 | 60.3278 | 61.5228 | 63.4457 | 66.6604 | 108.8239 | 115.9373 |
| u198 | 28.894 | 29.6479 | 30.289 | 31.4145 | 34.3064 | 54.6318 | 56.5113 | 58.3212 | 61.5361 | 63.5607 | 66.6623 | 110.5569 | 117.9697 |
| u199 | 28.8976 | 29.6487 | 30.2896 | 31.4154 | 34.3076 | 54.6318 | 56.5111 | 58.321 | 61.5357 | 63.5603 | 67.2615 | 110.5568 | 117.968 |
| u200 | 30.8385 | 31.6761 | 32.2269 | 33.1745 | 35.9425 | 56.8147 | 62.6807 | 64.6275 | 63.5938 | 65.4511 | 68.8078 | 112.6399 | 120.0732 |
| u201 | 30.8381 | 31.6768 | 32.2268 | 33.1746 | 35.9421 | 56.8143 | 62.6818 | 64.6076 | 63.5943 | 65.4502 | 69.7793 | 112.6406 | 120.0877 |
| u202 | 30.8377 | 31.6763 | 32.227 | 33.1739 | 35.9427 | 56.8128 | 60.5371 | 62.4377 | 63.6434 | 65.7446 | 69.7799 | 114.58 | 122.2273 |
| u203 | 30.8383 | 31.676 | 32.2271 | 33.1741 | 35.9422 | 56.8135 | 60.5377 | 62.4326 | 63.6414 | 65.7458 | 68.808 | 114.5829 | 122.2176 |
| u204 | 30.8669 | 31.7659 | 32.4737 | 33.7422 | 36.9479 | 58.7337 | 60.5375 | 62.4332 | 65.7106 | 67.522 | 72.4667 | 116.7006 | 124.3592 |
| u205 | 30.8648 | 31.7665 | 32.4732 | 33.7425 | 36.9485 | 58.7335 | 62.4378 | 65.711 | 67.5211 | 71.2356 | 116.7014 | 124.3665 | |
| u206 | 30.864 | 31.767 | 32.4725 | 33.7413 | 36.9488 | 58.7342 | 62.6812 | 64.6057 | 65.8604 | 68.1558 | 71.236 | 118.7805 | 126.5951 |
| u207 | 30.8655 | 31.7664 | 32.473 | 33.7407 | 36.9481 | 58.7348 | 62.6782 | 64.6256 | 65.861 | 68.1547 | 72.4679 | 118.7799 | 126.6084 |
| u208 | 33.0856 | 33.8573 | 34.3557 | 35.4122 | 38.511 | 60.9485 | 64.961 | 66.8665 | 67.8719 | 69.8016 | 73.9063 | 120.9783 | 128.8537 |
| u209 | 33.0853 | 33.8583 | 34.3563 | 35.4118 | 38.5104 | 60.9502 | 66.9393 | 67.8724 | 69.8028 | 75.282 | 120.979 | 128.8255 | |
| u210 | 33.0852 | 33.8597 | 34.3549 | 35.4117 | 38.5094 | 60.9512 | 67.3556 | 69.1826 | 68.2597 | 70.8585 | 75.2825 | 123.1866 | 131.1588 |
| u211 | 33.0862 | 33.8583 | 34.356 | 35.411 | 38.5111 | 60.9498 | 67.3087 | 69.4073 | 68.2601 | 70.8586 | 73.9069 | 123.1854 | 131.1615 |
| u212 | 33.2214 | 34.1824 | 35.0169 | 36.5131 | 39.9201 | 63.2019 | 67.3081 | 69.4075 | 70.1446 | 72.4123 | 78.2505 | 125.4882 | 133.5366 |
| u213 | 33.2217 | 34.1828 | 35.0176 | 36.5134 | 39.9208 | 63.1955 | 67.355 | 69.1817 | 70.1445 | 72.4125 | 76.7655 | 125.4847 | 133.5237 |
| u214 | 33.2237 | 34.1822 | 35.0165 | 36.5124 | 39.9194 | 63.1964 | 64.9502 | 66.9385 | 70.956 | 73.7621 | 76.7652 | 127.8281 | 136.0317 |
| u215 | 33.2235 | 34.1819 | 35.0172 | 36.5121 | 39.9192 | 63.2003 | 64.9603 | 66.8654 | 70.9565 | 73.7626 | 78.2503 | 127.8291 | 136.0114 |
| u216 | 35.445 | 36.2138 | 36.8228 | 38.1341 | 41.5374 | 65.6006 | 72.2936 | 75.2914 | 72.7133 | 75.3159 | 79.8088 | 130.2594 | 138.5627 |
| u217 | 35.4434 | 36.2154 | 36.823 | 38.134 | 41.5384 | 65.6352 | 72.7658 | 74.1616 | 72.7133 | 75.3153 | 81.3985 | 130.2599 | 138.5417 |
| u218 | 35.443 | 36.2148 | 36.8226 | 38.1337 | 41.5337 | 65.635 | 69.7645 | 72.1447 | 73.9916 | 76.8318 | 81.398 | 132.7503 | 141.24 |
| u219 | 35.4452 | 36.2154 | 36.822 | 38.1335 | 41.5332 | 65.6034 | 69.9292 | 71.5687 | 73.9915 | 76.8334 | 79.8097 | 132.7523 | 141.1228 |
| u220 | 35.9446 | 37.0809 | 38.1143 | 39.6668 | 43.2259 | 68.2437 | 69.93 | 71.5669 | 75.6828 | 78.4548 | 84.7489 | 135.3208 | 143.9764 |
| u221 | 35.9439 | 37.0807 | 38.1159 | 39.6739 | 43.2253 | 68.1096 | 69.7646 | 72.1413 | 75.6824 | 78.4533 | 83.05 | 135.3322 | 143.7174 |
| u222 | 35.9415 | 37.0793 | 38.1138 | 39.6751 | 43.1935 | 68.1097 | 72.7645 | 74.1629 | 77.2562 | 80.1038 | 83.0502 | 137.9532 | 146.9884 |
| u223 | 35.9399 | 37.0795 | 38.1142 | 39.6685 | 43.1934 | 68.2451 | 72.2929 | 75.2906 | 77.2558 | 80.1025 | 84.7445 | 138.0018 | 146.3707 |
| u224 | 38.1421 | 39.0748 | 39.9061 | 41.4312 | 45.0921 | 70.724 | 76.0497 | 77.1971 | 78.9949 | 81.8321 | 86.5172 | 140.6489 | 150.2997 |
| u225 | 38.1407 | 39.0737 | 39.9051 | 41.3874 | 45.0917 | 71.148 | 75.0027 | 78.8149 | 78.9935 | 81.8308 | 88.3057 | 140.7959 | 149.1778 |
| u226 | 38.1387 | 39.0729 | 39.9136 | 41.3874 | 44.9563 | 71.1475 | 79.8563 | 80.725 | 80.7524 | 83.6178 | 88.3586 | 143.3857 | 153.9366 |
| u227 | 38.1393 | 39.072 | 39.9138 | 41.4318 | 44.9577 | 70.7252 | 78.1693 | 82.6313 | 80.752 | 83.6106 | 86.5021 | 143.7715 | 152.3383 |
| u228 | 39.3811 | 40.6933 | 41.6807 | 43.1806 | 47.2136 | 74.5365 | 78.1688 | 82.6346 | 82.615 | 85.4919 | 92.4479 | 146.2133 | 157.7208 |
| u229 | 39.3797 | 40.6954 | 41.6813 | 43.3578 | 47.2147 | 73.5145 | 79.8549 | 80.7237 | 82.6175 | 85.4642 | 90.1531 | 147.0624 | 155.918 |
| u230 | 39.383 | 40.7177 | 41.7473 | 43.3615 | 46.7928 | 73.5134 | 75.0026 | 78.8136 | 84.5431 | 87.468 | 90.3172 | 149.3221 | 161.6712 |
| u231 | 39.3822 | 40.7174 | 41.7472 | 43.1824 | 46.7917 | 74.5368 | 76.0486 | 77.1971 | 84.5564 | 87.3728 | 92.0413 | 150.7556 | 159.7367 |
| u232 | 41.5864 | 42.737 | 43.629 | 45.6178 | 49.8016 | 76.7947 | 86.3111 | 91.7814 | 86.5573 | 89.6002 | 94.8545 | 152.8896 | 165.8723 |
| u233 | 41.5862 | 42.7351 | 43.6295 | 45.0949 | 49.7866 | 78.5611 | 88.8104 | 89.0424 | 86.6142 | 89.3315 | 96.3559 | 154.7376 | 163.7698 |

| | | | | | | | | | | | | | | |
|---|---|---|---|---|---|---|---|---|---|---|---|---|---|---|
| u234 | 41.6242 | 42.8512 | 43.8894 | 45.0964 | 48.8317 | 78.5612 | 81.9544 | 86.8512 | 88.6314 | 91.9867 | 97.5297 | 156.866 | 170.3772 |
| u235 | 41.6217 | 42.8509 | 43.8899 | 45.6189 | 48.8326 | 76.7942 | 84.0476 | 84.681 | 88.8158 | 91.3653 | 94.0545 | 158.9374 | 168.0686 |
| u236 | 43.6586 | 44.8534 | 45.73 | 47.2945 | 56.2922 | 83.0754 | 84.0414 | 84.6904 | 90.773 | 94.7231 | 103.4371 | 161.1551 | 175.1357 |
| u237 | 43.6584 | 44.8547 | 45.7322 | 48.4058 | 55.1603 | 80.8156 | 81.9552 | 86.8115 | 91.2635 | 93.6365 | 98.9928 | 163.3988 | 172.7418 |
| u238 | 43.91 | 45.3023 | 46.474 | 48.4076 | 51.4219 | 80.8115 | 88.6749 | 89.1885 | 93.1011 | 97.712 | 100.3833 | 165.7558 | 180.196 |
| u239 | 43.9111 | 45.3011 | 46.474 | 47.2943 | 51.4466 | 83.1093 | 86.3407 | 91.3499 | 94.1018 | 96.2886 | 101.9016 | 168.1813 | 177.6286 |
| u240 | 46.0819 | 47.3076 | 48.295 | 51.6846 | 52.6019 | 85.527 | 93.8045 | 94.7999 | 95.8386 | 103.2027 | 106.7386 | 170.7183 | 185.5392 |
| u241 | 46.0848 | 47.3029 | 48.2917 | 50.0756 | 53.0145 | 88.5886 | 91.5754 | 96.7404 | 97.3072 | 99.3683 | 108.4985 | 173.352 | 182.8435 |
| u242 | 46.875 | 48.4368 | 49.7504 | 50.0677 | 54.5156 | 88.0935 | 100.855 | 102.1953 | 99.0435 | 100.7888 | 110.3385 | 176.0937 | 191.2394 |
| u243 | 46.8669 | 48.4418 | 49.7745 | 51.755 | 57.1194 | 85.6786 | 98.6951 | 104.3252 | 100.7888 | 104.8564 | 105.0578 | 178.9503 | 188.3099 |
| u244 | 49.0907 | 50.4654 | 51.6106 | 53.482 | 58.5488 | 94.3568 | 96.9609 | 106.5724 | 102.6686 | 106.7538 | 118.5975 | 181.9285 | 201.4817 |
| u245 | 49.0876 | 50.5103 | 51.7362 | 56.187 | 59.6871 | 92.0944 | 103.0735 | 100.2446 | 104.6415 | 113.0328 | 112.264 | 185.0249 | 198.2276 |
| u246 | 50.8187 | 52.3785 | 53.5473 | 55.4438 | 61.0587 | 90.9153 | 91.1447 | 98.3088 | 106.7469 | 110.8313 | 114.2781 | 188.2473 | 195.0877 |
| u247 | 50.9711 | 52.6554 | 54.014 | 53.7502 | 62.383 | 96.3402 | 94.8234 | 93.8297 | 113.8639 | 108.735 | 116.388 | 191.6011 | 204.8098 |
| u248 | 53.1308 | 54.6369 | 55.8333 | 61.0935 | 63.9382 | 98.7255 | 110.9823 | 109.8671 | 111.3485 | 116.2929 | 128.5722 | 195.0998 | 220.3335 |
| u249 | 53.6727 | 55.4539 | 56.9776 | 59.2965 | 65.5845 | 101.2692 | 108.1322 | 112.4678 | 108.9785 | 124.0975 | 125.8846 | 198.7608 | 208.9816 |
| u250 | 55.8554 | 57.4983 | 58.8538 | 57.8716 | 67.4378 | 104.0613 | 105.5088 | 115.268 | 120.9644 | 121.3467 | 123.3387 | 207.3405 | 212.6536 |
| u251 | 57.3141 | 59.2853 | 60.7781 | 63.0654 | 69.4919 | 107.1332 | 114.0763 | 118.2761 | 124.0148 | 118.7481 | 120.9102 | 203.3115 | 216.39 |
| u252 | 59.7306 | 61.6024 | 63.0444 | 65.3044 | 71.7827 | 110.5139 | 117.4441 | 121.5172 | 117.5046 | 127.78 | 131.8728 | 212.2402 | 229.8116 |
| u253 | 62.446 | 64.281 | 65.6351 | 67.8256 | 74.338 | 114.2433 | 125.8827 | 125.0262 | 127.8356 | 130.9128 | 134.9058 | 216.7609 | 225.4612 |
| u254 | 65.7278 | 67.4355 | 68.6262 | 70.6915 | 77.2123 | 118.4101 | 121.8065 | 128.8876 | 131.439 | 134.3281 | 138.1853 | 221.6351 | 235.0857 |
| u255 | 69.7535 | 71.2292 | 72.1775 | 74.0527 | 80.5656 | 123.224 | 131.1028 | 133.2942 | 135.5132 | 138.1588 | 141.8506 | 227.06 | 240.4439 | i) 1048576-QAM/1024-PAM for a Non-Fading Channel

| SNR | 0 | 1 | 2 | 3 | 4 | 5 | 6 | 7 | 8 | 9 | 10 | 11 | 12 | 13 |
|---|---|---|---|---|---|---|---|---|---|---|---|---|---|---|
| u1 | 1.0002 | 1 | 0.9999 | 0.9999 | 1.0002 | 0.9996 | 1.0001 | 0.9993 | 0.9995 | 1 | 0.9998 | 0.9999 | 0.9999 | 1.0001 |
| u2 | 1.0004 | 1 | 0.9998 | 0.9999 | 1.0005 | 0.9992 | 1.0003 | 0.9982 | 0.9985 | 0.9963 | 0.999 | 0.9996 | 1.0001 | 1.0002 |
| u3 | 1.0007 | 1.0001 | 0.9998 | 0.9999 | 1.0007 | 0.9989 | 1.0008 | 0.9992 | 0.999 | 0.9959 | 0.9988 | 0.9992 | 1.0001 | 1.0002 |
| u4 | 1.0008 | 1 | 0.9995 | 0.9998 | 1.0009 | 0.9986 | 1.01 | 0.9965 | 0.9927 | 0.9921 | 0.9939 | 0.9977 | 1.0004 | 1.001 |
| u5 | 1.0011 | 1 | 0.9994 | 0.9998 | 1.0011 | 0.9982 | 1.002 | 0.9958 | 0.9921 | 0.9921 | 0.9936 | 0.9976 | 1.0004 | 1.0011 |
| u6 | 1.0012 | 1.0001 | 0.9994 | 0.9998 | 1.0014 | 0.998 | 1.002 | 0.9962 | 0.9929 | 0.9954 | 0.994 | 0.9973 | 1.0002 | 1.0011 |
| u7 | 1.0016 | 1.0002 | 0.9993 | 0.9998 | 1.0018 | 0.9978 | 1.0026 | 0.9956 | 0.9937 | 0.995 | 0.9938 | 0.9971 | 1.0002 | 1.0011 |
| u8 | 1.0013 | 0.9995 | 0.9986 | 0.9996 | 1.0019 | 0.9974 | 1.0029 | 0.9887 | 0.9727 | 0.9736 | 0.9874 | 0.9915 | 1.0004 | 1.0021 |
| u9 | 1.0015 | 0.9995 | 0.9985 | 0.9995 | 1.0021 | 0.997 | 1.0028 | 0.9871 | 0.9721 | 0.9736 | 0.9872 | 0.9915 | 1.0003 | 1.0022 |
| u10 | 1.0018 | 0.9995 | 0.9984 | 0.9994 | 1.0024 | 0.9966 | 1.0031 | 0.9865 | 0.9709 | 0.9698 | 0.9864 | 0.9915 | 1.0005 | 1.0023 |
| u11 | 1.002 | 0.9996 | 0.9984 | 0.9994 | 1.0026 | 0.9963 | 1.0037 | 0.9866 | 0.9716 | 0.9695 | 0.9863 | 0.9912 | 1.0006 | 1.0023 |
| u12 | 1.0023 | 0.9998 | 0.9984 | 0.9994 | 1.0029 | 0.996 | 1.004 | 0.9868 | 0.978 | 0.9728 | 0.9908 | 0.9924 | 1.0003 | 1.0017 |
| u13 | 1.0026 | 0.9999 | 0.9983 | 0.9993 | 1.0031 | 0.9957 | 1.0043 | 0.9861 | 0.9771 | 0.9729 | 0.9905 | 0.9924 | 1.0003 | 1.0018 |
| u14 | 1.0028 | 1 | 0.9983 | 0.9993 | 1.0034 | 0.9955 | 1.0041 | 0.9854 | 0.9779 | 0.976 | 0.9908 | 0.9922 | 1.0001 | 1.0018 |
| u15 | 1.0031 | 1.0001 | 0.9982 | 0.9993 | 1.0038 | 0.9951 | 1.0047 | 0.9848 | 0.9785 | 0.9756 | 0.9907 | 0.9919 | 1.0001 | 1.0018 |
| u16 | 1.0015 | 0.9972 | 0.9961 | 0.9984 | 1.0033 | 0.9948 | 1.0036 | 1.0275 | 1.0103 | 0.941 | 0.9734 | 0.9848 | 0.9973 | 1.0025 |
| u17 | 1.0017 | 0.9972 | 0.9961 | 0.9984 | 1.0036 | 0.9945 | 1.0037 | 1.0268 | 1.0094 | 0.9408 | 0.9732 | 0.9851 | 0.9973 | 1.0026 |
| u18 | 1.0018 | 0.9972 | 0.9959 | 0.9983 | 1.0039 | 0.9943 | 1.0037 | 1.0267 | 1.0085 | 0.937 | 0.9727 | 0.9852 | 0.9975 | 1.0027 |
| u19 | 1.0021 | 0.9973 | 0.9958 | 0.9983 | 1.0041 | 0.994 | 1.0039 | 1.0274 | 1.0091 | 0.9366 | 0.9728 | 0.9852 | 0.9975 | 1.0027 |
| u20 | 1.0022 | 0.9972 | 0.9956 | 0.9982 | 1.0044 | 0.9938 | 1.004 | 1.0261 | 1.0025 | 0.9328 | 0.9683 | 0.9842 | 0.9977 | 1.0035 |
| u21 | 1.0025 | 0.9972 | 0.9955 | 0.9982 | 1.0046 | 0.9934 | 1.0042 | 1.0256 | 1.0018 | 0.9325 | 0.9682 | 0.9844 | 0.9976 | 1.0035 |
| u22 | 1.0027 | 0.9973 | 0.9956 | 0.9982 | 1.0048 | 0.9931 | 1.0043 | 1.0257 | 1.0029 | 0.9355 | 0.9687 | 0.9846 | 0.9973 | 1.0036 |
| u23 | 1.003 | 0.9974 | 0.9955 | 0.9981 | 1.0049 | 0.993 | 1.0045 | 1.0259 | 1.0035 | 0.9351 | 0.9688 | 0.9847 | 0.9974 | 1.0036 |
| u24 | 1.0037 | 0.9981 | 0.9959 | 0.9983 | 1.0055 | 0.9925 | 1.0051 | 1.0307 | 1.0251 | 0.9552 | 0.9744 | 0.9887 | 0.9973 | 1.0027 |
| u25 | 1.0039 | 0.9982 | 0.9958 | 0.9983 | 1.0057 | 0.9924 | 1.0051 | 1.0299 | 1.0242 | 0.955 | 0.9742 | 0.9886 | 0.9972 | 1.0028 |
| u26 | 1.004 | 0.9982 | 0.9957 | 0.9982 | 1.0059 | 0.992 | 1.0054 | 1.0297 | 1.0232 | 0.9513 | 0.9737 | 0.9887 | 0.9974 | 1.0028 |
| u27 | 1.0044 | 0.9983 | 0.9956 | 0.9981 | 1.0062 | 0.9918 | 1.0051 | 1.0299 | 1.0239 | 0.9507 | 0.9737 | 0.9886 | 0.9974 | 1.0028 |
| u28 | 1.0048 | 0.9985 | 0.9956 | 0.9981 | 1.0065 | 0.9916 | 1.0052 | 1.0306 | 1.0303 | 0.9542 | 0.9779 | 0.9897 | 0.9972 | 1.0022 |
| u29 | 1.0049 | 0.9985 | 0.9956 | 0.9981 | 1.0066 | 0.9912 | 1.0053 | 1.0305 | 1.0297 | 0.9541 | 0.9779 | 0.9899 | 0.9971 | 1.0023 |
| u30 | 1.0052 | 0.9986 | 0.9955 | 0.998 | 1.0069 | 0.9909 | 1.0055 | 1.0301 | 1.0306 | 0.9571 | 0.9782 | 0.99 | 0.9969 | 1.0023 |
| u31 | 1.0055 | 0.9987 | 0.9954 | 0.998 | 1.0072 | 0.9908 | 1.0053 | 1.0305 | 1.0313 | 0.9566 | 0.9783 | 0.9899 | 0.997 | 1.0023 |
| u32 | 0.9979 | 0.986 | 0.9856 | 0.9939 | 1.0045 | 0.9905 | 0.9998 | 1.0801 | 1.1118 | 1.0503 | 0.9678 | 0.9905 | 0.9848 | 0.9969 |
| u33 | 0.9982 | 0.986 | 0.9856 | 0.9938 | 1.0047 | 0.9903 | 0.9996 | 1.0798 | 1.111 | 1.0505 | 0.9677 | 0.9907 | 0.9847 | 0.997 |
| u34 | 0.9984 | 0.986 | 0.9854 | 0.9938 | 1.005 | 0.99 | 0.9997 | 1.0797 | 1.11 | 1.0467 | 0.9671 | 0.9906 | 0.9849 | 0.9971 |
| u35 | 0.9987 | 0.9861 | 0.9853 | 0.9938 | 1.0052 | 0.9898 | 0.9995 | 1.0806 | 1.111 | 1.0465 | 0.9671 | 0.9904 | 0.9849 | 0.9971 |
| u36 | 0.9988 | 0.986 | 0.9851 | 0.9937 | 1.0056 | 0.9896 | 0.9999 | 1.0795 | 1.104 | 1.0425 | 0.9624 | 0.9891 | 0.9851 | 0.9978 |
| u37 | 0.999 | 0.9859 | 0.9851 | 0.9936 | 1.0058 | 0.9894 | 0.9999 | 1.079 | 1.1033 | 1.0428 | 0.9623 | 0.9892 | 0.985 | 0.9979 |
| u38 | 0.9992 | 0.986 | 0.9851 | 0.9936 | 1.006 | 0.9892 | 0.9998 | 1.0794 | 1.1046 | 1.0465 | 0.9628 | 0.9895 | 0.9848 | 0.9979 |
| u39 | 0.9994 | 0.9861 | 0.9849 | 0.9935 | 1.0063 | 0.9888 | 0.9995 | 1.0803 | 1.1055 | 1.0463 | 0.9629 | 0.9892 | 0.9849 | 0.9979 |
| u40 | 0.9992 | 0.9855 | 0.9844 | 0.9934 | 1.0064 | 0.9887 | 0.9992 | 1.0754 | 1.0823 | 1.0239 | 0.9558 | 0.9844 | 0.9851 | 0.9989 |
| u41 | 0.9994 | 0.9855 | 0.9843 | 0.9933 | 1.0067 | 0.9885 | 0.9992 | 1.0751 | 1.0816 | 1.0241 | 0.9557 | 0.9846 | 0.985 | 0.999 |
| u42 | 0.9996 | 0.9855 | 0.9841 | 0.9933 | 1.0069 | 0.9882 | 0.9991 | 1.075 | 1.0807 | 1.0204 | 0.9552 | 0.9847 | 0.9851 | 0.9991 |
| u43 | 0.9999 | 0.9856 | 0.9841 | 0.9932 | 1.007 | 0.9879 | 0.9993 | 1.0756 | 1.0815 | 1.0202 | 0.9553 | 0.9847 | 0.9851 | 0.999 |
| u44 | 1.0002 | 0.9858 | 0.9841 | 0.9932 | 1.0072 | 0.9877 | 0.9991 | 1.0771 | 1.0886 | 1.0242 | 0.9599 | 0.9859 | 0.985 | 0.9984 |
| u45 | 1.0004 | 0.9858 | 0.9841 | 0.9932 | 1.0074 | 0.9875 | 0.9994 | 1.0768 | 1.0879 | 1.0244 | 0.9598 | 0.9861 | 0.9849 | 0.9985 |
| u46 | 1.0006 | 0.9859 | 0.984 | 0.9931 | 1.0078 | 0.9873 | 0.9991 | 1.0771 | 1.0893 | 1.0281 | 0.9604 | 0.9862 | 0.9847 | 0.9984 |
| u47 | 1.001 | 0.9861 | 0.9839 | 0.9931 | 1.008 | 0.9872 | 0.999 | 1.0777 | 1.0902 | 1.0279 | 0.9604 | 0.9863 | 0.9847 | 0.9984 |
| u48 | 1.003 | 0.9889 | 0.9858 | 0.9939 | 1.0088 | 0.9869 | 0.9999 | 1.0346 | 1.0534 | 1.0653 | 0.9798 | 0.994 | 0.9872 | 0.9979 |
| u49 | 1.0032 | 0.989 | 0.9857 | 0.9939 | 1.009 | 0.9868 | 0.9999 | 1.0342 | 1.0528 | 1.0656 | 0.9796 | 0.9941 | 0.9871 | 0.998 |

-continued

| | | | | | | | | | | | | | | |
|---|---|---|---|---|---|---|---|---|---|---|---|---|---|---|
| u50 | 1.0034 | 0.9889 | 0.9856 | 0.9938 | 1.0092 | 0.9865 | 0.9995 | 1.034 | 1.0518 | 1.0617 | 0.979 | 0.9941 | 0.9873 | 0.9981 |
| u51 | 1.0036 | 0.989 | 0.9855 | 0.9939 | 1.0095 | 0.9864 | 0.9995 | 1.0346 | 1.0526 | 1.0615 | 0.979 | 0.994 | 0.9874 | 0.998 |
| u52 | 1.0038 | 0.9889 | 0.9853 | 0.9937 | 1.0096 | 0.9862 | 0.9993 | 1.0337 | 1.0462 | 1.0574 | 0.9744 | 0.9929 | 0.9876 | 0.9987 |
| u53 | 1.004 | 0.9889 | 0.9853 | 0.9937 | 1.0099 | 0.9859 | 0.9993 | 1.0332 | 1.0454 | 1.0576 | 0.9742 | 0.993 | 0.9875 | 0.9988 |
| u54 | 1.0043 | 0.989 | 0.9852 | 0.9937 | 1.0101 | 0.9857 | 0.999 | 1.0337 | 1.0465 | 1.0614 | 0.9747 | 0.9932 | 0.9874 | 0.9987 |
| u55 | 1.0045 | 0.9891 | 0.9852 | 0.9936 | 1.0103 | 0.9854 | 0.9988 | 1.0342 | 1.0474 | 1.0611 | 0.9747 | 0.9932 | 0.9874 | 0.9987 |
| u56 | 1.0052 | 0.9899 | 0.9856 | 0.9938 | 1.0106 | 0.9854 | 0.999 | 1.039 | 1.0698 | 1.0845 | 0.9808 | 0.9967 | 0.9871 | 0.9979 |
| u57 | 1.0054 | 0.9899 | 0.9855 | 0.9937 | 1.0109 | 0.9852 | 0.9991 | 1.0386 | 1.0692 | 1.0847 | 0.9807 | 0.9968 | 0.9871 | 0.9979 |
| u58 | 1.0055 | 0.9899 | 0.9854 | 0.9938 | 1.0111 | 0.9849 | 0.9985 | 1.0386 | 1.0682 | 1.0808 | 0.9801 | 0.9968 | 0.9873 | 0.9979 |
| u59 | 1.0059 | 0.99 | 0.9853 | 0.9937 | 1.0113 | 0.9848 | 0.9986 | 1.0392 | 1.0691 | 1.0806 | 0.9801 | 0.9968 | 0.9873 | 0.9979 |
| u60 | 1.0062 | 0.9902 | 0.9853 | 0.9937 | 1.0115 | 0.9845 | 0.9988 | 1.0404 | 1.0759 | 1.0848 | 0.9845 | 0.9979 | 0.9871 | 0.9973 |
| u61 | 1.0063 | 0.9902 | 0.9852 | 0.9937 | 1.0118 | 0.9844 | 0.9986 | 1.04 | 1.0752 | 1.085 | 0.9844 | 0.9979 | 0.9871 | 0.9973 |
| u62 | 1.0066 | 0.9903 | 0.9852 | 0.9936 | 1.0121 | 0.9842 | 0.9986 | 1.0404 | 1.0763 | 1.0889 | 0.9848 | 0.9982 | 0.987 | 0.9972 |
| u63 | 1.0069 | 0.9904 | 0.9852 | 0.9936 | 1.0122 | 0.9841 | 0.9987 | 1.0409 | 1.0774 | 1.0887 | 0.9849 | 0.9981 | 0.987 | 0.9972 |
| u64 | 0.9581 | 0.9485 | 0.9436 | 0.9567 | 0.9973 | 0.9928 | 0.9943 | 1.079 | 1.1591 | 1.223 | 1.0969 | 0.9982 | 0.9759 | 0.9698 |
| u65 | 0.9583 | 0.9486 | 0.9435 | 0.9566 | 0.9975 | 0.9929 | 0.9942 | 1.0785 | 1.1582 | 1.2232 | 1.097 | 0.9984 | 0.9759 | 0.97 |
| u66 | 0.9584 | 0.9485 | 0.9434 | 0.9566 | 0.9975 | 0.9927 | 0.9939 | 1.0782 | 1.1571 | 1.2187 | 1.0965 | 0.9985 | 0.9761 | 0.9702 |
| u67 | 0.9586 | 0.9486 | 0.9433 | 0.9565 | 0.9977 | 0.9927 | 0.9939 | 1.0788 | 1.1579 | 1.2184 | 1.0966 | 0.9985 | 0.9762 | 0.9703 |
| u68 | 0.9587 | 0.9485 | 0.9431 | 0.9564 | 0.9978 | 0.9926 | 0.9932 | 1.0773 | 1.1506 | 1.2138 | 1.0913 | 0.9976 | 0.9764 | 0.9711 |
| u69 | 0.9589 | 0.9486 | 0.9431 | 0.9563 | 0.998 | 0.9926 | 0.9932 | 1.0768 | 1.1498 | 1.2139 | 1.0913 | 0.9977 | 0.9764 | 0.9714 |
| u70 | 0.959 | 0.9487 | 0.9431 | 0.9562 | 0.998 | 0.9924 | 0.9934 | 1.077 | 1.151 | 1.2181 | 1.0921 | 0.998 | 0.9762 | 0.9714 |
| u71 | 0.9594 | 0.9487 | 0.943 | 0.9561 | 0.9983 | 0.9925 | 0.9932 | 1.0772 | 1.1517 | 1.2178 | 1.0923 | 0.9982 | 0.9762 | 0.9715 |
| u72 | 0.959 | 0.9481 | 0.9425 | 0.9559 | 0.9982 | 0.9924 | 0.9927 | 1.0719 | 1.1278 | 1.192 | 1.0848 | 0.9948 | 0.9766 | 0.9726 |
| u73 | 0.9593 | 0.9482 | 0.9424 | 0.9559 | 0.9983 | 0.9923 | 0.9925 | 1.0712 | 1.1269 | 1.1922 | 1.0849 | 0.995 | 0.9765 | 0.9727 |
| u74 | 0.9593 | 0.9481 | 0.9423 | 0.9558 | 0.9984 | 0.9923 | 0.9925 | 1.0708 | 1.1258 | 1.1879 | 1.0843 | 0.9951 | 0.9768 | 0.9728 |
| u75 | 0.9595 | 0.9482 | 0.9422 | 0.9557 | 0.9985 | 0.9922 | 0.9923 | 1.0711 | 1.1265 | 1.1876 | 1.0844 | 0.9952 | 0.9768 | 0.9729 |
| u76 | 0.9599 | 0.9484 | 0.9423 | 0.9557 | 0.9987 | 0.992 | 0.9921 | 1.0724 | 1.1338 | 1.1921 | 1.09 | 0.9963 | 0.9766 | 0.9723 |
| u77 | 0.9599 | 0.9485 | 0.9422 | 0.9557 | 0.9988 | 0.9919 | 0.9918 | 1.0718 | 1.1329 | 1.1923 | 1.09 | 0.9965 | 0.9765 | 0.9724 |
| u78 | 0.9602 | 0.9486 | 0.9422 | 0.9555 | 0.9989 | 0.9919 | 0.9919 | 1.072 | 1.1341 | 1.1965 | 1.0907 | 0.9968 | 0.9764 | 0.9725 |
| u79 | 0.9604 | 0.9486 | 0.9421 | 0.9555 | 0.9991 | 0.9918 | 0.9916 | 1.0725 | 1.1349 | 1.1962 | 1.0909 | 0.997 | 0.9765 | 0.9725 |
| u80 | 0.9589 | 0.946 | 0.9403 | 0.9546 | 0.9987 | 0.9918 | 0.9906 | 1.1149 | 1.1745 | 1.1536 | 1.0681 | 0.9907 | 0.9741 | 0.9734 |
| u81 | 0.9591 | 0.9461 | 0.9402 | 0.9545 | 0.9988 | 0.9917 | 0.9908 | 1.1144 | 1.1736 | 1.1538 | 1.0681 | 0.991 | 0.974 | 0.9735 |
| u82 | 0.9592 | 0.946 | 0.9401 | 0.9545 | 0.9989 | 0.9915 | 0.9904 | 1.1144 | 1.1724 | 1.1495 | 1.0675 | 0.991 | 0.9742 | 0.9736 |
| u83 | 0.9595 | 0.9461 | 0.9401 | 0.9544 | 0.9992 | 0.9915 | 0.9907 | 1.1144 | 1.1732 | 1.1493 | 1.0677 | 0.9911 | 0.9743 | 0.9736 |
| u84 | 0.9595 | 0.946 | 0.9399 | 0.9543 | 0.9993 | 0.9914 | 0.9904 | 1.1133 | 1.1658 | 1.1447 | 1.0624 | 0.9902 | 0.9746 | 0.9743 |
| u85 | 0.9597 | 0.946 | 0.9398 | 0.9542 | 0.9994 | 0.9914 | 0.9897 | 1.1127 | 1.1649 | 1.145 | 1.0624 | 0.9904 | 0.9745 | 0.9743 |
| u86 | 0.9599 | 0.9461 | 0.9398 | 0.9542 | 0.9995 | 0.9911 | 0.9901 | 1.1131 | 1.1661 | 1.1492 | 1.0631 | 0.9907 | 0.9744 | 0.9743 |
| u87 | 0.9601 | 0.9462 | 0.9398 | 0.9541 | 0.9996 | 0.9911 | 0.9905 | 1.1134 | 1.167 | 1.149 | 1.0632 | 0.9909 | 0.9744 | 0.9743 |
| u88 | 0.9607 | 0.947 | 0.9402 | 0.9542 | 0.9998 | 0.9911 | 0.9901 | 1.119 | 1.1916 | 1.1745 | 1.0704 | 0.9943 | 0.9742 | 0.9734 |
| u89 | 0.961 | 0.947 | 0.9401 | 0.9541 | 1 | 0.9911 | 0.9904 | 1.1184 | 1.1907 | 1.1747 | 1.0703 | 0.9945 | 0.9742 | 0.9735 |
| u90 | 0.961 | 0.947 | 0.94 | 0.9541 | 1.0002 | 0.991 | 0.9903 | 1.1182 | 1.1896 | 1.1705 | 1.0696 | 0.9945 | 0.9744 | 0.9735 |
| u91 | 0.9613 | 0.9471 | 0.9399 | 0.954 | 1.0001 | 0.9908 | 0.9905 | 1.1187 | 1.1905 | 1.1703 | 1.0697 | 0.9947 | 0.9744 | 0.9734 |
| u92 | 0.9615 | 0.9472 | 0.94 | 0.954 | 1.0003 | 0.9907 | 0.9905 | 1.12 | 1.1979 | 1.1749 | 1.0749 | 0.9959 | 0.9743 | 0.9728 |
| u93 | 0.9618 | 0.9472 | 0.9399 | 0.954 | 1.0005 | 0.9907 | 0.9904 | 1.1194 | 1.197 | 1.1752 | 1.0748 | 0.996 | 0.9742 | 0.9729 |
| u94 | 0.962 | 0.9474 | 0.9399 | 0.9539 | 1.0006 | 0.9906 | 0.9904 | 1.1194 | 1.1983 | 1.1795 | 1.0755 | 0.9964 | 0.9741 | 0.9728 |
| u95 | 0.9621 | 0.9475 | 0.9399 | 0.9539 | 1.0006 | 0.9904 | 0.9906 | 1.1202 | 1.1991 | 1.1794 | 1.0755 | 0.9965 | 0.9742 | 0.9727 |
| u96 | 0.9697 | 0.9594 | 0.9488 | 0.958 | 1.0035 | 0.9905 | 0.9928 | 1.0781 | 1.1191 | 1.0784 | 1.0887 | 0.993 | 0.9848 | 0.9764 |
| u97 | 0.9698 | 0.9595 | 0.9487 | 0.958 | 1.0037 | 0.9904 | 0.9927 | 1.0776 | 1.1184 | 1.0786 | 1.0886 | 0.9933 | 0.9847 | 0.9765 |
| u98 | 0.9701 | 0.9594 | 0.9486 | 0.9579 | 1.0039 | 0.9903 | 0.9927 | 1.0777 | 1.1172 | 1.0746 | 1.0878 | 0.9935 | 0.985 | 0.9765 |
| u99 | 0.9703 | 0.9595 | 0.9486 | 0.9579 | 1.0039 | 0.9902 | 0.9927 | 1.078 | 1.118 | 1.0745 | 1.0878 | 0.9936 | 0.9851 | 0.9765 |
| u100 | 0.9705 | 0.9594 | 0.9484 | 0.9578 | 1.0041 | 0.99 | 0.9931 | 1.0769 | 1.111 | 1.0704 | 1.0822 | 0.9923 | 0.9853 | 0.9771 |
| u101 | 0.9706 | 0.9594 | 0.9483 | 0.9577 | 1.0042 | 0.9899 | 0.9931 | 1.0765 | 1.1101 | 1.0706 | 1.0821 | 0.9927 | 0.9853 | 0.9771 |
| u102 | 0.9707 | 0.9595 | 0.9484 | 0.9577 | 1.0042 | 0.9899 | 0.9933 | 1.0767 | 1.1113 | 1.0745 | 1.0827 | 0.993 | 0.9851 | 0.9771 |
| u103 | 0.9709 | 0.9596 | 0.9483 | 0.9577 | 1.0044 | 0.9896 | 0.9935 | 1.0771 | 1.1121 | 1.0743 | 1.0827 | 0.993 | 0.9851 | 0.9771 |
| u104 | 0.9707 | 0.959 | 0.9478 | 0.9574 | 1.0043 | 0.9896 | 0.9937 | 1.0715 | 1.0887 | 1.0512 | 1.0748 | 0.9886 | 0.9855 | 0.9779 |
| u105 | 0.9709 | 0.959 | 0.9477 | 0.9574 | 1.0044 | 0.9895 | 0.9939 | 1.0709 | 1.0879 | 1.0514 | 1.0747 | 0.9888 | 0.9854 | 0.9779 |
| u106 | 0.9711 | 0.959 | 0.9477 | 0.9574 | 1.0046 | 0.9894 | 0.9942 | 1.0708 | 1.0868 | 1.0476 | 1.0739 | 0.989 | 0.9856 | 0.978 |
| u107 | 0.9712 | 0.959 | 0.9476 | 0.9574 | 1.0047 | 0.9893 | 0.9945 | 1.0715 | 1.0875 | 1.0474 | 1.0738 | 0.9891 | 0.9857 | 0.9779 |
| u108 | 0.9716 | 0.9592 | 0.9476 | 0.9574 | 1.0048 | 0.9892 | 0.9951 | 1.0728 | 1.0945 | 1.0516 | 1.0791 | 0.9905 | 0.9856 | 0.9773 |
| u109 | 0.9717 | 0.9592 | 0.9475 | 0.9573 | 1.005 | 0.9892 | 0.9953 | 1.0724 | 1.0935 | 1.0519 | 1.0789 | 0.9907 | 0.9855 | 0.9773 |
| u110 | 0.972 | 0.9594 | 0.9476 | 0.9573 | 1.005 | 0.989 | 0.9953 | 1.0726 | 1.0946 | 1.0557 | 1.0795 | 0.9911 | 0.9854 | 0.9773 |
| u111 | 0.9722 | 0.9595 | 0.9475 | 0.9573 | 1.0052 | 0.9888 | 0.9957 | 1.0732 | 1.0955 | 1.0556 | 1.0795 | 0.9913 | 0.9854 | 0.9772 |
| u112 | 0.9742 | 0.9622 | 0.9493 | 0.9581 | 1.006 | 0.9887 | 0.9966 | 1.0312 | 1.0592 | 1.0952 | 1.1027 | 0.9986 | 0.9879 | 0.9766 |
| u113 | 0.9744 | 0.9622 | 0.9492 | 0.9581 | 1.0061 | 0.9886 | 0.9972 | 1.0306 | 1.0582 | 1.0955 | 1.1024 | 0.999 | 0.9878 | 0.9766 |
| u114 | 0.9745 | 0.9621 | 0.9491 | 0.9581 | 1.0062 | 0.9884 | 0.9972 | 1.0304 | 1.0572 | 1.0917 | 1.1016 | 0.9991 | 0.9881 | 0.9767 |
| u115 | 0.9748 | 0.9623 | 0.9491 | 0.9581 | 1.0064 | 0.9883 | 0.9975 | 1.0309 | 1.0579 | 1.0916 | 1.1015 | 0.9993 | 0.9882 | 0.9766 |
| u116 | 0.9749 | 0.9621 | 0.9489 | 0.958 | 1.0063 | 0.9883 | 0.9982 | 1.0296 | 1.0511 | 1.0875 | 1.0956 | 0.9982 | 0.9884 | 0.9773 |
| u117 | 0.975 | 0.9622 | 0.9489 | 0.958 | 1.0065 | 0.9881 | 0.9985 | 1.0291 | 1.0503 | 1.0878 | 1.0953 | 0.9985 | 0.9884 | 0.9773 |
| u118 | 0.9753 | 0.9623 | 0.9489 | 0.9579 | 1.0066 | 0.9879 | 0.9993 | 1.0293 | 1.0513 | 1.0918 | 1.0958 | 0.9989 | 0.9883 | 0.9773 |
| u119 | 0.9755 | 0.9623 | 0.9489 | 0.9579 | 1.0068 | 0.9878 | 0.9994 | 1.0299 | 1.0519 | 1.0917 | 1.0957 | 0.9991 | 0.9884 | 0.9773 |
| u120 | 0.9762 | 0.963 | 0.9493 | 0.9581 | 1.0071 | 0.9875 | 1.0004 | 1.0351 | 1.0744 | 1.1158 | 1.1038 | 1.0043 | 0.9882 | 0.9765 |
| u121 | 0.9764 | 0.963 | 0.9492 | 0.9581 | 1.0072 | 0.9876 | 1.0008 | 1.0347 | 1.0736 | 1.1163 | 1.1033 | 1.0047 | 0.9882 | 0.9765 |
| u122 | 0.9766 | 0.9631 | 0.9491 | 0.9581 | 1.0073 | 0.9873 | 1.0011 | 1.0344 | 1.0724 | 1.1123 | 1.1024 | 1.0049 | 0.9884 | 0.9766 |
| u123 | 0.9768 | 0.9631 | 0.9491 | 0.9581 | 1.0074 | 0.9872 | 1.0021 | 1.0348 | 1.073 | 1.1122 | 1.1023 | 1.005 | 0.9885 | 0.9765 |
| u124 | 0.9771 | 0.9633 | 0.9491 | 0.9581 | 1.0075 | 0.9871 | 1.0026 | 1.0362 | 1.08 | 1.1167 | 1.1077 | 1.0066 | 0.9884 | 0.9759 |
| u125 | 0.9773 | 0.9633 | 0.9491 | 0.9581 | 1.0076 | 0.987 | 1.003 | 1.0357 | 1.0791 | 1.1171 | 1.1074 | 1.007 | 0.9884 | 0.976 |
| u126 | 0.9775 | 0.9634 | 0.9491 | 0.9581 | 1.0078 | 0.9869 | 1.0039 | 1.0356 | 1.08 | 1.1212 | 1.1079 | 1.0073 | 0.9882 | 0.976 |
| u127 | 0.9778 | 0.9635 | 0.9491 | 0.9581 | 1.0079 | 0.9866 | 1.0046 | 1.0362 | 1.0807 | 1.1212 | 1.1077 | 1.0077 | 0.9883 | 0.976 |
| u128 | 0.9022 | 0.8587 | 0.8135 | 0.8719 | 1.012 | 0.9885 | 0.9755 | 1.0759 | 1.1591 | 1.2633 | 1.5171 | 1.8229 | 2.2059 | 2.557 |

-continued

| | | | | | | | | | | | | | |
|---|---|---|---|---|---|---|---|---|---|---|---|---|---|
| u129 | 0.902 | 0.859 | 0.8136 | 0.8717 | 1.0117 | 0.9887 | 0.976 | 1.0758 | 1.1583 | 1.2637 | 1.517 | 1.8236 | 2.2057 | 2.5572 |
| u130 | 0.9017 | 0.8591 | 0.8138 | 0.8715 | 1.0116 | 0.9887 | 0.977 | 1.076 | 1.1574 | 1.2596 | 1.5162 | 1.8237 | 2.2057 | 2.5575 |
| u131 | 0.9015 | 0.8594 | 0.8138 | 0.8711 | 1.0114 | 0.9887 | 0.9779 | 1.0766 | 1.1584 | 1.2596 | 1.5164 | 1.823 | 2.206 | 2.5573 |
| u132 | 0.9011 | 0.8594 | 0.8139 | 0.8708 | 1.0111 | 0.9888 | 0.9787 | 1.0758 | 1.1513 | 1.2552 | 1.5094 | 1.8197 | 2.2051 | 2.5583 |
| u133 | 0.9008 | 0.8597 | 0.8141 | 0.8703 | 1.0107 | 0.989 | 0.9795 | 1.0754 | 1.1504 | 1.2557 | 1.5094 | 1.8204 | 2.2049 | 2.5585 |
| u134 | 0.9007 | 0.86 | 0.8143 | 0.8702 | 1.0107 | 0.9891 | 0.9801 | 1.0755 | 1.1517 | 1.2601 | 1.5106 | 1.8205 | 2.205 | 2.5583 |
| u135 | 0.9003 | 0.8603 | 0.8144 | 0.8698 | 1.0104 | 0.9891 | 0.9804 | 1.0764 | 1.1527 | 1.2601 | 1.5108 | 1.8198 | 2.2052 | 2.5582 |
| u136 | 0.8998 | 0.86 | 0.8142 | 0.8694 | 1.0103 | 0.9891 | 0.9818 | 1.0702 | 1.1287 | 1.2344 | 1.5011 | 1.809 | 2.2018 | 2.5583 |
| u137 | 0.8994 | 0.8601 | 0.8143 | 0.8691 | 1.0099 | 0.9891 | 0.9821 | 1.0704 | 1.128 | 1.2349 | 1.5011 | 1.8097 | 2.2016 | 2.5585 |
| u138 | 0.8992 | 0.8603 | 0.8144 | 0.8687 | 1.0097 | 0.9892 | 0.983 | 1.0703 | 1.1269 | 1.2308 | 1.5003 | 1.8097 | 2.2016 | 2.5588 |
| u139 | 0.899 | 0.8606 | 0.8145 | 0.8685 | 1.0094 | 0.9892 | 0.9832 | 1.0713 | 1.1279 | 1.2307 | 1.5005 | 1.809 | 2.2019 | 2.5586 |
| u140 | 0.8988 | 0.861 | 0.8148 | 0.8682 | 1.0092 | 0.9893 | 0.9839 | 1.0728 | 1.1352 | 1.2355 | 1.5078 | 1.8123 | 2.2027 | 2.5577 |
| u141 | 0.8985 | 0.8612 | 0.8149 | 0.8678 | 1.009 | 0.9895 | 0.9848 | 1.0726 | 1.1345 | 1.2359 | 1.5078 | 1.813 | 2.2025 | 2.5579 |
| u142 | 0.8983 | 0.8616 | 0.8151 | 0.8676 | 1.0087 | 0.9896 | 0.9858 | 1.073 | 1.1357 | 1.2404 | 1.5089 | 1.8131 | 2.2026 | 2.5578 |
| u143 | 0.8981 | 0.8618 | 0.8152 | 0.8673 | 1.0082 | 0.9895 | 0.9863 | 1.0734 | 1.1367 | 1.2404 | 1.5091 | 1.8124 | 2.2029 | 2.5576 |
| u144 | 0.8964 | 0.8597 | 0.8138 | 0.8665 | 1.0079 | 0.9891 | 0.9864 | 1.1165 | 1.1762 | 1.1973 | 1.4813 | 1.7982 | 2.1934 | 2.5569 |
| u145 | 0.8962 | 0.8599 | 0.8139 | 0.8661 | 1.0078 | 0.9891 | 0.9871 | 1.1164 | 1.1755 | 1.1976 | 1.4813 | 1.7989 | 2.1932 | 2.5571 |
| u146 | 0.8959 | 0.8601 | 0.814 | 0.8658 | 1.0074 | 0.9894 | 0.9878 | 1.1168 | 1.1744 | 1.1935 | 1.4803 | 1.7989 | 2.1932 | 2.5574 |
| u147 | 0.8956 | 0.8604 | 0.8141 | 0.8655 | 1.0072 | 0.9894 | 0.9886 | 1.1177 | 1.1754 | 1.1934 | 1.4805 | 1.7982 | 2.1935 | 2.5572 |
| u148 | 0.8954 | 0.8605 | 0.8142 | 0.8653 | 1.007 | 0.9894 | 0.9886 | 1.1169 | 1.1683 | 1.189 | 1.4734 | 1.795 | 2.1927 | 2.5582 |
| u149 | 0.895 | 0.8607 | 0.8143 | 0.8649 | 1.0069 | 0.9895 | 0.9895 | 1.1168 | 1.1676 | 1.1894 | 1.4734 | 1.7957 | 2.1925 | 2.5585 |
| u150 | 0.8947 | 0.8611 | 0.8146 | 0.8647 | 1.0065 | 0.9895 | 0.99 | 1.1173 | 1.1687 | 1.1939 | 1.4744 | 1.7957 | 2.1926 | 2.5583 |
| u151 | 0.8945 | 0.8613 | 0.8147 | 0.8644 | 1.0063 | 0.9896 | 0.9908 | 1.1182 | 1.1697 | 1.1938 | 1.4747 | 1.7951 | 2.1928 | 2.5582 |
| u152 | 0.8947 | 0.8622 | 0.8152 | 0.8642 | 1.006 | 0.9899 | 0.9917 | 1.1238 | 1.1945 | 1.2197 | 1.4846 | 1.8059 | 2.1961 | 2.5581 |
| u153 | 0.8944 | 0.8625 | 0.8154 | 0.8639 | 1.0057 | 0.99 | 0.9921 | 1.1237 | 1.1938 | 1.2201 | 1.4845 | 1.8066 | 2.1958 | 2.5583 |
| u154 | 0.8941 | 0.8626 | 0.8155 | 0.8635 | 1.0055 | 0.9902 | 0.9929 | 1.124 | 1.1927 | 1.216 | 1.4836 | 1.8065 | 2.1958 | 2.5586 |
| u155 | 0.8939 | 0.8629 | 0.8157 | 0.8633 | 1.0054 | 0.9902 | 0.9933 | 1.1244 | 1.1937 | 1.2159 | 1.4838 | 1.8058 | 2.1961 | 2.5584 |
| u156 | 0.8937 | 0.8632 | 0.8159 | 0.863 | 1.0051 | 0.9904 | 0.9939 | 1.1262 | 1.2011 | 1.2206 | 1.4911 | 1.8091 | 2.1969 | 2.5575 |
| u157 | 0.8935 | 0.8636 | 0.816 | 0.8627 | 1.0049 | 0.9905 | 0.9943 | 1.126 | 1.2005 | 1.221 | 1.491 | 1.8098 | 2.1967 | 2.5577 |
| u158 | 0.8933 | 0.8638 | 0.8162 | 0.8623 | 1.0048 | 0.9905 | 0.9947 | 1.1267 | 1.2018 | 1.2255 | 1.492 | 1.8098 | 2.1968 | 2.5576 |
| u159 | 0.8931 | 0.8641 | 0.8163 | 0.8621 | 1.0044 | 0.9906 | 0.9951 | 1.1277 | 1.2027 | 1.2254 | 1.4923 | 1.8092 | 2.197 | 2.5574 |
| u160 | 0.8864 | 0.8541 | 0.809 | 0.8588 | 1.0033 | 0.9882 | 0.994 | 1.1707 | 1.2875 | 1.341 | 1.4767 | 1.8275 | 2.1981 | 2.5483 |
| u161 | 0.886 | 0.8545 | 0.8092 | 0.8585 | 1.003 | 0.9883 | 0.9945 | 1.1707 | 1.2869 | 1.3413 | 1.4767 | 1.8283 | 2.1978 | 2.5485 |
| u162 | 0.8857 | 0.8546 | 0.8093 | 0.8581 | 1.0026 | 0.9884 | 0.995 | 1.1707 | 1.2858 | 1.3369 | 1.4757 | 1.8282 | 2.1979 | 2.5487 |
| u163 | 0.8854 | 0.855 | 0.8094 | 0.8579 | 1.0023 | 0.9886 | 0.9954 | 1.1715 | 1.2869 | 1.3368 | 1.4758 | 1.8275 | 2.1981 | 2.5486 |
| u164 | 0.885 | 0.8552 | 0.8095 | 0.8575 | 1.0022 | 0.9887 | 0.9961 | 1.1709 | 1.2795 | 1.3321 | 1.4686 | 1.8241 | 2.1973 | 2.5496 |
| u165 | 0.8848 | 0.8554 | 0.8097 | 0.8574 | 1.0019 | 0.9887 | 0.9966 | 1.171 | 1.2787 | 1.3324 | 1.4685 | 1.8249 | 2.1971 | 2.5498 |
| u166 | 0.8845 | 0.8558 | 0.8098 | 0.857 | 1.0018 | 0.9889 | 0.9969 | 1.1721 | 1.2802 | 1.337 | 1.4695 | 1.8249 | 2.1971 | 2.5496 |
| u167 | 0.8844 | 0.856 | 0.8101 | 0.8566 | 1.0015 | 0.9891 | 0.9972 | 1.173 | 1.2813 | 1.3368 | 1.4697 | 1.8242 | 2.1973 | 2.5494 |
| u168 | 0.8836 | 0.8558 | 0.8098 | 0.8562 | 1.0013 | 0.9892 | 0.9977 | 1.1681 | 1.2563 | 1.3102 | 1.4598 | 1.8128 | 2.1942 | 2.5497 |
| u169 | 0.8833 | 0.8559 | 0.81 | 0.8559 | 1.0011 | 0.9892 | 0.9978 | 1.1677 | 1.2557 | 1.3105 | 1.4597 | 1.8135 | 2.1939 | 2.5499 |
| u170 | 0.883 | 0.8563 | 0.81 | 0.8557 | 1.0007 | 0.9893 | 0.9984 | 1.1677 | 1.2547 | 1.3061 | 1.4587 | 1.8135 | 2.1939 | 2.5501 |
| u171 | 0.8828 | 0.8565 | 0.8102 | 0.8553 | 1.0005 | 0.9895 | 0.999 | 1.1693 | 1.2557 | 1.3059 | 1.4589 | 1.8128 | 2.1942 | 2.55 |
| u172 | 0.8826 | 0.857 | 0.8104 | 0.855 | 1.0002 | 0.9896 | 0.9991 | 1.171 | 1.2636 | 1.3107 | 1.4662 | 1.8162 | 2.1949 | 2.549 |
| u173 | 0.8823 | 0.8572 | 0.8106 | 0.8548 | 0.9999 | 0.9897 | 0.9994 | 1.1704 | 1.2629 | 1.311 | 1.4661 | 1.8169 | 2.1946 | 2.5492 |
| u174 | 0.8822 | 0.8575 | 0.8108 | 0.8545 | 0.9995 | 0.99 | 1 | 1.1708 | 1.2643 | 1.3156 | 1.4671 | 1.817 | 2.1946 | 2.549 |
| u175 | 0.8818 | 0.8578 | 0.811 | 0.8543 | 0.9991 | 0.99 | 1.0001 | 1.1718 | 1.2653 | 1.3155 | 1.4673 | 1.8162 | 2.1949 | 2.5489 |
| u176 | 0.8833 | 0.8603 | 0.8126 | 0.8545 | 0.9993 | 0.9907 | 1.0006 | 1.1266 | 1.2228 | 1.3599 | 1.4956 | 1.8314 | 2.2045 | 2.5494 |
| u177 | 0.883 | 0.8605 | 0.8128 | 0.8543 | 0.9989 | 0.9909 | 1.0009 | 1.1265 | 1.2222 | 1.3602 | 1.4955 | 1.8321 | 2.2042 | 2.5496 |
| u178 | 0.8827 | 0.8607 | 0.8128 | 0.854 | 0.9985 | 0.9911 | 1.0014 | 1.1267 | 1.2211 | 1.3559 | 1.4944 | 1.8321 | 2.2042 | 2.5498 |
| u179 | 0.8825 | 0.861 | 0.813 | 0.8538 | 0.9984 | 0.9913 | 1.0015 | 1.1275 | 1.2221 | 1.3558 | 1.4946 | 1.8313 | 2.2044 | 2.5496 |
| u180 | 0.8822 | 0.8612 | 0.813 | 0.8534 | 0.9982 | 0.9914 | 1.0017 | 1.1268 | 1.2147 | 1.3512 | 1.4873 | 1.8278 | 2.2036 | 2.5506 |
| u181 | 0.8819 | 0.8615 | 0.8131 | 0.8532 | 0.9979 | 0.9916 | 1.0021 | 1.127 | 1.2141 | 1.3515 | 1.4872 | 1.8286 | 2.2034 | 2.5508 |
| u182 | 0.8816 | 0.8617 | 0.8134 | 0.8529 | 0.9975 | 0.9915 | 1.0021 | 1.1267 | 1.2154 | 1.356 | 1.4883 | 1.8286 | 2.2034 | 2.5506 |
| u183 | 0.8814 | 0.862 | 0.8135 | 0.8525 | 0.9973 | 0.9918 | 1.0026 | 1.1275 | 1.2163 | 1.3559 | 1.4884 | 1.8278 | 2.2036 | 2.5504 |
| u184 | 0.8817 | 0.8627 | 0.814 | 0.8524 | 0.9972 | 0.9921 | 1.0027 | 1.1329 | 1.2413 | 1.3822 | 1.4983 | 1.8393 | 2.2069 | 2.5501 |
| u185 | 0.8814 | 0.863 | 0.8142 | 0.8522 | 0.9969 | 0.9921 | 1.0029 | 1.1322 | 1.2406 | 1.3826 | 1.4982 | 1.84 | 2.2066 | 2.5503 |
| u186 | 0.8812 | 0.8633 | 0.8143 | 0.8519 | 0.9967 | 0.9924 | 1.0036 | 1.1326 | 1.2395 | 1.3782 | 1.4972 | 1.8399 | 2.2066 | 2.5505 |
| u187 | 0.8809 | 0.8636 | 0.8144 | 0.8516 | 0.9966 | 0.9925 | 1.0034 | 1.1332 | 1.2404 | 1.3781 | 1.4974 | 1.8391 | 2.2069 | 2.5503 |
| u188 | 0.8808 | 0.8639 | 0.8146 | 0.8513 | 0.9961 | 0.9928 | 1.0034 | 1.1343 | 1.2482 | 1.3828 | 1.5048 | 1.8427 | 2.2076 | 2.5493 |
| u189 | 0.8806 | 0.8641 | 0.8148 | 0.8511 | 0.996 | 0.9927 | 1.004 | 1.1342 | 1.2475 | 1.3832 | 1.5047 | 1.8434 | 2.2074 | 2.5495 |
| u190 | 0.8805 | 0.8646 | 0.815 | 0.8509 | 0.9957 | 0.9928 | 1.0042 | 1.135 | 1.2486 | 1.3877 | 1.5057 | 1.8434 | 2.2074 | 2.5493 |
| u191 | 0.8802 | 0.8648 | 0.8152 | 0.8506 | 0.9955 | 0.9931 | 1.004 | 1.1354 | 1.2497 | 1.3875 | 1.5059 | 1.8426 | 2.2076 | 2.5491 |
| u192 | 0.928 | 0.8932 | 0.8426 | 0.8805 | 1.0066 | 0.9954 | 0.9872 | 1.0814 | 1.1544 | 1.2347 | 1.3445 | 1.811 | 2.201 | 2.5689 |
| u193 | 0.9278 | 0.8933 | 0.8427 | 0.8804 | 1.0064 | 0.9957 | 0.9875 | 1.081 | 1.1535 | 1.235 | 1.3444 | 1.8116 | 2.2008 | 2.5692 |
| u194 | 0.9277 | 0.8935 | 0.8428 | 0.8803 | 1.0065 | 0.9955 | 0.988 | 1.0811 | 1.1524 | 1.2307 | 1.3435 | 1.8116 | 2.2009 | 2.5695 |
| u195 | 0.9277 | 0.8936 | 0.8428 | 0.8801 | 1.0063 | 0.9956 | 0.9881 | 1.0819 | 1.1532 | 1.2306 | 1.3436 | 1.811 | 2.2012 | 2.5693 |
| u196 | 0.9275 | 0.8937 | 0.8427 | 0.88 | 1.0062 | 0.9957 | 0.9884 | 1.0808 | 1.146 | 1.2261 | 1.3368 | 1.8077 | 2.2006 | 2.5703 |
| u197 | 0.9274 | 0.8938 | 0.8428 | 0.8799 | 1.006 | 0.9959 | 0.9889 | 1.0801 | 1.1452 | 1.2263 | 1.3367 | 1.8084 | 2.2004 | 2.5706 |
| u198 | 0.9273 | 0.8939 | 0.8429 | 0.8796 | 1.006 | 0.9957 | 0.989 | 1.0804 | 1.1464 | 1.2307 | 1.3376 | 1.8084 | 2.2005 | 2.5706 |
| u199 | 0.9273 | 0.8941 | 0.8429 | 0.8795 | 1.006 | 0.9957 | 0.989 | 1.081 | 1.1473 | 1.2305 | 1.3376 | 1.8078 | 2.2008 | 2.5704 |
| u200 | 0.9267 | 0.8937 | 0.8425 | 0.8791 | 1.0059 | 0.9958 | 0.9891 | 1.0753 | 1.1232 | 1.2048 | 1.3281 | 1.7972 | 2.1982 | 2.5708 |
| u201 | 0.9266 | 0.8937 | 0.8425 | 0.879 | 1.0058 | 0.9955 | 0.9897 | 1.0751 | 1.1223 | 1.205 | 1.3279 | 1.7979 | 2.198 | 2.5711 |
| u202 | 0.9267 | 0.8939 | 0.8426 | 0.8789 | 1.0058 | 0.9958 | 0.9902 | 1.075 | 1.1212 | 1.2009 | 1.327 | 1.7979 | 2.1981 | 2.5714 |
| u203 | 0.9266 | 0.894 | 0.8426 | 0.8788 | 1.0057 | 0.9959 | 0.9904 | 1.0753 | 1.122 | 1.2006 | 1.327 | 1.7973 | 2.1985 | 2.5713 |
| u204 | 0.9265 | 0.8943 | 0.8427 | 0.8786 | 1.0057 | 0.9959 | 0.9904 | 1.077 | 1.1293 | 1.2052 | 1.3338 | 1.8005 | 2.1993 | 2.5705 |
| u205 | 0.9264 | 0.8944 | 0.8427 | 0.8785 | 1.0056 | 0.9959 | 0.991 | 1.0762 | 1.1284 | 1.2055 | 1.3336 | 1.8012 | 2.1992 | 2.5708 |
| u206 | 0.9264 | 0.8946 | 0.8428 | 0.8783 | 1.0056 | 0.9959 | 0.9912 | 1.0762 | 1.1296 | 1.2098 | 1.3345 | 1.8012 | 2.1993 | 2.5707 |
| u207 | 0.9263 | 0.8947 | 0.8429 | 0.8782 | 1.0054 | 0.9959 | 0.9913 | 1.0771 | 1.1305 | 1.2096 | 1.3345 | 1.8006 | 2.1997 | 2.5706 |

| | | | | | | | | | | | | | | |
|---|---|---|---|---|---|---|---|---|---|---|---|---|---|---|
| u208 | 0.9244 | 0.8926 | 0.8414 | 0.8772 | 1.0047 | 0.9959 | 0.9909 | 1.1198 | 1.1701 | 1.1665 | 1.3068 | 1.7867 | 2.1914 | 2.5692 |
| u209 | 0.9243 | 0.8927 | 0.8415 | 0.8771 | 1.0047 | 0.9959 | 0.9912 | 1.1195 | 1.1692 | 1.1668 | 1.3066 | 1.7874 | 2.1914 | 2.5695 |
| u210 | 0.9241 | 0.8928 | 0.8415 | 0.877 | 1.0046 | 0.9959 | 0.9915 | 1.1197 | 1.168 | 1.1626 | 1.3057 | 1.7874 | 2.1915 | 2.5697 |
| u211 | 0.924 | 0.893 | 0.8415 | 0.8769 | 1.0046 | 0.996 | 0.9917 | 1.1202 | 1.169 | 1.1624 | 1.3057 | 1.7867 | 2.1919 | 2.5696 |
| u212 | 0.924 | 0.893 | 0.8414 | 0.8768 | 1.0044 | 0.996 | 0.9916 | 1.119 | 1.1614 | 1.1579 | 1.2989 | 1.7836 | 2.1914 | 2.5706 |
| u213 | 0.9238 | 0.8931 | 0.8414 | 0.8766 | 1.0042 | 0.996 | 0.9921 | 1.1188 | 1.1605 | 1.1581 | 1.2987 | 1.7842 | 2.1913 | 2.5709 |
| u214 | 0.9238 | 0.8933 | 0.8415 | 0.8764 | 1.0041 | 0.9961 | 0.9922 | 1.119 | 1.1617 | 1.1624 | 1.2996 | 1.7843 | 2.1914 | 2.5707 |
| u215 | 0.9238 | 0.8934 | 0.8416 | 0.8762 | 1.0042 | 0.996 | 0.9927 | 1.1197 | 1.1626 | 1.1622 | 1.2996 | 1.7837 | 2.1918 | 2.5707 |
| u216 | 0.9242 | 0.8941 | 0.842 | 0.8763 | 1.0044 | 0.9961 | 0.9934 | 1.1248 | 1.1874 | 1.1879 | 1.309 | 1.7941 | 2.1945 | 2.5705 |
| u217 | 0.924 | 0.8942 | 0.842 | 0.8762 | 1.0043 | 0.9962 | 0.9929 | 1.1244 | 1.1866 | 1.1881 | 1.3088 | 1.7948 | 2.1944 | 2.5707 |
| u218 | 0.9239 | 0.8943 | 0.842 | 0.8761 | 1.0042 | 0.9962 | 0.9933 | 1.1245 | 1.1854 | 1.1839 | 1.3079 | 1.7948 | 2.1946 | 2.571 |
| u219 | 0.9239 | 0.8945 | 0.842 | 0.8759 | 1.0043 | 0.9962 | 0.9935 | 1.1251 | 1.1863 | 1.1836 | 1.308 | 1.7941 | 2.195 | 2.5709 |
| u220 | 0.924 | 0.8947 | 0.8421 | 0.8759 | 1.0042 | 0.9963 | 0.9937 | 1.1267 | 1.1938 | 1.1882 | 1.3146 | 1.7974 | 2.1958 | 2.5701 |
| u221 | 0.9239 | 0.8948 | 0.8422 | 0.8758 | 1.0042 | 0.9963 | 0.9939 | 1.1264 | 1.193 | 1.1885 | 1.3144 | 1.7981 | 2.1957 | 2.5704 |
| u222 | 0.9238 | 0.895 | 0.8422 | 0.8757 | 1.004 | 0.9965 | 0.994 | 1.1267 | 1.1941 | 1.1928 | 1.3153 | 1.7981 | 2.1959 | 2.5703 |
| u223 | 0.9239 | 0.8952 | 0.8423 | 0.8756 | 1.0041 | 0.9964 | 0.9941 | 1.1272 | 1.195 | 1.1926 | 1.3153 | 1.7975 | 2.1963 | 2.5702 |
| u224 | 0.9322 | 0.9055 | 0.8496 | 0.8799 | 1.0076 | 0.9966 | 0.9993 | 1.0832 | 1.114 | 1.0899 | 1.3351 | 1.7795 | 2.1929 | 2.5817 |
| u225 | 0.932 | 0.9055 | 0.8496 | 0.8798 | 1.0074 | 0.9965 | 0.9997 | 1.0828 | 1.1132 | 1.0901 | 1.3349 | 1.7802 | 2.1929 | 2.5819 |
| u226 | 0.932 | 0.9056 | 0.8496 | 0.8797 | 1.0075 | 0.9966 | 0.9998 | 1.0823 | 1.112 | 1.0861 | 1.3339 | 1.7802 | 2.193 | 2.5822 |
| u227 | 0.9321 | 0.9057 | 0.8496 | 0.8796 | 1.0075 | 0.9965 | 0.9999 | 1.0831 | 1.1129 | 1.0859 | 1.334 | 1.7796 | 2.1934 | 2.582 |
| u228 | 0.9318 | 0.9057 | 0.8495 | 0.8795 | 1.0075 | 0.9965 | 1.0004 | 1.0817 | 1.1059 | 1.0816 | 1.3272 | 1.7766 | 2.1929 | 2.5829 |
| u229 | 0.9318 | 0.9057 | 0.8495 | 0.8794 | 1.0075 | 0.9965 | 1.0006 | 1.0814 | 1.105 | 1.0818 | 1.327 | 1.7773 | 2.193 | 2.5832 |
| u230 | 0.9318 | 0.9059 | 0.8496 | 0.8794 | 1.0074 | 0.9965 | 1.0007 | 1.0816 | 1.1062 | 1.0857 | 1.3278 | 1.7774 | 2.1932 | 2.5831 |
| u231 | 0.9318 | 0.9061 | 0.8496 | 0.8793 | 1.0075 | 0.9965 | 1.001 | 1.0817 | 1.107 | 1.0854 | 1.3278 | 1.7768 | 2.1936 | 2.583 |
| u232 | 0.9312 | 0.9056 | 0.8492 | 0.879 | 1.0074 | 0.9965 | 1.0009 | 1.0765 | 1.0835 | 1.0618 | 1.3184 | 1.7668 | 2.1913 | 2.5833 |
| u233 | 0.9311 | 0.9057 | 0.8493 | 0.8789 | 1.0073 | 0.9964 | 1.0012 | 1.0764 | 1.0827 | 1.062 | 1.3182 | 1.7675 | 2.1912 | 2.5836 |
| u234 | 0.9311 | 0.9058 | 0.8492 | 0.8788 | 1.0072 | 0.9964 | 1.0012 | 1.0761 | 1.0817 | 1.0581 | 1.3172 | 1.7675 | 2.1914 | 2.5838 |
| u235 | 0.9311 | 0.9059 | 0.8492 | 0.8788 | 1.0072 | 0.9964 | 1.0016 | 1.0766 | 1.0825 | 1.0578 | 1.3173 | 1.767 | 2.1919 | 2.5837 |
| u236 | 0.9312 | 0.9061 | 0.8493 | 0.8787 | 1.0073 | 0.9964 | 1.0016 | 1.0779 | 1.0893 | 1.0619 | 1.3238 | 1.77 | 2.1927 | 2.5829 |
| u237 | 0.931 | 0.9062 | 0.8493 | 0.8787 | 1.0074 | 0.9964 | 1.0022 | 1.0775 | 1.0887 | 1.0621 | 1.3236 | 1.7708 | 2.1927 | 2.5831 |
| u238 | 0.9312 | 0.9063 | 0.8494 | 0.8786 | 1.0073 | 0.9963 | 1.0022 | 1.0777 | 1.0897 | 1.0659 | 1.3244 | 1.7708 | 2.1929 | 2.583 |
| u239 | 0.9312 | 0.9064 | 0.8493 | 0.8786 | 1.0073 | 0.9964 | 1.0023 | 1.0781 | 1.0906 | 1.0657 | 1.3244 | 1.7703 | 2.1934 | 2.5829 |
| u240 | 0.9332 | 0.9088 | 0.8508 | 0.8795 | 1.0081 | 0.9962 | 1.0035 | 1.0345 | 1.0541 | 1.1057 | 1.3518 | 1.7836 | 2.2019 | 2.5846 |
| u241 | 0.9332 | 0.9089 | 0.8509 | 0.8795 | 1.0082 | 0.9963 | 1.0037 | 1.034 | 1.0533 | 1.1059 | 1.3515 | 1.7843 | 2.2019 | 2.5849 |
| u242 | 0.9331 | 0.909 | 0.8508 | 0.8794 | 1.0081 | 0.9961 | 1.0039 | 1.0339 | 1.0523 | 1.1019 | 1.3506 | 1.7843 | 2.2021 | 2.5851 |
| u243 | 0.9331 | 0.9091 | 0.8508 | 0.8794 | 1.0081 | 0.9961 | 1.004 | 1.0344 | 1.0531 | 1.1016 | 1.3506 | 1.7838 | 2.2026 | 2.585 |
| u244 | 0.9331 | 0.909 | 0.8507 | 0.8793 | 1.0081 | 0.9961 | 1.0043 | 1.0331 | 1.0463 | 1.0974 | 1.3438 | 1.7808 | 2.2021 | 2.5859 |
| u245 | 0.933 | 0.9091 | 0.8507 | 0.8793 | 1.0081 | 0.9961 | 1.0041 | 1.0327 | 1.0456 | 1.0976 | 1.3436 | 1.7815 | 2.2021 | 2.5862 |
| u246 | 0.9329 | 0.9092 | 0.8508 | 0.8791 | 1.0081 | 0.9961 | 1.0045 | 1.0329 | 1.0465 | 1.1015 | 1.3444 | 1.7816 | 2.2023 | 2.5861 |
| u247 | 0.933 | 0.9093 | 0.8508 | 0.879 | 1.0082 | 0.9961 | 1.0048 | 1.0334 | 1.0473 | 1.1012 | 1.3444 | 1.781 | 2.2028 | 2.586 |
| u248 | 0.9336 | 0.9099 | 0.8511 | 0.8793 | 1.0083 | 0.996 | 1.0054 | 1.0386 | 1.0701 | 1.1254 | 1.3537 | 1.7912 | 2.2058 | 2.5858 |
| u249 | 0.9335 | 0.91 | 0.8511 | 0.8792 | 1.0084 | 0.996 | 1.0056 | 1.038 | 1.0693 | 1.1256 | 1.3535 | 1.7919 | 2.2058 | 2.5861 |
| u250 | 0.9334 | 0.9101 | 0.8511 | 0.8792 | 1.0085 | 0.9959 | 1.0061 | 1.0379 | 1.0683 | 1.1215 | 1.3525 | 1.792 | 2.2061 | 2.5864 |
| u251 | 0.9335 | 0.9102 | 0.8511 | 0.8792 | 1.0085 | 0.9959 | 1.0058 | 1.0383 | 1.069 | 1.1212 | 1.3525 | 1.7913 | 2.2065 | 2.5863 |
| u252 | 0.9336 | 0.9105 | 0.8512 | 0.8792 | 1.0086 | 0.9959 | 1.0066 | 1.0394 | 1.0757 | 1.1254 | 1.3592 | 1.7945 | 2.2075 | 2.5856 |
| u253 | 0.9336 | 0.9105 | 0.8511 | 0.8792 | 1.0086 | 0.9958 | 1.0068 | 1.0391 | 1.075 | 1.1257 | 1.3589 | 1.7952 | 2.2075 | 2.5859 |
| u254 | 0.9337 | 0.9106 | 0.8512 | 0.8791 | 1.0087 | 0.9957 | 1.0073 | 1.0392 | 1.0761 | 1.1296 | 1.3598 | 1.7953 | 2.2077 | 2.5858 |
| u255 | 0.9337 | 0.9108 | 0.8512 | 0.8791 | 1.0088 | 0.9957 | 1.0074 | 1.0398 | 1.077 | 1.1294 | 1.3598 | 1.7947 | 2.2082 | 2.5857 |
| u256 | 0.8915 | 0.8796 | 1.3001 | 1.8952 | 2.8681 | 3.3518 | 3.6708 | 4.0887 | 4.1608 | 3.8503 | 3.6605 | 3.9413 | 4.3507 | 4.7054 |
| u257 | 0.8916 | 0.8797 | 1.3002 | 1.8948 | 2.8685 | 3.3517 | 3.6708 | 4.1022 | 4.1699 | 3.849 | 3.6605 | 3.9448 | 4.3508 | 4.7053 |
| u258 | 0.8917 | 0.8797 | 1.3001 | 1.8944 | 2.8689 | 3.3515 | 3.6706 | 4.1043 | 4.1825 | 3.8719 | 3.6597 | 3.9445 | 4.3484 | 4.7049 |
| u259 | 0.8919 | 0.8797 | 1.3002 | 1.8941 | 2.8697 | 3.3514 | 3.6705 | 4.0854 | 4.1733 | 3.8731 | 3.6599 | 3.9398 | 4.349 | 4.704 |
| u260 | 0.8919 | 0.8797 | 1.3001 | 1.8936 | 2.8699 | 3.351 | 3.6702 | 4.1155 | 4.2566 | 3.8986 | 3.6691 | 3.9336 | 4.3434 | 4.6978 |
| u261 | 0.8921 | 0.8797 | 1.3002 | 1.893 | 2.8703 | 3.3509 | 3.6701 | 4.1289 | 4.2666 | 3.8972 | 3.669 | 3.9366 | 4.3432 | 4.6973 |
| u262 | 0.8922 | 0.8798 | 1.3004 | 1.8926 | 2.8712 | 3.3508 | 3.6701 | 4.1202 | 4.2529 | 3.8731 | 3.6699 | 3.9338 | 4.3461 | 4.6962 |
| u263 | 0.8924 | 0.8799 | 1.3004 | 1.8923 | 2.8716 | 3.3508 | 3.67 | 4.1016 | 4.2429 | 3.8743 | 3.6701 | 3.9292 | 4.3469 | 4.695 |
| u264 | 0.8921 | 0.8794 | 1.2996 | 1.891 | 2.871 | 3.3494 | 3.6691 | 4.2958 | 4.558 | 4.0318 | 3.6921 | 3.9209 | 4.3299 | 4.6826 |
| u265 | 0.8922 | 0.8795 | 1.2997 | 1.8906 | 2.8715 | 3.3493 | 3.669 | 4.3065 | 4.57 | 4.0303 | 3.6919 | 3.9243 | 4.3297 | 4.6819 |
| u266 | 0.8924 | 0.8795 | 1.2997 | 1.8903 | 2.8719 | 3.3491 | 3.6689 | 4.3082 | 4.5864 | 4.0608 | 3.6911 | 3.9256 | 4.3272 | 4.681 |
| u267 | 0.8925 | 0.8795 | 1.2998 | 1.8898 | 2.8725 | 3.3491 | 3.6688 | 4.2917 | 4.5743 | 4.0624 | 3.6912 | 3.9217 | 4.3278 | 4.6799 |
| u268 | 0.8928 | 0.8798 | 1.2999 | 1.8897 | 2.8735 | 3.3492 | 3.6689 | 4.2606 | 4.4727 | 4.0297 | 3.6814 | 3.9258 | 4.3342 | 4.6844 |
| u269 | 0.893 | 0.8798 | 1.3 | 1.8892 | 2.8739 | 3.3491 | 3.6689 | 4.2727 | 4.4841 | 4.0281 | 3.6813 | 3.9291 | 4.334 | 4.6834 |
| u270 | 0.8932 | 0.8799 | 1.3002 | 1.8888 | 2.8743 | 3.3491 | 3.6688 | 4.2648 | 4.4684 | 3.9987 | 3.6822 | 3.9273 | 4.337 | 4.6821 |
| u271 | 0.8935 | 0.88 | 1.3003 | 1.8884 | 2.8751 | 3.3491 | 3.6688 | 4.2478 | 4.4571 | 4.0002 | 3.6823 | 3.9238 | 4.3375 | 4.6811 |
| u272 | 0.8919 | 0.8778 | 1.2973 | 1.8848 | 2.8702 | 3.343 | 3.6663 | 3.8797 | 4.1982 | 4.3205 | 3.7747 | 3.9425 | 4.3193 | 4.6778 |
| u273 | 0.8921 | 0.8779 | 1.2974 | 1.8843 | 2.8707 | 3.3429 | 3.6663 | 3.8895 | 4.2054 | 4.3185 | 3.7746 | 3.9465 | 4.319 | 4.6775 |
| u274 | 0.8922 | 0.8779 | 1.2973 | 1.8839 | 2.8711 | 3.3427 | 3.6662 | 3.8923 | 4.2153 | 4.3564 | 3.7739 | 3.9484 | 4.3161 | 4.677 |
| u275 | 0.8924 | 0.878 | 1.2974 | 1.8836 | 2.8718 | 3.3427 | 3.6661 | 3.8822 | 4.2081 | 4.3585 | 3.774 | 3.9453 | 4.3163 | 4.6758 |
| u276 | 0.8925 | 0.8779 | 1.2973 | 1.883 | 2.8722 | 3.3423 | 3.6659 | 3.9022 | 4.2727 | 4.3999 | 3.7867 | 3.9416 | 4.3092 | 4.6694 |
| u277 | 0.8926 | 0.878 | 1.2973 | 1.8826 | 2.8726 | 3.3422 | 3.6659 | 3.9123 | 4.2804 | 4.3978 | 3.7865 | 3.9458 | 4.309 | 4.6692 |
| u278 | 0.8928 | 0.878 | 1.2975 | 1.8823 | 2.8731 | 3.3422 | 3.6659 | 3.9094 | 4.27 | 4.359 | 3.7871 | 3.9447 | 4.312 | 4.6675 |
| u279 | 0.8931 | 0.8781 | 1.2976 | 1.882 | 2.8735 | 3.3422 | 3.6658 | 3.8993 | 4.2625 | 4.361 | 3.7872 | 3.9417 | 4.3122 | 4.6665 |
| u280 | 0.8936 | 0.8787 | 1.2984 | 1.8822 | 2.8753 | 3.3434 | 3.6666 | 3.7692 | 4.0578 | 4.1588 | 3.7595 | 3.942 | 4.3288 | 4.6766 |
| u281 | 0.8939 | 0.8787 | 1.2986 | 1.8819 | 2.8757 | 3.3433 | 3.6666 | 3.7789 | 4.0642 | 4.1569 | 3.7593 | 3.9458 | 4.3286 | 4.6763 |
| u282 | 0.8939 | 0.8787 | 1.2986 | 1.8814 | 2.8763 | 3.3432 | 3.6665 | 3.7815 | 4.073 | 4.1913 | 3.7586 | 3.9478 | 4.3255 | 4.6759 |
| u283 | 0.8942 | 0.8787 | 1.2986 | 1.8811 | 2.8767 | 3.3431 | 3.6664 | 3.7707 | 4.0666 | 4.1932 | 3.7587 | 3.9444 | 4.3258 | 4.6746 |
| u284 | 0.8945 | 0.8789 | 1.2989 | 1.881 | 2.8775 | 3.3434 | 3.6666 | 3.7495 | 4.0123 | 4.1564 | 3.747 | 3.9489 | 4.3328 | 4.6798 |
| u285 | 0.8947 | 0.879 | 1.2989 | 1.8806 | 2.8781 | 3.3432 | 3.6666 | 3.7596 | 4.0183 | 4.1546 | 3.7468 | 3.9526 | 4.3325 | 4.6795 |
| u286 | 0.8949 | 0.8791 | 1.2991 | 1.8801 | 2.8786 | 3.3433 | 3.6665 | 3.7563 | 4.0101 | 4.1214 | 3.7474 | 3.9518 | 4.3355 | 4.6786 |

-continued

| | | | | | | | | | | | | | | |
|---|---|---|---|---|---|---|---|---|---|---|---|---|---|---|
| u287 | 0.8951 | 0.8792 | 1.2991 | 1.8797 | 2.8792 | 3.3432 | 3.6665 | 3.7456 | 4.0041 | 4.1231 | 3.7475 | 3.9487 | 4.3358 | 4.6777 |
| u288 | 0.8889 | 0.8691 | 1.2847 | 1.864 | 2.8496 | 3.3213 | 3.6543 | 3.5642 | 3.7513 | 3.8389 | 3.8974 | 4.0686 | 4.4811 | 4.7301 |
| u289 | 0.8891 | 0.8691 | 1.2848 | 1.8637 | 2.8499 | 3.3212 | 3.6542 | 3.5709 | 3.7554 | 3.8379 | 3.8974 | 4.0724 | 4.4806 | 4.7304 |
| u290 | 0.8892 | 0.8691 | 1.2848 | 1.8634 | 2.8503 | 3.3211 | 3.6542 | 3.5729 | 3.7609 | 3.856 | 3.8972 | 4.0742 | 4.4775 | 4.7307 |
| u291 | 0.8896 | 0.8692 | 1.2849 | 1.863 | 2.8509 | 3.321 | 3.6542 | 3.5662 | 3.7574 | 3.857 | 3.8973 | 4.0707 | 4.4776 | 4.7304 |
| u292 | 0.8896 | 0.8691 | 1.2848 | 1.8625 | 2.8513 | 3.3207 | 3.654 | 3.5794 | 3.7921 | 3.8768 | 3.9136 | 4.0675 | 4.4705 | 4.7242 |
| u293 | 0.8898 | 0.8691 | 1.2848 | 1.8621 | 2.8516 | 3.3206 | 3.654 | 3.5861 | 3.7962 | 3.8758 | 3.9136 | 4.0715 | 4.47 | 4.7246 |
| u294 | 0.8901 | 0.8692 | 1.285 | 1.8618 | 2.852 | 3.3206 | 3.654 | 3.584 | 3.7911 | 3.8573 | 3.9137 | 4.0702 | 4.473 | 4.7242 |
| u295 | 0.8904 | 0.8693 | 1.2851 | 1.8615 | 2.8526 | 3.3205 | 3.654 | 3.5772 | 3.7873 | 3.8583 | 3.9138 | 4.0668 | 4.4731 | 4.7239 |
| u296 | 0.8902 | 0.8687 | 1.2844 | 1.8604 | 2.852 | 3.3192 | 3.653 | 3.6618 | 3.9167 | 3.9706 | 3.9499 | 4.0685 | 4.4558 | 4.7116 |
| u297 | 0.8904 | 0.8687 | 1.2845 | 1.8601 | 2.8524 | 3.319 | 3.653 | 3.6686 | 3.9216 | 3.9695 | 3.9498 | 4.0723 | 4.4553 | 4.7119 |
| u298 | 0.8907 | 0.8688 | 1.2845 | 1.8598 | 2.853 | 3.3189 | 3.653 | 3.6709 | 3.9281 | 3.9902 | 3.9499 | 4.0739 | 4.4522 | 4.7123 |
| u299 | 0.8909 | 0.8688 | 1.2845 | 1.8594 | 2.8533 | 3.3189 | 3.653 | 3.6638 | 3.9236 | 3.9913 | 3.95 | 4.0702 | 4.4523 | 4.712 |
| u300 | 0.8913 | 0.8689 | 1.2848 | 1.8592 | 2.854 | 3.3191 | 3.6531 | 3.65 | 3.8843 | 3.9691 | 3.932 | 4.0739 | 4.4593 | 4.7179 |
| u301 | 0.8914 | 0.869 | 1.2849 | 1.8589 | 2.8543 | 3.319 | 3.6531 | 3.6569 | 3.8889 | 3.968 | 3.932 | 4.0777 | 4.4588 | 4.7182 |
| u302 | 0.8917 | 0.869 | 1.2851 | 1.8585 | 2.855 | 3.3189 | 3.6532 | 3.6548 | 3.8831 | 3.9477 | 3.9321 | 4.0763 | 4.4617 | 4.7179 |
| u303 | 0.892 | 0.8691 | 1.2852 | 1.8581 | 2.8556 | 3.319 | 3.6532 | 3.6479 | 3.8789 | 3.9488 | 3.9322 | 4.0726 | 4.4619 | 4.7176 |
| u304 | 0.8936 | 0.8714 | 1.2881 | 1.861 | 2.8611 | 3.3248 | 3.6563 | 3.8554 | 3.9609 | 3.7625 | 3.8234 | 4.0518 | 4.4757 | 4.7332 |
| u305 | 0.8937 | 0.8714 | 1.2882 | 1.8605 | 2.8617 | 3.3246 | 3.6563 | 3.8636 | 3.9662 | 3.7617 | 3.8233 | 4.0556 | 4.4754 | 4.7335 |
| u306 | 0.894 | 0.8714 | 1.2883 | 1.8603 | 2.8621 | 3.3245 | 3.6563 | 3.8661 | 3.9735 | 3.7782 | 3.8229 | 4.0572 | 4.4724 | 4.7338 |
| u307 | 0.8942 | 0.8714 | 1.2883 | 1.8599 | 2.8625 | 3.3245 | 3.6562 | 3.8581 | 3.9682 | 3.7792 | 3.823 | 4.0539 | 4.4727 | 4.7335 |
| u308 | 0.8944 | 0.8713 | 1.2882 | 1.8594 | 2.8627 | 3.3241 | 3.656 | 3.874 | 4.0159 | 3.7973 | 3.8369 | 4.0504 | 4.4657 | 4.7273 |
| u309 | 0.8946 | 0.8713 | 1.2883 | 1.8591 | 2.8632 | 3.324 | 3.656 | 3.8822 | 4.0214 | 3.7964 | 3.8369 | 4.0542 | 4.4654 | 4.7277 |
| u310 | 0.8949 | 0.8714 | 1.2885 | 1.8587 | 2.8637 | 3.324 | 3.656 | 3.8799 | 4.0137 | 3.7795 | 3.8373 | 4.053 | 4.4684 | 4.7273 |
| u311 | 0.8951 | 0.8715 | 1.2886 | 1.8584 | 2.8641 | 3.324 | 3.656 | 3.872 | 4.0081 | 3.7804 | 3.8375 | 4.0496 | 4.4686 | 4.727 |
| u312 | 0.8958 | 0.8721 | 1.2894 | 1.8587 | 2.8658 | 3.3253 | 3.6569 | 3.7715 | 3.8543 | 3.687 | 3.8093 | 4.0487 | 4.4851 | 4.7396 |
| u313 | 0.896 | 0.872 | 1.2896 | 1.8583 | 2.8661 | 3.3252 | 3.6568 | 3.7797 | 3.8591 | 3.6863 | 3.8092 | 4.0524 | 4.4848 | 4.7399 |
| u314 | 0.8963 | 0.872 | 1.2895 | 1.8581 | 2.8666 | 3.325 | 3.6569 | 3.7822 | 3.8656 | 3.7011 | 3.8086 | 4.0541 | 4.4818 | 4.7401 |
| u315 | 0.8966 | 0.8721 | 1.2896 | 1.8578 | 2.8671 | 3.325 | 3.6569 | 3.7743 | 3.861 | 3.7019 | 3.8088 | 4.0507 | 4.482 | 4.7398 |
| u316 | 0.8968 | 0.8723 | 1.2899 | 1.8576 | 2.8677 | 3.3252 | 3.6571 | 3.7586 | 3.8213 | 3.6862 | 3.7964 | 4.0542 | 4.4888 | 4.746 |
| u317 | 0.8971 | 0.8723 | 1.29 | 1.8572 | 2.8681 | 3.3251 | 3.6571 | 3.7667 | 3.8259 | 3.6855 | 3.7963 | 4.0578 | 4.4885 | 4.7462 |
| u318 | 0.8973 | 0.8724 | 1.2901 | 1.8568 | 2.8686 | 3.3251 | 3.6572 | 3.7646 | 3.8199 | 3.6712 | 3.7969 | 4.0568 | 4.4915 | 4.7458 |
| u319 | 0.8975 | 0.8724 | 1.2901 | 1.8565 | 2.869 | 3.3252 | 3.6572 | 3.7569 | 3.8157 | 3.6721 | 3.797 | 4.0536 | 4.4917 | 4.7455 |
| u320 | 0.8602 | 0.8445 | 1.2214 | 1.7566 | 2.8062 | 3.2683 | 3.6363 | 3.5347 | 3.6387 | 3.513 | 3.732 | 4.1832 | 4.6791 | 5.1416 |
| u321 | 0.8606 | 0.8445 | 1.2214 | 1.7563 | 2.8068 | 3.2682 | 3.6362 | 3.5413 | 3.6409 | 3.5168 | 3.7319 | 4.1867 | 4.679 | 5.1417 |
| u322 | 0.8608 | 0.8444 | 1.2214 | 1.756 | 2.8069 | 3.2682 | 3.636 | 3.5439 | 3.643 | 3.5269 | 3.7314 | 4.1883 | 4.6756 | 5.1419 |
| u323 | 0.8613 | 0.8444 | 1.2215 | 1.7558 | 2.8074 | 3.2682 | 3.6358 | 3.5386 | 3.6395 | 3.5315 | 3.7316 | 4.1846 | 4.6754 | 5.1421 |
| u324 | 0.8617 | 0.8442 | 1.2215 | 1.7553 | 2.8076 | 3.2679 | 3.6356 | 3.5509 | 3.6599 | 3.5389 | 3.741 | 4.181 | 4.6685 | 5.1334 |
| u325 | 0.8619 | 0.8441 | 1.2216 | 1.7551 | 2.8079 | 3.2678 | 3.6355 | 3.5573 | 3.6606 | 3.5417 | 3.741 | 4.1845 | 4.6684 | 5.1334 |
| u326 | 0.8623 | 0.8441 | 1.2218 | 1.7548 | 2.8083 | 3.2679 | 3.6355 | 3.5561 | 3.6574 | 3.5394 | 3.7414 | 4.183 | 4.6715 | 5.1336 |
| u327 | 0.8628 | 0.8441 | 1.2219 | 1.7546 | 2.8086 | 3.2679 | 3.6352 | 3.5507 | 3.6541 | 3.5423 | 3.7415 | 4.1793 | 4.6715 | 5.1337 |
| u328 | 0.8628 | 0.8435 | 1.2213 | 1.7538 | 2.8078 | 3.2667 | 3.6342 | 3.6264 | 3.7445 | 3.5788 | 3.7643 | 4.1808 | 4.6568 | 5.1169 |
| u329 | 0.8632 | 0.8435 | 1.2215 | 1.7535 | 2.8081 | 3.2667 | 3.6341 | 3.6329 | 3.7478 | 3.5797 | 3.7642 | 4.1846 | 4.6566 | 5.1171 |
| u330 | 0.8635 | 0.8434 | 1.2215 | 1.7533 | 2.8085 | 3.2666 | 3.6338 | 3.6353 | 3.7514 | 3.5896 | 3.7635 | 4.1861 | 4.6531 | 5.1173 |
| u331 | 0.8639 | 0.8433 | 1.2216 | 1.7531 | 2.8089 | 3.2666 | 3.6338 | 3.6294 | 3.7467 | 3.5912 | 3.7637 | 4.1828 | 4.6531 | 5.1175 |
| u332 | 0.8644 | 0.8434 | 1.2219 | 1.7528 | 2.8094 | 3.2668 | 3.6338 | 3.6182 | 3.7178 | 3.5845 | 3.7553 | 4.1859 | 4.6597 | 5.1264 |
| u333 | 0.8647 | 0.8433 | 1.222 | 1.7526 | 2.8097 | 3.2668 | 3.6337 | 3.6246 | 3.7202 | 3.5847 | 3.7552 | 4.1894 | 4.6595 | 5.1265 |
| u334 | 0.8652 | 0.8433 | 1.2222 | 1.7524 | 2.8101 | 3.2669 | 3.6337 | 3.6235 | 3.7145 | 3.5779 | 3.7557 | 4.188 | 4.6626 | 5.1267 |
| u335 | 0.8655 | 0.8434 | 1.2223 | 1.7521 | 2.8103 | 3.2669 | 3.6336 | 3.6178 | 3.7099 | 3.5796 | 3.7559 | 4.1846 | 4.6625 | 5.1268 |
| u336 | 0.865 | 0.8411 | 1.2198 | 1.7492 | 2.8055 | 3.2614 | 3.6295 | 3.4989 | 3.6673 | 3.6986 | 3.8218 | 4.2101 | 4.6593 | 5.1117 |
| u337 | 0.8652 | 0.841 | 1.2199 | 1.7489 | 2.8058 | 3.2613 | 3.6294 | 3.5028 | 3.6702 | 3.6976 | 3.8216 | 4.2139 | 4.6591 | 5.1118 |
| u338 | 0.8656 | 0.8409 | 1.2199 | 1.7488 | 2.8061 | 3.2613 | 3.6293 | 3.5018 | 3.6721 | 3.7107 | 3.8213 | 4.2156 | 4.6557 | 5.1119 |
| u339 | 0.8661 | 0.8408 | 1.22 | 1.7486 | 2.8064 | 3.2613 | 3.6291 | 3.4934 | 3.6679 | 3.7111 | 3.8214 | 4.212 | 4.6556 | 5.1121 |
| u340 | 0.8664 | 0.8407 | 1.22 | 1.7483 | 2.8067 | 3.2611 | 3.6288 | 3.4971 | 3.6942 | 3.7254 | 3.8323 | 4.2092 | 4.6482 | 5.1032 |
| u341 | 0.8668 | 0.8406 | 1.2201 | 1.748 | 2.8068 | 3.261 | 3.6285 | 3.4974 | 3.696 | 3.7245 | 3.8322 | 4.213 | 4.648 | 5.1033 |
| u342 | 0.8672 | 0.8406 | 1.2203 | 1.7477 | 2.8072 | 3.2611 | 3.6285 | 3.4927 | 3.6911 | 3.7112 | 3.8326 | 4.2115 | 4.6512 | 5.1034 |
| u343 | 0.8677 | 0.8405 | 1.2204 | 1.7475 | 2.8075 | 3.2612 | 3.6284 | 3.4843 | 3.6864 | 3.7117 | 3.8327 | 4.2078 | 4.6511 | 5.1035 |
| u344 | 0.8683 | 0.841 | 1.2212 | 1.7478 | 2.809 | 3.2624 | 3.6292 | 3.4185 | 3.5907 | 3.6359 | 3.8077 | 4.2066 | 4.6666 | 5.1208 |
| u345 | 0.8686 | 0.841 | 1.2214 | 1.7476 | 2.8093 | 3.2623 | 3.6289 | 3.4205 | 3.5891 | 3.6353 | 3.8075 | 4.2104 | 4.6663 | 5.1208 |
| u346 | 0.869 | 0.8409 | 1.2213 | 1.7474 | 2.8096 | 3.2623 | 3.6288 | 3.4194 | 3.5937 | 3.6473 | 3.807 | 4.2121 | 4.6628 | 5.121 |
| u347 | 0.8694 | 0.8408 | 1.2215 | 1.7472 | 2.8099 | 3.2623 | 3.6287 | 3.4122 | 3.5848 | 3.6481 | 3.8071 | 4.2086 | 4.6628 | 5.1211 |
| u348 | 0.8699 | 0.8409 | 1.2217 | 1.747 | 2.8105 | 3.2626 | 3.6287 | 3.3986 | 3.5568 | 3.6353 | 3.7965 | 4.212 | 4.6696 | 5.1303 |
| u349 | 0.8702 | 0.8409 | 1.2218 | 1.7468 | 2.8107 | 3.2626 | 3.6286 | 3.4008 | 3.5561 | 3.6347 | 3.7962 | 4.2159 | 4.6694 | 5.1304 |
| u350 | 0.8706 | 0.8408 | 1.222 | 1.7465 | 2.8111 | 3.2627 | 3.6286 | 3.3958 | 3.5485 | 3.6226 | 3.7965 | 4.2145 | 4.6725 | 5.1305 |
| u351 | 0.871 | 0.8408 | 1.2221 | 1.7463 | 2.8113 | 3.2627 | 3.6284 | 3.3883 | 3.5434 | 3.6232 | 3.7964 | 4.211 | 4.6724 | 5.1306 |
| u352 | 0.8755 | 0.851 | 1.2351 | 1.7587 | 2.8415 | 3.2833 | 3.6475 | 3.5699 | 3.7382 | 3.7446 | 3.6976 | 4.0839 | 4.5137 | 5.0407 |
| u353 | 0.8758 | 0.8509 | 1.2353 | 1.7585 | 2.8418 | 3.2832 | 3.6474 | 3.5764 | 3.7417 | 3.7435 | 3.6965 | 4.0878 | 4.5134 | 5.0409 |
| u354 | 0.8763 | 0.8509 | 1.2353 | 1.7583 | 2.8421 | 3.2831 | 3.6473 | 3.5783 | 3.7462 | 3.7588 | 3.6952 | 4.0895 | 4.5101 | 5.0411 |
| u355 | 0.8767 | 0.8509 | 1.2354 | 1.758 | 2.8425 | 3.2832 | 3.6472 | 3.5709 | 3.7427 | 3.7592 | 3.6948 | 4.0862 | 4.5102 | 5.0411 |
| u356 | 0.877 | 0.8507 | 1.2353 | 1.7577 | 2.8425 | 3.2829 | 3.6469 | 3.5841 | 3.7737 | 3.7757 | 3.7018 | 4.0827 | 4.5031 | 5.0331 |
| u357 | 0.8774 | 0.8506 | 1.2354 | 1.7574 | 2.8428 | 3.2829 | 3.6468 | 3.5904 | 3.7773 | 3.7746 | 3.7013 | 4.0868 | 4.5028 | 5.0333 |
| u358 | 0.8778 | 0.8506 | 1.2357 | 1.7572 | 2.8431 | 3.2829 | 3.6468 | 3.5881 | 3.7722 | 3.7585 | 3.7014 | 4.0854 | 4.5058 | 5.0333 |
| u359 | 0.8782 | 0.8506 | 1.2358 | 1.757 | 2.8436 | 3.283 | 3.6467 | 3.5806 | 3.7685 | 3.759 | 3.7008 | 4.082 | 4.5059 | 5.0333 |
| u360 | 0.8783 | 0.8499 | 1.2352 | 1.7562 | 2.8423 | 3.2817 | 3.6457 | 3.6667 | 3.8881 | 3.8569 | 3.7199 | 4.0813 | 4.4889 | 5.0176 |
| u361 | 0.8787 | 0.8499 | 1.2353 | 1.756 | 2.8428 | 3.2816 | 3.6456 | 3.6736 | 3.8923 | 3.8557 | 3.7194 | 4.0853 | 4.4885 | 5.0178 |
| u362 | 0.8792 | 0.8498 | 1.2353 | 1.7558 | 2.843 | 3.2815 | 3.6455 | 3.6757 | 3.8982 | 3.8733 | 3.7185 | 4.0871 | 4.4852 | 5.018 |
| u363 | 0.8794 | 0.8497 | 1.2354 | 1.7555 | 2.8434 | 3.2816 | 3.6453 | 3.6683 | 3.8938 | 3.8739 | 3.7182 | 4.0835 | 4.4854 | 5.018 |
| u364 | 0.8799 | 0.8498 | 1.2357 | 1.7554 | 2.8439 | 3.2819 | 3.6456 | 3.6541 | 3.857 | 3.8544 | 3.7095 | 4.0873 | 4.4923 | 5.0261 |
| u365 | 0.8803 | 0.8498 | 1.2358 | 1.7552 | 2.8442 | 3.2818 | 3.6454 | 3.661 | 3.861 | 3.8528 | 3.7091 | 4.0914 | 4.4919 | 5.0262 |

-continued

| | | | | | | | | | | | | | | |
|---|---|---|---|---|---|---|---|---|---|---|---|---|---|---|
| u366 | 0.8808 | 0.8498 | 1.236 | 1.7549 | 2.8445 | 3.2819 | 3.6454 | 3.6585 | 3.8553 | 3.8349 | 3.7092 | 4.0902 | 4.4949 | 5.0262 |
| u367 | 0.8811 | 0.8498 | 1.2361 | 1.7546 | 2.8448 | 3.2819 | 3.6454 | 3.6509 | 3.8511 | 3.8352 | 3.7087 | 4.0867 | 4.495 | 5.0262 |
| u368 | 0.8825 | 0.852 | 1.2388 | 1.757 | 2.8507 | 3.2875 | 3.6491 | 3.8264 | 3.9193 | 3.674 | 3.6414 | 4.067 | 4.5085 | 5.0407 |
| u369 | 0.8828 | 0.852 | 1.2389 | 1.7568 | 2.8509 | 3.2875 | 3.6491 | 3.8333 | 3.9242 | 3.6735 | 3.6412 | 4.0704 | 4.5083 | 5.0409 |
| u370 | 0.8831 | 0.8519 | 1.239 | 1.7566 | 2.8513 | 3.2874 | 3.649 | 3.835 | 3.9309 | 3.6876 | 3.6408 | 4.0714 | 4.5051 | 5.041 |
| u371 | 0.8836 | 0.8518 | 1.2391 | 1.7563 | 2.8516 | 3.2875 | 3.6489 | 3.8251 | 3.926 | 3.6884 | 3.6408 | 4.0682 | 4.5053 | 5.041 |
| u372 | 0.8841 | 0.8516 | 1.2391 | 1.7559 | 2.8516 | 3.2872 | 3.6486 | 3.8402 | 3.9706 | 3.7038 | 3.6491 | 4.0645 | 4.4985 | 5.0331 |
| u373 | 0.8843 | 0.8516 | 1.2392 | 1.7558 | 2.8519 | 3.2871 | 3.6486 | 3.8476 | 3.9758 | 3.7031 | 3.6485 | 4.0677 | 4.4983 | 5.0332 |
| u374 | 0.8847 | 0.8516 | 1.2394 | 1.7555 | 2.8521 | 3.2872 | 3.6486 | 3.8438 | 3.9686 | 3.689 | 3.6487 | 4.0664 | 4.5014 | 5.0332 |
| u375 | 0.8852 | 0.8516 | 1.2395 | 1.7553 | 2.8526 | 3.2872 | 3.6484 | 3.8338 | 3.9634 | 3.6898 | 3.6485 | 4.0631 | 4.5016 | 5.0332 |
| u376 | 0.8858 | 0.8521 | 1.2403 | 1.7556 | 2.8542 | 3.2885 | 3.6494 | 3.7309 | 3.8192 | 3.612 | 3.6287 | 4.057 | 4.5178 | 5.0488 |
| u377 | 0.8862 | 0.8521 | 1.2404 | 1.7553 | 2.8545 | 3.2884 | 3.6494 | 3.7379 | 3.8235 | 3.6119 | 3.6302 | 4.0593 | 4.5177 | 5.0489 |
| u378 | 0.8865 | 0.852 | 1.2404 | 1.7551 | 2.8547 | 3.2884 | 3.6493 | 3.7387 | 3.8294 | 3.6248 | 3.6303 | 4.0589 | 4.5146 | 5.049 |
| u379 | 0.8869 | 0.8519 | 1.2405 | 1.7549 | 2.855 | 3.2884 | 3.6492 | 3.7297 | 3.825 | 3.626 | 3.6324 | 4.0552 | 4.5148 | 5.049 |
| u380 | 0.8873 | 0.8521 | 1.2408 | 1.7548 | 2.8555 | 3.2887 | 3.6494 | 3.7128 | 3.788 | 3.6139 | 3.6304 | 4.0555 | 4.5216 | 5.0571 |
| u381 | 0.8877 | 0.852 | 1.2409 | 1.7546 | 2.8559 | 3.2886 | 3.6493 | 3.7198 | 3.7921 | 3.6142 | 3.633 | 4.0572 | 4.5214 | 5.0572 |
| u382 | 0.8881 | 0.852 | 1.2411 | 1.7543 | 2.8561 | 3.2887 | 3.6492 | 3.7158 | 3.7864 | 3.6034 | 3.637 | 4.0545 | 4.5245 | 5.0572 |
| u383 | 0.8885 | 0.852 | 1.2411 | 1.7541 | 2.8565 | 3.2887 | 3.6492 | 3.7069 | 3.7822 | 3.6049 | 3.6401 | 4.0507 | 4.5247 | 5.0572 |
| u384 | 0.9559 | 0.9364 | 1.5253 | 2.2309 | 2.8163 | 3.2696 | 3.6344 | 4.0607 | 4.1149 | 3.8998 | 4.2668 | 5.8583 | 6.7237 | 7.2034 |
| u385 | 0.9558 | 0.9364 | 1.5253 | 2.2304 | 2.8165 | 3.2696 | 3.6342 | 4.0814 | 4.1229 | 3.8985 | 4.2672 | 5.8437 | 6.7321 | 7.1968 |
| u386 | 0.9556 | 0.9365 | 1.525 | 2.2299 | 2.8167 | 3.2696 | 3.6339 | 4.0933 | 4.1337 | 3.923 | 4.2695 | 5.8438 | 6.7426 | 7.1903 |
| u387 | 0.9556 | 0.9366 | 1.5249 | 2.2293 | 2.8169 | 3.2697 | 3.6336 | 4.0839 | 4.126 | 3.9243 | 4.2695 | 5.8578 | 6.7344 | 7.1971 |
| u388 | 0.9554 | 0.9366 | 1.5245 | 2.2287 | 2.8169 | 3.2695 | 3.6331 | 4.1206 | 4.197 | 3.9517 | 4.3075 | 5.911 | 6.7719 | 7.1984 |
| u389 | 0.9553 | 0.9367 | 1.5245 | 2.2282 | 2.8172 | 3.2694 | 3.6328 | 4.14 | 4.2057 | 3.9502 | 4.3079 | 5.8935 | 6.7807 | 7.1917 |
| u390 | 0.9552 | 0.9368 | 1.5245 | 2.2277 | 2.8174 | 3.2696 | 3.6327 | 4.1414 | 4.1943 | 3.9244 | 4.3055 | 5.8935 | 6.77 | 7.1985 |
| u391 | 0.9552 | 0.9369 | 1.5244 | 2.2273 | 2.8177 | 3.2697 | 3.6325 | 4.1339 | 4.186 | 3.9257 | 4.3053 | 5.9106 | 6.7615 | 7.2055 |
| u392 | 0.9545 | 0.9364 | 1.5232 | 2.226 | 2.8166 | 3.2686 | 3.6311 | 4.3218 | 4.4615 | 4.096 | 4.3719 | 6.111 | 6.8961 | 7.2449 |
| u393 | 0.9545 | 0.9365 | 1.5231 | 2.2255 | 2.8169 | 3.2686 | 3.6308 | 4.3431 | 4.4723 | 4.0942 | 4.3725 | 6.0837 | 6.9062 | 7.2375 |
| u394 | 0.9544 | 0.9365 | 1.523 | 2.2249 | 2.8171 | 3.2686 | 3.6305 | 4.3515 | 4.4869 | 4.1266 | 4.3767 | 6.0809 | 6.921 | 7.2304 |
| u395 | 0.9543 | 0.9366 | 1.5228 | 2.2246 | 2.8173 | 3.2687 | 3.6303 | 4.3466 | 4.4767 | 4.1284 | 4.3764 | 6.1079 | 6.9103 | 7.2378 |
| u396 | 0.9543 | 0.9369 | 1.5229 | 2.2242 | 2.8178 | 3.2689 | 3.6305 | 4.3256 | 4.3888 | 4.0934 | 4.3315 | 6.0363 | 6.8649 | 7.2349 |
| u397 | 0.9542 | 0.9369 | 1.5228 | 2.2238 | 2.818 | 3.2689 | 3.6302 | 4.346 | 4.3989 | 4.0916 | 4.332 | 6.0133 | 6.8745 | 7.2278 |
| u398 | 0.9541 | 0.9371 | 1.5229 | 2.2233 | 2.8182 | 3.269 | 3.6302 | 4.3466 | 4.3857 | 4.0604 | 4.329 | 6.015 | 6.8613 | 7.2349 |
| u399 | 0.9541 | 0.9372 | 1.5228 | 2.2229 | 2.8185 | 3.2691 | 3.6299 | 4.3402 | 4.3761 | 4.0619 | 4.3289 | 6.0382 | 6.8514 | 7.2423 |
| u400 | 0.9522 | 0.9348 | 1.5187 | 2.2179 | 2.8137 | 3.2643 | 3.6252 | 3.8782 | 4.1677 | 4.4061 | 4.5348 | 6.2598 | 7.1765 | 7.4177 |
| u401 | 0.952 | 0.9349 | 1.5186 | 2.2174 | 2.814 | 3.2642 | 3.625 | 3.8875 | 4.1745 | 4.404 | 4.5358 | 6.2318 | 7.1857 | 7.4088 |
| u402 | 0.9519 | 0.9349 | 1.5184 | 2.2168 | 2.8142 | 3.2642 | 3.6247 | 3.8901 | 4.1839 | 4.4432 | 4.5422 | 6.2276 | 7.2091 | 7.4002 |
| u403 | 0.9519 | 0.935 | 1.5183 | 2.2165 | 2.8144 | 3.2642 | 3.6246 | 3.8812 | 4.1769 | 4.4453 | 4.5416 | 6.2546 | 7.1994 | 7.4088 |
| u404 | 0.9518 | 0.935 | 1.518 | 2.2159 | 2.8145 | 3.264 | 3.6242 | 3.8991 | 4.2389 | 4.4881 | 4.6034 | 6.322 | 7.2653 | 7.4166 |
| u405 | 0.9517 | 0.935 | 1.5179 | 2.2154 | 2.8147 | 3.264 | 3.624 | 3.9081 | 4.2462 | 4.4859 | 4.6045 | 6.291 | 7.2747 | 7.4075 |
| u406 | 0.9517 | 0.9352 | 1.5179 | 2.2149 | 2.8149 | 3.264 | 3.6239 | 3.9057 | 4.2361 | 4.4459 | 4.5972 | 6.2954 | 7.2482 | 7.4163 |
| u407 | 0.9517 | 0.9353 | 1.5178 | 2.2144 | 2.8153 | 3.2641 | 3.6237 | 3.8969 | 4.2288 | 4.448 | 4.5964 | 6.326 | 7.2384 | 7.4251 |
| u408 | 0.952 | 0.936 | 1.5188 | 2.215 | 2.8166 | 3.2652 | 3.6247 | 3.7927 | 4.0316 | 4.2361 | 4.5068 | 6.141 | 7.0672 | 7.3693 |
| u409 | 0.9519 | 0.9362 | 1.5187 | 2.2144 | 2.8168 | 3.2652 | 3.6246 | 3.8019 | 4.0377 | 4.2341 | 4.5077 | 6.1165 | 7.0765 | 7.3611 |
| u410 | 0.9519 | 0.9362 | 1.5184 | 2.214 | 2.817 | 3.2652 | 3.6243 | 3.8048 | 4.0462 | 4.2701 | 4.5135 | 6.1137 | 7.0951 | 7.353 |
| u411 | 0.9518 | 0.9363 | 1.5184 | 2.2136 | 2.8172 | 3.2652 | 3.6241 | 3.7977 | 4.0398 | 4.272 | 4.513 | 6.1371 | 7.0855 | 7.3612 |
| u412 | 0.9519 | 0.9366 | 1.5185 | 2.2133 | 2.8177 | 3.2655 | 3.6242 | 3.7829 | 3.9869 | 4.2335 | 4.4602 | 6.0767 | 7.0314 | 7.3554 |
| u413 | 0.9518 | 0.9366 | 1.5184 | 2.2128 | 2.8179 | 3.2654 | 3.6241 | 3.7921 | 3.9928 | 4.2316 | 4.461 | 6.0555 | 7.0407 | 7.3474 |
| u414 | 0.9518 | 0.9367 | 1.5184 | 2.2123 | 2.8182 | 3.2655 | 3.6239 | 3.7909 | 3.9846 | 4.1968 | 4.4563 | 6.0568 | 7.0238 | 7.3552 |
| u415 | 0.9517 | 0.9369 | 1.5183 | 2.2119 | 2.8184 | 3.2655 | 3.6238 | 3.7844 | 3.9787 | 4.1986 | 4.4559 | 6.0775 | 7.0149 | 7.3632 |
| u416 | 0.9444 | 0.9257 | 1.5003 | 2.1899 | 2.7914 | 3.2476 | 3.6019 | 3.5844 | 3.7435 | 3.8724 | 4.5926 | 5.7924 | 6.7437 | 7.4888 |
| u417 | 0.9443 | 0.9257 | 1.5002 | 2.1895 | 2.7917 | 3.2475 | 3.602 | 3.59 | 3.7467 | 3.8714 | 4.5925 | 5.7837 | 6.7495 | 7.4821 |
| u418 | 0.9443 | 0.9258 | 1.5 | 2.1889 | 2.7919 | 3.2474 | 3.602 | 3.5916 | 3.7514 | 3.8897 | 4.5959 | 5.7841 | 6.7565 | 7.4754 |
| u419 | 0.9443 | 0.9259 | 1.4999 | 2.1884 | 2.7924 | 3.2473 | 3.6021 | 3.5846 | 3.7474 | 3.8906 | 4.5948 | 5.7927 | 6.7504 | 7.4821 |
| u420 | 0.9442 | 0.9259 | 1.4996 | 2.188 | 2.7924 | 3.247 | 3.6018 | 3.5962 | 3.7789 | 3.9108 | 4.6381 | 5.8222 | 6.7756 | 7.4885 |
| u421 | 0.9441 | 0.926 | 1.4996 | 2.1874 | 2.7928 | 3.247 | 3.6019 | 3.6024 | 3.7824 | 3.9096 | 4.6378 | 5.8128 | 6.7817 | 7.4816 |
| u422 | 0.9442 | 0.9261 | 1.4996 | 2.1869 | 2.793 | 3.2469 | 3.602 | 3.5998 | 3.7771 | 3.8906 | 4.6321 | 5.8125 | 6.774 | 7.4883 |
| u423 | 0.9442 | 0.9263 | 1.4996 | 2.1866 | 2.7933 | 3.247 | 3.602 | 3.5929 | 3.7733 | 3.8915 | 4.6306 | 5.8218 | 6.7677 | 7.4953 |
| u424 | 0.9437 | 0.9257 | 1.4985 | 2.1851 | 2.7926 | 3.2458 | 3.6011 | 3.6732 | 3.8946 | 4.0071 | 4.6979 | 5.9275 | 6.8538 | 7.5434 |
| u425 | 0.9437 | 0.9257 | 1.4984 | 2.1846 | 2.7929 | 3.2457 | 3.6011 | 3.6795 | 3.8988 | 4.0059 | 4.6978 | 5.9157 | 6.8603 | 7.536 |
| u426 | 0.9436 | 0.9258 | 1.4983 | 2.1843 | 2.7932 | 3.2455 | 3.6011 | 3.6812 | 3.9047 | 4.0272 | 4.703 | 5.9154 | 6.8699 | 7.5287 |
| u427 | 0.9436 | 0.9259 | 1.4982 | 2.184 | 2.7936 | 3.2456 | 3.6012 | 3.6741 | 3.9002 | 4.0283 | 4.7017 | 5.9269 | 6.8633 | 7.5364 |
| u428 | 0.9438 | 0.9262 | 1.4983 | 2.1837 | 2.7939 | 3.2457 | 3.6014 | 3.6606 | 3.8628 | 4.0054 | 4.6532 | 5.8939 | 6.8338 | 7.5296 |
| u429 | 0.9437 | 0.9263 | 1.4983 | 2.183 | 2.7942 | 3.2456 | 3.6014 | 3.6669 | 3.8668 | 4.0042 | 4.6529 | 5.8833 | 6.8401 | 7.5224 |
| u430 | 0.9437 | 0.9264 | 1.4983 | 2.1825 | 2.7947 | 3.2456 | 3.6015 | 3.6645 | 3.861 | 3.9833 | 4.6469 | 5.8833 | 6.8311 | 7.5296 |
| u431 | 0.9438 | 0.9266 | 1.4982 | 2.1821 | 2.795 | 3.2456 | 3.6016 | 3.6574 | 3.8568 | 3.9843 | 4.6454 | 5.8939 | 6.8246 | 7.537 |
| u432 | 0.9454 | 0.9292 | 1.5018 | 2.186 | 2.8 | 3.2507 | 3.6052 | 3.8414 | 3.9245 | 3.7912 | 4.4943 | 5.7545 | 6.6285 | 7.3877 |
| u433 | 0.9453 | 0.9292 | 1.5018 | 2.1855 | 2.8002 | 3.2506 | 3.6052 | 3.848 | 3.9294 | 3.7902 | 4.4941 | 5.7456 | 6.6344 | 7.3812 |
| u434 | 0.9452 | 0.9292 | 1.5016 | 2.1851 | 2.8006 | 3.2505 | 3.6052 | 3.849 | 3.9363 | 3.8071 | 4.4977 | 5.7462 | 6.6404 | 7.3748 |
| u435 | 0.9453 | 0.9293 | 1.5015 | 2.1847 | 2.8008 | 3.2505 | 3.6052 | 3.8392 | 3.9313 | 3.8079 | 4.4969 | 5.755 | 6.6344 | 7.3811 |
| u436 | 0.9452 | 0.9293 | 1.5012 | 2.184 | 2.8009 | 3.2502 | 3.605 | 3.854 | 3.9762 | 3.8265 | 4.5398 | 5.7865 | 6.6572 | 7.3857 |
| u437 | 0.9452 | 0.9294 | 1.5012 | 2.1835 | 2.8012 | 3.2501 | 3.605 | 3.8607 | 3.9816 | 3.8254 | 4.5401 | 5.7769 | 6.6633 | 7.379 |
| u438 | 0.9452 | 0.9295 | 1.5012 | 2.1831 | 2.8015 | 3.2501 | 3.6051 | 3.8575 | 3.9743 | 3.8078 | 4.535 | 5.7765 | 6.6566 | 7.3855 |
| u439 | 0.9452 | 0.9296 | 1.5011 | 2.1827 | 2.8017 | 3.2502 | 3.6051 | 3.8473 | 3.9691 | 3.8086 | 4.5341 | 5.7862 | 6.6505 | 7.3921 |
| u440 | 0.9456 | 0.9303 | 1.502 | 2.1832 | 2.8031 | 3.2513 | 3.6059 | 3.743 | 3.8226 | 3.7126 | 4.4687 | 5.6823 | 6.5812 | 7.3496 |
| u441 | 0.9456 | 0.9304 | 1.5019 | 2.1826 | 2.8033 | 3.2512 | 3.6059 | 3.7497 | 3.827 | 3.7116 | 4.4688 | 5.6749 | 6.5867 | 7.3434 |
| u442 | 0.9456 | 0.9305 | 1.5018 | 2.1821 | 2.8036 | 3.251 | 3.6058 | 3.7506 | 3.8331 | 3.7266 | 4.4722 | 5.6757 | 6.5917 | 7.3374 |
| u443 | 0.9456 | 0.9306 | 1.5017 | 2.1819 | 2.804 | 3.251 | 3.6059 | 3.7409 | 3.8285 | 3.7273 | 4.471 | 5.6832 | 6.586 | 7.3436 |
| u444 | 0.9457 | 0.9309 | 1.5019 | 2.1816 | 2.8045 | 3.2513 | 3.606 | 3.7234 | 3.7903 | 3.7112 | 4.4298 | 5.6558 | 6.5672 | 7.3395 |

-continued

| | | | | | | | | | | | | | |
|---|---|---|---|---|---|---|---|---|---|---|---|---|---|
| u445 | 0.9456 | 0.9309 | 1.5018 | 2.181 | 2.8048 | 3.2511 | 3.6059 | 3.7303 | 3.7945 | 3.7102 | 4.4295 | 5.6489 | 6.5726 | 7.3335 |
| u446 | 0.9456 | 0.9311 | 1.5018 | 2.1806 | 2.8051 | 3.2511 | 3.606 | 3.7266 | 3.7885 | 3.6955 | 4.4255 | 5.6479 | 6.5679 | 7.3397 |
| u447 | 0.9457 | 0.9312 | 1.5017 | 2.1801 | 2.8053 | 3.2512 | 3.606 | 3.7164 | 3.7843 | 3.6961 | 4.4245 | 5.6548 | 6.5624 | 7.3459 |
| u448 | 0.9935 | 0.9703 | 1.5975 | 2.3282 | 2.8541 | 3.2963 | 3.6591 | 4.1617 | 4.1778 | 4.0568 | 5.4849 | 6.0129 | 6.8606 | 8.329 |
| u449 | 0.9933 | 0.9703 | 1.5973 | 2.3278 | 2.854 | 3.2965 | 3.6585 | 4.1709 | 4.1863 | 4.0552 | 5.4896 | 5.991 | 6.8702 | 8.3211 |
| u450 | 0.9932 | 0.9703 | 1.5971 | 2.3274 | 2.8538 | 3.2968 | 3.658 | 4.1697 | 4.198 | 4.0872 | 5.5261 | 5.9898 | 6.8842 | 8.313 |
| u451 | 0.9931 | 0.9705 | 1.5969 | 2.3271 | 2.8536 | 3.297 | 3.6574 | 4.1439 | 4.1892 | 4.089 | 5.5213 | 6.0113 | 6.8748 | 8.3208 |
| u452 | 0.9929 | 0.9703 | 1.5965 | 2.3262 | 2.8533 | 3.2972 | 3.6568 | 4.1712 | 4.267 | 4.1246 | 5.6963 | 6.08 | 6.9223 | 8.4079 |
| u453 | 0.9928 | 0.9704 | 1.5963 | 2.3259 | 2.853 | 3.2973 | 3.6564 | 4.1807 | 4.2763 | 4.1227 | 5.7025 | 6.0541 | 6.9327 | 8.4016 |
| u454 | 0.9927 | 0.9705 | 1.5964 | 2.3254 | 2.853 | 3.2978 | 3.6558 | 4.1683 | 4.2633 | 4.0895 | 5.6581 | 6.0564 | 6.9178 | 8.4079 |
| u455 | 0.9926 | 0.9706 | 1.5962 | 2.3251 | 2.8527 | 3.298 | 3.6554 | 4.1469 | 4.2539 | 4.0913 | 5.6525 | 6.0826 | 6.908 | 8.4139 |
| u456 | 0.992 | 0.97 | 1.595 | 2.3234 | 2.8517 | 3.2972 | 3.6538 | 4.3371 | 4.5533 | 4.3009 | 5.787 | 6.3091 | 7.0894 | 8.6598 |
| u457 | 0.9919 | 0.9701 | 1.5948 | 2.3229 | 2.8516 | 3.2972 | 3.6534 | 4.346 | 4.5644 | 4.2986 | 5.7926 | 6.2714 | 7.1008 | 8.6578 |
| u458 | 0.9917 | 0.9701 | 1.5946 | 2.3225 | 2.8514 | 3.2976 | 3.6529 | 4.3457 | 4.5797 | 4.3402 | 5.8364 | 6.2657 | 7.1262 | 8.6554 |
| u459 | 0.9917 | 0.9702 | 1.5944 | 2.3221 | 2.8512 | 3.298 | 3.6524 | 4.3237 | 4.568 | 4.3422 | 5.8304 | 6.3024 | 7.1151 | 8.6574 |
| u460 | 0.9917 | 0.9705 | 1.5945 | 2.3218 | 2.8513 | 3.2984 | 3.6519 | 4.2886 | 4.4717 | 4.2974 | 5.6726 | 6.2183 | 7.0467 | 8.546 |
| u461 | 0.9915 | 0.9706 | 1.5944 | 2.3215 | 2.8511 | 3.2986 | 3.6515 | 4.3003 | 4.4823 | 4.2949 | 5.6779 | 6.1871 | 7.0578 | 8.5409 |
| u462 | 0.9915 | 0.9707 | 1.5943 | 2.321 | 2.8509 | 3.299 | 3.651 | 4.2893 | 4.4673 | 4.2551 | 5.6384 | 6.1912 | 7.037 | 8.546 |
| u463 | 0.9914 | 0.9707 | 1.5941 | 2.3204 | 2.8508 | 3.2994 | 3.6504 | 4.2686 | 4.4565 | 4.257 | 5.6333 | 6.2229 | 7.0266 | 8.5507 |
| u464 | 0.9896 | 0.9681 | 1.5901 | 2.315 | 2.8469 | 3.2944 | 3.6464 | 3.8862 | 4.2157 | 4.6069 | 5.6745 | 6.4182 | 7.3511 | 8.7729 |
| u465 | 0.9895 | 0.9682 | 1.59 | 2.3146 | 2.8467 | 3.2945 | 3.646 | 3.8961 | 4.2229 | 4.6051 | 5.6781 | 6.3839 | 7.3597 | 8.7744 |
| u466 | 0.9894 | 0.9682 | 1.5897 | 2.3142 | 2.8466 | 3.2947 | 3.6455 | 3.8991 | 4.2328 | 4.645 | 5.706 | 6.3778 | 7.3882 | 8.7757 |
| u467 | 0.9893 | 0.9683 | 1.5895 | 2.3137 | 2.8465 | 3.295 | 3.645 | 3.8896 | 4.2255 | 4.6472 | 5.7024 | 6.411 | 7.3793 | 8.7754 |
| u468 | 0.9891 | 0.9682 | 1.5891 | 2.313 | 2.8461 | 3.295 | 3.6442 | 3.9091 | 4.2899 | 4.6896 | 5.8039 | 6.4846 | 7.4544 | 8.8649 |
| u469 | 0.989 | 0.9683 | 1.589 | 2.3127 | 2.846 | 3.2952 | 3.6438 | 3.9191 | 4.2976 | 4.6877 | 5.808 | 6.4475 | 7.4627 | 8.8689 |
| u470 | 0.9889 | 0.9684 | 1.5889 | 2.3121 | 2.8459 | 3.2955 | 3.6434 | 3.9168 | 4.2872 | 4.6484 | 5.7791 | 6.4547 | 7.4311 | 8.8663 |
| u471 | 0.9889 | 0.9685 | 1.5889 | 2.3118 | 2.8457 | 3.2958 | 3.6428 | 3.9073 | 4.2796 | 4.6508 | 5.7755 | 6.4922 | 7.4224 | 8.8638 |
| u472 | 0.9892 | 0.9693 | 1.5897 | 2.3124 | 2.8464 | 3.2973 | 3.6431 | 3.7815 | 4.0751 | 4.4456 | 5.6861 | 6.3045 | 7.2387 | 8.6651 |
| u473 | 0.9891 | 0.9693 | 1.5897 | 2.3119 | 2.8462 | 3.2974 | 3.6427 | 3.7917 | 4.0816 | 4.4436 | 5.69 | 6.2727 | 7.248 | 8.6644 |
| u474 | 0.989 | 0.9694 | 1.5894 | 2.3115 | 2.846 | 3.2977 | 3.6421 | 3.7943 | 4.0905 | 4.4854 | 5.7199 | 6.2678 | 7.2714 | 8.6633 |
| u475 | 0.9889 | 0.9695 | 1.5892 | 2.3111 | 2.8459 | 3.298 | 3.6417 | 3.7839 | 4.0839 | 4.4879 | 5.7159 | 6.2987 | 7.2616 | 8.6651 |
| u476 | 0.9889 | 0.9697 | 1.5893 | 2.3107 | 2.8459 | 3.2985 | 3.6414 | 3.7632 | 4.0289 | 4.4436 | 5.6013 | 6.2297 | 7.1957 | 8.5909 |
| u477 | 0.9888 | 0.9698 | 1.5892 | 2.3103 | 2.8457 | 3.2987 | 3.641 | 3.7733 | 4.035 | 4.4416 | 5.605 | 6.2021 | 7.2051 | 8.5884 |
| u478 | 0.9888 | 0.97 | 1.5891 | 2.3097 | 2.8456 | 3.299 | 3.6405 | 3.7702 | 4.0266 | 4.4008 | 5.5775 | 6.2057 | 7.1838 | 8.5922 |
| u479 | 0.9887 | 0.97 | 1.589 | 2.3094 | 2.8453 | 3.2994 | 3.64 | 3.7595 | 4.0205 | 4.4032 | 5.574 | 6.2336 | 7.1743 | 8.5955 |
| u480 | 0.9952 | 0.9823 | 1.6071 | 2.3346 | 2.8649 | 3.3201 | 3.6561 | 4.1677 | 4.612 | 6.3076 | 6.5511 | 7.7382 | 8.4951 | 9.5854 |
| u481 | 0.9951 | 0.9823 | 1.607 | 2.3342 | 2.8647 | 3.3204 | 3.6555 | 4.1959 | 4.6301 | 6.3084 | 6.5641 | 7.5593 | 8.4744 | 9.6438 |
| u482 | 0.9949 | 0.9824 | 1.6067 | 2.3338 | 2.8643 | 3.3207 | 3.6551 | 4.1993 | 4.6545 | 6.289 | 6.655 | 7.4938 | 8.6031 | 9.7098 |
| u483 | 0.9949 | 0.9825 | 1.6065 | 2.3333 | 2.864 | 3.3209 | 3.6545 | 4.1661 | 4.637 | 6.2883 | 6.6425 | 7.6617 | 8.6338 | 9.6416 |
| u484 | 0.9946 | 0.9824 | 1.6061 | 2.3327 | 2.8637 | 3.3211 | 3.6539 | 4.2229 | 4.7876 | 6.2705 | 6.7527 | 7.8019 | 8.8303 | 9.9224 |
| u485 | 0.9945 | 0.9824 | 1.606 | 2.3322 | 2.8633 | 3.3212 | 3.6537 | 4.2459 | 4.8046 | 6.2712 | 6.7629 | 7.6452 | 8.7923 | 10.0216 |
| u486 | 0.9945 | 0.9826 | 1.6059 | 2.3318 | 2.8628 | 3.3217 | 3.6531 | 4.2321 | 4.7816 | 6.287 | 6.694 | 7.7137 | 8.6682 | 9.9252 |
| u487 | 0.9944 | 0.9826 | 1.6057 | 2.3314 | 2.8625 | 3.3223 | 3.6527 | 4.1989 | 4.7647 | 6.287 | 6.6843 | 7.8764 | 8.6964 | 9.8407 |
| u488 | 0.9939 | 0.9821 | 1.6045 | 2.3298 | 2.8617 | 3.3212 | 3.6516 | 4.4734 | 5.1037 | 6.0688 | 6.6244 | 7.7847 | 8.8173 | 9.9971 |
| u489 | 0.9937 | 0.9821 | 1.6044 | 2.3294 | 2.8616 | 3.3215 | 3.6512 | 4.4868 | 5.1154 | 6.0683 | 6.632 | 7.6822 | 8.7896 | 10.06 |
| u490 | 0.9936 | 0.9822 | 1.6041 | 2.3291 | 2.8612 | 3.3216 | 3.6504 | 4.4862 | 5.1316 | 6.0786 | 6.6853 | 7.6375 | 8.876 | 10.1271 |
| u491 | 0.9935 | 0.9822 | 1.604 | 2.3285 | 2.861 | 3.3221 | 3.6501 | 4.4583 | 5.1189 | 6.0794 | 6.6776 | 7.7378 | 8.9085 | 10.0575 |
| u492 | 0.9936 | 0.9825 | 1.604 | 2.3285 | 2.8607 | 3.3228 | 3.6499 | 4.409 | 5.0094 | 6.0693 | 6.6061 | 7.6337 | 8.7776 | 9.8724 |
| u493 | 0.9934 | 0.9826 | 1.6039 | 2.3278 | 2.8603 | 3.3231 | 3.6494 | 4.4229 | 5.0221 | 6.0688 | 6.6152 | 7.5257 | 8.7493 | 9.9353 |
| u494 | 0.9934 | 0.9827 | 1.6039 | 2.3274 | 2.86 | 3.3236 | 3.649 | 4.409 | 5.0038 | 6.0585 | 6.5507 | 7.5704 | 8.6592 | 9.874 |
| u495 | 0.9933 | 0.9828 | 1.6036 | 2.327 | 2.8599 | 3.3239 | 3.6485 | 4.3804 | 4.99 | 6.0594 | 6.5418 | 7.6824 | 8.6827 | 9.8172 |
| u496 | 0.9946 | 0.9856 | 1.6074 | 2.3319 | 2.8619 | 3.3303 | 3.65 | 6.1657 | 6.8471 | 7.064 | 7.5955 | 8.7123 | 10.1103 | 10.8138 |
| u497 | 0.9945 | 0.9857 | 1.6072 | 2.3315 | 2.8616 | 3.3306 | 3.6497 | 6.1057 | 6.8262 | 7.0723 | 7.6049 | 8.5487 | 9.9221 | 11.0415 |
| u498 | 0.9944 | 0.9856 | 1.6069 | 2.3312 | 2.8611 | 3.331 | 3.6491 | 6.089 | 6.8 | 6.9333 | 7.6428 | 8.4117 | 10.0222 | 11.2778 |
| u499 | 0.9943 | 0.9858 | 1.6068 | 2.3308 | 2.8609 | 3.3313 | 3.6486 | 6.147 | 6.8187 | 6.9273 | 7.6359 | 8.5993 | 10.1831 | 11.0364 |
| u500 | 0.9941 | 0.9857 | 1.6063 | 2.33 | 2.8605 | 3.3315 | 3.6481 | 6.0534 | 6.6753 | 6.8194 | 7.3822 | 8.5825 | 10.0705 | 11.122 |
| u501 | 0.994 | 0.9857 | 1.6062 | 2.3296 | 2.8601 | 3.3318 | 3.6478 | 6.0083 | 6.6642 | 6.8238 | 7.3901 | 8.4614 | 9.9515 | 11.2749 |
| u502 | 0.9939 | 0.9859 | 1.6061 | 2.3291 | 2.8598 | 3.3322 | 3.6472 | 6.0215 | 6.6784 | 6.9247 | 7.3446 | 8.561 | 9.8801 | 11.1258 |
| u503 | 0.9939 | 0.986 | 1.606 | 2.3286 | 2.8594 | 3.3325 | 3.6468 | 6.0695 | 6.6896 | 6.9188 | 7.3365 | 8.6656 | 10.0135 | 10.9705 |
| u504 | 0.9941 | 0.9867 | 1.6068 | 2.3295 | 2.8595 | 3.3344 | 3.6471 | 7.7981 | 8.0067 | 8.1737 | 8.0267 | 9.527 | 11.0231 | 11.9531 |
| u505 | 0.994 | 0.9868 | 1.6067 | 2.3289 | 2.859 | 3.3347 | 3.6466 | 7.6219 | 7.9404 | 8.2018 | 8.0246 | 9.7063 | 10.7986 | 12.1517 |
| u506 | 0.9939 | 0.9868 | 1.6064 | 2.3287 | 2.8587 | 3.3349 | 3.6462 | 7.5698 | 7.856 | 7.7908 | 7.9867 | 9.6629 | 10.6791 | 12.2575 |
| u507 | 0.9937 | 0.9869 | 1.6062 | 2.3283 | 2.8583 | 3.3354 | 3.6457 | 7.7415 | 7.9167 | 7.7732 | 7.9865 | 9.4797 | 10.8399 | 12.1537 |
| u508 | 0.9938 | 0.9872 | 1.6062 | 2.3281 | 2.8579 | 3.3361 | 3.6454 | 8.1152 | 8.6308 | 8.2076 | 9.1417 | 10.2062 | 11.4782 | 13.5605 |
| u509 | 0.9937 | 0.9872 | 1.6061 | 2.3275 | 2.8575 | 3.3365 | 3.6451 | 7.9113 | 8.5283 | 8.2366 | 9.0581 | 12.4383 | 11.4036 | 13.1329 |
| u510 | 0.9937 | 0.9874 | 1.6061 | 2.3271 | 2.8572 | 3.3368 | 3.6447 | 7.9744 | 8.6705 | 8.9432 | 10.01 | 10.9627 | 14.172 | 13.5343 |
| u511 | 0.9936 | 0.9875 | 1.6059 | 2.3266 | 2.8568 | 3.3373 | 3.6442 | 8.1847 | 8.7834 | 8.8923 | 10.2287 | 10.0885 | 12.457 | 15.7591 |

| SNR | 14 | 15 | 16 | 17 | 18 | 19 | 20 | 21 | 22 | 23 | 24 | 25 | 26 | 27 |
|---|---|---|---|---|---|---|---|---|---|---|---|---|---|---|
| u1 | 0.9999 | 0.9999 | 1 | 1 | 1 | 1 | 1 | 1 | 0.9999 | 0.9999 | 1 | 1 | 1 | 1 |
| u2 | 0.9999 | 0.9998 | 1 | 0.9999 | 1 | 1 | 1.0001 | 0.9999 | 0.9999 | 0.9998 | 1 | 1 | 1 | 1 |
| u3 | 0.9999 | 0.9998 | 1 | 0.9999 | 1 | 1 | 1.0002 | 0.9999 | 0.9999 | 0.9998 | 1 | 1 | 1 | 1 |
| u4 | 1 | 0.9997 | 0.9999 | 0.9998 | 1.0001 | 1 | 1.0003 | 0.9999 | 0.9997 | 0.9997 | 1 | 1.0001 | 1 | 1 |
| u5 | 0.9999 | 0.9996 | 0.9999 | 0.9998 | 1.0001 | 1 | 1.0003 | 0.9998 | 0.9996 | 0.9996 | 1 | 1.0001 | 1 | 1 |
| u6 | 0.9999 | 0.9996 | 0.9999 | 0.9998 | 1 | 1 | 1.0004 | 0.9998 | 0.9995 | 0.9996 | 1 | 1.0001 | 1 | 1 |
| u7 | 0.9999 | 0.9995 | 0.9999 | 0.9997 | 1.0001 | 1.0001 | 1.0005 | 0.9998 | 0.9994 | 0.9995 | 1 | 1.0001 | 1 | 1 |
| u8 | 1.0004 | 0.9993 | 0.9996 | 0.9993 | 0.9998 | 0.9999 | 1.0006 | 0.9997 | 0.9993 | 0.9994 | 1 | 1.0002 | 1 | 1 |
| u9 | 1.0004 | 0.9992 | 0.9996 | 0.9993 | 0.9998 | 0.9999 | 1.0006 | 0.9996 | 0.9992 | 0.9993 | 1 | 1.0002 | 1 | 1 |

-continued

| | | | | | | | | | | | | | | |
|---|---|---|---|---|---|---|---|---|---|---|---|---|---|---|
| u10 | 1.0003 | 0.9991 | 0.9996 | 0.9992 | 0.9999 | 0.9999 | 1.0007 | 0.9996 | 0.9991 | 0.9992 | 1 | 1.0002 | 1 | 1 |
| u11 | 1.0003 | 0.999 | 0.9996 | 0.9992 | 0.9999 | 1 | 1.0007 | 0.9995 | 0.9991 | 0.9991 | 1 | 1.0002 | 1 | 1 |
| u12 | 1.0002 | 0.9989 | 0.9996 | 0.9993 | 0.9998 | 1 | 1.0008 | 0.9995 | 0.999 | 0.9991 | 1.0001 | 1.0002 | 1 | 1 |
| u13 | 1.0001 | 0.9989 | 0.9996 | 0.9992 | 0.9998 | 1 | 1.0009 | 0.9995 | 0.9989 | 0.999 | 1.0001 | 1.0002 | 1 | 1 |
| u14 | 1.0001 | 0.9988 | 0.9996 | 0.9992 | 0.9998 | 1 | 1.0009 | 0.9994 | 0.9988 | 0.9989 | 1 | 1.0002 | 1 | 1 |
| u15 | 1.0001 | 0.9987 | 0.9995 | 0.9992 | 0.9999 | 1 | 1.001 | 0.9994 | 0.9987 | 0.9989 | 1 | 1.0002 | 1 | 1 |
| u16 | 1.0014 | 0.9989 | 0.9989 | 0.9989 | 1 | 0.9997 | 1.0008 | 0.9994 | 1 | 1.0003 | 1.0002 | 0.9998 | 1.0001 | 0.9999 |
| u17 | 1.0014 | 0.9988 | 0.9989 | 0.9989 | 1 | 0.9997 | 1.0009 | 0.9994 | 1 | 1.0002 | 1.0002 | 0.9998 | 1.0001 | 0.9999 |
| u18 | 1.0013 | 0.9987 | 0.9989 | 0.9988 | 1.0001 | 0.9997 | 1.0009 | 0.9994 | 0.9999 | 1.0002 | 1.0002 | 0.9998 | 1.0001 | 0.9999 |
| u19 | 1.0013 | 0.9986 | 0.9989 | 0.9988 | 1.0001 | 0.9997 | 1.001 | 0.9993 | 0.9998 | 1.0001 | 1.0002 | 0.9998 | 1.0001 | 0.9999 |
| u20 | 1.0014 | 0.9986 | 0.9988 | 0.9987 | 1.0001 | 0.9997 | 1.001 | 0.9993 | 0.9998 | 1.0001 | 1.0002 | 0.9998 | 1.0001 | 0.9999 |
| u21 | 1.0013 | 0.9985 | 0.9988 | 0.9987 | 1.0002 | 0.9997 | 1.0011 | 0.9993 | 0.9998 | 1 | 1.0002 | 0.9999 | 1.0001 | 0.9999 |
| u22 | 1.0013 | 0.9985 | 0.9988 | 0.9987 | 1.0002 | 0.9997 | 1.0011 | 0.9993 | 0.9997 | 0.9999 | 1.0002 | 0.9999 | 1.0001 | 0.9999 |
| u23 | 1.0013 | 0.9984 | 0.9988 | 0.9987 | 1.0002 | 0.9997 | 1.0011 | 0.9992 | 0.9997 | 0.9999 | 1.0002 | 0.9999 | 1.0001 | 0.9999 |
| u24 | 1.0008 | 0.9984 | 0.999 | 0.9991 | 1.0004 | 0.9999 | 1.0011 | 0.9993 | 0.9997 | 0.9999 | 1.0001 | 0.9999 | 1.0001 | 0.9999 |
| u25 | 1.0007 | 0.9984 | 0.999 | 0.9991 | 1.0004 | 0.9999 | 1.0011 | 0.9993 | 0.9997 | 0.9999 | 1.0001 | 0.9999 | 1.0001 | 0.9999 |
| u26 | 1.0007 | 0.9983 | 0.9989 | 0.999 | 1.0005 | 0.9999 | 1.0011 | 0.9993 | 0.9997 | 0.9998 | 1.0001 | 0.9999 | 1.0001 | 0.9999 |
| u27 | 1.0007 | 0.9982 | 0.9989 | 0.999 | 1.0005 | 0.9999 | 1.0011 | 0.9994 | 0.9997 | 0.9998 | 1.0001 | 0.9999 | 1.0001 | 0.9999 |
| u28 | 1.0005 | 0.9981 | 0.999 | 0.9991 | 1.0005 | 0.9999 | 1.0011 | 0.9994 | 0.9998 | 0.9998 | 1.0001 | 0.9999 | 1.0001 | 0.9999 |
| u29 | 1.0005 | 0.9981 | 0.9989 | 0.9991 | 1.0005 | 0.9999 | 1.0011 | 0.9994 | 0.9998 | 0.9998 | 1.0001 | 0.9999 | 1.0001 | 0.9999 |
| u30 | 1.0005 | 0.998 | 0.9989 | 0.9991 | 1.0005 | 0.9999 | 1.0011 | 0.9995 | 0.9999 | 0.9998 | 1.0001 | 1 | 1.0001 | 0.9999 |
| u31 | 1.0005 | 0.998 | 0.9989 | 0.9991 | 1.0005 | 0.9999 | 1.001 | 0.9995 | 1 | 0.9998 | 1.0001 | 1 | 1.0001 | 0.9999 |
| u32 | 1.001 | 1.0012 | 0.9984 | 0.9927 | 0.9937 | 0.998 | 1.0013 | 0.9994 | 0.9991 | 1.0013 | 1.012 | 1.0735 | 1.6643 | 2.7081 |
| u33 | 1.001 | 1.0012 | 0.9984 | 0.9927 | 0.9937 | 0.998 | 1.0013 | 0.9995 | 0.9992 | 1.0013 | 1.012 | 1.0735 | 1.6643 | 2.7081 |
| u34 | 1.0009 | 1.0011 | 0.9983 | 0.9926 | 0.9937 | 0.998 | 1.0013 | 0.9995 | 0.9992 | 1.0013 | 1.012 | 1.0735 | 1.6643 | 2.7081 |
| u35 | 1.0009 | 1.0011 | 0.9983 | 0.9926 | 0.9937 | 0.998 | 1.0012 | 0.9996 | 0.9993 | 1.0013 | 1.012 | 1.0735 | 1.6643 | 2.7081 |
| u36 | 1.001 | 1.0011 | 0.9983 | 0.9925 | 0.9937 | 0.9979 | 1.0012 | 0.9996 | 0.9994 | 1.0013 | 1.012 | 1.0735 | 1.6643 | 2.7081 |
| u37 | 1.001 | 1.0011 | 0.9983 | 0.9925 | 0.9937 | 0.9979 | 1.0012 | 0.9997 | 0.9994 | 1.0012 | 1.012 | 1.0736 | 1.6643 | 2.7081 |
| u38 | 1.001 | 1.001 | 0.9983 | 0.9925 | 0.9937 | 0.9979 | 1.0011 | 0.9997 | 0.9994 | 1.0012 | 1.012 | 1.0736 | 1.6643 | 2.7081 |
| u39 | 1.001 | 1.001 | 0.9983 | 0.9925 | 0.9937 | 0.9979 | 1.0011 | 0.9997 | 0.9994 | 1.0012 | 1.012 | 1.0736 | 1.6643 | 2.7081 |
| u40 | 1.0015 | 1.0009 | 0.9981 | 0.9921 | 0.9935 | 0.9978 | 1.0011 | 0.9997 | 0.9994 | 1.0012 | 1.0121 | 1.0736 | 1.6643 | 2.7081 |
| u41 | 1.0015 | 1.0009 | 0.9981 | 0.9921 | 0.9935 | 0.9978 | 1.0011 | 0.9997 | 0.9994 | 1.0011 | 1.0121 | 1.0736 | 1.6643 | 2.7081 |
| u42 | 1.0014 | 1.0009 | 0.9981 | 0.992 | 0.9935 | 0.9977 | 1.0011 | 0.9997 | 0.9994 | 1.0011 | 1.0121 | 1.0736 | 1.6643 | 2.7081 |
| u43 | 1.0014 | 1.0009 | 0.9981 | 0.992 | 0.9935 | 0.9977 | 1.0011 | 0.9997 | 0.9993 | 1.001 | 1.0121 | 1.0736 | 1.6643 | 2.7081 |
| u44 | 1.0013 | 1.0009 | 0.9981 | 0.9921 | 0.9935 | 0.9978 | 1.0011 | 0.9997 | 0.9993 | 1.001 | 1.0121 | 1.0737 | 1.6643 | 2.7081 |
| u45 | 1.0013 | 1.0009 | 0.9981 | 0.9921 | 0.9935 | 0.9978 | 1.0011 | 0.9997 | 0.9992 | 1.0009 | 1.0121 | 1.0737 | 1.6643 | 2.7081 |
| u46 | 1.0013 | 1.0009 | 0.9982 | 0.9921 | 0.9935 | 0.9978 | 1.0011 | 0.9997 | 0.9992 | 1.0008 | 1.012 | 1.0737 | 1.6643 | 2.7081 |
| u47 | 1.0013 | 1.001 | 0.9982 | 0.992 | 0.9935 | 0.9978 | 1.0011 | 0.9997 | 0.9991 | 1.0008 | 1.012 | 1.0737 | 1.6643 | 2.7081 |
| u48 | 0.9999 | 1.0008 | 0.9988 | 0.9923 | 0.9933 | 0.9981 | 1.0012 | 1.0001 | 1 | 1.0022 | 1.0121 | 1.0736 | 1.6644 | 2.708 |
| u49 | 0.9999 | 1.0008 | 0.9988 | 0.9923 | 0.9933 | 0.9981 | 1.0012 | 1 | 1 | 1.0021 | 1.0121 | 1.0736 | 1.6644 | 2.708 |
| u50 | 0.9999 | 1.0008 | 0.9988 | 0.9923 | 0.9933 | 0.9981 | 1.0012 | 1 | 0.9999 | 1.002 | 1.0121 | 1.0736 | 1.6644 | 2.708 |
| u51 | 0.9999 | 1.0009 | 0.9988 | 0.9923 | 0.9933 | 0.9981 | 1.0012 | 1 | 0.9998 | 1.002 | 1.0121 | 1.0736 | 1.6644 | 2.708 |
| u52 | 1 | 1.0009 | 0.9988 | 0.9922 | 0.9934 | 0.9981 | 1.0013 | 1 | 0.9997 | 1.0019 | 1.0121 | 1.0736 | 1.6644 | 2.708 |
| u53 | 1 | 1.001 | 0.9988 | 0.9922 | 0.9934 | 0.9981 | 1.0013 | 0.9999 | 0.9997 | 1.0018 | 1.0121 | 1.0737 | 1.6644 | 2.708 |
| u54 | 1 | 1.0011 | 0.9988 | 0.9922 | 0.9934 | 0.9981 | 1.0013 | 0.9999 | 0.9996 | 1.0017 | 1.012 | 1.0737 | 1.6644 | 2.708 |
| u55 | 1 | 1.0012 | 0.9989 | 0.9922 | 0.9934 | 0.9981 | 1.0014 | 0.9999 | 0.9995 | 1.0017 | 1.012 | 1.0737 | 1.6644 | 2.708 |
| u56 | 0.9995 | 1.0013 | 0.9991 | 0.9926 | 0.9936 | 0.9983 | 1.0014 | 0.9999 | 0.9994 | 1.0015 | 1.012 | 1.0737 | 1.6644 | 2.708 |
| u57 | 0.9994 | 1.0014 | 0.9992 | 0.9926 | 0.9936 | 0.9983 | 1.0014 | 0.9999 | 0.9993 | 1.0014 | 1.012 | 1.0737 | 1.6644 | 2.708 |
| u58 | 0.9994 | 1.0015 | 0.9992 | 0.9925 | 0.9936 | 0.9983 | 1.0015 | 0.9999 | 0.9992 | 1.0014 | 1.012 | 1.0737 | 1.6644 | 2.708 |
| u59 | 0.9994 | 1.0016 | 0.9992 | 0.9925 | 0.9937 | 0.9983 | 1.0015 | 0.9998 | 0.9991 | 1.0013 | 1.012 | 1.0737 | 1.6644 | 2.708 |
| u60 | 0.9993 | 1.0017 | 0.9993 | 0.9926 | 0.9936 | 0.9983 | 1.0015 | 0.9998 | 0.999 | 1.0012 | 1.012 | 1.0737 | 1.6644 | 2.708 |
| u61 | 0.9993 | 1.0018 | 0.9993 | 0.9926 | 0.9936 | 0.9983 | 1.0016 | 0.9998 | 0.9989 | 1.0011 | 1.012 | 1.0738 | 1.6644 | 2.708 |
| u62 | 0.9993 | 1.0019 | 0.9994 | 0.9926 | 0.9936 | 0.9983 | 1.0017 | 0.9997 | 0.9988 | 1.001 | 1.012 | 1.0738 | 1.6644 | 2.708 |
| u63 | 0.9993 | 1.0021 | 0.9994 | 0.9926 | 0.9936 | 0.9983 | 1.0017 | 0.9996 | 0.9987 | 1.001 | 1.012 | 1.0738 | 1.6644 | 2.708 |
| u64 | 0.9685 | 0.9806 | 1.0019 | 1.0454 | 1.1588 | 1.5058 | 2.3723 | 2.8119 | 2.9596 | 3.0028 | 3.0143 | 3.0492 | 3.6238 | 4.7163 |
| u65 | 0.9684 | 0.9806 | 1.002 | 1.0454 | 1.1588 | 1.5057 | 2.3723 | 2.8119 | 2.9595 | 3.0028 | 3.0143 | 3.0492 | 3.6238 | 4.7163 |
| u66 | 0.9683 | 0.9807 | 1.0021 | 1.0454 | 1.1588 | 1.5057 | 2.3724 | 2.8119 | 2.9594 | 3.0027 | 3.0143 | 3.0492 | 3.6238 | 4.7163 |
| u67 | 0.9682 | 0.9807 | 1.0022 | 1.0454 | 1.1588 | 1.5057 | 2.3724 | 2.8119 | 2.9593 | 3.0026 | 3.0143 | 3.0492 | 3.6238 | 4.7163 |
| u68 | 0.9682 | 0.9807 | 1.0023 | 1.0453 | 1.1589 | 1.5057 | 2.3725 | 2.8119 | 2.9593 | 3.0025 | 3.0143 | 3.0493 | 3.6238 | 4.7163 |
| u69 | 0.9681 | 0.9808 | 1.0024 | 1.0453 | 1.1589 | 1.5057 | 2.3725 | 2.8119 | 2.9592 | 3.0025 | 3.0143 | 3.0493 | 3.6238 | 4.7163 |
| u70 | 0.968 | 0.9808 | 1.0025 | 1.0453 | 1.1589 | 1.5057 | 2.3726 | 2.8119 | 2.9591 | 3.0024 | 3.0143 | 3.0493 | 3.6238 | 4.7162 |
| u71 | 0.968 | 0.9808 | 1.0026 | 1.0453 | 1.1589 | 1.5057 | 2.3726 | 2.8119 | 2.959 | 3.0023 | 3.0143 | 3.0493 | 3.6238 | 4.7162 |
| u72 | 0.9683 | 0.9808 | 1.0025 | 1.0449 | 1.1586 | 1.5057 | 2.3725 | 2.8119 | 2.9591 | 3.0022 | 3.0143 | 3.0493 | 3.6238 | 4.7162 |
| u73 | 0.9682 | 0.9808 | 1.0026 | 1.0449 | 1.1586 | 1.5057 | 2.3726 | 2.8119 | 2.959 | 3.0022 | 3.0143 | 3.0494 | 3.6238 | 4.7162 |
| u74 | 0.9682 | 0.9808 | 1.0026 | 1.0448 | 1.1587 | 1.5057 | 2.3726 | 2.8119 | 2.9589 | 3.0021 | 3.0143 | 3.0494 | 3.6238 | 4.7162 |
| u75 | 0.9681 | 0.9808 | 1.0027 | 1.0448 | 1.1587 | 1.5057 | 2.3726 | 2.8118 | 2.9588 | 3.002 | 3.0143 | 3.0494 | 3.6238 | 4.7162 |
| u76 | 0.968 | 0.9808 | 1.0028 | 1.0449 | 1.1587 | 1.5056 | 2.3726 | 2.8118 | 2.9588 | 3.0019 | 3.0143 | 3.0494 | 3.6238 | 4.7162 |
| u77 | 0.9679 | 0.9808 | 1.0029 | 1.0449 | 1.1587 | 1.5056 | 2.3726 | 2.8118 | 2.9587 | 3.0018 | 3.0143 | 3.0494 | 3.6238 | 4.7162 |
| u78 | 0.9679 | 0.9808 | 1.0029 | 1.0449 | 1.1587 | 1.5056 | 2.3726 | 2.8118 | 2.9586 | 3.0017 | 3.0143 | 3.0494 | 3.6238 | 4.7162 |
| u79 | 0.9679 | 0.9808 | 1.003 | 1.0449 | 1.1587 | 1.5055 | 2.3726 | 2.8118 | 2.9585 | 3.0017 | 3.0143 | 3.0494 | 3.6238 | 4.7162 |
| u80 | 0.9688 | 0.9813 | 1.0024 | 1.0445 | 1.1587 | 1.5063 | 2.3732 | 2.8112 | 2.9597 | 3.0029 | 3.0142 | 3.0491 | 3.6239 | 4.7162 |
| u81 | 0.9687 | 0.9813 | 1.0024 | 1.0445 | 1.1587 | 1.5063 | 2.3732 | 2.8112 | 2.9597 | 3.0029 | 3.0142 | 3.0491 | 3.6239 | 4.7162 |
| u82 | 0.9687 | 0.9813 | 1.0024 | 1.0444 | 1.1587 | 1.5063 | 2.3732 | 2.8112 | 2.9596 | 3.0028 | 3.0142 | 3.0491 | 3.6239 | 4.7162 |
| u83 | 0.9687 | 0.9813 | 1.0025 | 1.0444 | 1.1587 | 1.5063 | 2.3731 | 2.8112 | 2.9596 | 3.0028 | 3.0142 | 3.0491 | 3.6239 | 4.7162 |
| u84 | 0.9687 | 0.9813 | 1.0025 | 1.0443 | 1.1588 | 1.5063 | 2.3731 | 2.8112 | 2.9596 | 3.0027 | 3.0142 | 3.0491 | 3.6239 | 4.7162 |
| u85 | 0.9687 | 0.9813 | 1.0025 | 1.0443 | 1.1588 | 1.5063 | 2.3731 | 2.8112 | 2.9596 | 3.0027 | 3.0142 | 3.0491 | 3.6239 | 4.7162 |
| u86 | 0.9687 | 0.9813 | 1.0025 | 1.0443 | 1.1588 | 1.5063 | 2.3731 | 2.8112 | 2.9596 | 3.0026 | 3.0142 | 3.0492 | 3.6239 | 4.7162 |
| u87 | 0.9687 | 0.9813 | 1.0025 | 1.0443 | 1.1588 | 1.5062 | 2.373 | 2.8112 | 2.9595 | 3.0026 | 3.0142 | 3.0492 | 3.6239 | 4.7162 |
| u88 | 0.9682 | 0.9814 | 1.0027 | 1.0447 | 1.1592 | 1.5062 | 2.373 | 2.8112 | 2.9594 | 3.0026 | 3.0142 | 3.0492 | 3.6239 | 4.7162 |

-continued

| | | | | | | | | | | | | | | |
|---|---|---|---|---|---|---|---|---|---|---|---|---|---|---|
| u89 | 0.9682 | 0.9814 | 1.0027 | 1.0447 | 1.1592 | 1.5061 | 2.373 | 2.8112 | 2.9594 | 3.0025 | 3.0142 | 3.0492 | 3.6239 | 4.7161 |
| u90 | 0.9682 | 0.9814 | 1.0027 | 1.0446 | 1.1592 | 1.5061 | 2.3729 | 2.8112 | 2.9594 | 3.0025 | 3.0142 | 3.0492 | 3.6239 | 4.7162 |
| u91 | 0.9682 | 0.9814 | 1.0027 | 1.0446 | 1.1592 | 1.5061 | 2.3728 | 2.8112 | 2.9595 | 3.0025 | 3.0142 | 3.0492 | 3.6239 | 4.7161 |
| u92 | 0.9681 | 0.9813 | 1.0028 | 1.0447 | 1.1592 | 1.506 | 2.3728 | 2.8112 | 2.9595 | 3.0024 | 3.0142 | 3.0492 | 3.6239 | 4.7161 |
| u93 | 0.9681 | 0.9813 | 1.0027 | 1.0447 | 1.1592 | 1.506 | 2.3727 | 2.8112 | 2.9596 | 3.0024 | 3.0142 | 3.0492 | 3.6239 | 4.7161 |
| u94 | 0.9681 | 0.9813 | 1.0027 | 1.0447 | 1.1592 | 1.506 | 2.3726 | 2.8112 | 2.9596 | 3.0024 | 3.0142 | 3.0492 | 3.6239 | 4.7161 |
| u95 | 0.9681 | 0.9813 | 1.0027 | 1.0446 | 1.1592 | 1.506 | 2.3725 | 2.8112 | 2.9598 | 3.0024 | 3.0142 | 3.0492 | 3.6239 | 4.7161 |
| u96 | 0.9687 | 0.9789 | 1.0046 | 1.0516 | 1.1657 | 1.5095 | 2.372 | 2.8101 | 2.958 | 3.0098 | 3.0517 | 3.2104 | 4.5061 | 6.4961 |
| u97 | 0.9687 | 0.9789 | 1.0046 | 1.0515 | 1.1657 | 1.5095 | 2.3719 | 2.8101 | 2.9581 | 3.0098 | 3.0517 | 3.2104 | 4.5061 | 6.4961 |
| u98 | 0.9687 | 0.9789 | 1.0046 | 1.0515 | 1.1657 | 1.5095 | 2.3718 | 2.8101 | 2.9582 | 3.0098 | 3.0517 | 3.2104 | 4.5061 | 6.4961 |
| u99 | 0.9687 | 0.9789 | 1.0045 | 1.0515 | 1.1658 | 1.5094 | 2.3718 | 2.8101 | 2.9582 | 3.0098 | 3.0517 | 3.2105 | 4.5061 | 6.4961 |
| u100 | 0.9688 | 0.9789 | 1.0044 | 1.0514 | 1.1658 | 1.5094 | 2.3717 | 2.8101 | 2.9583 | 3.0098 | 3.0517 | 3.2105 | 4.5061 | 6.4961 |
| u101 | 0.9688 | 0.9789 | 1.0044 | 1.0513 | 1.1659 | 1.5094 | 2.3717 | 2.8101 | 2.9583 | 3.0098 | 3.0517 | 3.2105 | 4.5061 | 6.4961 |
| u102 | 0.9688 | 0.9789 | 1.0044 | 1.0514 | 1.1659 | 1.5094 | 2.3717 | 2.8101 | 2.9583 | 3.0097 | 3.0517 | 3.2105 | 4.5061 | 6.4961 |
| u103 | 0.9689 | 0.9789 | 1.0043 | 1.0513 | 1.1659 | 1.5094 | 2.3717 | 2.8101 | 2.9583 | 3.0097 | 3.0517 | 3.2105 | 4.5061 | 6.4961 |
| u104 | 0.9693 | 0.9789 | 1.0041 | 1.0509 | 1.1657 | 1.5094 | 2.3716 | 2.8101 | 2.9584 | 3.0097 | 3.0517 | 3.2106 | 4.5061 | 6.4961 |
| u105 | 0.9693 | 0.9788 | 1.004 | 1.0508 | 1.1657 | 1.5094 | 2.3716 | 2.8101 | 2.9584 | 3.0097 | 3.0517 | 3.2106 | 4.5061 | 6.4961 |
| u106 | 0.9693 | 0.9788 | 1.0039 | 1.0508 | 1.1658 | 1.5093 | 2.3717 | 2.8101 | 2.9584 | 3.0097 | 3.0517 | 3.2106 | 4.5061 | 6.4961 |
| u107 | 0.9693 | 0.9788 | 1.0039 | 1.0508 | 1.1658 | 1.5093 | 2.3717 | 2.8101 | 2.9583 | 3.0096 | 3.0517 | 3.2106 | 4.5061 | 6.4961 |
| u108 | 0.9693 | 0.9788 | 1.0039 | 1.0508 | 1.1658 | 1.5093 | 2.3717 | 2.8101 | 2.9583 | 3.0095 | 3.0517 | 3.2106 | 4.5061 | 6.4961 |
| u109 | 0.9693 | 0.9788 | 1.0038 | 1.0508 | 1.1658 | 1.5092 | 2.3718 | 2.8101 | 2.9582 | 3.0095 | 3.0517 | 3.2106 | 4.5061 | 6.4961 |
| u110 | 0.9693 | 0.9788 | 1.0037 | 1.0508 | 1.1659 | 1.5092 | 2.3718 | 2.8101 | 2.9582 | 3.0094 | 3.0517 | 3.2107 | 4.5061 | 6.4961 |
| u111 | 0.9694 | 0.9787 | 1.0037 | 1.0507 | 1.1659 | 1.5092 | 2.3719 | 2.8101 | 2.9581 | 3.0093 | 3.0517 | 3.2107 | 4.5061 | 6.4961 |
| u112 | 0.9684 | 0.9783 | 1.0042 | 1.0511 | 1.166 | 1.5084 | 2.3713 | 2.8108 | 2.959 | 3.0108 | 3.0519 | 3.2105 | 4.5061 | 6.496 |
| u113 | 0.9684 | 0.9783 | 1.0042 | 1.0511 | 1.166 | 1.5083 | 2.3713 | 2.8108 | 2.9589 | 3.0108 | 3.0519 | 3.2105 | 4.5061 | 6.496 |
| u114 | 0.9684 | 0.9783 | 1.0041 | 1.051 | 1.166 | 1.5083 | 2.3714 | 2.8108 | 2.9589 | 3.0107 | 3.0519 | 3.2105 | 4.5061 | 6.496 |
| u115 | 0.9685 | 0.9783 | 1.004 | 1.051 | 1.1661 | 1.5083 | 2.3714 | 2.8108 | 2.9587 | 3.0106 | 3.0519 | 3.2105 | 4.5061 | 6.496 |
| u116 | 0.9686 | 0.9783 | 1.0039 | 1.0509 | 1.1662 | 1.5083 | 2.3715 | 2.8108 | 2.9587 | 3.0105 | 3.0519 | 3.2105 | 4.5061 | 6.496 |
| u117 | 0.9686 | 0.9783 | 1.0038 | 1.0508 | 1.1662 | 1.5083 | 2.3715 | 2.8108 | 2.9586 | 3.0105 | 3.0519 | 3.2105 | 4.5062 | 6.496 |
| u118 | 0.9686 | 0.9783 | 1.0038 | 1.0508 | 1.1662 | 1.5082 | 2.3716 | 2.8108 | 2.9585 | 3.0104 | 3.0519 | 3.2105 | 4.5062 | 6.496 |
| u119 | 0.9687 | 0.9783 | 1.0037 | 1.0508 | 1.1663 | 1.5082 | 2.3717 | 2.8108 | 2.9584 | 3.0103 | 3.0519 | 3.2106 | 4.5062 | 6.496 |
| u120 | 0.9683 | 0.9783 | 1.0038 | 1.0512 | 1.1666 | 1.5081 | 2.3718 | 2.8107 | 2.9582 | 3.0101 | 3.0519 | 3.2106 | 4.5062 | 6.496 |
| u121 | 0.9683 | 0.9783 | 1.0038 | 1.0511 | 1.1667 | 1.5081 | 2.3719 | 2.8108 | 2.9581 | 3.0101 | 3.0519 | 3.2106 | 4.5062 | 6.496 |
| u122 | 0.9683 | 0.9783 | 1.0037 | 1.0511 | 1.1667 | 1.5079 | 2.3719 | 2.8107 | 2.958 | 3.01 | 3.0519 | 3.2106 | 4.5062 | 6.496 |
| u123 | 0.9684 | 0.9783 | 1.0036 | 1.051 | 1.1667 | 1.508 | 2.3721 | 2.8107 | 2.9579 | 3.0099 | 3.0519 | 3.2106 | 4.5062 | 6.496 |
| u124 | 0.9683 | 0.9782 | 1.0036 | 1.0511 | 1.1667 | 1.508 | 2.3721 | 2.8107 | 2.9578 | 3.0098 | 3.0519 | 3.2106 | 4.5062 | 6.496 |
| u125 | 0.9683 | 0.9782 | 1.0035 | 1.051 | 1.1668 | 1.5079 | 2.3722 | 2.8107 | 2.9577 | 3.0098 | 3.0519 | 3.2106 | 4.5062 | 6.496 |
| u126 | 0.9683 | 0.9782 | 1.0035 | 1.051 | 1.1668 | 1.5079 | 2.3723 | 2.8107 | 2.9577 | 3.0097 | 3.0519 | 3.2107 | 4.5062 | 6.496 |
| u127 | 0.9684 | 0.9782 | 1.0034 | 1.0509 | 1.1668 | 1.5079 | 2.3724 | 2.8107 | 2.9576 | 3.0096 | 3.0519 | 3.2107 | 4.5062 | 6.496 |
| u128 | 2.7668 | 2.8933 | 2.9656 | 3.0137 | 3.104 | 3.4603 | 4.4018 | 4.8721 | 5.0306 | 5.065 | 5.0563 | 5.1034 | 6.3834 | 8.5353 |
| u129 | 2.7668 | 2.8933 | 2.9656 | 3.0136 | 3.104 | 3.4604 | 4.4018 | 4.872 | 5.0306 | 5.0649 | 5.0563 | 5.1034 | 6.3834 | 8.5353 |
| u130 | 2.7668 | 2.8932 | 2.9657 | 3.0136 | 3.1039 | 3.4604 | 4.4018 | 4.872 | 5.0305 | 5.0649 | 5.0563 | 5.1034 | 6.3834 | 8.5353 |
| u131 | 2.7668 | 2.8932 | 2.9657 | 3.0135 | 3.1038 | 3.4604 | 4.4018 | 4.872 | 5.0304 | 5.0648 | 5.0563 | 5.1035 | 6.3834 | 8.5353 |
| u132 | 2.7673 | 2.8932 | 2.9658 | 3.0135 | 3.1036 | 3.4604 | 4.4018 | 4.8719 | 5.0304 | 5.0647 | 5.0563 | 5.1035 | 6.3834 | 8.5353 |
| u133 | 2.7673 | 2.8932 | 2.9658 | 3.0135 | 3.1036 | 3.4605 | 4.4019 | 4.8719 | 5.0303 | 5.0647 | 5.0563 | 5.1035 | 6.3834 | 8.5353 |
| u134 | 2.7673 | 2.8933 | 2.9658 | 3.0134 | 3.1035 | 3.4605 | 4.4019 | 4.8719 | 5.0302 | 5.0646 | 5.0563 | 5.1035 | 6.3834 | 8.5353 |
| u135 | 2.7674 | 2.8933 | 2.9659 | 3.0133 | 3.1035 | 3.4606 | 4.4019 | 4.8718 | 5.0301 | 5.0645 | 5.0563 | 5.1035 | 6.3834 | 8.5353 |
| u136 | 2.7687 | 2.8931 | 2.965 | 3.0139 | 3.1038 | 3.4605 | 4.4018 | 4.8716 | 5.03 | 5.0645 | 5.0562 | 5.1035 | 6.3834 | 8.5353 |
| u137 | 2.7687 | 2.8931 | 2.965 | 3.0138 | 3.1037 | 3.4605 | 4.4018 | 4.8716 | 5.0299 | 5.0644 | 5.0562 | 5.1035 | 6.3834 | 8.5353 |
| u138 | 2.7687 | 2.893 | 2.9651 | 3.0138 | 3.1037 | 3.4606 | 4.4019 | 4.8716 | 5.0299 | 5.0644 | 5.0562 | 5.1035 | 6.3834 | 8.5353 |
| u139 | 2.7687 | 2.893 | 2.9651 | 3.0138 | 3.1036 | 3.4606 | 4.4019 | 4.8715 | 5.0298 | 5.0643 | 5.0562 | 5.1035 | 6.3834 | 8.5353 |
| u140 | 2.7683 | 2.893 | 2.9652 | 3.0136 | 3.1036 | 3.4607 | 4.4019 | 4.8715 | 5.0297 | 5.0642 | 5.0562 | 5.1035 | 6.3834 | 8.5353 |
| u141 | 2.7683 | 2.893 | 2.9652 | 3.0136 | 3.1036 | 3.4607 | 4.4019 | 4.8714 | 5.0296 | 5.0641 | 5.0562 | 5.1035 | 6.3834 | 8.5353 |
| u142 | 2.7683 | 2.8931 | 2.9652 | 3.0135 | 3.1036 | 3.4608 | 4.402 | 4.8714 | 5.0295 | 5.064 | 5.0562 | 5.1035 | 6.3834 | 8.5353 |
| u143 | 2.7684 | 2.8931 | 2.9653 | 3.0134 | 3.1035 | 3.4608 | 4.402 | 4.8714 | 5.0294 | 5.064 | 5.0562 | 5.1036 | 6.3834 | 8.5353 |
| u144 | 2.7698 | 2.8937 | 2.9645 | 3.0103 | 3.1014 | 3.4598 | 4.4024 | 4.8713 | 5.0293 | 5.0656 | 5.0565 | 5.1036 | 6.3835 | 8.5352 |
| u145 | 2.7698 | 2.8937 | 2.9646 | 3.0103 | 3.1013 | 3.4598 | 4.4025 | 4.8713 | 5.0292 | 5.0655 | 5.0565 | 5.1036 | 6.3835 | 8.5352 |
| u146 | 2.7698 | 2.8936 | 2.9646 | 3.0103 | 3.1013 | 3.4598 | 4.4025 | 4.8712 | 5.0292 | 5.0654 | 5.0564 | 5.1036 | 6.3835 | 8.5352 |
| u147 | 2.7698 | 2.8936 | 2.9646 | 3.0103 | 3.1012 | 3.4599 | 4.4025 | 4.8712 | 5.0291 | 5.0654 | 5.0564 | 5.1036 | 6.3835 | 8.5352 |
| u148 | 2.7703 | 2.8937 | 2.9647 | 3.0103 | 3.1011 | 3.4599 | 4.4025 | 4.8711 | 5.0291 | 5.0653 | 5.0564 | 5.1036 | 6.3835 | 8.5352 |
| u149 | 2.7703 | 2.8937 | 2.9647 | 3.0103 | 3.101 | 3.4599 | 4.4025 | 4.8711 | 5.029 | 5.0653 | 5.0564 | 5.1036 | 6.3835 | 8.5352 |
| u150 | 2.7703 | 2.8938 | 2.9647 | 3.0102 | 3.101 | 3.4599 | 4.4026 | 4.8711 | 5.029 | 5.0652 | 5.0564 | 5.1036 | 6.3835 | 8.5352 |
| u151 | 2.7704 | 2.8938 | 2.9647 | 3.0102 | 3.101 | 3.46 | 4.4026 | 4.8711 | 5.029 | 5.0652 | 5.0564 | 5.1036 | 6.3835 | 8.5352 |
| u152 | 2.7691 | 2.894 | 2.9657 | 3.0095 | 3.1006 | 3.4601 | 4.4028 | 4.8713 | 5.0289 | 5.065 | 5.0565 | 5.1037 | 6.3835 | 8.5352 |
| u153 | 2.769 | 2.8941 | 2.9657 | 3.0095 | 3.1005 | 3.4601 | 4.4028 | 4.8713 | 5.0289 | 5.065 | 5.0565 | 5.1037 | 6.3835 | 8.5352 |
| u154 | 2.769 | 2.894 | 2.9658 | 3.0095 | 3.1005 | 3.4601 | 4.4028 | 4.8713 | 5.029 | 5.065 | 5.0565 | 5.1037 | 6.3835 | 8.5352 |
| u155 | 2.7691 | 2.894 | 2.9658 | 3.0094 | 3.1004 | 3.4601 | 4.4028 | 4.8713 | 5.029 | 5.0649 | 5.0565 | 5.1037 | 6.3835 | 8.5352 |
| u156 | 2.7686 | 2.894 | 2.9658 | 3.0093 | 3.1005 | 3.4602 | 4.4028 | 4.8713 | 5.029 | 5.0649 | 5.0565 | 5.1037 | 6.3835 | 8.5352 |
| u157 | 2.7686 | 2.894 | 2.9658 | 3.0093 | 3.1005 | 3.4602 | 4.4029 | 4.8714 | 5.0291 | 5.0649 | 5.0565 | 5.1037 | 6.3835 | 8.5352 |
| u158 | 2.7687 | 2.894 | 2.9659 | 3.0093 | 3.1005 | 3.4602 | 4.4029 | 4.8714 | 5.0291 | 5.0649 | 5.0565 | 5.1038 | 6.3835 | 8.5352 |
| u159 | 2.7687 | 2.894 | 2.9659 | 3.0092 | 3.1004 | 3.4603 | 4.4029 | 4.8715 | 5.0292 | 5.0649 | 5.0565 | 5.1038 | 6.3835 | 8.5352 |
| u160 | 2.7646 | 2.9009 | 2.9871 | 3.039 | 3.1191 | 3.4616 | 4.3982 | 4.8674 | 5.0353 | 5.1062 | 5.1892 | 5.5029 | 7.6151 | 10.4476 |
| u161 | 2.7647 | 2.9009 | 2.9871 | 3.0389 | 3.1191 | 3.4616 | 4.3982 | 4.8675 | 5.0354 | 5.1062 | 5.1892 | 5.5029 | 7.6151 | 10.4476 |
| u162 | 2.7647 | 2.9008 | 2.9871 | 3.0389 | 3.1191 | 3.4616 | 4.3982 | 4.8676 | 5.0354 | 5.1062 | 5.1891 | 5.5029 | 7.6151 | 10.4476 |
| u163 | 2.7647 | 2.9008 | 2.9871 | 3.0389 | 3.119 | 3.4616 | 4.3983 | 4.8677 | 5.0355 | 5.1062 | 5.1891 | 5.5029 | 7.6151 | 10.4476 |
| u164 | 2.7652 | 2.9008 | 2.9871 | 3.039 | 3.1189 | 3.4615 | 4.3983 | 4.8677 | 5.0355 | 5.1062 | 5.1892 | 5.5029 | 7.6151 | 10.4476 |
| u165 | 2.7652 | 2.9008 | 2.9872 | 3.039 | 3.1189 | 3.4616 | 4.3983 | 4.8677 | 5.0356 | 5.1062 | 5.1891 | 5.503 | 7.6151 | 10.4476 |
| u166 | 2.7652 | 2.9009 | 2.9872 | 3.0389 | 3.1189 | 3.4616 | 4.3983 | 4.8678 | 5.0356 | 5.1062 | 5.1892 | 5.503 | 7.6151 | 10.4476 |
| u167 | 2.7653 | 2.9009 | 2.9871 | 3.0389 | 3.1189 | 3.4616 | 4.3984 | 4.8678 | 5.0356 | 5.1061 | 5.1892 | 5.503 | 7.6151 | 10.4476 |

-continued

| | | | | | | | | | | | | | | |
|---|---|---|---|---|---|---|---|---|---|---|---|---|---|---|
| u168 | 2.7666 | 2.9006 | 2.9862 | 3.0395 | 3.1193 | 3.4615 | 4.3982 | 4.8677 | 5.0356 | 5.1063 | 5.1891 | 5.503 | 7.6151 | 10.4476 |
| u169 | 2.7666 | 2.9006 | 2.9862 | 3.0395 | 3.1192 | 3.4615 | 4.3983 | 4.8677 | 5.0356 | 5.1062 | 5.1891 | 5.503 | 7.6151 | 10.4476 |
| u170 | 2.7667 | 2.9005 | 2.9863 | 3.0395 | 3.1192 | 3.4615 | 4.3983 | 4.8677 | 5.0356 | 5.1062 | 5.189 | 5.503 | 7.6151 | 10.4476 |
| u171 | 2.7667 | 2.9004 | 2.9862 | 3.0395 | 3.1192 | 3.4615 | 4.3983 | 4.8677 | 5.0355 | 5.1061 | 5.189 | 5.503 | 7.6151 | 10.4476 |
| u172 | 2.7663 | 2.9004 | 2.9862 | 3.0394 | 3.1192 | 3.4616 | 4.3983 | 4.8677 | 5.0355 | 5.1061 | 5.189 | 5.5031 | 7.6151 | 10.4476 |
| u173 | 2.7663 | 2.9004 | 2.9862 | 3.0394 | 3.1192 | 3.4616 | 4.3983 | 4.8677 | 5.0355 | 5.106 | 5.189 | 5.5031 | 7.6151 | 10.4476 |
| u174 | 2.7664 | 2.9005 | 2.9862 | 3.0393 | 3.1192 | 3.4617 | 4.3984 | 4.8678 | 5.0354 | 5.1059 | 5.189 | 5.5031 | 7.6151 | 10.4476 |
| u175 | 2.7664 | 2.9004 | 2.9862 | 3.0393 | 3.1192 | 3.4617 | 4.3984 | 4.8677 | 5.0354 | 5.1059 | 5.189 | 5.5031 | 7.6151 | 10.4476 |
| u176 | 2.7651 | 2.8999 | 2.9869 | 3.0423 | 3.1212 | 3.4628 | 4.398 | 4.8682 | 5.0376 | 5.1071 | 5.189 | 5.5024 | 7.6152 | 10.4474 |
| u177 | 2.7651 | 2.8999 | 2.9868 | 3.0423 | 3.1211 | 3.4628 | 4.398 | 4.8682 | 5.0375 | 5.107 | 5.189 | 5.5024 | 7.6152 | 10.4474 |
| u178 | 2.7651 | 2.8997 | 2.9868 | 3.0423 | 3.1211 | 3.4628 | 4.398 | 4.8681 | 5.0375 | 5.1069 | 5.189 | 5.5024 | 7.6152 | 10.4475 |
| u179 | 2.7651 | 2.8997 | 2.9868 | 3.0423 | 3.1211 | 3.4628 | 4.398 | 4.8681 | 5.0374 | 5.1069 | 5.189 | 5.5024 | 7.6152 | 10.4475 |
| u180 | 2.7656 | 2.8997 | 2.9868 | 3.0423 | 3.121 | 3.4628 | 4.3981 | 4.868 | 5.0373 | 5.1068 | 5.189 | 5.5024 | 7.6152 | 10.4475 |
| u181 | 2.7656 | 2.8997 | 2.9868 | 3.0423 | 3.121 | 3.4628 | 4.3981 | 4.868 | 5.0372 | 5.1067 | 5.189 | 5.5025 | 7.6152 | 10.4474 |
| u182 | 2.7657 | 2.8997 | 2.9867 | 3.0423 | 3.121 | 3.4628 | 4.3981 | 4.868 | 5.0371 | 5.1067 | 5.189 | 5.5025 | 7.6152 | 10.4474 |
| u183 | 2.7658 | 2.8997 | 2.9867 | 3.0423 | 3.1209 | 3.4629 | 4.3981 | 4.868 | 5.037 | 5.1066 | 5.189 | 5.5025 | 7.6152 | 10.4474 |
| u184 | 2.7645 | 2.9 | 2.9876 | 3.0416 | 3.1205 | 3.463 | 4.3983 | 4.8681 | 5.0369 | 5.1063 | 5.1891 | 5.5026 | 7.6152 | 10.4474 |
| u185 | 2.7645 | 2.8999 | 2.9875 | 3.0416 | 3.1205 | 3.463 | 4.3983 | 4.868 | 5.0368 | 5.1062 | 5.1891 | 5.5026 | 7.6152 | 10.4474 |
| u186 | 2.7645 | 2.8998 | 2.9875 | 3.0416 | 3.1204 | 3.463 | 4.3983 | 4.868 | 5.0367 | 5.1062 | 5.1891 | 5.5026 | 7.6152 | 10.4474 |
| u187 | 2.7646 | 2.8998 | 2.9874 | 3.0416 | 3.1204 | 3.463 | 4.3984 | 4.868 | 5.0366 | 5.1061 | 5.1891 | 5.5027 | 7.6152 | 10.4474 |
| u188 | 2.7642 | 2.8997 | 2.9874 | 3.0415 | 3.1205 | 3.4631 | 4.3984 | 4.8679 | 5.0366 | 5.106 | 5.1891 | 5.5027 | 7.6152 | 10.4474 |
| u189 | 2.7642 | 2.8997 | 2.9874 | 3.0415 | 3.1205 | 3.4631 | 4.3984 | 4.8679 | 5.0365 | 5.1059 | 5.1891 | 5.5027 | 7.6152 | 10.4474 |
| u190 | 2.7643 | 2.8997 | 2.9873 | 3.0415 | 3.1205 | 3.4631 | 4.3985 | 4.8678 | 5.0364 | 5.1058 | 5.1891 | 5.5028 | 7.6152 | 10.4474 |
| u191 | 2.7644 | 2.8997 | 2.9872 | 3.0415 | 3.1205 | 3.4632 | 4.3985 | 4.8678 | 5.0363 | 5.1058 | 5.1891 | 5.5028 | 7.6152 | 10.4474 |
| u192 | 2.8319 | 3.0119 | 3.1574 | 3.3055 | 3.5969 | 4.3941 | 6.0915 | 6.8898 | 7.1509 | 7.1851 | 7.1376 | 7.268 | 9.4361 | 12.562 |
| u193 | 2.832 | 3.012 | 3.1573 | 3.3055 | 3.5969 | 4.3941 | 6.0915 | 6.8898 | 7.1509 | 7.185 | 7.1376 | 7.268 | 9.4361 | 12.562 |
| u194 | 2.8321 | 3.012 | 3.1573 | 3.3054 | 3.5969 | 4.3941 | 6.0916 | 6.8898 | 7.1508 | 7.185 | 7.1376 | 7.268 | 9.4361 | 12.562 |
| u195 | 2.8322 | 3.0121 | 3.1572 | 3.3053 | 3.5969 | 4.394 | 6.0916 | 6.8899 | 7.1507 | 7.1849 | 7.1376 | 7.268 | 9.4361 | 12.562 |
| u196 | 2.8327 | 3.0122 | 3.1571 | 3.3053 | 3.5968 | 4.394 | 6.0916 | 6.8899 | 7.1506 | 7.1848 | 7.1376 | 7.268 | 9.4361 | 12.562 |
| u197 | 2.8328 | 3.0123 | 3.1571 | 3.3052 | 3.5968 | 4.394 | 6.0916 | 6.8899 | 7.1505 | 7.1847 | 7.1376 | 7.2681 | 9.4361 | 12.562 |
| u198 | 2.8329 | 3.0125 | 3.157 | 3.3051 | 3.5969 | 4.3939 | 6.0916 | 6.89 | 7.1504 | 7.1846 | 7.1376 | 7.2681 | 9.4361 | 12.562 |
| u199 | 2.833 | 3.0125 | 3.157 | 3.3051 | 3.5969 | 4.3939 | 6.0916 | 6.89 | 7.1504 | 7.1846 | 7.1376 | 7.2681 | 9.4361 | 12.562 |
| u200 | 2.8341 | 3.0123 | 3.156 | 3.3058 | 3.5976 | 4.3944 | 6.0916 | 6.8899 | 7.1499 | 7.1843 | 7.1376 | 7.2681 | 9.4361 | 12.562 |
| u201 | 2.8341 | 3.0124 | 3.1559 | 3.3058 | 3.5976 | 4.3944 | 6.0916 | 6.8899 | 7.1498 | 7.1842 | 7.1376 | 7.2681 | 9.4361 | 12.562 |
| u202 | 2.8342 | 3.0124 | 3.1559 | 3.3058 | 3.5977 | 4.3943 | 6.0916 | 6.89 | 7.1497 | 7.1842 | 7.1376 | 7.2681 | 9.4361 | 12.562 |
| u203 | 2.8343 | 3.0124 | 3.1559 | 3.3057 | 3.5977 | 4.3943 | 6.0916 | 6.89 | 7.1497 | 7.1841 | 7.1376 | 7.2681 | 9.4361 | 12.562 |
| u204 | 2.8339 | 3.0124 | 3.1559 | 3.3056 | 3.5979 | 4.3943 | 6.0916 | 6.89 | 7.1497 | 7.184 | 7.1376 | 7.2681 | 9.4361 | 12.562 |
| u205 | 2.8339 | 3.0125 | 3.1559 | 3.3056 | 3.598 | 4.3943 | 6.0916 | 6.89 | 7.1496 | 7.184 | 7.1376 | 7.2681 | 9.4361 | 12.562 |
| u206 | 2.834 | 3.0126 | 3.1558 | 3.3055 | 3.5981 | 4.3942 | 6.0916 | 6.89 | 7.1495 | 7.1839 | 7.1375 | 7.2681 | 9.4361 | 12.562 |
| u207 | 2.834 | 3.0126 | 3.1558 | 3.3055 | 3.5982 | 4.3942 | 6.0916 | 6.89 | 7.1495 | 7.1838 | 7.1375 | 7.2681 | 9.4361 | 12.562 |
| u208 | 2.8349 | 3.0132 | 3.1552 | 3.3022 | 3.5945 | 4.3924 | 6.0912 | 6.8921 | 7.1507 | 7.1841 | 7.1372 | 7.2682 | 9.4362 | 12.5617 |
| u209 | 2.8349 | 3.0132 | 3.1552 | 3.3022 | 3.5946 | 4.3924 | 6.0912 | 6.8921 | 7.1506 | 7.1841 | 7.1372 | 7.2682 | 9.4362 | 12.5617 |
| u210 | 2.8349 | 3.0131 | 3.1552 | 3.3022 | 3.5947 | 4.3924 | 6.0911 | 6.892 | 7.1506 | 7.184 | 7.1372 | 7.2682 | 9.4362 | 12.5617 |
| u211 | 2.8349 | 3.0131 | 3.1552 | 3.3022 | 3.5947 | 4.3923 | 6.0911 | 6.892 | 7.1506 | 7.1839 | 7.1372 | 7.2682 | 9.4362 | 12.5617 |
| u212 | 2.8353 | 3.0132 | 3.1552 | 3.3023 | 3.5946 | 4.3923 | 6.0911 | 6.892 | 7.1505 | 7.1838 | 7.1372 | 7.2682 | 9.4362 | 12.5617 |
| u213 | 2.8353 | 3.0132 | 3.1552 | 3.3024 | 3.5947 | 4.3923 | 6.091 | 6.892 | 7.1504 | 7.1838 | 7.1372 | 7.2682 | 9.4362 | 12.5617 |
| u214 | 2.8353 | 3.0133 | 3.1552 | 3.3023 | 3.5948 | 4.3923 | 6.091 | 6.892 | 7.1504 | 7.1837 | 7.1372 | 7.2682 | 9.4362 | 12.5617 |
| u215 | 2.8353 | 3.0133 | 3.1552 | 3.3023 | 3.5949 | 4.3922 | 6.091 | 6.8919 | 7.1504 | 7.1837 | 7.1372 | 7.2682 | 9.4362 | 12.5617 |
| u216 | 2.8342 | 3.0135 | 3.1561 | 3.3016 | 3.5943 | 4.3916 | 6.0909 | 6.892 | 7.1509 | 7.1838 | 7.1372 | 7.2682 | 9.4362 | 12.5617 |
| u217 | 2.8341 | 3.0135 | 3.1561 | 3.3016 | 3.5944 | 4.3916 | 6.0909 | 6.8919 | 7.1509 | 7.1838 | 7.1372 | 7.2682 | 9.4362 | 12.5617 |
| u218 | 2.8341 | 3.0134 | 3.1562 | 3.3017 | 3.5944 | 4.3916 | 6.0908 | 6.8919 | 7.1509 | 7.1837 | 7.1372 | 7.2683 | 9.4362 | 12.5617 |
| u219 | 2.834 | 3.0134 | 3.1562 | 3.3017 | 3.5945 | 4.3915 | 6.0907 | 6.8918 | 7.1509 | 7.1837 | 7.1372 | 7.2683 | 9.4362 | 12.5617 |
| u220 | 2.8336 | 3.0134 | 3.1562 | 3.3016 | 3.5947 | 4.3915 | 6.0907 | 6.8918 | 7.1511 | 7.1837 | 7.1372 | 7.2683 | 9.4362 | 12.5617 |
| u221 | 2.8336 | 3.0134 | 3.1562 | 3.3016 | 3.5948 | 4.3915 | 6.0906 | 6.8917 | 7.1511 | 7.1837 | 7.1372 | 7.2683 | 9.4362 | 12.5617 |
| u222 | 2.8335 | 3.0134 | 3.1562 | 3.3016 | 3.5948 | 4.3915 | 6.0905 | 6.8916 | 7.1512 | 7.1837 | 7.1372 | 7.2683 | 9.4362 | 12.5617 |
| u223 | 2.8335 | 3.0134 | 3.1562 | 3.3017 | 3.595 | 4.3915 | 6.0904 | 6.8915 | 7.1513 | 7.1837 | 7.1371 | 7.2683 | 9.4362 | 12.5617 |
| u224 | 2.8396 | 3.0077 | 3.1339 | 3.2644 | 3.5631 | 4.3809 | 6.0888 | 6.9123 | 7.2204 | 7.3604 | 7.539 | 8.1149 | 11.0073 | 14.6639 |
| u225 | 2.8395 | 3.0077 | 3.1339 | 3.2644 | 3.5632 | 4.3808 | 6.0887 | 6.9123 | 7.2205 | 7.3604 | 7.539 | 8.1149 | 11.0073 | 14.6639 |
| u226 | 2.8395 | 3.0076 | 3.1339 | 3.2645 | 3.5633 | 4.3808 | 6.0886 | 6.9122 | 7.2206 | 7.3604 | 7.5391 | 8.1149 | 11.0073 | 14.6639 |
| u227 | 2.8394 | 3.0076 | 3.134 | 3.2646 | 3.5633 | 4.3808 | 6.0886 | 6.9122 | 7.2206 | 7.3604 | 7.5391 | 8.115 | 11.0073 | 14.6639 |
| u228 | 2.8397 | 3.0076 | 3.134 | 3.2647 | 3.5632 | 4.3807 | 6.0885 | 6.9122 | 7.2206 | 7.3603 | 7.5391 | 8.115 | 11.0073 | 14.6639 |
| u229 | 2.8396 | 3.0075 | 3.134 | 3.2648 | 3.5633 | 4.3807 | 6.0885 | 6.9121 | 7.2206 | 7.3603 | 7.5391 | 8.115 | 11.0073 | 14.6639 |
| u230 | 2.8396 | 3.0076 | 3.134 | 3.2648 | 3.5634 | 4.3807 | 6.0885 | 6.9121 | 7.2206 | 7.3603 | 7.5391 | 8.115 | 11.0073 | 14.6639 |
| u231 | 2.8395 | 3.0075 | 3.1341 | 3.2649 | 3.5635 | 4.3806 | 6.0885 | 6.9121 | 7.2206 | 7.3602 | 7.5391 | 8.115 | 11.0073 | 14.6639 |
| u232 | 2.8406 | 3.0072 | 3.1332 | 3.2658 | 3.5642 | 4.3811 | 6.0885 | 6.9121 | 7.2202 | 7.3601 | 7.5391 | 8.1148 | 11.0073 | 14.6639 |
| u233 | 2.8405 | 3.0072 | 3.1332 | 3.2659 | 3.5643 | 4.3811 | 6.0885 | 6.912 | 7.2201 | 7.3601 | 7.5391 | 8.1148 | 11.0073 | 14.6639 |
| u234 | 2.8404 | 3.007 | 3.1333 | 3.266 | 3.5644 | 4.3811 | 6.0885 | 6.912 | 7.2201 | 7.36 | 7.5391 | 8.1148 | 11.0073 | 14.6639 |
| u235 | 2.8403 | 3.007 | 3.1333 | 3.2661 | 3.5645 | 4.381 | 6.0885 | 6.912 | 7.2201 | 7.36 | 7.5391 | 8.1148 | 11.0073 | 14.6639 |
| u236 | 2.8398 | 3.0069 | 3.1333 | 3.2661 | 3.5648 | 4.381 | 6.0885 | 6.9121 | 7.2201 | 7.3599 | 7.5391 | 8.1149 | 11.0073 | 14.6639 |
| u237 | 2.8397 | 3.0069 | 3.1334 | 3.2662 | 3.5649 | 4.3809 | 6.0886 | 6.9121 | 7.22 | 7.3599 | 7.5392 | 8.1149 | 11.0073 | 14.6639 |
| u238 | 2.8396 | 3.0069 | 3.1334 | 3.2663 | 3.5651 | 4.3809 | 6.0886 | 6.9121 | 7.22 | 7.3598 | 7.5391 | 8.115 | 11.0073 | 14.6639 |
| u239 | 2.8396 | 3.0069 | 3.1335 | 3.2664 | 3.5652 | 4.3808 | 6.0886 | 6.9121 | 7.2199 | 7.3598 | 7.5391 | 8.115 | 11.0073 | 14.6639 |
| u240 | 2.8386 | 3.0063 | 3.1341 | 3.2698 | 3.5689 | 4.3825 | 6.0889 | 6.9101 | 7.2206 | 7.3624 | 7.5398 | 8.1132 | 11.0068 | 14.6643 |
| u241 | 2.8385 | 3.0063 | 3.1341 | 3.2699 | 3.5691 | 4.3824 | 6.0889 | 6.9101 | 7.2206 | 7.3623 | 7.5398 | 8.1133 | 11.0068 | 14.6643 |
| u242 | 2.8384 | 3.0061 | 3.1342 | 3.2701 | 3.5692 | 4.3824 | 6.0889 | 6.9101 | 7.2205 | 7.3622 | 7.5398 | 8.1133 | 11.0068 | 14.6643 |
| u243 | 2.8383 | 3.0061 | 3.1342 | 3.2702 | 3.5693 | 4.3823 | 6.089 | 6.9101 | 7.2204 | 7.3621 | 7.5398 | 8.1133 | 11.0068 | 14.6643 |
| u244 | 2.8387 | 3.0061 | 3.1343 | 3.2704 | 3.5692 | 4.3823 | 6.089 | 6.9101 | 7.2203 | 7.362 | 7.5398 | 8.1133 | 11.0068 | 14.6643 |
| u245 | 2.8386 | 3.006 | 3.1343 | 3.2706 | 3.5694 | 4.3822 | 6.0891 | 6.9101 | 7.2202 | 7.362 | 7.5398 | 8.1133 | 11.0068 | 14.6643 |
| u246 | 2.8385 | 3.006 | 3.1344 | 3.2706 | 3.5696 | 4.3822 | 6.0891 | 6.9102 | 7.2201 | 7.3619 | 7.5398 | 8.1134 | 11.0068 | 14.6643 |

-continued

| | | | | | | | | | | | | | |
|---|---|---|---|---|---|---|---|---|---|---|---|---|---|
| u247 | 2.8384 | 3.006 | 3.1345 | 3.2708 | 3.5697 | 4.3821 | 6.0892 | 6.9102 | 7.2201 | 7.3618 | 7.5398 | 8.1134 | 11.0068 | 14.6643 |
| u248 | 2.8372 | 3.0062 | 3.1355 | 3.2701 | 3.5693 | 4.3815 | 6.0892 | 6.9103 | 7.2204 | 7.3618 | 7.5399 | 8.1137 | 11.0069 | 14.6643 |
| u249 | 2.8371 | 3.0062 | 3.1355 | 3.2702 | 3.5694 | 4.3814 | 6.0893 | 6.9103 | 7.2203 | 7.3617 | 7.5399 | 8.1137 | 11.0069 | 14.6643 |
| u250 | 2.837 | 3.006 | 3.1356 | 3.2704 | 3.5695 | 4.3814 | 6.0893 | 6.9103 | 7.2202 | 7.3617 | 7.5399 | 8.1137 | 11.0069 | 14.6643 |
| u251 | 2.8369 | 3.006 | 3.1357 | 3.2705 | 3.5697 | 4.3813 | 6.0893 | 6.9103 | 7.2202 | 7.3616 | 7.5399 | 8.1138 | 11.0069 | 14.6643 |
| u252 | 2.8364 | 3.0059 | 3.1358 | 3.2705 | 3.57 | 4.3813 | 6.0894 | 6.9104 | 7.2202 | 7.3615 | 7.5399 | 8.1138 | 11.0069 | 14.6643 |
| u253 | 2.8363 | 3.0059 | 3.1358 | 3.2707 | 3.5702 | 4.3813 | 6.0895 | 6.9104 | 7.2201 | 7.3615 | 7.5399 | 8.1138 | 11.0069 | 14.6643 |
| u254 | 2.8363 | 3.0059 | 3.1359 | 3.2707 | 3.5703 | 4.3812 | 6.0895 | 6.9104 | 7.22 | 7.3614 | 7.5399 | 8.1139 | 11.0069 | 14.6643 |
| u255 | 2.8362 | 3.0059 | 3.136 | 3.2709 | 3.5705 | 4.3811 | 6.0896 | 6.9104 | 7.22 | 7.3613 | 7.5399 | 8.1139 | 11.0069 | 14.6643 |
| u256 | 4.9077 | 5.0671 | 5.2086 | 5.3118 | 5.53 | 6.3556 | 8.2541 | 9.1471 | 9.4129 | 9.4085 | 9.389 | 9.7899 | 12.8707 | 16.9305 |
| u257 | 4.9079 | 5.0674 | 5.2084 | 5.3117 | 5.53 | 6.3557 | 8.2541 | 9.1471 | 9.4129 | 9.4084 | 9.389 | 9.7899 | 12.8707 | 16.9305 |
| u258 | 4.9081 | 5.068 | 5.208 | 5.3116 | 5.53 | 6.3557 | 8.2543 | 9.1471 | 9.4128 | 9.4083 | 9.389 | 9.79 | 12.8707 | 16.9305 |
| u259 | 4.9074 | 5.0683 | 5.2079 | 5.3115 | 5.5299 | 6.3558 | 8.2544 | 9.1471 | 9.4127 | 9.4083 | 9.389 | 9.79 | 12.8707 | 16.9305 |
| u260 | 4.9073 | 5.0689 | 5.2076 | 5.3111 | 5.53 | 6.3558 | 8.2543 | 9.1468 | 9.4126 | 9.4082 | 9.389 | 9.79 | 12.8707 | 16.9304 |
| u261 | 4.9075 | 5.0692 | 5.2074 | 5.311 | 5.53 | 6.3558 | 8.2543 | 9.1468 | 9.4125 | 9.4081 | 9.389 | 9.79 | 12.8707 | 16.9304 |
| u262 | 4.9066 | 5.0692 | 5.2073 | 5.3109 | 5.53 | 6.3559 | 8.2543 | 9.1468 | 9.4125 | 9.408 | 9.389 | 9.79 | 12.8707 | 16.9304 |
| u263 | 4.9059 | 5.0695 | 5.2072 | 5.3108 | 5.5299 | 6.3559 | 8.2544 | 9.1468 | 9.4124 | 9.4079 | 9.389 | 9.79 | 12.8707 | 16.9304 |
| u264 | 4.902 | 5.0704 | 5.2088 | 5.3105 | 5.5293 | 6.3566 | 8.2565 | 9.1469 | 9.4122 | 9.4077 | 9.389 | 9.7901 | 12.8708 | 16.9304 |
| u265 | 4.902 | 5.0709 | 5.2085 | 5.3104 | 5.5292 | 6.3567 | 8.2566 | 9.1469 | 9.4121 | 9.4076 | 9.389 | 9.7901 | 12.8708 | 16.9304 |
| u266 | 4.9021 | 5.0713 | 5.2082 | 5.3103 | 5.5292 | 6.3567 | 8.2568 | 9.1469 | 9.412 | 9.4075 | 9.389 | 9.7901 | 12.8708 | 16.9304 |
| u267 | 4.9013 | 5.0718 | 5.2081 | 5.3102 | 5.5292 | 6.3568 | 8.2568 | 9.1469 | 9.4119 | 9.4075 | 9.389 | 9.7901 | 12.8708 | 16.9304 |
| u268 | 4.9008 | 5.0718 | 5.2079 | 5.3104 | 5.529 | 6.3568 | 8.2571 | 9.1471 | 9.4118 | 9.4074 | 9.389 | 9.7901 | 12.8708 | 16.9304 |
| u269 | 4.9008 | 5.0721 | 5.2077 | 5.3102 | 5.529 | 6.3569 | 8.2571 | 9.1471 | 9.4118 | 9.4074 | 9.3889 | 9.7901 | 12.8708 | 16.9304 |
| u270 | 4.9001 | 5.0721 | 5.2077 | 5.3102 | 5.5289 | 6.3569 | 8.2571 | 9.1471 | 9.4117 | 9.4073 | 9.3889 | 9.7901 | 12.8708 | 16.9304 |
| u271 | 4.8991 | 5.0724 | 5.2075 | 5.3101 | 5.5289 | 6.357 | 8.2571 | 9.1471 | 9.4116 | 9.4072 | 9.3889 | 9.7901 | 12.8708 | 16.9304 |
| u272 | 4.8896 | 5.0612 | 5.213 | 5.3219 | 5.5371 | 6.355 | 8.2506 | 9.143 | 9.4148 | 9.4121 | 9.3896 | 9.7885 | 12.8707 | 16.9393 |
| u273 | 4.8896 | 5.0615 | 5.2127 | 5.3217 | 5.5371 | 6.3551 | 8.2506 | 9.1429 | 9.4147 | 9.412 | 9.3896 | 9.7885 | 12.8707 | 16.9393 |
| u274 | 4.8895 | 5.0621 | 5.2124 | 5.3215 | 5.537 | 6.3552 | 8.2508 | 9.1429 | 9.4147 | 9.4119 | 9.3896 | 9.7885 | 12.8707 | 16.9393 |
| u275 | 4.8885 | 5.0623 | 5.2123 | 5.3214 | 5.537 | 6.3552 | 8.2508 | 9.1429 | 9.4146 | 9.4119 | 9.3896 | 9.7885 | 12.8707 | 16.9393 |
| u276 | 4.8881 | 5.0629 | 5.2121 | 5.3211 | 5.5371 | 6.3552 | 8.2507 | 9.1427 | 9.4146 | 9.4118 | 9.3896 | 9.7885 | 12.8707 | 16.9393 |
| u277 | 4.8882 | 5.063 | 5.2119 | 5.3209 | 5.5371 | 6.3552 | 8.2507 | 9.1426 | 9.4145 | 9.4117 | 9.3896 | 9.7885 | 12.8707 | 16.9393 |
| u278 | 4.8869 | 5.063 | 5.2118 | 5.3209 | 5.537 | 6.3553 | 8.2506 | 9.1426 | 9.4145 | 9.4117 | 9.3896 | 9.7885 | 12.8707 | 16.9393 |
| u279 | 4.8861 | 5.0632 | 5.2117 | 5.3207 | 5.537 | 6.3553 | 8.2506 | 9.1426 | 9.4145 | 9.4116 | 9.3896 | 9.7885 | 12.8707 | 16.9393 |
| u280 | 4.8893 | 5.0626 | 5.2097 | 5.3208 | 5.5375 | 6.3547 | 8.2485 | 9.1426 | 9.4146 | 9.4118 | 9.3896 | 9.7885 | 12.8706 | 16.9393 |
| u281 | 4.8894 | 5.0629 | 5.2096 | 5.3207 | 5.5375 | 6.3547 | 8.2486 | 9.1426 | 9.4146 | 9.4118 | 9.3896 | 9.7885 | 12.8706 | 16.9393 |
| u282 | 4.8894 | 5.0634 | 5.2093 | 5.3206 | 5.5374 | 6.3547 | 8.2486 | 9.1426 | 9.4146 | 9.4118 | 9.3896 | 9.7885 | 12.8707 | 16.9393 |
| u283 | 4.8886 | 5.0636 | 5.2092 | 5.3205 | 5.5374 | 6.3548 | 8.2486 | 9.1426 | 9.4146 | 9.4117 | 9.3896 | 9.7885 | 12.8707 | 16.9393 |
| u284 | 4.888 | 5.0635 | 5.2092 | 5.3207 | 5.5372 | 6.3548 | 8.2488 | 9.1429 | 9.4146 | 9.4117 | 9.3896 | 9.7885 | 12.8706 | 16.9393 |
| u285 | 4.8882 | 5.0637 | 5.209 | 5.3206 | 5.5372 | 6.3549 | 8.2488 | 9.1429 | 9.4146 | 9.4117 | 9.3895 | 9.7885 | 12.8707 | 16.9393 |
| u286 | 4.8874 | 5.0636 | 5.209 | 5.3205 | 5.5371 | 6.3549 | 8.2486 | 9.1429 | 9.4147 | 9.4117 | 9.3896 | 9.7885 | 12.8707 | 16.9393 |
| u287 | 4.8864 | 5.0637 | 5.2089 | 5.3205 | 5.5371 | 6.3549 | 8.2486 | 9.1429 | 9.4148 | 9.4117 | 9.3896 | 9.7885 | 12.8707 | 16.9393 |
| u288 | 4.8796 | 5.015 | 5.1421 | 5.2465 | 5.4981 | 6.364 | 8.3111 | 9.3075 | 9.7243 | 9.9725 | 10.3318 | 11.1532 | 14.7313 | 19.2755 |
| u289 | 4.8801 | 5.015 | 5.1422 | 5.2465 | 5.4982 | 6.364 | 8.311 | 9.3075 | 9.7244 | 9.9725 | 10.3318 | 11.1532 | 14.7313 | 19.2755 |
| u290 | 4.8805 | 5.0153 | 5.1423 | 5.2465 | 5.4983 | 6.364 | 8.3111 | 9.3074 | 9.7244 | 9.9724 | 10.3318 | 11.1533 | 14.7313 | 19.2755 |
| u291 | 4.88 | 5.0152 | 5.1425 | 5.2465 | 5.4984 | 6.364 | 8.3111 | 9.3074 | 9.7244 | 9.9724 | 10.3319 | 11.1533 | 14.7313 | 19.2755 |
| u292 | 4.88 | 5.0157 | 5.1423 | 5.2462 | 5.4984 | 6.364 | 8.3109 | 9.3071 | 9.7245 | 9.9724 | 10.3319 | 11.1533 | 14.7313 | 19.2755 |
| u293 | 4.8805 | 5.0157 | 5.1424 | 5.2462 | 5.4985 | 6.364 | 8.3109 | 9.3071 | 9.7245 | 9.9724 | 10.3319 | 11.1533 | 14.7313 | 19.2756 |
| u294 | 4.88 | 5.0153 | 5.1427 | 5.2462 | 5.4986 | 6.364 | 8.3108 | 9.3071 | 9.7245 | 9.9724 | 10.3319 | 11.1534 | 14.7313 | 19.2755 |
| u295 | 4.8795 | 5.0152 | 5.1429 | 5.2462 | 5.4987 | 6.3641 | 8.3108 | 9.3071 | 9.7245 | 9.9724 | 10.332 | 11.1534 | 14.7313 | 19.2755 |
| u296 | 4.8762 | 5.017 | 5.1432 | 5.2459 | 5.4978 | 6.3647 | 8.3127 | 9.3071 | 9.7245 | 9.972 | 10.3323 | 11.1541 | 14.7312 | 19.2757 |
| u297 | 4.8766 | 5.017 | 5.1432 | 5.2459 | 5.4979 | 6.3647 | 8.3127 | 9.3071 | 9.7245 | 9.972 | 10.3324 | 11.1541 | 14.7312 | 19.2757 |
| u298 | 4.8771 | 5.0173 | 5.1431 | 5.2459 | 5.498 | 6.3648 | 8.3128 | 9.3071 | 9.7244 | 9.972 | 10.3324 | 11.1541 | 14.7312 | 19.2757 |
| u299 | 4.8766 | 5.0173 | 5.1432 | 5.2459 | 5.498 | 6.3648 | 8.3128 | 9.3071 | 9.7244 | 9.972 | 10.3324 | 11.1541 | 14.7312 | 19.2757 |
| u300 | 4.8765 | 5.0168 | 5.1436 | 5.2462 | 5.4981 | 6.3648 | 8.313 | 9.3073 | 9.7244 | 9.972 | 10.3324 | 11.1541 | 14.7312 | 19.2757 |
| u301 | 4.877 | 5.0168 | 5.1435 | 5.2462 | 5.4982 | 6.3648 | 8.3131 | 9.3073 | 9.7244 | 9.972 | 10.3325 | 11.1541 | 14.7312 | 19.2757 |
| u302 | 4.8766 | 5.0165 | 5.1437 | 5.2462 | 5.4983 | 6.3648 | 8.313 | 9.3073 | 9.7244 | 9.972 | 10.3325 | 11.1541 | 14.7312 | 19.2757 |
| u303 | 4.8762 | 5.0165 | 5.1437 | 5.2462 | 5.4984 | 6.3648 | 8.313 | 9.3074 | 9.7243 | 9.9719 | 10.3325 | 11.1541 | 14.7312 | 19.2757 |
| u304 | 4.8869 | 5.0243 | 5.145 | 5.2381 | 5.4931 | 6.3666 | 8.3193 | 9.3118 | 9.722 | 9.9664 | 10.3289 | 11.1555 | 14.7443 | 19.3323 |
| u305 | 4.8874 | 5.0243 | 5.1448 | 5.2381 | 5.4932 | 6.3666 | 8.3193 | 9.3118 | 9.722 | 9.9663 | 10.3289 | 11.1555 | 14.7443 | 19.3323 |
| u306 | 4.8879 | 5.0246 | 5.1444 | 5.238 | 5.4932 | 6.3666 | 8.3194 | 9.3117 | 9.722 | 9.9663 | 10.3289 | 11.1555 | 14.7443 | 19.3323 |
| u307 | 4.8875 | 5.0246 | 5.1444 | 5.2381 | 5.4933 | 6.3666 | 8.3195 | 9.3118 | 9.7219 | 9.9663 | 10.3289 | 11.1555 | 14.7443 | 19.3323 |
| u308 | 4.8876 | 5.0252 | 5.1437 | 5.2378 | 5.4934 | 6.3666 | 8.3193 | 9.3115 | 9.7219 | 9.9662 | 10.329 | 11.1556 | 14.7443 | 19.3323 |
| u309 | 4.8881 | 5.0252 | 5.1435 | 5.2379 | 5.4934 | 6.3666 | 8.3194 | 9.3115 | 9.7219 | 9.9662 | 10.329 | 11.1556 | 14.7443 | 19.3323 |
| u310 | 4.8877 | 5.0249 | 5.1434 | 5.2379 | 5.4935 | 6.3666 | 8.3193 | 9.3115 | 9.7219 | 9.9662 | 10.329 | 11.1556 | 14.7443 | 19.3323 |
| u311 | 4.8873 | 5.0249 | 5.1432 | 5.2379 | 5.4935 | 6.3666 | 8.3194 | 9.3116 | 9.7219 | 9.9662 | 10.3291 | 11.1556 | 14.7443 | 19.3323 |
| u312 | 4.8917 | 5.0234 | 5.1427 | 5.2381 | 5.4945 | 6.366 | 8.3174 | 9.3115 | 9.7219 | 9.9664 | 10.3288 | 11.155 | 14.7445 | 19.3321 |
| u313 | 4.8923 | 5.0235 | 5.1423 | 5.2382 | 5.4945 | 6.366 | 8.3175 | 9.3115 | 9.7219 | 9.9664 | 10.3288 | 11.155 | 14.7445 | 19.3321 |
| u314 | 4.8928 | 5.0238 | 5.1417 | 5.2382 | 5.4945 | 6.366 | 8.3177 | 9.3115 | 9.7218 | 9.9664 | 10.3288 | 11.155 | 14.7445 | 19.3321 |
| u315 | 4.8924 | 5.0238 | 5.1415 | 5.2382 | 5.4945 | 6.366 | 8.3177 | 9.3115 | 9.7218 | 9.9664 | 10.3289 | 11.155 | 14.7445 | 19.3321 |
| u316 | 4.8925 | 5.0233 | 5.1413 | 5.2385 | 5.4945 | 6.366 | 8.3179 | 9.3118 | 9.7217 | 9.9664 | 10.3289 | 11.155 | 14.7445 | 19.3321 |
| u317 | 4.8931 | 5.0234 | 5.1407 | 5.2385 | 5.4945 | 6.366 | 8.318 | 9.3118 | 9.7217 | 9.9663 | 10.3289 | 11.155 | 14.7445 | 19.3321 |
| u318 | 4.8927 | 5.0231 | 5.1404 | 5.2386 | 5.4945 | 6.366 | 8.318 | 9.3119 | 9.7217 | 9.9663 | 10.3289 | 11.1551 | 14.7445 | 19.3321 |
| u319 | 4.8923 | 5.0231 | 5.1399 | 5.2386 | 5.4945 | 6.366 | 8.318 | 9.3119 | 9.7216 | 9.9663 | 10.3289 | 11.1551 | 14.7445 | 19.3321 |
| u320 | 5.4522 | 5.655 | 5.823 | 6.0226 | 6.5884 | 7.9504 | 10.4205 | 11.5403 | 11.8939 | 11.9725 | 12.1362 | 12.8491 | 16.7622 | 21.7599 |
| u321 | 5.4529 | 5.6549 | 5.823 | 6.0227 | 6.5884 | 7.9502 | 10.4205 | 11.5403 | 11.8938 | 11.9725 | 12.1362 | 12.8491 | 16.7622 | 21.7599 |
| u322 | 5.4535 | 5.6556 | 5.8229 | 6.0227 | 6.5886 | 7.9501 | 10.4202 | 11.5402 | 11.8938 | 11.9724 | 12.1362 | 12.8491 | 16.7622 | 21.7599 |
| u323 | 5.4528 | 5.6555 | 5.8232 | 6.0229 | 6.5886 | 7.9501 | 10.4202 | 11.5402 | 11.8936 | 11.9724 | 12.1362 | 12.8491 | 16.7622 | 21.7599 |
| u324 | 5.4511 | 5.6558 | 5.8233 | 6.0223 | 6.5894 | 7.9505 | 10.4211 | 11.5407 | 11.8935 | 11.9723 | 12.1362 | 12.849 | 16.7623 | 21.7599 |
| u325 | 5.4517 | 5.6557 | 5.8233 | 6.0224 | 6.5894 | 7.9504 | 10.421 | 11.5407 | 11.8934 | 11.9723 | 12.1362 | 12.849 | 16.7623 | 21.7598 |

| | | | | | | | | | | | | | |
|---|---|---|---|---|---|---|---|---|---|---|---|---|---|
| u326 | 5.451 | 5.6549 | 5.8236 | 6.0226 | 6.5893 | 7.9504 | 10.4212 | 11.5407 | 11.8933 | 11.9722 | 12.1362 | 12.849 | 16.7623 | 21.7598 |
| u327 | 5.4502 | 5.6548 | 5.8238 | 6.0227 | 6.5894 | 7.9504 | 10.4211 | 11.5406 | 11.8932 | 11.9722 | 12.1362 | 12.849 | 16.7623 | 21.7598 |
| u328 | 5.441 | 5.6569 | 5.8287 | 6.0219 | 6.5857 | 7.9425 | 10.4139 | 11.5402 | 11.8933 | 11.9721 | 12.1366 | 12.8485 | 16.7627 | 21.7594 |
| u329 | 5.4417 | 5.6568 | 5.8287 | 6.022 | 6.5857 | 7.9423 | 10.4139 | 11.5402 | 11.8932 | 11.9721 | 12.1366 | 12.8485 | 16.7627 | 21.7594 |
| u330 | 5.4423 | 5.6574 | 5.8286 | 6.022 | 6.586 | 7.9422 | 10.4136 | 11.5402 | 11.8932 | 11.972 | 12.1366 | 12.8485 | 16.7627 | 21.7594 |
| u331 | 5.4416 | 5.6573 | 5.8288 | 6.0221 | 6.586 | 7.9422 | 10.4135 | 11.5402 | 11.8931 | 11.972 | 12.1366 | 12.8486 | 16.7627 | 21.7594 |
| u332 | 5.4431 | 5.6569 | 5.8288 | 6.0227 | 6.5852 | 7.9416 | 10.4125 | 11.5396 | 11.893 | 11.9719 | 12.1366 | 12.8486 | 16.7627 | 21.7594 |
| u333 | 5.4438 | 5.6568 | 5.8288 | 6.0227 | 6.5852 | 7.9415 | 10.4125 | 11.5396 | 11.8929 | 11.9719 | 12.1366 | 12.8486 | 16.7627 | 21.7594 |
| u334 | 5.443 | 5.656 | 5.829 | 6.0229 | 6.5852 | 7.9415 | 10.4126 | 11.5395 | 11.8928 | 11.9718 | 12.1366 | 12.8486 | 16.7627 | 21.7594 |
| u335 | 5.4423 | 5.6559 | 5.8292 | 6.0229 | 6.5852 | 7.9415 | 10.4125 | 11.5395 | 11.8927 | 11.9718 | 12.1366 | 12.8487 | 16.7627 | 21.7594 |
| u336 | 5.4221 | 5.6428 | 5.8331 | 6.0501 | 6.621 | 7.9779 | 10.4472 | 11.5511 | 11.8863 | 11.9624 | 12.138 | 12.8764 | 16.844 | 21.9877 |
| u337 | 5.4228 | 5.6427 | 5.8331 | 6.0501 | 6.621 | 7.9777 | 10.4471 | 11.5511 | 11.8863 | 11.9623 | 12.138 | 12.8764 | 16.844 | 21.9877 |
| u338 | 5.4234 | 5.6434 | 5.833 | 6.0501 | 6.6212 | 7.9776 | 10.4467 | 11.5511 | 11.8862 | 11.9623 | 12.138 | 12.8764 | 16.844 | 21.9877 |
| u339 | 5.4227 | 5.6433 | 5.8331 | 6.0501 | 6.6212 | 7.9776 | 10.4466 | 11.5511 | 11.8861 | 11.9623 | 12.138 | 12.8764 | 16.844 | 21.9877 |
| u340 | 5.4211 | 5.6436 | 5.8333 | 6.0496 | 6.622 | 7.9781 | 10.4475 | 11.5517 | 11.886 | 11.9622 | 12.138 | 12.8764 | 16.844 | 21.9877 |
| u341 | 5.4218 | 5.6435 | 5.8332 | 6.0496 | 6.622 | 7.9779 | 10.4474 | 11.5517 | 11.886 | 11.9622 | 12.138 | 12.8764 | 16.844 | 21.9877 |
| u342 | 5.4211 | 5.6427 | 5.8334 | 6.0497 | 6.622 | 7.9779 | 10.4475 | 11.5517 | 11.8859 | 11.9622 | 12.138 | 12.8764 | 16.8441 | 21.9877 |
| u343 | 5.4204 | 5.6426 | 5.8336 | 6.0497 | 6.622 | 7.9779 | 10.4474 | 11.5517 | 11.8859 | 11.9622 | 12.138 | 12.8764 | 16.8441 | 21.9877 |
| u344 | 5.4295 | 5.6404 | 5.8288 | 6.0506 | 6.6258 | 7.9861 | 10.4549 | 11.552 | 11.8857 | 11.9621 | 12.1376 | 12.8769 | 16.8436 | 21.9882 |
| u345 | 5.4301 | 5.6403 | 5.8287 | 6.0506 | 6.6259 | 7.9859 | 10.4547 | 11.5521 | 11.8857 | 11.9621 | 12.1376 | 12.8769 | 16.8436 | 21.9882 |
| u346 | 5.4308 | 5.641 | 5.8286 | 6.0505 | 6.626 | 7.9858 | 10.4544 | 11.5521 | 11.8857 | 11.962 | 12.1376 | 12.877 | 16.8436 | 21.9882 |
| u347 | 5.43 | 5.6409 | 5.8287 | 6.0506 | 6.6261 | 7.9858 | 10.4543 | 11.5521 | 11.8857 | 11.962 | 12.1376 | 12.877 | 16.8436 | 21.9882 |
| u348 | 5.4316 | 5.6405 | 5.8287 | 6.0512 | 6.6253 | 7.9852 | 10.4532 | 11.5516 | 11.8857 | 11.962 | 12.1376 | 12.8771 | 16.8436 | 21.9882 |
| u349 | 5.4323 | 5.6404 | 5.8287 | 6.0512 | 6.6254 | 7.9851 | 10.453 | 11.5516 | 11.8858 | 11.962 | 12.1376 | 12.8771 | 16.8436 | 21.9882 |
| u350 | 5.4315 | 5.6396 | 5.8288 | 6.0513 | 6.6253 | 7.9851 | 10.4531 | 11.5516 | 11.8858 | 11.962 | 12.1376 | 12.8771 | 16.8436 | 21.9882 |
| u351 | 5.4308 | 5.6396 | 5.829 | 6.0513 | 6.6253 | 7.9852 | 10.453 | 11.5517 | 11.8859 | 11.962 | 12.1376 | 12.8771 | 16.8436 | 21.9882 |
| u352 | 5.4226 | 5.7141 | 5.9766 | 6.2585 | 6.8453 | 8.247 | 10.8653 | 12.2363 | 12.83 | 13.2505 | 13.7158 | 14.5735 | 18.8921 | 24.3731 |
| u353 | 5.4233 | 5.714 | 5.9765 | 6.2584 | 6.8453 | 8.2469 | 10.8653 | 12.2361 | 12.8298 | 13.2504 | 13.7158 | 14.5735 | 18.8921 | 24.3731 |
| u354 | 5.424 | 5.7146 | 5.9763 | 6.2583 | 6.8455 | 8.2467 | 10.8649 | 12.2358 | 12.8298 | 13.2504 | 13.7158 | 14.5735 | 18.8921 | 24.3731 |
| u355 | 5.4233 | 5.7145 | 5.9764 | 6.2583 | 6.8455 | 8.2468 | 10.8649 | 12.2355 | 12.8296 | 13.2504 | 13.7158 | 14.5735 | 18.8921 | 24.3731 |
| u356 | 5.4219 | 5.7148 | 5.9765 | 6.2577 | 6.8463 | 8.2473 | 10.8662 | 12.2363 | 12.8296 | 13.2504 | 13.7158 | 14.5737 | 18.8921 | 24.3731 |
| u357 | 5.4226 | 5.7147 | 5.9764 | 6.2576 | 6.8463 | 8.2471 | 10.8661 | 12.2362 | 12.8295 | 13.2504 | 13.7158 | 14.5737 | 18.8921 | 24.3731 |
| u358 | 5.4219 | 5.7138 | 5.9766 | 6.2576 | 6.8463 | 8.2472 | 10.8664 | 12.236 | 12.8294 | 13.2504 | 13.7158 | 14.5737 | 18.8921 | 24.3731 |
| u359 | 5.4213 | 5.7138 | 5.9767 | 6.2576 | 6.8463 | 8.2472 | 10.8664 | 12.2358 | 12.8294 | 13.2504 | 13.7158 | 14.5737 | 18.8921 | 24.3731 |
| u360 | 5.4127 | 5.7155 | 5.981 | 6.2569 | 6.8428 | 8.2384 | 10.8561 | 12.2334 | 12.8307 | 13.2503 | 13.7121 | 14.573 | 18.8912 | 24.3738 |
| u361 | 5.4134 | 5.7153 | 5.9809 | 6.2568 | 6.8428 | 8.2382 | 10.8561 | 12.2334 | 12.8306 | 13.2503 | 13.7121 | 14.573 | 18.8912 | 24.3738 |
| u362 | 5.4141 | 5.716 | 5.9807 | 6.2567 | 6.843 | 8.2381 | 10.8557 | 12.2333 | 12.8307 | 13.2503 | 13.7121 | 14.573 | 18.8912 | 24.3738 |
| u363 | 5.4134 | 5.7159 | 5.9808 | 6.2567 | 6.8432 | 8.2381 | 10.8557 | 12.2332 | 12.8307 | 13.2503 | 13.7121 | 14.573 | 18.8912 | 24.3738 |
| u364 | 5.4148 | 5.7154 | 5.9807 | 6.2574 | 6.8426 | 8.2375 | 10.8544 | 12.232 | 12.8307 | 13.2504 | 13.7121 | 14.5729 | 18.8913 | 24.3738 |
| u365 | 5.4155 | 5.7153 | 5.9806 | 6.2573 | 6.8427 | 8.2373 | 10.8544 | 12.2319 | 12.8307 | 13.2504 | 13.7121 | 14.5729 | 18.8913 | 24.3738 |
| u366 | 5.4149 | 5.7145 | 5.9807 | 6.2573 | 6.8427 | 8.2374 | 10.8547 | 12.2318 | 12.8307 | 13.2504 | 13.7121 | 14.573 | 18.8913 | 24.3738 |
| u367 | 5.4142 | 5.7145 | 5.9809 | 6.2573 | 6.8428 | 8.2374 | 10.8547 | 12.2317 | 12.8307 | 13.2504 | 13.7121 | 14.573 | 18.8913 | 24.3738 |
| u368 | 5.4339 | 5.7269 | 5.9776 | 6.2332 | 6.8086 | 8.1961 | 10.8071 | 12.204 | 12.8363 | 13.2873 | 13.7849 | 14.7321 | 19.2161 | 25.071 |
| u369 | 5.4346 | 5.7268 | 5.9775 | 6.2331 | 6.8087 | 8.196 | 10.807 | 12.2039 | 12.8363 | 13.2872 | 13.7849 | 14.7322 | 19.2161 | 25.071 |
| u370 | 5.4352 | 5.7274 | 5.9774 | 6.233 | 6.8089 | 8.1958 | 10.8067 | 12.204 | 12.8364 | 13.2872 | 13.7849 | 14.7322 | 19.2161 | 25.071 |
| u371 | 5.4346 | 5.7273 | 5.9775 | 6.233 | 6.809 | 8.1958 | 10.8067 | 12.2039 | 12.8365 | 13.2872 | 13.7849 | 14.7322 | 19.2161 | 25.071 |
| u372 | 5.4333 | 5.7276 | 5.9776 | 6.2322 | 6.8098 | 8.1963 | 10.808 | 12.205 | 12.8365 | 13.2872 | 13.7849 | 14.7323 | 19.2161 | 25.071 |
| u373 | 5.4339 | 5.7275 | 5.9775 | 6.2321 | 6.8099 | 8.1962 | 10.808 | 12.205 | 12.8366 | 13.2871 | 13.7849 | 14.7323 | 19.2161 | 25.071 |
| u374 | 5.4333 | 5.7267 | 5.9776 | 6.2321 | 6.81 | 8.1962 | 10.8083 | 12.2049 | 12.8366 | 13.2871 | 13.7849 | 14.7324 | 19.2161 | 25.071 |
| u375 | 5.4327 | 5.7267 | 5.9777 | 6.2321 | 6.8101 | 8.1962 | 10.8083 | 12.2048 | 12.8367 | 13.2871 | 13.7849 | 14.7324 | 19.2161 | 25.071 |
| u376 | 5.4413 | 5.7249 | 5.9733 | 6.2327 | 6.8141 | 8.205 | 10.8184 | 12.2067 | 12.8356 | 13.2873 | 13.7884 | 14.7332 | 19.2172 | 25.0699 |
| u377 | 5.442 | 5.7248 | 5.9732 | 6.2326 | 6.8142 | 8.2048 | 10.8184 | 12.2067 | 12.8356 | 13.2873 | 13.7884 | 14.7332 | 19.2172 | 25.0699 |
| u378 | 5.4426 | 5.7254 | 5.973 | 6.2325 | 6.8144 | 8.2046 | 10.8181 | 12.2067 | 12.8357 | 13.2873 | 13.7884 | 14.7332 | 19.2172 | 25.0699 |
| u379 | 5.442 | 5.7254 | 5.9731 | 6.2324 | 6.8146 | 8.2046 | 10.8181 | 12.2066 | 12.8358 | 13.2873 | 13.7884 | 14.7332 | 19.2172 | 25.0699 |
| u380 | 5.4434 | 5.7249 | 5.973 | 6.233 | 6.814 | 8.204 | 10.8168 | 12.2054 | 12.8358 | 13.2873 | 13.7884 | 14.7331 | 19.2173 | 25.0698 |
| u381 | 5.4441 | 5.7248 | 5.9729 | 6.2329 | 6.8141 | 8.2038 | 10.8168 | 12.2054 | 12.8359 | 13.2873 | 13.7884 | 14.7331 | 19.2172 | 25.0698 |
| u382 | 5.4435 | 5.724 | 5.973 | 6.2329 | 6.8142 | 8.2038 | 10.8171 | 12.2052 | 12.8359 | 13.2873 | 13.7884 | 14.7331 | 19.2172 | 25.0698 |
| u383 | 5.4428 | 5.7239 | 5.9731 | 6.2329 | 6.8143 | 8.2038 | 10.8171 | 12.2052 | 12.8359 | 13.2873 | 13.7884 | 14.7331 | 19.2172 | 25.0698 |
| u384 | 7.6157 | 7.8892 | 8.0968 | 8.2661 | 8.7483 | 10.2418 | 13.1951 | 14.5838 | 15.061 | 15.2742 | 15.6046 | 16.4684 | 21.2339 | 27.3892 |
| u385 | 7.6131 | 7.8892 | 8.0979 | 8.2657 | 8.7484 | 10.2419 | 13.1953 | 14.5837 | 15.0607 | 15.2741 | 15.6046 | 16.4684 | 21.234 | 27.3891 |
| u386 | 7.6106 | 7.8893 | 8.0988 | 8.2652 | 8.7484 | 10.2421 | 13.1957 | 14.5836 | 15.0603 | 15.274 | 15.6046 | 16.4684 | 21.2339 | 27.3891 |
| u387 | 7.6135 | 7.8909 | 8.0994 | 8.2643 | 8.7485 | 10.242 | 13.1959 | 14.5835 | 15.06 | 15.2739 | 15.6046 | 16.4685 | 21.2339 | 27.3891 |
| u388 | 7.601 | 7.8862 | 8.1 | 8.2655 | 8.7483 | 10.24 | 13.1937 | 14.5837 | 15.06 | 15.2738 | 15.6046 | 16.4684 | 21.234 | 27.3892 |
| u389 | 7.5985 | 7.8862 | 8.1007 | 8.265 | 8.7483 | 10.2401 | 13.1938 | 14.5835 | 15.0598 | 15.2738 | 15.6046 | 16.4684 | 21.234 | 27.3892 |
| u390 | 7.6012 | 7.8882 | 8.1013 | 8.2646 | 8.7486 | 10.2401 | 13.1936 | 14.5832 | 15.0596 | 15.2737 | 15.6046 | 16.4685 | 21.234 | 27.3893 |
| u391 | 7.604 | 7.8895 | 8.102 | 8.2639 | 8.7487 | 10.2401 | 13.1938 | 14.583 | 15.0592 | 15.2736 | 15.6046 | 16.4685 | 21.234 | 27.3894 |
| u392 | 7.5969 | 7.8758 | 8.0906 | 8.2658 | 8.7592 | 10.2557 | 13.2086 | 14.5839 | 15.0563 | 15.2735 | 15.6118 | 16.4716 | 21.2348 | 27.3865 |
| u393 | 7.5942 | 7.876 | 8.0915 | 8.2658 | 8.7592 | 10.2558 | 13.2088 | 14.5839 | 15.0561 | 15.2734 | 15.6118 | 16.4716 | 21.2348 | 27.3866 |
| u394 | 7.5915 | 7.8767 | 8.0923 | 8.2654 | 8.7592 | 10.2559 | 13.2094 | 14.5838 | 15.0556 | 15.2733 | 15.6118 | 16.4716 | 21.2348 | 27.3868 |
| u395 | 7.5942 | 7.8782 | 8.0928 | 8.2649 | 8.7593 | 10.2559 | 13.2094 | 14.5836 | 15.0554 | 15.2732 | 15.6118 | 16.4716 | 21.2348 | 27.3868 |
| u396 | 7.607 | 7.8834 | 8.0939 | 8.2627 | 8.7597 | 10.2581 | 13.2121 | 14.5831 | 15.0547 | 15.2731 | 15.6118 | 16.4717 | 21.2348 | 27.3868 |
| u397 | 7.6042 | 7.884 | 8.0946 | 8.2626 | 8.7597 | 10.2582 | 13.2123 | 14.583 | 15.0546 | 15.273 | 15.6118 | 16.4717 | 21.2348 | 27.3869 |
| u398 | 7.6068 | 7.8851 | 8.0945 | 8.2622 | 8.7598 | 10.2582 | 13.2122 | 14.5827 | 15.0543 | 15.2729 | 15.6118 | 16.4717 | 21.2348 | 27.387 |
| u399 | 7.6095 | 7.8867 | 8.0947 | 8.2617 | 8.7599 | 10.2581 | 13.2124 | 14.5824 | 15.054 | 15.2728 | 15.6118 | 16.4717 | 21.2348 | 27.387 |
| u400 | 7.6951 | 7.8935 | 8.0575 | 8.2104 | 8.6879 | 10.1734 | 13.1348 | 14.5819 | 15.1434 | 15.4497 | 15.9133 | 16.9996 | 22.1299 | 28.9119 |
| u401 | 7.6917 | 7.8928 | 8.058 | 8.2099 | 8.6878 | 10.1735 | 13.1348 | 14.5817 | 15.1432 | 15.4496 | 15.9133 | 16.9997 | 22.1299 | 28.9119 |
| u402 | 7.6885 | 7.8919 | 8.0585 | 8.2097 | 8.6876 | 10.1736 | 13.135 | 14.5815 | 15.143 | 15.4495 | 15.9132 | 16.9996 | 22.1299 | 28.9119 |
| u403 | 7.692 | 7.8925 | 8.0584 | 8.209 | 8.6877 | 10.1736 | 13.1349 | 14.5812 | 15.1427 | 15.4494 | 15.9133 | 16.9997 | 22.1299 | 28.9119 |
| u404 | 7.6777 | 7.8863 | 8.058 | 8.2108 | 8.6871 | 10.1721 | 13.1331 | 14.5811 | 15.1428 | 15.4493 | 15.9133 | 16.9997 | 22.1299 | 28.9119 |

-continued

|  |  |  |  |  |  |  |  |  |  |  |  |  |  |
|---|---|---|---|---|---|---|---|---|---|---|---|---|---|
| u405 | 7.6744 | 7.8857 | 8.0582 | 8.2106 | 8.687 | 10.1722 | 13.1331 | 14.5809 | 15.1427 | 15.4493 | 15.9133 | 16.9997 | 22.1299 | 28.9119 |
| u406 | 7.6777 | 7.8866 | 8.0577 | 8.2103 | 8.6871 | 10.1722 | 13.1327 | 14.5806 | 15.1426 | 15.4492 | 15.9133 | 16.9998 | 22.13 | 28.9119 |
| u407 | 7.6812 | 7.8873 | 8.0572 | 8.21 | 8.687 | 10.1722 | 13.1327 | 14.5804 | 15.1424 | 15.4491 | 15.9133 | 16.9998 | 22.13 | 28.9119 |
| u408 | 7.6859 | 7.9036 | 8.0684 | 8.205 | 8.6794 | 10.1586 | 13.1192 | 14.5791 | 15.1449 | 15.449 | 15.9039 | 16.993 | 22.1254 | 28.9155 |
| u409 | 7.6826 | 7.903 | 8.0683 | 8.2052 | 8.6793 | 10.1587 | 13.1192 | 14.579 | 15.1448 | 15.4489 | 15.9038 | 16.993 | 22.1254 | 28.9155 |
| u410 | 7.6794 | 7.9021 | 8.0684 | 8.2056 | 8.6791 | 10.1589 | 13.1195 | 14.5789 | 15.1446 | 15.4489 | 15.9038 | 16.993 | 22.1254 | 28.9155 |
| u411 | 7.6828 | 7.9027 | 8.0675 | 8.2056 | 8.679 | 10.1588 | 13.1195 | 14.5787 | 15.1445 | 15.4488 | 15.9039 | 16.993 | 22.1254 | 28.9155 |
| u412 | 7.6967 | 7.9085 | 8.0674 | 8.2038 | 8.6794 | 10.1604 | 13.1211 | 14.5784 | 15.1441 | 15.4487 | 15.9038 | 16.9931 | 22.1253 | 28.9155 |
| u413 | 7.6934 | 7.9078 | 8.0669 | 8.2043 | 8.6793 | 10.1605 | 13.1212 | 14.5784 | 15.1441 | 15.4486 | 15.9038 | 16.9931 | 22.1253 | 28.9155 |
| u414 | 7.6966 | 7.9086 | 8.0655 | 8.2046 | 8.6792 | 10.1605 | 13.121 | 14.5783 | 15.1441 | 15.4486 | 15.9038 | 16.9932 | 22.1254 | 28.9154 |
| u415 | 7.7 | 7.9091 | 8.0644 | 8.2053 | 8.6791 | 10.1606 | 13.1211 | 14.5782 | 15.144 | 15.4485 | 15.9039 | 16.9932 | 22.1254 | 28.9154 |
| u416 | 7.9992 | 8.3496 | 8.583 | 8.7567 | 9.2768 | 10.8982 | 14.213 | 16.1733 | 16.9754 | 17.3302 | 17.7269 | 18.7368 | 24.1412 | 31.225 |
| u417 | 7.9947 | 8.3489 | 8.5838 | 8.7569 | 9.2768 | 10.8984 | 14.2132 | 16.1726 | 16.9754 | 17.3303 | 17.7269 | 18.7368 | 24.1412 | 31.225 |
| u418 | 7.9904 | 8.346 | 8.5849 | 8.7569 | 9.2767 | 10.8985 | 14.2142 | 16.1728 | 16.9759 | 17.3303 | 17.7269 | 18.7368 | 24.1412 | 31.225 |
| u419 | 7.9948 | 8.3467 | 8.5842 | 8.7567 | 9.2768 | 10.8983 | 14.2143 | 16.1727 | 16.9761 | 17.3304 | 17.7269 | 18.7369 | 24.1412 | 31.225 |
| u420 | 7.9819 | 8.3375 | 8.584 | 8.76 | 9.2761 | 10.8935 | 14.2055 | 16.164 | 16.9745 | 17.3305 | 17.7269 | 18.7367 | 24.1414 | 31.2254 |
| u421 | 7.9774 | 8.3368 | 8.5848 | 8.7602 | 9.276 | 10.8937 | 14.2057 | 16.1634 | 16.9744 | 17.3306 | 17.7269 | 18.7367 | 24.1414 | 31.2254 |
| u422 | 7.9817 | 8.3395 | 8.5837 | 8.7603 | 9.2762 | 10.8935 | 14.2049 | 16.1626 | 16.9742 | 17.3307 | 17.7269 | 18.7367 | 24.1414 | 31.2254 |
| u423 | 7.9861 | 8.3402 | 8.583 | 8.7601 | 9.2763 | 10.8933 | 14.2049 | 16.1625 | 16.9744 | 17.3307 | 17.7269 | 18.7367 | 24.1414 | 31.2254 |
| u424 | 7.9932 | 8.325 | 8.5681 | 8.7616 | 9.2986 | 10.9346 | 14.2629 | 16.2138 | 16.9901 | 17.3272 | 17.7115 | 18.7285 | 24.1461 | 31.269 |
| u425 | 7.9885 | 8.3242 | 8.5688 | 8.7618 | 9.2986 | 10.9348 | 14.2632 | 16.2131 | 16.99 | 17.3272 | 17.7115 | 18.7285 | 24.1461 | 31.269 |
| u426 | 7.984 | 8.3215 | 8.5699 | 8.7618 | 9.2985 | 10.9349 | 14.2642 | 16.2134 | 16.9905 | 17.3272 | 17.7115 | 18.7285 | 24.1461 | 31.269 |
| u427 | 7.9886 | 8.3222 | 8.5692 | 8.7616 | 9.2986 | 10.9347 | 14.2643 | 16.2132 | 16.9907 | 17.3272 | 17.7115 | 18.7285 | 24.1461 | 31.269 |
| u428 | 8.002 | 8.3315 | 8.5693 | 8.7583 | 9.2995 | 10.9396 | 14.2735 | 16.2219 | 16.9925 | 17.3272 | 17.7115 | 18.7286 | 24.1459 | 31.2686 |
| u429 | 7.9973 | 8.3308 | 8.57 | 8.7585 | 9.2994 | 10.9398 | 14.2738 | 16.2213 | 16.9924 | 17.3272 | 17.7115 | 18.7286 | 24.1459 | 31.2686 |
| u430 | 8.0017 | 8.3336 | 8.5689 | 8.7585 | 9.2996 | 10.9396 | 14.2729 | 16.2205 | 16.9921 | 17.3273 | 17.7115 | 18.7286 | 24.1459 | 31.2686 |
| u431 | 8.0064 | 8.3343 | 8.5682 | 8.7583 | 9.2997 | 10.9394 | 14.2729 | 16.2205 | 16.9923 | 17.3273 | 17.7115 | 18.7286 | 24.1459 | 31.2686 |
| u432 | 7.8888 | 8.2823 | 8.5983 | 8.8627 | 9.4682 | 11.1866 | 14.6049 | 16.6255 | 17.5658 | 18.0321 | 18.6013 | 19.9416 | 25.8401 | 33.4882 |
| u433 | 7.8849 | 8.2816 | 8.599 | 8.8629 | 9.4681 | 11.1868 | 14.6052 | 16.6251 | 17.5655 | 18.0321 | 18.6013 | 19.9417 | 25.8401 | 33.4883 |
| u434 | 7.8813 | 8.2794 | 8.6 | 8.8628 | 9.4681 | 11.1869 | 14.6061 | 16.6254 | 17.5662 | 18.0321 | 18.6014 | 19.9422 | 25.84 | 33.4883 |
| u435 | 7.885 | 8.2801 | 8.5992 | 8.8626 | 9.4683 | 11.1867 | 14.6061 | 16.6255 | 17.5664 | 18.0321 | 18.6014 | 19.9423 | 25.84 | 33.4883 |
| u436 | 7.872 | 8.2718 | 8.5989 | 8.8656 | 9.4677 | 11.1819 | 14.5975 | 16.6153 | 17.5631 | 18.0321 | 18.6016 | 19.9412 | 25.8373 | 33.4864 |
| u437 | 7.8681 | 8.2711 | 8.5995 | 8.8658 | 9.4676 | 11.182 | 14.5977 | 16.6148 | 17.5627 | 18.0321 | 18.6016 | 19.9412 | 25.8373 | 33.4864 |
| u438 | 7.8718 | 8.2734 | 8.5985 | 8.8658 | 9.4678 | 11.1819 | 14.597 | 16.614 | 17.5618 | 18.0321 | 18.6017 | 19.9408 | 25.8374 | 33.4863 |
| u439 | 7.8756 | 8.2741 | 8.5977 | 8.8656 | 9.4679 | 11.1817 | 14.5969 | 16.6141 | 17.5621 | 18.0321 | 18.6017 | 19.9408 | 25.8374 | 33.4863 |
| u440 | 7.8739 | 8.289 | 8.6122 | 8.8651 | 9.4468 | 11.1422 | 14.5388 | 16.5547 | 17.5293 | 18.0283 | 18.6346 | 20.0017 | 25.9573 | 33.7444 |
| u441 | 7.8702 | 8.2884 | 8.6129 | 8.8652 | 9.4467 | 11.1424 | 14.5391 | 16.5541 | 17.529 | 18.0283 | 18.6347 | 20.0017 | 25.9573 | 33.7444 |
| u442 | 7.8666 | 8.2862 | 8.6138 | 8.8652 | 9.4467 | 11.1425 | 14.5401 | 16.5545 | 17.5297 | 18.0283 | 18.6347 | 20.0022 | 25.9572 | 33.7444 |
| u443 | 7.8702 | 8.2869 | 8.6131 | 8.865 | 9.4468 | 11.1423 | 14.5401 | 16.5545 | 17.53 | 18.0283 | 18.6347 | 20.0022 | 25.9572 | 33.7444 |
| u444 | 7.8827 | 8.2953 | 8.6133 | 8.8619 | 9.4476 | 11.1472 | 14.5492 | 16.5644 | 17.5331 | 18.0285 | 18.6346 | 20.0033 | 25.9598 | 33.7466 |
| u445 | 7.8789 | 8.2947 | 8.614 | 8.8621 | 9.4475 | 11.1474 | 14.5494 | 16.5638 | 17.5327 | 18.0285 | 18.6347 | 20.0033 | 25.9598 | 33.7466 |
| u446 | 7.8824 | 8.297 | 8.6129 | 8.862 | 9.4477 | 11.1473 | 14.5486 | 16.563 | 17.5319 | 18.0285 | 18.6347 | 20.0029 | 25.9599 | 33.7465 |
| u447 | 7.886 | 8.2978 | 8.6121 | 8.8618 | 9.4478 | 11.1471 | 14.5486 | 16.563 | 17.5321 | 18.0285 | 18.6347 | 20.0029 | 25.9599 | 33.7465 |
| u448 | 9.3903 | 10.0254 | 10.4615 | 10.7616 | 11.3859 | 13.2367 | 16.9686 | 18.9467 | 19.728 | 20.0598 | 20.4908 | 21.7234 | 27.9423 | 36.0572 |
| u449 | 9.3802 | 10.0305 | 10.462 | 10.7608 | 11.3859 | 13.2367 | 16.9685 | 18.9473 | 19.7281 | 20.0598 | 20.4908 | 21.7235 | 27.9423 | 36.0572 |
| u450 | 9.3702 | 10.0166 | 10.4577 | 10.7616 | 11.3868 | 13.2369 | 16.9665 | 18.945 | 19.7276 | 20.0601 | 20.4909 | 21.723 | 27.9425 | 36.0572 |
| u451 | 9.3804 | 10.0115 | 10.4575 | 10.7624 | 11.3866 | 13.2375 | 16.967 | 18.9445 | 19.7273 | 20.0599 | 20.4909 | 21.7229 | 27.9426 | 36.0572 |
| u452 | 9.4278 | 10.0115 | 10.4449 | 10.7568 | 11.3893 | 13.2474 | 16.9842 | 18.9617 | 19.7302 | 20.0565 | 20.4905 | 21.727 | 27.9492 | 36.0608 |
| u453 | 9.417 | 10.0166 | 10.4455 | 10.756 | 11.3891 | 13.2475 | 16.9842 | 18.9623 | 19.7302 | 20.0565 | 20.4905 | 21.7271 | 27.9492 | 36.0608 |
| u454 | 9.4276 | 10.031 | 10.4501 | 10.7552 | 11.3878 | 13.2479 | 16.9867 | 18.9648 | 19.7304 | 20.0562 | 20.4904 | 21.7276 | 27.949 | 36.0608 |
| u455 | 9.4382 | 10.0257 | 10.4498 | 10.756 | 11.3876 | 13.2485 | 16.987 | 18.9642 | 19.7302 | 20.0561 | 20.4904 | 21.7275 | 27.949 | 36.0608 |
| u456 | 9.668 | 10.1259 | 10.468 | 10.7265 | 11.3391 | 13.1711 | 16.8829 | 18.8675 | 19.7109 | 20.1177 | 20.6312 | 21.9635 | 28.3882 | 36.8749 |
| u457 | 9.6584 | 10.1324 | 10.4684 | 10.7261 | 11.3385 | 13.1715 | 16.8833 | 18.8679 | 19.7109 | 20.1177 | 20.6312 | 21.9636 | 28.3881 | 36.8749 |
| u458 | 9.6485 | 10.1156 | 10.4638 | 10.7271 | 11.339 | 13.172 | 16.8822 | 18.8664 | 19.7106 | 20.1179 | 20.6313 | 21.963 | 28.3885 | 36.875 |
| u459 | 9.6582 | 10.1092 | 10.4633 | 10.7282 | 11.3384 | 13.173 | 16.883 | 18.866 | 19.7104 | 20.1178 | 20.6313 | 21.9629 | 28.3886 | 36.875 |
| u460 | 9.5807 | 10.1061 | 10.4768 | 10.7342 | 11.335 | 13.1655 | 16.8698 | 18.8524 | 19.708 | 20.1209 | 20.6318 | 21.9579 | 28.3779 | 36.8651 |
| u461 | 9.5707 | 10.1122 | 10.4772 | 10.7336 | 11.3345 | 13.1661 | 16.8703 | 18.8529 | 19.7081 | 20.1209 | 20.6318 | 21.958 | 28.3778 | 36.8651 |
| u462 | 9.5805 | 10.1281 | 10.4819 | 10.733 | 11.3329 | 13.1668 | 16.873 | 18.8545 | 19.7083 | 20.1206 | 20.6317 | 21.9586 | 28.3775 | 36.8649 |
| u463 | 9.5902 | 10.1216 | 10.4814 | 10.7339 | 11.3322 | 13.168 | 16.8739 | 18.8541 | 19.7082 | 20.1205 | 20.6317 | 21.9585 | 28.3775 | 36.865 |
| u464 | 9.7813 | 10.4415 | 10.9134 | 11.2123 | 11.8316 | 13.7429 | 17.6252 | 19.8216 | 21.0546 | 21.672 | 22.2724 | 23.6509 | 30.3875 | 39.2125 |
| u465 | 9.7761 | 10.4496 | 10.9122 | 11.2109 | 11.8318 | 13.7426 | 17.6246 | 19.8237 | 21.057 | 21.6716 | 22.2723 | 23.6508 | 30.3876 | 39.2125 |
| u466 | 9.7707 | 10.4362 | 10.9041 | 11.2114 | 11.8337 | 13.7423 | 17.6201 | 19.817 | 21.0495 | 21.67 | 22.2722 | 23.651 | 30.3871 | 39.2122 |
| u467 | 9.776 | 10.4281 | 10.9052 | 11.2128 | 11.8335 | 13.7426 | 17.6204 | 19.8155 | 21.0474 | 21.6703 | 22.2722 | 23.651 | 30.3871 | 39.2123 |
| u468 | 9.846 | 10.4447 | 10.8914 | 11.2015 | 11.8359 | 13.766 | 17.6629 | 19.8697 | 21.0912 | 21.6872 | 22.2696 | 23.6375 | 30.37 | 39.2078 |
| u469 | 9.8415 | 10.4532 | 10.8903 | 11.2001 | 11.8361 | 13.7657 | 17.6623 | 19.8718 | 21.0937 | 21.6868 | 22.2696 | 23.6375 | 30.37 | 39.2072 |
| u470 | 9.8462 | 10.4671 | 10.8985 | 11.1995 | 11.8342 | 13.766 | 17.6669 | 19.8793 | 21.1019 | 21.6885 | 22.2697 | 23.6373 | 30.3705 | 39.2078 |
| u471 | 9.8505 | 10.4585 | 10.8996 | 11.2008 | 11.834 | 13.7662 | 17.6672 | 19.8775 | 21.0997 | 21.6889 | 22.2697 | 23.6373 | 30.3704 | 39.207 |
| u472 | 9.6598 | 10.3287 | 10.8334 | 11.221 | 11.9324 | 13.9301 | 17.9282 | 20.2204 | 21.4933 | 22.2189 | 22.9028 | 24.4057 | 31.5443 | 40.9902 |
| u473 | 9.6531 | 10.3358 | 10.8329 | 11.2198 | 11.9325 | 13.9299 | 17.9277 | 20.2225 | 21.4959 | 22.2181 | 22.9028 | 24.4055 | 31.5445 | 40.9903 |
| u474 | 9.6464 | 10.3226 | 10.8262 | 11.2202 | 11.9343 | 13.9296 | 17.9231 | 20.2152 | 21.4867 | 22.2148 | 22.9024 | 24.406 | 31.5427 | 40.9875 |
| u475 | 9.6531 | 10.3157 | 10.8271 | 11.2216 | 11.9342 | 13.9297 | 17.9235 | 20.2135 | 21.4843 | 22.2156 | 22.9024 | 24.4063 | 31.5424 | 40.9874 |
| u476 | 9.5996 | 10.3062 | 10.8402 | 11.2326 | 11.9325 | 13.9069 | 17.8804 | 20.1573 | 21.4318 | 22.1825 | 22.8968 | 24.4339 | 31.6103 | 41.1176 |
| u477 | 9.5927 | 10.313 | 10.8398 | 11.2314 | 11.9326 | 13.9067 | 17.8799 | 20.1595 | 21.4345 | 22.1818 | 22.8967 | 24.4338 | 31.6105 | 41.1177 |
| u478 | 9.5994 | 10.326 | 10.847 | 11.2311 | 11.9308 | 13.907 | 17.8845 | 20.1671 | 21.4438 | 22.185 | 22.8972 | 24.4334 | 31.6123 | 41.1205 |
| u479 | 9.606 | 10.3194 | 10.848 | 11.2325 | 11.9306 | 13.9072 | 17.885 | 20.1652 | 21.4414 | 22.1857 | 22.8972 | 24.4337 | 31.6121 | 41.1204 |
| u480 | 10.5293 | 11.5321 | 12.3265 | 12.8887 | 13.713 | 15.9197 | 20.2972 | 22.5977 | 23.6622 | 24.1825 | 24.7475 | 26.2024 | 33.6263 | 43.4137 |
| u481 | 10.5494 | 11.5498 | 12.309 | 12.8916 | 13.7122 | 15.9222 | 20.2979 | 22.5949 | 23.6594 | 24.1831 | 24.7477 | 26.2021 | 33.6263 | 43.4139 |
| u482 | 10.5701 | 11.5788 | 12.3012 | 12.878 | 13.7084 | 15.9216 | 20.3089 | 22.6126 | 23.676 | 24.185 | 24.7448 | 26.2029 | 33.6314 | 43.4219 |
| u483 | 10.5479 | 11.5599 | 12.3189 | 12.8753 | 13.7108 | 15.9169 | 20.3069 | 22.6162 | 23.68 | 24.1848 | 24.7446 | 26.2031 | 33.6315 | 43.4216 |

| | | | | | | | | | | | | | |
|---|---|---|---|---|---|---|---|---|---|---|---|---|---|
| u484 | 10.8328 | 11.7505 | 12.3954 | 12.8806 | 13.6742 | 15.8575 | 20.2201 | 22.5162 | 23.5944 | 24.1677 | 24.8037 | 26.3324 | 33.878 | 43.8932 |
| u485 | 10.8843 | 11.7698 | 12.3746 | 12.8835 | 13.674 | 15.8597 | 20.2206 | 22.5138 | 23.5918 | 24.1681 | 24.8039 | 26.3322 | 33.8779 | 43.8936 |
| u486 | 10.8355 | 11.7236 | 12.3813 | 12.8978 | 13.6805 | 15.8577 | 20.2101 | 22.5002 | 23.5792 | 24.1667 | 24.8065 | 26.3315 | 33.8718 | 43.8812 |
| u487 | 10.7915 | 11.7051 | 12.4015 | 12.8945 | 13.6829 | 15.853 | 20.2084 | 22.5029 | 23.5819 | 24.1665 | 24.8063 | 26.3317 | 33.8719 | 43.8808 |
| u488 | 11.0371 | 11.9775 | 12.7749 | 13.3197 | 14.1469 | 16.3748 | 20.8507 | 23.2533 | 24.4891 | 25.3809 | 26.2068 | 27.8614 | 35.7911 | 46.1944 |
| u489 | 11.0802 | 11.9879 | 12.752 | 13.3267 | 14.1455 | 16.3792 | 20.8533 | 23.2452 | 24.4772 | 25.3889 | 26.2056 | 27.862 | 35.7909 | 46.1931 |
| u490 | 11.1255 | 12.0414 | 12.7587 | 13.3074 | 14.131 | 16.3805 | 20.8768 | 23.2875 | 24.5314 | 25.4267 | 26.2191 | 27.8557 | 35.7736 | 46.172 |
| u491 | 11.0778 | 12.0319 | 12.7822 | 13.2995 | 14.1319 | 16.3765 | 20.8742 | 23.2945 | 24.5401 | 25.4181 | 26.2203 | 27.8551 | 35.7739 | 46.1723 |
| u492 | 10.8673 | 11.8535 | 12.6659 | 13.2546 | 14.168 | 16.4852 | 21.0633 | 23.5535 | 24.8674 | 25.823 | 26.7363 | 28.4643 | 36.6344 | 47.4871 |
| u493 | 10.903 | 11.8663 | 12.6452 | 13.2603 | 14.1669 | 16.4886 | 21.0657 | 23.5452 | 24.8566 | 25.8333 | 26.7335 | 28.4656 | 36.6338 | 47.4834 |
| u494 | 10.8692 | 11.8278 | 12.6422 | 13.2766 | 14.1798 | 16.4874 | 21.043 | 23.5001 | 24.7968 | 25.7847 | 26.7038 | 28.4691 | 36.67 | 47.5638 |
| u495 | 10.8367 | 11.8153 | 12.6617 | 13.2701 | 14.1804 | 16.4844 | 21.0405 | 23.5072 | 24.8061 | 25.7744 | 26.7064 | 28.4679 | 36.6706 | 47.5672 |
| u496 | 11.8239 | 12.8576 | 13.8086 | 14.6307 | 15.7481 | 18.3463 | 23.3557 | 25.9188 | 27.0951 | 27.8138 | 28.5254 | 30.217 | 38.713 | 49.9067 |
| u497 | 12.0171 | 12.8192 | 13.8004 | 14.651 | 15.7622 | 18.3004 | 23.3462 | 25.9326 | 27.1143 | 27.7984 | 28.5253 | 30.2149 | 38.7151 | 49.9162 |
| u498 | 12.2365 | 13.0763 | 13.951 | 14.7126 | 15.755 | 18.2994 | 23.2754 | 25.8447 | 27.0154 | 27.7328 | 28.5259 | 30.2878 | 38.872 | 50.2069 |
| u499 | 12.0098 | 13.1597 | 13.9482 | 14.6903 | 15.7395 | 18.3439 | 23.2823 | 25.8325 | 27.0001 | 27.7449 | 28.526 | 30.2897 | 38.87 | 50.1955 |
| u500 | 12.1968 | 13.3695 | 14.2386 | 15.0738 | 16.1671 | 18.8425 | 23.8852 | 26.4761 | 27.6998 | 28.6863 | 29.689 | 31.6436 | 40.636 | 52.4252 |
| u501 | 12.3468 | 13.2903 | 14.2676 | 15.088 | 16.1918 | 18.7889 | 23.8709 | 26.5045 | 27.7455 | 28.6252 | 29.73 | 31.6494 | 40.6256 | 52.3992 |
| u502 | 12.2013 | 13.0901 | 14.103 | 14.9826 | 16.1646 | 18.7967 | 23.9968 | 26.7002 | 28.0117 | 28.9455 | 30.1458 | 32.1779 | 41.3479 | 53.4106 |
| u503 | 12.0581 | 13.1464 | 14.0889 | 14.9677 | 16.1423 | 18.8511 | 24.0099 | 26.6724 | 27.9631 | 29.01 | 30.0882 | 32.1584 | 41.3581 | 53.4713 |
| u504 | 13.0311 | 14.3307 | 15.1163 | 16.1848 | 17.5277 | 20.5267 | 26.0876 | 29.0203 | 30.2695 | 30.9567 | 31.9554 | 33.8821 | 43.3738 | 55.8351 |
| u505 | 13.2815 | 14.0054 | 15.4341 | 16.0697 | 17.5035 | 20.9932 | 26.1523 | 28.9434 | 30.1784 | 31.0569 | 31.8917 | 33.9076 | 43.4758 | 56.0539 |
| u506 | 13.4418 | 14.2862 | 15.6514 | 16.4063 | 17.8698 | 20.9864 | 26.7636 | 29.5491 | 30.815 | 31.9622 | 32.7896 | 35.0835 | 45.0627 | 58.124 |
| u507 | 13.2822 | 14.5312 | 15.3834 | 16.5712 | 17.958 | 20.495 | 26.6703 | 29.6969 | 31.0385 | 31.6535 | 33.2127 | 35.5653 | 45.7212 | 59.0465 |
| u508 | 14.81 | 15.5334 | 16.2285 | 17.8021 | 19.4525 | 24.4282 | 29.2933 | 31.889 | 33.2296 | 34.744 | 34.9964 | 37.2469 | 47.7221 | 61.4686 |
| u509 | 14.4033 | 15.2596 | 16.6696 | 17.3616 | 18.9673 | 22.9367 | 28.6883 | 32.5102 | 33.8775 | 34.01 | 35.9677 | 38.4817 | 49.4685 | 63.8341 |
| u510 | 14.7719 | 18.3327 | 17.578 | 20.7201 | 22.559 | 22.4317 | 34.1296 | 34.9404 | 36.3669 | 40.1451 | 38.2199 | 40.6564 | 52.0935 | 67.017 |
| u511 | 17.079 | 16.4699 | 19.5451 | 18.8239 | 20.5951 | 26.6216 | 31.3654 | 37.9888 | 39.4116 | 37.1598 | 41.096 | 43.4609 | 55.4767 | 71.0608 |

| SNR | 28 | 29 | 30 | 31 | 32 | 33 | 34 | 35 | 36 | 37 | 38 | 39 | 40 |
|---|---|---|---|---|---|---|---|---|---|---|---|---|---|
| u1 | 0.9999 | 1.0002 | 1 | 1.0004 | 1.0002 | 0.9962 | 0.9994 | 1 | 0.9999 | 1.0027 | 1.0006 | 1 | 0.9965 |
| u2 | 0.9999 | 1.0001 | 1 | 1.0006 | 1.0001 | 1.0063 | 0.9998 | 1.0006 | 0.9993 | 1.0011 | 1.002 | 0.9995 | 0.9977 |
| u3 | 0.9999 | 1.0002 | 1.0001 | 1.0007 | 1.0002 | 0.9994 | 1.0003 | 1.0007 | 0.9997 | 1.0001 | 1.0002 | 1.0017 | 0.9987 |
| u4 | 0.9998 | 1 | 1 | 1.0013 | 1.0001 | 1.004 | 0.9998 | 1.0015 | 0.9995 | 0.9999 | 1.0005 | 0.9981 | 0.995 |
| u5 | 0.9998 | 1 | 1 | 1.001 | 0.9999 | 1.0052 | 0.9999 | 1.0012 | 0.9988 | 1.0018 | 1.0014 | 0.9995 | 0.9961 |
| u6 | 0.9998 | 1.0001 | 1 | 1.0007 | 1 | 1.0079 | 1 | 1.0013 | 1.0007 | 1.0018 | 1.0009 | 0.9975 | 0.9981 |
| u7 | 0.9998 | 1.0001 | 1 | 1.0009 | 1.0002 | 1.002 | 1 | 1.0007 | 1.0002 | 1.0016 | 0.9997 | 0.9987 | 0.9991 |
| u8 | 0.9998 | 1 | 1.0006 | 1.0012 | 1.0016 | 1.0004 | 1.0007 | 1.0002 | 0.999 | 1.002 | 1.002 | 2.646 | 2.9016 |
| u9 | 0.9998 | 1 | 1.0004 | 1.0012 | 1.0013 | 1.0017 | 0.999 | 0.9997 | 0.9979 | 1.0033 | 1.0022 | 2.6453 | 2.8999 |
| u10 | 0.9998 | 0.9998 | 1.0002 | 1.0011 | 1.0009 | 1.0002 | 0.9995 | 1.0001 | 0.9976 | 1.0034 | 1.0025 | 2.6455 | 2.8976 |
| u11 | 0.9998 | 0.9998 | 1.0002 | 1.0014 | 1.0016 | 0.9951 | 0.9996 | 1.0005 | 0.9985 | 1.0028 | 1.0018 | 2.6475 | 2.8991 |
| u12 | 0.9997 | 1.0001 | 1.0004 | 1.0009 | 1.0013 | 1.0051 | 1.0003 | 1.0008 | 0.999 | 1.0021 | 1.0023 | 2.6456 | 2.8919 |
| u13 | 0.9998 | 1 | 1.0003 | 1.0009 | 1.0009 | 1.001 | 1.0006 | 1.0009 | 0.9978 | 1.0025 | 1.0027 | 2.6463 | 2.8972 |
| u14 | 0.9997 | 1 | 1.0003 | 1.0013 | 1.002 | 0.9908 | 1.0003 | 1.0013 | 0.9978 | 1.0023 | 1.0036 | 2.647 | 2.8974 |
| u15 | 0.9997 | 1 | 0.9998 | 1 | 1.001 | 1.0101 | 1.0004 | 1.0007 | 0.9996 | 1.0022 | 1.0026 | 2.6466 | 2.8964 |
| u16 | 0.9999 | 1.0002 | 0.9996 | 1.0054 | 1.0871 | 2.654 | 2.9094 | 2.9823 | 2.9945 | 3.0041 | 3.0025 | 4.6463 | 4.896 |
| u17 | 0.9999 | 1.0001 | 0.9995 | 1.005 | 1.0872 | 2.6616 | 2.9097 | 2.9823 | 2.994 | 3.0033 | 3.0034 | 4.6473 | 4.8924 |
| u18 | 0.9999 | 1.0001 | 0.9996 | 1.0046 | 1.087 | 2.6664 | 2.9106 | 2.9818 | 2.9948 | 3.0049 | 3.0027 | 4.6462 | 4.8954 |
| u19 | 0.9999 | 1 | 0.9995 | 1.005 | 1.0872 | 2.6597 | 2.9099 | 2.9823 | 2.9952 | 3.0044 | 3.0023 | 4.6461 | 4.8977 |
| u20 | 0.9999 | 1.0002 | 0.9999 | 1.0046 | 1.0873 | 2.6639 | 2.909 | 2.9815 | 2.9933 | 3.005 | 3.0024 | 4.6474 | 4.8925 |
| u21 | 0.9999 | 1.0002 | 0.9999 | 1.0041 | 1.0872 | 2.6647 | 2.9107 | 2.9816 | 2.9926 | 3.0056 | 3.0031 | 4.6476 | 4.8916 |
| u22 | 0.9999 | 1.0001 | 0.9997 | 1.0046 | 1.0873 | 2.6619 | 2.9099 | 2.9818 | 2.9924 | 3.0033 | 3.0037 | 4.6476 | 4.8869 |
| u23 | 0.9999 | 1 | 0.9996 | 1.0049 | 1.0872 | 2.6618 | 2.9098 | 2.9817 | 2.9929 | 3.0058 | 3.0029 | 4.6485 | 4.8924 |
| u24 | 0.9998 | 1 | 0.9997 | 1.0041 | 1.0872 | 2.6636 | 2.909 | 2.9822 | 2.9922 | 3.0051 | 3.0076 | 6.2984 | 6.7952 |
| u25 | 0.9998 | 1 | 0.9997 | 1.0037 | 1.0871 | 2.6553 | 2.9099 | 2.9823 | 2.9915 | 3.0046 | 3.0086 | 6.2982 | 6.7971 |
| u26 | 0.9998 | 1.0001 | 0.9998 | 1.0033 | 1.0871 | 2.662 | 2.9096 | 2.9821 | 2.9918 | 3.0064 | 3.0074 | 6.2981 | 6.7921 |
| u27 | 0.9998 | 1.0001 | 0.9998 | 1.0038 | 1.0872 | 2.6565 | 2.9095 | 2.9823 | 2.9927 | 3.0065 | 3.0073 | 6.2985 | 6.7932 |
| u28 | 0.9998 | 0.9998 | 0.9994 | 1.0042 | 1.0871 | 2.6614 | 2.9097 | 2.9819 | 2.9934 | 3.0067 | 3.0071 | 6.3 | 6.7913 |
| u29 | 0.9998 | 0.9999 | 0.9995 | 1.004 | 1.087 | 2.6633 | 2.91 | 2.9821 | 2.9924 | 3.0053 | 3.0078 | 6.2993 | 6.7939 |
| u30 | 0.9997 | 0.9998 | 0.9995 | 1.0044 | 1.0871 | 2.6564 | 2.9099 | 2.9825 | 2.9924 | 3.0047 | 3.0087 | 6.3005 | 6.7926 |
| u31 | 0.9997 | 1 | 0.9995 | 1.0045 | 1.0873 | 2.6567 | 2.9096 | 2.9826 | 2.993 | 3.0062 | 3.008 | 6.301 | 6.7895 |
| u32 | 2.9239 | 2.9848 | 3.0002 | 3.0062 | 3.068 | 4.6634 | 4.9146 | 4.9887 | 4.9939 | 5.0129 | 5.0072 | 8.3014 | 8.7876 |
| u33 | 2.9239 | 2.9849 | 3.0003 | 3.0062 | 3.068 | 4.6688 | 4.9146 | 4.9887 | 4.9942 | 5.0131 | 5.0068 | 8.3012 | 8.7895 |
| u34 | 2.9238 | 2.9849 | 3.0003 | 3.0064 | 3.0679 | 4.667 | 4.9138 | 4.9888 | 4.9929 | 5.0113 | 5.0057 | 8.3007 | 8.7897 |
| u35 | 2.9238 | 2.985 | 3.0004 | 3.0064 | 3.0679 | 4.666 | 4.9137 | 4.9888 | 4.993 | 5.0116 | 5.0067 | 8.301 | 8.7889 |
| u36 | 2.9238 | 2.9847 | 3.0005 | 3.007 | 3.0674 | 4.6696 | 4.9133 | 4.9893 | 4.9942 | 5.0122 | 5.006 | 8.3026 | 8.7859 |
| u37 | 2.9237 | 2.9847 | 3.0006 | 3.007 | 3.0676 | 4.6691 | 4.9132 | 4.9889 | 4.9942 | 5.0111 | 5.0053 | 8.3011 | 8.7885 |
| u38 | 2.9237 | 2.9848 | 3.0005 | 3.007 | 3.0677 | 4.6676 | 4.9137 | 4.9887 | 4.9953 | 5.0127 | 5.006 | 8.3022 | 8.7881 |
| u39 | 2.9237 | 2.9848 | 3.0004 | 3.007 | 3.0677 | 4.6729 | 4.9139 | 4.9888 | 4.9962 | 5.0135 | 5.0066 | 8.3009 | 8.7821 |
| u40 | 2.9237 | 2.9848 | 3.001 | 3.0077 | 3.0673 | 4.665 | 4.9143 | 4.9893 | 4.9961 | 5.015 | 5.0178 | 9.9649 | 10.695 |
| u41 | 2.9237 | 2.9848 | 3.0009 | 3.0076 | 3.0674 | 4.6636 | 4.9136 | 4.9891 | 4.9958 | 5.015 | 5.017 | 9.9655 | 10.6955 |
| u42 | 2.9237 | 2.9846 | 3.0009 | 3.0077 | 3.0672 | 4.663 | 4.9121 | 4.9898 | 4.9944 | 5.0133 | 5.0165 | 9.9648 | 10.6989 |
| u43 | 2.9237 | 2.9846 | 3.0009 | 3.0076 | 3.0669 | 4.661 | 4.9136 | 4.9895 | 4.9947 | 5.0135 | 5.0173 | 9.9645 | 10.6957 |
| u44 | 2.9237 | 2.9849 | 3.0009 | 3.0072 | 3.0674 | 4.6678 | 4.9135 | 4.9891 | 4.9927 | 5.0145 | 5.0183 | 9.9643 | 10.6969 |
| u45 | 2.9237 | 2.9848 | 3.0008 | 3.0072 | 3.0676 | 4.6663 | 4.9134 | 4.9893 | 4.9925 | 5.0142 | 5.0177 | 9.9649 | 10.6976 |
| u46 | 2.9237 | 2.9848 | 3.0006 | 3.0072 | 3.0677 | 4.6669 | 4.914 | 4.9886 | 4.9938 | 5.0153 | 5.0173 | 9.9652 | 10.6953 |
| u47 | 2.9237 | 2.9848 | 3.0005 | 3.0073 | 3.0678 | 4.6686 | 4.9146 | 4.9889 | 4.9939 | 5.0145 | 5.0182 | 9.9655 | 10.6938 |
| u48 | 2.9238 | 2.9849 | 3 | 3.0141 | 3.2071 | 6.3473 | 6.8361 | 6.9805 | 6.9954 | 7.0239 | 7.0072 | 11.9663 | 12.6913 |

-continued

| | | | | | | | | | | | | | |
|---|---|---|---|---|---|---|---|---|---|---|---|---|---|
| u49 | 2.9238 | 2.9849 | 2.9999 | 3.0142 | 3.2071 | 6.3463 | 6.8361 | 6.9804 | 6.9962 | 7.0235 | 7.0089 | 11.9656 | 12.6943 |
| u50 | 2.9238 | 2.9849 | 3 | 3.0141 | 3.2069 | 6.3461 | 6.8366 | 6.9807 | 6.997 | 7.0232 | 7.0097 | 11.9651 | 12.6954 |
| u51 | 2.9238 | 2.9848 | 2.9999 | 3.014 | 3.207 | 6.3474 | 6.8368 | 6.9806 | 6.9974 | 7.0232 | 7.0078 | 11.9662 | 12.6951 |
| u52 | 2.9238 | 2.985 | 3.0005 | 3.0141 | 3.2068 | 6.3506 | 6.8368 | 6.9813 | 6.9952 | 7.0236 | 7.009 | 11.9659 | 12.6936 |
| u53 | 2.9238 | 2.9849 | 3.0005 | 3.0142 | 3.2066 | 6.3499 | 6.8369 | 6.9809 | 6.9956 | 7.0235 | 7.0109 | 11.9662 | 12.6939 |
| u54 | 2.9238 | 2.9848 | 3.0002 | 3.0143 | 3.2069 | 6.3475 | 6.8363 | 6.9801 | 6.9943 | 7.0243 | 7.0096 | 11.966 | 12.6943 |
| u55 | 2.9238 | 2.9848 | 3.0001 | 3.0142 | 3.2069 | 6.3489 | 6.8363 | 6.9804 | 6.9937 | 7.0238 | 7.0077 | 11.9664 | 12.6955 |
| u56 | 2.9237 | 2.9848 | 3.0002 | 3.0132 | 3.207 | 6.3487 | 6.8362 | 6.9804 | 6.9951 | 7.0262 | 7.0351 | 13.6459 | 14.6106 |
| u57 | 2.9237 | 2.9847 | 3.0001 | 3.0133 | 3.2069 | 6.3458 | 6.8364 | 6.9807 | 6.9955 | 7.0261 | 7.0368 | 13.6459 | 14.6137 |
| u58 | 2.9237 | 2.9848 | 3.0003 | 3.0133 | 3.2067 | 6.3474 | 6.8369 | 6.9803 | 6.9965 | 7.0264 | 7.0378 | 13.6469 | 14.6113 |
| u59 | 2.9237 | 2.9848 | 3.0002 | 3.0132 | 3.2067 | 6.3486 | 6.8369 | 6.9802 | 6.9958 | 7.0265 | 7.0362 | 13.6475 | 14.6133 |
| u60 | 2.9237 | 2.9847 | 2.9997 | 3.0132 | 3.207 | 6.3477 | 6.8367 | 6.9808 | 6.9975 | 7.0257 | 7.0346 | 13.6475 | 14.6128 |
| u61 | 2.9237 | 2.9847 | 2.9998 | 3.0132 | 3.207 | 6.3459 | 6.8369 | 6.9805 | 6.9978 | 7.0255 | 7.0364 | 13.6475 | 14.6088 |
| u62 | 2.9236 | 2.9847 | 2.9997 | 3.0133 | 3.2073 | 6.3454 | 6.8362 | 6.9803 | 6.997 | 7.0263 | 7.0351 | 13.6465 | 14.6114 |
| u63 | 2.9236 | 2.9849 | 2.9997 | 3.0133 | 3.2073 | 6.3494 | 6.8361 | 6.9803 | 6.9966 | 7.0264 | 7.0338 | 13.6455 | 14.6147 |
| u64 | 4.9392 | 5.0035 | 5.0185 | 5.0216 | 5.1215 | 8.3544 | 8.8516 | 9.0008 | 9.0116 | 9.0436 | 9.0146 | 15.6489 | 16.6187 |
| u65 | 4.9392 | 5.0036 | 5.0186 | 5.0217 | 5.1215 | 8.353 | 8.8519 | 9.0005 | 9.0117 | 9.0428 | 9.0127 | 15.6496 | 16.619 |
| u66 | 4.9391 | 5.0036 | 5.0187 | 5.022 | 5.1214 | 8.3535 | 8.8521 | 9.0007 | 9.0112 | 9.0433 | 9.0123 | 15.6501 | 16.6178 |
| u67 | 4.9391 | 5.0037 | 5.0187 | 5.022 | 5.1215 | 8.355 | 8.8518 | 9.0006 | 9.0112 | 9.0438 | 9.0136 | 15.6495 | 16.617 |
| u68 | 4.9391 | 5.0035 | 5.0188 | 5.0229 | 5.1212 | 8.3527 | 8.8518 | 9.0009 | 9.0109 | 9.0442 | 9.0123 | 15.6499 | 16.6182 |
| u69 | 4.939 | 5.0034 | 5.0189 | 5.023 | 5.1214 | 8.3515 | 8.852 | 9.0008 | 9.0111 | 9.0433 | 9.011 | 15.6506 | 16.618 |
| u70 | 4.939 | 5.0036 | 5.0188 | 5.0227 | 5.1214 | 8.3524 | 8.852 | 9.001 | 9.0113 | 9.043 | 9.0112 | 15.6505 | 16.6177 |
| u71 | 4.939 | 5.0036 | 5.0188 | 5.0226 | 5.1214 | 8.3544 | 8.8518 | 9.0008 | 9.0119 | 9.0439 | 9.013 | 15.6497 | 16.6189 |
| u72 | 4.939 | 5.0035 | 5.0191 | 5.023 | 5.1218 | 8.351 | 8.8512 | 9.0007 | 9.0126 | 9.0463 | 9.0692 | 17.356 | 18.5503 |
| u73 | 4.939 | 5.0034 | 5.019 | 5.023 | 5.1216 | 8.3495 | 8.8514 | 9.0006 | 9.0126 | 9.045 | 9.0674 | 17.3558 | 18.5498 |
| u74 | 4.939 | 5.0033 | 5.0189 | 5.0231 | 5.1215 | 8.3488 | 8.8514 | 9.0001 | 9.0121 | 9.0449 | 9.066 | 17.3558 | 18.5507 |
| u75 | 4.939 | 5.0033 | 5.0189 | 5.023 | 5.1216 | 8.3498 | 8.8515 | 9.0001 | 9.0118 | 9.0461 | 9.0678 | 17.3561 | 18.5506 |
| u76 | 4.939 | 5.0035 | 5.019 | 5.0222 | 5.1219 | 8.3514 | 8.8515 | 9.0002 | 9.0122 | 9.0457 | 9.069 | 17.3552 | 18.552 |
| u77 | 4.939 | 5.0034 | 5.0189 | 5.0224 | 5.1218 | 8.3506 | 8.8516 | 9.0002 | 9.0127 | 9.0455 | 9.0673 | 17.3552 | 18.5499 |
| u78 | 4.939 | 5.0034 | 5.0189 | 5.0222 | 5.1219 | 8.3512 | 8.8518 | 9.0005 | 9.0126 | 9.0446 | 9.0683 | 17.3554 | 18.5495 |
| u79 | 4.939 | 5.0034 | 5.0188 | 5.0221 | 5.1218 | 8.3522 | 8.8517 | 9.0006 | 9.0126 | 9.0451 | 9.0702 | 17.3551 | 18.551 |
| u80 | 4.9391 | 5.0036 | 5.0188 | 5.0399 | 5.3893 | 10.0796 | 10.7997 | 11.013 | 11.0333 | 11.0714 | 11.0088 | 19.3621 | 20.5659 |
| u81 | 4.9391 | 5.0035 | 5.0186 | 5.0399 | 5.3893 | 10.0793 | 10.7994 | 11.0129 | 11.0336 | 11.0725 | 11.0099 | 19.3611 | 20.569 |
| u82 | 4.9391 | 5.0035 | 5.0187 | 5.04 | 5.3892 | 10.0777 | 10.799 | 11.0132 | 11.0334 | 11.0722 | 11.0101 | 19.362 | 20.5671 |
| u83 | 4.9391 | 5.0035 | 5.0185 | 5.04 | 5.3891 | 10.0781 | 10.7994 | 11.0132 | 11.0338 | 11.071 | 11.0088 | 19.3616 | 20.5658 |
| u84 | 4.9391 | 5.0037 | 5.0191 | 5.0405 | 5.3889 | 10.0769 | 10.7992 | 11.0133 | 11.0337 | 11.0705 | 11.0103 | 19.3621 | 20.5684 |
| u85 | 4.9391 | 5.0037 | 5.0191 | 5.0405 | 5.389 | 10.0761 | 10.799 | 11.0129 | 11.0335 | 11.0713 | 11.0121 | 19.3626 | 20.5689 |
| u86 | 4.9391 | 5.0035 | 5.0189 | 5.0403 | 5.3891 | 10.0774 | 10.7994 | 11.0125 | 11.0331 | 11.0723 | 11.0111 | 19.362 | 20.5698 |
| u87 | 4.9391 | 5.0035 | 5.0187 | 5.0403 | 5.389 | 10.0794 | 10.7999 | 11.0124 | 11.0333 | 11.0711 | 11.0099 | 19.3618 | 20.5689 |
| u88 | 4.9391 | 5.0035 | 5.019 | 5.0399 | 5.3888 | 10.0773 | 10.7999 | 11.0121 | 11.0332 | 11.0726 | 11.1228 | 21.0943 | 22.5193 |
| u89 | 4.9391 | 5.0034 | 5.019 | 5.0399 | 5.3889 | 10.0758 | 10.7996 | 11.0119 | 11.0329 | 11.0735 | 11.1248 | 21.0938 | 22.5205 |
| u90 | 4.939 | 5.0035 | 5.0191 | 5.0401 | 5.3887 | 10.0755 | 10.7992 | 11.0121 | 11.0339 | 11.0733 | 11.1254 | 21.093 | 22.5187 |
| u91 | 4.939 | 5.0035 | 5.0191 | 5.0401 | 5.3885 | 10.0765 | 10.7996 | 11.0122 | 11.034 | 11.0723 | 11.1234 | 21.0938 | 22.5193 |
| u92 | 4.939 | 5.0033 | 5.0186 | 5.0397 | 5.3889 | 10.0767 | 10.7997 | 11.0126 | 11.0333 | 11.0725 | 11.122 | 21.0932 | 22.5201 |
| u93 | 4.939 | 5.0034 | 5.0187 | 5.0398 | 5.3891 | 10.0766 | 10.7994 | 11.0123 | 11.0334 | 11.0736 | 11.1238 | 21.0929 | 22.5203 |
| u94 | 4.939 | 5.0034 | 5.0186 | 5.0397 | 5.3893 | 10.077 | 10.8 | 11.012 | 11.0324 | 11.074 | 11.1233 | 21.0939 | 22.5191 |
| u95 | 4.9389 | 5.0035 | 5.0186 | 5.0397 | 5.3893 | 10.0775 | 10.8003 | 11.0122 | 11.0327 | 11.073 | 11.1213 | 21.0941 | 22.5201 |
| u96 | 6.9113 | 7.0298 | 7.0552 | 7.0479 | 7.1862 | 12.0909 | 12.8344 | 13.0545 | 13.0713 | 13.1105 | 13.0013 | 23.1036 | 24.5502 |
| u97 | 6.9113 | 7.0299 | 7.0553 | 7.0481 | 7.1864 | 12.0927 | 12.8342 | 13.0546 | 13.0716 | 13.1087 | 13.0008 | 23.1015 | 24.5528 |
| u98 | 6.9112 | 7.0299 | 7.0552 | 7.0482 | 7.1866 | 12.0932 | 12.8343 | 13.0554 | 13.071 | 13.1101 | 13.0003 | 23.1019 | 24.5505 |
| u99 | 6.9112 | 7.0299 | 7.0553 | 7.0482 | 7.1864 | 12.0894 | 12.8345 | 13.0553 | 13.071 | 13.1116 | 13.0011 | 23.102 | 24.5497 |
| u100 | 6.9112 | 7.0299 | 7.055 | 7.0489 | 7.1863 | 12.0902 | 12.8344 | 13.0558 | 13.0697 | 13.1117 | 13.0004 | 23.1024 | 24.5468 |
| u101 | 6.9111 | 7.0298 | 7.0551 | 7.049 | 7.1862 | 12.0943 | 12.8342 | 13.0557 | 13.0702 | 13.1107 | 12.999 | 23.1039 | 24.5479 |
| u102 | 6.9111 | 7.0299 | 7.0551 | 7.0489 | 7.1862 | 12.093 | 12.8343 | 13.0548 | 13.0709 | 13.1092 | 12.9991 | 23.1025 | 24.5474 |
| u103 | 6.9111 | 7.0299 | 7.055 | 7.0488 | 7.1861 | 12.0908 | 12.8345 | 13.0548 | 13.0707 | 13.1102 | 13.0007 | 23.1024 | 24.5476 |
| u104 | 6.9111 | 7.0299 | 7.055 | 7.0484 | 7.1864 | 12.0916 | 12.8346 | 13.0549 | 13.0702 | 13.113 | 13.2276 | 24.8639 | 26.5219 |
| u105 | 6.9111 | 7.0299 | 7.0549 | 7.0485 | 7.1864 | 12.0941 | 12.8345 | 13.0548 | 13.0706 | 13.1118 | 13.2264 | 24.8641 | 26.5228 |
| u106 | 6.9111 | 7.0298 | 7.0548 | 7.0485 | 7.1866 | 12.0969 | 12.8345 | 13.0554 | 13.0699 | 13.1127 | 13.2262 | 24.8643 | 26.5243 |
| u107 | 6.9111 | 7.0298 | 7.0548 | 7.0484 | 7.1865 | 12.0929 | 12.8346 | 13.0553 | 13.07 | 13.1141 | 13.2276 | 24.8644 | 26.5231 |
| u108 | 6.9111 | 7.0299 | 7.0551 | 7.0478 | 7.1861 | 12.0912 | 12.8348 | 13.0553 | 13.0701 | 13.1138 | 13.2285 | 24.8647 | 26.5242 |
| u109 | 6.9111 | 7.0298 | 7.055 | 7.0479 | 7.1862 | 12.0942 | 12.8348 | 13.0551 | 13.0703 | 13.1123 | 13.227 | 24.8651 | 26.523 |
| u110 | 6.9111 | 7.0298 | 7.055 | 7.0478 | 7.1862 | 12.0938 | 12.8348 | 13.0543 | 13.0708 | 13.1115 | 13.227 | 24.8656 | 26.5212 |
| u111 | 6.9111 | 7.0298 | 7.0549 | 7.0478 | 7.1863 | 12.0929 | 12.835 | 13.0544 | 13.0704 | 13.113 | 13.2285 | 24.8655 | 26.5224 |
| u112 | 6.9112 | 7.03 | 7.0576 | 7.0944 | 7.6944 | 13.8805 | 14.8199 | 15.0987 | 15.1206 | 15.1609 | 14.9983 | 26.8806 | 28.5681 |
| u113 | 6.9112 | 7.03 | 7.0575 | 7.0944 | 7.6944 | 13.8811 | 14.8199 | 15.0987 | 15.1198 | 15.1619 | 14.9981 | 26.8783 | 28.5676 |
| u114 | 6.9112 | 7.03 | 7.0575 | 7.0944 | 7.6944 | 13.8808 | 14.8197 | 15.0984 | 15.1196 | 15.1607 | 14.9975 | 26.8798 | 28.5667 |
| u115 | 6.9112 | 7.0299 | 7.0574 | 7.0944 | 7.6944 | 13.8799 | 14.8199 | 15.0983 | 15.1203 | 15.16 | 14.9978 | 26.8794 | 28.5683 |
| u116 | 6.9112 | 7.0301 | 7.0577 | 7.0946 | 7.6946 | 13.8811 | 14.82 | 15.0988 | 15.1209 | 15.1605 | 14.9981 | 26.8791 | 28.5709 |
| u117 | 6.9112 | 7.0301 | 7.0578 | 7.0947 | 7.6945 | 13.8822 | 14.8199 | 15.0987 | 15.1203 | 15.1609 | 14.9977 | 26.8807 | 28.5674 |
| u118 | 6.9112 | 7.03 | 7.0576 | 7.0948 | 7.6945 | 13.8816 | 14.8201 | 15.0988 | 15.1202 | 15.1616 | 14.9983 | 26.8812 | 28.5671 |
| u119 | 6.9112 | 7.0299 | 7.0575 | 7.0948 | 7.6945 | 13.8817 | 14.8202 | 15.0987 | 15.1209 | 15.1605 | 14.9983 | 26.8798 | 28.5695 |
| u120 | 6.9112 | 7.0299 | 7.0581 | 7.0949 | 7.6944 | 13.8823 | 14.8195 | 15.0986 | 15.1191 | 15.1648 | 15.4231 | 28.6774 | 30.5629 |
| u121 | 6.9111 | 7.0299 | 7.058 | 7.0949 | 7.6944 | 13.8825 | 14.8194 | 15.0984 | 15.1187 | 15.1657 | 15.4227 | 28.6771 | 30.5642 |
| u122 | 6.9111 | 7.0299 | 7.0581 | 7.0949 | 7.6944 | 13.8824 | 14.8193 | 15.0984 | 15.1187 | 15.165 | 15.4224 | 28.6768 | 30.5635 |
| u123 | 6.9111 | 7.0299 | 7.0581 | 7.0949 | 7.6945 | 13.8819 | 14.8194 | 15.0982 | 15.1192 | 15.1642 | 15.4227 | 28.6773 | 30.5616 |
| u124 | 6.9111 | 7.0298 | 7.0579 | 7.0947 | 7.6943 | 13.8813 | 14.8195 | 15.0983 | 15.1182 | 15.1643 | 15.4228 | 28.6772 | 30.5634 |
| u125 | 6.9111 | 7.0298 | 7.058 | 7.0947 | 7.6943 | 13.8821 | 14.8194 | 15.0982 | 15.1176 | 15.1648 | 15.4221 | 28.6772 | 30.5642 |
| u126 | 6.911 | 7.0298 | 7.0579 | 7.0948 | 7.6943 | 13.8823 | 14.8196 | 15.0984 | 15.1176 | 15.1659 | 15.4225 | 28.678 | 30.5637 |
| u127 | 6.911 | 7.0298 | 7.058 | 7.0948 | 7.6943 | 13.8818 | 14.8197 | 15.0985 | 15.1185 | 15.1655 | 15.4231 | 28.6777 | 30.5635 |

-continued

| | | | | | | | | | | | | | |
|---|---|---|---|---|---|---|---|---|---|---|---|---|---|
| u128 | 8.9793 | 9.1059 | 9.125 | 9.0842 | 9.3531 | 15.9067 | 16.8861 | 17.1756 | 17.1878 | 17.2246 | 17.0601 | 30.6985 | 32.6226 |
| u129 | 8.9792 | 9.106 | 9.125 | 9.0842 | 9.3527 | 15.9072 | 16.8859 | 17.1757 | 17.1882 | 17.225 | 17.061 | 30.6998 | 32.6232 |
| u130 | 8.9791 | 9.1059 | 9.1249 | 9.0843 | 9.3529 | 15.9096 | 16.8855 | 17.175 | 17.1892 | 17.2254 | 17.0616 | 30.6992 | 32.6225 |
| u131 | 8.9791 | 9.106 | 9.125 | 9.0843 | 9.3529 | 15.9091 | 16.8858 | 17.1751 | 17.1888 | 17.2252 | 17.0606 | 30.6995 | 32.6226 |
| u132 | 8.9791 | 9.1059 | 9.1245 | 9.0847 | 9.3531 | 15.909 | 16.8862 | 17.1753 | 17.1891 | 17.2247 | 17.0608 | 30.7001 | 32.6229 |
| u133 | 8.9791 | 9.1059 | 9.1245 | 9.0846 | 9.3531 | 15.9101 | 16.886 | 17.1751 | 17.1894 | 17.2241 | 17.0613 | 30.6988 | 32.6223 |
| u134 | 8.9791 | 9.1059 | 9.1246 | 9.0846 | 9.3531 | 15.9091 | 16.8865 | 17.1756 | 17.1885 | 17.2242 | 17.0604 | 30.7001 | 32.6224 |
| u135 | 8.9791 | 9.1059 | 9.1247 | 9.0847 | 9.353 | 15.9085 | 16.8868 | 17.1755 | 17.1882 | 17.2244 | 17.0595 | 30.7006 | 32.6231 |
| u136 | 8.979 | 9.106 | 9.1244 | 9.084 | 9.3532 | 15.9072 | 16.8856 | 17.1759 | 17.187 | 17.2359 | 17.7564 | 32.5333 | 34.6404 |
| u137 | 8.979 | 9.1059 | 9.1243 | 9.0839 | 9.3532 | 15.9074 | 16.8856 | 17.1758 | 17.1872 | 17.2353 | 17.7572 | 32.5331 | 34.64 |
| u138 | 8.979 | 9.1059 | 9.1241 | 9.0839 | 9.353 | 15.9089 | 16.8851 | 17.1754 | 17.1882 | 17.2359 | 17.7577 | 32.5338 | 34.6395 |
| u139 | 8.979 | 9.1059 | 9.1241 | 9.084 | 9.3529 | 15.9088 | 16.8854 | 17.1754 | 17.1879 | 17.2366 | 17.7568 | 32.5342 | 34.6396 |
| u140 | 8.979 | 9.106 | 9.1247 | 9.0837 | 9.3526 | 15.911 | 16.8851 | 17.1755 | 17.187 | 17.2369 | 17.7565 | 32.534 | 34.6377 |
| u141 | 8.979 | 9.1059 | 9.1246 | 9.0837 | 9.3527 | 15.9109 | 16.8849 | 17.1754 | 17.1873 | 17.2363 | 17.7574 | 32.5344 | 34.6369 |
| u142 | 8.979 | 9.1059 | 9.1247 | 9.0837 | 9.3529 | 15.9089 | 16.8854 | 17.1756 | 17.186 | 17.2365 | 17.7569 | 32.534 | 34.6376 |
| u143 | 8.979 | 9.1059 | 9.1247 | 9.0838 | 9.353 | 15.9083 | 16.8857 | 17.1757 | 17.1859 | 17.237 | 17.7563 | 32.5334 | 34.6389 |
| u144 | 8.9791 | 9.1066 | 9.1359 | 9.2029 | 10.1868 | 17.7697 | 18.922 | 19.262 | 19.2758 | 19.3008 | 19.2717 | 34.5669 | 36.7167 |
| u145 | 8.9791 | 9.1066 | 9.1358 | 9.2028 | 10.1868 | 17.7676 | 18.9225 | 19.2621 | 19.2758 | 19.3004 | 19.2715 | 34.5671 | 36.7188 |
| u146 | 8.9791 | 9.1066 | 9.1358 | 9.2027 | 10.1869 | 17.7681 | 18.923 | 19.2622 | 19.2749 | 19.3009 | 19.2716 | 34.5673 | 36.7192 |
| u147 | 8.9791 | 9.1066 | 9.1357 | 9.2027 | 10.1871 | 17.771 | 18.9223 | 19.2621 | 19.275 | 19.3013 | 19.2713 | 34.5678 | 36.7174 |
| u148 | 8.9791 | 9.1066 | 9.1357 | 9.2026 | 10.1868 | 17.7681 | 18.9226 | 19.2622 | 19.2754 | 19.302 | 19.2713 | 34.5673 | 36.7168 |
| u149 | 8.9791 | 9.1066 | 9.1357 | 9.2025 | 10.1866 | 17.7656 | 18.9234 | 19.262 | 19.2754 | 19.3023 | 19.2718 | 34.5679 | 36.718 |
| u150 | 8.9791 | 9.1065 | 9.1356 | 9.2027 | 10.1866 | 17.7663 | 18.9229 | 19.2617 | 19.276 | 19.3019 | 19.2713 | 34.568 | 36.7178 |
| u151 | 8.9791 | 9.1065 | 9.1356 | 9.203 | 10.1867 | 17.7701 | 18.9224 | 19.2617 | 19.2761 | 19.3018 | 19.2715 | 34.5674 | 36.7169 |
| u152 | 8.9791 | 9.1065 | 9.1362 | 9.2031 | 10.1864 | 17.7688 | 18.9218 | 19.2626 | 19.2753 | 19.3304 | 20.2212 | 36.4421 | 38.7655 |
| u153 | 8.9791 | 9.1064 | 9.1362 | 9.2031 | 10.1862 | 17.7668 | 18.9223 | 19.2624 | 19.2755 | 19.3302 | 20.2209 | 36.4419 | 38.7649 |
| u154 | 8.979 | 9.1065 | 9.1361 | 9.2031 | 10.1863 | 17.7663 | 18.9227 | 19.2626 | 19.2746 | 19.3306 | 20.221 | 36.4414 | 38.7649 |
| u155 | 8.979 | 9.1065 | 9.1362 | 9.2033 | 10.1864 | 17.7685 | 18.9223 | 19.2624 | 19.2745 | 19.3307 | 20.221 | 36.4419 | 38.765 |
| u156 | 8.979 | 9.1064 | 9.1362 | 9.2033 | 10.1867 | 17.7711 | 18.9222 | 19.2629 | 19.2735 | 19.3298 | 20.2217 | 36.4419 | 38.7655 |
| u157 | 8.979 | 9.1064 | 9.1363 | 9.2032 | 10.1865 | 17.7694 | 18.9227 | 19.2627 | 19.2734 | 19.3294 | 20.2215 | 36.4426 | 38.7648 |
| u158 | 8.979 | 9.1064 | 9.1363 | 9.2032 | 10.1865 | 17.7695 | 18.9224 | 19.2624 | 19.2744 | 19.3289 | 20.2213 | 36.4431 | 38.7642 |
| u159 | 8.9789 | 9.1064 | 9.1364 | 9.2033 | 10.1866 | 17.7705 | 18.922 | 19.2625 | 19.2743 | 19.3297 | 20.2214 | 36.4424 | 38.7656 |
| u160 | 11.0503 | 11.2177 | 11.2258 | 11.1265 | 11.7265 | 19.8213 | 21.0313 | 21.386 | 21.3875 | 21.3879 | 21.6506 | 38.4905 | 40.8674 |
| u161 | 11.0502 | 11.2177 | 11.2258 | 11.1264 | 11.7264 | 19.8185 | 21.0315 | 21.3862 | 21.3871 | 21.3893 | 21.6507 | 38.4901 | 40.8704 |
| u162 | 11.0502 | 11.2176 | 11.2257 | 11.1267 | 11.7265 | 19.8168 | 21.0321 | 21.3865 | 21.3868 | 21.3897 | 21.6506 | 38.4899 | 40.8706 |
| u163 | 11.0502 | 11.2176 | 11.2257 | 11.1268 | 11.7266 | 19.8191 | 21.0321 | 21.3862 | 21.3871 | 21.3883 | 21.6508 | 38.4905 | 40.8687 |
| u164 | 11.0502 | 11.2177 | 11.2251 | 11.1268 | 11.7263 | 19.818 | 21.0319 | 21.3866 | 21.3866 | 21.3876 | 21.65 | 38.49 | 40.8685 |
| u165 | 11.0501 | 11.2176 | 11.2251 | 11.1266 | 11.7264 | 19.8161 | 21.032 | 21.3866 | 21.3864 | 21.389 | 21.6512 | 38.4899 | 40.8697 |
| u166 | 11.0501 | 11.2176 | 11.2252 | 11.1266 | 11.7262 | 19.8174 | 21.0314 | 21.3861 | 21.3865 | 21.3887 | 21.6515 | 38.4902 | 40.869 |
| u167 | 11.0501 | 11.2176 | 11.2252 | 11.1266 | 11.7262 | 19.8198 | 21.0313 | 21.3858 | 21.3865 | 21.3875 | 21.6511 | 38.4905 | 40.8671 |
| u168 | 11.0501 | 11.2178 | 11.2253 | 11.1265 | 11.7265 | 19.8205 | 21.0309 | 21.3862 | 21.3878 | 21.454 | 22.7587 | 40.4081 | 42.9529 |
| u169 | 11.0501 | 11.2178 | 11.2252 | 11.1262 | 11.7263 | 19.8195 | 21.031 | 21.3863 | 21.3877 | 21.4553 | 22.7586 | 40.4079 | 42.9502 |
| u170 | 11.0501 | 11.2177 | 11.225 | 11.126 | 11.7263 | 19.8189 | 21.0316 | 21.3865 | 21.387 | 21.4557 | 22.7583 | 40.4083 | 42.9503 |
| u171 | 11.05 | 11.2177 | 11.2251 | 11.1259 | 11.7263 | 19.8199 | 21.0316 | 21.3862 | 21.3873 | 21.4542 | 22.7586 | 40.4084 | 42.9525 |
| u172 | 11.05 | 11.2177 | 11.2257 | 11.1263 | 11.7268 | 19.8198 | 21.032 | 21.3866 | 21.3875 | 21.4554 | 22.7585 | 40.4081 | 42.9532 |
| u173 | 11.05 | 11.2176 | 11.2257 | 11.1263 | 11.7267 | 19.8176 | 21.0321 | 21.3866 | 21.3872 | 21.4567 | 22.7583 | 40.4083 | 42.9504 |
| u174 | 11.05 | 11.2176 | 11.2258 | 11.1264 | 11.7265 | 19.8183 | 21.0315 | 21.3861 | 21.3876 | 21.4565 | 22.7586 | 40.408 | 42.9499 |
| u175 | 11.05 | 11.2176 | 11.2258 | 11.1264 | 11.7264 | 19.8202 | 21.0314 | 21.386 | 21.388 | 21.4554 | 22.7586 | 40.4075 | 42.9536 |
| u176 | 11.0501 | 11.2215 | 11.2635 | 11.4112 | 12.8435 | 21.763 | 23.1331 | 23.5308 | 23.522 | 23.479 | 24.1517 | 42.4739 | 45.0861 |
| u177 | 11.0501 | 11.2215 | 11.2635 | 11.4111 | 12.8433 | 21.7662 | 23.1333 | 23.5311 | 23.5227 | 23.4778 | 24.1502 | 42.4743 | 45.089 |
| u178 | 11.0501 | 11.2214 | 11.2634 | 11.4109 | 12.8432 | 21.7627 | 23.1336 | 23.5303 | 23.5227 | 23.4774 | 24.1508 | 42.4746 | 45.0876 |
| u179 | 11.0501 | 11.2214 | 11.2635 | 11.411 | 12.8434 | 21.7649 | 23.1334 | 23.53 | 23.5218 | 23.4789 | 24.1513 | 42.474 | 45.0862 |
| u180 | 11.0501 | 11.2214 | 11.2632 | 11.4106 | 12.8436 | 21.7654 | 23.1338 | 23.5302 | 23.5221 | 23.48 | 24.1517 | 42.4741 | 45.0854 |
| u181 | 11.0501 | 11.2213 | 11.2632 | 11.4105 | 12.8433 | 21.7673 | 23.1341 | 23.5302 | 23.5227 | 23.4784 | 24.1506 | 42.4747 | 45.0859 |
| u182 | 11.0501 | 11.2214 | 11.2633 | 11.4106 | 12.8433 | 21.7673 | 23.1337 | 23.5309 | 23.5226 | 23.4792 | 24.1511 | 42.475 | 45.0871 |
| u183 | 11.0501 | 11.2214 | 11.2633 | 11.411 | 12.8433 | 21.7673 | 23.1336 | 23.5307 | 23.5223 | 23.4807 | 24.1514 | 42.4742 | 45.0859 |
| u184 | 11.0501 | 11.2214 | 11.2636 | 11.411 | 12.8436 | 21.7661 | 23.1328 | 23.5307 | 23.5252 | 23.6334 | 25.3442 | 44.4359 | 47.2056 |
| u185 | 11.0501 | 11.2213 | 11.2635 | 11.411 | 12.8434 | 21.7694 | 23.133 | 23.5307 | 23.5256 | 23.6319 | 25.344 | 44.4351 | 47.2068 |
| u186 | 11.05 | 11.2213 | 11.2635 | 11.4109 | 12.8432 | 21.7672 | 23.1333 | 23.53 | 23.5257 | 23.6312 | 25.3436 | 44.4345 | 47.2074 |
| u187 | 11.05 | 11.2213 | 11.2635 | 11.411 | 12.8435 | 21.7642 | 23.1332 | 23.5296 | 23.5251 | 23.6327 | 25.3436 | 44.4357 | 47.2063 |
| u188 | 11.05 | 11.2213 | 11.2637 | 11.4113 | 12.8433 | 21.765 | 23.1329 | 23.5301 | 23.5252 | 23.6319 | 25.3442 | 44.436 | 47.2053 |
| u189 | 11.0499 | 11.2212 | 11.2637 | 11.4112 | 12.8433 | 21.769 | 23.1332 | 23.5302 | 23.526 | 23.6309 | 25.3438 | 44.4355 | 47.2059 |
| u190 | 11.0499 | 11.2213 | 11.2638 | 11.4112 | 12.8433 | 21.7707 | 23.133 | 23.5307 | 23.5256 | 23.6314 | 25.3439 | 44.4362 | 47.2045 |
| u191 | 11.0499 | 11.2212 | 11.2638 | 11.4113 | 12.8437 | 21.7652 | 23.133 | 23.5306 | 23.5251 | 23.6325 | 25.3439 | 44.4364 | 47.205 |
| u192 | 13.2201 | 13.3952 | 13.3598 | 13.2116 | 14.3206 | 23.8647 | 25.301 | 25.7138 | 25.686 | 25.5714 | 26.7281 | 46.5246 | 49.3731 |
| u193 | 13.2201 | 13.3951 | 13.3597 | 13.2117 | 14.3204 | 23.864 | 25.3007 | 25.7138 | 25.6866 | 25.5731 | 26.7293 | 46.5247 | 49.3747 |
| u194 | 13.2201 | 13.3951 | 13.3596 | 13.2118 | 14.3206 | 23.8644 | 25.3007 | 25.7142 | 25.6857 | 25.5728 | 26.7301 | 46.5258 | 49.3729 |
| u195 | 13.22 | 13.3951 | 13.3597 | 13.2119 | 14.32 | 23.8649 | 25.3011 | 25.7142 | 25.6854 | 25.5718 | 26.7293 | 46.5255 | 49.3719 |
| u196 | 13.2201 | 13.395 | 13.3593 | 13.212 | 14.3207 | 23.868 | 25.3009 | 25.7152 | 25.686 | 25.5712 | 26.7275 | 46.5266 | 49.3715 |
| u197 | 13.22 | 13.395 | 13.3592 | 13.2121 | 14.3208 | 23.8681 | 25.3006 | 25.7149 | 25.6864 | 25.5717 | 26.7288 | 46.5268 | 49.3712 |
| u198 | 13.22 | 13.395 | 13.3593 | 13.2121 | 14.3208 | 23.8685 | 25.3008 | 25.7144 | 25.6871 | 25.5725 | 26.7289 | 46.5264 | 49.3729 |
| u199 | 13.22 | 13.395 | 13.3594 | 13.2122 | 14.3205 | 23.8683 | 25.3011 | 25.7145 | 25.6866 | 25.5719 | 26.7295 | 46.5262 | 49.3721 |
| u200 | 13.22 | 13.3949 | 13.3599 | 13.2118 | 14.3201 | 23.8676 | 25.3015 | 25.7137 | 25.6966 | 25.8968 | 27.9764 | 48.536 | 51.5342 |
| u201 | 13.22 | 13.3949 | 13.3599 | 13.2119 | 14.3206 | 23.8683 | 25.3012 | 25.7135 | 25.6969 | 25.8976 | 27.9765 | 48.5356 | 51.5327 |
| u202 | 13.22 | 13.3949 | 13.3597 | 13.2122 | 14.321 | 23.8691 | 25.301 | 25.7139 | 25.6964 | 25.8974 | 27.9764 | 48.5354 | 51.5329 |
| u203 | 13.22 | 13.3949 | 13.3598 | 13.2122 | 14.3209 | 23.8684 | 25.3015 | 25.7138 | 25.6961 | 25.8967 | 27.9759 | 48.5357 | 51.5336 |
| u204 | 13.2199 | 13.3949 | 13.3602 | 13.2121 | 14.3199 | 23.8652 | 25.302 | 25.7134 | 25.6951 | 25.8971 | 27.9764 | 48.5367 | 51.5333 |
| u205 | 13.2199 | 13.3949 | 13.3602 | 13.2122 | 14.3204 | 23.8659 | 25.3017 | 25.7132 | 25.6955 | 25.8982 | 27.9759 | 48.5365 | 51.5319 |
| u206 | 13.2199 | 13.3949 | 13.3603 | 13.2122 | 14.3202 | 23.865 | 25.3017 | 25.7126 | 25.6957 | 25.8989 | 27.9759 | 48.5367 | 51.5312 |

-continued

| | | | | | | | | | | | | |
|---|---|---|---|---|---|---|---|---|---|---|---|---|
| u207 | 13.2199 | 13.3949 | 13.3603 | 13.2122 | 14.3203 | 23.8649 | 25.302 | 25.7129 | 25.6953 | 25.8978 | 27.9757 | 48.5371 | 51.5336 |
| u208 | 13.2211 | 13.4119 | 13.4753 | 13.808 | 15.6104 | 25.9031 | 27.4824 | 27.9286 | 27.8762 | 27.7047 | 29.3698 | 50.6514 | 53.7355 |
| u209 | 13.2212 | 13.4119 | 13.4754 | 13.8079 | 15.6105 | 25.9066 | 27.4825 | 27.9287 | 27.8748 | 27.7048 | 29.3696 | 50.6515 | 53.7376 |
| u210 | 13.2212 | 13.4118 | 13.4754 | 13.8077 | 15.6105 | 25.9096 | 27.4821 | 27.9278 | 27.8747 | 27.7047 | 29.3703 | 50.6528 | 53.7368 |
| u211 | 13.2212 | 13.4118 | 13.4755 | 13.8078 | 15.6106 | 25.9084 | 27.4822 | 27.9277 | 27.8763 | 27.705 | 29.37 | 50.6524 | 53.7356 |
| u212 | 13.2212 | 13.4116 | 13.4752 | 13.8072 | 15.6103 | 25.908 | 27.4825 | 27.9281 | 27.8753 | 27.7061 | 29.3702 | 50.6532 | 53.7355 |
| u213 | 13.2212 | 13.4116 | 13.4752 | 13.8071 | 15.6104 | 25.9088 | 27.4826 | 27.9279 | 27.874 | 27.705 | 29.3691 | 50.6542 | 53.7365 |
| u214 | 13.2212 | 13.4117 | 13.4754 | 13.8072 | 15.6105 | 25.9051 | 27.483 | 27.9287 | 27.874 | 27.7053 | 29.37 | 50.6532 | 53.7361 |
| u215 | 13.2211 | 13.4117 | 13.4755 | 13.8074 | 15.6104 | 25.9041 | 27.483 | 27.9286 | 27.8753 | 27.7063 | 29.3698 | 50.6526 | 53.7349 |
| u216 | 13.2211 | 13.4119 | 13.4751 | 13.8074 | 15.6104 | 25.9073 | 27.4836 | 27.9277 | 27.903 | 28.3188 | 30.6624 | 52.7142 | 55.9402 |
| u217 | 13.2211 | 13.4119 | 13.4751 | 13.8073 | 15.6104 | 25.9083 | 27.4836 | 27.9275 | 27.9015 | 28.3177 | 30.6623 | 52.715 | 55.9394 |
| u218 | 13.2211 | 13.4118 | 13.4751 | 13.8072 | 15.6101 | 25.909 | 27.4832 | 27.9266 | 27.9017 | 28.3175 | 30.6623 | 52.7155 | 55.94 |
| u219 | 13.221 | 13.4118 | 13.4751 | 13.8073 | 15.61 | 25.9082 | 27.4831 | 27.9266 | 27.903 | 28.3183 | 30.6622 | 52.715 | 55.9416 |
| u220 | 13.221 | 13.412 | 13.4753 | 13.8078 | 15.6103 | 25.9098 | 27.4827 | 27.9267 | 27.9033 | 28.3174 | 30.6625 | 52.7162 | 55.9407 |
| u221 | 13.2209 | 13.4119 | 13.4752 | 13.8077 | 15.6102 | 25.9118 | 27.4829 | 27.9266 | 27.9019 | 28.3165 | 30.6618 | 52.7165 | 55.9385 |
| u222 | 13.2209 | 13.412 | 13.4752 | 13.8078 | 15.6105 | 25.9111 | 27.4833 | 27.9274 | 27.9017 | 28.317 | 30.6617 | 52.7159 | 55.9367 |
| u223 | 13.2209 | 13.4119 | 13.4752 | 13.808 | 15.6103 | 25.9093 | 27.4833 | 27.9275 | 27.9033 | 28.318 | 30.662 | 52.7157 | 55.9393 |
| u224 | 15.4446 | 15.6277 | 15.5188 | 15.4716 | 17.0875 | 28.0697 | 29.7304 | 30.1869 | 30.0859 | 29.9824 | 32.0716 | 54.8697 | 58.1813 |
| u225 | 15.4446 | 15.6276 | 15.5189 | 15.4714 | 17.0874 | 28.0679 | 29.731 | 30.187 | 30.0872 | 29.9834 | 32.0719 | 54.8693 | 58.1813 |
| u226 | 15.4446 | 15.6276 | 15.519 | 15.4719 | 17.0875 | 28.0687 | 29.7318 | 30.187 | 30.0873 | 29.9843 | 32.0714 | 54.8677 | 58.1803 |
| u227 | 15.4445 | 15.6276 | 15.519 | 15.4718 | 17.0877 | 28.0714 | 29.7313 | 30.1869 | 30.086 | 29.984 | 32.0711 | 54.868 | 58.1815 |
| u228 | 15.4445 | 15.6279 | 15.5191 | 15.4725 | 17.0869 | 28.0711 | 29.7305 | 30.1874 | 30.0855 | 29.983 | 32.0716 | 54.8682 | 58.1824 |
| u229 | 15.4445 | 15.6279 | 15.5191 | 15.4724 | 17.0872 | 28.0697 | 29.7311 | 30.1875 | 30.0867 | 29.984 | 32.0718 | 54.8682 | 58.1807 |
| u230 | 15.4444 | 15.6278 | 15.519 | 15.4721 | 17.0869 | 28.0673 | 29.7305 | 30.1874 | 30.0867 | 29.9834 | 32.0716 | 54.8699 | 58.1802 |
| u231 | 15.4444 | 15.6277 | 15.5189 | 15.4715 | 17.0869 | 28.0688 | 29.7299 | 30.1872 | 30.0854 | 29.984 | 32.0712 | 54.8703 | 58.1828 |
| u232 | 15.4445 | 15.6279 | 15.5201 | 15.4728 | 17.0874 | 28.0697 | 29.7293 | 30.1884 | 30.1593 | 30.9345 | 33.407 | 56.9852 | 60.4261 |
| u233 | 15.4444 | 15.6279 | 15.52 | 15.4723 | 17.0871 | 28.0692 | 29.7298 | 30.1885 | 30.1601 | 30.935 | 33.4066 | 56.9851 | 60.4302 |
| u234 | 15.4444 | 15.628 | 15.52 | 15.4723 | 17.0868 | 28.0692 | 29.7303 | 30.1885 | 30.1602 | 30.9355 | 33.4061 | 56.985 | 60.4312 |
| u235 | 15.4444 | 15.628 | 15.5199 | 15.4721 | 17.0867 | 28.0709 | 29.7298 | 30.1882 | 30.1587 | 30.9347 | 33.4058 | 56.986 | 60.4287 |
| u236 | 15.4443 | 15.6277 | 15.5199 | 15.4717 | 17.0874 | 28.0706 | 29.7305 | 30.1879 | 30.1589 | 30.9347 | 33.4064 | 56.9853 | 60.428 |
| u237 | 15.4443 | 15.6277 | 15.5198 | 15.472 | 17.0872 | 28.0695 | 29.7313 | 30.188 | 30.1599 | 30.935 | 33.4056 | 56.9846 | 60.4304 |
| u238 | 15.4443 | 15.6276 | 15.5197 | 15.4717 | 17.0872 | 28.0697 | 29.7308 | 30.1879 | 30.1603 | 30.9347 | 33.4065 | 56.9851 | 60.428 |
| u239 | 15.4443 | 15.6276 | 15.5195 | 15.4715 | 17.0871 | 28.072 | 29.7302 | 30.188 | 30.1588 | 30.9343 | 33.4067 | 56.9859 | 60.4266 |
| u240 | 15.4543 | 15.6931 | 15.8293 | 16.4743 | 18.4909 | 30.2216 | 32.0136 | 32.4862 | 32.3108 | 32.4893 | 34.8363 | 59.1799 | 62.7166 |
| u241 | 15.4543 | 15.6931 | 15.8293 | 16.4743 | 18.491 | 30.2195 | 32.0138 | 32.4863 | 32.3115 | 32.4899 | 34.8362 | 59.1804 | 62.7173 |
| u242 | 15.4543 | 15.6931 | 15.8293 | 16.4741 | 18.4913 | 30.2168 | 32.0145 | 32.4864 | 32.3117 | 32.4894 | 34.8363 | 59.1803 | 62.7143 |
| u243 | 15.4543 | 15.6931 | 15.8294 | 16.4743 | 18.4913 | 30.2188 | 32.0144 | 32.4863 | 32.311 | 32.4902 | 34.8362 | 59.1795 | 62.7137 |
| u244 | 15.4543 | 15.6931 | 15.8293 | 16.4737 | 18.4915 | 30.2204 | 32.0138 | 32.4864 | 32.3109 | 32.4884 | 34.8364 | 59.1789 | 62.7143 |
| u245 | 15.4543 | 15.6931 | 15.8292 | 16.4735 | 18.4916 | 30.2184 | 32.014 | 32.4862 | 32.3113 | 32.4897 | 34.8363 | 59.1794 | 62.7142 |
| u246 | 15.4542 | 15.6931 | 15.8293 | 16.4736 | 18.4913 | 30.2202 | 32.0135 | 32.486 | 32.3113 | 32.4886 | 34.8355 | 59.18 | 62.7155 |
| u247 | 15.4542 | 15.6931 | 15.8294 | 16.4736 | 18.4911 | 30.2231 | 32.0132 | 32.4861 | 32.3108 | 32.4905 | 34.835 | 59.1801 | 62.7172 |
| u248 | 15.4542 | 15.6932 | 15.8289 | 16.4735 | 18.4913 | 30.2181 | 32.0125 | 32.4945 | 32.4931 | 33.6873 | 36.2145 | 61.3539 | 65.0213 |
| u249 | 15.4542 | 15.6931 | 15.8289 | 16.4732 | 18.4913 | 30.217 | 32.0126 | 32.4945 | 32.4932 | 33.6869 | 36.2147 | 61.3543 | 65.0209 |
| u250 | 15.4542 | 15.6931 | 15.8288 | 16.4729 | 18.4915 | 30.2148 | 32.0131 | 32.4946 | 32.4926 | 33.6869 | 36.2149 | 61.3553 | 65.0233 |
| u251 | 15.4541 | 15.6931 | 15.8289 | 16.4731 | 18.4914 | 30.2171 | 32.013 | 32.4945 | 32.4923 | 33.6873 | 36.214 | 61.3552 | 65.0241 |
| u252 | 15.454 | 15.6931 | 15.8291 | 16.474 | 18.4911 | 30.2171 | 32.013 | 32.4947 | 32.4918 | 33.6873 | 36.2141 | 61.3553 | 65.0238 |
| u253 | 15.454 | 15.693 | 15.829 | 16.4739 | 18.4912 | 30.2146 | 32.0134 | 32.4947 | 32.4922 | 33.6871 | 36.2145 | 61.3557 | 65.0222 |
| u254 | 15.454 | 15.693 | 15.829 | 16.4742 | 18.491 | 30.2171 | 32.013 | 32.4946 | 32.4924 | 33.6874 | 36.2141 | 61.3547 | 65.0189 |
| u255 | 15.454 | 15.6928 | 15.829 | 16.4744 | 18.491 | 30.2195 | 32.013 | 32.4947 | 32.4921 | 33.6877 | 36.2145 | 61.3545 | 65.0212 |
| u256 | 17.7742 | 17.919 | 17.752 | 18.0371 | 20.01 | 32.4707 | 34.3613 | 34.831 | 34.5525 | 35.192 | 37.6699 | 63.5974 | 67.3686 |
| u257 | 17.7742 | 17.9188 | 17.7521 | 18.0371 | 20.0102 | 32.473 | 34.3616 | 34.8311 | 34.5523 | 35.1915 | 37.6701 | 63.5981 | 67.3705 |
| u258 | 17.7742 | 17.9189 | 17.7523 | 18.0371 | 20.0092 | 32.4736 | 34.3628 | 34.8318 | 34.5525 | 35.1916 | 37.67 | 63.5978 | 67.3689 |
| u259 | 17.7741 | 17.9188 | 17.7522 | 18.037 | 20.0098 | 32.472 | 34.3628 | 34.8319 | 34.5528 | 35.1912 | 37.6704 | 63.5974 | 67.3675 |
| u260 | 17.7741 | 17.9189 | 17.7527 | 18.0378 | 20.0095 | 32.47 | 34.3624 | 34.8319 | 34.5521 | 35.1919 | 37.6708 | 63.5963 | 67.3661 |
| u261 | 17.7741 | 17.919 | 17.7527 | 18.0379 | 20.0101 | 32.4725 | 34.3627 | 34.8317 | 34.5521 | 35.1931 | 37.6706 | 63.5964 | 67.3665 |
| u262 | 17.774 | 17.9188 | 17.7524 | 18.0376 | 20.0099 | 32.472 | 34.3617 | 34.8311 | 34.5518 | 35.1915 | 37.6705 | 63.5968 | 67.3668 |
| u263 | 17.7739 | 17.9188 | 17.7523 | 18.0372 | 20.0098 | 32.4694 | 34.3613 | 34.8311 | 34.5516 | 35.192 | 37.6705 | 63.5971 | 67.3675 |
| u264 | 17.7741 | 17.9189 | 17.753 | 18.0377 | 20.01 | 32.4696 | 34.3619 | 34.861 | 34.9548 | 36.5224 | 39.0953 | 65.8385 | 69.7365 |
| u265 | 17.7741 | 17.919 | 17.753 | 18.0374 | 20.0094 | 32.4718 | 34.362 | 34.8609 | 34.9557 | 36.5227 | 39.0954 | 65.8383 | 69.7378 |
| u266 | 17.7741 | 17.919 | 17.7533 | 18.0379 | 20.0092 | 32.4714 | 34.3629 | 34.8616 | 34.9562 | 36.5227 | 39.096 | 65.8384 | 69.7377 |
| u267 | 17.774 | 17.919 | 17.7532 | 18.037 | 20.009 | 32.4692 | 34.3627 | 34.8614 | 34.9551 | 36.5224 | 39.096 | 65.8387 | 69.7362 |
| u268 | 17.774 | 17.9188 | 17.7527 | 18.0361 | 20.0103 | 32.4714 | 34.3625 | 34.8618 | 34.9555 | 36.5222 | 39.0964 | 65.8371 | 69.734 |
| u269 | 17.774 | 17.919 | 17.7527 | 18.0364 | 20.01 | 32.4733 | 34.3628 | 34.8616 | 34.9566 | 36.5223 | 39.0961 | 65.837 | 69.7355 |
| u270 | 17.774 | 17.9188 | 17.7523 | 18.0362 | 20.01 | 32.4727 | 34.3621 | 34.8608 | 34.9561 | 36.5228 | 39.0956 | 65.8373 | 69.7347 |
| u271 | 17.774 | 17.9188 | 17.7522 | 18.036 | 20.0095 | 32.4724 | 34.362 | 34.8609 | 34.9553 | 36.5231 | 39.0965 | 65.8368 | 69.7339 |
| u272 | 17.8237 | 18.1294 | 18.4462 | 19.3498 | 21.5165 | 34.754 | 36.7615 | 37.2135 | 36.8704 | 38.0269 | 40.5845 | 68.1409 | 72.1411 |
| u273 | 17.8237 | 18.1294 | 18.4462 | 19.3497 | 21.5164 | 34.7537 | 36.7622 | 37.2135 | 36.8693 | 38.0261 | 40.5852 | 68.1394 | 72.1406 |
| u274 | 17.8238 | 18.1293 | 18.446 | 19.3496 | 21.5163 | 34.7534 | 36.7628 | 37.2123 | 36.8697 | 38.0262 | 40.5838 | 68.1391 | 72.1397 |
| u275 | 17.8238 | 18.1292 | 18.4462 | 19.3496 | 21.5167 | 34.7542 | 36.7624 | 37.2123 | 36.8697 | 38.0268 | 40.5834 | 68.1397 | 72.141 |
| u276 | 17.8237 | 18.1291 | 18.4456 | 19.3492 | 21.5165 | 34.7519 | 36.7632 | 37.2124 | 36.8706 | 38.0265 | 40.5844 | 68.1392 | 72.1425 |
| u277 | 17.8237 | 18.1291 | 18.4455 | 19.3491 | 21.5162 | 34.7518 | 36.7637 | 37.2122 | 36.8693 | 38.0268 | 40.5838 | 68.1381 | 72.14 |
| u278 | 17.8237 | 18.1291 | 18.4459 | 19.3491 | 21.5162 | 34.7523 | 36.7632 | 37.2133 | 36.8694 | 38.0272 | 40.5851 | 68.1393 | 72.1403 |
| u279 | 17.8237 | 18.129 | 18.4461 | 19.349 | 21.5163 | 34.7545 | 36.7627 | 37.2133 | 36.8694 | 38.0262 | 40.5852 | 68.1397 | 72.1427 |
| u280 | 17.8237 | 18.1293 | 18.4456 | 19.3485 | 21.5161 | 34.7536 | 36.7674 | 37.2982 | 37.6378 | 39.438 | 42.0596 | 70.4528 | 74.5733 |
| u281 | 17.8236 | 18.1293 | 18.4455 | 19.3484 | 21.5158 | 34.7538 | 36.7677 | 37.2981 | 37.6372 | 39.4384 | 42.0598 | 70.452 | 74.5749 |
| u282 | 17.8236 | 18.1293 | 18.4453 | 19.3482 | 21.5157 | 34.7533 | 36.7682 | 37.2971 | 37.6375 | 39.439 | 42.0609 | 70.4514 | 74.5736 |
| u283 | 17.8235 | 18.1292 | 18.4453 | 19.3483 | 21.5159 | 34.7537 | 36.7678 | 37.2971 | 37.6377 | 39.4387 | 42.0605 | 70.4527 | 74.5745 |
| u284 | 17.8235 | 18.1294 | 18.4457 | 19.3489 | 21.5161 | 34.7562 | 36.7664 | 37.2975 | 37.6385 | 39.4386 | 42.0607 | 70.4518 | 74.5747 |
| u285 | 17.8234 | 18.1294 | 18.4456 | 19.3489 | 21.5159 | 34.7562 | 36.767 | 37.2973 | 37.6386 | 39.4391 | 42.0609 | 70.4511 | 74.5739 |

-continued

| | | | | | | | | | | | | | |
|---|---|---|---|---|---|---|---|---|---|---|---|---|---|
| u286 | 17.8234 | 18.1294 | 18.4456 | 19.3492 | 21.5161 | 34.7567 | 36.7667 | 37.2983 | 37.638 | 39.4387 | 42.0595 | 70.4516 | 74.5736 |
| u287 | 17.8233 | 18.1293 | 18.4456 | 19.3493 | 21.5164 | 34.7569 | 36.7663 | 37.2983 | 37.6378 | 39.4386 | 42.0598 | 70.4516 | 74.5743 |
| u288 | 20.1823 | 20.2722 | 20.239 | 20.8991 | 23.1083 | 37.1324 | 39.233 | 39.6226 | 39.4047 | 40.9676 | 43.5898 | 72.8214 | 77.047 |
| u289 | 20.1822 | 20.2725 | 20.2386 | 20.8991 | 23.1083 | 37.1329 | 39.2332 | 39.6224 | 39.4062 | 40.9672 | 43.589 | 72.8204 | 77.0463 |
| u290 | 20.1821 | 20.2727 | 20.2384 | 20.8996 | 23.1084 | 37.1338 | 39.2334 | 39.6222 | 39.4063 | 40.9671 | 43.5888 | 72.8205 | 77.0448 |
| u291 | 20.1821 | 20.2728 | 20.2384 | 20.8995 | 23.1083 | 37.1331 | 39.2334 | 39.6235 | 39.4062 | 40.9663 | 43.5894 | 72.8211 | 77.0448 |
| u292 | 20.1819 | 20.273 | 20.238 | 20.8995 | 23.1089 | 37.1329 | 39.2336 | 39.624 | 39.4073 | 40.9672 | 43.5899 | 72.8195 | 77.0461 |
| u293 | 20.1819 | 20.2729 | 20.2378 | 20.899 | 23.1088 | 37.1343 | 39.2337 | 39.6238 | 39.4023 | 40.9666 | 43.59 | 72.8193 | 77.0452 |
| u294 | 20.1818 | 20.273 | 20.238 | 20.8992 | 23.1088 | 37.1335 | 39.2336 | 39.6232 | 39.4076 | 40.9668 | 43.5901 | 72.8194 | 77.0468 |
| u295 | 20.1818 | 20.273 | 20.2383 | 20.8995 | 23.1088 | 37.133 | 39.2333 | 39.6232 | 39.4051 | 40.9673 | 43.5898 | 72.8194 | 77.048 |
| u296 | 20.1819 | 20.273 | 20.2369 | 20.8995 | 23.1086 | 37.1316 | 39.2544 | 39.8444 | 40.5639 | 42.4464 | 45.121 | 75.2115 | 79.5513 |
| u297 | 20.1818 | 20.273 | 20.2371 | 20.8997 | 23.1086 | 37.1342 | 39.2544 | 39.8443 | 40.5642 | 42.4468 | 45.1214 | 75.2112 | 79.5519 |
| u298 | 20.1818 | 20.2728 | 20.237 | 20.8993 | 23.1086 | 37.1354 | 39.2544 | 39.8452 | 40.5644 | 42.4469 | 45.1211 | 75.2114 | 79.5534 |
| u299 | 20.1818 | 20.2728 | 20.2372 | 20.8989 | 23.1086 | 37.1346 | 39.2543 | 39.845 | 40.5639 | 42.4466 | 45.1207 | 75.2121 | 79.5525 |
| u300 | 20.1819 | 20.2727 | 20.2374 | 20.8992 | 23.108 | 37.1352 | 39.2538 | 39.8444 | 40.5639 | 42.4468 | 45.1212 | 75.2102 | 79.5507 |
| u301 | 20.1819 | 20.2725 | 20.2374 | 20.8993 | 23.1081 | 37.1361 | 39.254 | 39.8443 | 40.5642 | 42.4471 | 45.1217 | 75.2103 | 79.5512 |
| u302 | 20.1819 | 20.2724 | 20.238 | 20.8992 | 23.1081 | 37.1355 | 39.254 | 39.8433 | 40.564 | 42.447 | 45.122 | 75.2103 | 79.5492 |
| u303 | 20.1819 | 20.2724 | 20.2387 | 20.8985 | 23.1081 | 37.1346 | 39.254 | 39.8434 | 40.5637 | 42.4474 | 45.121 | 75.2106 | 79.5495 |
| u304 | 20.3719 | 20.8338 | 21.4326 | 22.3997 | 24.7288 | 39.5712 | 41.7597 | 42.066 | 42.2342 | 44.0141 | 46.699 | 77.6539 | 82.0954 |
| u305 | 20.3719 | 20.8339 | 21.4325 | 22.3999 | 24.7289 | 39.5719 | 41.76 | 42.0656 | 42.2335 | 44.0147 | 46.6984 | 77.6541 | 82.0997 |
| u306 | 20.3719 | 20.8339 | 21.4328 | 22.4 | 24.7291 | 39.5729 | 41.7599 | 42.0653 | 42.2325 | 44.0134 | 46.6983 | 77.6537 | 82.0968 |
| u307 | 20.372 | 20.8341 | 21.4327 | 22.3999 | 24.7292 | 39.5725 | 41.76 | 42.0655 | 42.2323 | 44.0134 | 46.6988 | 77.6538 | 82.0929 |
| u308 | 20.3719 | 20.8339 | 21.4336 | 22.4 | 24.7296 | 39.5751 | 41.7601 | 42.0652 | 42.2331 | 44.015 | 46.6986 | 77.6538 | 82.0898 |
| u309 | 20.3719 | 20.8339 | 21.4337 | 22.4002 | 24.7296 | 39.5755 | 41.7604 | 42.0647 | 42.233 | 44.015 | 46.6981 | 77.6546 | 82.0935 |
| u310 | 20.372 | 20.8341 | 21.4333 | 22.4002 | 24.7293 | 39.5744 | 41.7605 | 42.0648 | 42.2326 | 44.0139 | 46.6982 | 77.6549 | 82.0956 |
| u311 | 20.3721 | 20.8341 | 21.4332 | 22.4003 | 24.7292 | 39.5744 | 41.7602 | 42.0651 | 42.233 | 44.013 | 46.6989 | 77.6551 | 82.0923 |
| u312 | 20.3719 | 20.8339 | 21.4318 | 22.4 | 24.7302 | 39.5796 | 41.8311 | 42.576 | 43.6465 | 45.5645 | 48.2891 | 80.1325 | 84.6798 |
| u313 | 20.3719 | 20.8338 | 21.4318 | 22.4001 | 24.7301 | 39.58 | 41.8315 | 42.5763 | 43.6463 | 45.5647 | 48.29 | 80.1341 | 84.6785 |
| u314 | 20.3719 | 20.8337 | 21.432 | 22.4004 | 24.7303 | 39.581 | 41.8314 | 42.5757 | 43.6457 | 45.5644 | 48.2901 | 80.1332 | 84.68 |
| u315 | 20.3718 | 20.8337 | 21.4321 | 22.4004 | 24.7302 | 39.5802 | 41.831 | 42.5754 | 43.6459 | 45.5641 | 48.2895 | 80.132 | 84.6821 |
| u316 | 20.3719 | 20.834 | 21.4313 | 22.4003 | 24.7297 | 39.5773 | 41.8305 | 42.5752 | 43.6459 | 45.564 | 48.289 | 80.1318 | 84.6749 |
| u317 | 20.3718 | 20.8337 | 21.4314 | 22.4004 | 24.7297 | 39.5785 | 41.8308 | 42.5754 | 43.646 | 45.5641 | 48.2893 | 80.1325 | 84.6728 |
| u318 | 20.3717 | 20.8334 | 21.4312 | 22.4003 | 24.7296 | 39.5776 | 41.8308 | 42.5758 | 43.6461 | 45.5642 | 48.2893 | 80.1335 | 84.6709 |
| u319 | 20.3714 | 20.833 | 21.4313 | 22.4003 | 24.7296 | 39.5766 | 41.8304 | 42.5754 | 43.6463 | 45.5644 | 48.2889 | 80.1331 | 84.6728 |
| u320 | 22.6871 | 22.8507 | 23.1452 | 24.0231 | 26.4283 | 42.1023 | 44.3404 | 44.6399 | 45.2957 | 47.1846 | 49.9228 | 82.6655 | 87.3124 |
| u321 | 22.6871 | 22.8507 | 23.1448 | 24.0233 | 26.4285 | 42.1023 | 44.3407 | 44.6395 | 45.2958 | 47.1842 | 49.9224 | 82.6665 | 87.3179 |
| u322 | 22.687 | 22.8506 | 23.1448 | 24.0229 | 26.4284 | 42.1042 | 44.3408 | 44.6405 | 45.2967 | 47.1839 | 49.9224 | 82.668 | 87.3177 |
| u323 | 22.687 | 22.8506 | 23.1444 | 24.0229 | 26.4282 | 42.1045 | 44.3406 | 44.6414 | 45.2955 | 47.1843 | 49.923 | 82.6672 | 87.313 |
| u324 | 22.6868 | 22.8503 | 23.1452 | 24.0224 | 26.4279 | 42.1058 | 44.3402 | 44.6399 | 45.2967 | 47.1836 | 49.9224 | 82.6671 | 87.2902 |
| u325 | 22.6868 | 22.8503 | 23.145 | 24.0224 | 26.428 | 42.1059 | 44.3404 | 44.6409 | 45.2955 | 47.1842 | 49.9221 | 82.6673 | 87.2945 |
| u326 | 22.6868 | 22.8504 | 23.1449 | 24.0228 | 26.4281 | 42.1037 | 44.3402 | 44.6411 | 45.2953 | 47.1834 | 49.9219 | 82.6666 | 87.2935 |
| u327 | 22.6868 | 22.8503 | 23.145 | 24.0231 | 26.4278 | 42.1031 | 44.34 | 44.641 | 45.2956 | 47.1836 | 49.9228 | 82.6662 | 87.29 |
| u328 | 22.6869 | 22.85 | 23.1446 | 24.0229 | 26.4321 | 42.13 | 44.5399 | 45.6123 | 46.8504 | 48.8059 | 51.5793 | 85.2449 | 90.0056 |
| u329 | 22.6869 | 22.85 | 23.1451 | 24.0234 | 26.4321 | 42.1296 | 44.5403 | 45.6119 | 46.8494 | 48.806 | 51.5795 | 85.2464 | 90.0061 |
| u330 | 22.6869 | 22.8499 | 23.1459 | 24.0235 | 26.4319 | 42.1314 | 44.5407 | 45.6125 | 46.8499 | 48.8062 | 51.5803 | 85.2464 | 90.0043 |
| u331 | 22.6869 | 22.8499 | 23.1459 | 24.0237 | 26.4317 | 42.1313 | 44.5403 | 45.6125 | 46.8498 | 48.8063 | 51.5798 | 85.2455 | 90.006 |
| u332 | 22.687 | 22.8502 | 23.1446 | 24.0227 | 26.432 | 42.1299 | 44.5402 | 45.6123 | 46.8496 | 48.8058 | 51.5802 | 85.2453 | 89.9439 |
| u333 | 22.687 | 22.8502 | 23.1448 | 24.0233 | 26.4323 | 42.1299 | 44.5408 | 45.6119 | 46.8494 | 48.8058 | 51.5804 | 85.2461 | 89.942 |
| u334 | 22.687 | 22.8503 | 23.1447 | 24.0234 | 26.4325 | 42.1286 | 44.5405 | 45.6112 | 46.8495 | 48.8058 | 51.5795 | 85.2459 | 89.9415 |
| u335 | 22.687 | 22.8502 | 23.1455 | 24.0234 | 26.4325 | 42.129 | 44.5401 | 45.6115 | 46.8502 | 48.8059 | 51.5791 | 85.2451 | 89.9442 |
| u336 | 23.2472 | 23.9968 | 24.7078 | 25.68 | 28.1834 | 44.7117 | 46.9632 | 47.5309 | 48.5352 | 50.4855 | 53.2791 | 87.8824 | 92.7763 |
| u337 | 23.2473 | 23.9969 | 24.7076 | 25.6799 | 28.1835 | 44.7098 | 46.9631 | 47.5304 | 48.5363 | 50.4853 | 53.2802 | 87.883 | 92.7802 |
| u338 | 23.2473 | 23.9969 | 24.7075 | 25.6799 | 28.1833 | 44.706 | 46.9621 | 47.5299 | 48.5357 | 50.485 | 53.2792 | 87.8796 | 92.7806 |
| u339 | 23.2473 | 23.9969 | 24.7074 | 25.68 | 28.1832 | 44.7081 | 46.9625 | 47.5304 | 48.5363 | 50.486 | 53.2783 | 87.8793 | 92.7779 |
| u340 | 23.2473 | 23.997 | 24.7076 | 25.6799 | 28.1826 | 44.7051 | 46.9613 | 47.5293 | 48.5357 | 50.4861 | 53.2784 | 87.8789 | 92.6155 |
| u341 | 23.2473 | 23.9971 | 24.7076 | 25.68 | 28.1827 | 44.7028 | 46.961 | 47.5298 | 48.5357 | 50.4857 | 53.2786 | 87.8799 | 92.6195 |
| u342 | 23.2474 | 23.9971 | 24.7076 | 25.6801 | 28.1829 | 44.7067 | 46.9621 | 47.5281 | 48.5365 | 50.4863 | 53.28 | 87.8832 | 92.6178 |
| u343 | 23.2474 | 23.997 | 24.7075 | 25.6803 | 28.1828 | 44.7086 | 46.9623 | 47.5299 | 48.5355 | 50.4856 | 53.2797 | 87.8821 | 92.6163 |
| u344 | 23.2473 | 23.9972 | 24.708 | 25.6829 | 28.2004 | 44.8014 | 47.4648 | 48.9479 | 50.1963 | 52.1866 | 55.0115 | 90.5612 | 95.6812 |
| u345 | 23.2474 | 23.9972 | 24.708 | 25.683 | 28.2005 | 44.7984 | 47.465 | 48.9484 | 50.1955 | 52.1865 | 55.0116 | 90.561 | 95.6836 |
| u346 | 23.2474 | 23.9972 | 24.7079 | 25.6831 | 28.2003 | 44.794 | 47.4647 | 48.9484 | 50.1955 | 52.1867 | 55.0126 | 90.5727 | 95.6776 |
| u347 | 23.2474 | 23.9971 | 24.708 | 25.6832 | 28.2003 | 44.7968 | 47.4647 | 48.9481 | 50.1957 | 52.1866 | 55.0123 | 90.5734 | 95.6757 |
| u348 | 23.2473 | 23.9969 | 24.7079 | 25.6832 | 28.2011 | 44.7986 | 47.465 | 48.9474 | 50.1956 | 52.1866 | 55.0122 | 90.5719 | 95.3043 |
| u349 | 23.2473 | 23.9969 | 24.708 | 25.6832 | 28.2011 | 44.7958 | 47.4649 | 48.9484 | 50.1951 | 52.1865 | 55.0124 | 90.5726 | 95.3 |
| u350 | 23.2472 | 23.9967 | 24.7081 | 25.6832 | 28.2013 | 44.8011 | 47.4652 | 48.9479 | 50.1952 | 52.1866 | 55.0112 | 90.5596 | 95.3008 |
| u351 | 23.247 | 23.9964 | 24.7083 | 25.6833 | 28.2013 | 44.8045 | 47.4653 | 48.9474 | 50.1963 | 52.1869 | 55.011 | 90.5593 | 95.3053 |
| u352 | 25.4503 | 25.9232 | 26.4742 | 27.4324 | 30.0079 | 47.3803 | 49.7275 | 50.7917 | 51.9472 | 53.9414 | 56.7898 | 93.3305 | 98.7881 |
| u353 | 25.4501 | 25.9232 | 26.4745 | 27.4326 | 30.0079 | 47.3822 | 49.7275 | 50.793 | 51.9464 | 53.9419 | 56.7898 | 93.33 | 98.7872 |
| u354 | 25.45 | 25.9231 | 26.4748 | 27.4326 | 30.008 | 47.3861 | 49.7276 | 50.7912 | 51.9466 | 53.9427 | 56.7898 | 93.2881 | 98.7921 |
| u355 | 25.4498 | 25.9229 | 26.4751 | 27.4325 | 30.008 | 47.3848 | 49.7279 | 50.7911 | 51.9464 | 53.9423 | 56.7896 | 93.2892 | 98.7926 |
| u356 | 25.4499 | 25.9232 | 26.4748 | 27.4322 | 30.0081 | 47.3856 | 49.7276 | 50.7911 | 51.9465 | 53.9425 | 56.7864 | 93.2888 | 98.0402 |
| u357 | 25.4499 | 25.9233 | 26.4751 | 27.4323 | 30.0082 | 47.3874 | 49.7276 | 50.7921 | 51.9457 | 53.9431 | 56.7864 | 93.2888 | 98.0416 |
| u358 | 25.4497 | 25.9232 | 26.4756 | 27.4324 | 30.0081 | 47.3833 | 49.728 | 50.7916 | 51.9457 | 53.9422 | 56.7862 | 93.3305 | 98.039 |
| u359 | 25.4498 | 25.9231 | 26.4759 | 27.4326 | 30.0081 | 47.3812 | 49.7283 | 50.7916 | 51.947 | 53.9419 | 56.7864 | 93.3312 | 98.0396 |
| u360 | 25.4498 | 25.9214 | 26.4751 | 27.4467 | 30.0742 | 47.6581 | 50.7504 | 52.4786 | 53.7089 | 55.7333 | 58.6094 | 96.0561 | 102.1968 |
| u361 | 25.4499 | 25.9216 | 26.4751 | 27.447 | 30.0741 | 47.6603 | 50.7506 | 52.4787 | 53.7087 | 55.733 | 58.6091 | 96.0551 | 102.1942 |
| u362 | 25.4501 | 25.9216 | 26.4748 | 27.4474 | 30.0742 | 47.6693 | 50.7503 | 52.4777 | 53.7096 | 55.7321 | 58.6086 | 96.1752 | 102.1967 |
| u363 | 25.4501 | 25.9215 | 26.4752 | 27.4475 | 30.0742 | 47.6663 | 50.7503 | 52.4775 | 53.7095 | 55.7323 | 58.6088 | 96.1761 | 102.1985 |
| u364 | 25.4501 | 25.9211 | 26.4762 | 27.4477 | 30.0744 | 47.6625 | 50.7501 | 52.4776 | 53.7092 | 55.733 | 58.5968 | 96.1765 | 100.9724 |

-continued

| | | | | | | | | | | | | |
|---|---|---|---|---|---|---|---|---|---|---|---|---|
| u365 | 25.4502 | 25.9212 | 26.4766 | 27.4476 | 30.0744 | 47.6649 | 50.7502 | 52.4773 | 53.7089 | 55.733 | 58.5962 | 96.1755 | 100.97 |
| u366 | 25.45 | 25.9212 | 26.4764 | 27.4476 | 30.0743 | 47.6558 | 50.7506 | 52.4783 | 53.708 | 55.7339 | 58.5967 | 96.0552 | 100.9707 |
| u367 | 25.45 | 25.9211 | 26.4768 | 27.4475 | 30.0743 | 47.6537 | 50.7506 | 52.4785 | 53.7078 | 55.7339 | 58.5973 | 96.0554 | 100.9662 |
| u368 | 26.6934 | 27.6192 | 28.283 | 29.2514 | 31.8831 | 50.1401 | 52.862 | 54.3503 | 55.5476 | 57.5757 | 60.4822 | 99.1599 | 105.8048 |
| u369 | 26.6934 | 27.6192 | 28.2829 | 29.2514 | 31.8831 | 50.1394 | 52.8603 | 54.3509 | 55.5483 | 57.5761 | 60.4825 | 99.1588 | 105.808 |
| u370 | 26.6934 | 27.6191 | 28.2828 | 29.2517 | 31.8835 | 50.1327 | 52.8575 | 54.3518 | 55.547 | 57.5761 | 60.4819 | 98.8465 | 105.8083 |
| u371 | 26.6934 | 27.6191 | 28.2827 | 29.2514 | 31.8836 | 50.1344 | 52.8591 | 54.3514 | 55.5465 | 57.5762 | 60.4819 | 98.8466 | 105.8062 |
| u372 | 26.6934 | 27.6188 | 28.2823 | 29.2513 | 31.8843 | 50.1314 | 52.862 | 54.3514 | 55.5468 | 57.5795 | 60.4458 | 98.8455 | 104.2296 |
| u373 | 26.6934 | 27.6188 | 28.2823 | 29.2515 | 31.8842 | 50.1295 | 52.8596 | 54.3515 | 55.5464 | 57.5795 | 60.4455 | 98.8471 | 104.2253 |
| u374 | 26.6934 | 27.6189 | 28.2823 | 29.2512 | 31.8838 | 50.1378 | 52.8616 | 54.3507 | 55.5473 | 57.579 | 60.4465 | 99.1586 | 104.2289 |
| u375 | 26.6935 | 27.6189 | 28.2823 | 29.2512 | 31.8837 | 50.1408 | 52.8554 | 54.3502 | 55.5472 | 57.5795 | 60.4466 | 99.1592 | 104.2252 |
| u376 | 26.6921 | 27.6199 | 28.2953 | 29.3146 | 32.0919 | 50.8367 | 54.4305 | 56.2047 | 57.4235 | 59.4649 | 62.4228 | 101.6819 | 109.5439 |
| u377 | 26.6921 | 27.6198 | 28.2953 | 29.3148 | 32.092 | 50.8358 | 54.4305 | 56.2041 | 57.4231 | 59.4657 | 62.4236 | 101.6812 | 109.5443 |
| u378 | 26.6921 | 27.6197 | 28.2951 | 29.3152 | 32.092 | 50.829 | 54.4309 | 56.2044 | 57.4238 | 59.4666 | 62.4241 | 102.3729 | 109.5424 |
| u379 | 26.6921 | 27.6196 | 28.2951 | 29.315 | 32.092 | 50.8299 | 54.4308 | 56.2043 | 57.4237 | 59.4651 | 62.4233 | 102.3738 | 109.5437 |
| u380 | 26.6921 | 27.6199 | 28.2957 | 29.3148 | 32.0916 | 50.8332 | 54.4314 | 56.204 | 57.4234 | 59.4763 | 62.3241 | 102.372 | 107.7734 |
| u381 | 26.692 | 27.6198 | 28.2949 | 29.3149 | 32.0917 | 50.8321 | 54.4319 | 56.2039 | 57.423 | 59.4772 | 62.3237 | 102.372 | 107.7724 |
| u382 | 26.6919 | 27.6198 | 28.2958 | 29.3146 | 32.0917 | 50.837 | 54.4314 | 56.2037 | 57.4222 | 59.4778 | 62.324 | 101.6835 | 107.772 |
| u383 | 26.6918 | 27.6197 | 28.2959 | 29.3145 | 32.0916 | 50.8364 | 54.4314 | 56.204 | 57.4217 | 59.4773 | 62.3232 | 101.6817 | 107.7719 |
| u384 | 28.8336 | 29.6017 | 30.2105 | 31.1422 | 33.8296 | 53.1439 | 56.4692 | 58.1685 | 59.3709 | 61.4077 | 64.4733 | 105.9256 | 113.4139 |
| u385 | 28.8335 | 29.6009 | 30.2107 | 31.1424 | 33.8295 | 53.1513 | 56.47 | 58.169 | 59.3699 | 61.4071 | 64.473 | 105.9245 | 113.4138 |
| u386 | 28.8335 | 29.6009 | 30.211 | 31.1432 | 33.8295 | 53.1503 | 56.4696 | 58.1697 | 59.37 | 61.4067 | 64.4735 | 104.7031 | 113.4124 |
| u387 | 28.8331 | 29.6006 | 30.211 | 31.1432 | 33.8297 | 53.1495 | 56.4694 | 58.1695 | 59.3697 | 61.4081 | 64.4732 | 104.7025 | 113.4128 |
| u388 | 28.8333 | 29.6003 | 30.212 | 31.143 | 33.8295 | 53.1525 | 56.4686 | 58.1696 | 59.3727 | 61.4431 | 64.2245 | 104.7024 | 111.5199 |
| u389 | 28.8333 | 29.6007 | 30.2122 | 31.1432 | 33.8294 | 53.1544 | 56.4694 | 58.1689 | 59.3717 | 61.4421 | 64.2237 | 104.7038 | 111.5204 |
| u390 | 28.8334 | 29.6005 | 30.2119 | 31.1425 | 33.8293 | 53.1519 | 56.468 | 58.1702 | 59.3723 | 61.4424 | 64.2236 | 105.9264 | 111.5221 |
| u391 | 28.8334 | 29.6005 | 30.2117 | 31.1422 | 33.8293 | 53.1478 | 56.4685 | 58.1685 | 59.3726 | 61.4433 | 64.224 | 105.9274 | 111.5227 |
| u392 | 28.8324 | 29.6151 | 30.2773 | 31.3543 | 34.3575 | 54.4905 | 58.3807 | 60.1766 | 61.3716 | 63.3843 | 66.7059 | 108.0895 | 117.4159 |
| u393 | 28.8325 | 29.6151 | 30.2774 | 31.3546 | 34.3574 | 54.4909 | 58.3805 | 60.1767 | 61.3716 | 63.3855 | 66.7049 | 108.09 | 117.4172 |
| u394 | 28.8328 | 29.6154 | 30.2777 | 31.3542 | 34.3577 | 54.4916 | 58.3801 | 60.1757 | 61.3716 | 63.3862 | 66.7046 | 109.7497 | 117.4167 |
| u395 | 28.8329 | 29.6155 | 30.2775 | 31.3543 | 34.3577 | 54.4917 | 58.3803 | 60.1752 | 61.3717 | 63.3852 | 66.7054 | 109.75 | 117.4155 |
| u396 | 28.8328 | 29.6158 | 30.2767 | 31.3543 | 34.3569 | 54.488 | 58.3806 | 60.1757 | 61.3836 | 63.4874 | 66.1683 | 109.7512 | 115.4305 |
| u397 | 28.8329 | 29.616 | 30.2768 | 31.3542 | 34.3569 | 54.4898 | 58.3807 | 60.1761 | 61.3837 | 63.4885 | 66.1685 | 109.75 | 115.4324 |
| u398 | 28.8328 | 29.6158 | 30.2764 | 31.3549 | 34.3566 | 54.4884 | 58.3813 | 60.1769 | 61.3836 | 63.4883 | 66.1684 | 108.0909 | 115.4313 |
| u399 | 28.8329 | 29.6159 | 30.276 | 31.3549 | 34.3567 | 54.4884 | 58.3812 | 60.1765 | 61.3838 | 63.4869 | 66.1695 | 108.0903 | 115.4307 |
| u400 | 30.7686 | 31.6431 | 32.2198 | 33.1169 | 35.9896 | 56.6879 | 60.487 | 62.2779 | 63.4405 | 65.3937 | 69.185 | 113.739 | 121.5803 |
| u401 | 30.7686 | 31.6432 | 32.2199 | 33.1169 | 35.9896 | 56.6844 | 60.487 | 62.2778 | 63.4406 | 65.3938 | 69.1858 | 113.738 | 121.5818 |
| u402 | 30.7686 | 31.6431 | 32.22 | 33.117 | 35.9894 | 56.6852 | 60.4881 | 62.2784 | 63.4406 | 65.3932 | 69.1843 | 111.838 | 121.5806 |
| u403 | 30.7688 | 31.6432 | 32.2198 | 33.1171 | 35.9896 | 56.679 | 60.4856 | 62.2789 | 63.4402 | 65.3927 | 69.1843 | 111.8366 | 121.5801 |
| u404 | 30.7685 | 31.6423 | 32.22 | 33.1162 | 35.9902 | 56.6834 | 60.4868 | 62.2824 | 63.4829 | 65.6593 | 68.2735 | 111.8392 | 119.501 |
| u405 | 30.7687 | 31.6423 | 32.2202 | 33.1162 | 35.99 | 56.6844 | 60.4873 | 62.2828 | 63.4832 | 65.6591 | 68.2725 | 111.8389 | 119.4989 |
| u406 | 30.7689 | 31.6425 | 32.2199 | 33.1162 | 35.9901 | 56.683 | 60.4852 | 62.2808 | 63.4832 | 65.6602 | 68.2743 | 113.7388 | 119.4963 |
| u407 | 30.769 | 31.6426 | 32.2197 | 33.1163 | 35.9902 | 56.6857 | 60.4869 | 62.2817 | 63.4828 | 65.6609 | 68.272 | 113.7398 | 119.4989 |
| u408 | 30.795 | 31.7272 | 32.4564 | 33.6746 | 37.0043 | 58.5751 | 62.6228 | 64.4478 | 65.5581 | 67.4583 | 71.848 | 115.8502 | 125.9235 |
| u409 | 30.7951 | 31.7272 | 32.4567 | 33.6747 | 37.0041 | 58.5786 | 62.6229 | 64.4474 | 65.5585 | 67.4579 | 71.8473 | 115.8494 | 125.9263 |
| u410 | 30.7952 | 31.7271 | 32.457 | 33.6746 | 37.0045 | 58.578 | 62.6251 | 64.446 | 65.5593 | 67.4567 | 71.8498 | 117.9038 | 125.926 |
| u411 | 30.7952 | 31.7272 | 32.4568 | 33.6746 | 37.0046 | 58.5732 | 62.625 | 64.4462 | 65.5591 | 67.457 | 71.849 | 117.905 | 125.9239 |
| u412 | 30.7956 | 31.728 | 32.4568 | 33.6744 | 37.0043 | 58.5769 | 62.6254 | 64.4653 | 65.6857 | 68.047 | 70.6516 | 117.906 | 123.7404 |
| u413 | 30.7955 | 31.7279 | 32.457 | 33.6745 | 37.0043 | 58.5817 | 62.6256 | 64.465 | 65.6859 | 68.0463 | 70.6513 | 117.9053 | 123.7373 |
| u414 | 30.7953 | 31.728 | 32.4566 | 33.6746 | 37.004 | 58.5823 | 62.6235 | 64.4662 | 65.6852 | 68.0463 | 70.6511 | 115.8503 | 123.7375 |
| u415 | 30.7949 | 31.7279 | 32.4564 | 33.6747 | 37.0041 | 58.5794 | 62.6237 | 64.4647 | 65.6848 | 68.0469 | 70.6513 | 115.8494 | 123.7391 |
| u416 | 33.0145 | 33.8252 | 34.3457 | 35.3469 | 38.5667 | 60.7984 | 64.8988 | 66.6968 | 67.7178 | 69.7144 | 74.6428 | 122.2731 | 130.4834 |
| u417 | 33.0143 | 33.8253 | 34.3469 | 35.3462 | 38.5671 | 60.7938 | 64.8982 | 66.697 | 67.7181 | 69.7169 | 74.6445 | 122.2717 | 130.4845 |
| u418 | 33.0142 | 33.8254 | 34.3472 | 35.3463 | 38.5668 | 60.7928 | 64.8888 | 66.6996 | 67.7156 | 69.7145 | 74.6426 | 120.0848 | 130.4848 |
| u419 | 33.0141 | 33.8252 | 34.3471 | 35.3454 | 38.5661 | 60.7991 | 64.8897 | 66.6695 | 67.7162 | 69.7153 | 74.6434 | 120.0863 | 130.4845 |
| u420 | 33.0141 | 33.8254 | 34.3466 | 35.3462 | 38.5665 | 60.8037 | 64.8875 | 66.7683 | 68.0546 | 70.7304 | 73.2875 | 120.0867 | 128.1823 |
| u421 | 33.0141 | 33.8254 | 34.3469 | 35.3464 | 38.5663 | 60.7976 | 64.888 | 66.7688 | 68.0536 | 70.7303 | 73.286 | 120.0872 | 128.1835 |
| u422 | 33.0141 | 33.8252 | 34.3467 | 35.3462 | 38.5662 | 60.7978 | 64.8966 | 66.767 | 68.055 | 70.7312 | 73.2862 | 122.2726 | 128.1856 |
| u423 | 33.0142 | 33.8249 | 34.3465 | 35.346 | 38.5664 | 60.8033 | 64.8958 | 66.7664 | 68.0545 | 70.7309 | 73.2865 | 122.2712 | 128.1841 |
| u424 | 33.1475 | 34.1358 | 34.9921 | 36.439 | 39.9819 | 63.0245 | 67.2409 | 69.0131 | 69.9624 | 72.3007 | 77.5818 | 124.5566 | 135.2748 |
| u425 | 33.1476 | 34.1358 | 34.9913 | 36.4389 | 39.9819 | 63.0334 | 67.2411 | 69.0116 | 69.9624 | 72.2992 | 77.5821 | 124.555 | 135.2748 |
| u426 | 33.1477 | 34.1362 | 34.9903 | 36.4388 | 39.9816 | 63.0291 | 67.2821 | 69.0111 | 69.9648 | 72.2987 | 77.5812 | 126.8755 | 135.2699 |
| u427 | 33.1478 | 34.1364 | 34.9905 | 36.4388 | 39.9816 | 63.0224 | 67.2818 | 69.0121 | 69.9632 | 72.2995 | 77.5812 | 126.8755 | 135.27 |
| u428 | 33.1478 | 34.1359 | 34.9918 | 36.4372 | 39.981 | 63.0324 | 67.2796 | 69.2216 | 70.7043 | 73.6294 | 76.1158 | 126.8764 | 132.8516 |
| u429 | 33.1479 | 34.136 | 34.9911 | 36.4371 | 39.9811 | 63.0391 | 67.28 | 69.2209 | 70.7049 | 73.6296 | 76.1172 | 126.8743 | 132.8499 |
| u430 | 33.1479 | 34.1357 | 34.9912 | 36.4373 | 39.9814 | 63.0434 | 67.2391 | 69.2229 | 70.7039 | 73.6298 | 76.1163 | 124.5551 | 132.8517 |
| u431 | 33.1479 | 34.1359 | 34.9907 | 36.4373 | 39.9814 | 63.0395 | 67.2389 | 69.224 | 70.7038 | 73.63 | 76.1155 | 124.5549 | 132.8517 |
| u432 | 35.3673 | 36.1733 | 36.8063 | 38.0581 | 41.597 | 65.4426 | 69.8384 | 71.3939 | 72.484 | 75.1851 | 80.6954 | 131.7401 | 140.3531 |
| u433 | 35.3672 | 36.1732 | 36.8048 | 38.0581 | 41.597 | 65.437 | 69.8374 | 71.3937 | 72.4836 | 75.1856 | 80.6941 | 131.7374 | 140.3414 |
| u434 | 35.3672 | 36.1734 | 36.8039 | 38.0584 | 41.5966 | 65.4323 | 69.6926 | 71.3933 | 72.4838 | 75.1867 | 80.6941 | 129.2792 | 140.2923 |
| u435 | 35.3672 | 36.1735 | 36.8038 | 38.0579 | 41.5969 | 65.4366 | 69.6932 | 71.3933 | 72.4835 | 75.1849 | 80.6942 | 129.2761 | 140.3061 |
| u436 | 35.3682 | 36.1738 | 36.804 | 38.0587 | 41.6018 | 65.4716 | 69.6925 | 71.9276 | 73.7073 | 76.6942 | 79.1261 | 129.2748 | 137.7683 |
| u437 | 35.3681 | 36.1738 | 36.8041 | 38.0592 | 41.602 | 65.4633 | 69.6916 | 71.9287 | 73.7087 | 76.6948 | 79.1257 | 129.2769 | 137.7728 |
| u438 | 35.3682 | 36.1737 | 36.8039 | 38.0599 | 41.6019 | 65.4693 | 69.8358 | 71.9266 | 73.7081 | 76.6942 | 79.1243 | 131.7393 | 137.7598 |
| u439 | 35.3682 | 36.1738 | 36.8036 | 38.0603 | 41.602 | 65.4688 | 69.8366 | 71.927 | 73.7071 | 76.6931 | 79.1254 | 131.7422 | 137.7543 |
| u440 | 35.8585 | 37.0193 | 38.0814 | 39.5865 | 43.2635 | 67.9368 | 72.2211 | 73.9634 | 75.4065 | 78.3141 | 84.0138 | 134.2818 | 145.8535 |
| u441 | 35.8586 | 37.0194 | 38.0816 | 39.5862 | 43.2637 | 67.9325 | 72.2209 | 73.9613 | 75.4072 | 78.3138 | 84.0103 | 134.2834 | 145.8523 |
| u442 | 35.8588 | 37.0192 | 38.081 | 39.5857 | 43.2641 | 67.9324 | 72.6444 | 73.964 | 75.4072 | 78.3142 | 84.0092 | 136.9324 | 145.51 |
| u443 | 35.8587 | 37.0192 | 38.0816 | 39.5859 | 43.2639 | 67.9367 | 72.6426 | 73.9632 | 75.4057 | 78.3141 | 84.0136 | 136.9341 | 145.5114 |

| | | | | | | | | | | | | | |
|---|---|---|---|---|---|---|---|---|---|---|---|---|---|
| u444 | 35.8578 | 37.0177 | 38.0813 | 39.5926 | 43.2944 | 68.0571 | 72.6424 | 75.039 | 76.9509 | 79.9576 | 82.3296 | 136.8983 | 143.0163 |
| u445 | 35.8578 | 37.0176 | 38.081 | 39.5924 | 43.2947 | 68.06 | 72.6439 | 75.0384 | 76.95 | 79.9569 | 82.3305 | 136.8987 | 143.0225 |
| u446 | 35.8575 | 37.0179 | 38.0814 | 39.5929 | 43.2944 | 68.0565 | 72.2221 | 75.0368 | 76.9504 | 79.9555 | 82.3309 | 134.2936 | 142.8933 |
| u447 | 35.8574 | 37.0178 | 38.0818 | 39.5931 | 43.2943 | 68.058 | 72.2221 | 75.037 | 76.9514 | 79.9567 | 82.3296 | 134.2932 | 142.8843 |
| u448 | 38.0543 | 39.0173 | 39.8774 | 41.3049 | 45.0367 | 70.55 | 75.8785 | 76.956 | 78.6861 | 81.6807 | 87.583 | 142.3095 | 152.3927 |
| u449 | 38.0538 | 39.0175 | 39.8769 | 41.3044 | 45.0369 | 70.551 | 75.8777 | 76.9562 | 78.6869 | 81.6788 | 87.5412 | 142.3095 | 152.3929 |
| u450 | 38.0529 | 39.0172 | 39.8759 | 41.3059 | 45.0372 | 70.5533 | 74.9068 | 76.9566 | 78.6864 | 81.6802 | 87.54 | 139.6908 | 151.1156 |
| u451 | 38.0528 | 39.0174 | 39.877 | 41.3041 | 45.037 | 70.5437 | 74.9083 | 76.9558 | 78.6849 | 81.682 | 87.5826 | 139.6909 | 151.1177 |
| u452 | 38.0507 | 39.0141 | 39.8857 | 41.3431 | 45.1593 | 70.9454 | 74.909 | 78.5367 | 80.4284 | 83.4564 | 85.7515 | 139.5833 | 148.9446 |
| u453 | 38.0529 | 39.0144 | 39.8856 | 41.3437 | 45.1593 | 70.9451 | 74.9082 | 78.537 | 80.4263 | 83.4571 | 85.7633 | 139.5827 | 148.9429 |
| u454 | 38.0495 | 39.0133 | 39.8855 | 41.3425 | 45.1595 | 70.9502 | 75.8764 | 78.5358 | 80.4248 | 83.462 | 85.7636 | 142.6066 | 148.1995 |
| u455 | 38.051 | 39.0142 | 39.8851 | 41.3421 | 45.1591 | 70.9507 | 75.8762 | 78.536 | 80.426 | 83.4608 | 85.7523 | 142.6046 | 148.2025 |
| u456 | 39.2761 | 40.6188 | 41.6466 | 43.095 | 46.8876 | 73.3354 | 78.0149 | 80.4441 | 82.2822 | 85.3085 | 91.5777 | 145.0999 | 160.0248 |
| u457 | 39.2764 | 40.6191 | 41.6467 | 43.0951 | 46.8875 | 73.3271 | 78.0151 | 80.4443 | 82.2819 | 85.3085 | 91.2426 | 145.1001 | 160.026 |
| u458 | 39.2766 | 40.6201 | 41.6464 | 43.0955 | 46.8877 | 73.3274 | 79.6456 | 80.4424 | 82.2793 | 85.3287 | 91.245 | 149.3668 | 158.0959 |
| u459 | 39.2768 | 40.6206 | 41.6465 | 43.0946 | 46.8877 | 73.3326 | 79.6467 | 80.4434 | 82.2787 | 85.3306 | 91.5801 | 149.3659 | 158.0948 |
| u460 | 39.28 | 40.6397 | 41.7127 | 43.2624 | 47.2688 | 74.3079 | 79.6448 | 82.3285 | 84.2071 | 87.2159 | 89.3732 | 148.1043 | 156.1076 |
| u461 | 39.2802 | 40.6403 | 41.7128 | 43.2629 | 47.2693 | 74.3113 | 79.6449 | 82.3288 | 84.2076 | 87.2177 | 89.5043 | 148.1059 | 156.1043 |
| u462 | 39.2803 | 40.6403 | 41.7127 | 43.2609 | 47.2696 | 74.308 | 78.0177 | 82.3271 | 84.1959 | 87.2948 | 89.5041 | 145.7857 | 154.4256 |
| u463 | 39.2803 | 40.6411 | 41.7125 | 43.2602 | 47.2693 | 74.3189 | 78.0174 | 82.3277 | 84.1953 | 87.2925 | 89.3735 | 145.7856 | 154.4249 |
| u464 | 41.4858 | 42.6577 | 43.5982 | 45.0026 | 48.9244 | 76.577 | 83.8073 | 84.3678 | 86.249 | 89.1774 | 96.5297 | 155.4054 | 164.1738 |
| u465 | 41.4865 | 42.6582 | 43.5978 | 45.0038 | 48.9255 | 76.5802 | 83.8018 | 84.3672 | 86.2497 | 89.1764 | 95.4314 | 155.4023 | 164.1668 |
| u466 | 41.4869 | 42.6584 | 43.5964 | 45.0023 | 48.9249 | 76.5807 | 81.7443 | 84.3617 | 86.2023 | 89.3957 | 95.4302 | 153.2874 | 166.3172 |
| u467 | 41.4874 | 42.6591 | 43.5971 | 45.0034 | 48.9244 | 76.5796 | 81.7434 | 84.3632 | 86.2014 | 89.3987 | 96.5295 | 153.2858 | 166.3116 |
| u468 | 41.5231 | 42.7698 | 43.8535 | 45.4985 | 49.7981 | 78.3198 | 81.7438 | 86.5044 | 88.4294 | 91.1936 | 93.2095 | 151.536 | 168.5033 |
| u469 | 41.5229 | 42.7696 | 43.853 | 45.4984 | 49.798 | 78.3199 | 81.7436 | 86.5033 | 88.4291 | 91.1957 | 93.9086 | 151.5386 | 168.4994 |
| u470 | 41.5234 | 42.7694 | 43.8522 | 45.4972 | 49.7981 | 78.3273 | 83.8017 | 86.4712 | 88.2699 | 91.7357 | 93.9109 | 157.4443 | 162.0943 |
| u471 | 41.5233 | 42.7696 | 43.8516 | 45.4976 | 49.7981 | 78.3238 | 83.8072 | 86.4722 | 88.2701 | 91.7341 | 93.2111 | 157.4372 | 162.0979 |
| u472 | 43.5584 | 44.7715 | 45.6996 | 47.1812 | 51.4008 | 80.5853 | 86.052 | 88.8102 | 90.8379 | 93.4148 | 102.3437 | 159.6629 | 178.0281 |
| u473 | 43.5585 | 44.7711 | 45.6985 | 47.1793 | 51.3999 | 80.5784 | 86.0775 | 88.8085 | 90.8395 | 93.4126 | 100.8371 | 159.7353 | 178.0888 |
| u474 | 43.5568 | 44.7721 | 45.6988 | 47.1792 | 51.3996 | 80.5778 | 88.3989 | 88.6874 | 90.4077 | 94.418 | 100.8385 | 161.4906 | 170.7864 |
| u475 | 43.5567 | 44.7721 | 45.6989 | 47.1775 | 51.3998 | 80.5826 | 88.5045 | 88.6874 | 90.407 | 94.4168 | 102.3437 | 162.0578 | 170.7885 |
| u476 | 43.7989 | 45.2109 | 46.4283 | 48.2602 | 52.8027 | 82.8266 | 88.5079 | 91.351 | 93.6197 | 96.0017 | 97.9904 | 164.329 | 173.1246 |
| u477 | 43.7989 | 45.2111 | 46.4279 | 48.2589 | 52.8033 | 82.8247 | 88.399 | 91.3517 | 93.6216 | 96.001 | 99.3405 | 166.9644 | 173.1339 |
| u478 | 43.8007 | 45.2101 | 46.4263 | 48.2571 | 52.8089 | 82.8635 | 86.0761 | 90.9752 | 92.7009 | 97.3717 | 99.3403 | 166.8286 | 175.5452 |
| u479 | 43.8005 | 45.2103 | 46.4261 | 48.2578 | 52.8079 | 82.8658 | 86.0498 | 90.9768 | 92.7021 | 97.3718 | 97.9893 | 164.9195 | 175.5667 |
| u480 | 45.9757 | 47.2168 | 48.25 | 49.9204 | 54.4608 | 85.2749 | 94.3572 | 94.308 | 96.7916 | 98.9623 | 109.0638 | 171.9601 | 183.1706 |
| u481 | 45.9753 | 47.2163 | 48.2503 | 49.9207 | 54.4594 | 85.2789 | 93.4722 | 94.305 | 96.7938 | 98.9639 | 107.3125 | 169.4261 | 183.561 |
| u482 | 45.9792 | 47.2131 | 48.2489 | 49.9267 | 54.4959 | 85.4091 | 91.2062 | 93.4157 | 95.3759 | 100.5473 | 107.2919 | 169.3906 | 185.8604 |
| u483 | 45.9786 | 47.2131 | 48.2486 | 49.9295 | 54.4958 | 85.4157 | 90.8593 | 93.4156 | 95.3754 | 100.5491 | 109.138 | 172.0146 | 186.6658 |
| u484 | 46.7464 | 48.3322 | 49.6876 | 51.5221 | 56.1812 | 87.8379 | 90.8599 | 97.7921 | 100.2475 | 102.245 | 103.9362 | 174.6048 | 188.8092 |
| u485 | 46.7465 | 48.3326 | 49.6903 | 51.5246 | 56.181 | 87.8408 | 91.2098 | 97.7919 | 100.2473 | 102.2485 | 105.5795 | 177.7215 | 190.1516 |
| u486 | 46.7368 | 48.3356 | 47.7133 | 51.5879 | 56.3367 | 88.2852 | 93.4714 | 96.2548 | 98.5286 | 104.0024 | 105.5764 | 177.2994 | 180.5749 |
| u487 | 46.7367 | 48.3367 | 49.7131 | 51.5863 | 56.337 | 88.2862 | 94.3565 | 96.2546 | 98.5303 | 104.0187 | 103.9358 | 174.7609 | 180.7371 |
| u488 | 48.9592 | 50.3579 | 51.5478 | 53.3161 | 58.0275 | 90.6272 | 96.5321 | 106.0663 | 104.0424 | 105.8492 | 117.3113 | 183.2688 | 207.205 |
| u489 | 48.9592 | 50.3582 | 51.548 | 53.3156 | 58.0272 | 90.6288 | 98.1431 | 105.9258 | 104.0839 | 105.9014 | 115.8266 | 181.0581 | 201.9648 |
| u490 | 48.9571 | 50.3971 | 51.6596 | 53.5603 | 58.5022 | 91.7549 | 100.2597 | 99.7346 | 102.1054 | 107.7543 | 114.8657 | 180.109 | 192.1819 |
| u491 | 48.9569 | 50.3971 | 51.6584 | 53.5598 | 58.5013 | 91.7452 | 102.7452 | 99.7353 | 102.1144 | 107.9239 | 118.618 | 184.8946 | 193.9278 |
| u492 | 50.6557 | 52.2602 | 53.4746 | 55.2561 | 60.1408 | 94.0274 | 102.094 | 101.6902 | 108.1702 | 109.7293 | 110.8906 | 187.0507 | 195.9463 |
| u493 | 50.653 | 52.2588 | 53.4753 | 55.2536 | 60.1401 | 94.0225 | 100.3662 | 101.6823 | 108.5941 | 110.1842 | 113.2987 | 189.0814 | 197.9263 |
| u494 | 50.8019 | 52.5138 | 53.9079 | 55.9575 | 61.1933 | 95.9591 | 98.1398 | 103.7922 | 106.0702 | 111.8828 | 112.7799 | 191.2342 | 200.1039 |
| u495 | 50.8048 | 52.5155 | 53.904 | 55.9545 | 61.193 | 95.9578 | 96.5259 | 103.7559 | 106.2142 | 112.8128 | 111.1046 | 193.4234 | 205.0979 |
| u496 | 52.9569 | 54.501 | 55.7308 | 57.6385 | 62.8176 | 98.2729 | 110.7233 | 111.6839 | 113.1487 | 114.4232 | 130.5814 | 195.7412 | 217.4963 |
| u497 | 52.9639 | 54.503 | 55.7268 | 57.642 | 62.8281 | 98.3185 | 112.2847 | 110.6768 | 114.6195 | 115.7969 | 132.6632 | 198.1371 | 214.7692 |
| u498 | 53.4777 | 55.2791 | 56.806 | 59.0042 | 64.3876 | 100.6974 | 107.626 | 115.2945 | 110.4487 | 117.4144 | 126.718 | 200.6614 | 223.3043 |
| u499 | 53.4645 | 55.2722 | 56.8142 | 59.0342 | 64.465 | 100.9143 | 108.7795 | 113.6476 | 111.3842 | 119.0583 | 128.5997 | 203.2991 | 220.3407 |
| u500 | 55.656 | 57.3102 | 58.6572 | 60.7329 | 66.1457 | 103.2898 | 104.8265 | 119.3173 | 120.0971 | 120.8309 | 120.1201 | 206.0702 | 229.6263 |
| u501 | 55.636 | 57.3179 | 58.7152 | 60.8673 | 66.4305 | 103.9738 | 105.8718 | 117.3087 | 130.1909 | 127.7652 | 124.9348 | 208.9752 | 226.3983 |
| u502 | 56.9889 | 58.9649 | 60.4423 | 62.5426 | 68.0764 | 106.2703 | 114.3264 | 108.6353 | 116.3941 | 129.9928 | 123.2466 | 212.0266 | 212.1517 |
| u503 | 57.0925 | 59.1306 | 60.7429 | 63.0233 | 68.845 | 107.8059 | 116.3532 | 108.2046 | 118.2137 | 122.6547 | 121.632 | 215.2249 | 209.6442 |
| u504 | 59.2837 | 61.1089 | 62.5497 | 64.7063 | 70.4884 | 110.0966 | 118.6444 | 130.9001 | 122.984 | 134.8738 | 137.7682 | 218.5842 | 236.4769 |
| u505 | 59.6443 | 61.6733 | 63.3845 | 65.8405 | 71.9292 | 112.3906 | 121.1165 | 122.8929 | 125.2188 | 132.3583 | 135.4531 | 222.1134 | 244.6645 |
| u506 | 61.7674 | 63.6949 | 65.2531 | 67.5824 | 73.7057 | 115.0313 | 123.8409 | 125.3324 | 127.6202 | 125.6912 | 140.7453 | 225.8235 | 240.8179 |
| u507 | 62.9178 | 65.1645 | 66.9789 | 69.4139 | 75.665 | 117.9552 | 126.8307 | 128.0094 | 133.5832 | 137.548 | 143.3382 | 229.737 | 232.9769 |
| u508 | 65.306 | 67.4133 | 69.1366 | 71.5481 | 77.8744 | 121.1796 | 130.1067 | 134.716 | 136.5634 | 140.4019 | 146.0965 | 233.8787 | 249.6594 |
| u509 | 67.8605 | 69.9821 | 71.633 | 73.9871 | 80.3612 | 124.7913 | 133.7124 | 138.147 | 139.7863 | 143.479 | 149.0639 | 238.2892 | 253.9707 |
| u510 | 71.0398 | 73.0578 | 74.5507 | 76.7941 | 83.1813 | 128.8735 | 137.7296 | 141.9513 | 143.3296 | 146.8374 | 152.2948 | 243.1015 | 264.3589 |
| u511 | 74.9966 | 76.8096 | 78.0466 | 80.1201 | 86.4858 | 133.6086 | 142.366 | 146.2886 | 147.35 | 150.6362 | 155.922 | 248.5007 | 259.1528 |

Obviously, numerous modifications and variations of the present disclosure are possible in light of the above teachings. It is therefore to be understood that within the scope of the appended claims, the disclosure may be practiced otherwise than as specifically described herein (e.g., if the NUC position vectors are rounded to a smaller number of digits).

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

In so far as embodiments of the disclosure have been described as being implemented, at least in part, by software-controlled data processing apparatus, it will be appreciated that a non-transitory machine-readable medium carrying such software, such as an optical disk, a magnetic disk, semiconductor memory or the like, is also considered to represent an embodiment of the present disclosure. Further, such a software may also be distributed in other forms, such as via the Internet or other wired or wireless telecommunication systems.

A circuit that may be used for implementing one or more of the elements of the claimed apparatus is a structural assemblage of electronic components including conventional circuit elements, integrated circuits including application specific integrated circuits, standard integrated circuits, application specific standard products, and field programmable gate arrays. Further a circuit includes central processing units, graphics processing units, and microprocessors which are programmed or configured according to software code. A circuit does not include pure software, although a circuit includes the above-described hardware executing software.

Any reference signs in the claims should not be construed as limiting the scope.

The invention claimed is:

1. A coding and modulation apparatus, comprising:
   circuitry configured to:
   encode input data into 10-bit cell words;
   modulate the cell words into constellation points of a non-uniform constellation (NUC); and
   convert the constellation points into one or more data streams,
   wherein
   the NUC is a Quadrature Amplitude Modulation (QAM) constellation having 1024 constellation points,
   a constellation point ($z_q$) of the constellation points that has an in-phase component $Re(z_q)$ and a quadrature-phase component $Im(z_q)$ is determined according to a cell word ($y_{0,q}, \ldots y_{9,q}$) of the cell words, a constellation position vector ($u_0, \ldots u_{15}$), and tables as follows:

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 1 | 1 | 1 | 1 | 1 | 1 | 1 | 1 |
| $y_{2,q}$ | 0 | 0 | 0 | 0 | 0 | 0 | 0 | 0 | 1 | 1 | 1 | 1 | 1 | 1 | 1 | 1 |
| $y_{4,q}$ | 0 | 0 | 0 | 0 | 1 | 1 | 1 | 1 | 1 | 1 | 1 | 1 | 0 | 0 | 0 | 0 |
| $y_{6,q}$ | 0 | 0 | 1 | 1 | 1 | 1 | 0 | 0 | 0 | 0 | 1 | 1 | 1 | 1 | 0 | 0 |
| $y_{8,q}$ | 0 | 1 | 1 | 0 | 0 | 1 | 1 | 0 | 0 | 1 | 1 | 0 | 0 | 1 | 1 | 0 |
| $Re(z_q)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{0,q}$ | 0 | 0 | 0 | 0 | 0 | 0 | 0 | 0 | 0 | 0 | 0 | 0 | 0 | 0 | 0 | 0 |
| $y_{2,q}$ | 1 | 1 | 1 | 1 | 1 | 1 | 1 | 1 | 0 | 0 | 0 | 0 | 0 | 0 | 0 | 0 |
| $y_{4,q}$ | 0 | 0 | 0 | 0 | 1 | 1 | 1 | 1 | 1 | 1 | 1 | 1 | 0 | 0 | 0 | 0 |
| $y_{6,q}$ | 0 | 0 | 1 | 1 | 1 | 1 | 0 | 0 | 0 | 0 | 1 | 1 | 1 | 1 | 0 | 0 |
| $y_{8,q}$ | 0 | 1 | 1 | 0 | 0 | 1 | 1 | 0 | 0 | 1 | 1 | 0 | 0 | 1 | 1 | 0 |
| $Re(z_q)$ | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 1 | 1 | 1 | 1 | 1 | 1 | 1 | 1 |
| $y_{3,q}$ | 0 | 0 | 0 | 0 | 0 | 0 | 0 | 0 | 1 | 1 | 1 | 1 | 1 | 1 | 1 | 1 |
| $y_{5,q}$ | 0 | 0 | 0 | 0 | 1 | 1 | 1 | 1 | 1 | 1 | 1 | 1 | 0 | 0 | 0 | 0 |
| $y_{7,q}$ | 0 | 0 | 1 | 1 | 1 | 1 | 0 | 0 | 0 | 0 | 1 | 1 | 1 | 1 | 0 | 0 |
| $y_{9,q}$ | 0 | 1 | 1 | 0 | 0 | 1 | 1 | 0 | 0 | 1 | 1 | 0 | 0 | 1 | 1 | 0 |
| $Im(z_q)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{1,q}$ | 0 | 0 | 0 | 0 | 0 | 0 | 0 | 0 | 0 | 0 | 0 | 0 | 0 | 0 | 0 | 0 |
| $y_{3,q}$ | 1 | 1 | 1 | 1 | 1 | 1 | 1 | 1 | 0 | 0 | 0 | 0 | 0 | 0 | 0 | 0 |
| $y_{5,q}$ | 0 | 0 | 0 | 0 | 1 | 1 | 1 | 1 | 1 | 1 | 1 | 1 | 0 | 0 | 0 | 0 |
| $y_{7,q}$ | 0 | 0 | 1 | 1 | 1 | 1 | 0 | 0 | 0 | 0 | 1 | 1 | 1 | 1 | 0 | 0 |
| $y_{9,q}$ | 0 | 1 | 1 | 0 | 0 | 1 | 1 | 0 | 0 | 1 | 1 | 0 | 0 | 1 | 1 | 0 |
| $Im(z_q)$ | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ | and the constellation position vector ($u_0, \ldots u_{15}$) prior to power normalization is (1, 1.0005, 2.0897, 2.0888, 3.9945, 3.9931, 5.3843, 5.3894, 7.5206, 7.6013, 9.3371, 9.8429, 11.9255, 13.3962, 15.8981, 19.1591).

2. The apparatus according to claim 1, wherein the constellation position vector ($u_0, \ldots u_{15}$) after the power normalization is (0.0773, 0.0773, 0.1614, 0.1614, 0.3086, 0.3085, 0.4159, 0.4163, 0.5810, 0.5872, 0.7213, 0.7604, 0.9212, 1.0349, 1.2281, 1.4800).

3. A transmission apparatus, comprising:
the coding and modulation apparatus as recited in claim 1; and
a transmitter configured to transmit the one or more data streams.

4. A coding and modulation method, comprising:
encoding input data into 10-bit cell words;
modulating, by circuitry, the cell words into constellation points of a non-uniform constellation (NUC); and
converting said constellation points into one or more data streams,
wherein
the NUC is a Quadrature Amplitude Modulation (QAM) constellation having 1024 constellation points,
a constellation point ($z_q$) of the constellation points that has an in-phase component Re($z_q$) and a quadrature-phase component Im($z_q$) is determined according to a cell word ($y_{0,q}, \ldots y_{9,q}$) of the cell words, a constellation position vector ($u_0 \ldots u_{15}$), and tables as follows:

| $y_{0,q}$ | 1 | 1 | 1 | 1 | 1 | 1 | 1 | 1 | 1 | 1 | 1 | 1 | 1 | 1 | 1 | 1 |
|---|---|---|---|---|---|---|---|---|---|---|---|---|---|---|---|---|
| $y_{2,q}$ | 0 | 0 | 0 | 0 | 0 | 0 | 0 | 0 | 1 | 1 | 1 | 1 | 1 | 1 | 1 | 1 |
| $y_{4,q}$ | 0 | 0 | 0 | 0 | 1 | 1 | 1 | 1 | 1 | 1 | 1 | 1 | 0 | 0 | 0 | 0 |
| $y_{6,q}$ | 0 | 0 | 1 | 1 | 1 | 1 | 0 | 0 | 0 | 0 | 1 | 1 | 1 | 1 | 0 | 0 |
| $y_{8,q}$ | 0 | 1 | 1 | 0 | 0 | 1 | 1 | 0 | 0 | 1 | 1 | 0 | 0 | 1 | 1 | 0 |
| Re($z_q$) | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{0,q}$ | 0 | 0 | 0 | 0 | 0 | 0 | 0 | 0 | 0 | 0 | 0 | 0 | 0 | 0 | 0 | 0 |
| $y_{2,q}$ | 1 | 1 | 1 | 1 | 1 | 1 | 1 | 1 | 0 | 0 | 0 | 0 | 0 | 0 | 0 | 0 |
| $y_{4,q}$ | 0 | 0 | 0 | 0 | 1 | 1 | 1 | 1 | 1 | 1 | 1 | 1 | 0 | 0 | 0 | 0 |
| $y_{6,q}$ | 0 | 0 | 1 | 1 | 1 | 1 | 0 | 0 | 0 | 0 | 1 | 1 | 1 | 1 | 0 | 0 |
| $y_{8,q}$ | 0 | 1 | 1 | 0 | 0 | 1 | 1 | 0 | 0 | 1 | 1 | 0 | 0 | 1 | 1 | 0 |
| Re($z_q$) | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

| $y_{1,q}$ | 1 | 1 | 1 | 1 | 1 | 1 | 1 | 1 | 1 | 1 | 1 | 1 | 1 | 1 | 1 | 1 |
|---|---|---|---|---|---|---|---|---|---|---|---|---|---|---|---|---|
| $y_{3,q}$ | 0 | 0 | 0 | 0 | 0 | 0 | 0 | 0 | 1 | 1 | 1 | 1 | 1 | 1 | 1 | 1 |
| $y_{5,q}$ | 0 | 0 | 0 | 0 | 1 | 1 | 1 | 1 | 1 | 1 | 1 | 1 | 0 | 0 | 0 | 0 |
| $y_{7,q}$ | 0 | 0 | 1 | 1 | 1 | 1 | 0 | 0 | 0 | 0 | 1 | 1 | 1 | 1 | 0 | 0 |
| $y_{9,q}$ | 0 | 1 | 1 | 0 | 0 | 1 | 1 | 0 | 0 | 1 | 1 | 0 | 0 | 1 | 1 | 0 |
| Im(zq) | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{1,q}$ | 0 | 0 | 0 | 0 | 0 | 0 | 0 | 0 | 0 | 0 | 0 | 0 | 0 | 0 | 0 | 0 |
| $y_{3,q}$ | 1 | 1 | 1 | 1 | 1 | 1 | 1 | 1 | 0 | 0 | 0 | 0 | 0 | 0 | 0 | 0 |
| $y_{5,q}$ | 0 | 0 | 0 | 0 | 1 | 1 | 1 | 1 | 1 | 1 | 1 | 1 | 0 | 0 | 0 | 0 |
| $y_{7,q}$ | 0 | 0 | 1 | 1 | 1 | 1 | 0 | 0 | 0 | 0 | 1 | 1 | 1 | 1 | 0 | 0 |
| $y_{9,q}$ | 0 | 1 | 1 | 0 | 0 | 1 | 1 | 0 | 0 | 1 | 1 | 0 | 0 | 1 | 1 | 0 |
| Im($z_q$) | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ | and the constellation position vector ($u_0, \ldots u_{15}$) prior to power normalization is (1, 1.0005, 2.0897, 2.0888, 3.9945, 3.9931, 5.3843, 5.3894, 7.5206, 7.6013, 9.3371, 9.8429, 11.9255, 13.3962, 15.8981, 19.1591).

5. The method according to claim 4, wherein the constellation position vector ($u_0, \ldots u_{15}$) after the power normalization is (0.0773, 0.0773, 0.1614, 0.1614, 0.3086, 0.3085, 0.4159, 0.4163, 0.5810, 0.5872, 0.7213, 0.7604, 0.9212, 1.0349, 1.2281, 1.4800).

6. A decoder and demodulation apparatus, comprising:
circuitry configured to:
convert one or more data streams into constellation points of a non-uniform constellation (NUC);
demodulate the constellation points into 10-bit cell words; and
decode the cell words into input data,
wherein
the NUC is a Quadrature Amplitude Modulation (QAM) constellation having 1024 constellation points, a cell word $(y_{0,q}, \ldots y_{9,q})$ of the cell words is determined according to a constellation point $(z_q)$ of the constellation points that has an in-phase component $Re(z_q)$ and a quadrature-phase component $Im(z_q)$, a constellation position vector $(u_0, \ldots u_{15})$, and tables as follows:

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 1 | 1 | 1 | 1 | 1 | 1 | 1 | 1 |
| $y_{2,q}$ | 0 | 0 | 0 | 0 | 0 | 0 | 0 | 0 | 1 | 1 | 1 | 1 | 1 | 1 | 1 | 1 |
| $y_{4,q}$ | 0 | 0 | 0 | 0 | 1 | 1 | 1 | 1 | 1 | 1 | 1 | 1 | 0 | 0 | 0 | 0 |
| $y_{6,q}$ | 0 | 0 | 1 | 1 | 1 | 1 | 0 | 0 | 0 | 0 | 1 | 1 | 1 | 1 | 0 | 0 |
| $y_{8,q}$ | 0 | 1 | 1 | 0 | 0 | 1 | 1 | 0 | 0 | 1 | 1 | 0 | 0 | 1 | 1 | 0 |
| $Re(z_q)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{0,q}$ | 0 | 0 | 0 | 0 | 0 | 0 | 0 | 0 | 0 | 0 | 0 | 0 | 0 | 0 | 0 | 0 |
| $y_{2,q}$ | 1 | 1 | 1 | 1 | 1 | 1 | 1 | 1 | 0 | 0 | 0 | 0 | 0 | 0 | 0 | 0 |
| $y_{4,q}$ | 0 | 0 | 0 | 0 | 1 | 1 | 1 | 1 | 1 | 1 | 1 | 1 | 0 | 0 | 0 | 0 |
| $y_{6,q}$ | 0 | 0 | 1 | 1 | 1 | 1 | 0 | 0 | 0 | 0 | 1 | 1 | 1 | 1 | 0 | 0 |
| $y_{8,q}$ | 0 | 1 | 1 | 0 | 0 | 1 | 1 | 0 | 0 | 1 | 1 | 0 | 0 | 1 | 1 | 0 |
| $Re(z_q)$ | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 1 | 1 | 1 | 1 | 1 | 1 | 1 | 1 |
| $y_{3,q}$ | 0 | 0 | 0 | 0 | 0 | 0 | 0 | 0 | 1 | 1 | 1 | 1 | 1 | 1 | 1 | 1 |
| $y_{5,q}$ | 0 | 0 | 0 | 0 | 1 | 1 | 1 | 1 | 1 | 1 | 1 | 1 | 0 | 0 | 0 | 0 |
| $y_{7,q}$ | 0 | 0 | 1 | 1 | 1 | 1 | 0 | 0 | 0 | 0 | 1 | 1 | 1 | 1 | 0 | 0 |
| $y_{9,q}$ | 0 | 1 | 1 | 0 | 0 | 1 | 1 | 0 | 0 | 1 | 1 | 0 | 0 | 1 | 1 | 0 |
| $Im(z_q)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{1,q}$ | 0 | 0 | 0 | 0 | 0 | 0 | 0 | 0 | 0 | 0 | 0 | 0 | 0 | 0 | 0 | 0 |
| $y_{3,q}$ | 1 | 1 | 1 | 1 | 1 | 1 | 1 | 1 | 0 | 0 | 0 | 0 | 0 | 0 | 0 | 0 |
| $y_{5,q}$ | 0 | 0 | 0 | 0 | 1 | 1 | 1 | 1 | 1 | 1 | 1 | 1 | 0 | 0 | 0 | 0 |
| $y_{7,q}$ | 0 | 0 | 1 | 1 | 1 | 1 | 0 | 0 | 0 | 0 | 1 | 1 | 1 | 1 | 0 | 0 |
| $y_{9,q}$ | 0 | 1 | 1 | 0 | 0 | 1 | 1 | 0 | 0 | 1 | 1 | 0 | 0 | 1 | 1 | 0 |
| $Im(z_q)$ | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ | and the constellation position vector $(u_0, \ldots, u_{15})$ prior to power normalization is (1, 1.0005, 2.0897, 2.0888, 3.9945, 3.9931, 5.3843, 5.3894, 7.5206, 7.6013, 9.3371, 9.8429, 11.9255, 13.3962, 15.8981, 19.1591).

7. The apparatus according to claim 6, wherein the constellation position vector $(u_0, \ldots u_{15})$ after the power normalization is (0.0773, 0.0773, 0.1614, 0.1614, 0.3086, 0.3085, 0.4159, 0.4163, 0.5810, 0.5872, 0.7213, 0.7604, 0.9212, 1.0349, 1.2281, 1.4800).

8. A receiver apparatus, comprising:

the decoder and demodulation apparatus according to claim 6; and a receiver configured to receive the one or more data streams.

9. The receiver apparatus according to claim 8, wherein the receiver is configured to receive the one or more data streams for terrestrial delivery having fading channels.

10. A receiving method, comprising:

converting one or more data streams into constellation points of a non-uniform constellation (NUC);

demodulating, by circuitry, the constellation points into 10-bit cell words; and decoding the cell words into input data, wherein the NUC is a Quadrature Amplitude Modulation (QAM) constellation having 1024 constellation points, a cell word $(v_{0,q}, \ldots y_{9,q})$ of the cell words is determined according to a constellation point $(z_q)$ of the constellation points that has an in-phase component $Re(z_q)$ and a quadrature-phase component $Im(z_q)$, a constellation position vector $(u_0, \ldots u_{15})$, and tables as follows:

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 1 | 1 | 1 | 1 | 1 | 1 | 1 | 1 |
| $y_{2,q}$ | 0 | 0 | 0 | 0 | 0 | 0 | 0 | 0 | 1 | 1 | 1 | 1 | 1 | 1 | 1 | 1 |
| $y_{4,q}$ | 0 | 0 | 0 | 0 | 1 | 1 | 1 | 1 | 1 | 1 | 1 | 1 | 0 | 0 | 0 | 0 |
| $y_{6,q}$ | 0 | 0 | 1 | 1 | 1 | 1 | 0 | 0 | 0 | 0 | 1 | 1 | 1 | 1 | 0 | 0 |
| $y_{8,q}$ | 0 | 1 | 1 | 0 | 0 | 1 | 1 | 0 | 0 | 1 | 1 | 0 | 0 | 1 | 1 | 0 |
| $Re(z_q)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{0,q}$ | 0 | 0 | 0 | 0 | 0 | 0 | 0 | 0 | 0 | 0 | 0 | 0 | 0 | 0 | 0 | 0 |
| $y_{2,q}$ | 1 | 1 | 1 | 1 | 1 | 1 | 1 | 1 | 0 | 0 | 0 | 0 | 0 | 0 | 0 | 0 |
| $y_{4,q}$ | 0 | 0 | 0 | 0 | 1 | 1 | 1 | 1 | 1 | 1 | 1 | 1 | 0 | 0 | 0 | 0 |
| $y_{6,q}$ | 0 | 0 | 1 | 1 | 1 | 1 | 0 | 0 | 0 | 0 | 1 | 1 | 1 | 1 | 0 | 0 |
| $y_{8,q}$ | 0 | 1 | 1 | 0 | 0 | 1 | 1 | 0 | 0 | 1 | 1 | 0 | 0 | 1 | 1 | 0 |
| $Re(z_q)$ | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 1 | 1 | 1 | 1 | 1 | 1 | 1 | 1 |
| $y_{3,q}$ | 0 | 0 | 0 | 0 | 0 | 0 | 0 | 0 | 1 | 1 | 1 | 1 | 1 | 1 | 1 | 1 |
| $y_{5,q}$ | 0 | 0 | 0 | 0 | 1 | 1 | 1 | 1 | 1 | 1 | 1 | 1 | 0 | 0 | 0 | 0 |
| $y_{7,q}$ | 0 | 0 | 1 | 1 | 1 | 1 | 0 | 0 | 0 | 0 | 1 | 1 | 1 | 1 | 0 | 0 |
| $y_{9,q}$ | 0 | 1 | 1 | 0 | 0 | 1 | 1 | 0 | 0 | 1 | 1 | 0 | 0 | 1 | 1 | 0 |
| $\mathrm{Im}(z_q)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{1,q}$ | 0 | 0 | 0 | 0 | 0 | 0 | 0 | 0 | 0 | 0 | 0 | 0 | 0 | 0 | 0 | 0 |
| $y_{3,q}$ | 1 | 1 | 1 | 1 | 1 | 1 | 1 | 1 | 0 | 0 | 0 | 0 | 0 | 0 | 0 | 0 |
| $y_{5,q}$ | 0 | 0 | 0 | 0 | 1 | 1 | 1 | 1 | 1 | 1 | 1 | 1 | 0 | 0 | 0 | 0 |
| $y_{7,q}$ | 0 | 0 | 1 | 1 | 1 | 1 | 0 | 0 | 0 | 0 | 1 | 1 | 1 | 1 | 0 | 0 |
| $y_{9,q}$ | 0 | 1 | 1 | 0 | 0 | 1 | 1 | 0 | 0 | 1 | 1 | 0 | 0 | 1 | 1 | 0 |
| $\mathrm{Im}(z_q)$ | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ | and the constellation position vector $(u_0, \ldots u_{15})$ prior to power normalization is (1, 1.0005, 2.0897, 2.0888, 3.9945, 3.9931, 5.3843, 5.3894, 7.5206, 7.6013, 9.3371, 9.8429, 11.9255, 13.3962, 15.8981, 19.1591).

11. The method according to claim 10, wherein the constellation position vector $(u_0, \ldots u_{15})$ after the power normalization is (0.0773, 0.0773, 0.1614, 0.1614, 0.3086, 0.3085, 0.4159, 0.4163, 0.5810, 0.5872, 0.7213, 0.7604, 0.9212, 1.0349, 1.2281, 1.4800).

12. A non-transitory computer readable medium including computer program instructions which, when executed by a computer, causes the computer to perform the method of claim 10.

* * * * *